US012796209B2

(12) United States Patent
Jradi et al.

(10) Patent No.: US 12,796,209 B2
(45) Date of Patent: Nov. 10, 2026

(54) ORGANIC ELECTROLUMINESCENT MATERIALS AND DEVICES

(71) Applicant: Universal Display Corporation, Ewing, NJ (US)

(72) Inventors: Fadi M. Jradi, Abington, PA (US); Rasha Hamze, Philadelphia, PA (US); Peter Wolohan, Princeton Junction, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 336 days.

(21) Appl. No.: 18/652,826

(22) Filed: May 2, 2024

(65) Prior Publication Data

US 2024/0407188 A1 Dec. 5, 2024

Related U.S. Application Data

(60) Provisional application No. 63/519,322, filed on Aug. 14, 2023, provisional application No. 63/503,367, filed on May 19, 2023.

(51) Int. Cl.
*H10K 50/12* (2023.01)
*H10K 85/30* (2023.01)
(Continued)

(52) U.S. Cl.
CPC ......... *H10K 50/121* (2023.02); *H10K 85/346* (2023.02); *H10K 85/40* (2023.02);
(Continued)

(58) Field of Classification Search
CPC ........... H10K 2101/10; H10K 2101/20; H10K 2101/30; H10K 2101/90; H10K 50/11;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 112745354 5/2021
EP 0650955 5/1995
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
(Continued)

*Primary Examiner* — Shahan Ur Rahaman
(74) *Attorney, Agent, or Firm* — DUANE MORRIS LLP

(57) ABSTRACT

An organic light emitting device (OLED) having an anode; a cathode; and an emissive layer, disposed between the anode and cathode is provided, where the emissive layer includes a first compound of Formula I, (Continued)

and a second compound of Formula II,

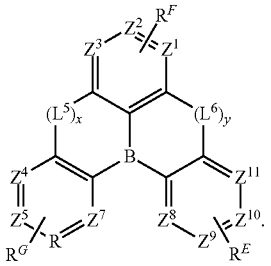

In the OLED, the LUMO energy of the second compound is ≤ to −2.33 eV and at least one $R^D$ substituent is not hydrogen.

20 Claims, 3 Drawing Sheets

(51) Int. Cl.
*H10K 85/40* (2023.01)
*H10K 85/60* (2023.01)
*H10K 101/30* (2023.01)

(52) U.S. Cl.
CPC ......... *H10K 85/622* (2023.02); *H10K 85/623* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 2101/30* (2023.02)

(58) Field of Classification Search
CPC .... H10K 50/121; H10K 50/18; H10K 85/322; H10K 85/346; H10K 85/40; H10K 85/622; H10K 85/623; H10K 85/636; H10K 85/654; H10K 85/6572; H10K 85/6574; H10K 85/6576; H10K 85/658
See application file for complete search history.

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 11,919,914 | B2 | 3/2024 | Wolohan et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2014/0014922 | A1 | 1/2014 | Lin et al. |
| 2021/0074932 | A1 | 3/2021 | Park et al. |
| 2021/0130382 | A1 | 5/2021 | Park et al. |

FOREIGN PATENT DOCUMENTS

| | | |
|---|---|---|
| EP | 1725079 | 11/2006 |
| EP | 2034538 | 3/2009 |
| EP | 4119633 | 1/2023 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |

(56) References Cited

FOREIGN PATENT DOCUMENTS

| | | |
|---|---|---|
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2022161453 | 8/2022 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

(56) References Cited

OTHER PUBLICATIONS

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Applications No. 63/503,367, filed on May 19, 2023, and No. 63/519,322, filed on Aug. 14, 2023, the entire contents of both applications incorporated herein by reference.

FIELD

The present disclosure generally relates to novel device architectures and the OLED devices having those novel architectures and their uses.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

An organic light emitting device (OLED) comprising an anode; a cathode; and an emissive layer, disposed between the anode and cathode is provided. The emissive layer comprises a first compound and a second compound.

The first compound has a structure of Formula I,

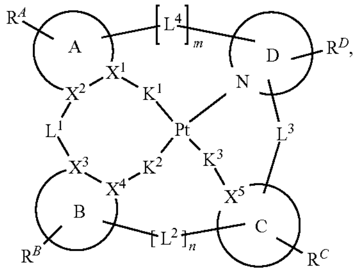

and the second compound has a structure of Formula II,

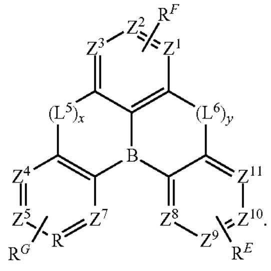

In Formula I and Formula II:

each of moiety A, moiety B, moiety C, and moiety D is independently a monocyclic ring or a polycyclic fused ring system, where the monocyclic ring or each ring of the polycyclic fused ring system is independently a 5-membered or 6-membered carbocyclic or heterocyclic ring;

each of $X^1$ to $X^5$ is independently C or N;

each of $K^1$, $K^2$, and $K^3$ is independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;

m and n are each independently 0 or 1; and $m+n=1$ or 2;

each of $Z^1$ to $Z^1$ is independently C or N;

x and y are each independently 0 or 1;

wherein the LUMO energy of the second compound is less than or equal to −2.33 eV;

each of $L^1$, $L^2$, $L^3$, $L^4$, $L^5$, and $L^6$ is independently selected from the group consisting of a direct bond, or a linker selected from the group consisting of BR, BRR', NR, PR, P(O)R, O, S, Se, C=O, C=S, C=Se, C=NR', C=CR"R"', S=O, $SO_2$, CRR', SiRR', GeRR', alkyl, cycloalkyl, aryl, heteroaryl, and combinations thereof;

each of $R^A$, $R^B$, $R^C$, $R^D$, $R^E$, $R^F$, and $R^G$ independently represents mono to the maximum allowable substitution, or no substitution;

each $R^\alpha$, $R^\beta$, R, R', R", R"', $R^A$, $R^B$, $R^C$, $R^D$, $R^E$, $R^F$, and $R^G$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

any two substituents may be joined or fused to form a ring;

at least one $R^D$ substituent is not hydrogen; and when moiety A is benzimidazole, each of moiety B and moiety C is phenyl, moiety D is pyridine, and $X^1$ is N, at least one of the following two conditions is true:

(1) a combined molecular weight of all of the at least one $R^D$ substituents that are not hydrogen is ≥57 g/mol; or (2) two $R^D$ substituents are joined together to form a ring.

Consumer products containing the OLED as described herein are also provided.

DETAILED DESCRIPTION

A. Terminology

Figure 1:
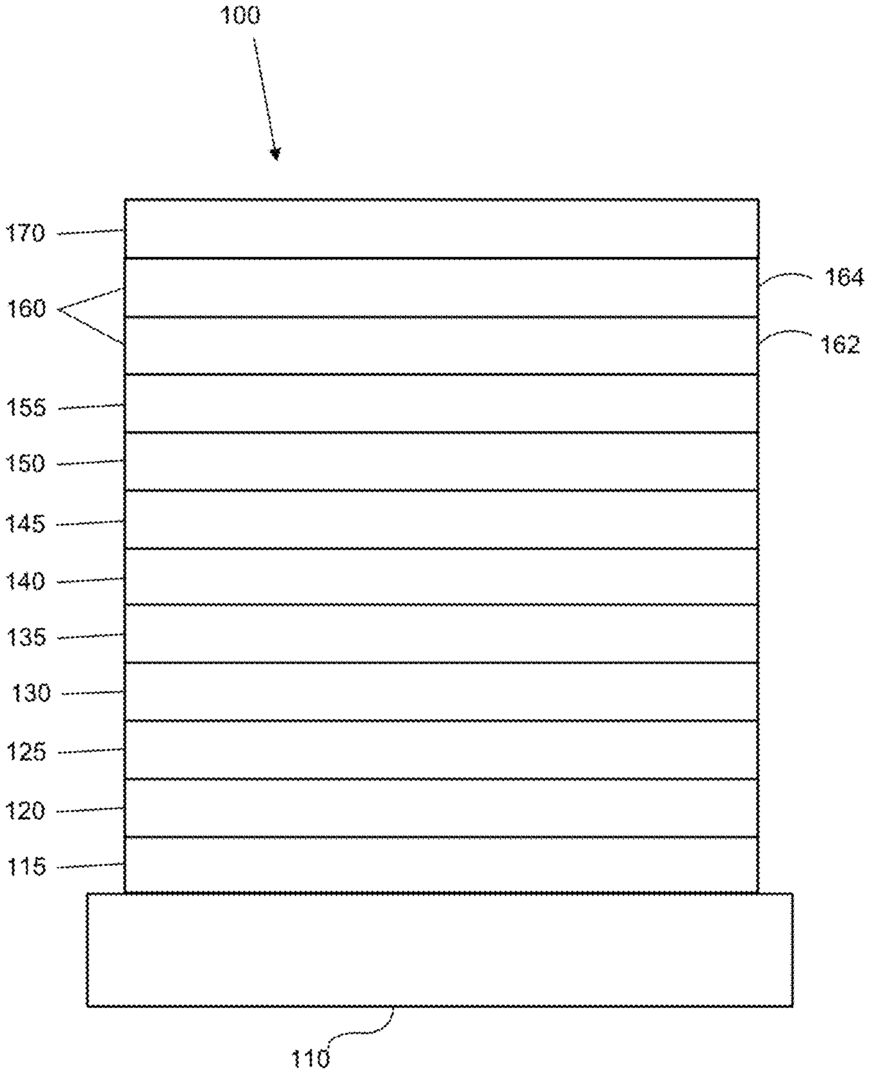
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "selenyl" refers to a $—SeR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

The term "germyl" refers to a $—Ge(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more General Substituents.

In many instances, the General Substituents are selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, selenyl, sulfinyl, sulfonyl, phosphino, and combinations thereof.

In some instances, the Preferred General Substituents are selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

In some instances, the More Preferred General Substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the Most Preferred General Substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one R must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instances, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

Figure 2:
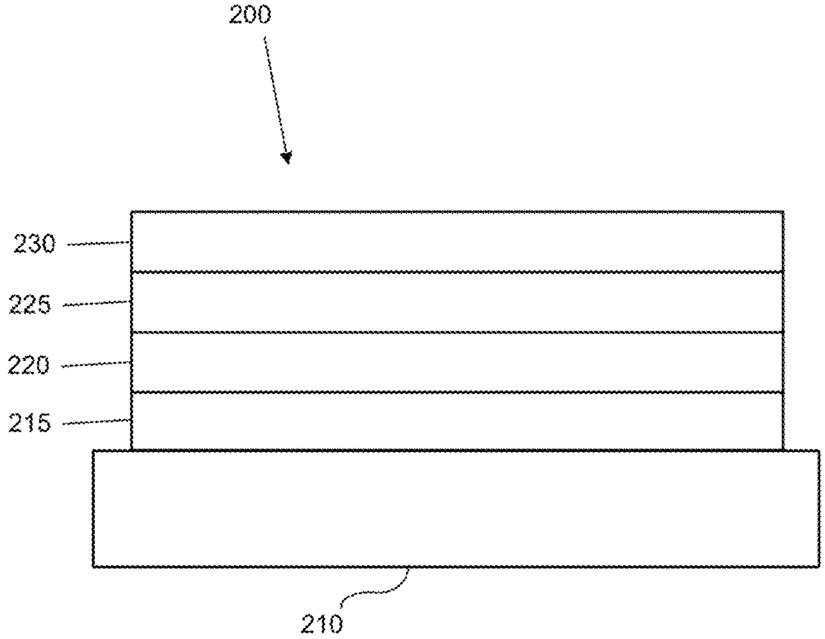
FIG. 2 shows an inverted organic light emitting device that does not have a separate electron transport layer.

As disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP, also referred to as organic vapor jet deposition (OVJD)), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by any theory, it is believed that E-type delayed fluorescence requires the luminescent material to have a small singlet-triplet energy gap (ΔES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In general parlance in the art, a "sub-pixel" may refer to the emissive region, which may be a single-layer EML, a stacked device, or the like, in conjunction with any color altering layer that is used to modify the color emitted by the emissive region.

As used herein, the "emissive region" of a sub-pixel refers to any and all emissive layers, regions, and devices that are used initially to generate light for the sub-pixel. A sub-pixel also may include additional layers disposed in a stack with the emissive region that affect the color ultimately produced by the sub-pixel, such as color altering layers disclosed herein, though such color altering layers typically are not considered "emissive layers" as disclosed herein. An unfiltered sub-pixel is one that excludes a color modifying component such as a color altering layer, but may include one or more emissive regions, layers, or devices.

In some configurations, an "emissive region" may include emissive materials that emit light of multiple colors. For example, a yellow emissive region may include multiple materials that emit red and green light when each material is used in an OLED device alone. When used in a yellow device, the individual materials typically are not arranged such that they can be individually activated or addressed. That is, the "yellow" OLED stack containing the materials cannot be driven to produce red, green, or yellow light; rather, the stack can be driven as a whole to produce yellow light. Such an emissive region may be referred to as a yellow emissive region even though, at the level of individual emitters, the stack does not directly produce yellow light. As described in further detail below, the individual emissive materials used in an emissive region (if more than one), may be placed in the same emissive layer within the device, or in multiple emissive layers within an OLED device comprising an emissive region. As described in further detail below, embodiments disclosed herein may allow for OLED devices such as displays that include a limited number of colors of emissive regions, while including more colors of sub-pixels or other OLED devices than the number of colors of emissive regions. For example, a device as disclosed herein may include only blue and yellow emissive regions. Additional colors of sub-pixels may be achieved by the use of color altering layers, such as color altering layers disposed in a stack with yellow or blue emissive regions, or more generally through the use of color altering layers, electrodes or other structures that form a microcavity as disclosed herein, or any other suitable configuration. In some cases, the general color provided by a sub-pixel may be the same as the color provided by the emissive region in the stack that defines the sub-pixel, such as where a deep blue color altering layer is disposed in a stack with a light blue emissive region to produce a deep blue sub-pixel. Similarly, the color provided by a sub-pixel may be different than the color provided by an emissive region in the stack that defines the sub-pixel, such as where a green color altering layer is disposed in a stack with a yellow emissive region to product a green sub-pixel.

In some configurations, emissive regions and/or emissive layers may span multiple sub-pixels, such as where additional layers and circuitry are fabricated to allow portions of an emissive region or layer to be separately addressable.

An emissive region as disclosed herein may be distinguished from an emissive "layer" as typically referred to in the art and as used herein. In some cases, a single emissive region may include multiple layers, such as where a yellow emissive region is fabricated by sequentially depositing red and green emissive layers to form the yellow emissive region. As previously described, when such layers occur in an emissive region as disclosed herein, the layers are not individually addressable within a single emissive stack; rather, the layers are activated or driven concurrently to produce the desired color of light for the emissive region. In other configurations, an emissive region may include a single emissive layer of a single color, or multiple emissive layers of the same color, in which case the color of such an emissive layer will be the same as, or in the same region of the spectrum as, the color of the emissive region in which the emissive layer is disposed.

B. The OLEDs and the Devices of the Present Disclosure

Boron containing E-Hosts such as those with OBO core of Formula II have shallower LUMO energies compared to E-Hosts utilizing a triazine core. Thus when used as EHosts in OLEDs, OBOs result in reduced exciplex formation compared to the commonly used deep LUMO EHosts, such as triazines. This reduction in exciplex formation results in more saturated colors and in some instances blue-shifted emission, as well as an increase in the efficiency of the OLED device. In addition, due to their extended conjugation and planar nature, OBOs have high electron mobilities which can result in low device operating voltages.

However, OLEDs utilizing OBOs as EHosts often suffer from reduced device lifetimes compared to those with triazines. The detrimental effect on lifetime could be due to multiple reasons that are not all listed here, but one reason could be related to their shallower LUMO energy. Another reason could be related to the reactivity of the boron atom to reactive sites on the emitter or reactive sites on other compounds present in the emissive layer of the EML. In some embodiments, such reactive sites on the emitter could be sites that have LUMO density on them, in some embodiments such reactive sites with LUMO density on them include pyridines, pyrimidines, benzimidazoles, imidazoles, and triazines.

In some embodiments a sterically bulky group is added on the emitter on or in the vicinity of the reactive sites in order to reduce the likelihood of interacting with the boron center on the EHost. In some embodiments, a sterically bulky group is added on the boron containing EHost to reduce the likelihood of interacting with the reactive sites on the emitter.

This disclosure provides OLEDs with OBO E-Hosts of Formula II and Pt-tetradentate emitters of Formula I, where emitters with added bulks around the pyridine reactive site result in an increased device lifetime.

An OLED according to an embodiment of the present disclosure comprises an anode; a cathode; and an emissive layer, disposed between the anode and cathode; wherein the emissive layer comprises a first compound and a second compound; wherein the first compound has a structure of Formula I:

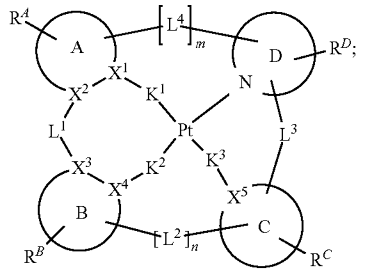

wherein:

each of moiety A, moiety B, moiety C, and moiety D is independently a monocyclic ring or a polycyclic fused ring system, where the monocyclic ring or each ring of the polycyclic fused ring system is independently a 5-membered or 6-membered carbocyclic or heterocyclic ring;

each of $X^1$ to $X^5$ is independently C or N;

each of $K^1$, $K^2$, and $K^3$ is independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;

m and n are each independently 0 or 1;

m+n=1 or 2;

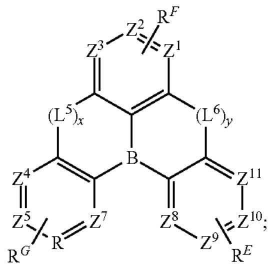

wherein the second compound has a structure of Formula II, wherein:

each of $Z^1$ to $Z^1$ is independently C or N;

x and y are each independently 0 or 1;

wherein the LUMO energy of the second compound is less than or equal to −2.33 eV;

wherein:

each of $L^1$, $L^2$, $L^3$, $L^4$, $L^5$, and $L^6$ is independently selected from the group consisting of a direct bond, or a linker selected from the group consisting of BR, BRR', NR, PR, P(O)R, O, S, Se, C═O, C═S, C═Se, C═NR', C═CR"R"', S═O, $SO_2$, CR, CRR', SiRR', GeRR', alkyl, cycloalkyl, aryl, heteroaryl, and combinations thereof;

each of $R^A$, $R^B$, $R^C$, $R^D$, $R^E$, $R^F$, and $R^G$ independently represents mono to the maximum allowable substitution, or no substitution;

each $R^\alpha$, $R^\beta$, R, R', R", R"', $R^A$, $R^B$, $R^C$, $R^D$, $R^E$, $R^F$, and $R^G$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents may be joined or fused to form a ring; with at least one of the following conditions being true:

(1) wherein at least one $R^D$ substituent is not hydrogen;

(2) wherein one of moiety A, B, C, or D of Formula I comprises a pyridine moiety coordinated to Pt, and the pyridine moiety having a center of gravity C1; wherein the closest calculated intermolecular distance at 0K between C1 and the boron atom of Formula II is greater than or equal to 3.57 Å;

(3) wherein at least one of $R^E$, $R^G$, or $R^F$ of Formula II has a spherocity greater than or equal to 0.04, and the LUMO energy of Formula II is less than or equal to −2.33 eV; and (4) when moiety A is benzimidazole, each of moiety B and moiety C is phenyl, moiety D is pyridine, and $X^1$ is N, at least one of the following two conditions is true:

(a) a combined molecular weight of all of the at least one $R^D$ substituents that are not hydrogen is >57 g/mol; or (b) two $R^D$ substituents are joined together to form a ring.

In some embodiment, condition (2) is true. In some embodiments, condition (3) is true. In some embodiments, both conditions (1) and (2) are true. In some embodiments, both conditions (1) and (3) are true. In some embodiments, both conditions (1) and (4) are true. In some embodiments, both conditions (2) and (3) are true. In some embodiments, both conditions (2) and (4) are true. In some embodiments, both conditions (3) and (4) are true. In some embodiments, all the conditions are true.

In some embodiments, each $R^\alpha$, $R^\beta$, R, R', R", R'", $R^A$, $R^B$, $R^C$, $R^D$, $R^E$, $R^F$, and $R^G$ is independently a hydrogen or a substituent selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

In some embodiments, each of moiety A, moiety B, moiety C, and moiety D is independently selected from the group consisting of benzene, pyridine, pyrimidine, pyridazine, pyrazine, triazine, imidazole, imidazole derived carbene, pyrazole, pyrrole, oxazole, furan, thiophene, thiazole, triazole, naphthalene, quinoline, isoquinoline, quinazoline, benzofuran, aza-benzofuran, benzoxazole, aza-benzoxazole, benzothiophene, aza-benzothiophene, benzothiazole, aza-benzothiazole, benzoselenophene, aza-benzoselenophene, indene, aza-indene, indole, aza-indole, benzimidazole, aza-benzimidazole, benzimidazole derived carbene, aza-benzimidazole derived carbene, carbazole, aza-carbazole, dibenzofuran, aza-dibenzofuran, dibenzothiophene, aza-dibenzothiophene, quinoxaline, phthalazine, phenanthrene, aza-phenanathrene, anthracene, aza-antracene, phenanthridine, fluorene, and aza-fluorene.

In some embodiments, moiety A is a monocyclic ring.

In some embodiments, moiety A is a polycyclic fused ring system.

In some embodiments, the ring comprising $X^1$ and $X^2$ is an N-heterocyclic carbene ligand.

In some embodiments, $X^1$ is C and $X^2$ is N. In some embodiments, $X^1$ is N and $X^2$ is C.

In some embodiments, $X^3$ is C and $X^4$ is C.

In some embodiments, moiety B is a monocyclic ring. In some embodiments, moiety B is benzene. In some embodiments, moiety B is a polycyclic fused ring system.

In some embodiments, $X^5$ is C.

In some embodiments, moiety C is a monocyclic ring. In some embodiments, moiety C is benzene. In some embodiments, moiety C is a polycyclic fused ring system.

In some embodiments, moiety D is a monocyclic ring. In some embodiments, moiety D is pyridine. In some embodiments, moiety D is a polycyclic fused ring system.

In some embodiments, $L^1$ is a direct bond. In some embodiments, $L^1$ is selected from the group consisting of O, S, and Se. In some embodiments, $L^1$ is selected from the group consisting of BR, NR, and PR. In some embodiments, $L^2$ is selected from the group consisting of BRR', CRR', SiRR', and GeRR'. In some embodiments, $L^2$ is selected from the group consisting of P(O)R, C═O, C═S, C═Se, C═NR', C═CR"R'", S═O, $SO_2$, and CR. In some embodiments, $L^1$ is selected from the group consisting of alkyl, cycloalkyl, aryl, and heteroaryl.

In some embodiments, wherein n in Formula I is 0. In some embodiments, n is 1.

In some embodiments, $L^2$ is a direct bond. In some embodiments, $L^2$ is selected from the group consisting of O, S, and Se. In some embodiments, $L^2$ is selected from the group consisting of BR, NR, and PR. In some embodiments, $L^2$ is selected from the group consisting of BRR', CRR', SiRR', and GeRR'. In some embodiments, $L^2$ is selected from the group consisting of P(O)R, C═O, C═S, C═Se, C═NR', C═CR"R'", S═O, $SO_2$, and CR. In some embodiments, $L^2$ is selected from the group consisting of alkyl, cycloalkyl, aryl, and heteroaryl.

In some embodiments, $L^3$ is a direct bond. In some embodiments, $L^3$ is selected from the group consisting of O, S, and Se. In some embodiments, $L^3$ is selected from the group consisting of BR, NR, and PR. In some embodiments, $L^3$ is selected from the group consisting of BRR', CRR', SiRR', and GeRR'. In some embodiments, $L^3$ is selected from the group consisting of P(O)R, C═O, C═S, C═Se, C═NR', C═CR"R'", S═O, $SO_2$, and CR. In some embodiments, $L^3$ is selected from the group consisting of alkyl, cycloalkyl, aryl, and heteroaryl.

In some embodiments, m in Formula I is 0. In some embodiments, m is 1.

In some embodiments, $L^4$ is a direct bond. In some embodiments, $L^4$ is selected from the group consisting of O, S, and Se. In some embodiments, $L^4$ is selected from the group consisting of BR, NR, and PR. In some embodiments, $L^4$ is selected from the group consisting of BRR', CRR', SiRR', and GeRR'. In some embodiments, $L^4$ is selected from the group consisting of P(O)R, C═O, C═S, C═Se, C═NR', C═CR"R'", S═O, $SO_2$, and CR. In some embodiments, $L^4$ is selected from the group consisting of alkyl, cycloalkyl, aryl, and heteroaryl.

In some embodiments, $K^1$ is a direct bond. In some embodiments, $K^1$ is selected from the group consisting of O and S. In some embodiments, $K^1$ is selected from the group consisting of $N(R^\alpha)$, $P(R^\alpha)$, and $B(R^\alpha)$. In some embodiments, $K^1$ is selected from the group consisting of $C(R^\alpha)(R^\beta)$, and $Si(R^\alpha)(R^\beta)$.

In some embodiments, $K^2$ is a direct bond. In some embodiments, $K^2$ is selected from the group consisting of O and S. In some embodiments, $K^2$ is selected from the group consisting of $N(R^\alpha)$, $P(R^\alpha)$, and $B(R^\alpha)$. In some embodiments, $K^2$ is selected from the group consisting of $C(R^\alpha)(R^\beta)$, and $Si(R^\alpha)(R^\beta)$.

In some embodiments, $K^3$ is a direct bond. In some embodiments, $K^3$ is selected from the group consisting of O and S. In some embodiments, $K^3$ is selected from the group consisting of $N(R^{\alpha})$, $P(R^{\alpha})$, and $B(R^{\alpha})$. In some embodiments, $K^3$ is selected from the group consisting of $C(R^{\alpha})(R^{\beta})$, and $Si(R^{\alpha})(R^{\beta})$.

In some embodiments, each of $K^1$, $K^2$, and $K^3$ is a direct bond. In some embodiments, one of $K^1$, $K^2$, or $K^3$ is selected from the group consisting of O, S, $N(R^{\alpha})$, $P(R^{\alpha})$, $B(R^{\alpha})$, $C(R^{\alpha})(R^{\beta})$, and $Si(R^{\alpha})(R^{\beta})$, and the other two of $K^1$, $K^2$, and $K^3$ are direct bonds.

In some embodiments, moiety A is benzimidazole, each of moiety B and moiety C is phenyl, moiety D is pyridine, and $X^1$ is N.

In some embodiments, at least one $R^A$ substituent is not hydrogen. In some embodiments, at least one $R^A$ has a molecular weight of at least 57 g/mol.

In some embodiments, at least one $R^B$ substituent is not hydrogen. In some embodiments, at least one $R^C$ substituent is not hydrogen.

In some embodiments, the molecular weight of each of the at least one $R^D$ substituents that are not hydrogen is ≥57 g/mol. In some embodiments, the combined molecular weight of all of the at least one $R^D$ substituents that are not hydrogen is ≥77 g/mol.

In some embodiments, at least one $R^D$ is a bulky group. In some embodiments, at least one $R^D$ has a structure selected from the structures of the following LIST 1:

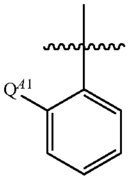
,
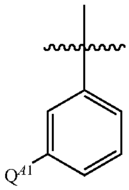
,
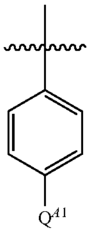
,
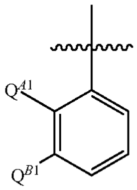
,
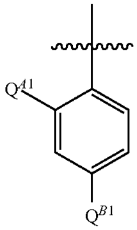
,
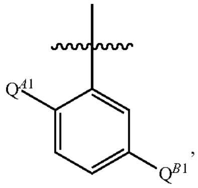
,
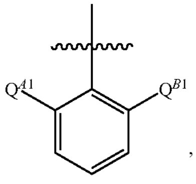
,
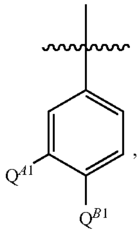
,
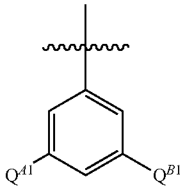
,
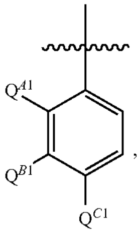
,
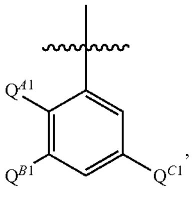
,
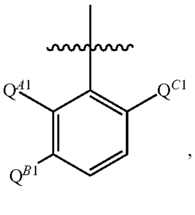
, -continued

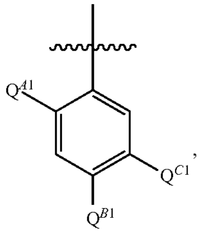
,
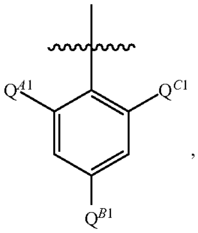
,
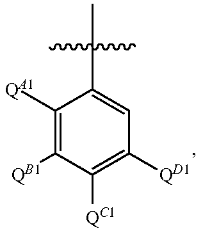
,
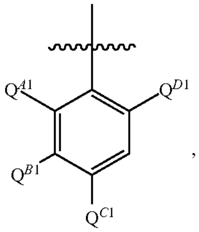
,
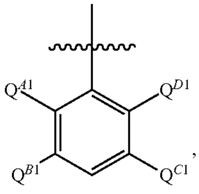
,
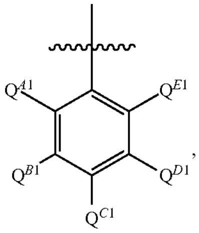
,
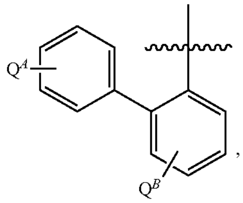
,
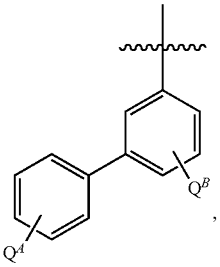
,
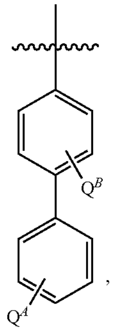
,
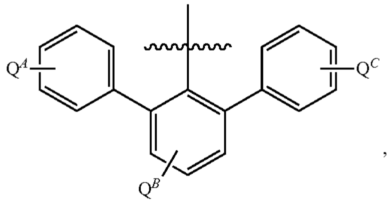
,
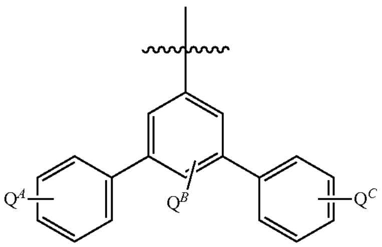
, -continued
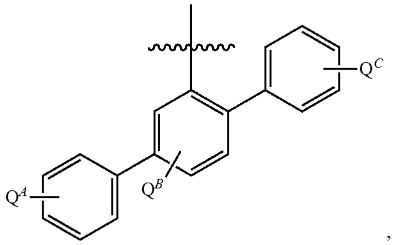
,
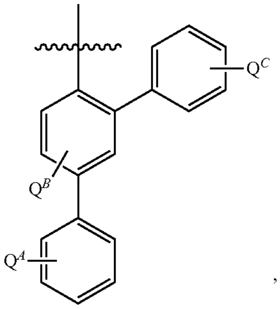
,
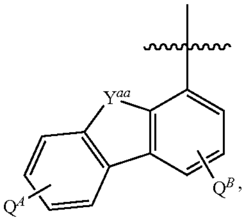
,
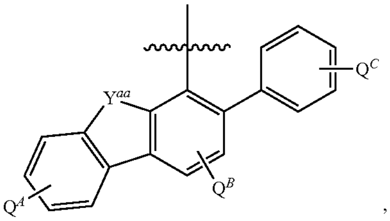
,
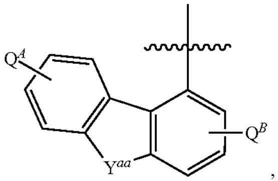
,
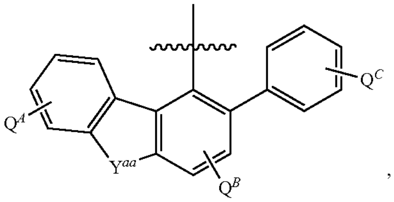
,
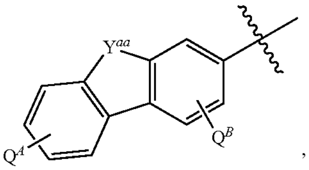
,
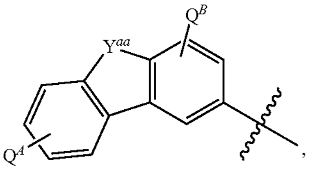
,
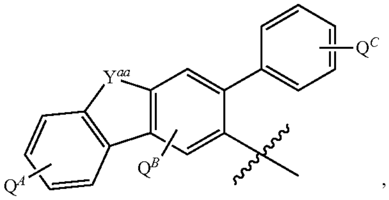
,
-continued
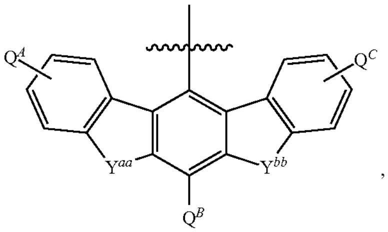
,
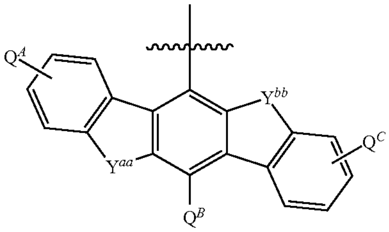
,
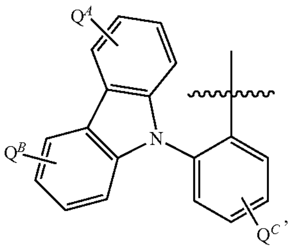
,
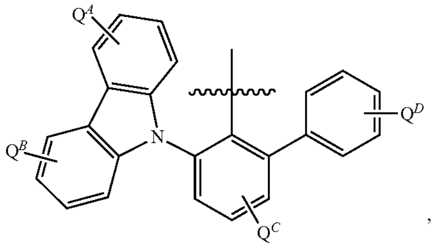
,
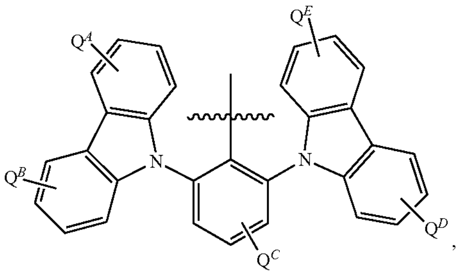
,
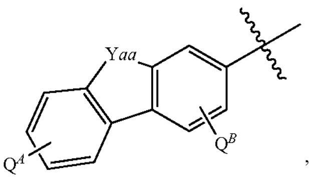
,
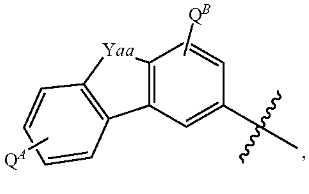
, -continued

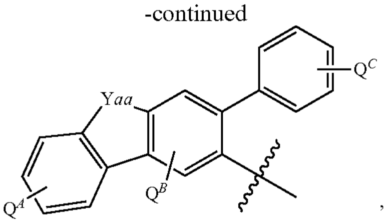

,

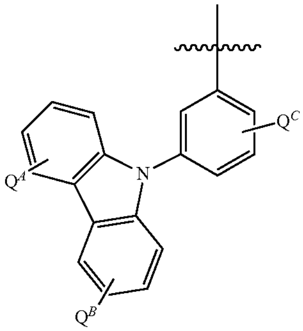

, and

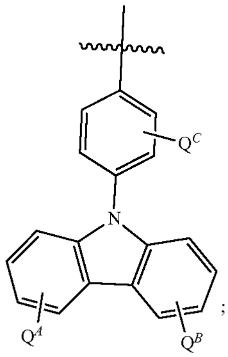

;

wherein: each $Y^{aa}$ and $Y^{bb}$ is independently selected from the group consisting of a direct bond, BR, BRR', NR, PR, O, S, Se, C═O, C═S, C═Se, C═NR, C═CRR', S═O, $SO_2$, CR, CRR', SiRR', GeRR', alkyl, cycloalkyl, aryl, heteroaryl, and combinations thereof;

each of $Q^A$, $Q^B$, $Q^C$, $Q^D$, and $Q^E$ independently represents mono to the maximum allowable substitution, or no substitution;

each R, R', $Q^A$, $Q^B$, $Q^C$, $Q^D$, $Q^E$, $Q^{A1}$, $Q^{B1}$, $Q^{C1}$, $Q^{D1}$ and $Q^{E1}$ is independently a hydrogen or a substituent selected from the group consisting of alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

In some embodiments, at least one $R^D$ has a structure selected from the group consisting of the structures of the following LIST 2:

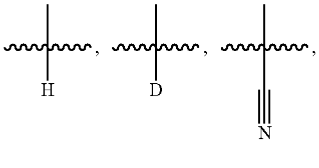, Me, iPr, tBu, $CD_3$,

-continued

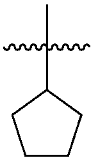, 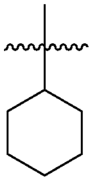, 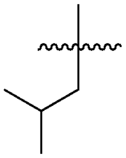, 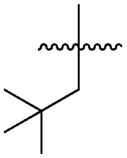,

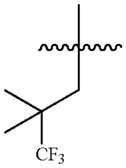, 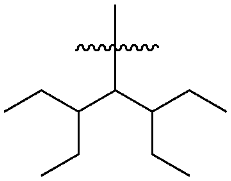, 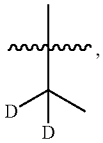,

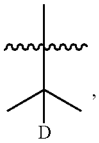, 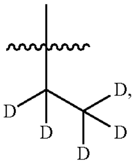, 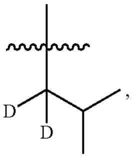, 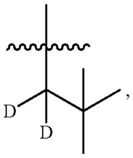,

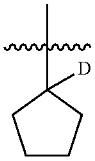, 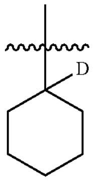, 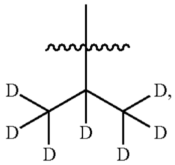, 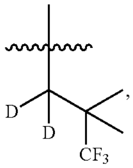,

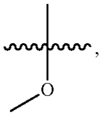, 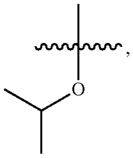, 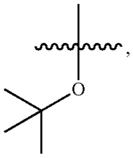, 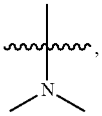,

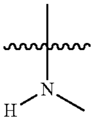, 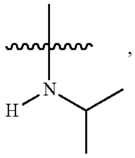, 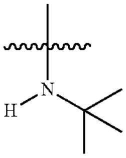, 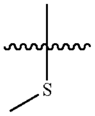,

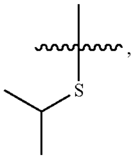, 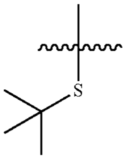, 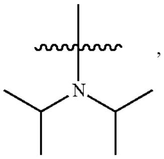,

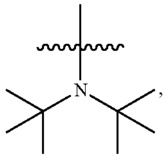, 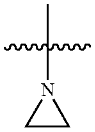, 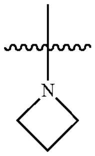, 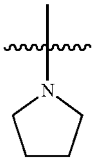,

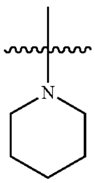, 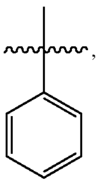, 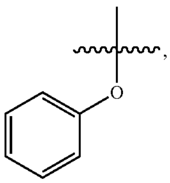, 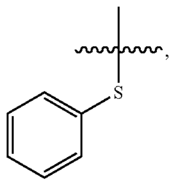,

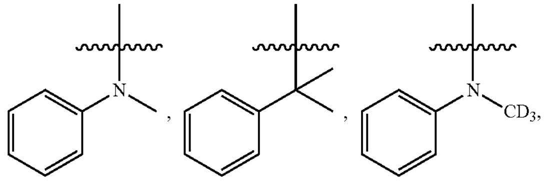

-continued
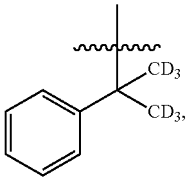, 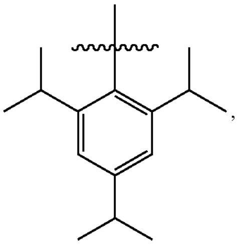,
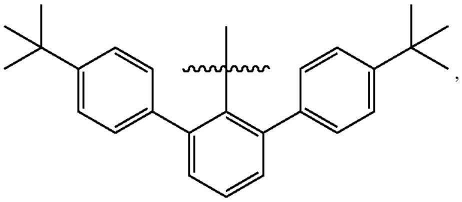,
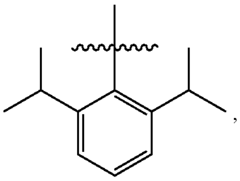, 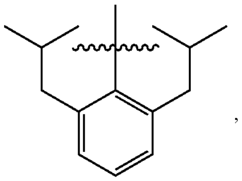,
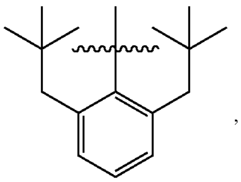, 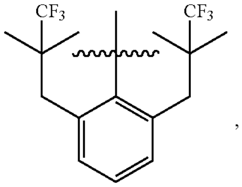,
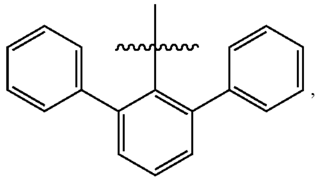,
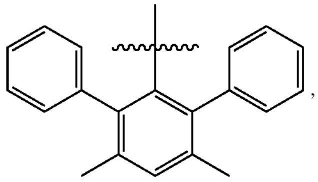,
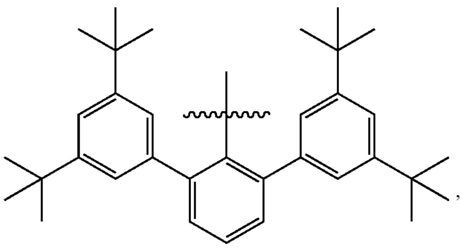,
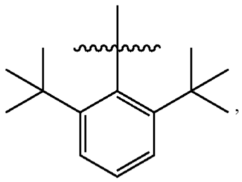, 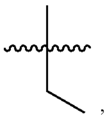, 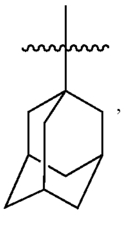,
-continued
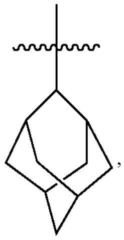, 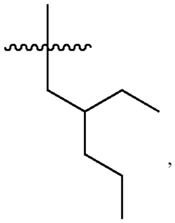, 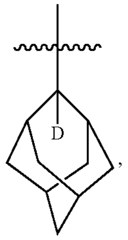,
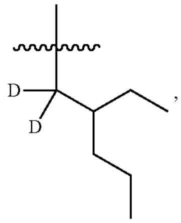, 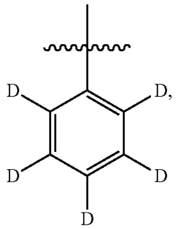, 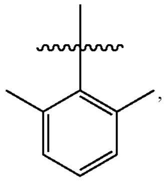,
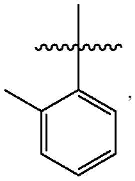, 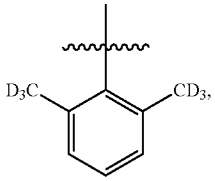, 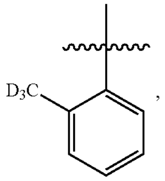,
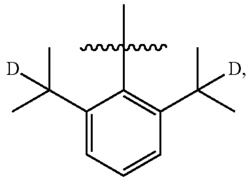, 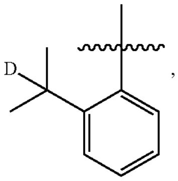,
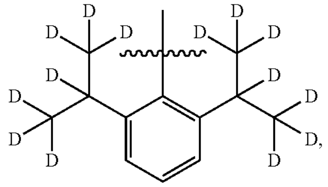
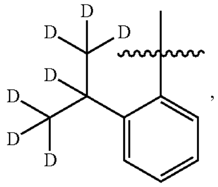, 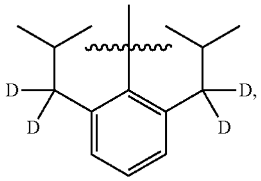
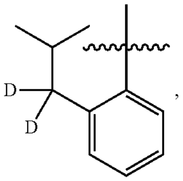, 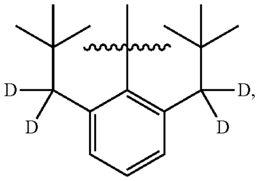
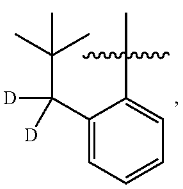, 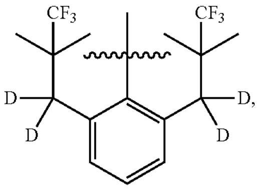

-continued
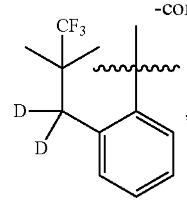
,
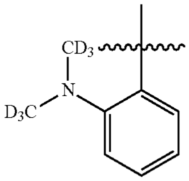
,
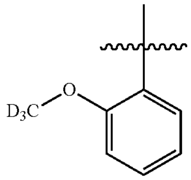
,
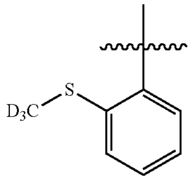
,
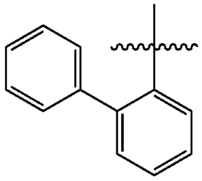
,
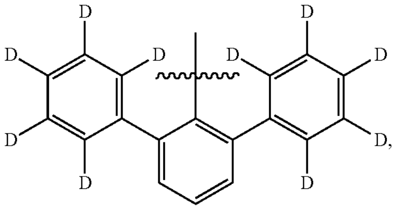
,
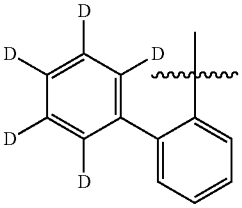
,
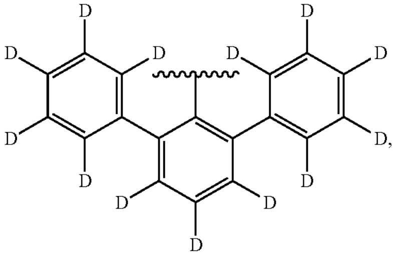
,
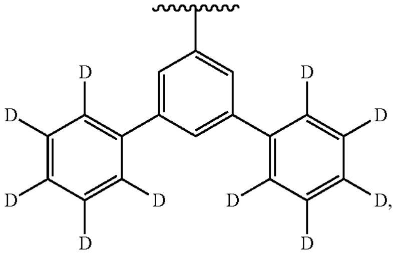
,
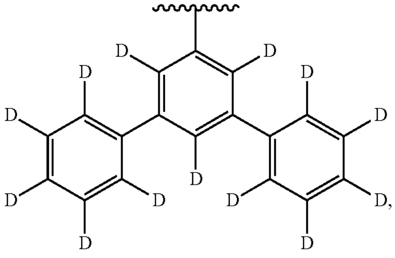
,
-continued
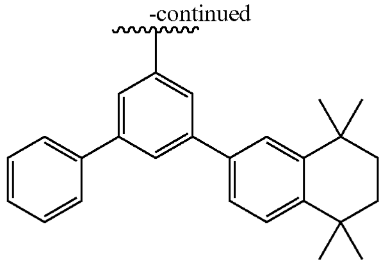
,
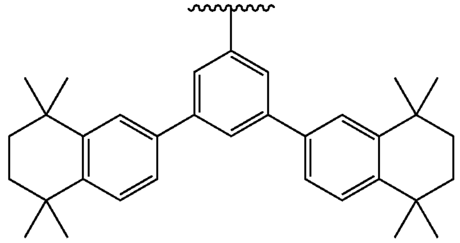
,
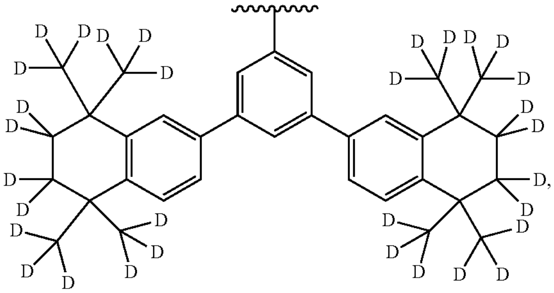
,
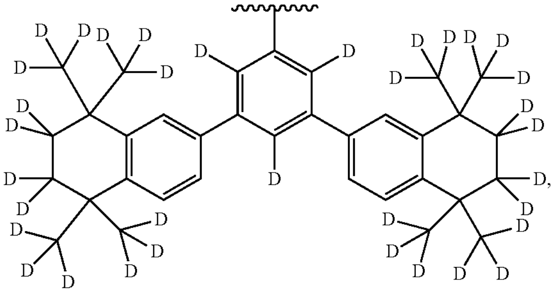
,
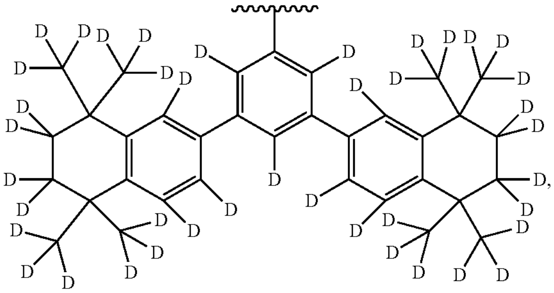
,
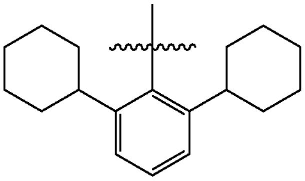
,
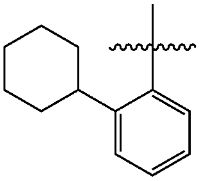
,
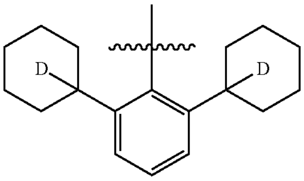
,
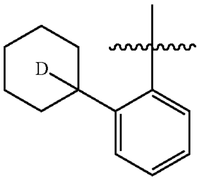
, -continued
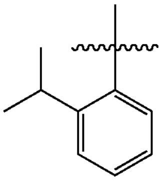,
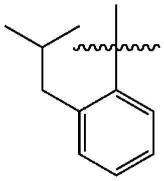,
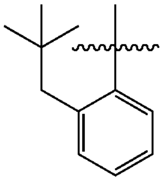,
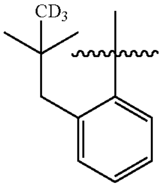,
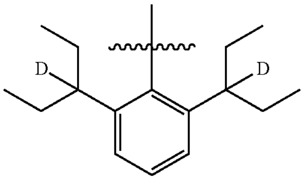,
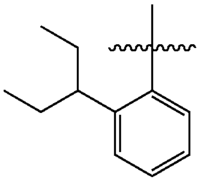,
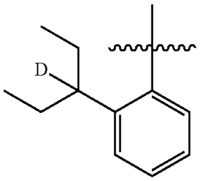,
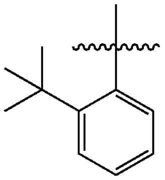,
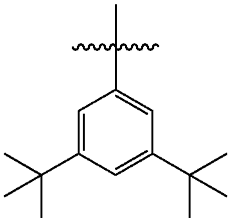,
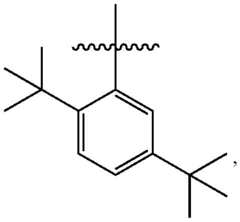,
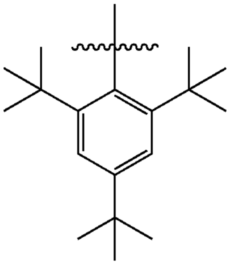,
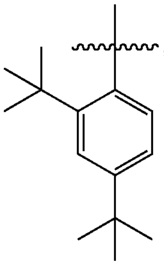,
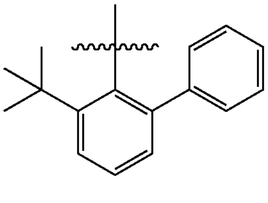,
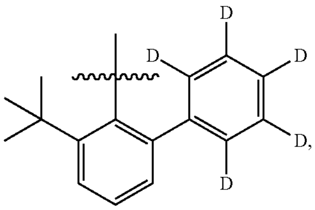
-continued
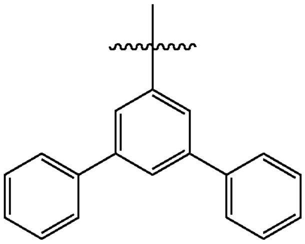,
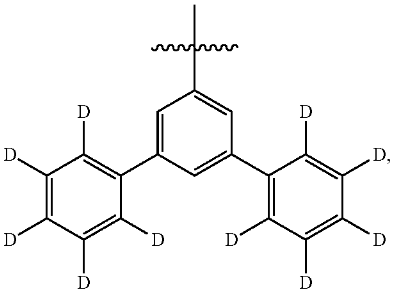
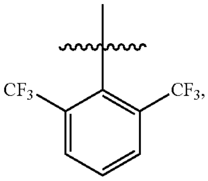
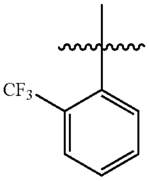
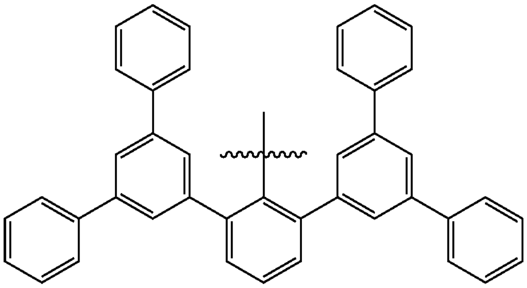,
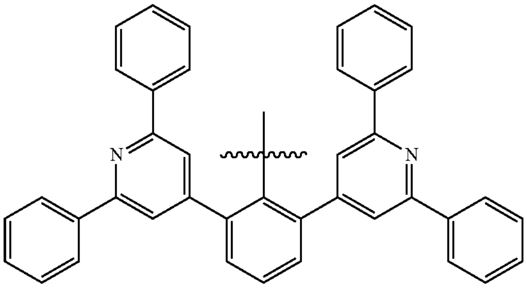,
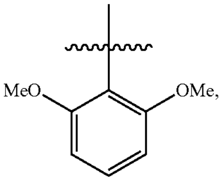
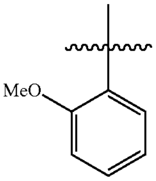,
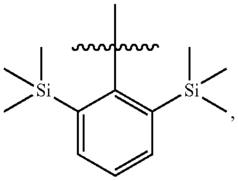
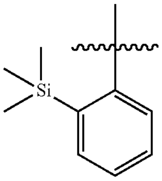, -continued
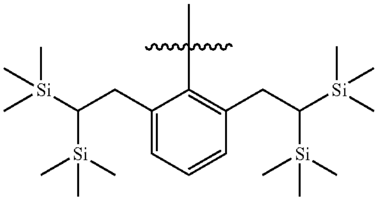,
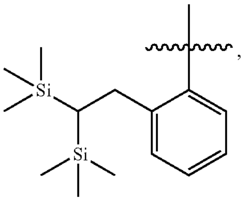,
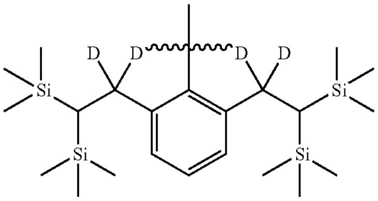,
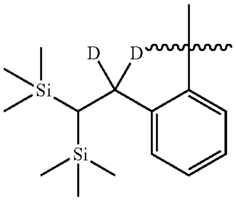, 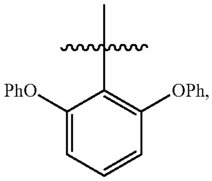,
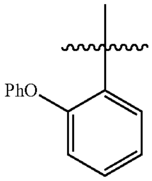, 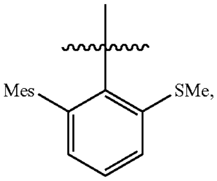,
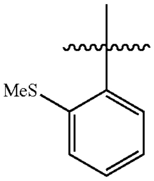, 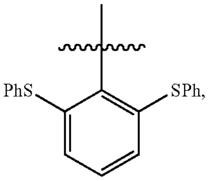, 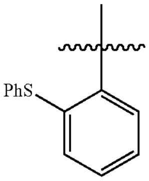,
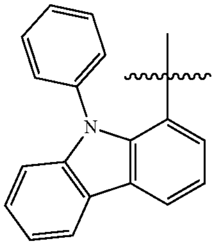,
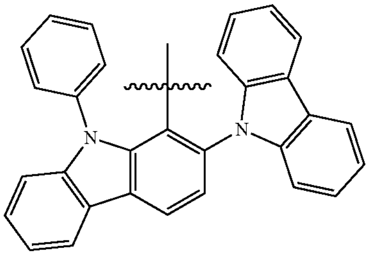,
-continued
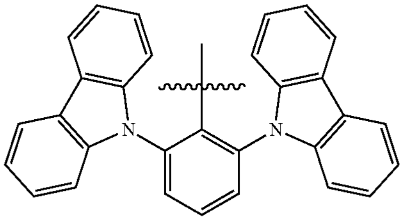,
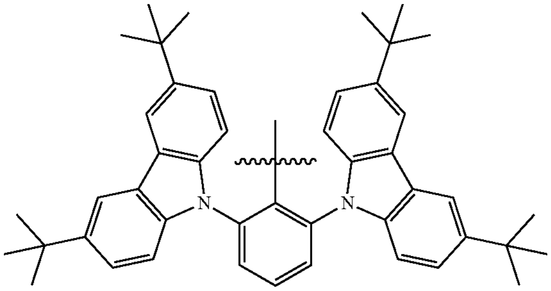,
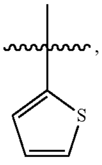, 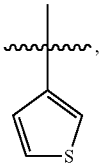, 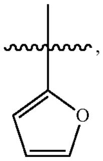, 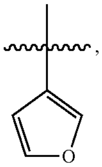,
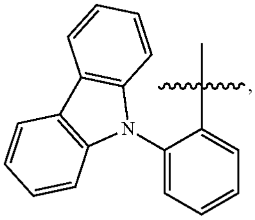,
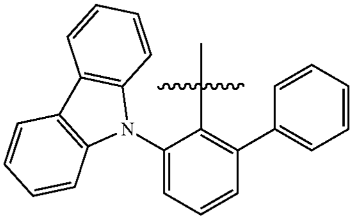,
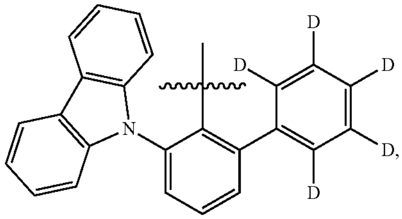,
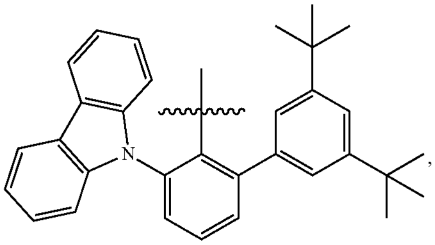, -continued
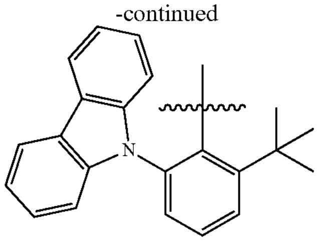
,
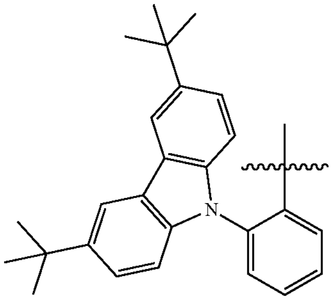
,
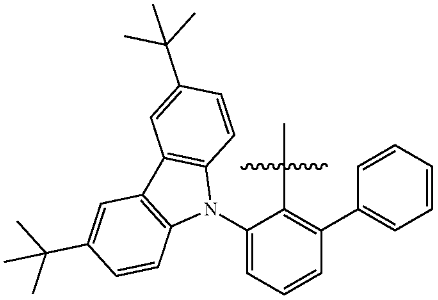
,
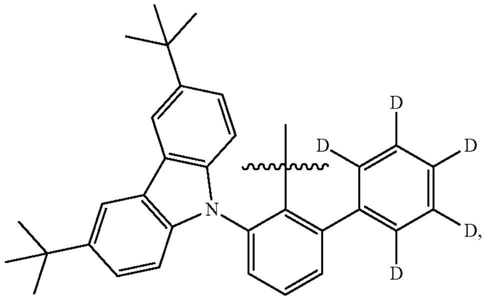
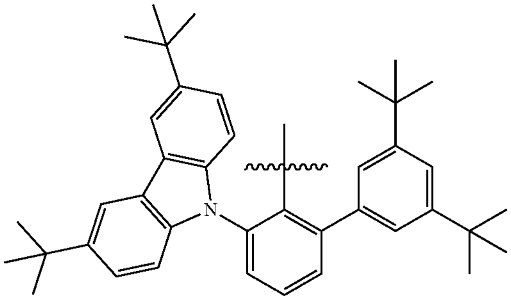
,
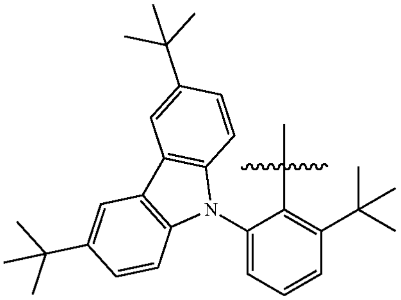
,
-continued
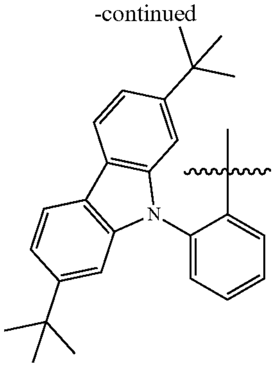
,
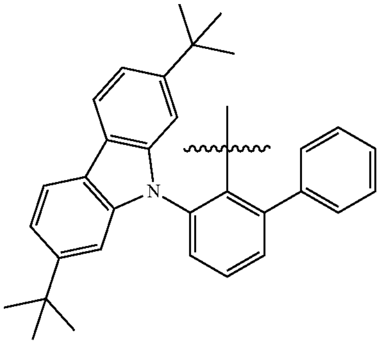
,
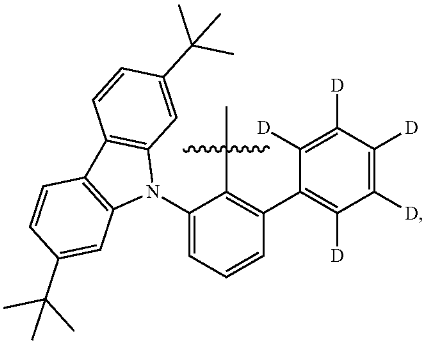
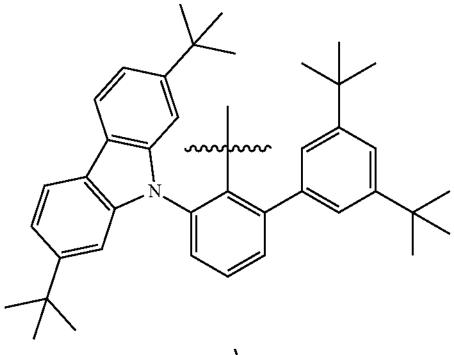
,
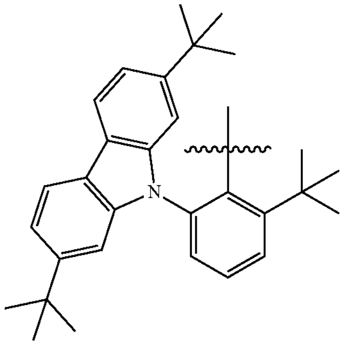
,

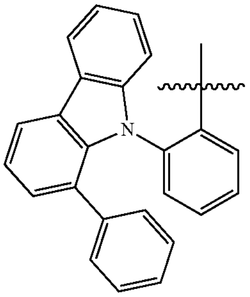,
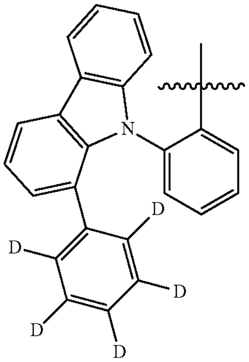,
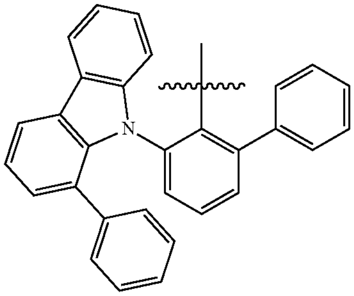,
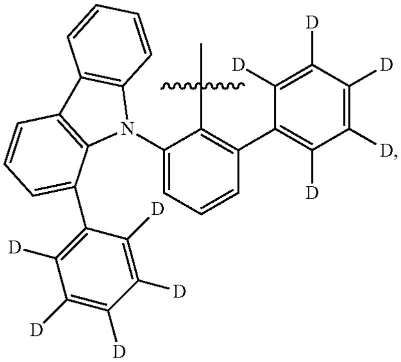,
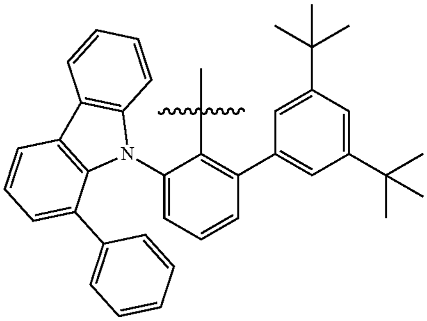,
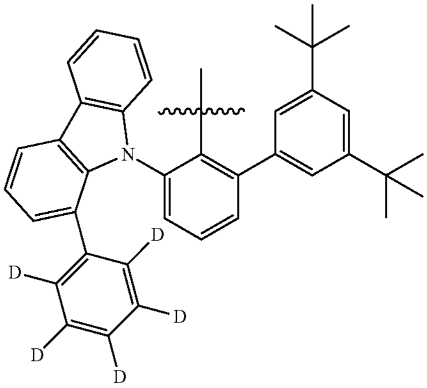,
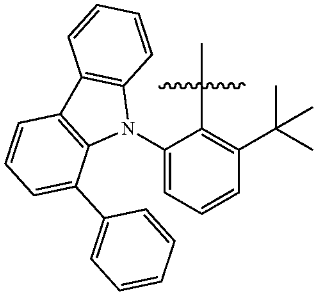,
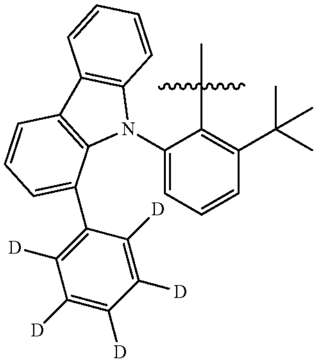,
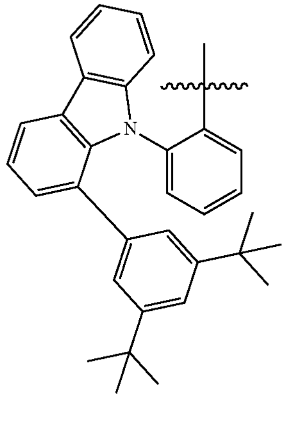,
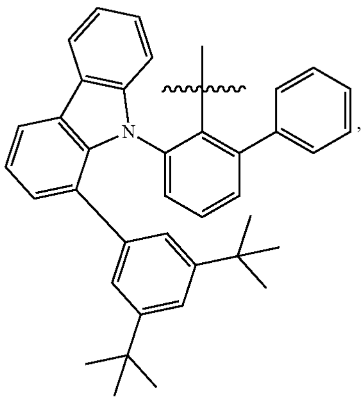, -continued
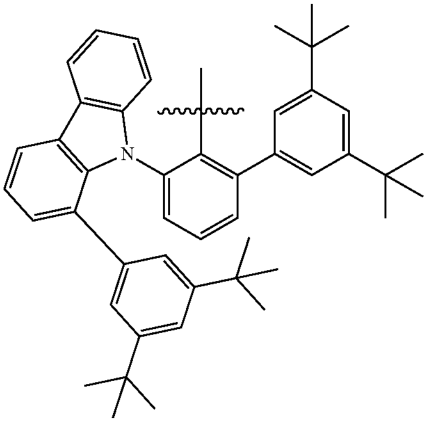
,
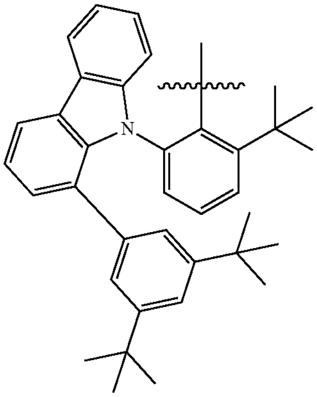
,
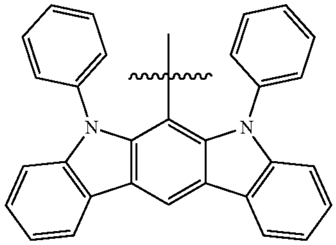
,
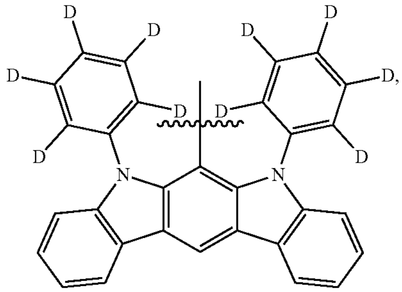
,
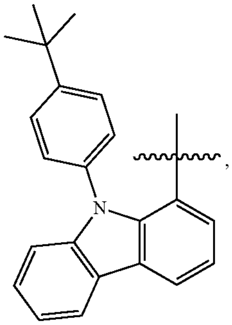
,
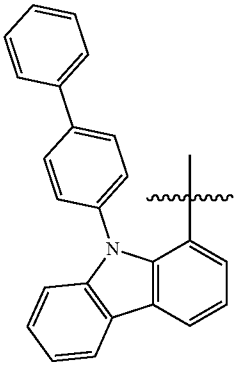
,
-continued
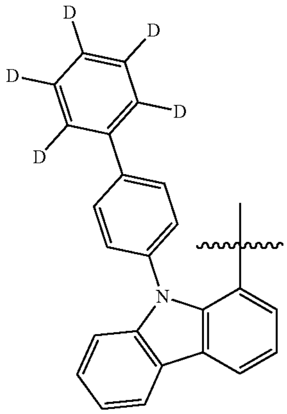
,
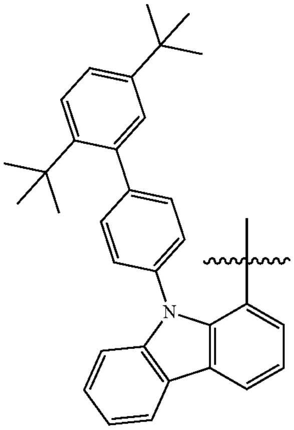
,
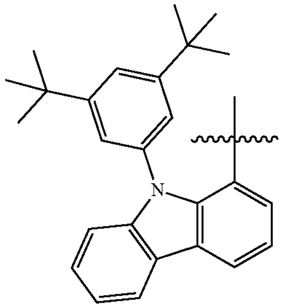
,
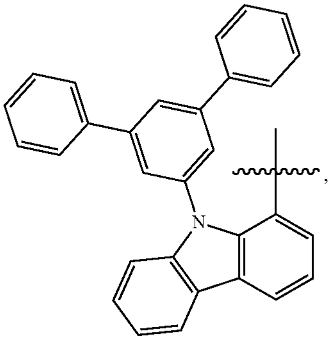
, -continued
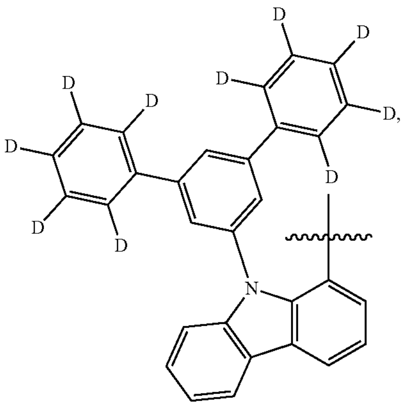
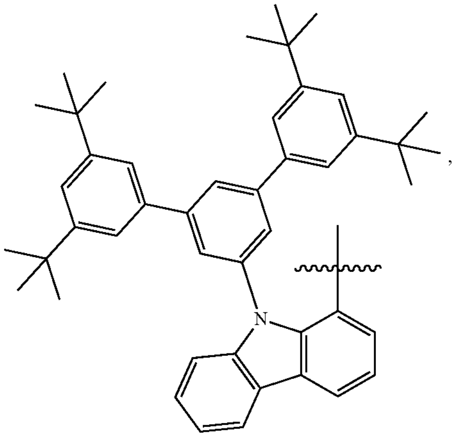
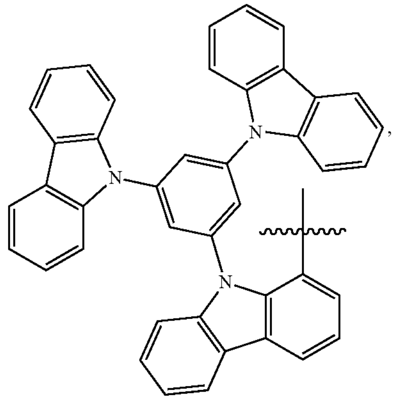
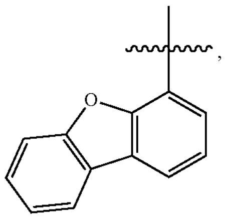
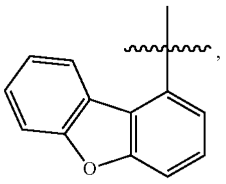
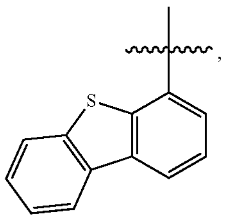
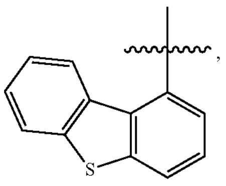
-continued
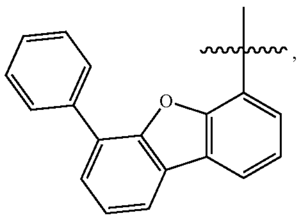
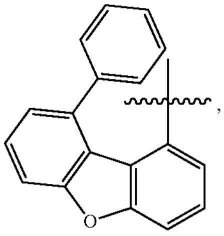
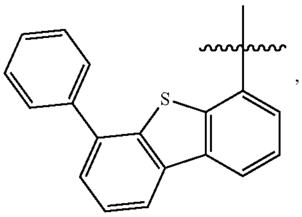
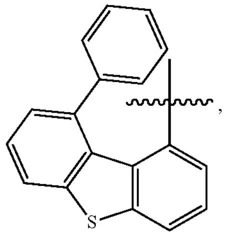
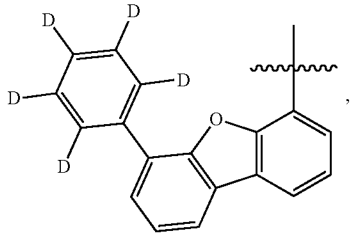
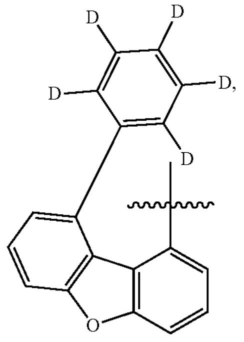
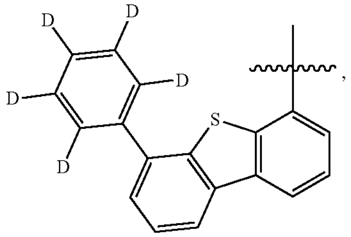
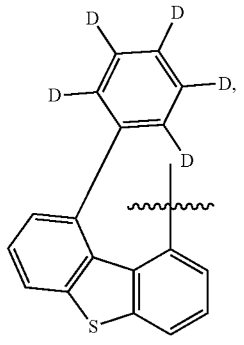

-continued
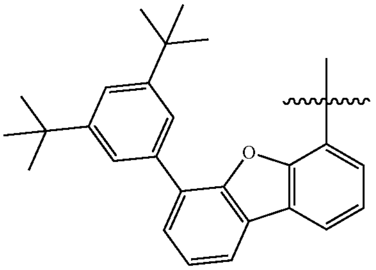
,
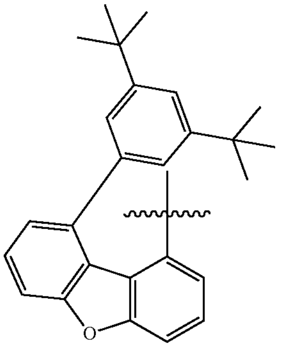
,
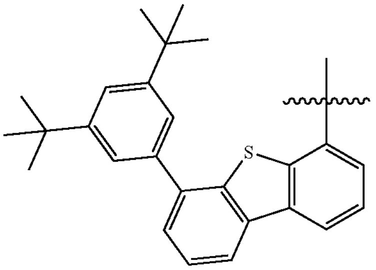
,
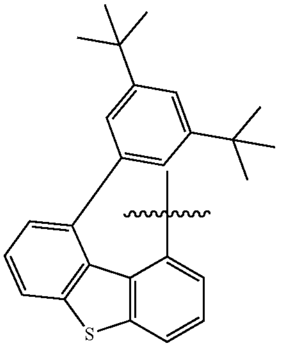
,
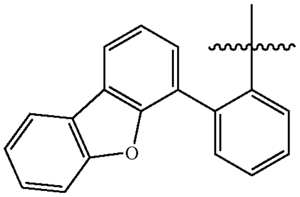
,
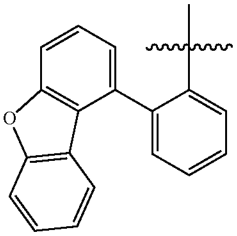
,
-continued
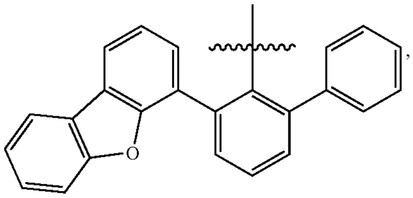
,
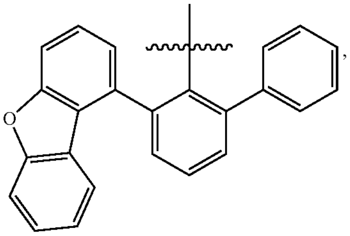
,
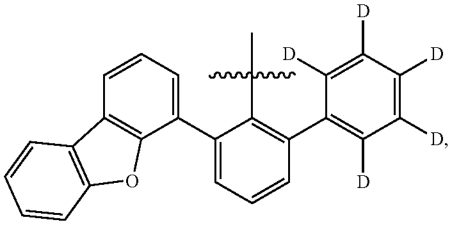
,
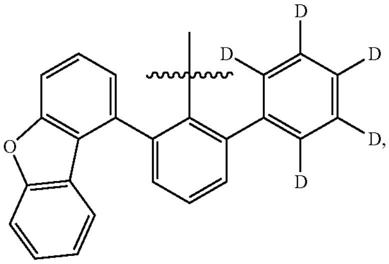
,
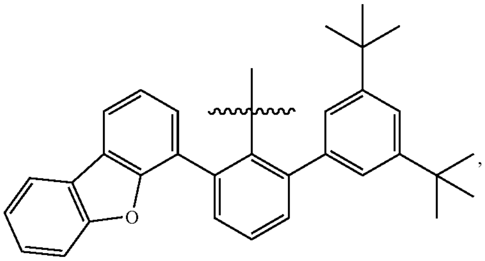
,
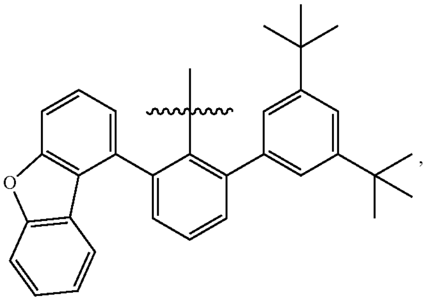
,
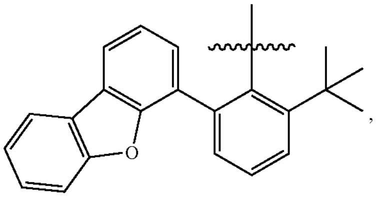
, -continued
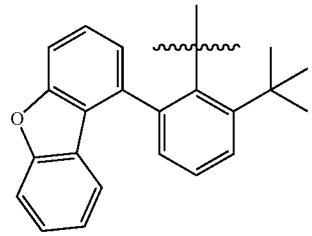
,
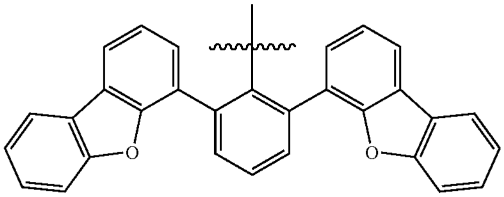
,
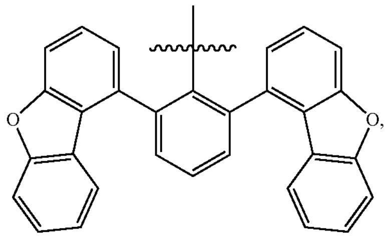
,
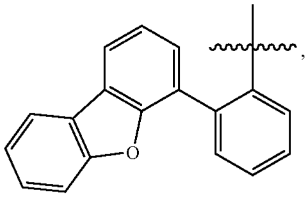
,
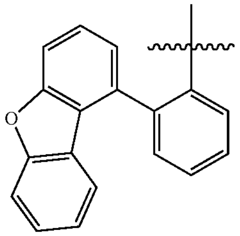
,
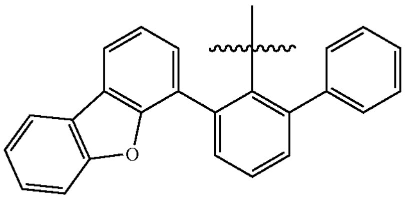
,
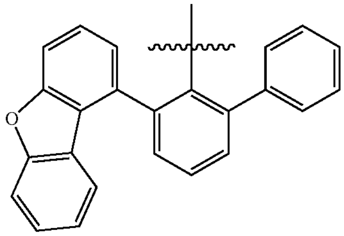
,
-continued
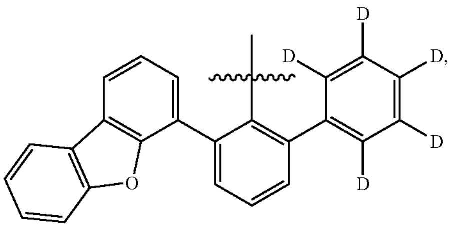
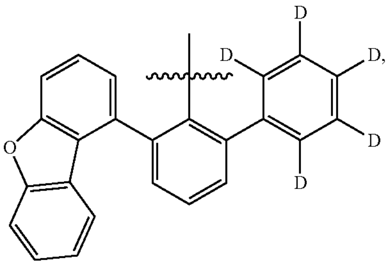
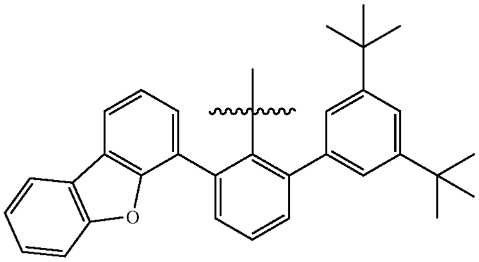
,
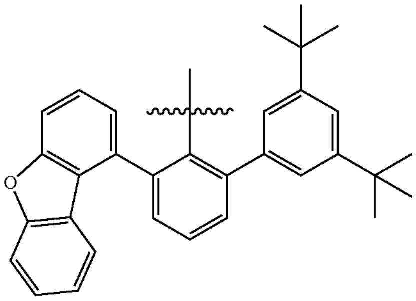
,
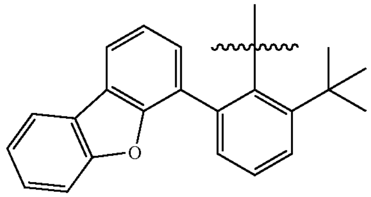
,
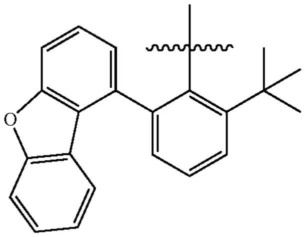
,
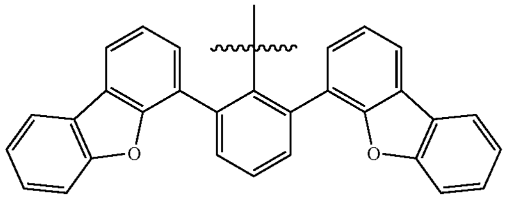
, -continued
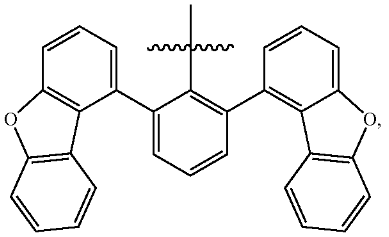
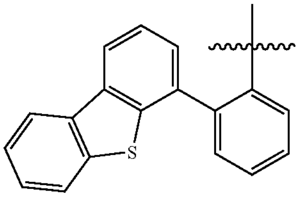
,
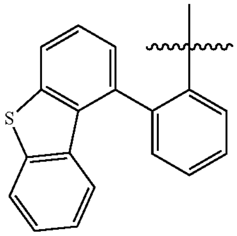
,
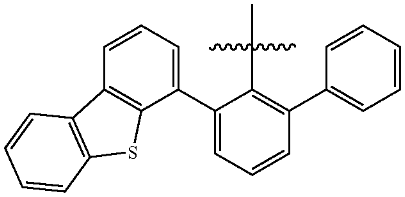
,
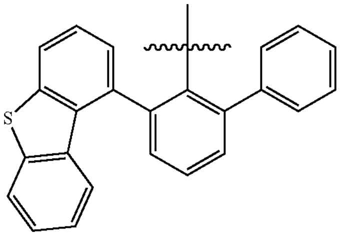
,
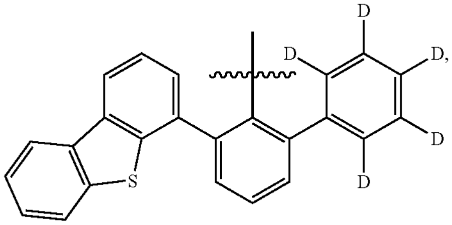
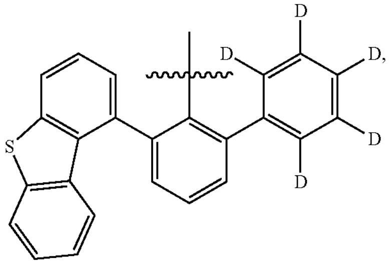
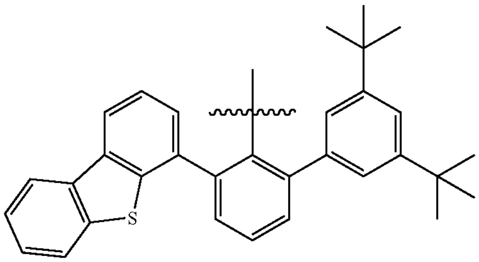
,
-continued
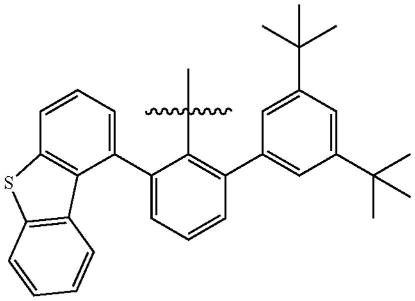
,
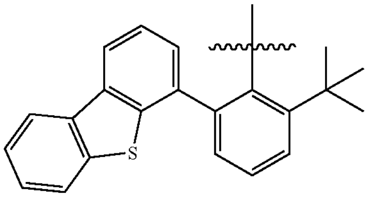
,
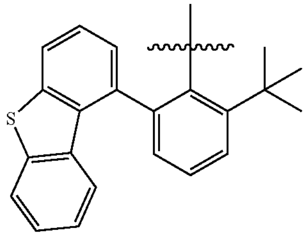
,
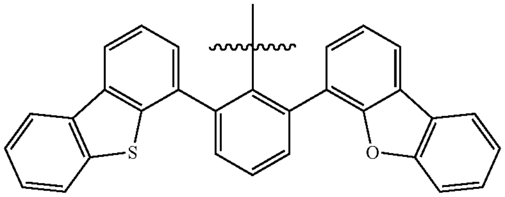
,
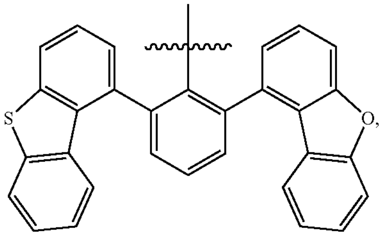
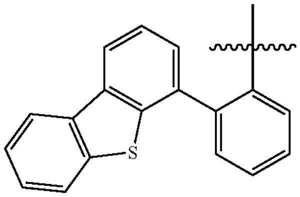
,
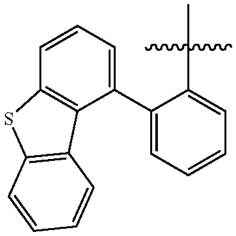
,
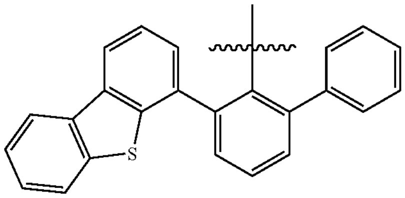
,

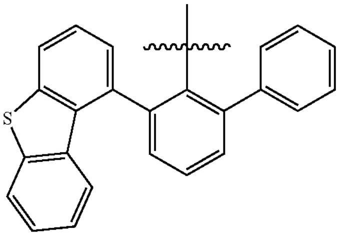
,
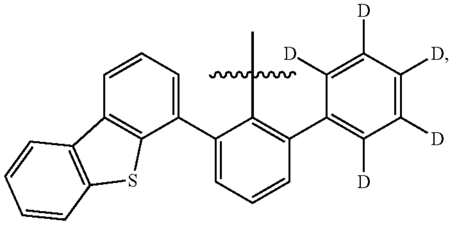
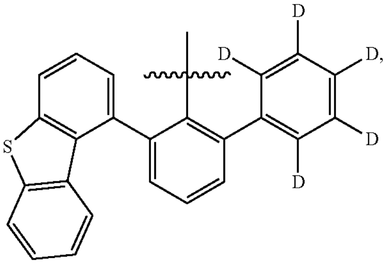
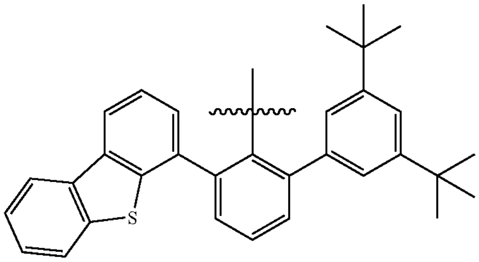
,
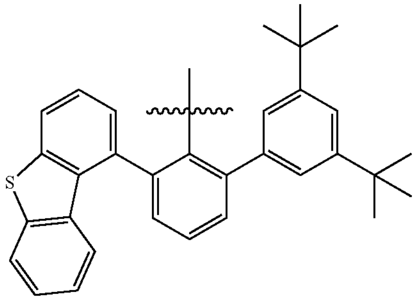
,
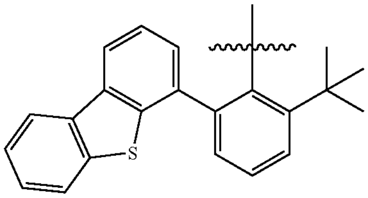
,
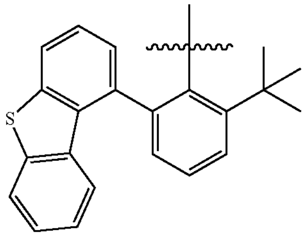
,
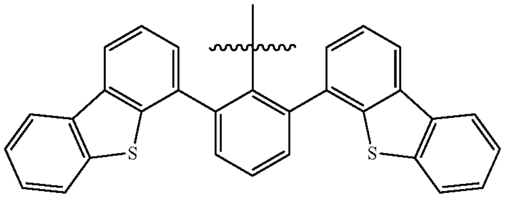
,
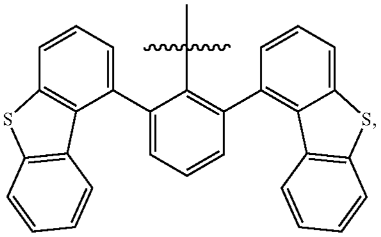
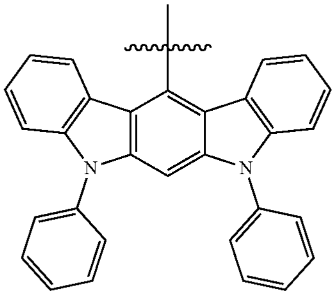
,
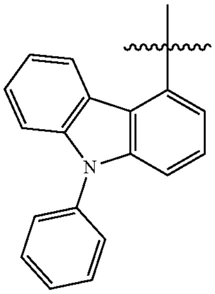
,
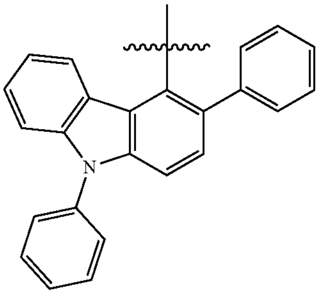
,
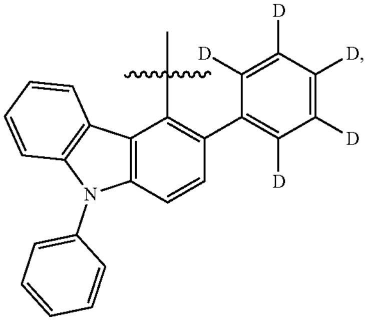
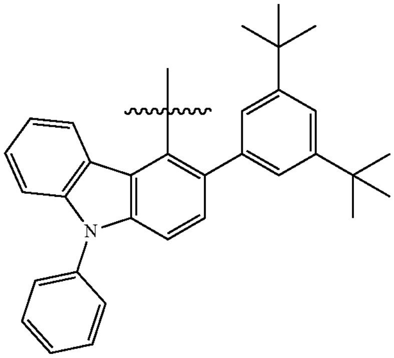
, -continued
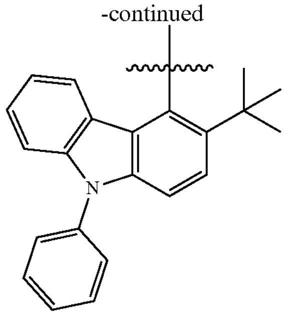
,
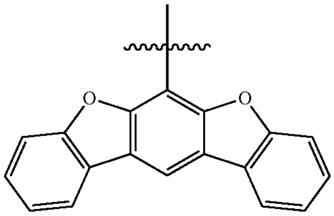
,
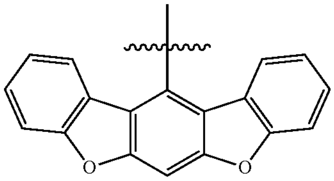
,
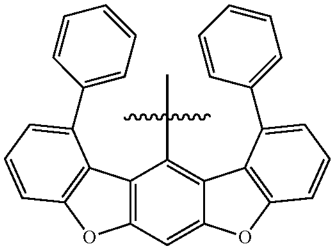
,
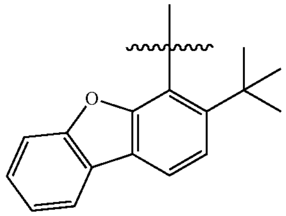
,
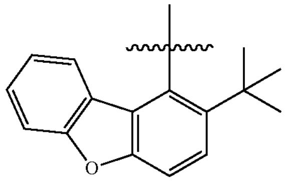
,
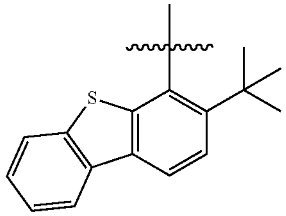
,
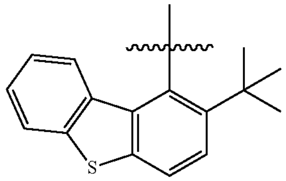
-continued
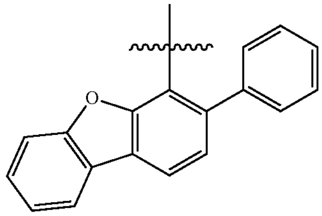
,
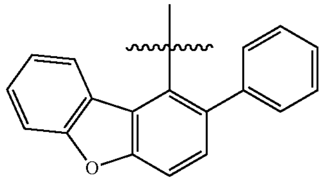
,
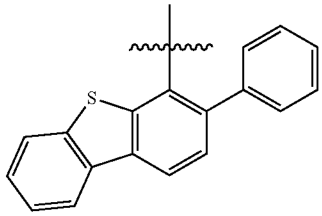
,
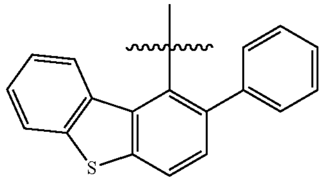
,
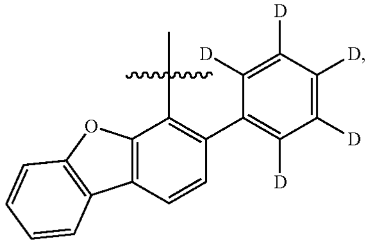
,
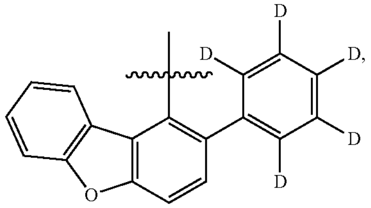
,
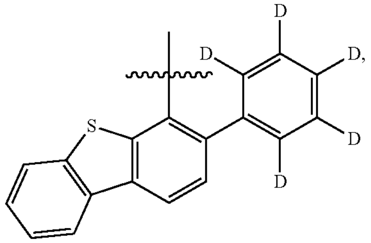
,
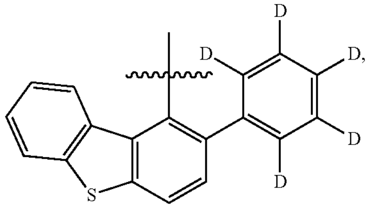
, -continued
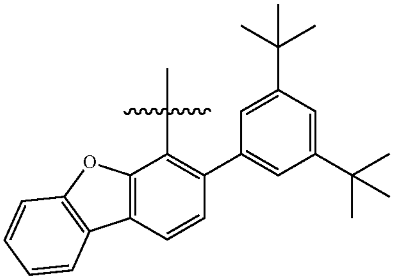
,
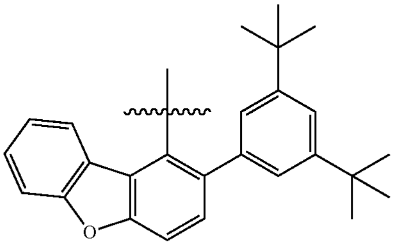
,
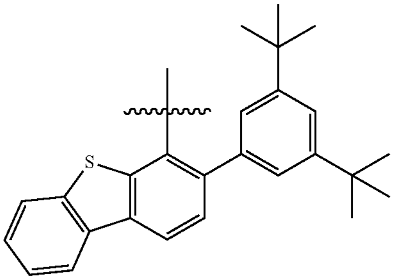
,
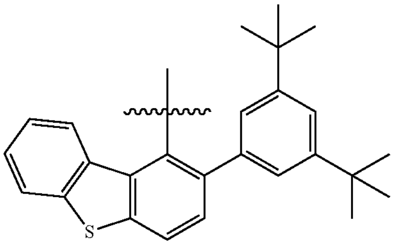
,
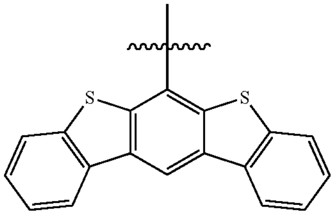
,
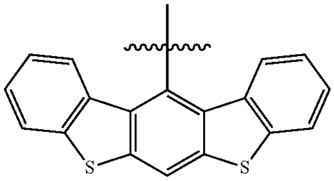
,
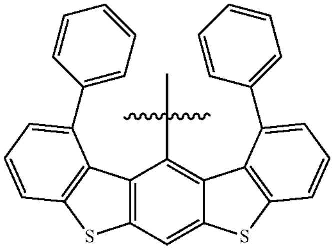
,
-continued
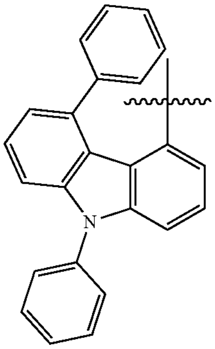
,
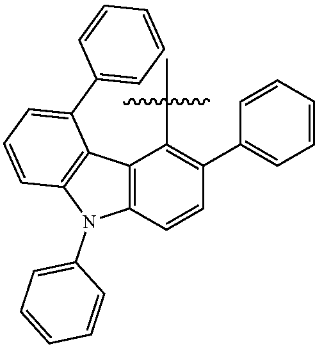
,
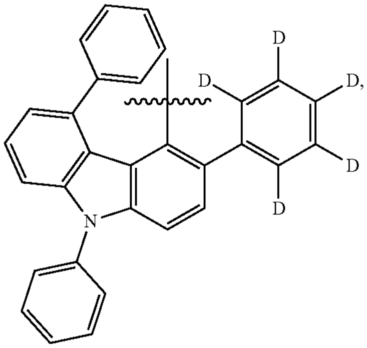
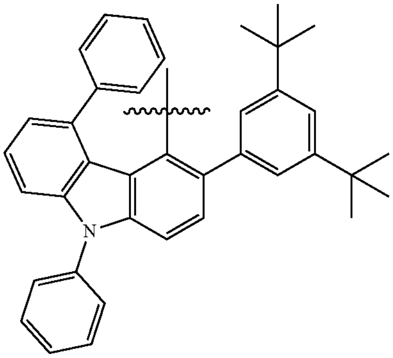
,
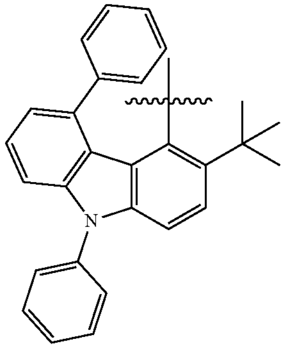
, -continued
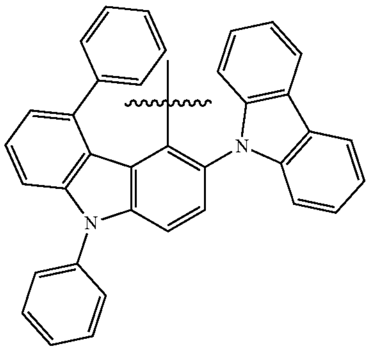
,
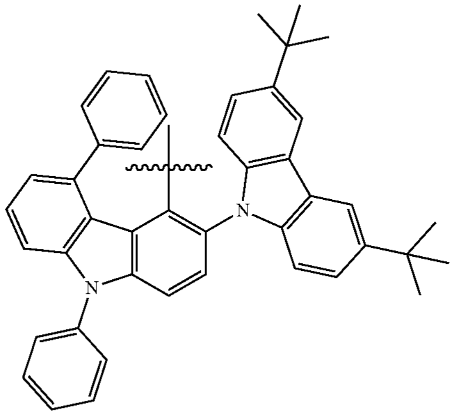
,
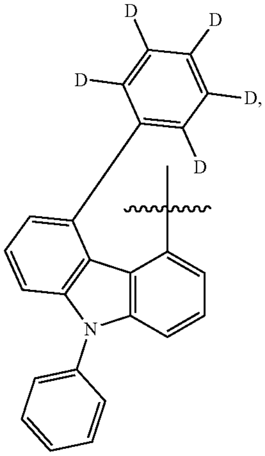
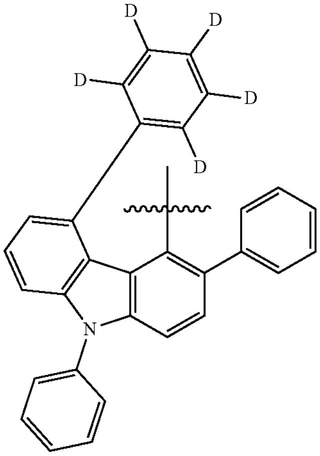
,
-continued
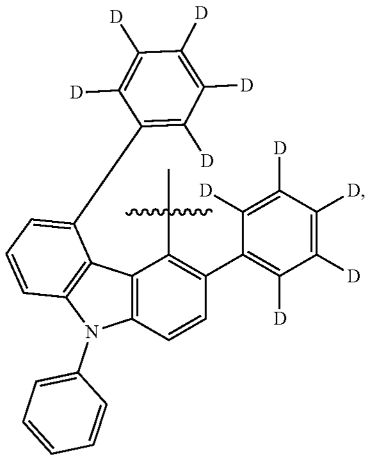
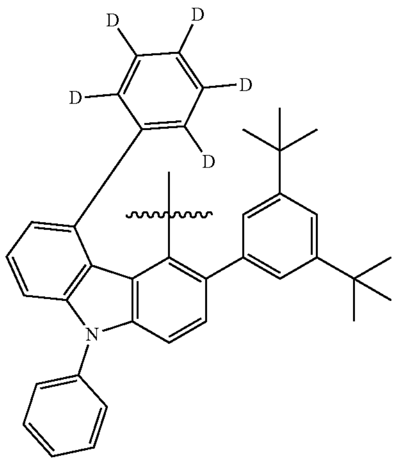
,
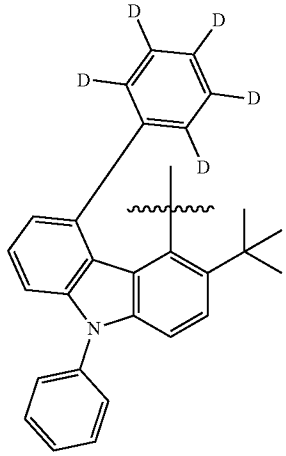
, -continued
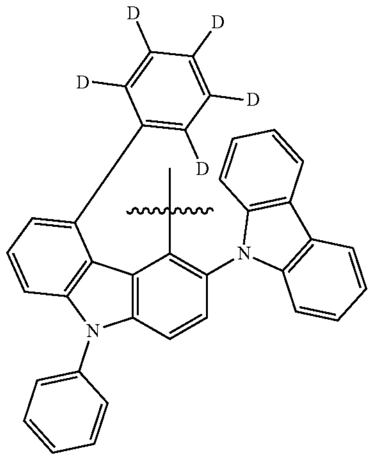
,
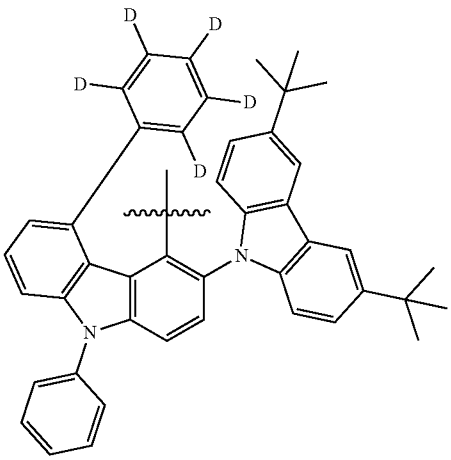
,
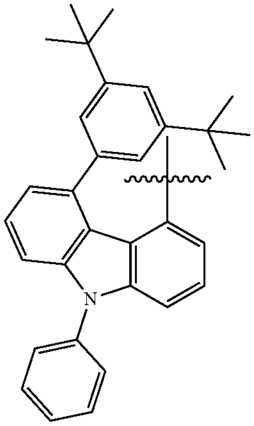
,
-continued
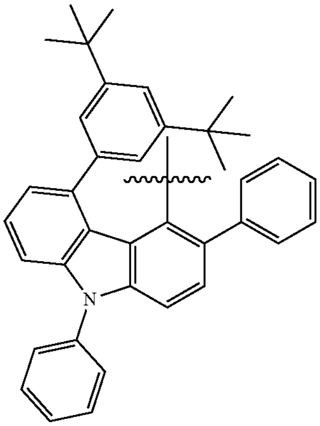
,
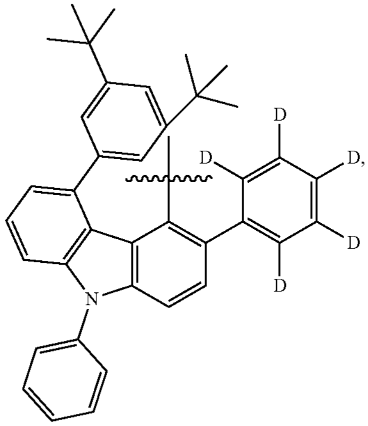
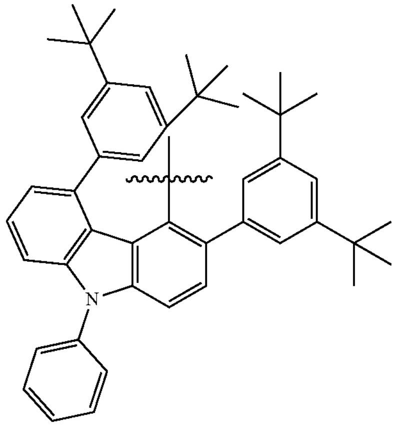
,
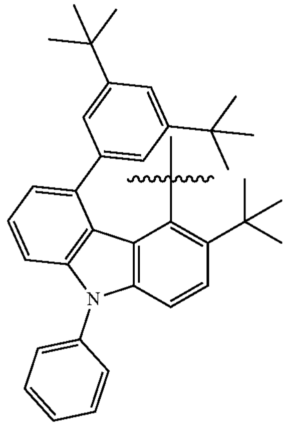
, -continued
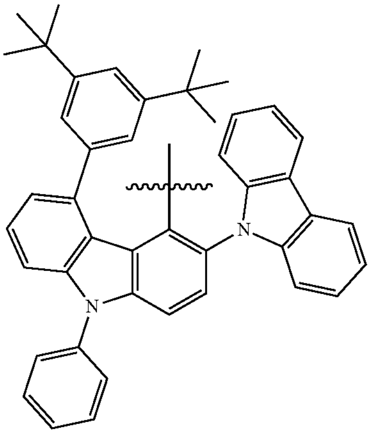
,
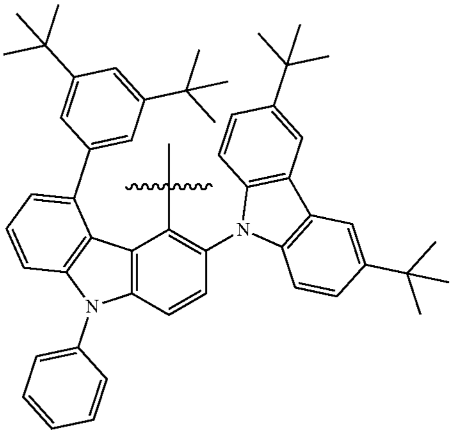
,
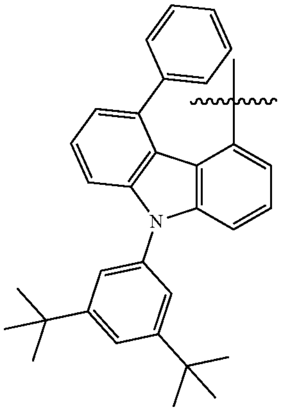
,
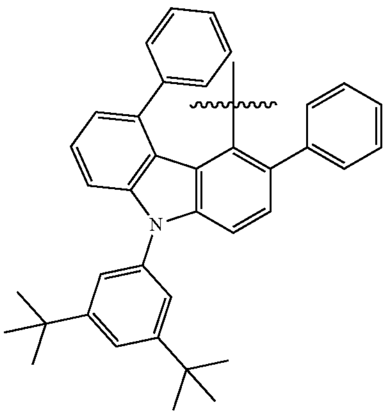
,
-continued
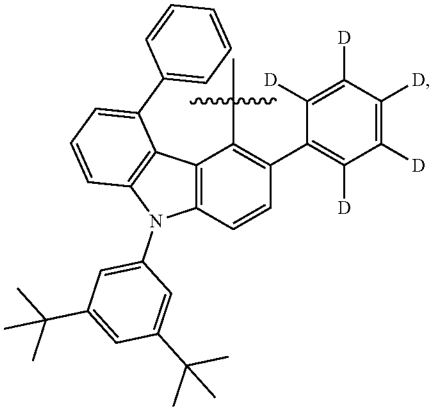
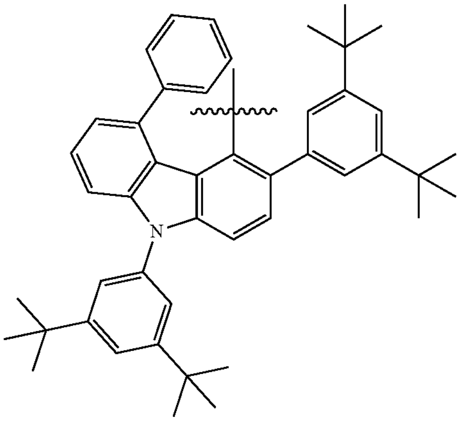
,
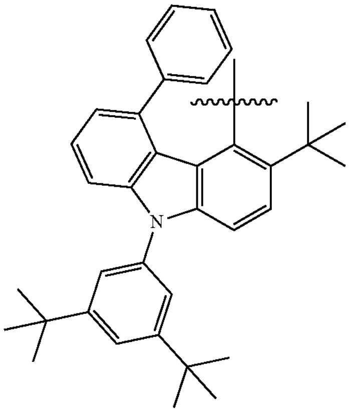
,
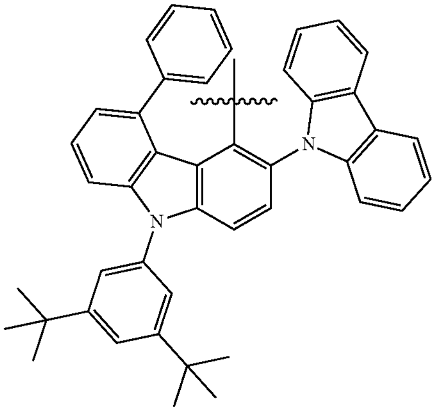
, -continued
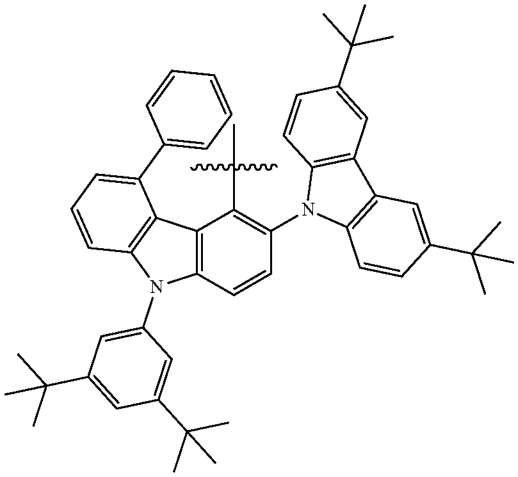
,
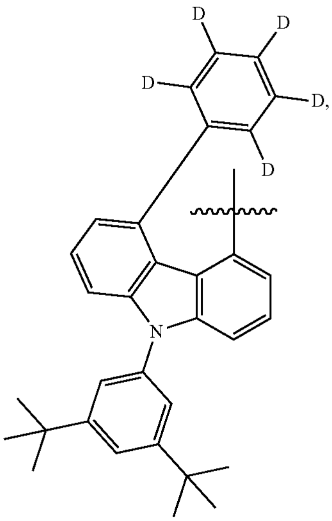
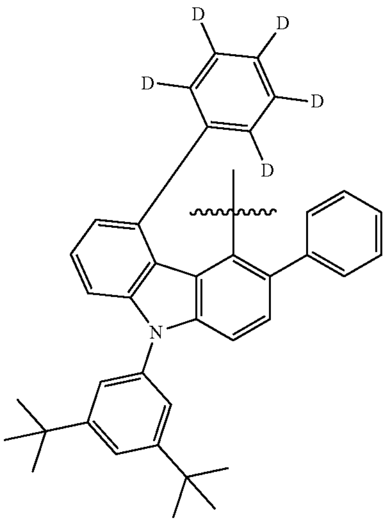
,
-continued
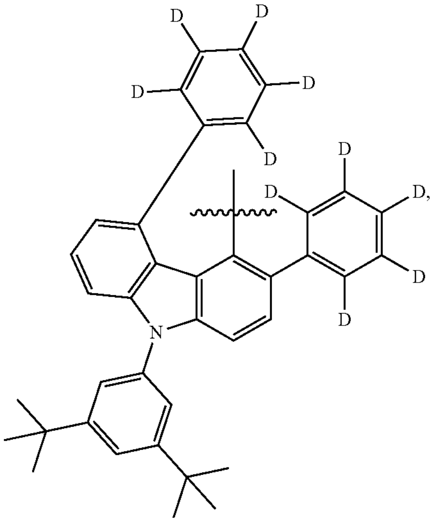
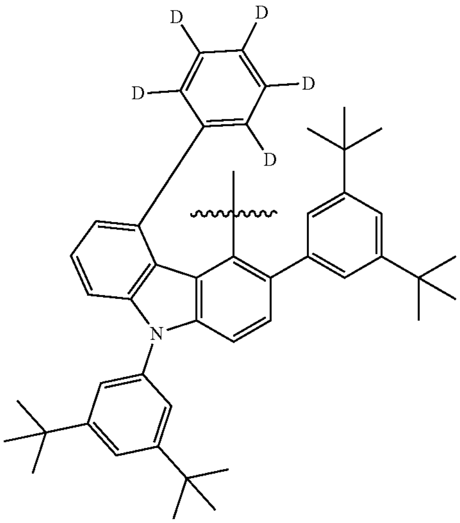
,
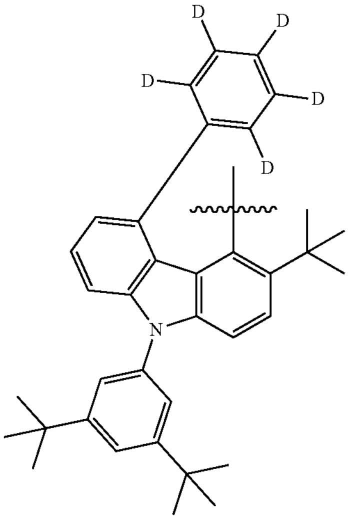
, -continued
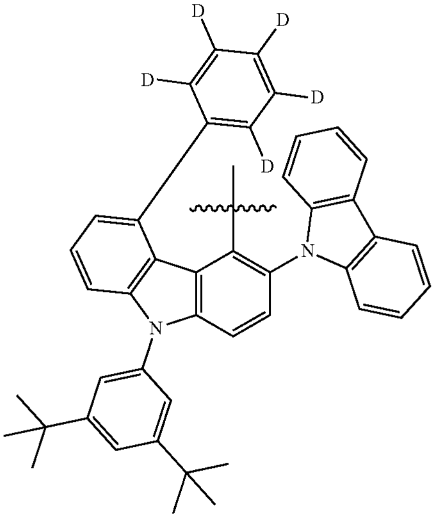
,
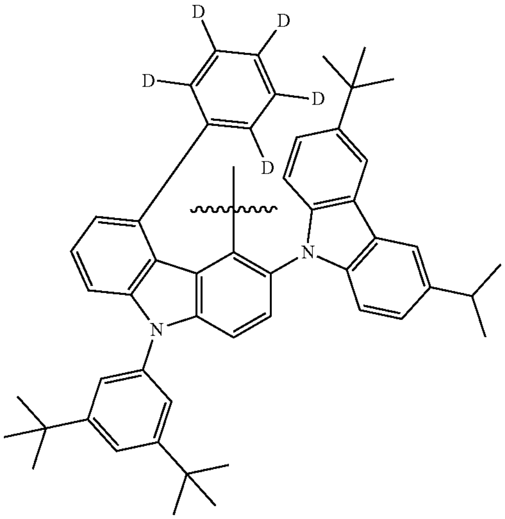
,
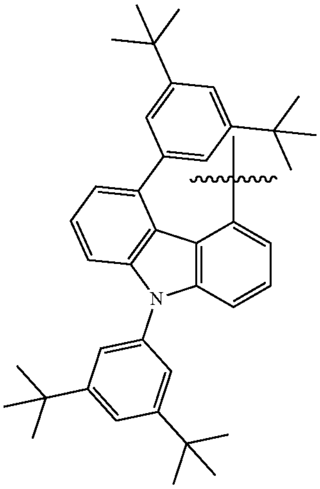
,
-continued
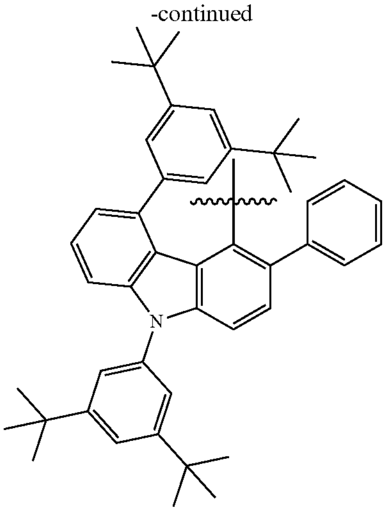
,
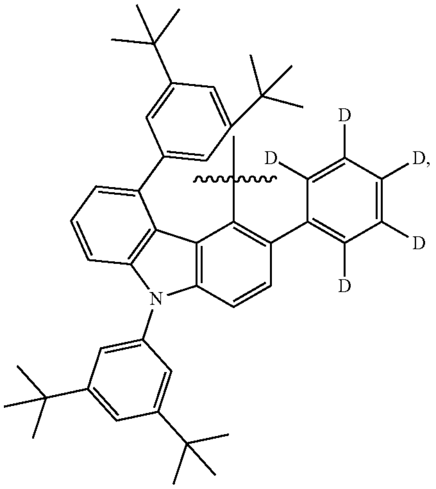
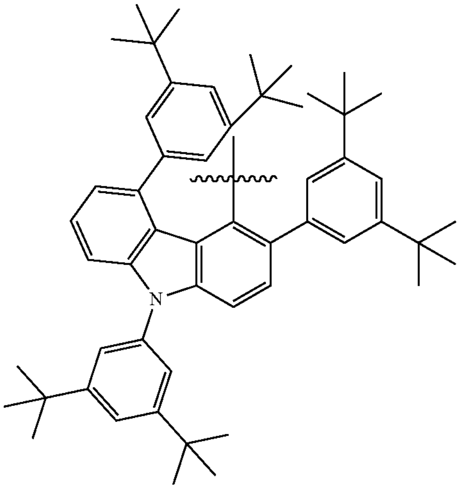
, -continued
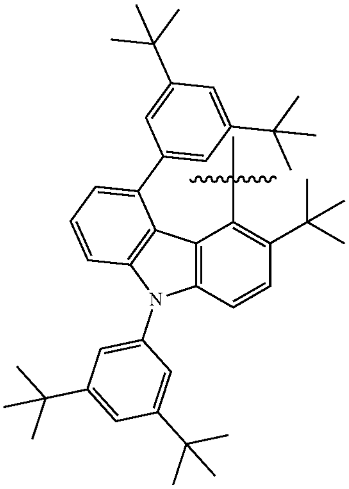
,
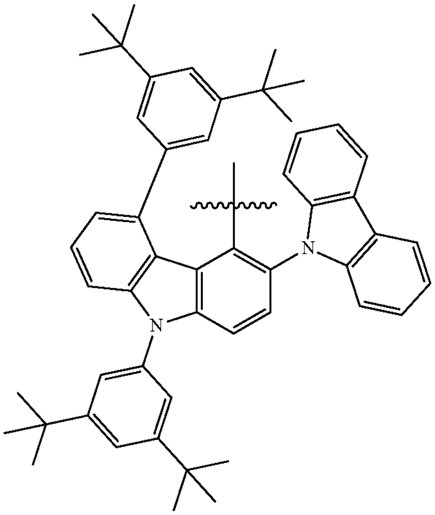
,
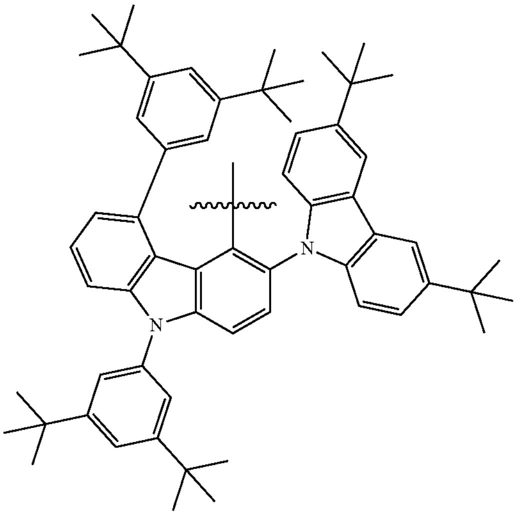
,
-continued
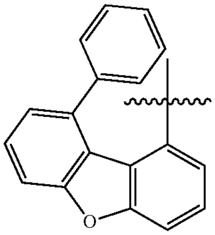
,
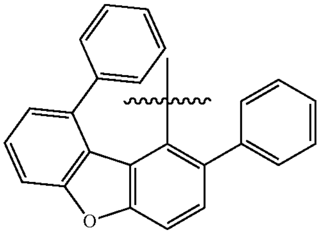
,
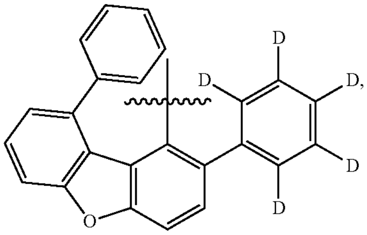
,
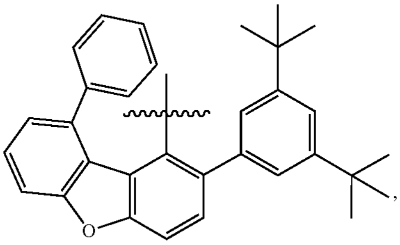
,
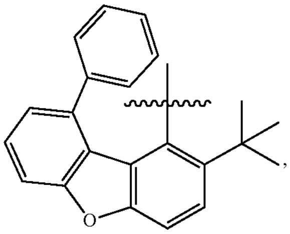
,
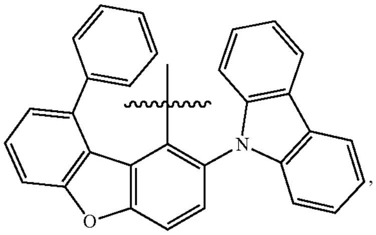
, -continued
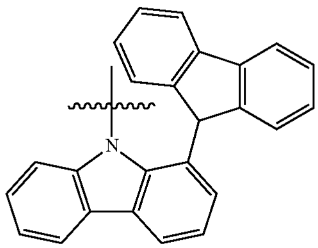,
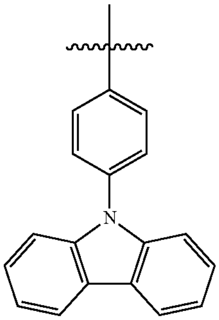,
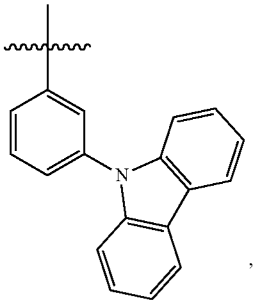,
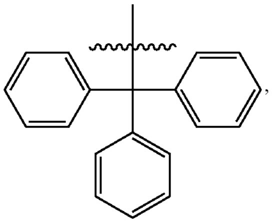,
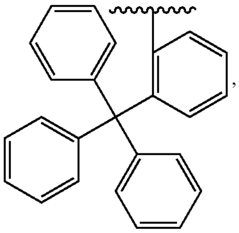,
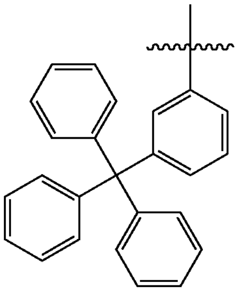,
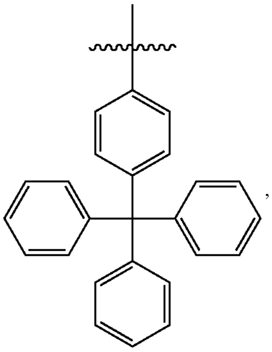,
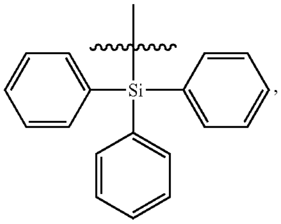,
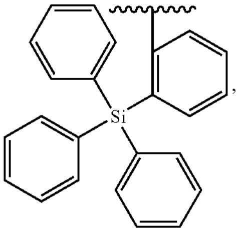,
-continued
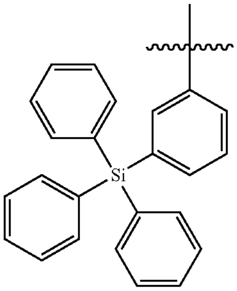,
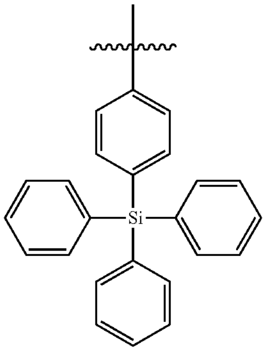,
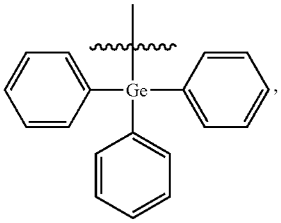,
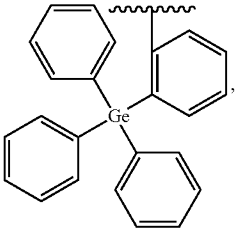,
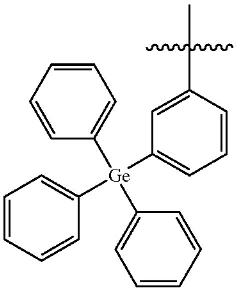,
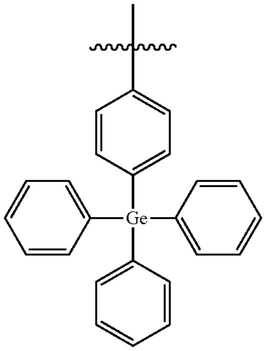,
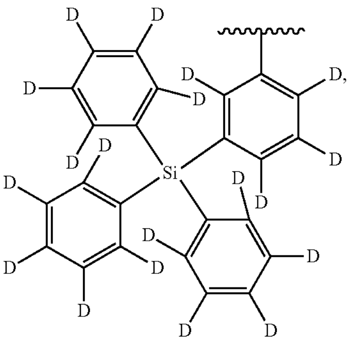
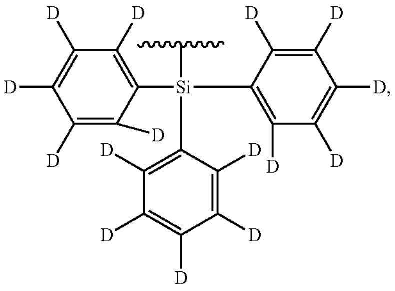

-continued
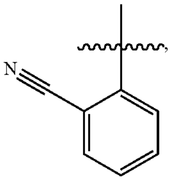,
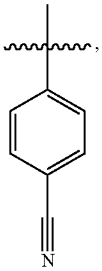,
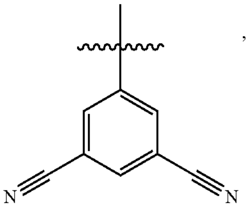,
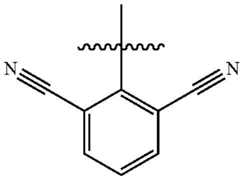,
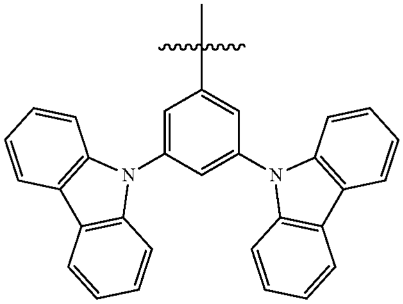,
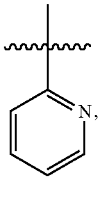,
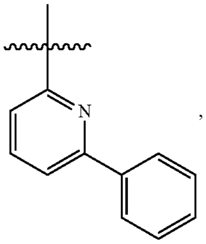,
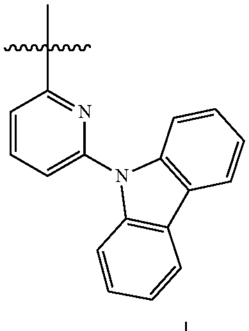,
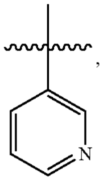,
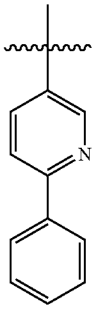,
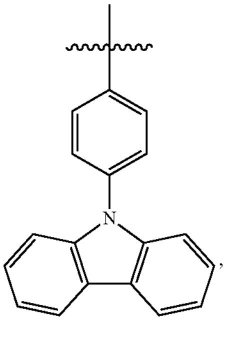,
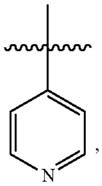,
-continued
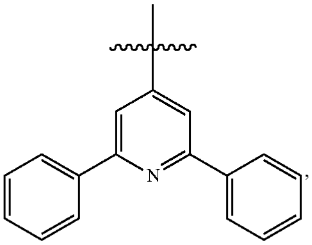,
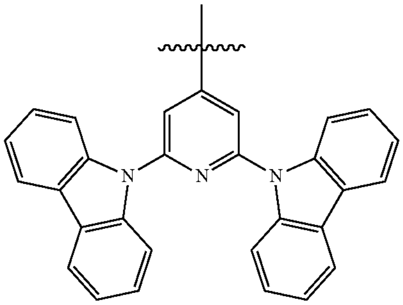,
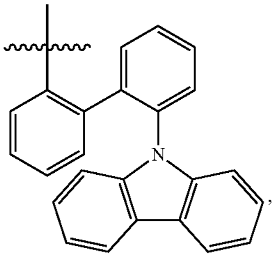,
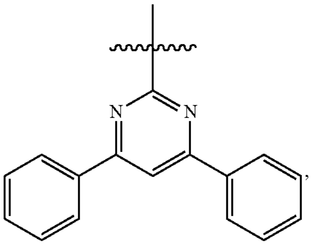,
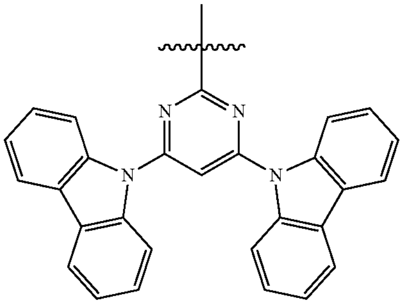,
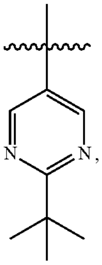,
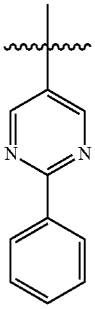,
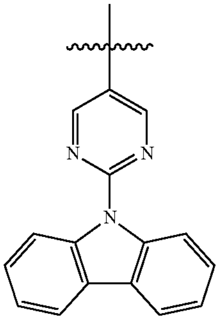, -continued
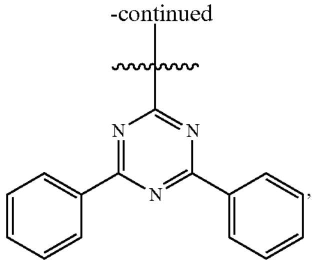
,
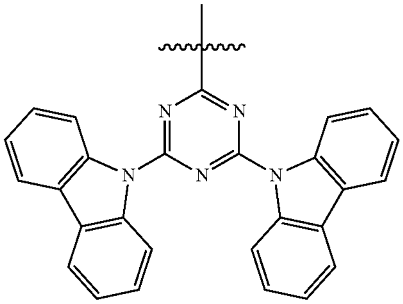
,
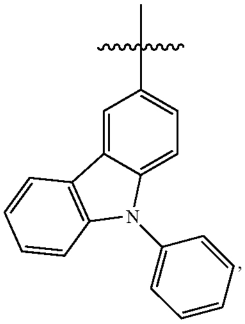
,
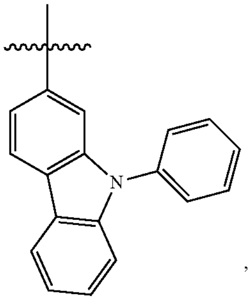
,
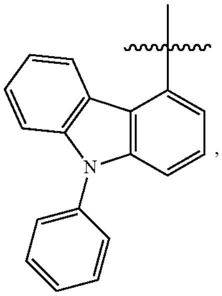
,
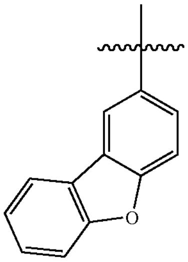
,
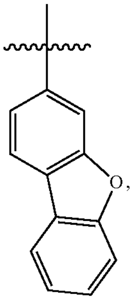
,
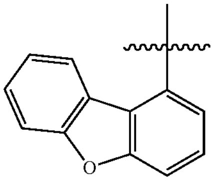
,
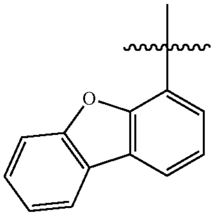
,
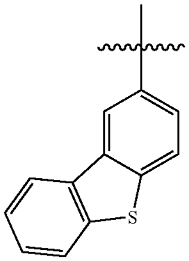
,
-continued
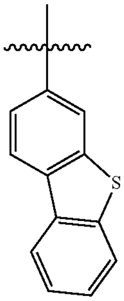
,
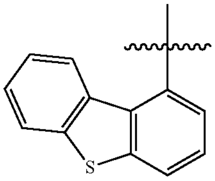
,
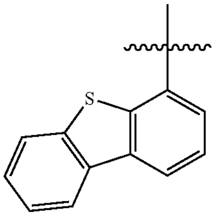
,
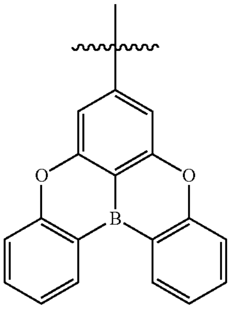
,
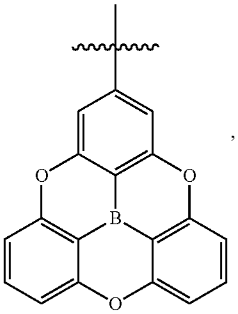
,
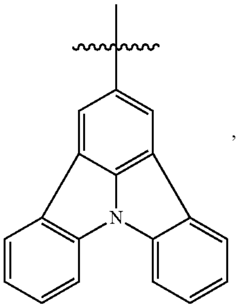
,
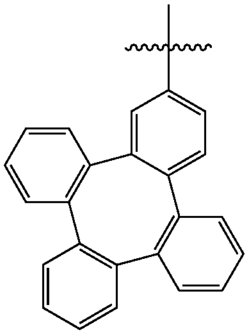
,
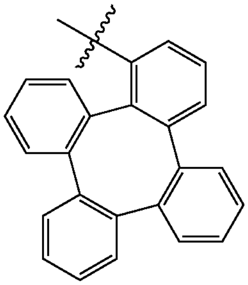
,
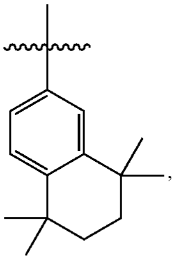
,
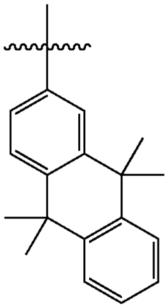
, -continued

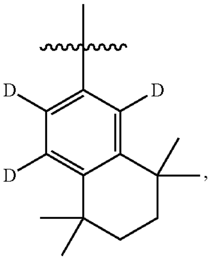,

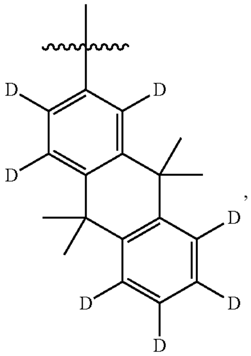,

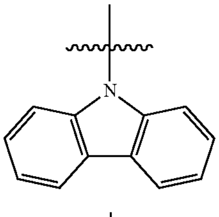,

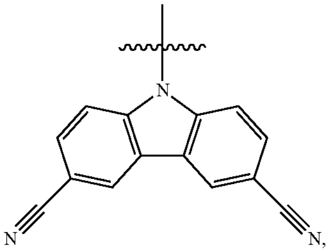

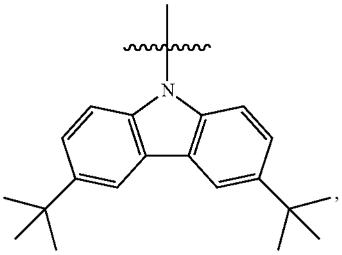,

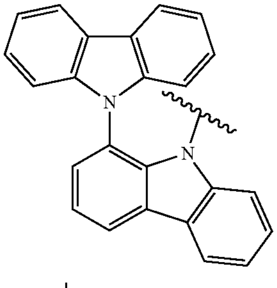,

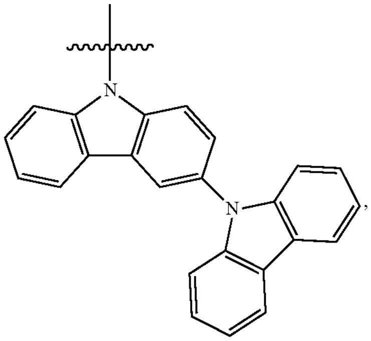,

-continued

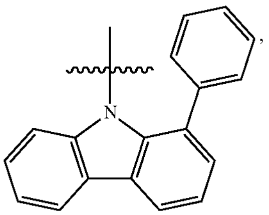,

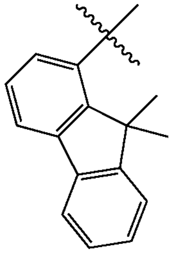,

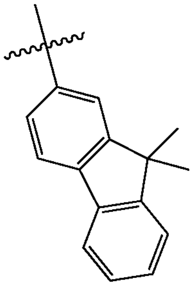,

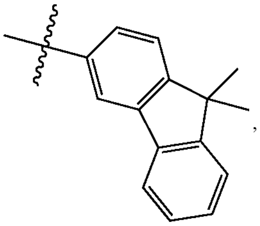,

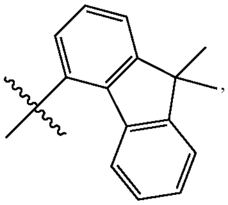,

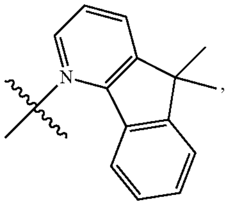,

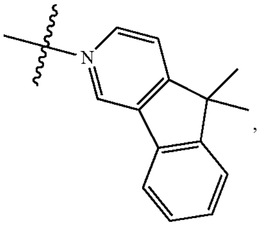,

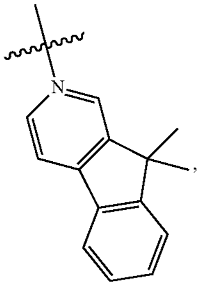,

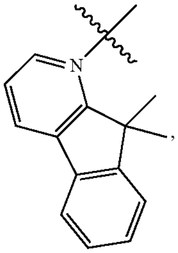, and

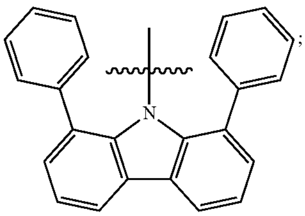;

wherein Ph represents phenyl.

In some embodiments, exactly one $R^D$ is not hydrogen. In some embodiments, two $R^D$ substituents are joined together to form a ring fused to moiety D.

In some embodiments, the first compound is partially or fully deuterated.

In some embodiments, the first compound comprises one or more electron-withdrawing groups. In some embodiments, the electron-withdrawing groups commonly comprise one or more highly electronegative elements including but not limited to fluorine, oxygen, sulfur, nitrogen, chlorine, and bromine.

In some embodiments, the electron-withdrawing group has a Hammett constant larger than 0. In some embodiments, the electron-withdrawing group has a Hammett constant equal or larger than 0.1, 0.2, 0.3, 0.4, 0.5, 0.6, 0.7, 0.8, 0.9, 1.0, or 1.1.

In some embodiments the first compound comprises one or more electron-withdrawing groups selected from the group consisting of the structures of the following EWG1 LIST: F, $CF_3$, CN, $COCH_3$, CHO, $COCF_3$, COOMe, $COOCF_3$, $NO_2$, $SF_3$, $SiF_3$, $PF_4$, $SF_5$, $OCF_3$, $SCF_3$, $SeCF_3$, $SOCF_3$, $SeOCF_3$, $SO_2F$, $SO_2CF_3$, $SeO_2CF_3$, $OSeO_2CF_3$, OCN, SCN, SeCN, NC, $^+N(R^{k2})_3$, $(R^{k2})_2CCN$, $(R^{k2})_2CCF_3$, $CNC(CF_3)_2$, $BR^{k3}R^{k2}$, substituted or unsubstituted dibenzoborole, 1-substituted carbazole, 1,9-substituted carbazole, substituted or unsubstituted carbazole, substituted or unsubstituted pyridine, substituted or unsubstituted pyrimidine, substituted or unsubstituted pyrazine, substituted or unsubstituted pyridoxine, substituted or unsubstituted triazine, substituted or unsubstituted oxazole, substituted or unsubstituted benzoxazole, substituted or unsubstituted thiazole, substituted or unsubstituted benzothiazole, substituted or unsubstituted imidazole, substituted or unsubstituted benzimidazole, ketone, carboxylic acid, ester, nitrile, isonitrile, sulfinyl, sulfonyl, partially and fully fluorinated alkyl, partially and fully fluorinated aryl, partially and fully fluorinated heteroaryl, cyano-containing alkyl, cyano-containing aryl, cyano-containing heteroaryl, isocyanate,

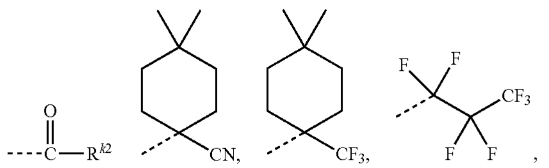
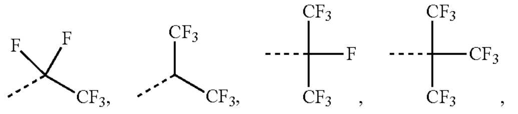
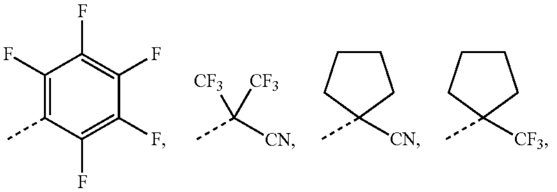
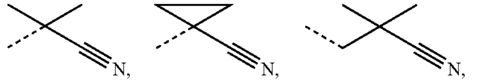
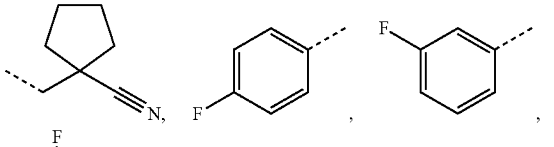
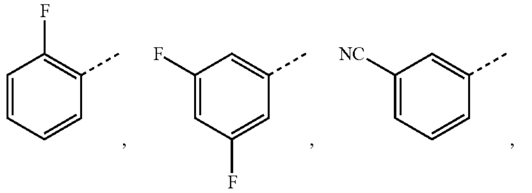

-continued

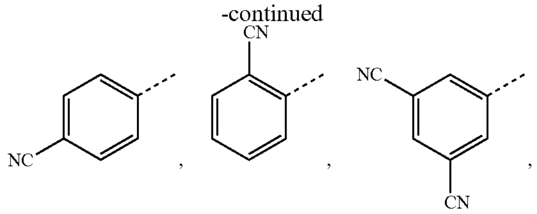
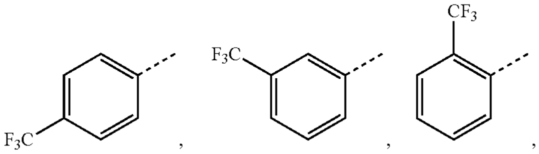
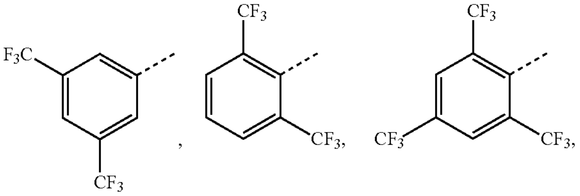
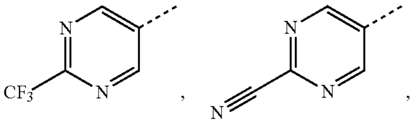
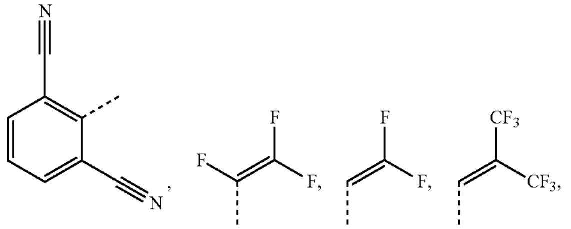
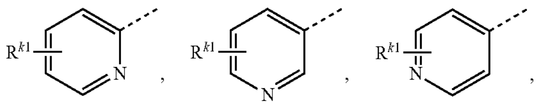
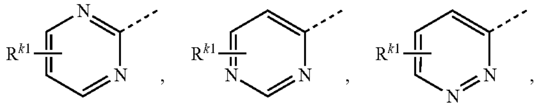
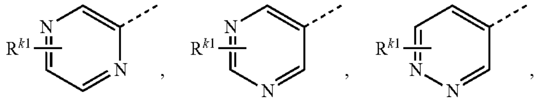
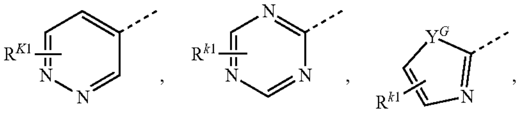
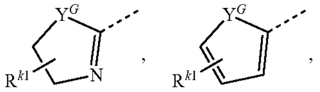
and
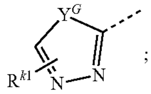
;

wherein each $R^{k1}$ represents mono to the maximum allowable substitution, or no substitutions;

wherein $Y^G$ is selected from the group consisting of $BR_e$, $NR_e$, $PR_e$, O, S, Se, C═O, S═O, $SO_2$, $CR_eR_f$, $SiR_eR_f$, and $GeR_eR_f$; and wherein each of $R^{k1}$, $R^{k2}$, $R^{k3}$, $R_e$, and $R_f$ is independently a hydrogen or a substituent selected from the group consisting of the General Substituents defined herein.

In some embodiments, the first compound comprises one or more electron-withdrawing groups selected from the group consisting of the structures of the following EWG2 List:

E1
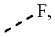
E2
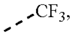
E3
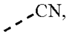
E4
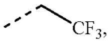
E5
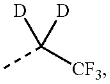
E6
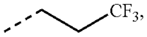
E7
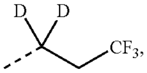
E8
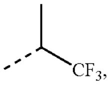
E9
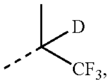
E10
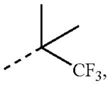
E11
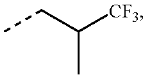
E12
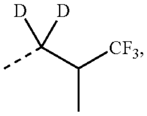
E13
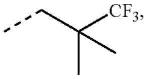
E14
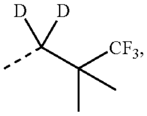
E15
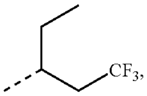
E16
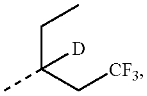
E17
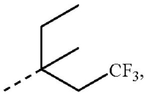
-continued
E18
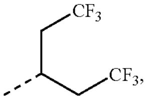
E19
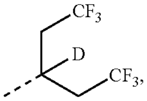
E20
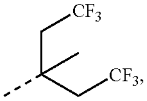
E21
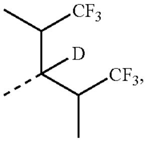
E22
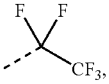
E23
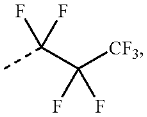
E24
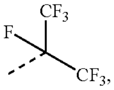
E25
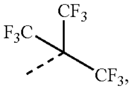
E26
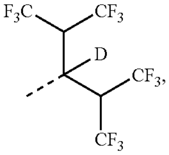
E27
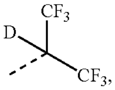
E28
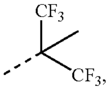
E29
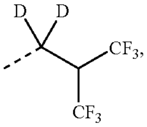
E30
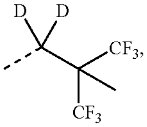

-continued
E31
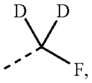
E32
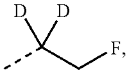
E33
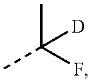
E34
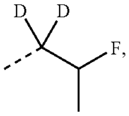
E35
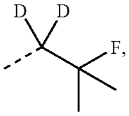
E36
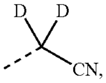
E37
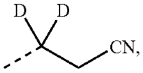
E38
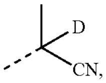
E39
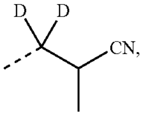
E40
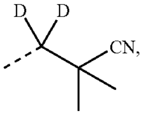
E41
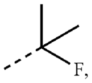
E42
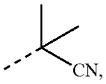
E43
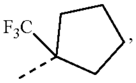
E44
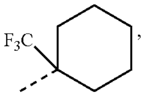
E45
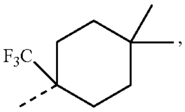
-continued
E46
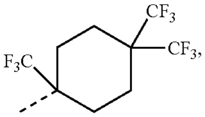
E47
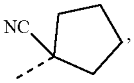
E48
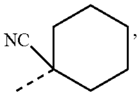
E49
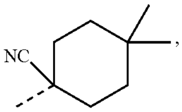
E50
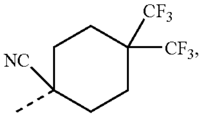
E51
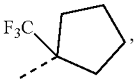
E52
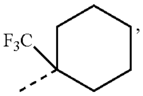
E53
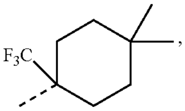
E54
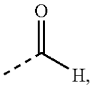
E55
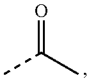
E56
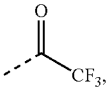
E57
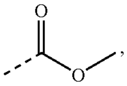
E58
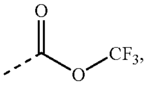
E59
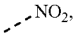
E60
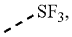
E61
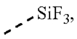

-continued
E62
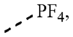
E63
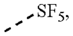
E64
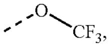
E65
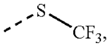
E66
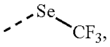
E67
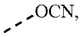
E68
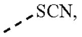
E69
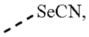
E70
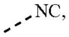
E71
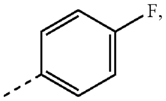
E72
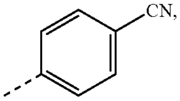
E73
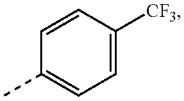
E74
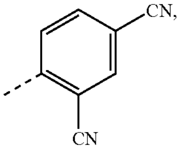
E75
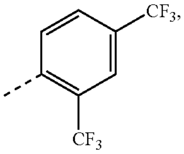
E76
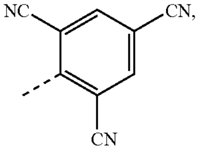
E77
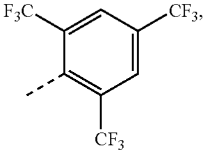
-continued
E78
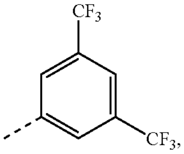
E79
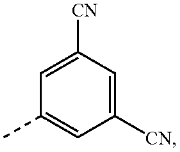
E80
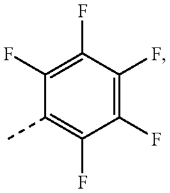
E81
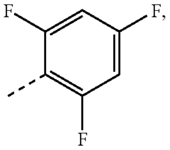
E82
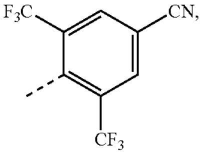
E83
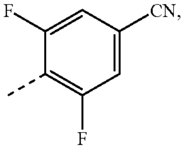
E84
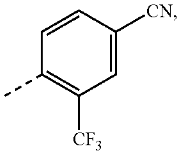
E85
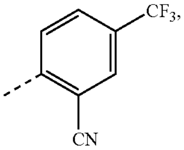
E86
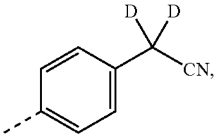

-continued
E87
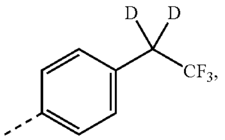
E88
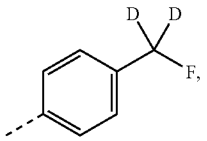
E89
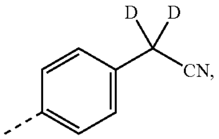
E90
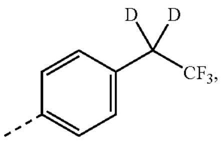
E91
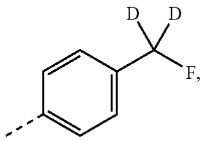
E92
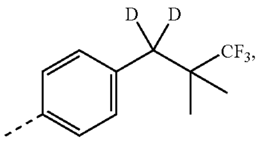
E93
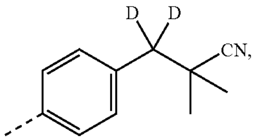
E94
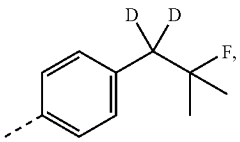
E95
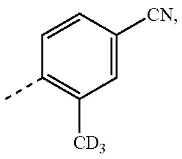
E96
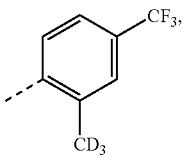
-continued
E97
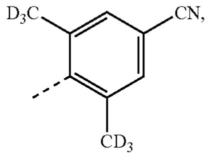
E98
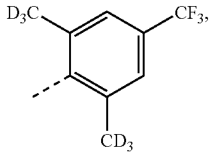
E99
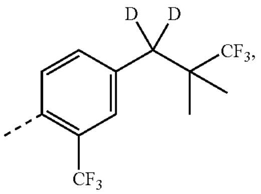
E100
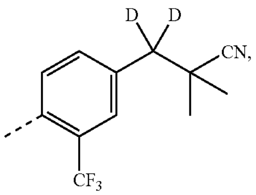
E101
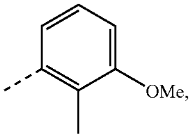
E102
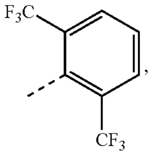
E103
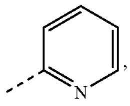
E104
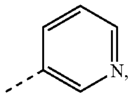
E105
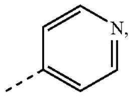
E106
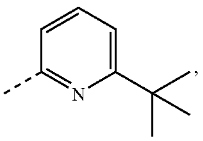

-continued
E107
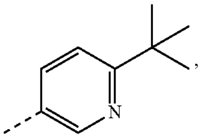
E108
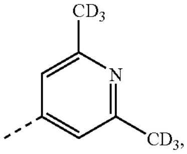
E109
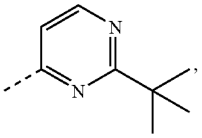
E110
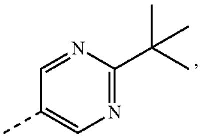
E111
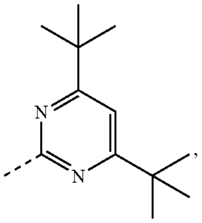
E112
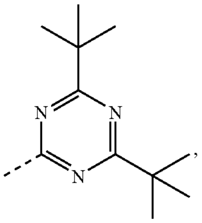
E113
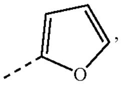
E114
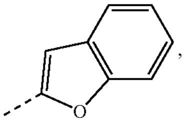
E115
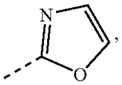
E116
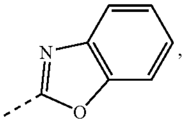
-continued
E117
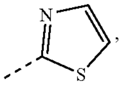
E118
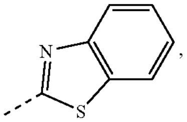
E119
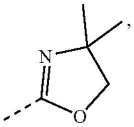
E120
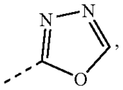
E121
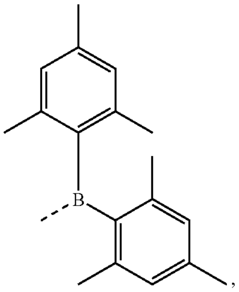
E122
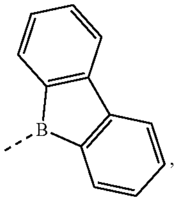
E123
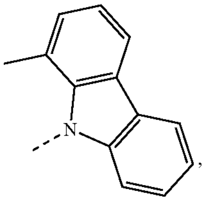
E124
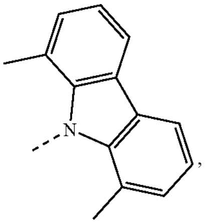
and -continued
E125
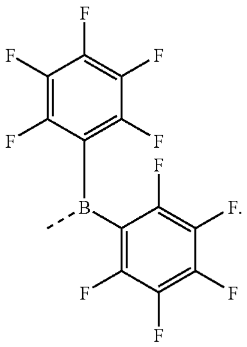
In some embodiments, the first compound comprises one or more electron-withdrawing groups selected from the group consisting of the structures of the following EWG3 LIST:
E1
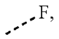
E2
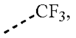
E3
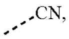
E5
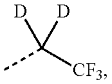
E7
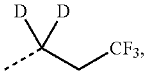
E9
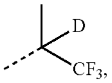
E10
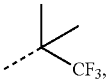
E12
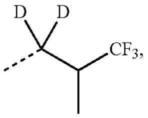
E14
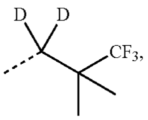
E22
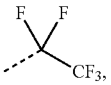
E23
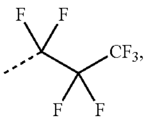
-continued
E24
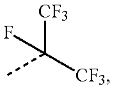
E25
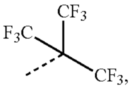
E27
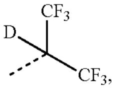
E28
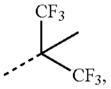
E29
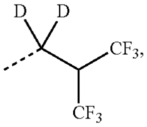
E30
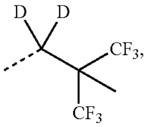
E35
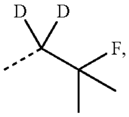
E36
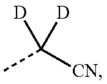
E38
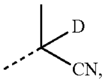
E40
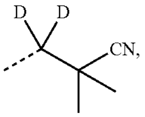
E41
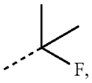
E42
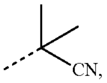
E71
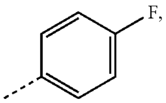
E72
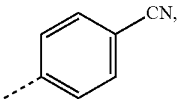

-continued
E73
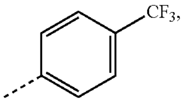
E75
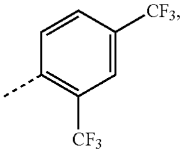
E78
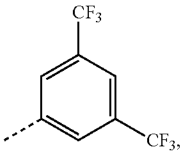
E79
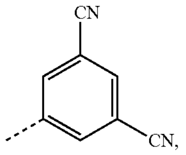
E80
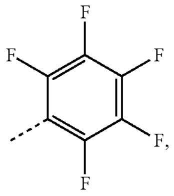
E89
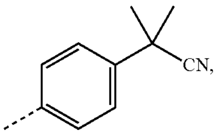
E90
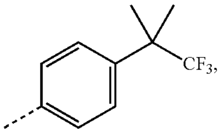
E91
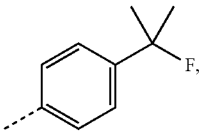
E92
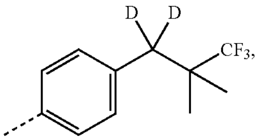
E93
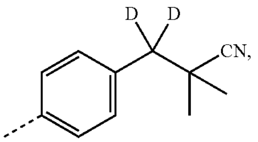
-continued
E94
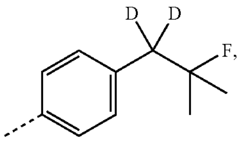
E95
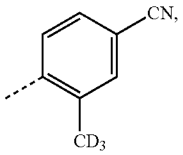
E96
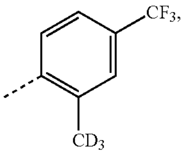
E97
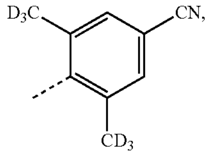
E98
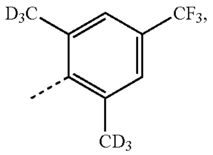
E106
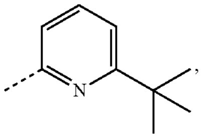
E107
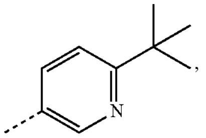
E108
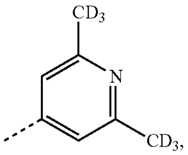
E109
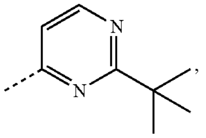
E110
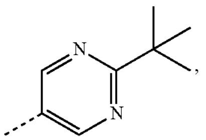

-continued
E112
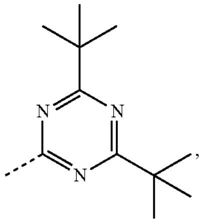
E114
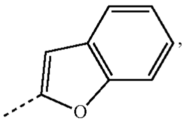
E115
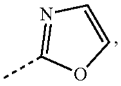
E116
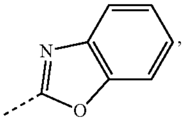
and
E119
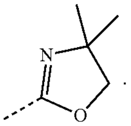
In some embodiments, the first compound comprises one or more electron-withdrawing groups selected from the group consisting of the structures of the following EWG4 LIST:
E1
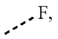
E2
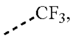
E3
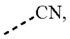
E5
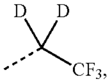
E9
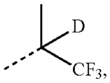
E10
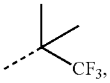
E14
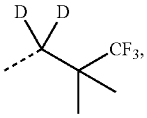
-continued
E28
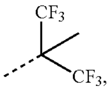
E35
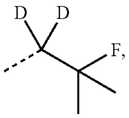
E36
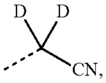
E38
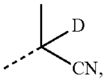
E42
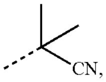
E71
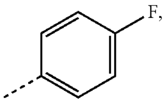
E72
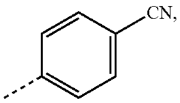
E73
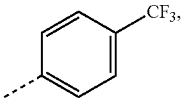
E106
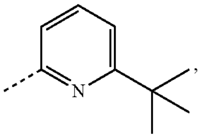
E107
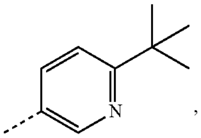
E108
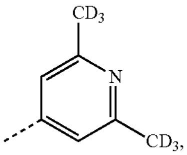
E109
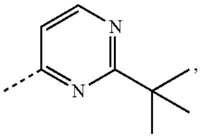

-continued

E110

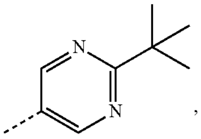,

E112

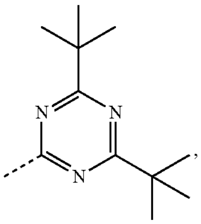,

E114

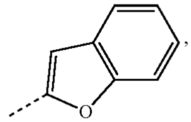,

E115

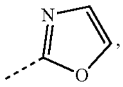,

E116

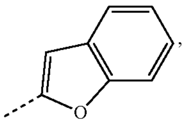, and

E119

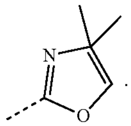.

In some embodiments, the first compound comprises one or more π-electron deficient electron-withdrawing group. In some embodiments, the first compound comprises one or more π-electron deficient electron-withdrawing groups selected from the group consisting of the structures of the following Pi-EWG LIST: CN, $COCH_3$, CHO, $COCF_3$, COOMe, $COOCF_3$, $NO_2$, $SF_3$, $SiF_3$, $PF_4$, $SF_5$, $OCF_3$, $SCF_3$, $SeCF_3$, $SOCF_3$, $SeOCF_3$, $SO_2F$, $SO_2CF_3$, $SeO_2CF_3$, $OSeO_2CF_3$, OCN, SCN, SeCN, NC, $^+N(R^{k2})_3$, $(R^{k2})_2CCN$, $(R^{k2})_2CCF_3$, $CNC(CF_3)_2$, $BR^{k3}R^{k2}$, substituted or unsubstituted dibenzoborole, 1-substituted carbazole, 1,9-substituted carbazole, substituted or unsubstituted carbazole, substituted or unsubstituted pyridine, substituted or unsubstituted pyrimidine, substituted or unsubstituted pyrazine, substituted or unsubstituted pyridazine, substituted or unsubstituted triazine, substituted or unsubstituted oxazole, substituted or unsubstituted benzoxazole, substituted or unsubstituted thiazole, substituted or unsubstituted benzothiazole, substituted or unsubstituted imidazole, substituted or unsubstituted benzimidazole, ketone, carboxylic acid, ester, nitrile, isonitrile, sulfinyl, sulfonyl, partially and fully fluorinated aryl, partially and fully fluorinated heteroaryl, cyano-containing aryl, cyano-containing heteroaryl, isocyanate,

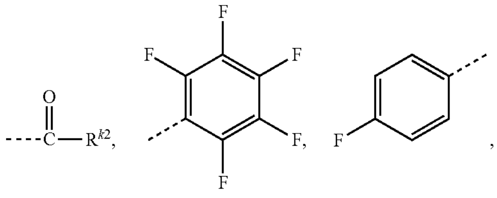,

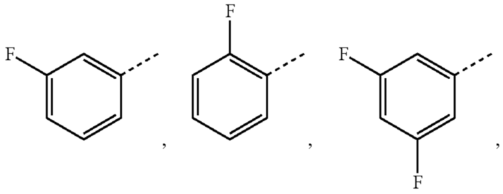,

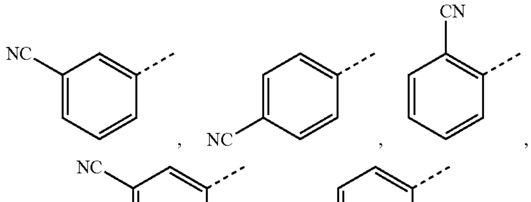,

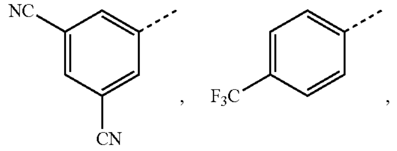,

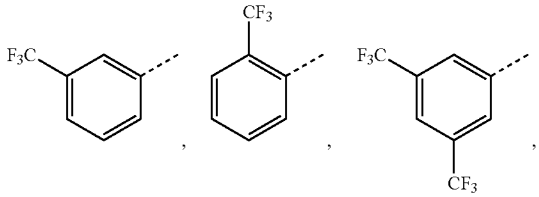,

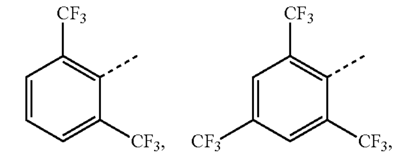

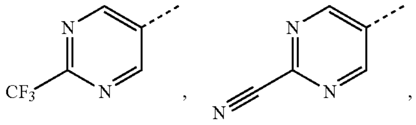,

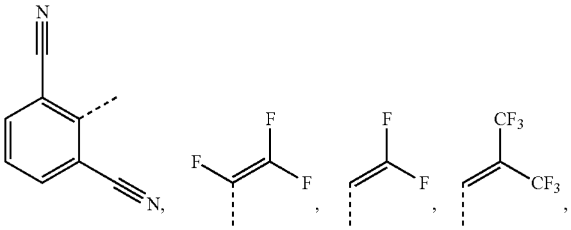,

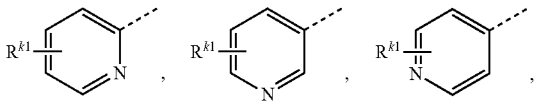,

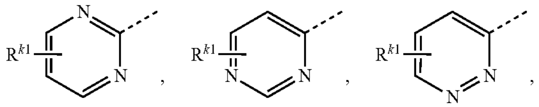,

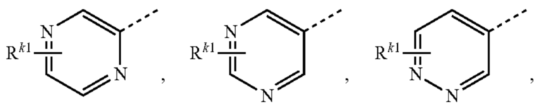,

-continued

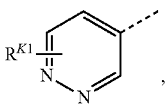 , 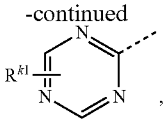 , 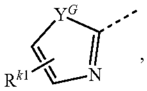 ,

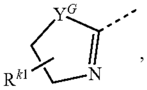 , 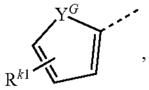 , and 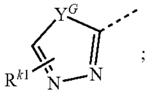 ;

wherein the variables are the same as previously defined.

In some embodiments, at least one of $R^A$, $R^B$, $R^C$, or $R^D$ is an electron-withdrawing group from the EWG1 LIST as defined herein. In some embodiments, at least one of $R^A$, $R^B$, $R^C$, or $R^D$ is an electron-withdrawing group from the EWG2 LIST as defined herein. In some embodiments, at least one of $R^A$, $R^B$, $R^C$, or $R^D$ is an electron-withdrawing group from the EWG3 LIST as defined herein. In some embodiments, at least one of $R^A$, $R^B$, $R^C$, or $R^D$ is an electron-withdrawing group from the EWG4 LIST as defined herein. In some embodiments, at least one of $R^A$, $R^B$, $R^C$, or $R^D$ is an electron-withdrawing group from the Pi-EWG LIST as defined herein.

In some embodiments, at least one $R^A$ is an electron-withdrawing group from the EWG1 LIST as defined herein. In some embodiments, at least one $R^A$ is an electron-withdrawing group from the EWG2 LIST as defined herein. In some embodiments, at least one $R^A$ is an electron-withdrawing group from the EWG3 LIST as defined herein. In some embodiments, at least one $R^A$ is an electron-withdrawing group from the EWG4 LIST as defined herein. In some embodiments, at least one $R^A$ is an electron-withdrawing group from the Pi-EWG LIST as defined herein.

In some embodiments, at least one $R^B$ is an electron-withdrawing group from the EWG1 LIST as defined herein. In some embodiments, at least one $R^B$ is an electron-withdrawing group from the EWG2 LIST as defined herein. In some embodiments, at least one $R^B$ is an electron-withdrawing group from the EWG3 LIST as defined herein. In some embodiments, at least one $R^B$ is an electron-withdrawing group from the EWG4 LIST as defined herein. In some embodiments, at least one $R^B$ is an electron-withdrawing group from the Pi-EWG LIST as defined herein.

In some embodiments, at least one $R^C$ is an electron-withdrawing group from the EWG1 LIST as defined herein. In some embodiments, at least one $R^C$ is an electron-withdrawing group from the EWG2 LIST as defined herein. In some embodiments, at least one $R^C$ is an electron-withdrawing group from the EWG3 LIST as defined herein. In some embodiments, at least one $R^C$ is an electron-withdrawing group from the EWG4 LIST as defined herein. In some embodiments, at least one $R^C$ is an electron-withdrawing group from the Pi-EWG LIST as defined herein.

In some embodiments, at least one $R^D$ is an electron-withdrawing group from the EWG1 LIST as defined herein. In some embodiments, at least one $R^D$ is an electron-withdrawing group from the EWG2 LIST as defined herein. In some embodiments, at least one $R^D$ is an electron-withdrawing group from the EWG3 LIST as defined herein. In some embodiments, at least one $R^D$ is an electron-withdrawing group from the EWG4 LIST as defined herein. In some embodiments, at least one $R^D$ is an electron-withdrawing group from the Pi-EWG LIST as defined herein.

In some embodiments, the first compound is partially or fully deuterated. In some embodiments, the first compound is fully deuterated. In some embodiments, the first compound is partially deuterated.

In some embodiments, the first compound has a structure selected from the group consisting of the structures of the following LIST 3:

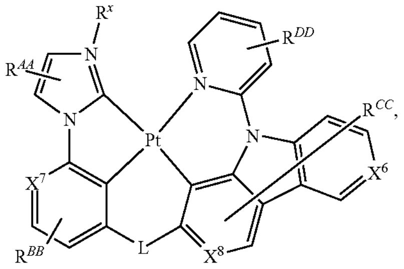

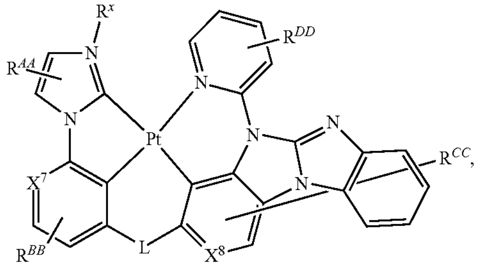

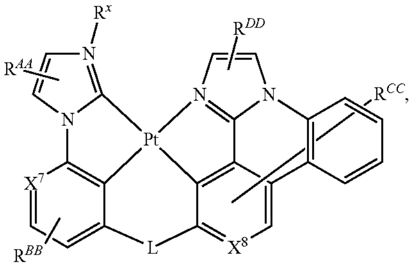

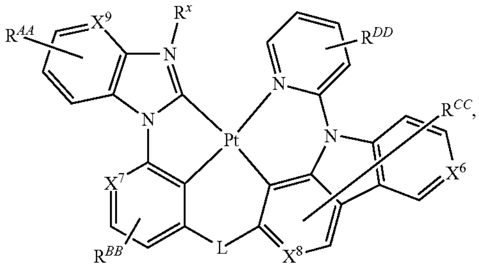

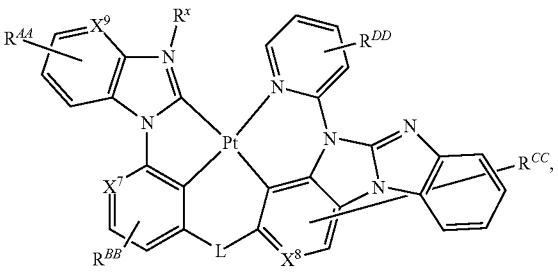

-continued
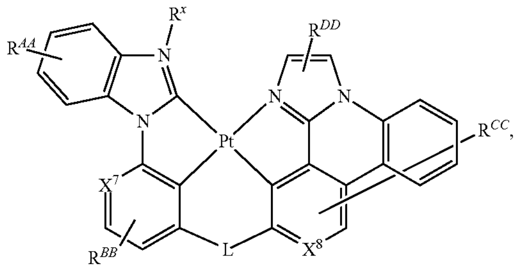
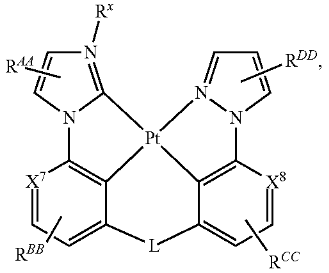
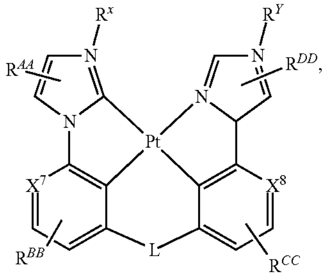
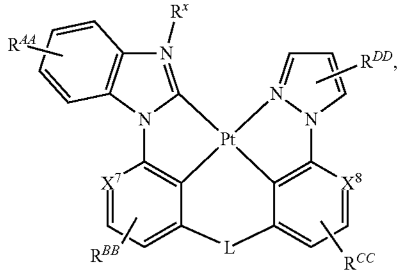
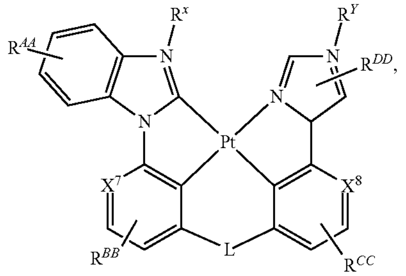
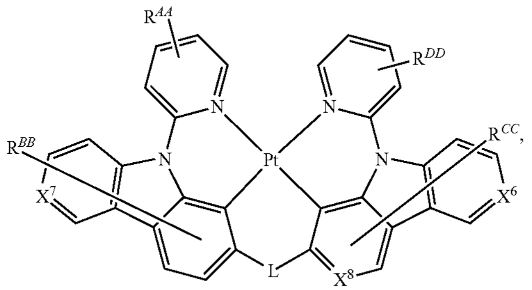
-continued
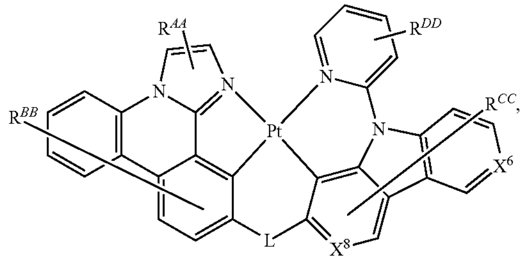
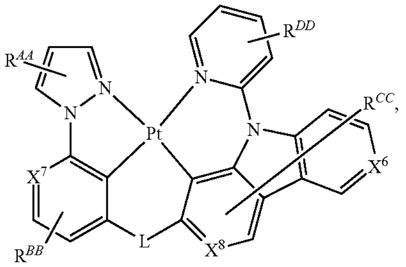
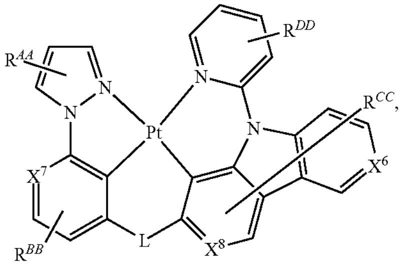
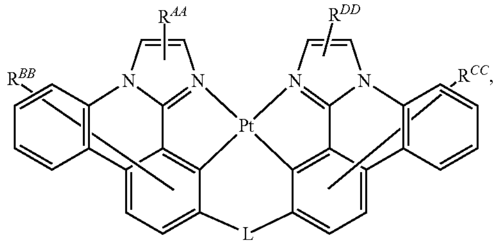
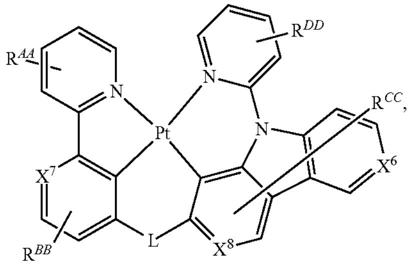
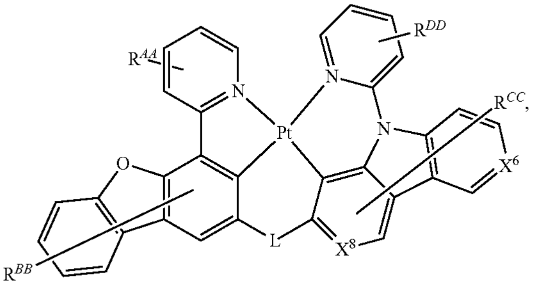

-continued
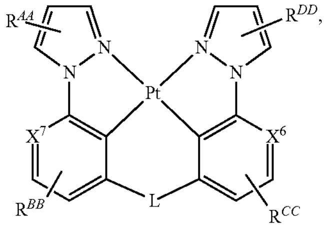
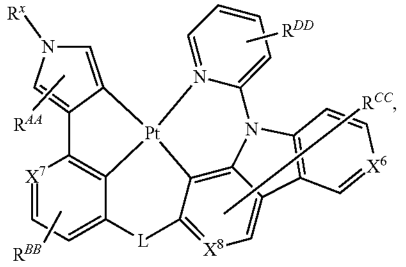
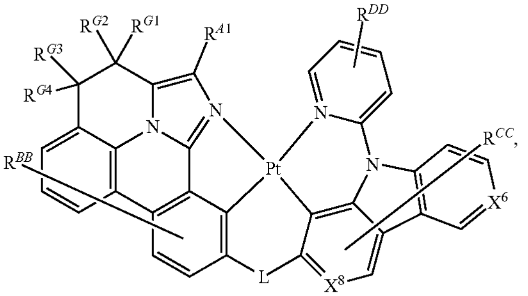
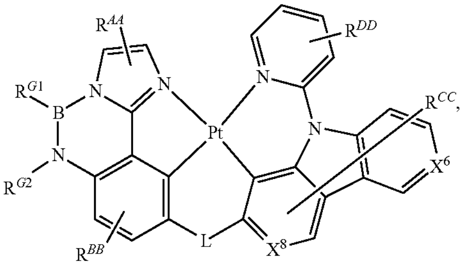
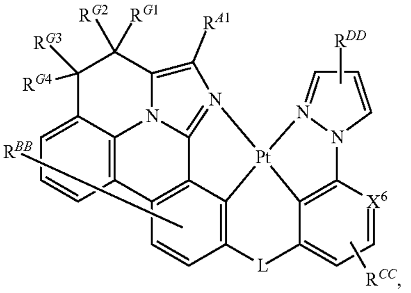
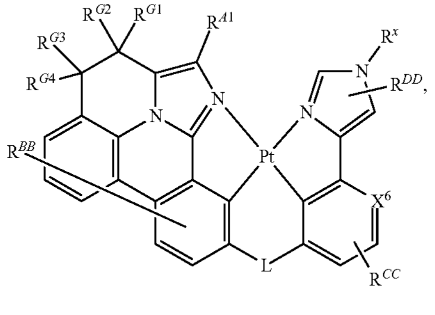
-continued
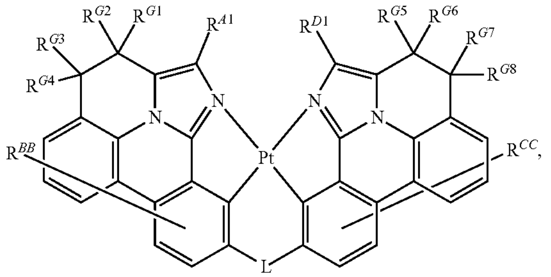
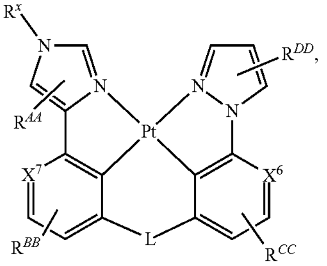
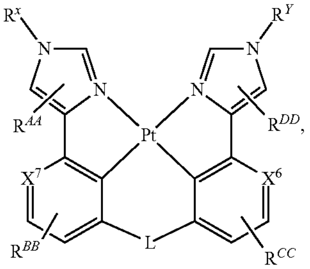
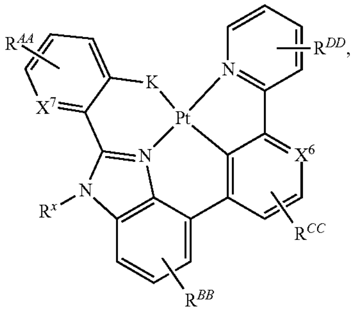
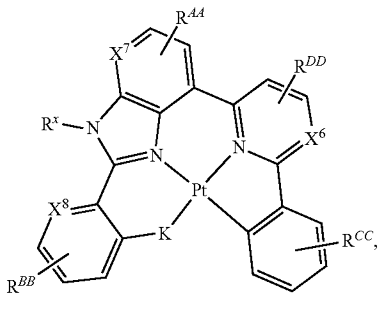
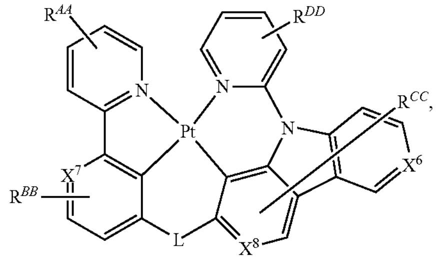

-continued
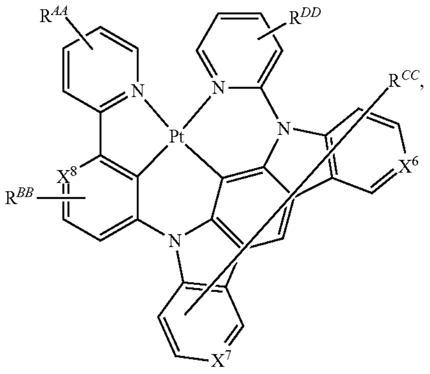
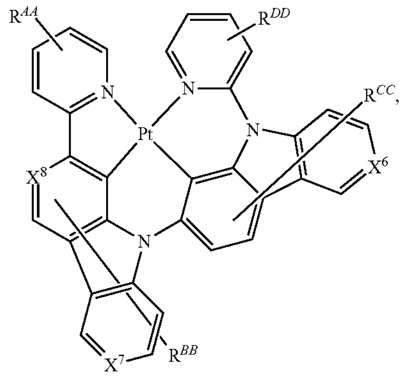
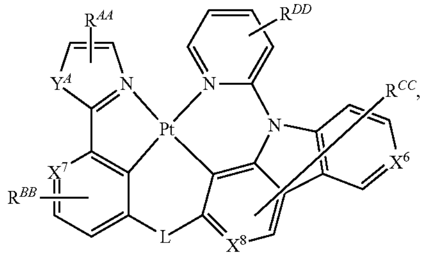
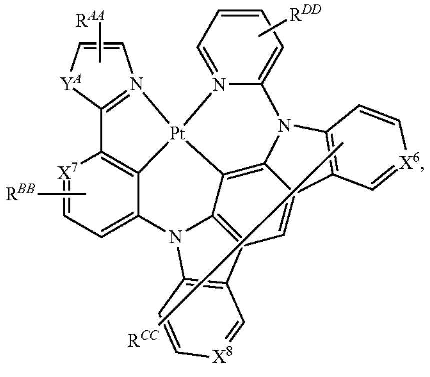
-continued
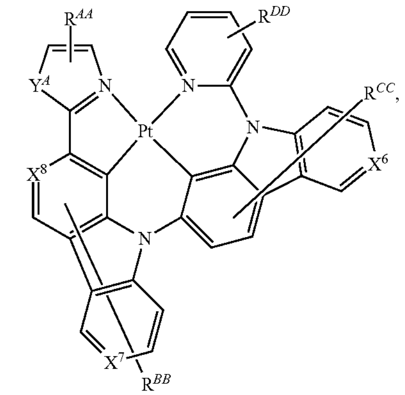
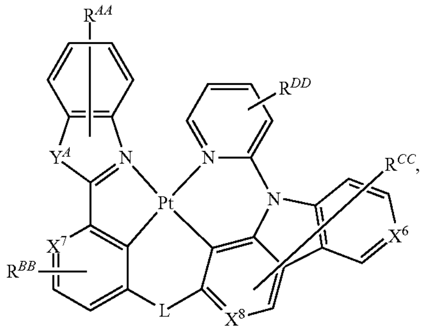
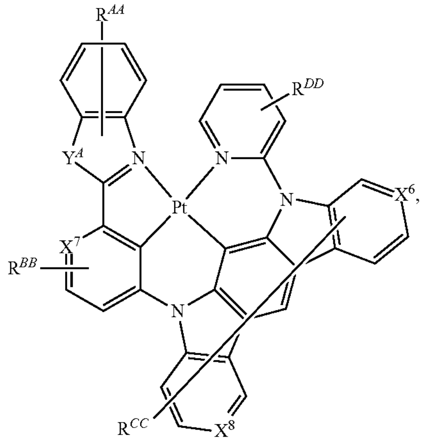
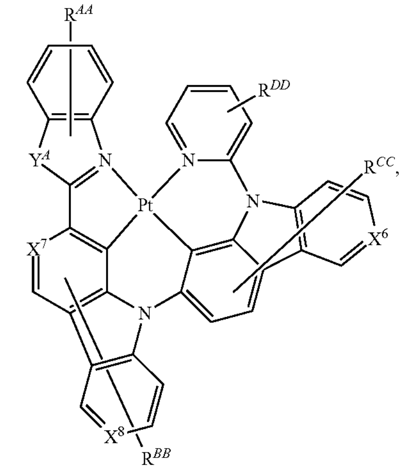

-continued
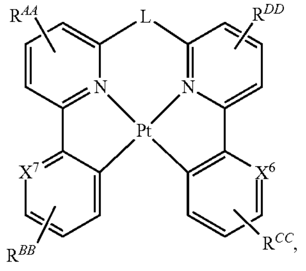
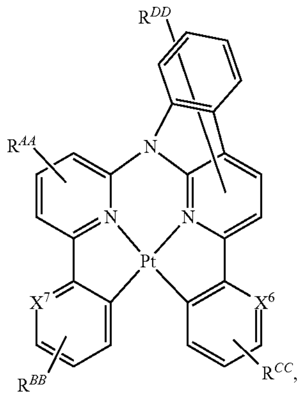
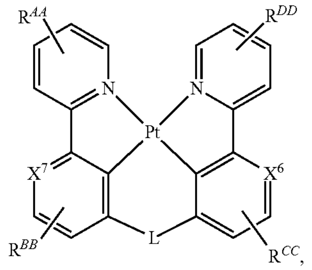
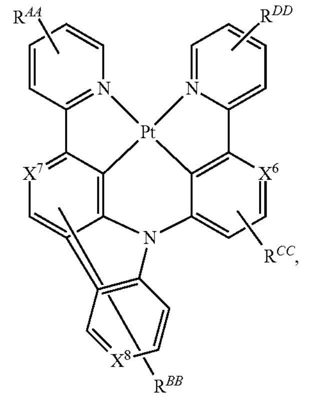
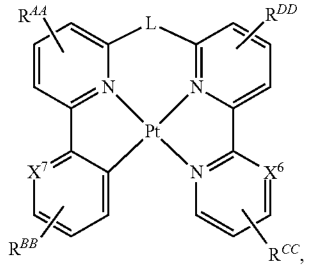
-continued
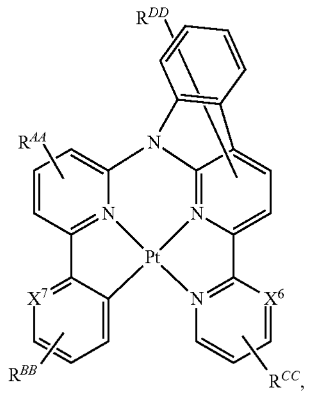
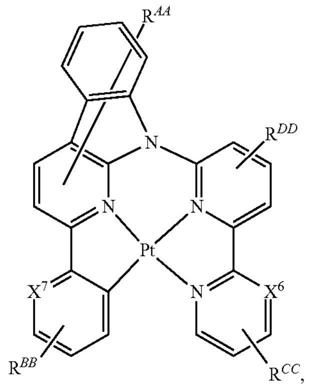
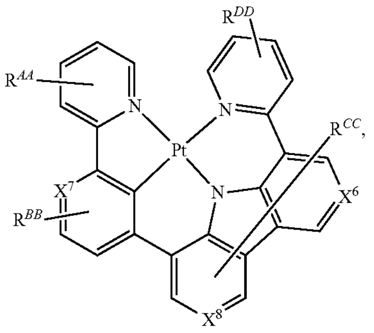
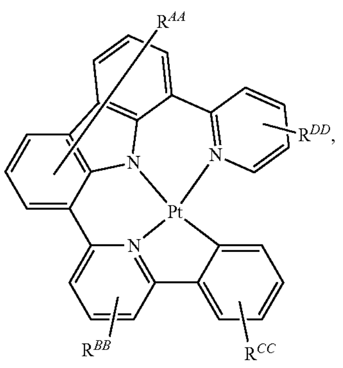

-continued
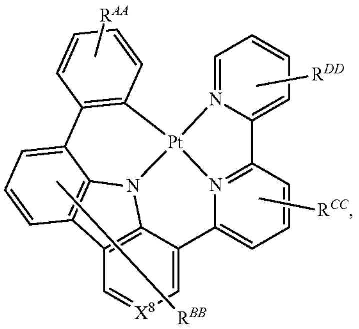
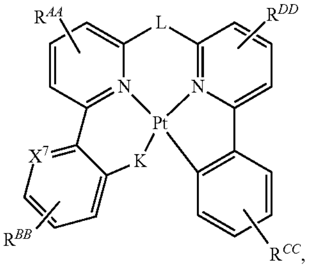
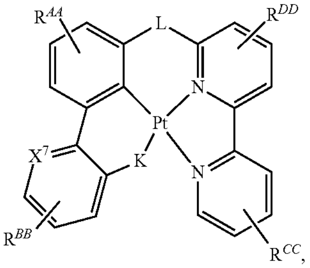
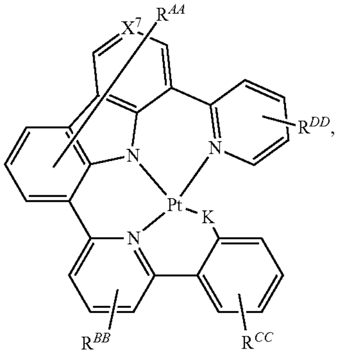
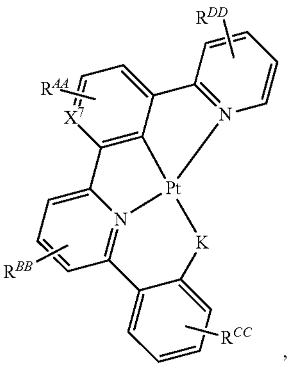
-continued
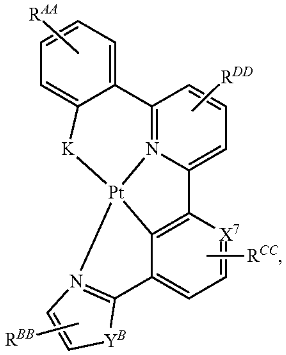
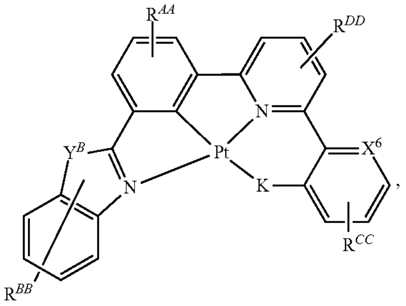
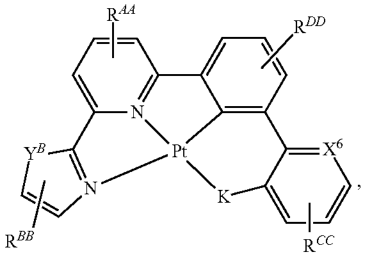
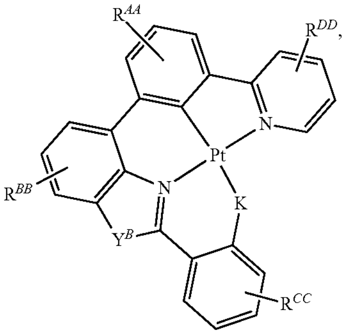
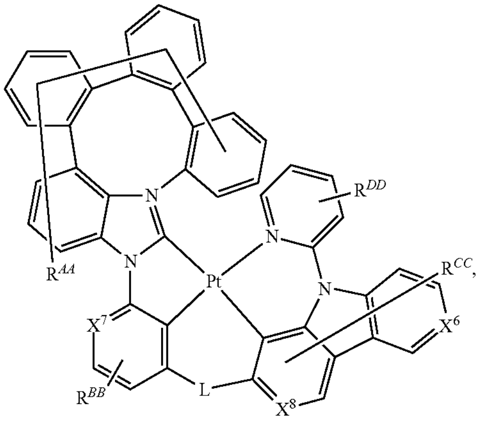

-continued
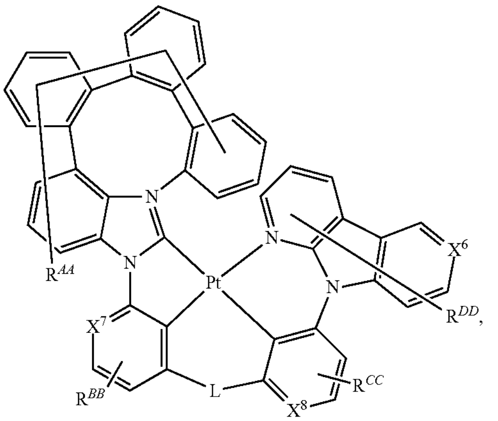
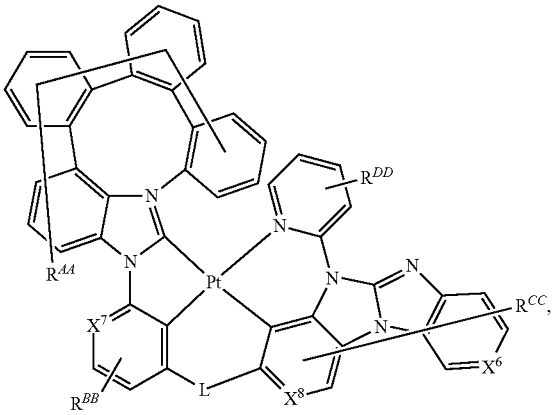
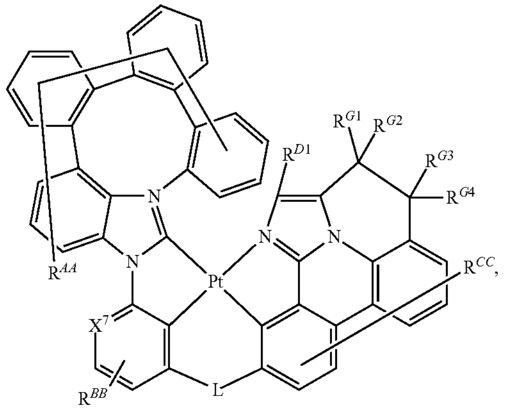
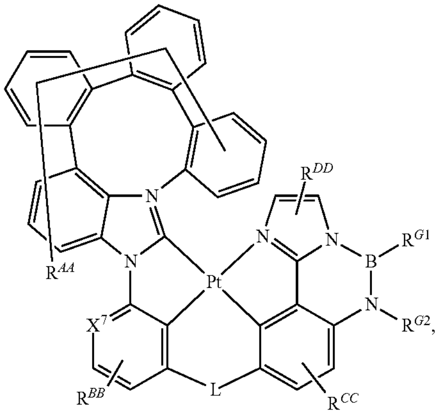
-continued
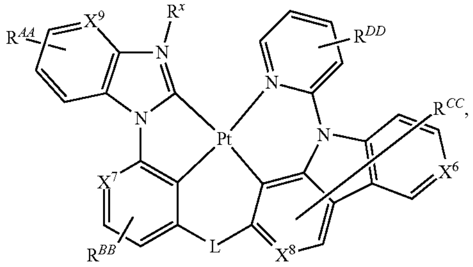
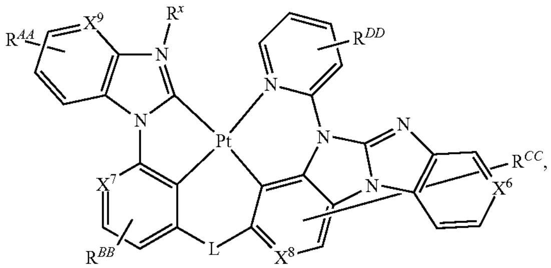
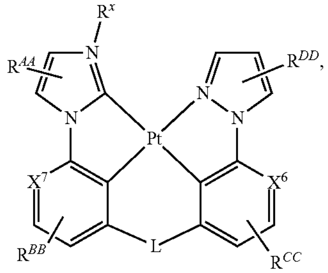
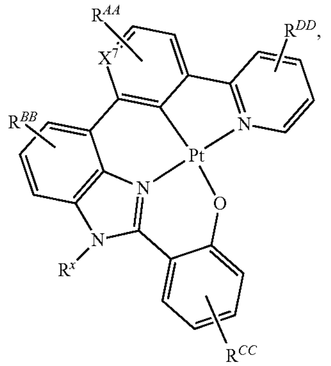
and
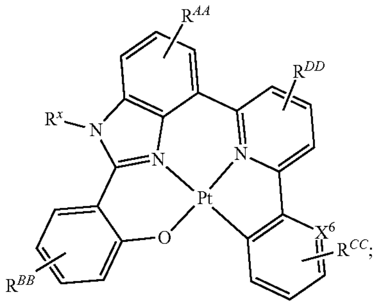
wherein:
each of $X^6$ to $X^9$ is independently C or N;
K is selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;
L is selected from the group consisting of a direct bond, or a linker selected from the group consisting of BR, BRR', NR, PR, P(O)R, O, S, Se, C═O, C═S, C═Se, C═NR', C═CR"R"', S═O, $SO_2$, CR, CRR', SiRR', GeRR', alkyl, cycloalkyl, aryl, heteroaryl, and combinations thereof;

each of $Y^A$ and $Y^B$ is independently selected from the group consisting of BR, BRR', NR, PR, P(O)R, O, S, Se, C═O, C═S, C═Se, C═NR', C═CR"R"', S═O, $SO_2$, CR, CRR', SiRR', GeRR';

each of $R^{AA}$, $R^{BB}$, $R^{CC}$, and $R^{DD}$ independently represents mono to the maximum allowable substitution, or no substitution;

each R, R', R", R"', $R^{\alpha}$, $R^{\beta}$, $R^X$, $R^Y$, $R^{A1}$, $R^{D1}$, $R^{G1}$, $R^{G2}$, $R^{G3}$, $R^{G4}$, $R^{G5}$, $R^{G6}$, $R^{G7}$, $R^{G8}$, $R^{AA}$, $R^{BB}$, $R^{CC}$, and $R^{DD}$ is independently a hydrogen or a substituent selected from the group consisting of the General Substituents defined herein; and any two substituents can be joined or fused to form a ring.

In some embodiments, the first compound has a structure selected from the group consisting of the structures of the following LIST 4:

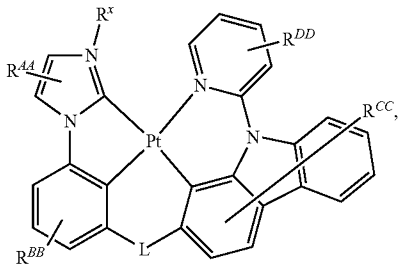

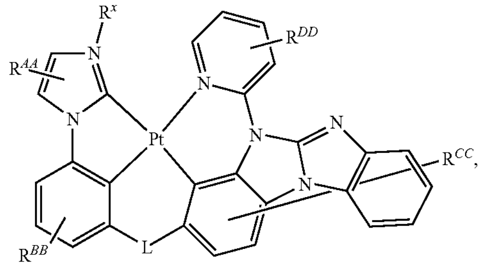

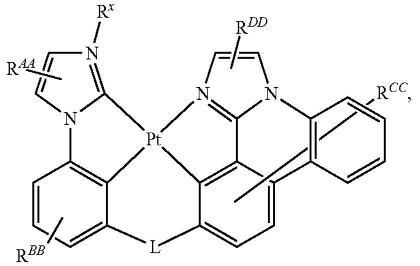

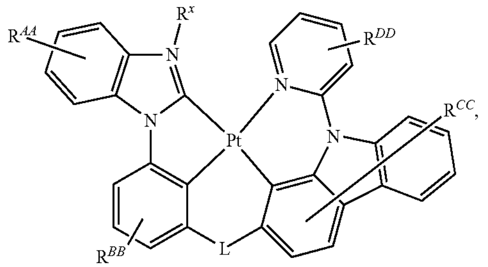

-continued

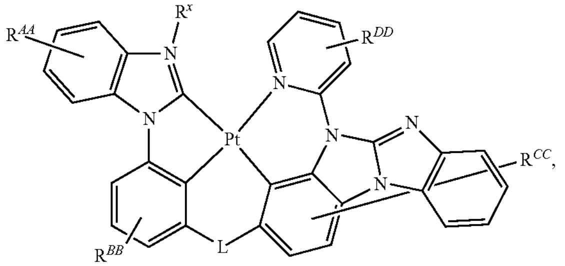

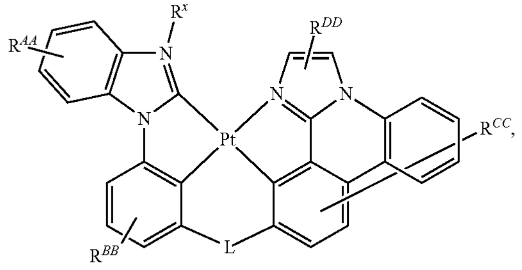

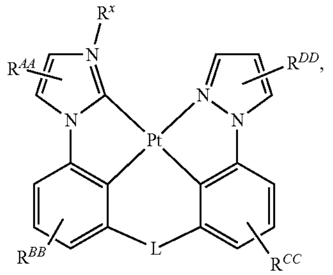

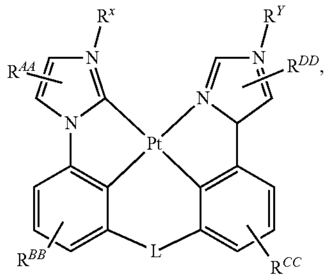

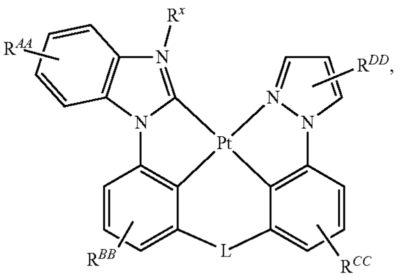

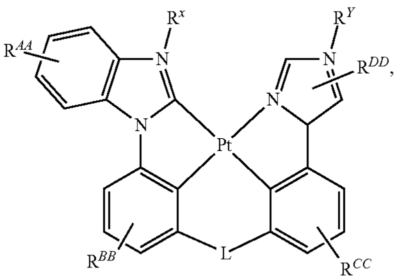

-continued
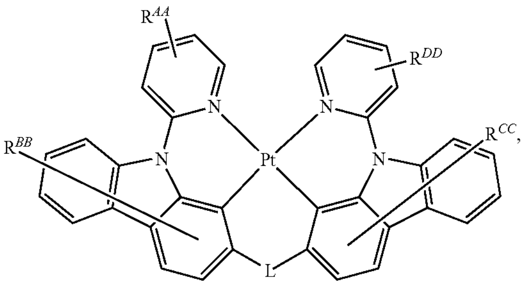
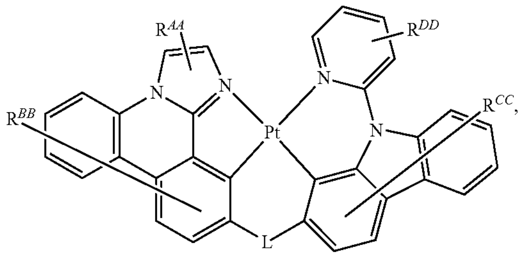
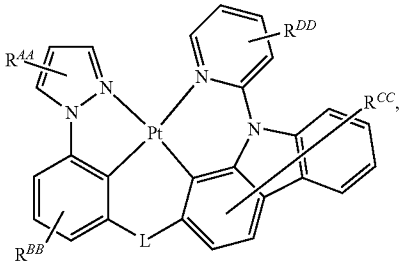
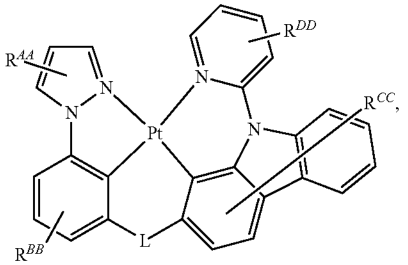
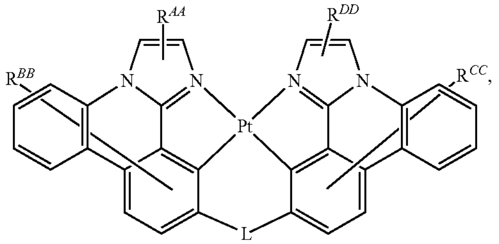
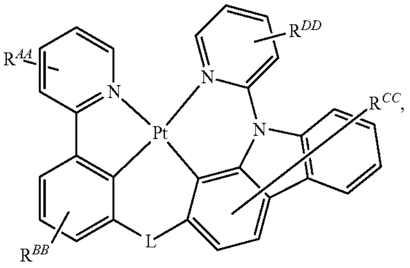
-continued
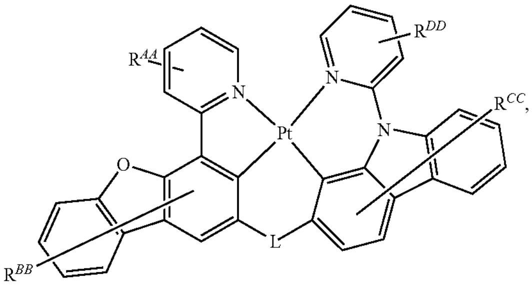
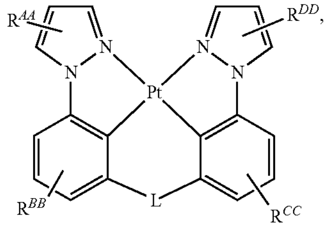
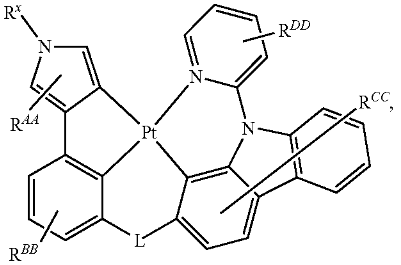
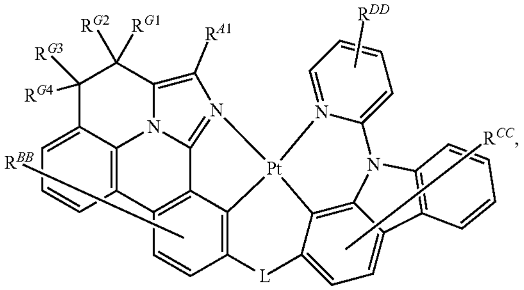
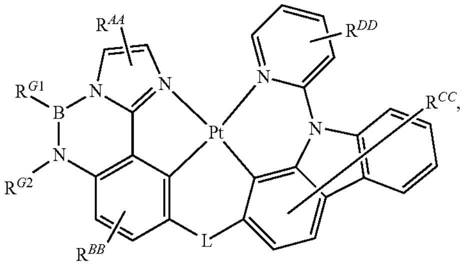
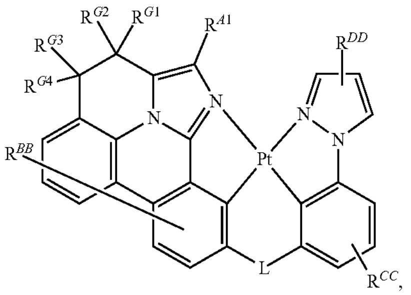

-continued
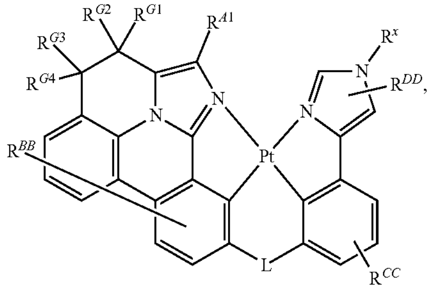
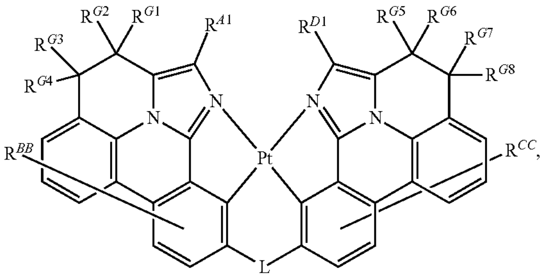
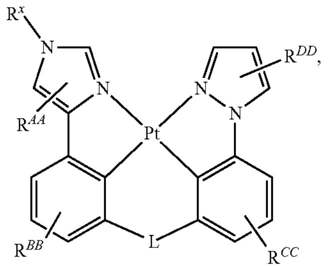
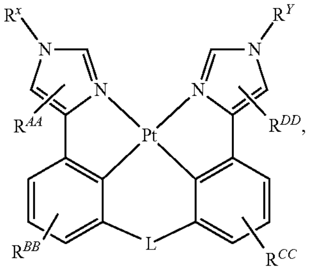
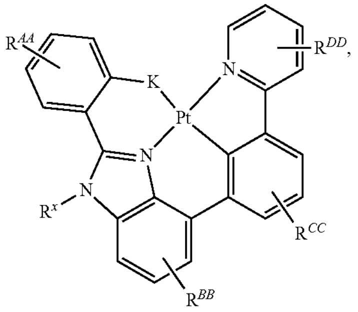
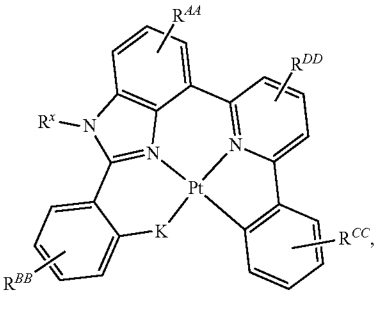
-continued
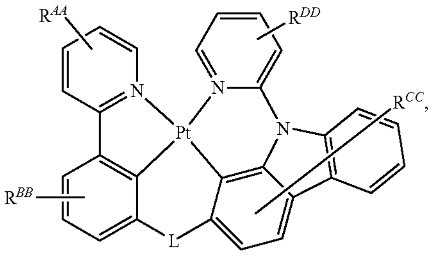
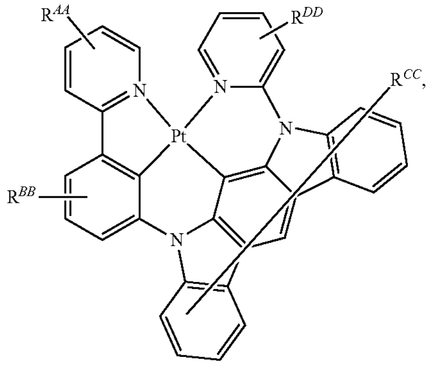
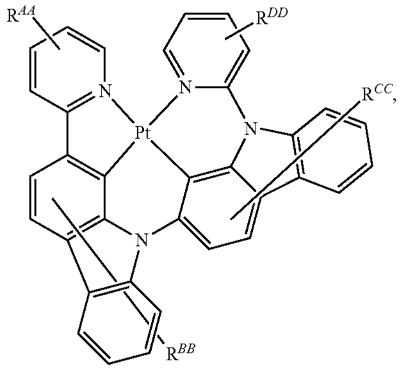
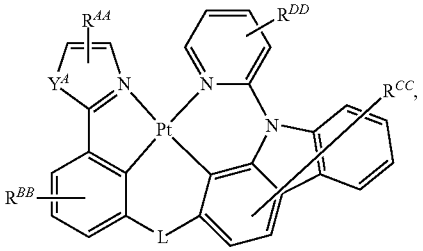
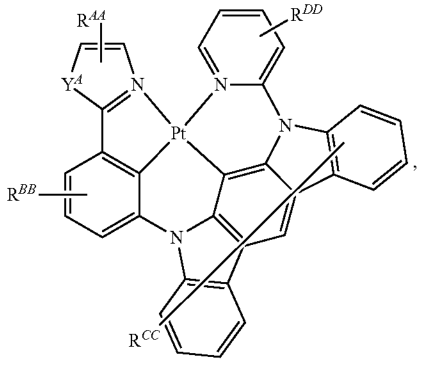

-continued
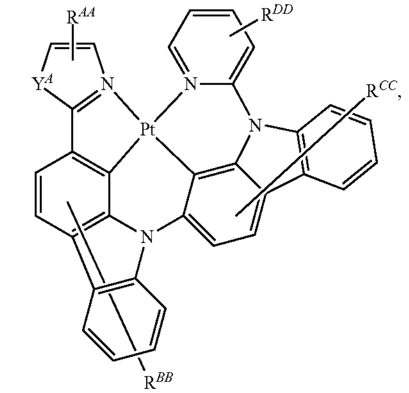
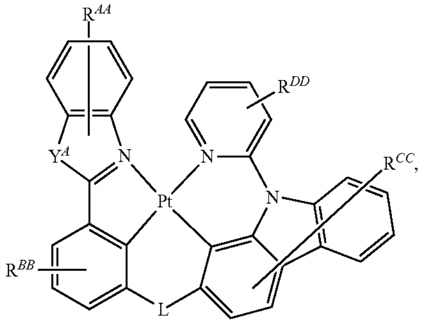
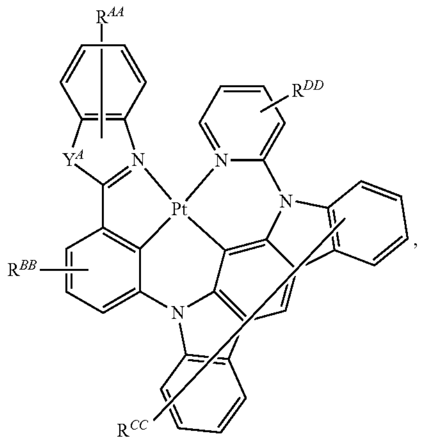
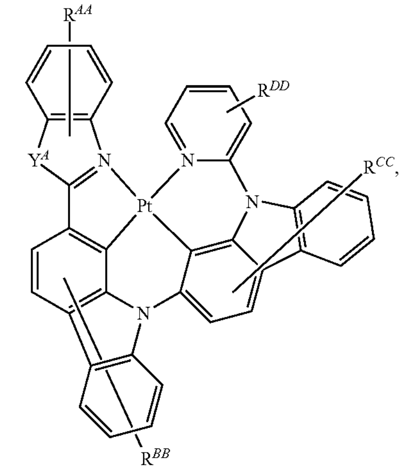
-continued
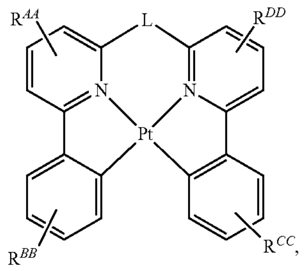
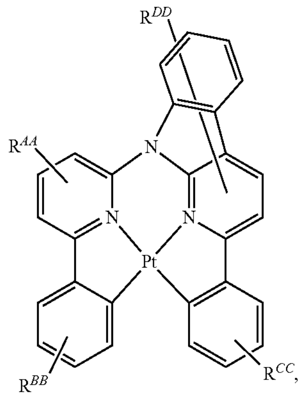
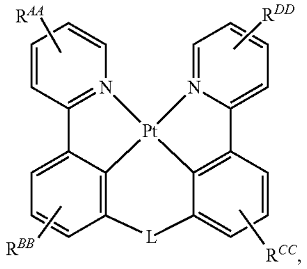
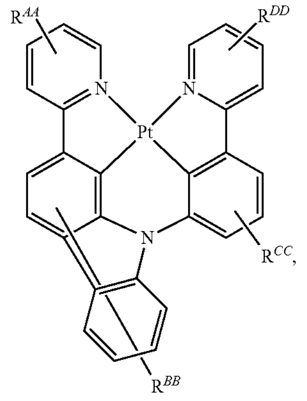
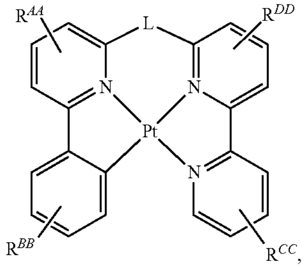

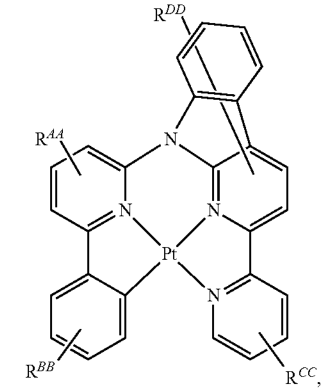
,
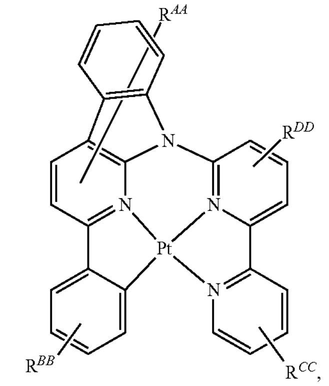
,
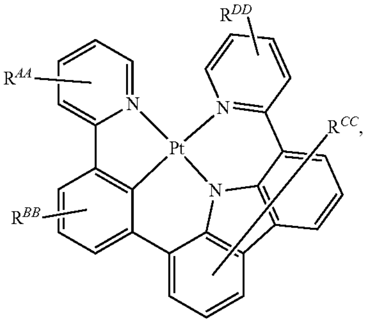
,
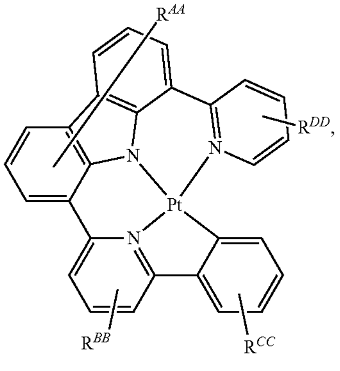
,
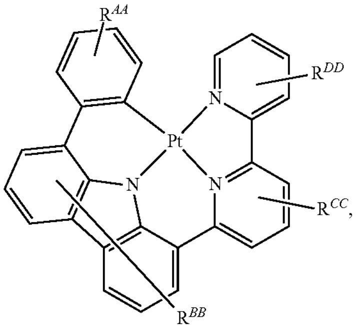
,
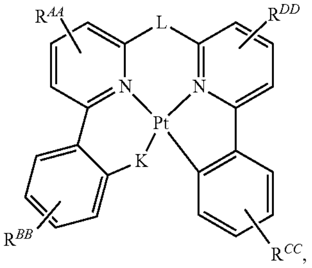
,
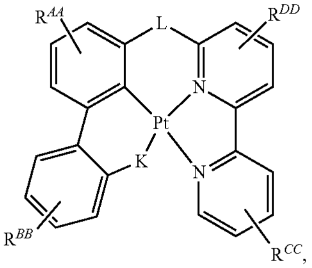
,
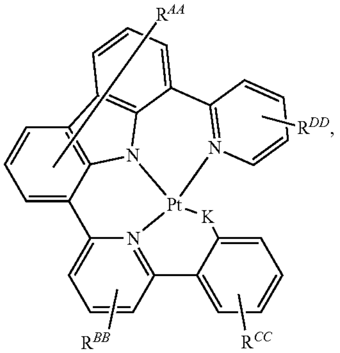
,
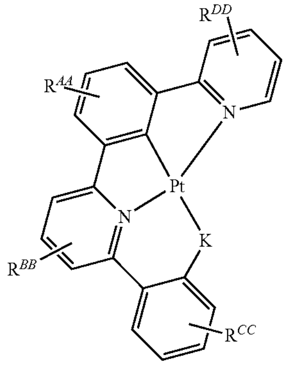
, -continued
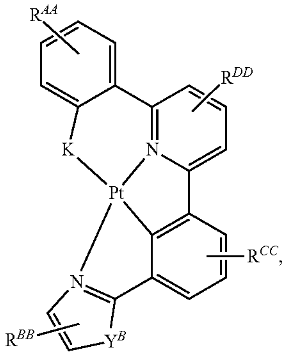
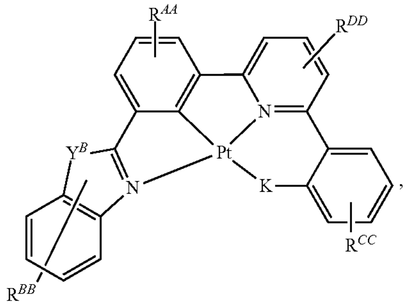
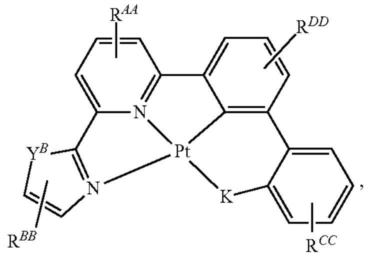
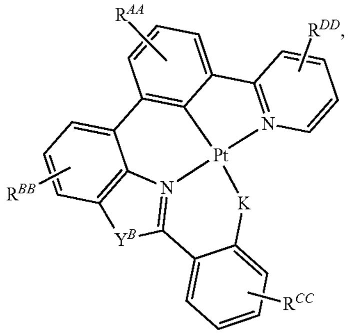
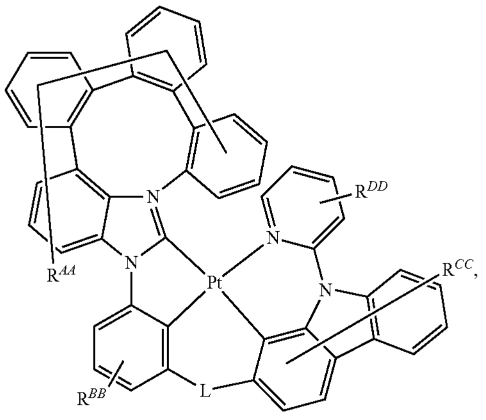
-continued
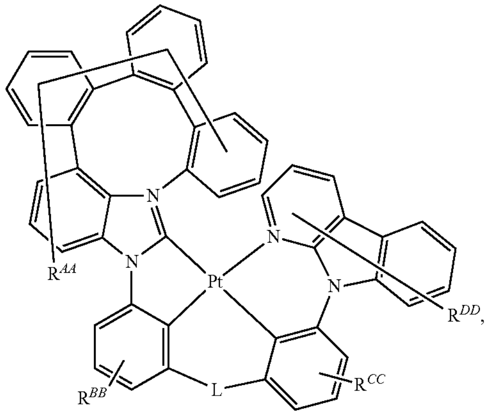
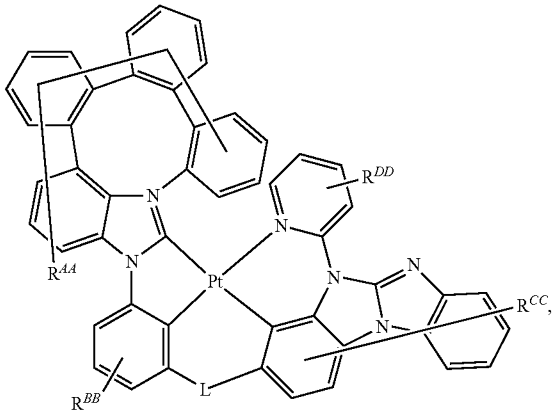
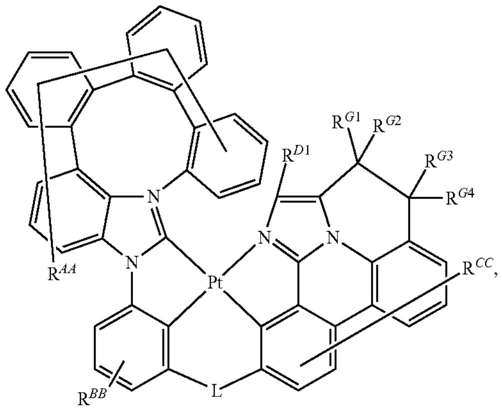
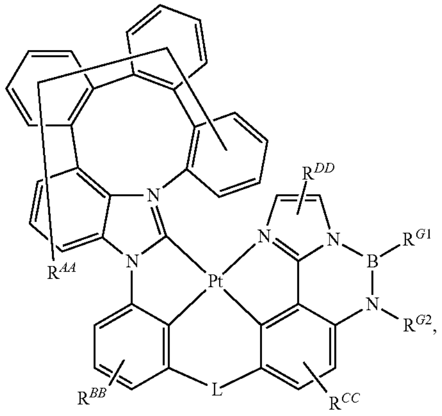

-continued

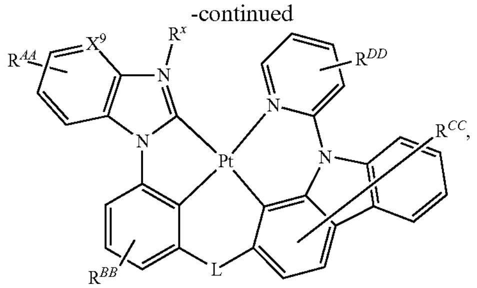

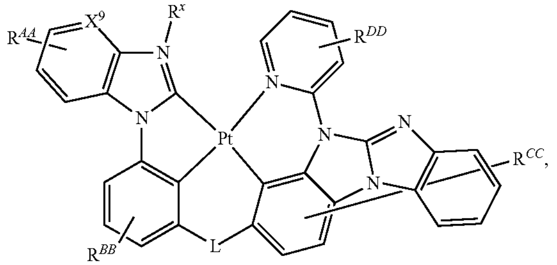

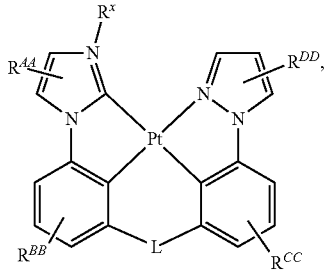

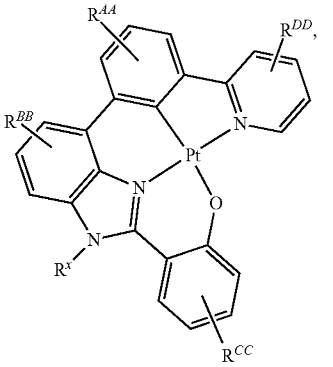

and

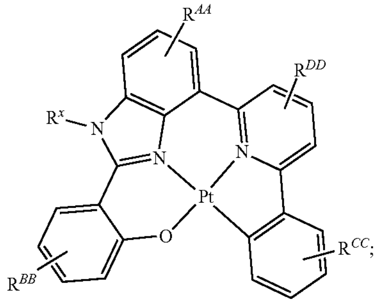

wherein:

K is selected from the group consisting of a direct bond, O, S, $N(R^{\alpha})$, $P(R^{\alpha})$, $B(R^{\alpha})$, $C(R^{\alpha})(R^{\beta})$, and $Si(R^{\alpha})(R^{\beta})$;

L is selected from the group consisting of a direct bond, or a linker selected from the group consisting of BR, BRR', NR, PR, P(O)R, O, S, Se, C═O, C═S, C═Se, C═NR', C═CR"R"', S═O, $SO_2$, CR, CRR', SiRR', GeRR', alkyl, cycloalkyl, aryl, heteroaryl, and combinations thereof;

each of $Y^A$ and $Y^B$ is independently selected from the group consisting of BR, BRR', NR, PR, P(O)R, O, S, Se, C═O, C═S, C═Se, C═NR', C═CR"R"', S═O, $SO_2$, CR, CRR', SiRR', GeRR';

each of R', $R^{BB}$, $R^{CC}$, and $R^{DD}$ independently represents mono to the maximum allowable substitution, or no substitution;

each R, R', R", R"', $R^{\alpha}$, $R^{\beta}$, $R^X$, $R^Y$, $R^{A1}$, $R^{D1}$, $R^{G1}$, $R^{G2}$, $R^{G3}$, $R^{G4}$, $R^{G5}$, $R^{G6}$, $R^{G7}$, $R^{G8}$, $R^{AA}$, $R^{BB}$, $R^{CC}$, and $R^{DD}$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

In some embodiments, the first compound may have a structure of Formula XI or Formula XII:

Formula XI,

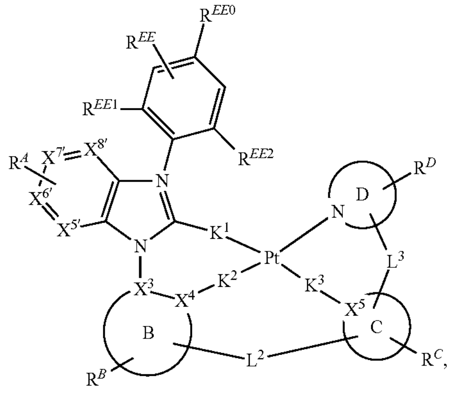

Formula XII;

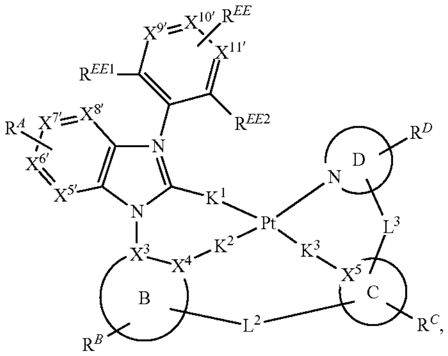

wherein:

$X^{5'}$ to $X^{11'}$ are each independently C or N;

$R^{EE}$ represents mono to the maximum allowable substitutions, or no substitutions;

each of $R^E$, $R^{EE0}$, $R^{EE1}$ and $R^{EE2}$ is independently hydrogen or a substituent selected from the group consisting of the General Substituents defined herein; and any two substituents may be joined or fused to form a ring.

In some embodiments, $R^{EE0}$ is selected from the group consisting of halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof. In some embodiments, $R^{EE0}$ is not H or D. In some embodiments, $R^{EE0}$ is alkyl, cycloalkyl, aryl, or heteroaryl. In some embodiments, $R^{EE0}$ is $C_6H_5$, $C_6D_5$, $C(CH_3)_3$, $C(CD_3)_3$, $CD_2C(CH_3)_3$, $CH_3$, $CD_3$, cyclopentyl, cyclohexyl, or neopentyl.

In some embodiments, $X^{5'}$ to $X^{1'}$ are each C. In some embodiments, one of $X^{5'}$ to $X^{1'}$ is N. In some embodiments, two of $X^{5'}$ to $X^{1'}$ are N. In some embodiments, one of $X^{5'}$ to $X^{8'}$ is N. In some embodiments, one of $X^{9'}$ and $X^{1'}$ is N. In some embodiments, $X^{10'}$ is N.

In some embodiments, $R^{EE1}$ is the same as $R^{EE2}$. In some embodiments, REEL is different from $R^{EE2}$ In some embodiments, at least one of $R^{EE1}$ or $R^{EE2}$ comprises a chemical group containing at least three 6-membered aromatic rings that are not fused next to each other. In some embodiments, at least one of $R^{EE1}$ or $R^{EE2}$ comprises a chemical group containing at least four 6-membered aromatic rings that are not fused next to each other. In some embodiments, at least one of $R^{EE1}$ or $R^{EE2}$ comprises a chemical group containing at least five 6-membered aromatic rings that are not fused next to each other. In some embodiments, at least one of $R^{EE1}$ or $R^{EE2}$ comprises a chemical group containing at least six 6-membered aromatic rings that are not fused next to each other. In some embodiments, each of $R^{EE1}$ and $R^{EE2}$ independently comprises a chemical group containing at least three to six 6-membered aromatic rings that are not fused next to each other.

In some embodiments, at least one of $R^{EE1}$ or $R^{EE2}$ comprises a group $R^W$, where $R^W$ has a structure selected from the group consisting of: Formula XIIIA, $-Q^4(R^{1a})(R^{2a})_a(R^{3a})_b$, Formula XIIIB,

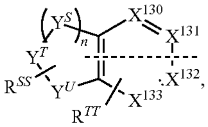

and

Formula XIIIC,

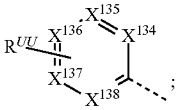

;

wherein:

each of $X^{130}$ to $X^{138}$ is independently C or N;

each of $Y^S$, $Y^T$, and $Y^U$ is independently CRR', SiRR' or GeRR';

n is an integer from 1 to 8, when n is more than 1, each $Y^S$ can be same or different;

$Q^4$ is selected from the group consisting of C, Si, Ge, N, P, O, S, Se, and B;

each of a and b is independently 0 or 1;

if $Q^4$ is C, Si, or Ge, then a+b=2;

if $Q^4$ is N or P, then a+b=1;

if $Q^4$ is B, then a+b can be 1 or 2;

if $Q^4$ is 0, S, or Se, then a+b=0;

each of $R^{SS}$, $R^{TT}$, and $R^{UU}$ independently represents mono to the maximum allowable number of substitutions, or no substitution;

each R, R', $R^{1a}$, $R^{2a}$, $R^{3a}$, $R^{SS}$, $R^{TT}$, and $R^{UU}$ is independently hydrogen or a substituent selected from the group consisting of the General Substituents defined herein; and any two substituents may be optionally fused or joined to form a ring.

In some embodiments, at least one $Y^S$, $Y^T$, or $Y^U$ is SiRR' or GeRR'. In some embodiments, each $Y^S$, $Y^T$, and $Y^U$ is CRR'.

In some embodiments, at least one of $R^{EE1}$ and $R^{EE2}$ comprises a group $R^W$. In some embodiments, each of $R^{EE1}$ and $R^{EE2}$ comprises a group $R^W$. In some embodiments, each of $R^{EE1}$ and $R^{EE2}$ comprises Formula XIIIA. In some embodiments, each of $R^{EE1}$ and $R^{EE2}$ comprises Formula XIIIB. In some embodiments, each of $R^{EE1}$ and $R^{EE2}$ comprises Formula XIIIC. In some embodiments, either $R^{EE1}$ or $R^{EE2}$ comprises Formula XIIIA, and the other one of $R^{EE1}$ and $R^{EE2}$ comprises Formula XIIIB. In some embodiments, either $R^{EE1}$ or $R^{EE2}$ comprises Formula XIIIA, and the other one of $R^{EE1}$ and $R^{EE2}$ comprises Formula XIIIC. In some embodiments, either $R^{EE1}$ or $R^{EE2}$ comprises Formula XIIIB, and the other one of $R^{EE1}$ and $R^{EE2}$ comprises Formula XIIIC.

In some embodiments, $R^{EE1}$ has a molecular weight (MW) greater than 15 g/mol and $R^{EE2}$ has a molecular weight greater than that of $R^{EE1}$. In some embodiments, $R^{EE1}$ has a molecular weight (MW) greater than 56 g/mol and $R^{EE2}$ has a molecular weight greater than that of $R^{EE1}$. In some embodiments, $R^{EE1}$ has a molecular weight (MW) greater than 76 g/mol and $R^{EE2}$ has a molecular weight greater than that of $R^{EE1}$. In some embodiments, $R^{EE1}$ has a molecular weight (MW) greater than 81 g/mol and $R^{EE2}$ has a molecular weight greater than that of $R^{EE1}$. In some embodiments, $R^{EE1}$ or $R^{EE2}$ has a molecular weight (MW) greater than 165 g/mol. In some embodiments, $R^{EE1}$ or $R^{EE2}$ has a molecular weight (MW) greater than 166 g/mol. In some embodiments, $R^{EE1}$ or $R^{EE2}$ has a molecular weight (MW) greater than 182 g/mol.

In some embodiments, $R^{EE1}$ has one more 6-membered aromatic ring than $R^{EE2}$. In some embodiments, $R^{EE1}$ has two more 6-membered aromatic rings than $R^{EE2}$. In some embodiments, $R^{EE1}$ has three more 6-membered aromatic rings than $R^{EE2}$. In some embodiments, $R^{EE1}$ has four more 6-membered aromatic rings than $R^{EE2}$. In some embodiments, $R^{EE1}$ has five more 6-membered aromatic rings than $R^{EE2}$.

In some embodiments, $R^{EE1}$ comprises at least one heteroatom and $R^{EE2}$ consists of hydrocarbon and deuterated variant thereof. In some embodiments, $R^{EE1}$ comprises at least two heteroatoms and $R^{EE2}$ consists of hydrocarbon and deuterated variant thereof. In some embodiments, $R^{EE1}$ comprises at least three heteroatoms and $R^{EE2}$ consists of hydrocarbon and deuterated variant thereof. In some embodiments, $R^{EE1}$ comprises exactly one heteroatom and $R^{EE2}$ consists of hydrocarbon and deuterated variant thereof. In some embodiments, $R^{EE1}$ comprises exactly two heteroatoms and $R^{EE2}$ consists of hydrocarbon and deuterated variant thereof. In some embodiments, $R^{EE1}$ comprises exactly three heteroatoms and $R^{EE2}$ consists of hydrocarbon and deuterated variant thereof. In some embodiments, $R^{EE1}$ comprises exactly one heteroatom and $R^{EE2}$ comprises exactly one heteroatom that is different from the heteroatom in $R^{EE1}$ In some embodiments, $R^{EE1}$ comprises exactly one heteroatom and $R^{EE2}$ comprises exactly one heteroatom that is same as the heteroatom in $R^{EE1}$.

In some embodiments, $R^{EE1}$ comprises exactly two heteroatoms and $R^{EE2}$ comprises exactly one heteroatom. In some embodiments, $R^{EE1}$ comprises exactly two heteroatoms and $R^{EE2}$ comprises exactly two heteroatoms. In some embodiments, $R^{EE1}$ comprises exactly three heteroatoms and $R^{EE2}$ comprises exactly one heteroatom. In some embodiments, $R^{EE1}$ comprises exactly three heteroatoms and $R^{EE2}$ comprises exactly two heteroatoms. In some embodiments, $R^{EE1}$ comprises exactly three heteroatoms and $R^{EE2}$ comprises exactly three heteroatoms.

In some embodiments, at least one of $R^{EE1}$ and $R^{EE2}$ comprises an aromatic ring fused to a non-aromatic ring. In some embodiments, both $R^{EE1}$ and $R^{EE2}$ comprise an aromatic ring fused to a non-aromatic ring. In some embodiments, the aromatic ring is a phenyl ring and the non-aromatic ring is a cycloalkyl ring.

In some embodiments, at least one of $R^{EE1}$ and $R^{EE2}$ is partially or fully deuterated. In some embodiments, both $R^{EE1}$ and $R^{EE2}$ are partially or fully deuterated.

In some embodiments, one of the $R^{EE1}$ and $R^{EE2}$ is joined with $R^A$ to form a cyclic ring.

In some embodiments, the first compound may have a structure of Formula XIV or Formula XV:

Formula XIV,

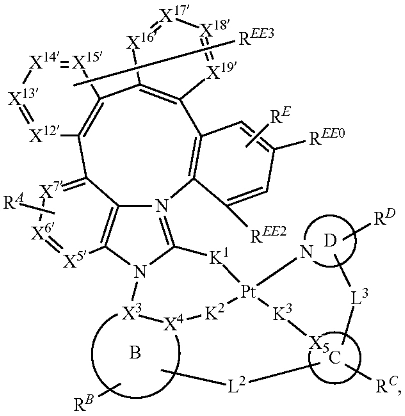

-continued

Formula XV;

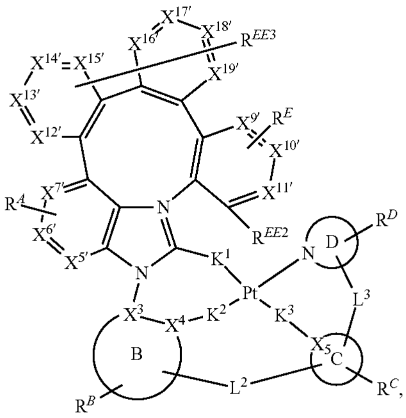

wherein $X^{12'}$ to $X^{19'}$ are each independently C or N; $R^{EE3}$ is independently hydrogen or a substituent selected from the group consisting of the General Substituents defined herein; and any two substituents may be joined or fused to form a ring.

In some embodiments, $X^{12'}$ to $X^{19'}$ are each C. In some embodiments, one of $X^{12'}$ to $X^{19'}$ is N. In some embodiments, two of $X^{12'}$ to $X^{19'}$ are N. In some embodiments, one of $X^{12'}$ to $X^{15'}$ is N. In some embodiments, one of $X^{16'}$ to $X^{19'}$ is N.

In some embodiments, the first compound has a structure consisting of the structures of the following LIST

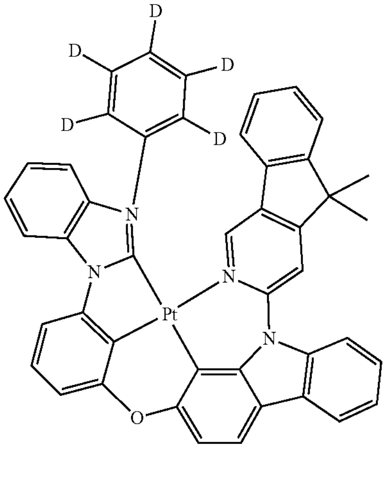

,

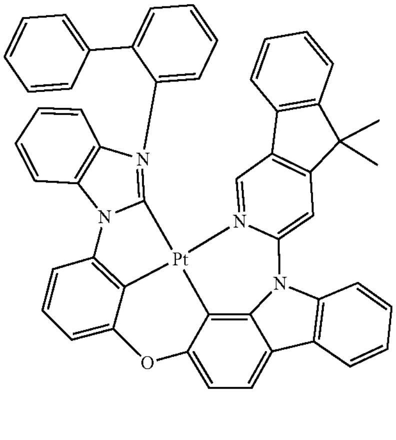

,

-continued
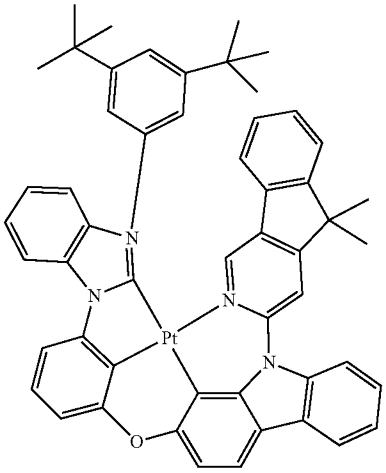,
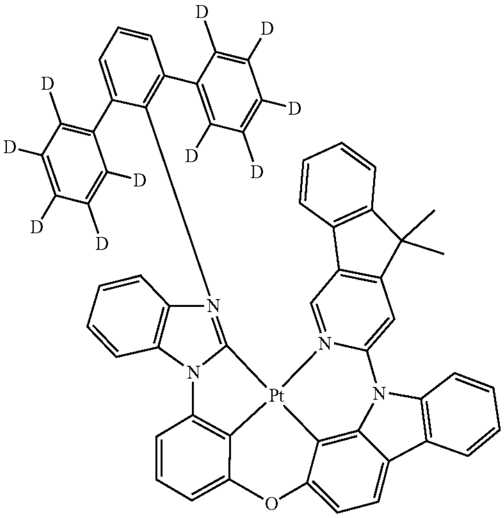,
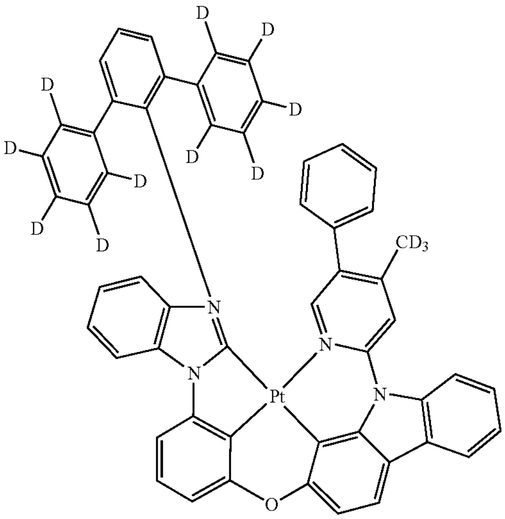,
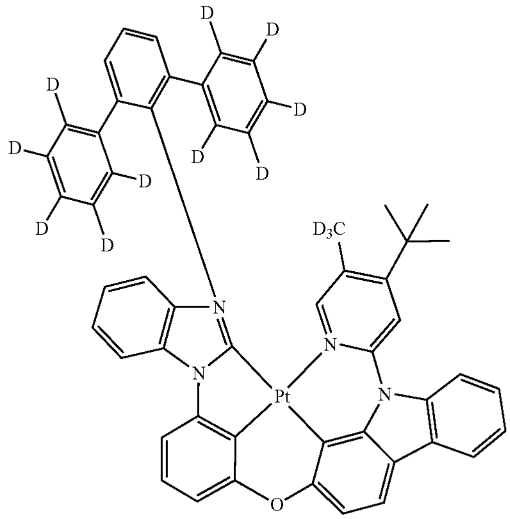,
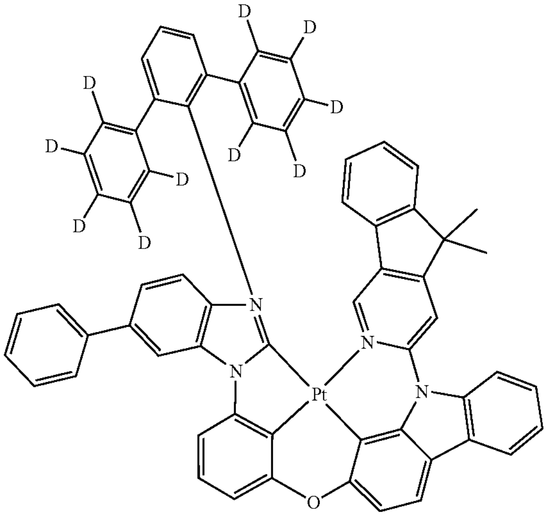,
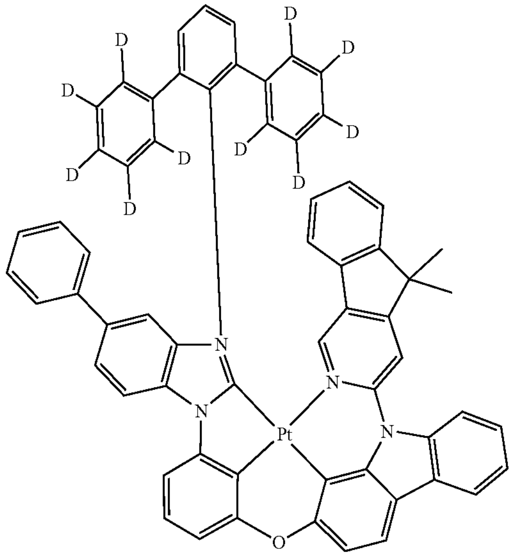, -continued
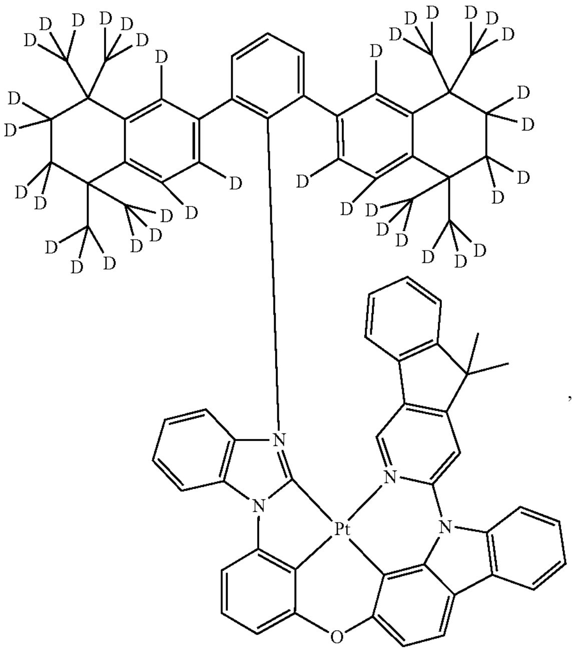
,
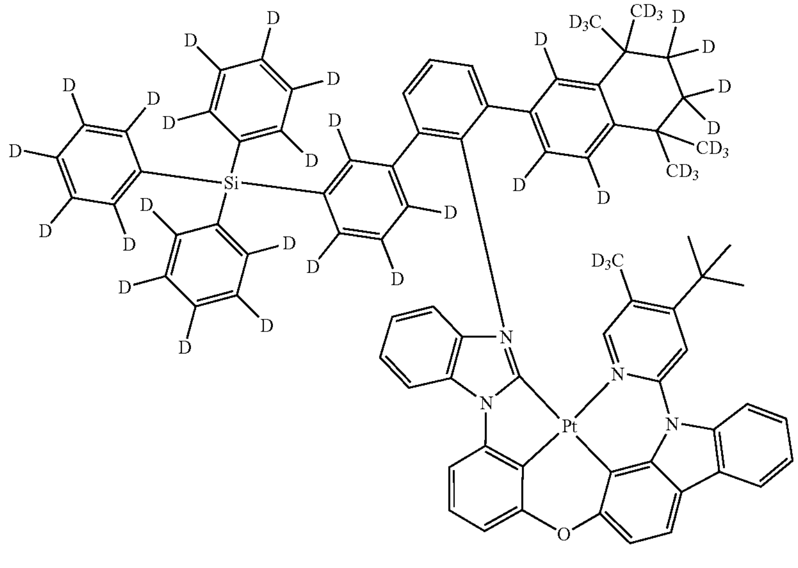
, -continued
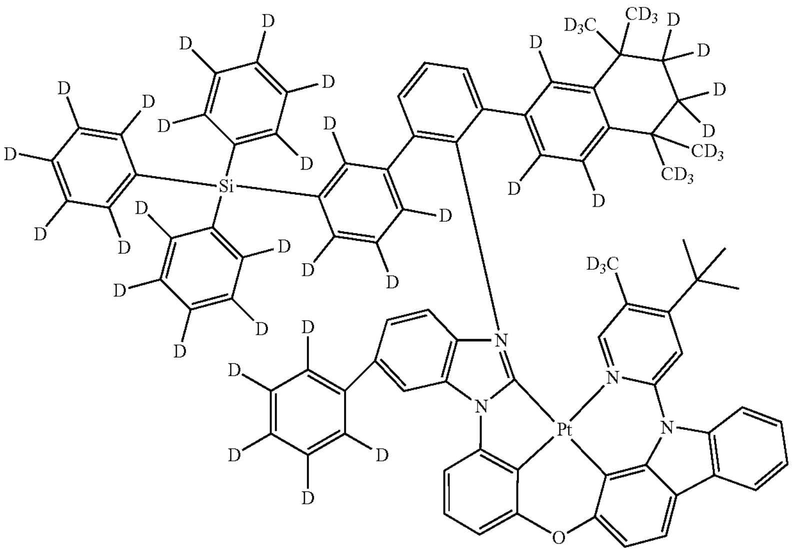
,
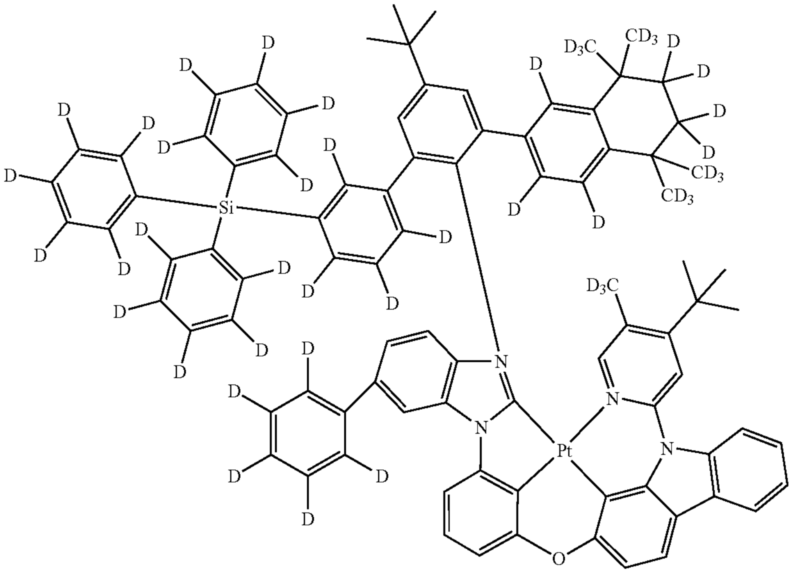
, -continued
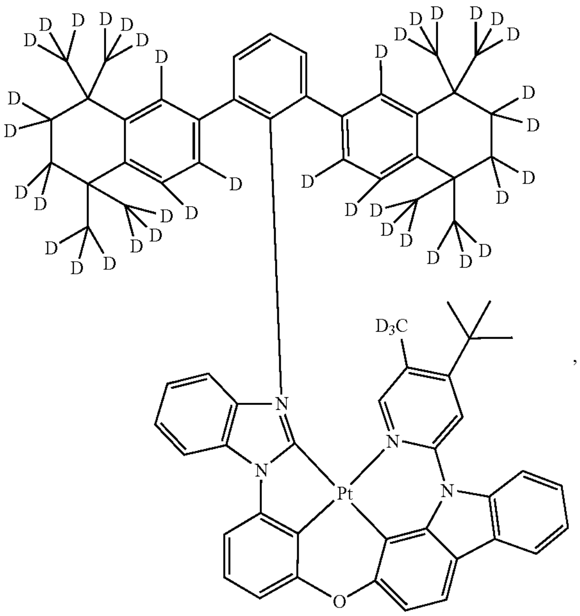
,
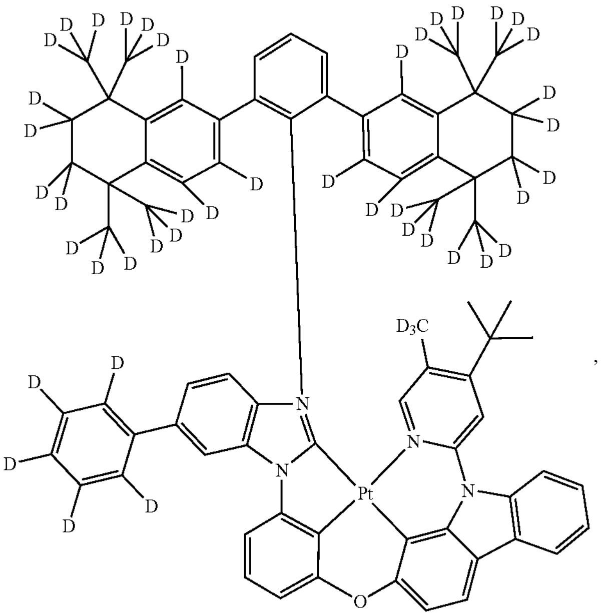
,
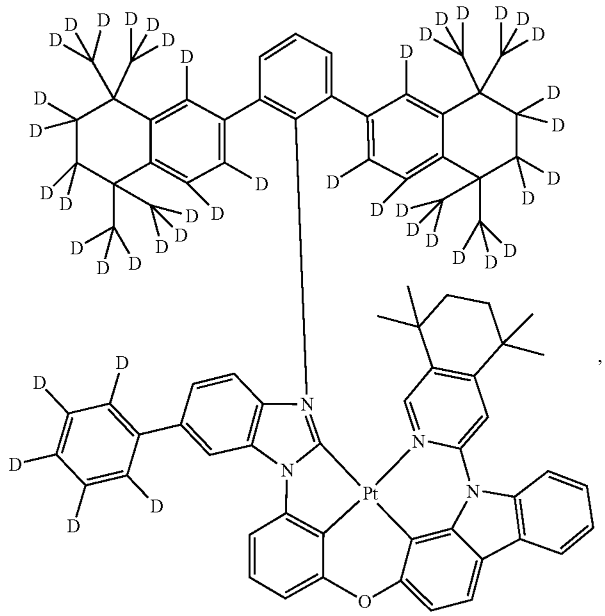
, -continued
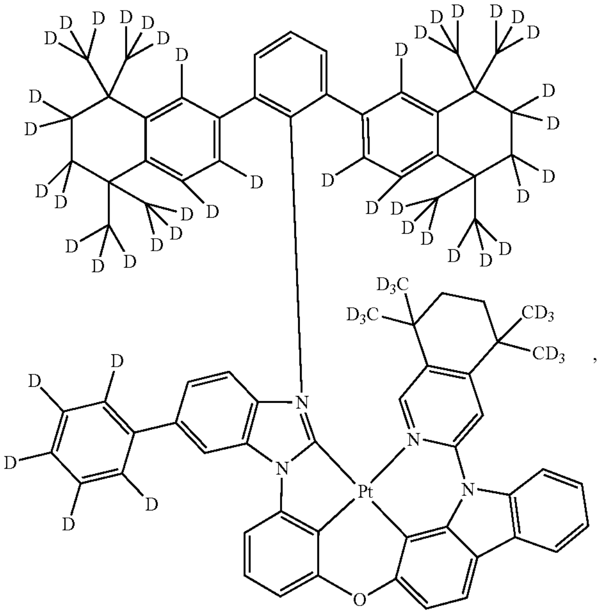
,
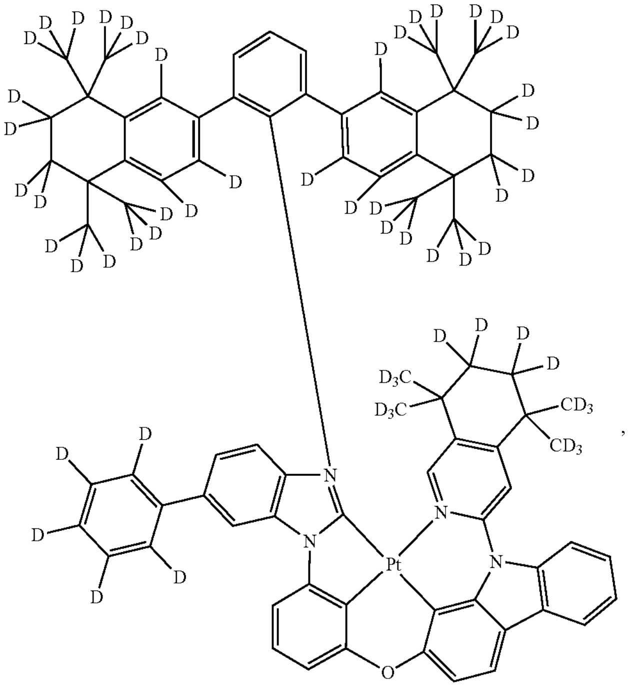
, -continued
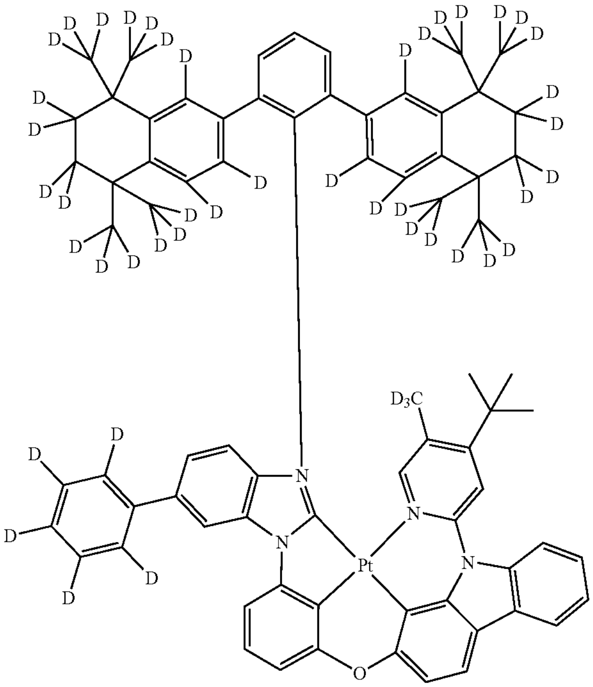
,
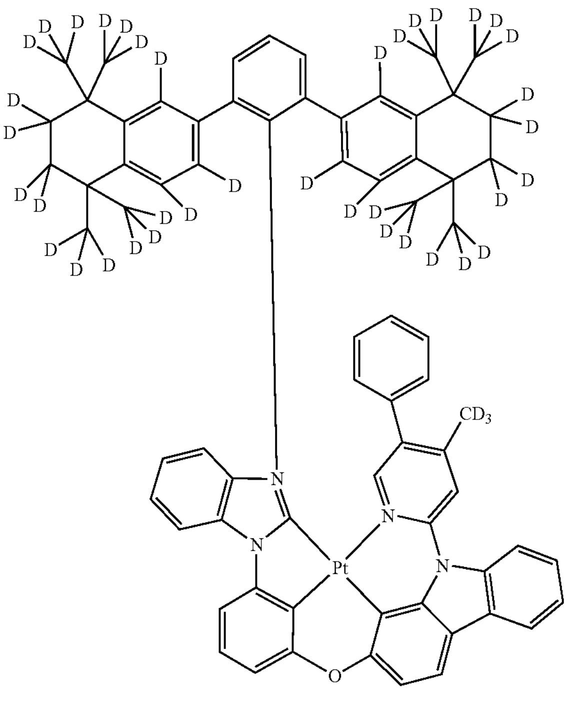
, -continued
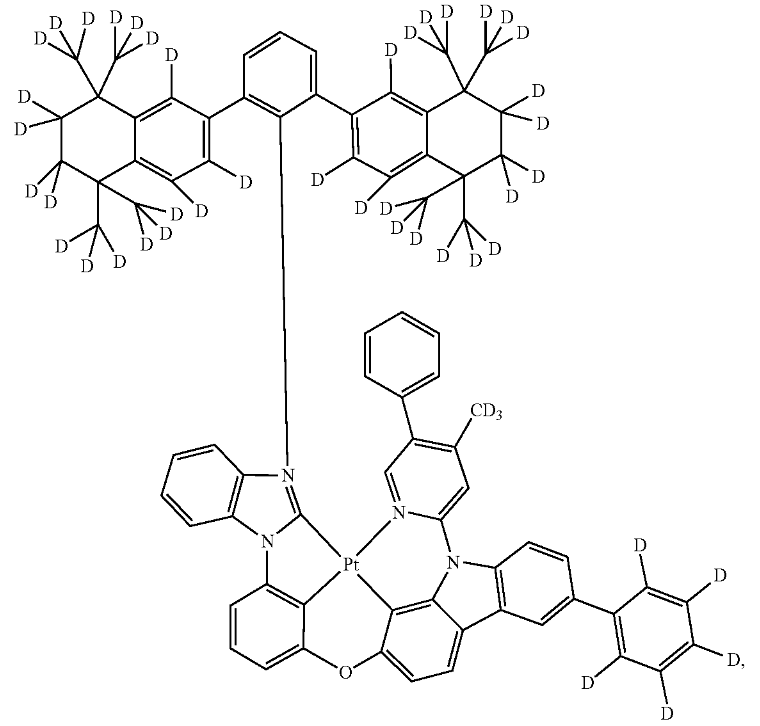
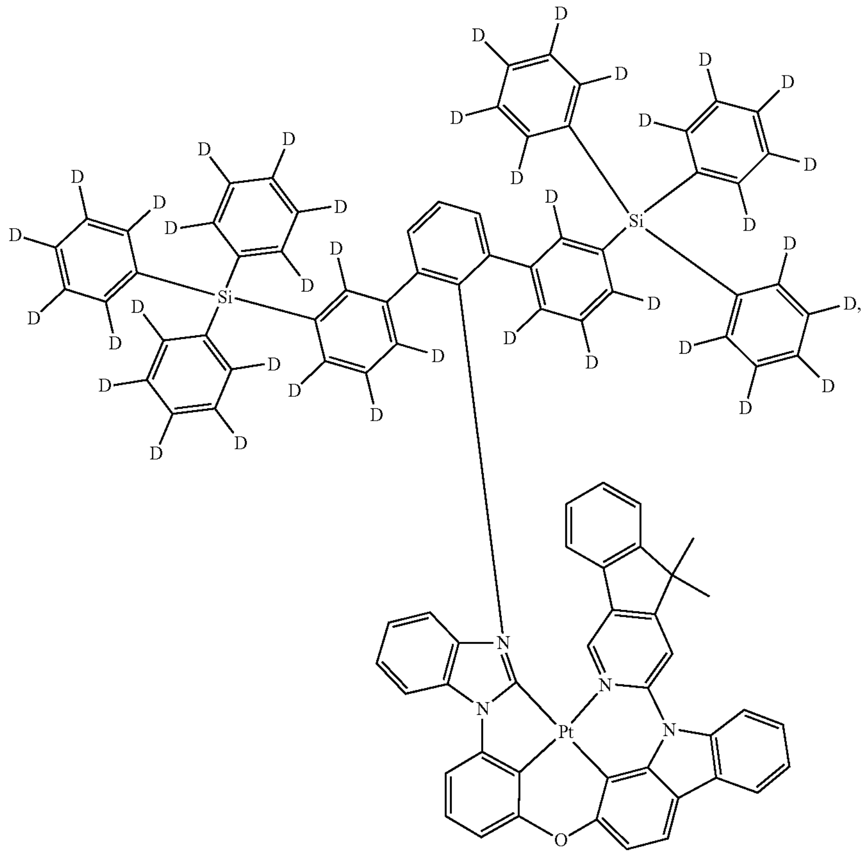

-continued
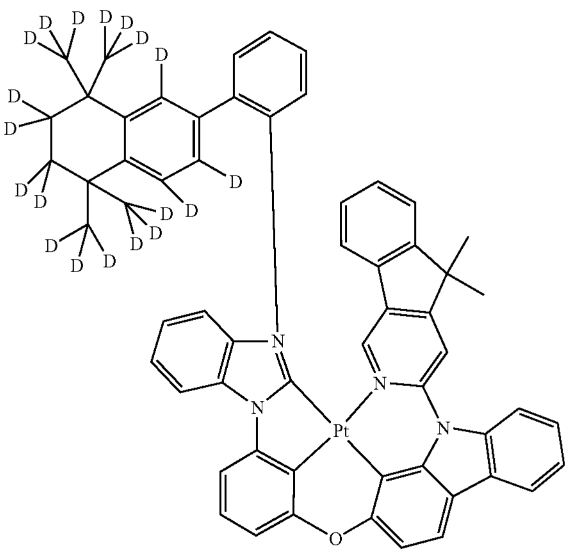
,
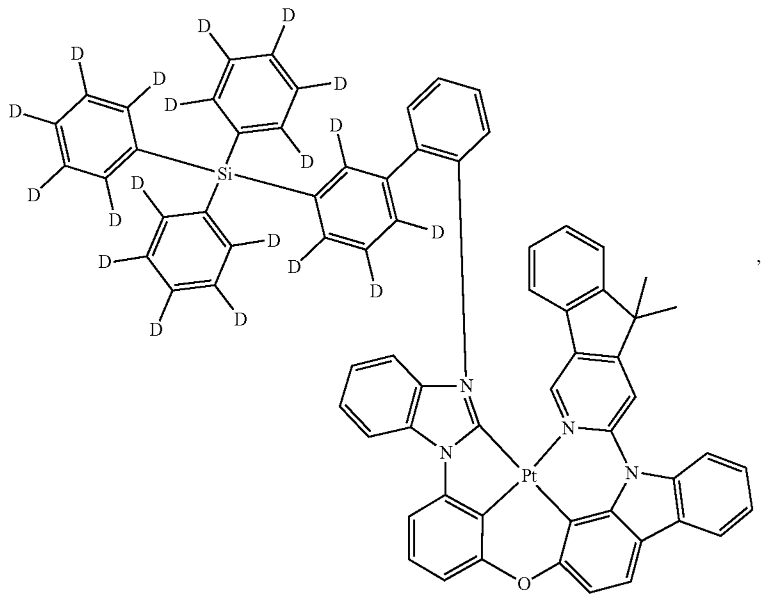
,

-continued
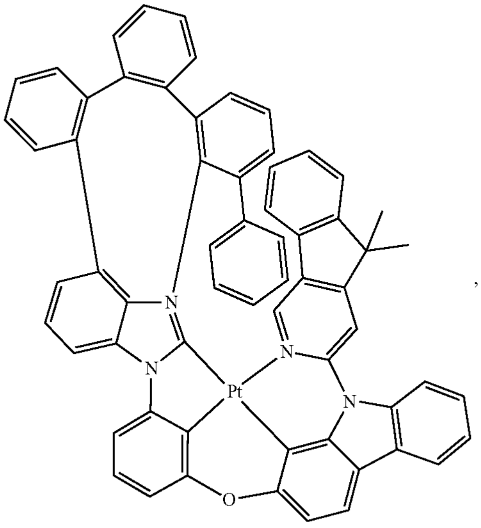
,
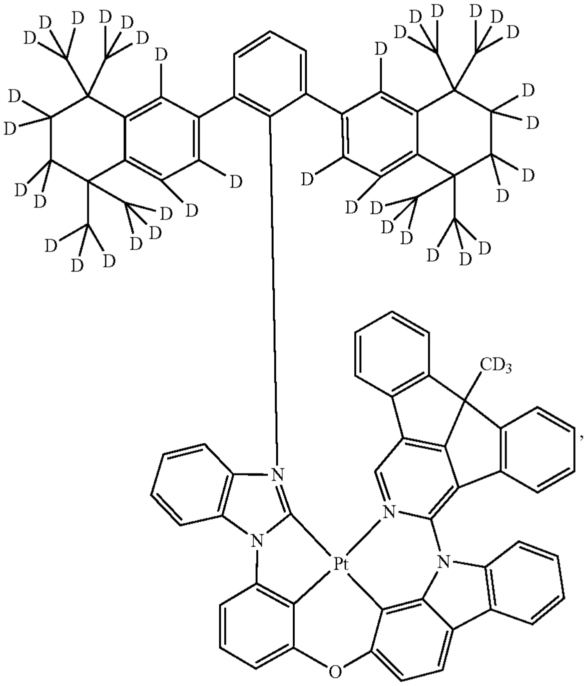
,
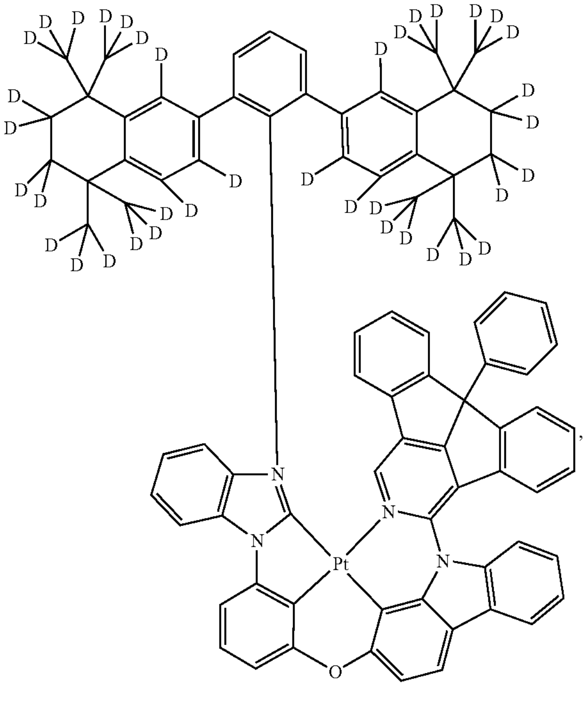
,
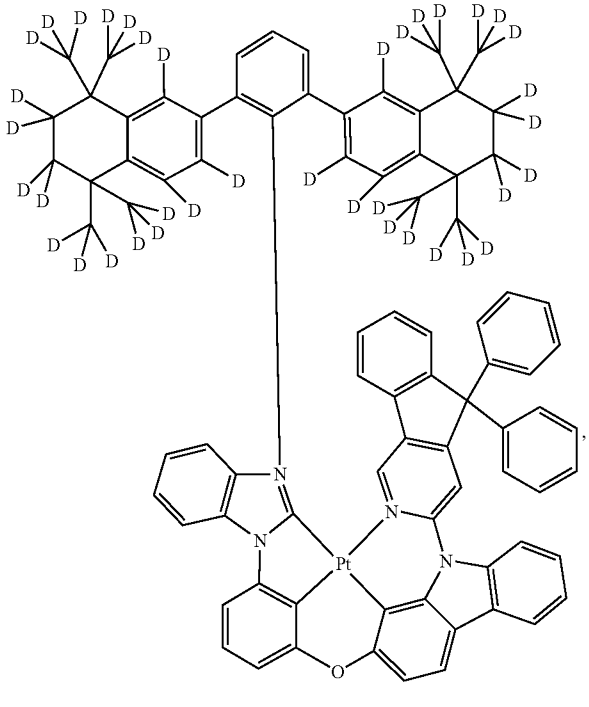
,

-continued
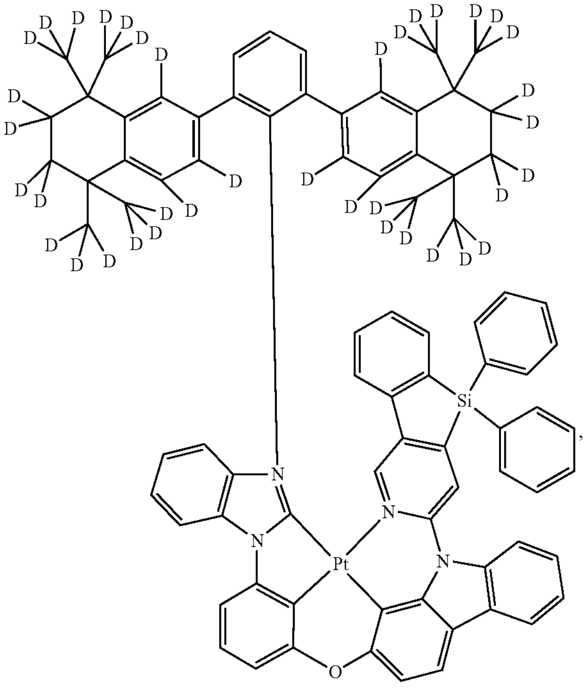
,
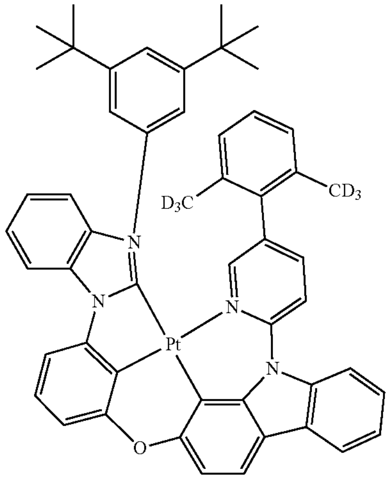
,
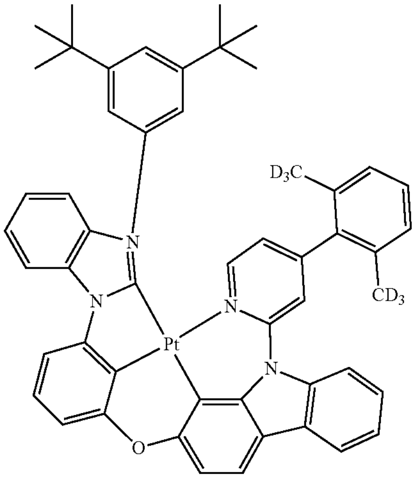
,
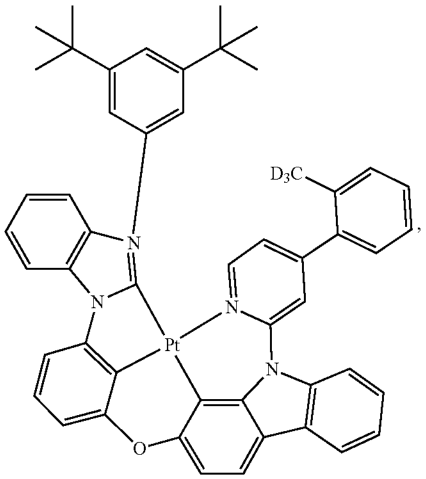
,
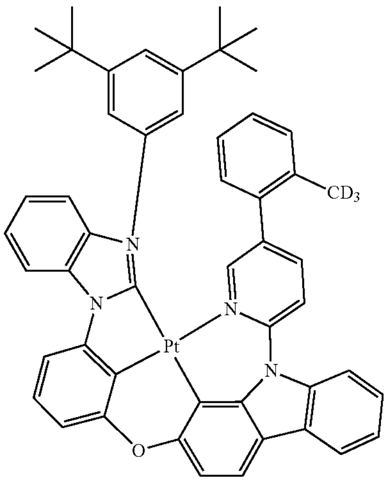
,
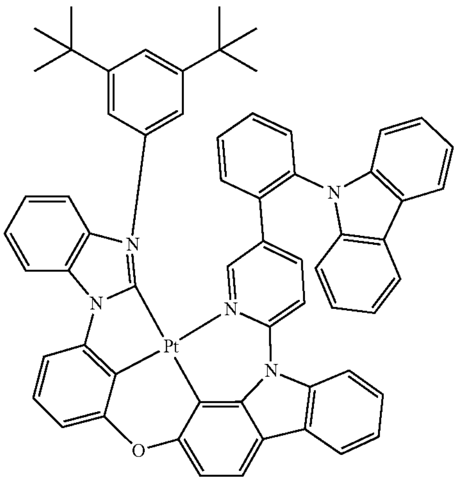
, -continued
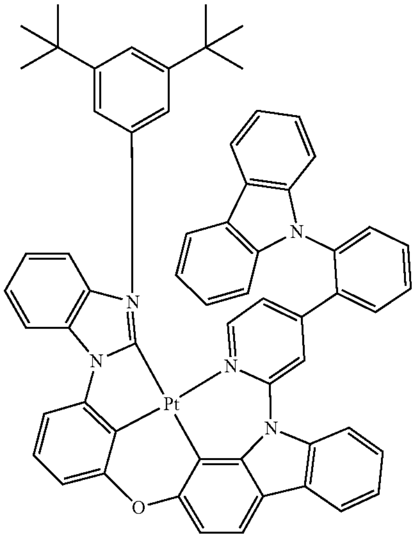,
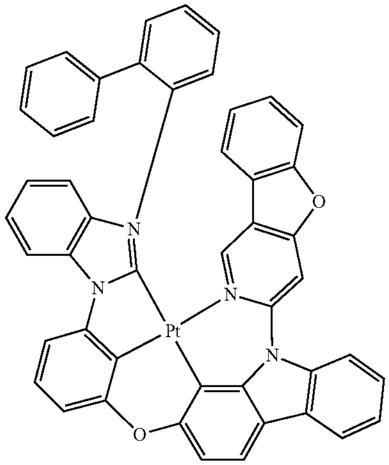,
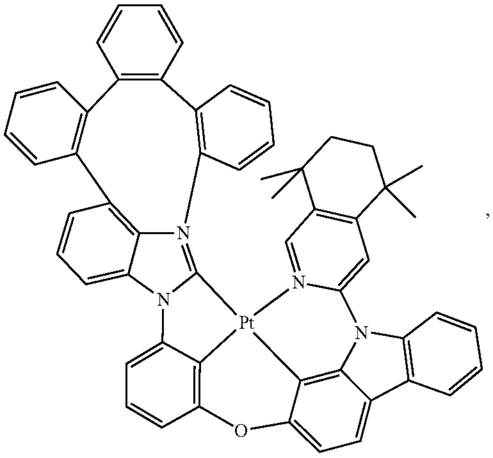,
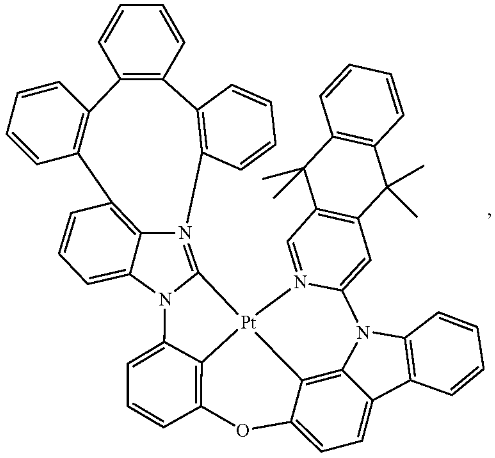,
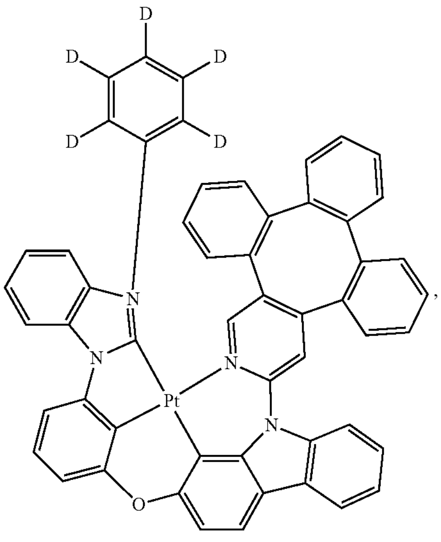,
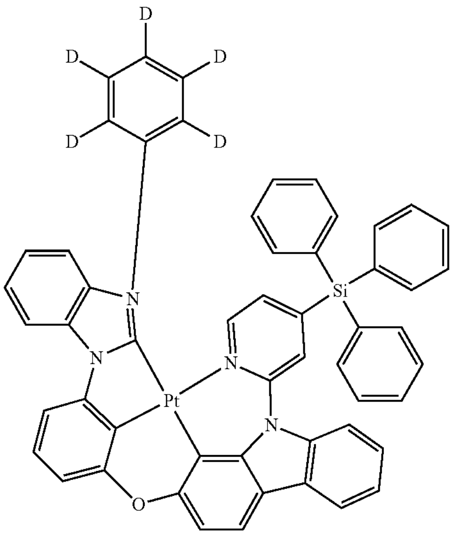, -continued

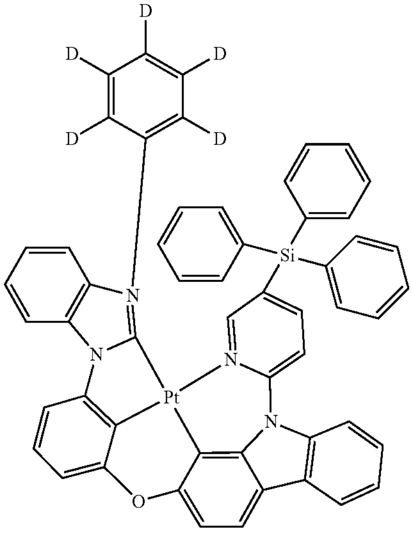

,

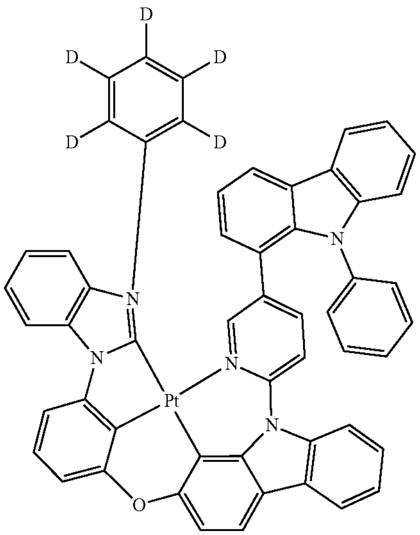

,

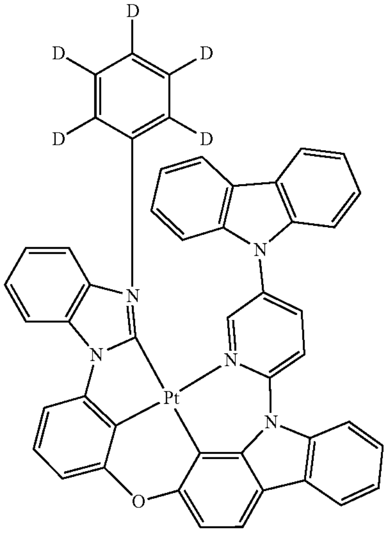

, and

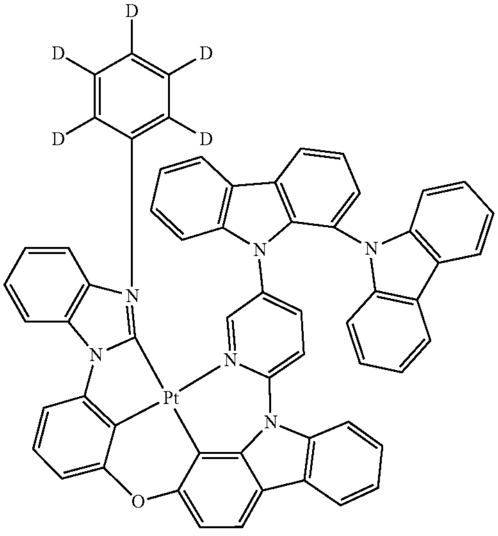

.

In some embodiments, the LUMO energy of the second compound is less than or equal to −2.40 eV. In some embodiments, the LUMO energy of the second compound is less than or equal to −2.45 eV. In some embodiments, the LUMO energy of the second compound is less than or equal to −2.50 eV. In some embodiments, the LUMO energy of the second compound is less than or equal to −2.55 eV. In some embodiments, the LUMO energy of the second compound is less than or equal to −2.60 eV. In some embodiments, the LUMO energy of the second compound is less than or equal to −2.65 eV.

In some embodiments, the second compound is a host. In some embodiments, the second compound is an E-host.

In some embodiments, the second compound is partially or fully deuterated. In some embodiments, the second compound is partially deuterated. In some embodiments, the second compound is fully deuterated.

In some embodiments, each of $Z^1$ to $Z^{11}$ is C.

In some embodiments, each of $Z^1$ to $Z^3$ is C. In some embodiments, at least one of $Z^1$ to $Z^3$ is N. In some embodiments, exactly one of $Z^1$ to $Z^3$ is N.

In some embodiments, each of $Z^4$ to $Z^7$ is C. In some embodiments, at least one of $Z^4$ to $Z^7$ is N. In some embodiments, exactly one of $Z^4$ to $Z^7$ is N.

In some embodiments, each of $Z^8$ to $Z^{11}$ is C. In some embodiments, at least one of $Z^8$ to $Z^{11}$ is N. In some embodiments, exactly one of $Z^8$ to $Z^1$ is N.

In some embodiments, x+y=2. In some embodiments, x+y=1. In some embodiments, x+y=0.

In some embodiments, $L^5$ is a direct bond.

In some embodiments, $L^5$ is selected from the group consisting of a direct bond, or a linker selected from the group consisting of a BR, BRR', NR, PR, P(O)R, O, S, Se, C═O, C═S, C═Se, C═NR', C═CR"R"', S═O, $SO_2$, CR, CRR', SiRR', GeRR', alkyl, cycloalkyl, aryl, heteroaryl, and combinations thereof.

In some embodiments, $L^5$ is selected from the group consisting of O, S, and Se. In some embodiments, $L^5$ is selected from the group consisting of BR, NR, and PR. In some embodiments, $L^5$ is selected from the group consisting of BRR', CRR', SiRR', and GeRR'. In some embodiments, $L^5$ is selected from the group consisting of P(O)R, C═O, C═S, C═Se, C═NR', C═CR"R"', S═O, $SO_2$, and CR. In some embodiments, $L^5$ is selected from the group consisting of alkyl, cycloalkyl, aryl, and heteroaryl.

In some embodiments, $L^6$ is a direct bond.

In some embodiments, $L^6$ is selected from the group consisting of a direct bond, or a linker selected from the group consisting of a BR, BRR', NR, PR, P(O)R, O, S, Se, C═O, C═S, C═Se, C═NR', C═CR"R'", S═O, $SO_2$, CR, CRR', SiRR', GeRR', alkyl, cycloalkyl, aryl, heteroaryl, and combinations thereof.

In some embodiments, $L^6$ is selected from the group consisting of O, S, and Se. In some embodiments, $L^6$ is selected from the group consisting of BR, NR, and PR. In some embodiments, $L^6$ is selected from the group consisting of BRR', CRR', SiRR', and GeRR'. In some embodiments, $L^6$ is selected from the group consisting of P(O)R, C═O, C═S, C═Se, C═NR', C═CR"R'", S═O, $SO_2$, and CR. In some embodiments, $L^6$ is selected from the group consisting of alkyl, cycloalkyl, aryl, and heteroaryl.

In some embodiments, at least one $R^E$, $R^F$, or $R^G$ comprises a moiety selected from the group consisting of aryl, heteroaryl, silyl, amino, combinations thereof, and partially and fully deuterated variants thereof.

In some embodiments, at least one $R^E$ is not hydrogen. In some embodiments, at least one $R^E$ comprises a moiety selected from the group consisting of aryl, heteroaryl, silyl, amino, combinations thereof, and partially and fully deuterated variants thereof.

In some embodiments, at least one $R^F$ is not hydrogen. In some embodiments, at least one $R^F$ comprises a moiety selected from the group consisting of aryl, heteroaryl, silyl, amino, combinations thereof, and partially and fully deuterated variants thereof.

In some embodiments, at least one $R^G$ is not hydrogen. In some embodiments, at least one $R^G$ comprises a moiety selected from the group consisting of aryl, heteroaryl, silyl, amino, combinations thereof, and partially and fully deuterated variants thereof.

In some embodiments, two adjacent $R^E$ are joined or fused to form a ring.

In some embodiments, two adjacent $R^F$ are joined or fused to form a ring.

In some embodiments, two adjacent $R^G$ are joined or fused to form a ring.

In some embodiments, the second compound is selected from the structures of the following LIST 6:

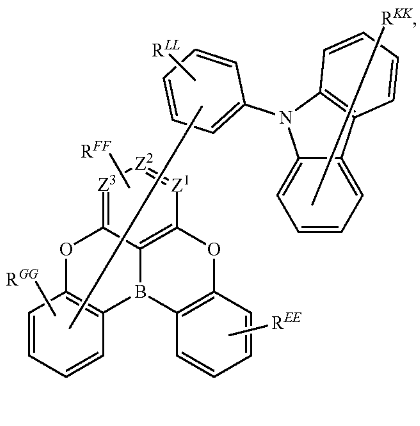

,

-continued

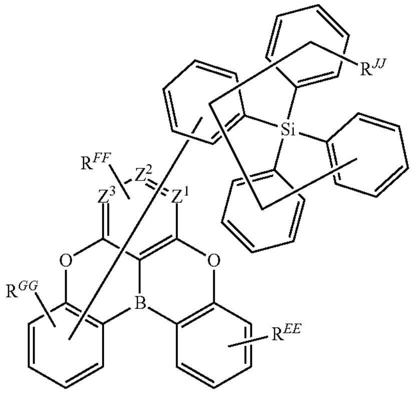

,

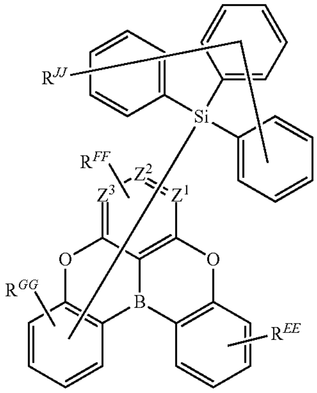

,

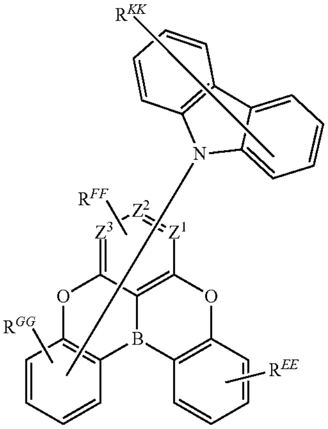

,

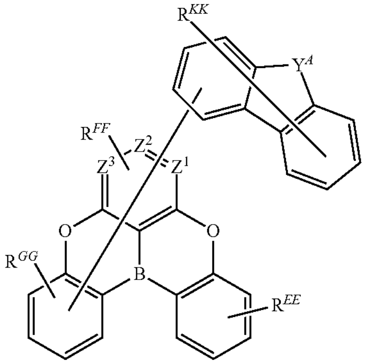

,

-continued

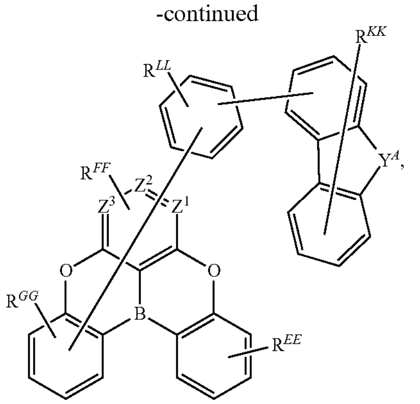

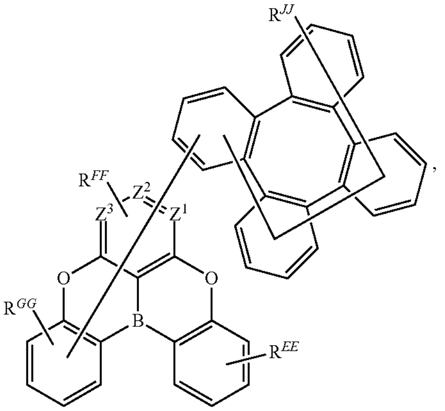

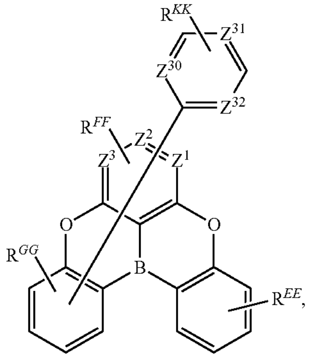

and

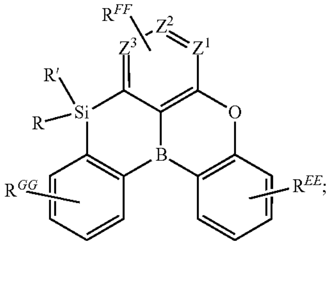

wherein:

each of $Z^{30}$, $Z^{31}$, and $Z^{32}$ is independently C or N;

each $Y^A$ is independently selected from the group consisting of BR, BRR', NR, PR, P(O)R, O, S, Se, C═O, C═S, C═Se, C═NR', C═CRR, S═O, SO2, CRR', SiRR', and GeRR';

each of $R^{EE}$, $R^{FF}$, $R^{GG}$, $R^{JJ}$, $R^{KK}$, and $R^{LL}$ independently represents mono, up to the maximum substitutions, or no substitutions;

each of R, R', $R^{EE}$, $R^{FF}$, $R^{GG}$, $R^{JJ}$, $R^{KK}$, and $R^{LL}$ is independently a hydrogen or a substituent selected from the group consisting of the General Substituents defined herein; and any two adjacent substituents can be joined or fused to form a ring.

In some embodiments, the second compound is selected from the structures of the following LIST 7:

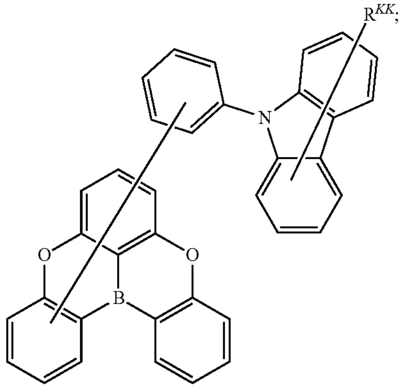

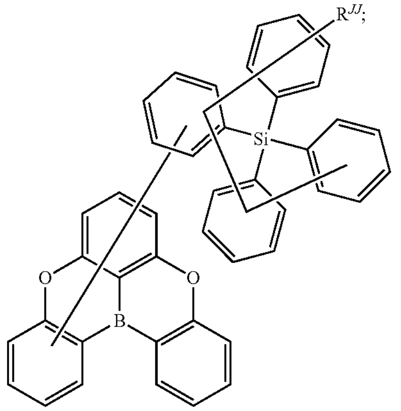

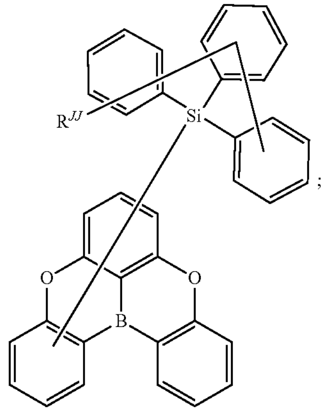

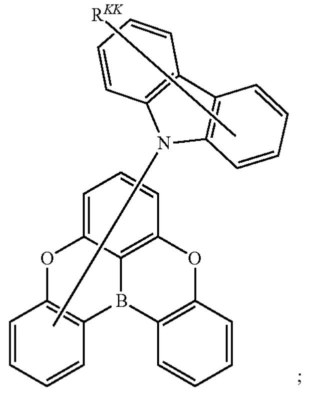

;

-continued
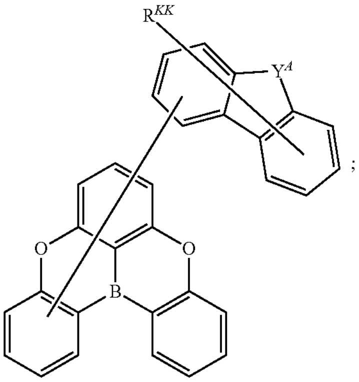
;
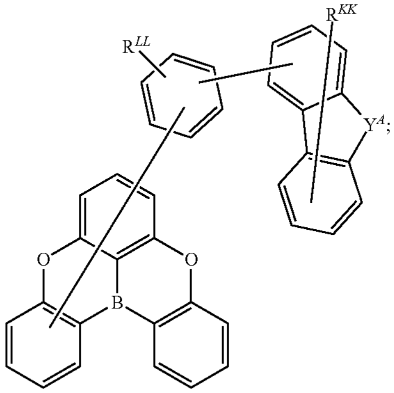
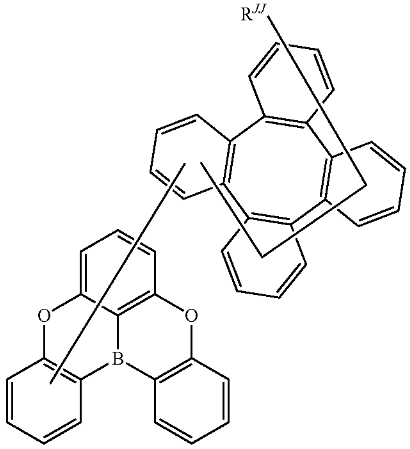
;
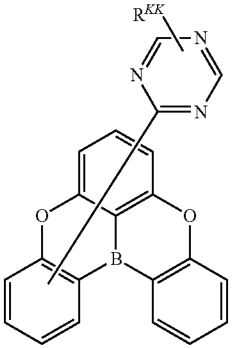
;
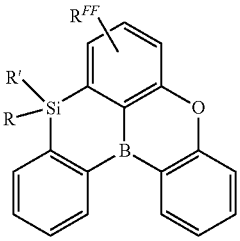
;
-continued
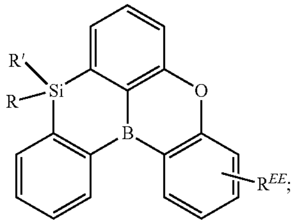
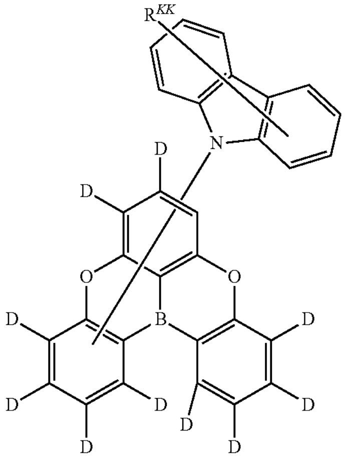
;
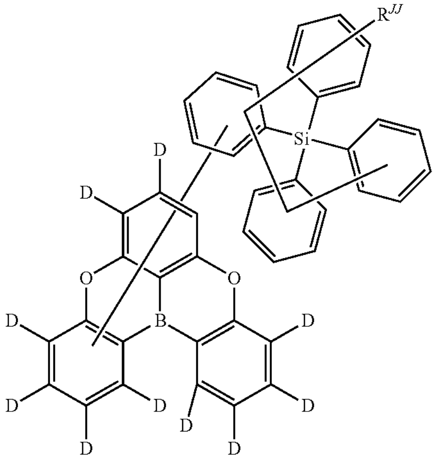
;
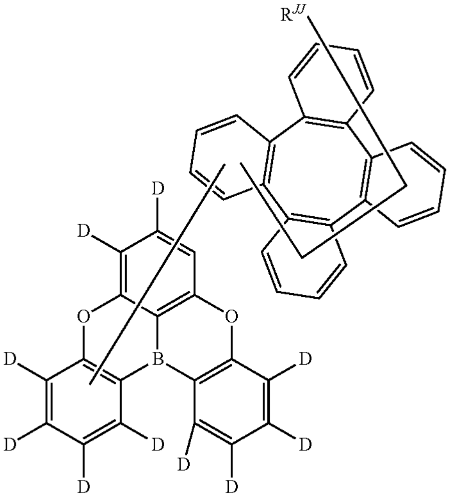
;

-continued

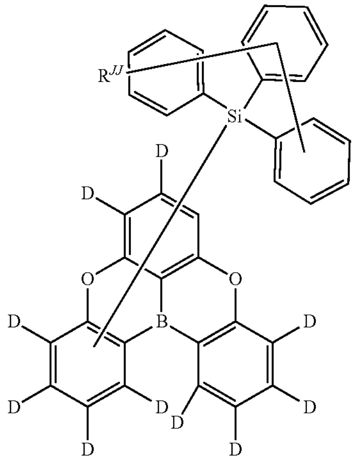

; and

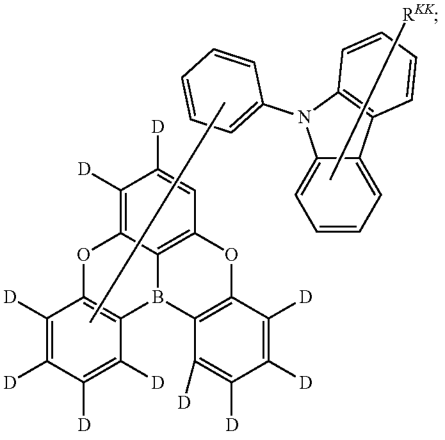

;

wherein:

each $Y^A$ is independently selected from the group consisting of BR, BRR', NR, PR, P(O)R, O, S, Se, C=O, C=S, C=Se, C=NR', C=CRR, S=O, SO2, CRR', SiRR', and GeRR';

each of $R^{EE}$, $R^{FF}$, $R^{JJ}$, $R^{KK}$, and $R^{LL}$ independently represents mono, up to the maximum substitutions, or no substitutions;

each of R, R', $R^{EE}$, $R^{FF}$, $R^{JJ}$, $R^{KK}$, and $R^{LL}$ is independently a hydrogen or a substituent selected from the group consisting of the General Substituents defined herein; and any two adjacent substituents can be joined or fused to form a ring.

In some embodiments, the second compound is selected from the structures of the following LIST 8:

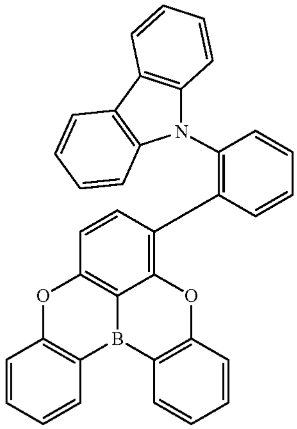

,

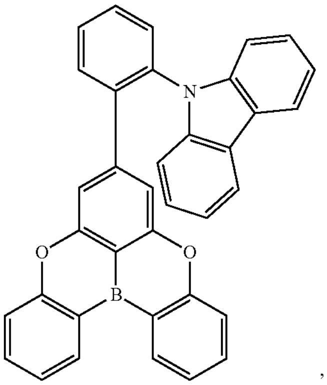

,

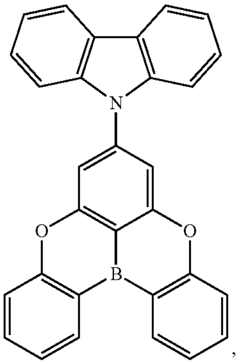

,

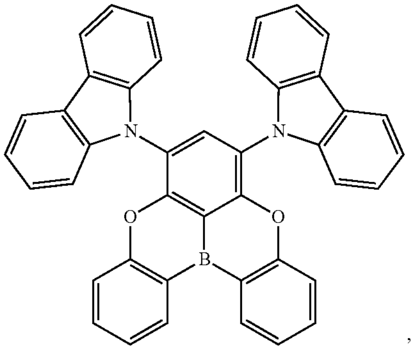

,

-continued
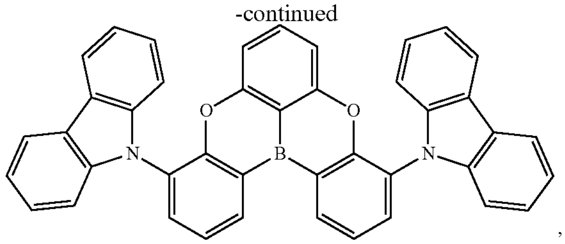
,
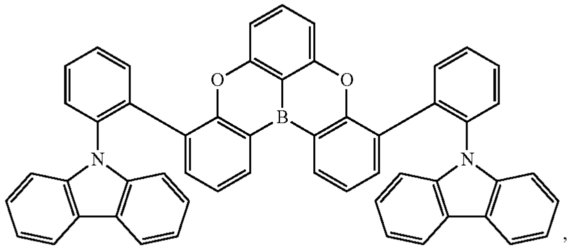
,
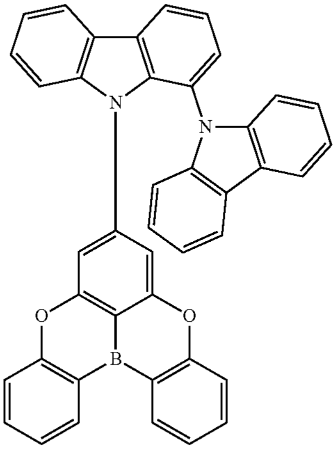
,
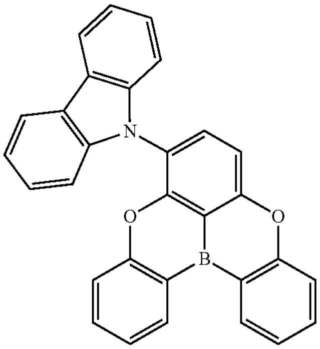
,
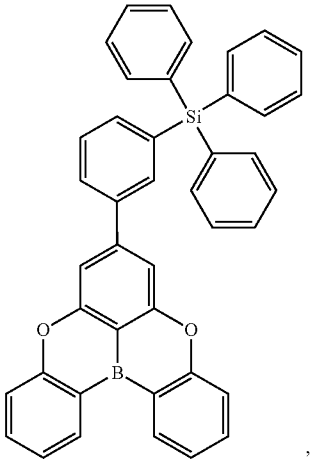
,
-continued
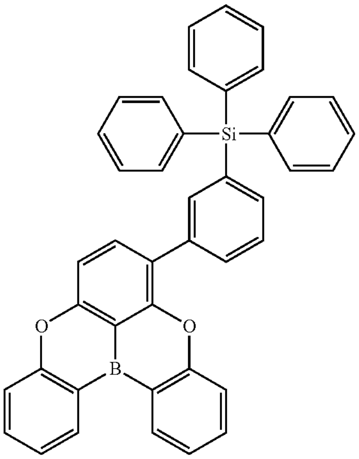
,
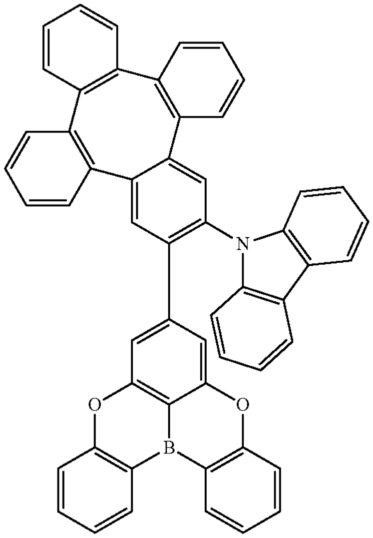
,
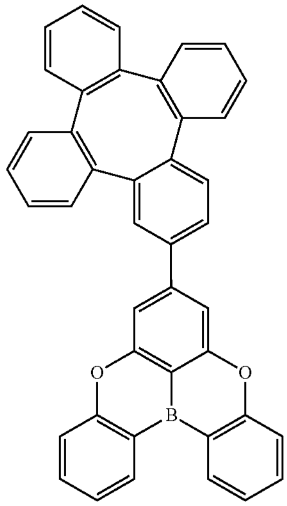
, -continued
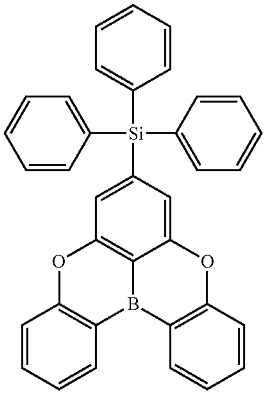
,
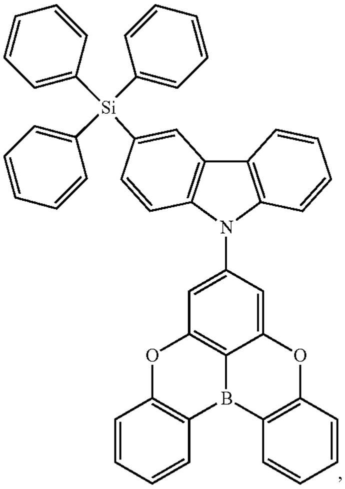
,
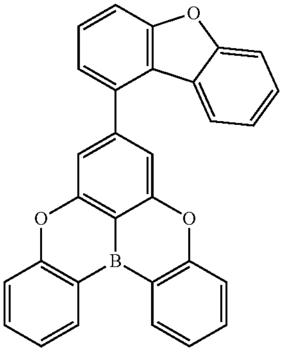
,
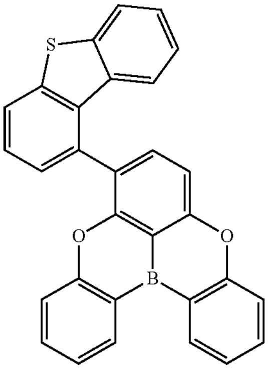
,
-continued
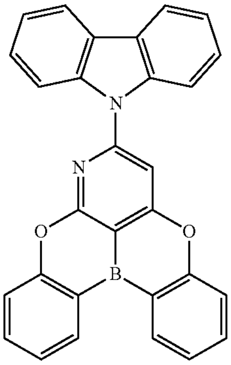
,
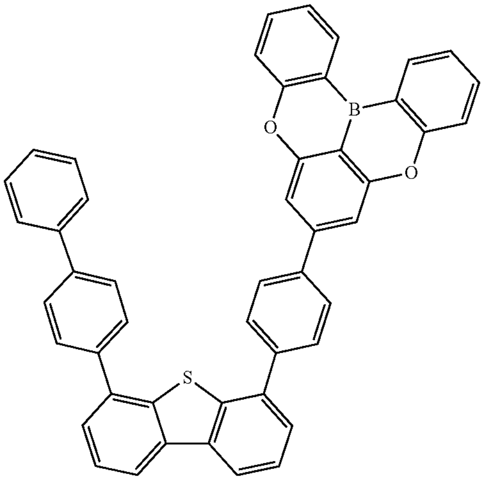
,
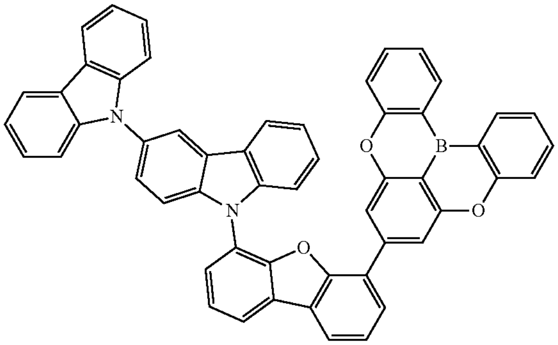
,
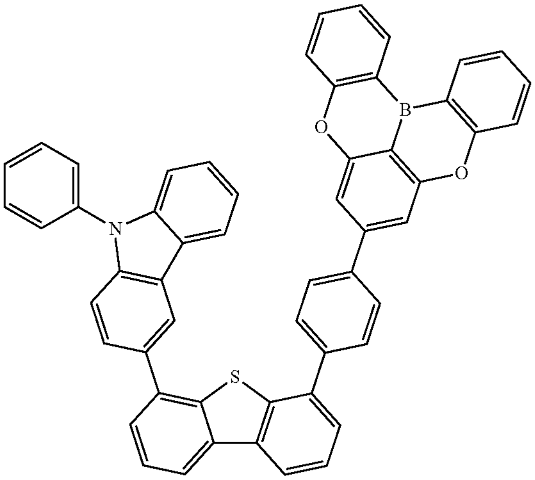
, -continued
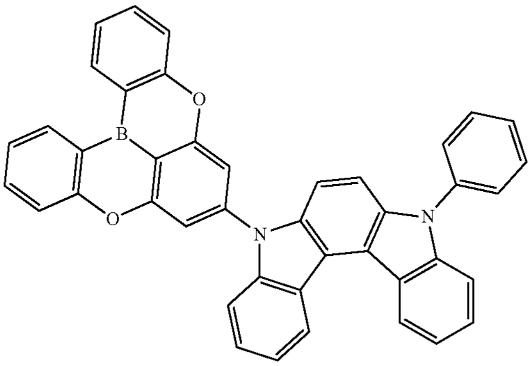
,
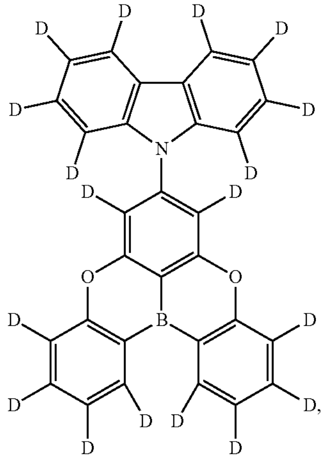
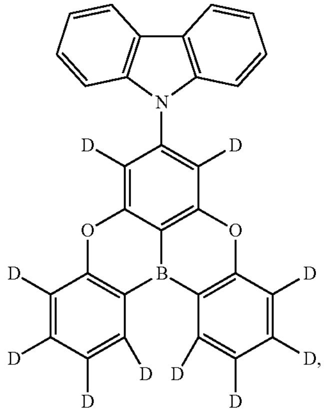
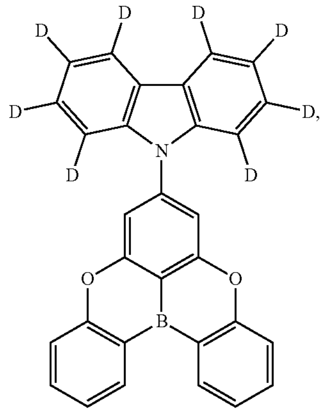
-continued
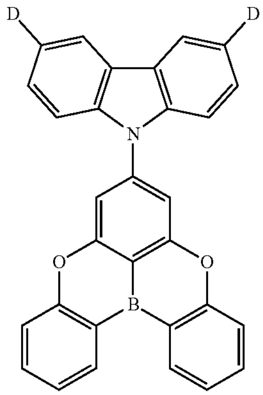
,
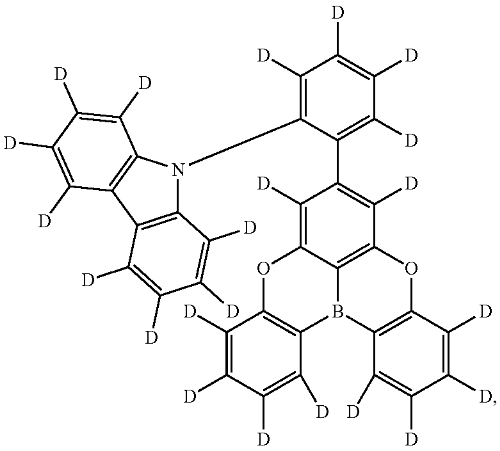
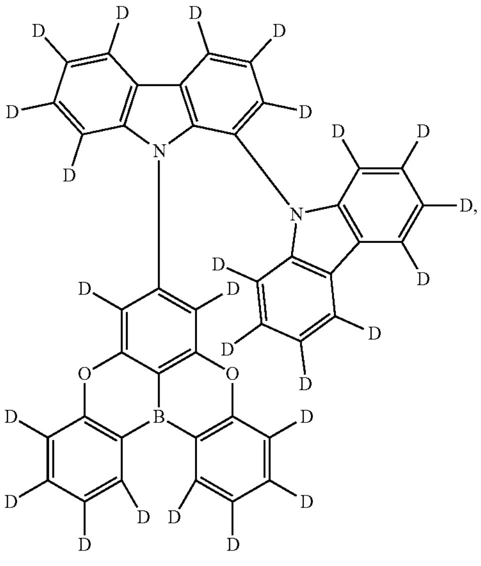

-continued
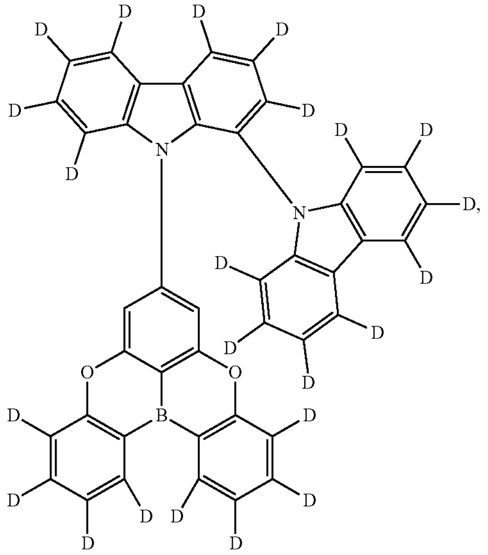
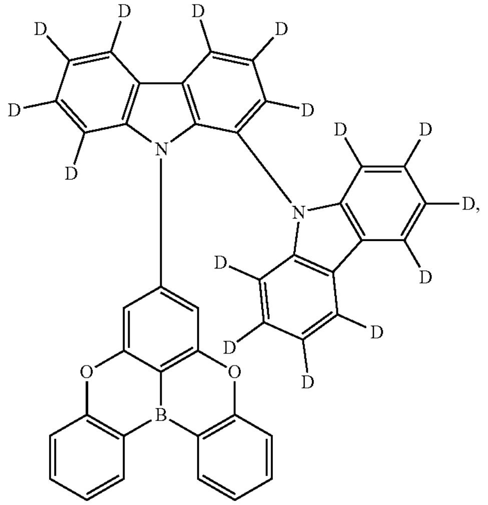
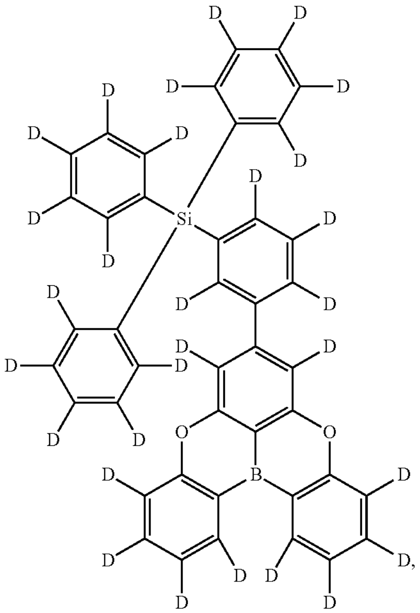
-continued
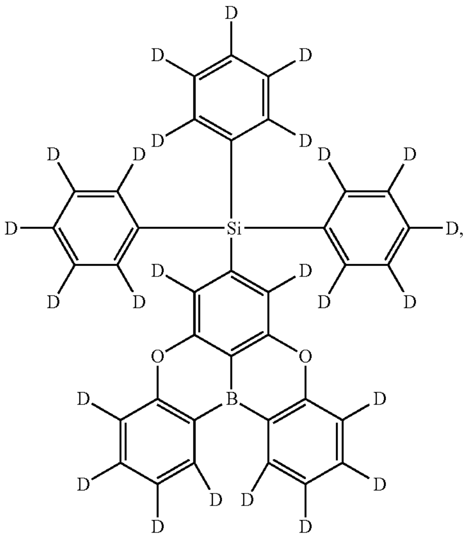
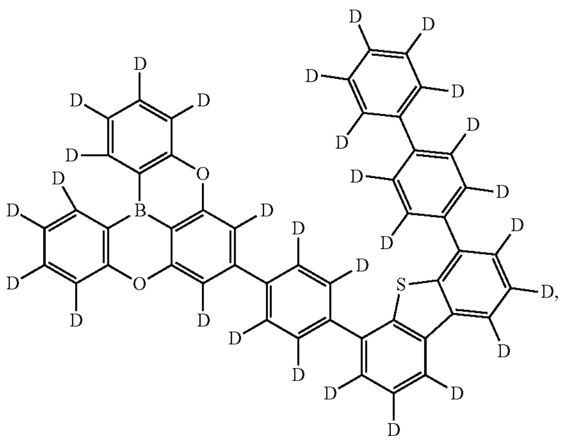
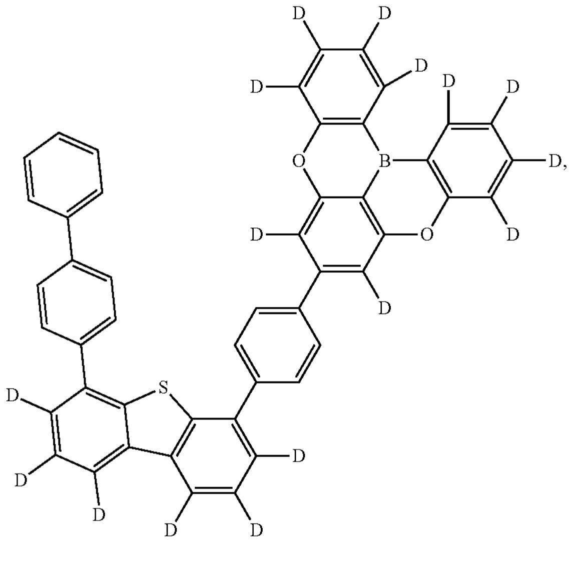

-continued
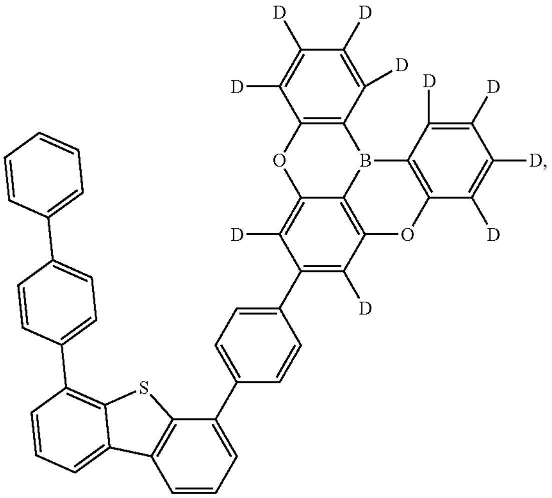
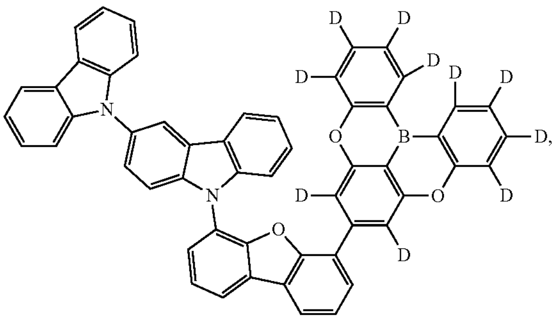
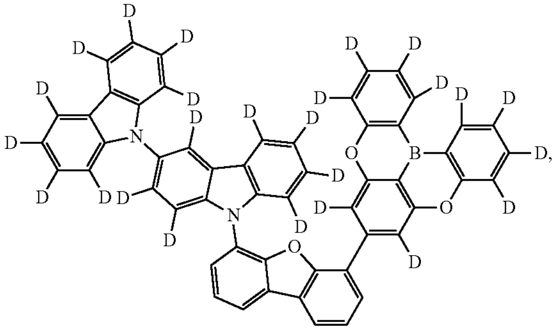
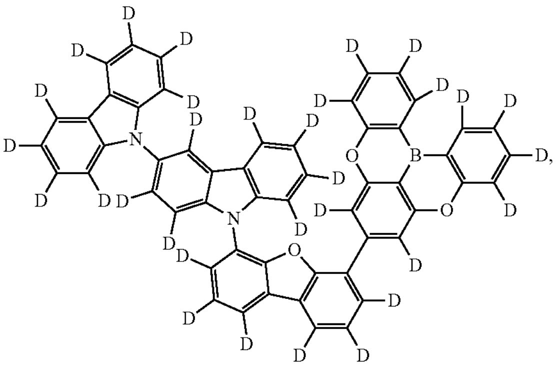
-continued
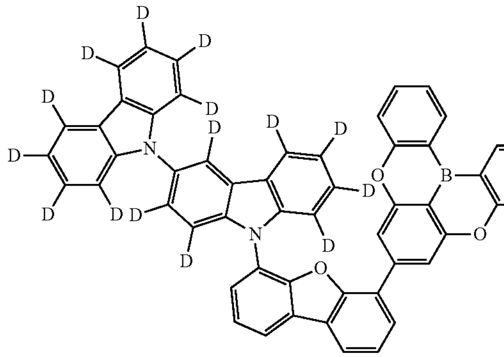
,
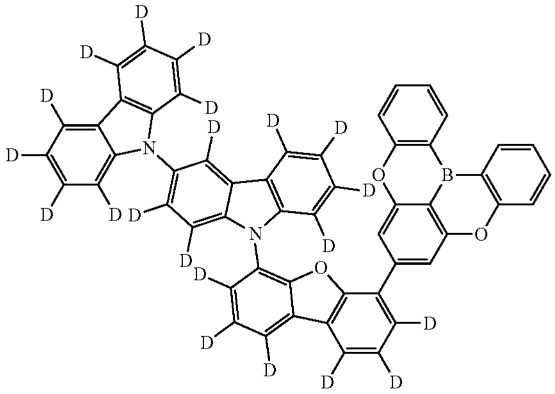
,
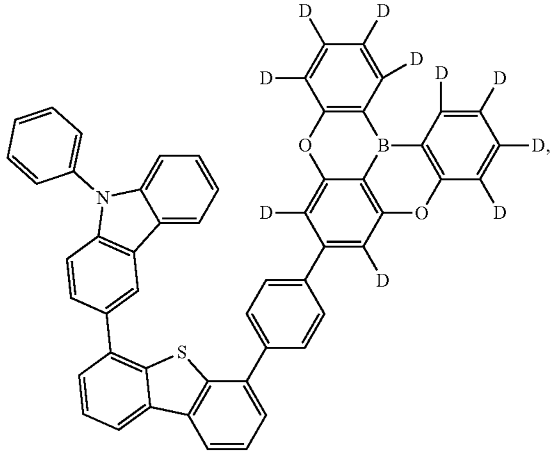
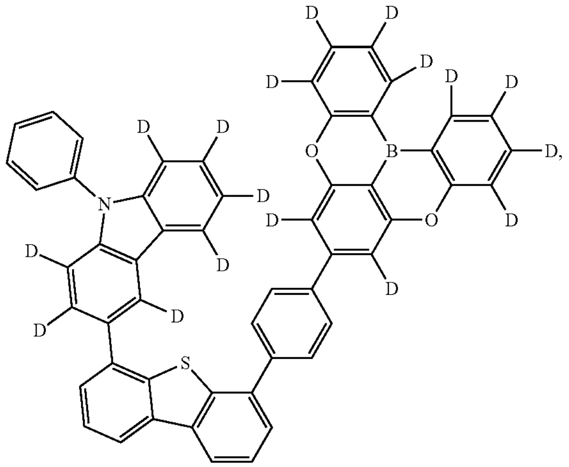

-continued

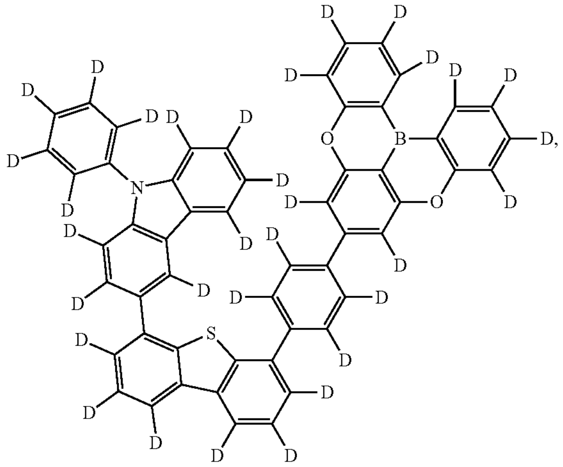

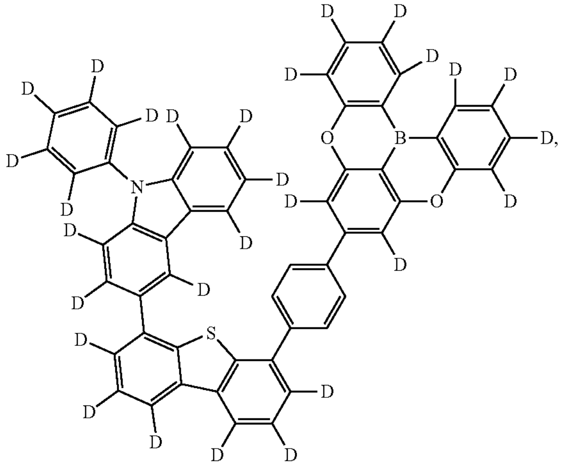

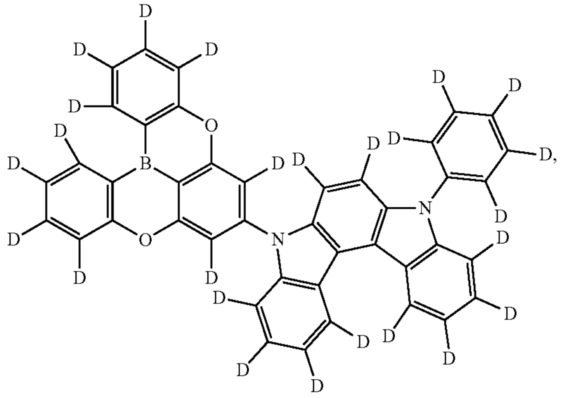

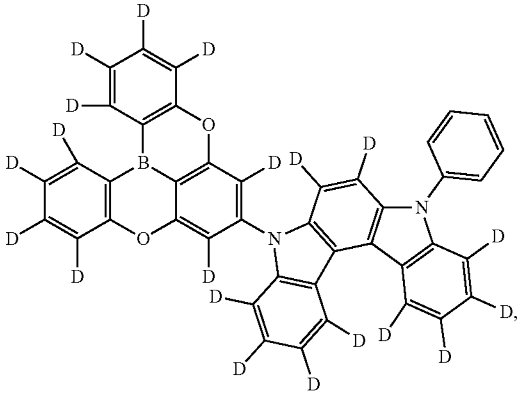

and

-continued

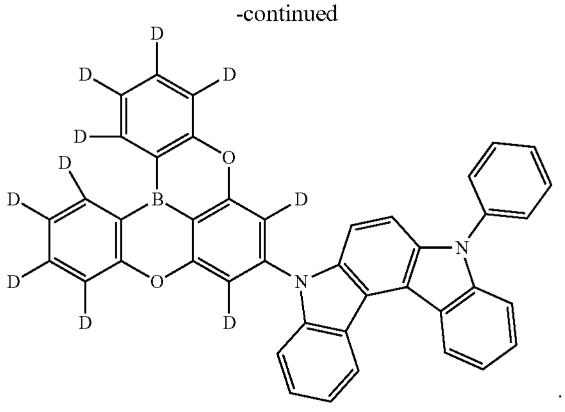

.

In some embodiments, one of moiety A, B, C, or D of Formula I comprises a pyridine moiety coordinated to Pt, and the pyridine moiety having a center of gravity C1; wherein the closest calculated intermolecular distance at 0K between C1 and the boron atom of Formula II is greater than or equal to 3.57 Å.

In some embodiments of the device, the closest calculated intermolecular contact between the boron atom of the host and the center of the pyridine ring of the Pt complex at 0 K is greater than or equal to 3.60 Å. In some embodiments of the device, the closest calculated intermolecular contact between the boron atom of the host and the center of the pyridine ring of the Pt complex at 0 K is greater than or equal to 4.50 Å. In some embodiments of the device, the closest calculated intermolecular contact between the boron atom of the host and the center of the pyridine ring of the Pt complex at 0 K is up or equal to 10.57 Å.

To measure the distance of this intermolecular close contact, it is necessary to find low energy bimolecular pairs between the boron-containing host and the Pt emitter that will occur in the emissive layer of an OLED device. To model the most favorable low energy pairwise structures the following procedure was used. The ground state B3LYP structures served as input for a Metropolis Monte Carlo simulated annealing sampling of molecular pairs using BIOVIA Materials Studio 2022, Release 22.1, with the Adsorption Locator tool. In each Monte Carlo simulation, the Universal forcefield was used while electrostatic interactions were described by extracting the Hirshfeld charges fitted to the dipole moment from a single point DM013 calculation with the PW91 functional, employing a DNP basis set. A total number of 10 heating cycles were used for each simulation and 500,000 molecular pair configurations were sampled at each cycle using automated temperature control. From each intermolecular pair simulation, the lowest 50 pairs were returned. Of these pairs those within 2 kcal/mol of the lowest pair were examined for the closest intermolecular contact between the boron atom of the host and the center of the pyridine ring of the Pt emitter in units of Angstrom.

Figure 4A:
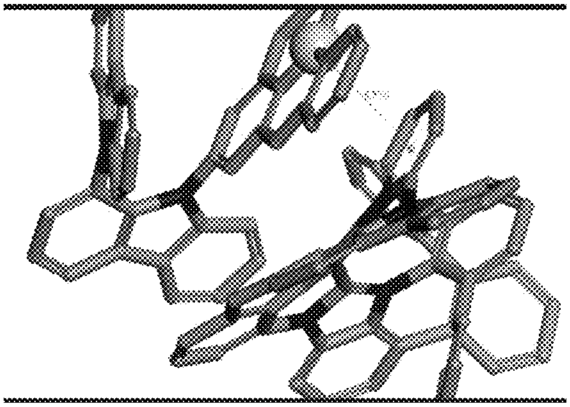
FIGS. 4*a*, 4*b* and 4*c* show some calculation results of the intermolecular contact between the boron atom of the host and the center of the pyridine ring of the Pt complex.
Figure 4B:
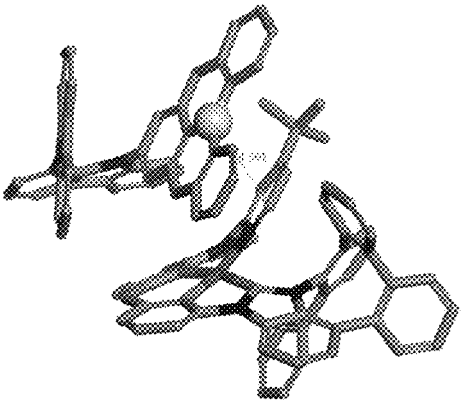
Figure 4C:
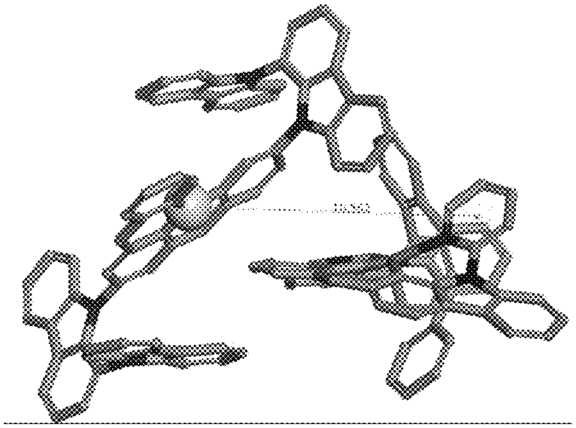

FIG. 4*a* illustrates the interaction of EH2 with D1, and it shows that the pyridine ring of Formula I is not protected and can easily interact with the boron atom of EH2. FIG. 4*b* illustrates the interaction of EH2 with D2, and it shows that a bulky t-butyl group on 3-position of the pyridine ring provides the protection of the pyridine by reducing the interaction of the pyridine of D2 with the boron atom of EH2. FIG. 4*c* illustrates the interaction of EH1 with D1, and it shows the steric protection of the boron atom from both sides of the E-Host. It is believed that by reducing the interactions between a boron-containing E-Host and a Pt containing blue dopant, the device lifetime of the blue system can be increased.

The structures of EH1, EH2, D1 and D2 are shown below:

EH1

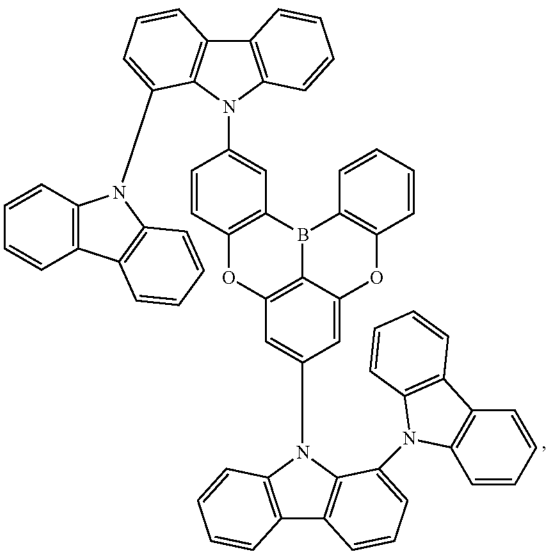

EH2

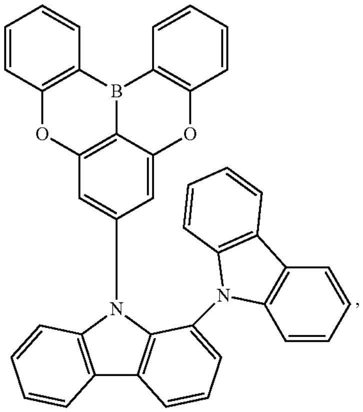

D1

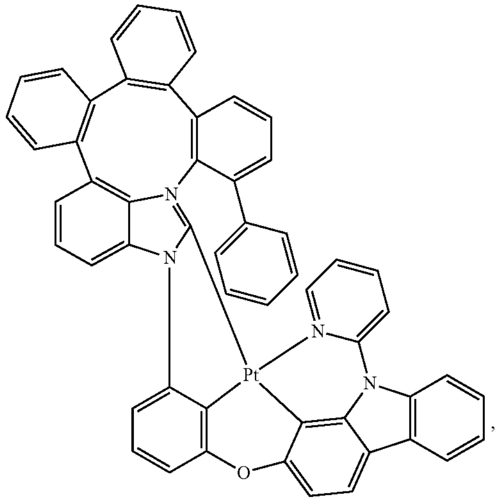

-continued

D2

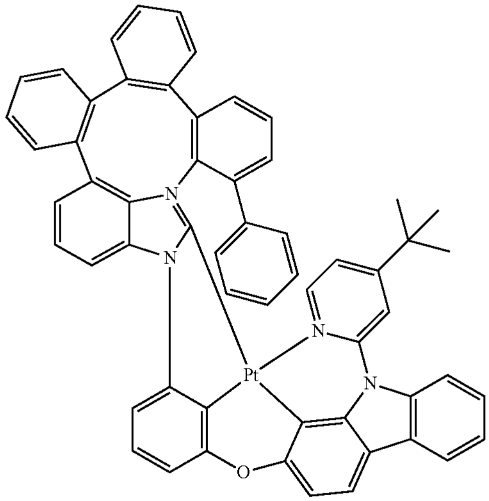

In some embodiments, at least one of $R^E$, $R^G$, or $R^F$ of Formula II has a spherocity greater than or equal to 0.04. In some embodiments, at least one of $R^E$, $R^G$, or $R^F$ of Formula II has a spherocity greater than 0.25. In some embodiments, at least one of $R^E$, $R^G$, or $R^F$ of Formula II has a spherocity greater than 0.3. In some embodiments, at least one of $R^E$, $R^G$, or $R^F$ of Formula II has a spherocity greater than 0.35. In some embodiments, at least one of $R^E$, $R^G$, or $R^F$ of Formula II has a spherocity greater than 0.4. In some embodiments, at least one of $R^E$, $R^G$, or $R^F$ of Formula II has a spherocity greater than 0.45. In some embodiments, at least one of $R^E$, $R^G$, or $R^F$ of Formula II has a spherocity greater than 0.5. In some embodiments, at least one of $R^E$, $R^G$, or $R^F$ of Formula II has a spherocity greater than 0.55. In some embodiments, at least one of $R^E$, $R^G$, or $R^F$ of Formula II has a spherocity greater than 0.6. In some embodiments, at least one of $R^E$, $R^G$, or $R^F$ of Formula II has a spherocity greater than 0.65. In some embodiments, at least one of $R^E$, $R^G$, or $R^F$ of Formula II has a spherocity greater than 0.7. In some embodiments, at least one of $R^E$, $R^G$, or $R^F$ of Formula II has a spherocity greater than 0.75. In some embodiments, at least one of $R^E$, $R^G$, or $R^F$ of Formula II has a spherocity greater than 0.8. In some embodiments, at least one of $R^E$, $R^G$, or $R^F$ of Formula II has a spherocity greater than 0.85. In some embodiments, at least one of $R^E$, $R^G$, or $R^F$ of Formula II has a spherocity greater than 0.9.

The spherocity is a measurement of the three-dimensionality of bulky groups. Spherocity is defined as the ratio between the principal moments of inertia (PMI). Specifically, spherocity is the ratio of three times PMI1 over the sum of PMI1, PMI2, and PMI3, where PMI1 is the smallest principal moment of inertia, PMI2 is the second smallest principal moment of inertia, and PMI3 is the largest principal moment of inertia. The spherocity of the lowest energy conformer of a structure after optimization of the ground state with density functional theory may be calculated. More detailed information can be found in paragraphs [0054] to [0059] of U.S. application Ser. No. 18/062,110 filed Dec. 6, 2022, the contents of which are incorporated herein by reference.

In some embodiments, at least one of $R^E$, $R^F$ or $R^G$ is selected from the group consisting of the structures in the following LIST 6a:

Formula IIA
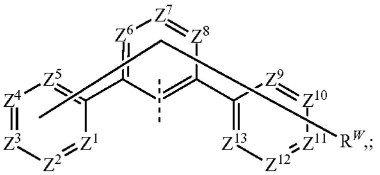
Formula IIB
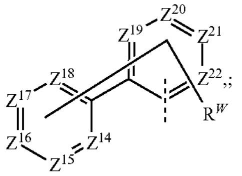
Formula IIC
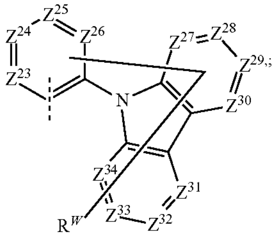
Formula IID
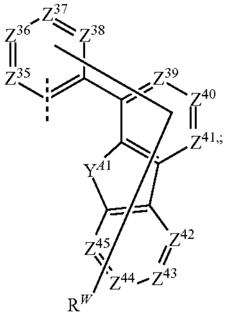
Formula IIE
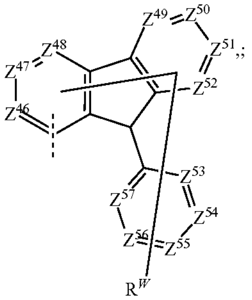
Formula IIF
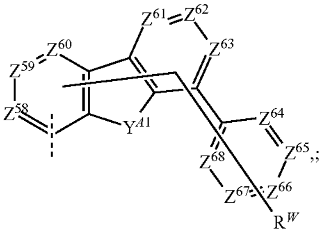
-continued
Formula IIG
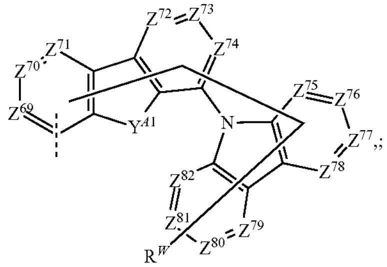
Formula IIH
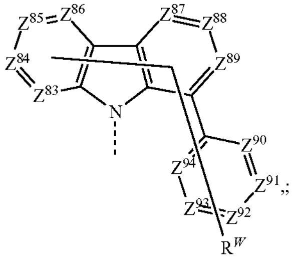
Formula IIJ
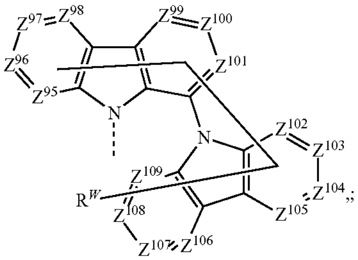
Formula IIK
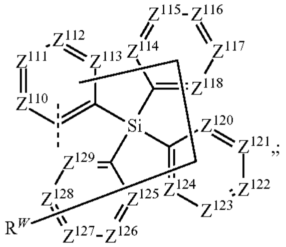
Formula IIO
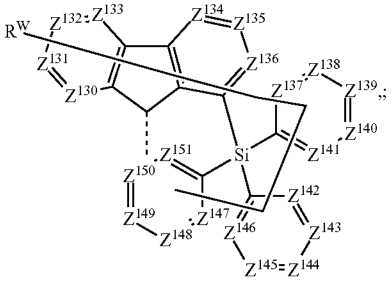
Formula IIL
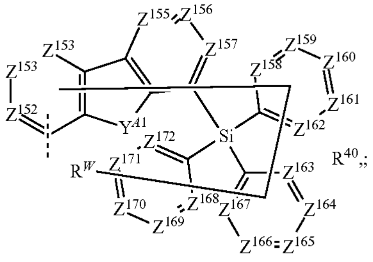

-continued

Formula IIM

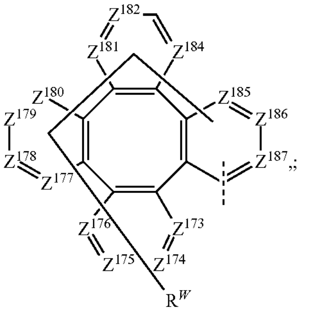

and

Formula IIN

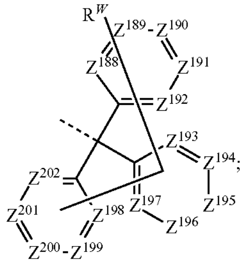

wherein:

$Z^1$ to $Z^{202}$ are each independently C or N; wherein each $Y^{A1}$ is selected from the group consisting of BR, BRR', NR, PR, O, S, Se, C═O, C═S, C═Se, C═NR, C═CRR', S═O, $SO_2$, CR, CRR', SiRR', and GeRR'; wherein each $R^W$ independently represents mono to the maximum allowable substitution, or no substitution; each R, R', and $R^W$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two $R^W$ can be joined or fused to form a ring.

In some embodiments, the boron containing EHost of Formula II comprises a sterically bulky group on one side of the boron containing plane. In these embodiments, the boron containing plane is defined as the plane containing the OBO moiety. In some embodiments, the boron containing EHost of Formula II comprises a sterically bulky group on both sides of the boron containing plane. In some embodiments, the boron containing EHost of Formula II comprises a sterically bulky group on both sides of the boron containing plane resulting in a sandwich type of structure around the plane of the OBO. In some of the above embodiments, the sterically bulky group can be formed by combining one or more carbazole molecules in various arrangements. In some of the above embodiments, the steric bulk can be formed by combining one or more phenyl molecules in various arrangements. In some of the above embodiments, the steric bulk can be formed by combining one or more silane containing molecules in various arrangements. In some such embodiments, these silane containing molecules can be triphenyl silanes, or tetraphenyl silanes. In some embodiments, the sterically bulky group may be selected from a structure of LIST 6a as defined herein.

In some embodiments, the first compound can be an emissive dopant or a non-emissive dopant. In some embodiments, the emissive dopant can be a phosphorescent or fluorescent material. In some embodiments, the non-emissive dopant can also be a phosphorescent or fluorescent material.

Phosphorescence generally refers to emission of a photon with a change in electron spin, i.e., the initial and final states of the emission have different multiplicity, such as from $T_1$ to $S_0$ state. Ir and Pt complexes currently widely used in the OLED belong to phosphorescent material. In some embodiments, if an exciplex formation involves a triplet emitter, such exciplex can also emit phosphorescent light. On the other hand, fluorescent emitters generally refer to emission of a photon without a change in electron spin, such as from $S_1$ to $S_0$ state. Fluorescent emitters can be delayed fluorescent or non-delayed fluorescent emitters. Depending on the spin state, fluorescent emitter can be a singlet emitter or a doublet emitter, or other multiplet emitter. It is believed that the internal quantum efficiency (IQE) of fluorescent OLEDs can exceed the 25% spin statistics limit through delayed fluorescence. There are two types of delayed fluorescence, i.e. P-type and E-type delayed fluorescence. P-type delayed fluorescence is generated from triplet-triplet annihilation (TTA). On the other hand, E-type delayed fluorescence does not rely on the collision of two triplets, but rather on the thermal population between the triplet states and the singlet excited states. Thermal energy can activate the transition from the triplet state back to the singlet state. This type of delayed fluorescence is also known as thermally activated delayed fluorescence (TADF). E-type delayed fluorescence characteristics can be found in an exciplex system or in a single compound. Without being bound by theory, it is believed that TADF requires a compound or an exciplex having a small singlet-triplet energy gap ($\Delta E_{S-T}$) less than or equal to 300, 250, 200, 150, 100, or 50 meV. There are two major types of TADF emitters, one is called donor-acceptor type TADF, the other one is called multiple resonance (MR) TADF. Often, donor-acceptor single compounds are constructed by connecting an electron donor moiety such as amino- or carbazole-derivatives and an electron acceptor moiety such as N-containing six-membered aromatic ring. Donor-acceptor exciplex can be formed between a hole transporting compound and an electron transporting compound. The examples for MR-TADF include a highly conjugated boron-containing compounds. In some embodiments, the reverse intersystem crossing time from T1 to S1 of the delayed fluorescent emission at 293K is less than or equal to 10 microseconds. In some embodiments, such time can be greater than 10 microseconds and less than 100 microseconds.

In some embodiments, the OLED may comprise an additional compound selected from the group consisting of a fluorescence material, a delayed fluorescence material, a phosphorescent material, and combination thereof.

In some embodiments, the phosphorescent material is an emitter which emits light within the OLED. In some embodiments, the phosphorescent material does not emit light within the OLED. In some embodiments, the phosphorescent material energy transfers its excited state to another material within the OLED. In some embodiments, the phosphorescent material participates in charge transport within the OLED. In some embodiments, the phosphorescent material is a sensitizer, and the OLED further comprises an acceptor.

In some embodiments, the fluorescence material or the delayed fluorescence material is an emitter which emits light within the OLED. In some embodiments, the fluorescence material or the delayed fluorescence material does not emit light within the OLED. In some embodiments, the fluorescence material or the delayed fluorescence material energy transfers its excited state to another material within the OLED. In some embodiments, the fluorescence material or the delayed fluorescence material participates in charge transport within the OLED. In some embodiments, the fluorescence material or the delayed fluorescence material is a sensitizer, and the OLED further comprises an acceptor.

In some embodiments, the first compound may be an acceptor, and the OLED may further comprise a sensitizer selected from the group consisting of a delayed fluorescence material, a phosphorescent material, and combination thereof.

In some embodiments, the first compound may be a fluorescent emitter, a delayed fluorescence material, or a component of an exciplex that is a fluorescent emitter or a delayed fluorescence material.

In some embodiments, the second compound is a host and the OLED comprises an acceptor that is an emitter and a sensitizer selected from the group consisting of a delayed fluorescence material, a phosphorescent material, and combination thereof; wherein the sensitizer transfers energy to the acceptor.

In some embodiments, the LUMO energy of Formula II is less than or equal to −2.33 eV.

In some embodiments, the emissive layer includes a third compound. In some embodiments, the third compound is an emitter.

In some embodiments, the first compound is a sensitizer and the third compound is an acceptor.

In some embodiments, the third compound is phosphorescent emitter, a fluorescent emitter, a thermally activated delayed fluorescence (TADF) emitter, or any combination thereof.

In some embodiments, the third compound is a fluorescent emitter. In some embodiments, the third compound is a non-delayed fluorescent emitter. In some embodiment, the third compound is a delayed fluorescent emitter. In some embodiments, the third compound is a P-type delayed fluorescent emitter.

In some embodiments, the third compound is a delayed-fluorescent compound functioning as a TADF emitter at room temperature. In some embodiments, the TADF emitter comprises at least one donor group and at least one acceptor group. In some embodiments, the TADF emitter is a metal complex. In some embodiments, the TADF emitter is a non-metal complex. In some embodiments, the TADF emitter is a Cu, Ag, or Au complex.

In some embodiments, the TADF emitter comprises at least one of the chemical moieties selected from the group consisting of the structures of the following LIST 9:

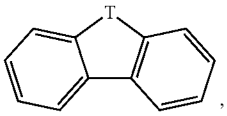
,
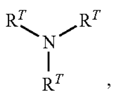
,
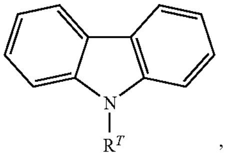
,
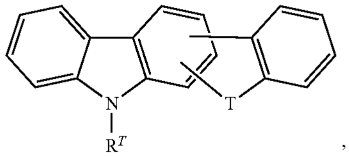
,

-continued

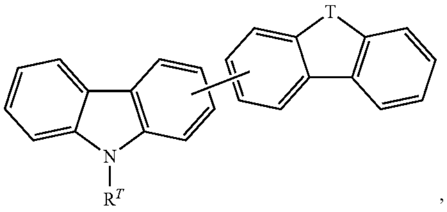
,
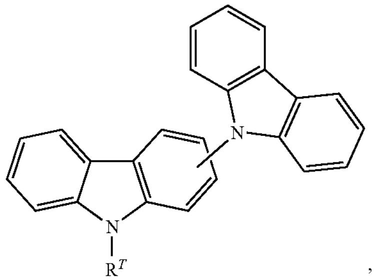
,
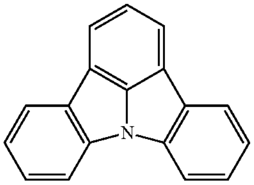
,
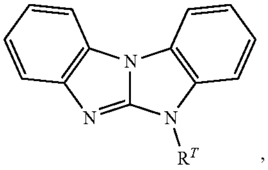
,
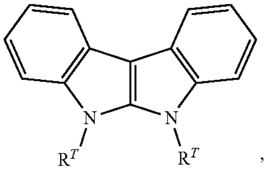
,
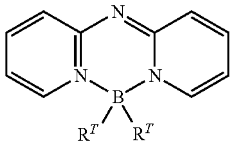
,
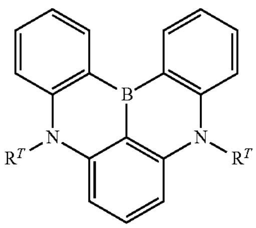
,
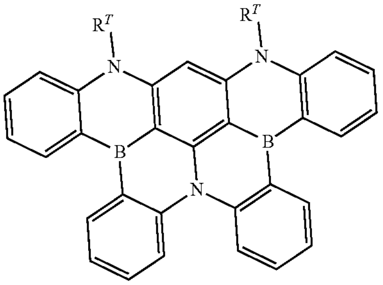
,
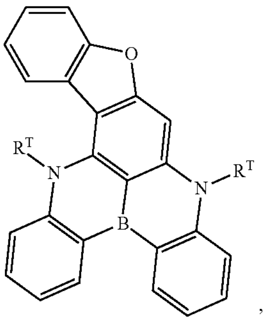
, -continued

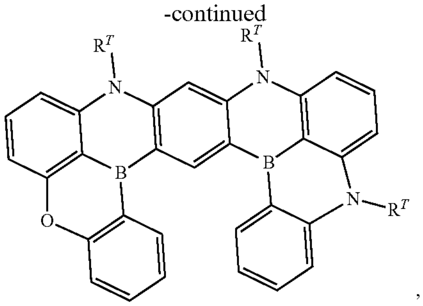

,

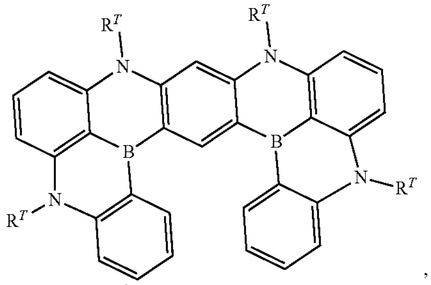

,

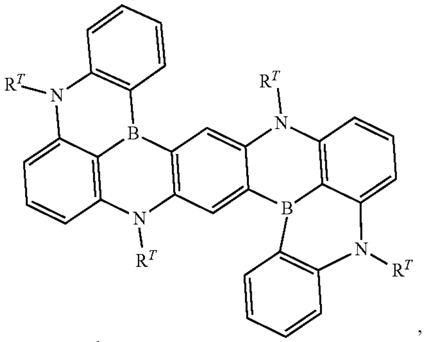

,

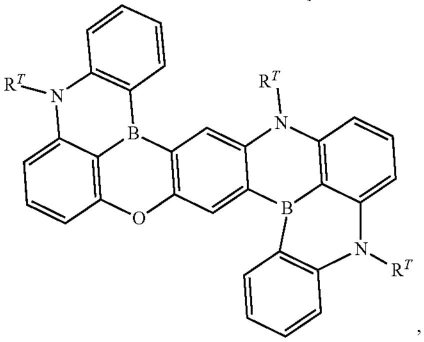

, and

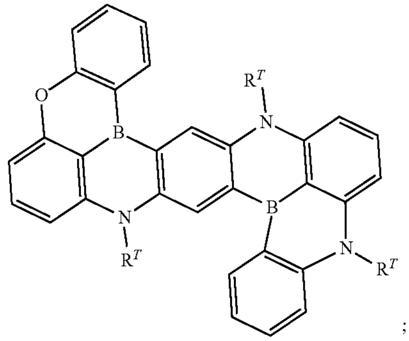

;

wherein T is selected from the group consisting of BR, NR, PR, O, S, Se, C═O, S═O, $SO_2$, CRR', SiRR', and GeRR';

wherein each $R^T$ can be the same or different, and each $R^T$ is independently a donor group, an acceptor group, an organic linker bonded to a donor group, an organic linker bonded to an acceptor group, or a terminal group selected from the group consisting of alkyl, cycloalkyl, heteroalkyl, heterocycloalkyl, arylalkyl, aryl, heteroaryl, and combinations thereof; and each R and R' is independently a hydrogen or a substituent selected from the group consisting of the General Substituents defined herein.

In some embodiments, the TADF emitter comprises at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

In some embodiments, the emissive layer further includes a fourth compound. In some embodiments, the fourth compound is a host. In some embodiments, the fourth compound is an H-host.

In some embodiments, the emissive layer comprises a plurality of emissive layers and at least one of the plurality of emissive layers comprises both the first and second compounds.

In some embodiments, the emissive layer comprises a plurality of emissive layers, and each of the plurality of emissive layers emits only a single color.

In some embodiments, the OLED further comprises at least one layer from the group consisting of a hole injection layer, a hole transport layer, an electron blocking layer, an emission material layer, a hole blocking layer, an electron transport layer, electron injection layer and a capping layer.

In some embodiments, an OLED of the present disclosure comprises an emissive region disposed between the anode and the cathode; wherein the emissive region comprises a sensitizer compound and an acceptor compound; wherein the sensitizer transfers energy to the acceptor compound that is an emitter. In some embodiments, the sensitizer compound is capable of emitting light from a triplet excited state to a ground singlet state in an OLED at room temperature. In some embodiments, the sensitizer compound is capable of functioning as a phosphorescent emitter, a TADF emitter, or a doublet emitter in an OLED at room temperature. In some embodiments, the acceptor compound is selected from the group consisting of: a delayed-fluorescent compound functioning as a TADF emitter in the OLED at room temperature, a fluorescent compound functioning as a fluorescent emitter in the OLED at room temperature. In some embodiments, the fluorescent emitter can be a singlet or doublet emitters. In some of such embodiments, the singlet emitter can also include a TADF emitter, furthermore, a multi-resonant MR-TADF emitter. Description of the delayed fluorescence as used herein can be found in U.S. application publication US20200373510A1, at paragraphs 0083-0084, the entire contents of which are incorporated herein by reference.

In some embodiments of the OLED, the sensitizer and acceptor compounds are in separate layers within the emissive region.

In some embodiments, the sensitizer and the acceptor compounds are present as a mixture in one or more layers in the emissive region. It should be understood that the mixture in a given layer can be a homogeneous mixture or the compounds in the mixture can be in graded concentrations through the thickness of the given layer. The concentration grading can be linear, non-linear, sinusoidal, etc. When there are more than one layer in the emissive region having a mixture of the sensitizer and the acceptor compounds, the type of mixture (i.e., homogeneous or graded concentration)

and the concentration levels of the compounds in the mixture in each of the more than one layer can be the same or different. In addition to the sensitizer and the acceptor compounds, there can be one or more other functional compounds such as, but not limit to, hosts also mixed into the mixture.

In some embodiments, the acceptor compound can be in two or more layers with the same or different concentration. In some embodiments, when two or more layers contain the acceptor compound, the concentration of the acceptor compound in at least two of the two or more layers are different. In some embodiments, the concentration of sensitizer compound in the layer containing the sensitizer compound is in the range of 1 to 50%, 10 to 20%, or 12-15% by weight. In some embodiments, the concentration of the acceptor compound in the layer containing the acceptor compound is in the range of 0.1 to 10%, 0.5 to 5%, or 1 to 3% by weight.

In some embodiments, the emissive region contains N layers where N>2. In some embodiments, the sensitizer compound is present in each of the N layers, and the acceptor compound is contained in fewer than or equal to N−1 layers. In some embodiments, the sensitizer compound is present in each of the N layers, and the acceptor compound is contained in fewer than or equal to N/2 layers. In some embodiments, the acceptor compound is present in each of the N layers, and the sensitizer compound is contained in fewer than or equal to N−1 layers. In some embodiments, the acceptor compound is present in each of the N layers, and the sensitizer compound is contained in fewer than or equal to N/2 layers.

In some embodiments, the OLED emits a luminescent emission comprising an emission component from the $S_1$ energy (the first singlet energy) of the acceptor compound when a voltage is applied across the OLED. In some embodiments, at least 65%, 75%, 85%, or 95% of the emission from the OLED is produced from the acceptor compound with a luminance of at least 10 cd/m$^2$. In some embodiments, $S_1$ energy of the acceptor compound is lower than that of the sensitizer compound.

In some embodiments, a $T_1$ energy (the first triplet energy) of the host compound is higher than the $T_1$ energies of the sensitizer compound and the acceptor compound. In some embodiments, $S_1$-$T_1$ energy gap of the sensitizer compound and/or acceptor compound is less than 400, 300, 250, 200, 150, 100, or 50 meV.

In some embodiments where the sensitizer compound provides unicolored sensitization (i.e., minimal loss in energy upon energy transfer to the acceptor compound), the acceptor compound has a Stokes shift of 30, 25, 20, 15, or 10 nm or less. An example would be a broad blue phosphor sensitizing a narrow blue emitting acceptor In some embodiments where the sensitizer compound provides a down conversion process (e.g., a blue emitter being used to sensitize a green emitter, or a green emitter being used to sensitize a red emitter), the acceptor compound has a Stokes shift of 30, 40, 60, 80, or 100 nm or more.

One way to quantify the qualitative relationship between a sensitizer compound (a compound to be used as the sensitizer in the emissive region of the OLED of the present disclosure) and an acceptor compound (a compound to be used as the acceptor in the emissive region of the OLED of the present disclosure) is by determining a value $\Delta\lambda=\lambda_{max1}-\lambda_{max2}$, where $\lambda_{max1}$ and $\lambda_{max2}$ are defined as follows. $\lambda_{max1}$ is the emission maximum of the sensitizer compound at room temperature when the sensitizer compound is used as the sole emitter in a first monochromic OLED (an OLED that emits only one color) that has a first host. $\lambda_{max2}$ is the emission maximum of the acceptor compound at room temperature when the acceptor compound is used as the sole emitter in a second monochromic OLED that has the same first host.

In some embodiments of the OLED of the present disclosure where the sensitizer compound provides unicolored sensitization (i.e., minimal loss in energy upon energy transfer to the acceptor compound), $\Delta\lambda$ (determined as described above) is equal to or less than the number selected from the group consisting of 15, 12, 10, 8, 6, 4, 2, 0, −2, −4, −6, −8, and −10 nm.

In some embodiments where the emission of the acceptor is redshifted by the sensitization, A, is equal to or greater than the number selected from the group consisting of 20, 30, 40, 60, 80, 100 nm.

In the embodiments, the sensitizer compound is capable of functioning as a phosphorescent emitter in an OLED at room temperature, and the sensitizer compound can be a metal coordination complex having a metal-carbon bond, a metal-nitrogen bond, or a metal-oxygen bond. In some embodiments, the metal is selected from the group consisting of Ir, Rh, Re, Ru, Os, Pt, Pd, Au, and Cu. In some embodiments, the metal is Ir. In some embodiments, the metal is Pt. In some embodiments, the sensitizer compound has the formula of $M(L_A)_x(L_B)_y(L_C)_z$;

wherein $L_A$, $L_B$, and $L_C$ can be the same or different;

wherein x is 1, 2, or 3;

wherein y is 0, 1, or 2;

wherein z is 0, 1, or 2;

wherein x+y+z is the oxidation state of the metal M;

wherein $L_A$ is selected from the group consisting of the structures of LIGAND LIST:

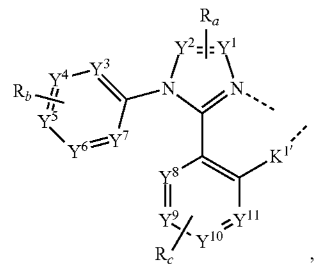

,

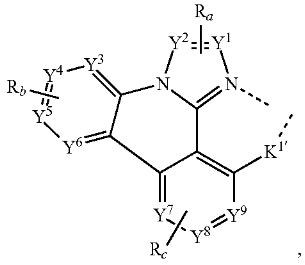

,

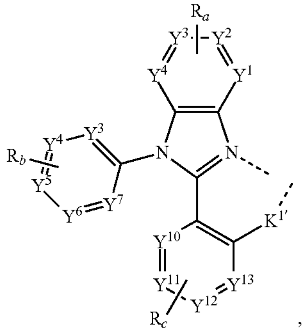

,

-continued
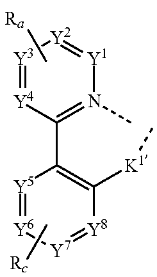
,
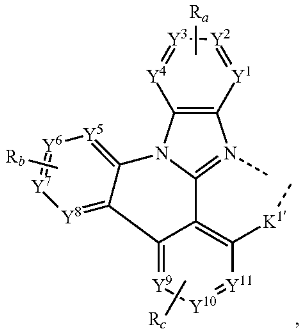
,
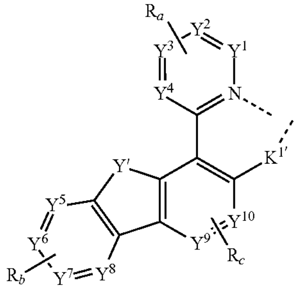
,
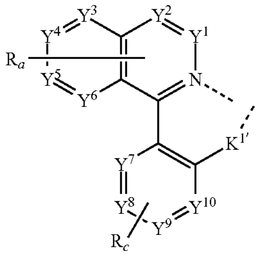
,
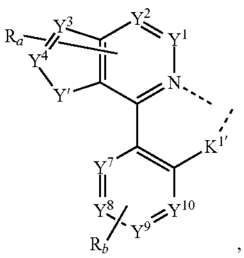
,
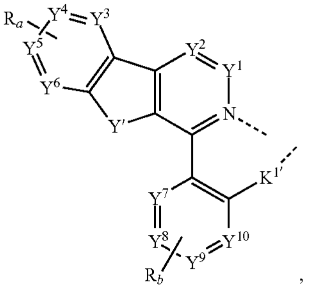
,
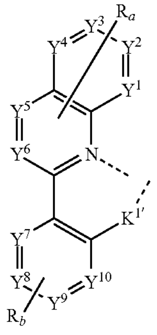
,
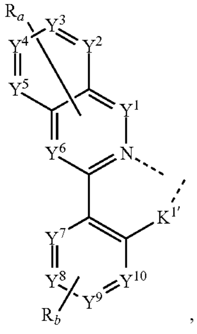
,
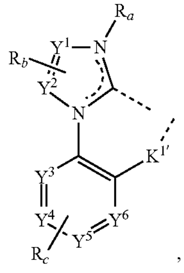
,
-continued
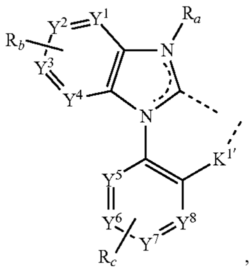
,
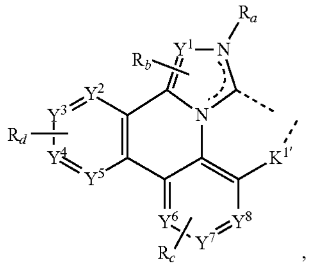
,
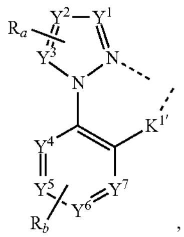
,
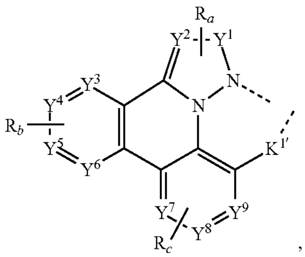
,
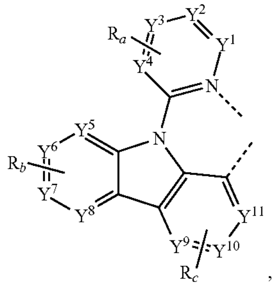
,
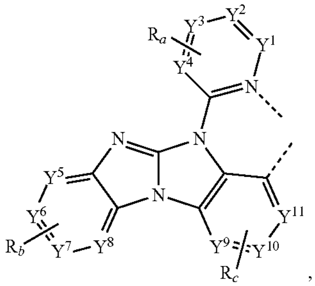
,
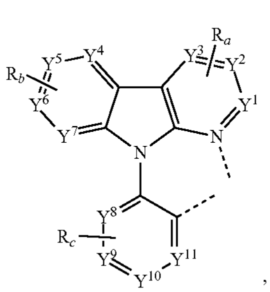
,
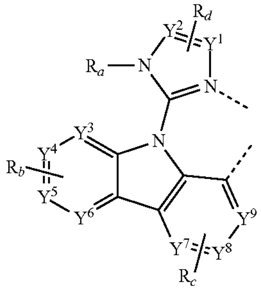
,
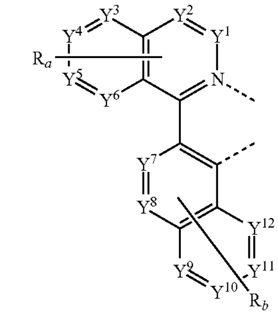
,
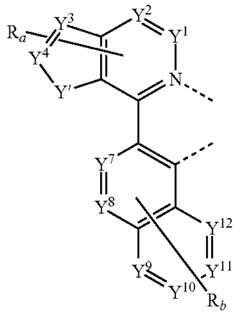
, -continued
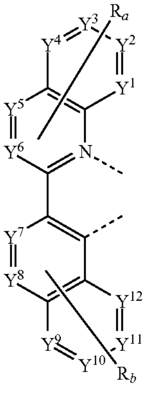
,
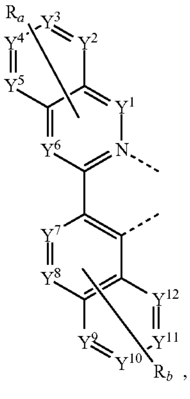
,
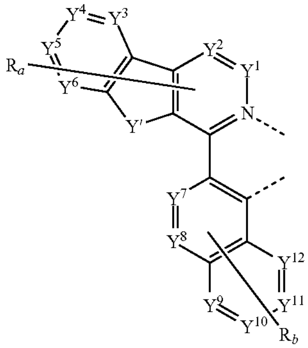
,
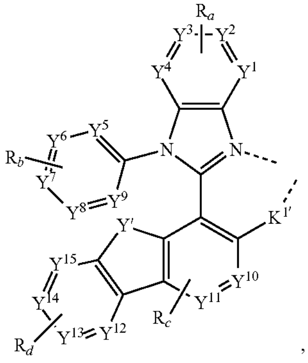
,
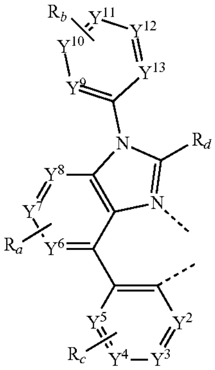
,
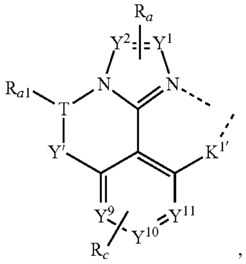
,
-continued
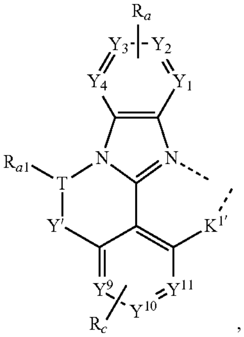
,
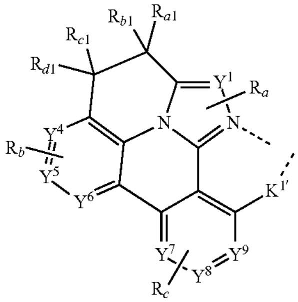
,
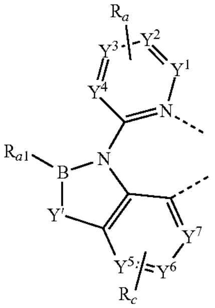
,
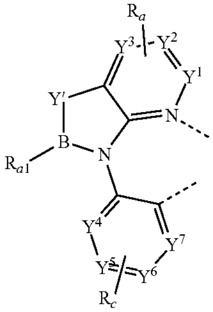
,
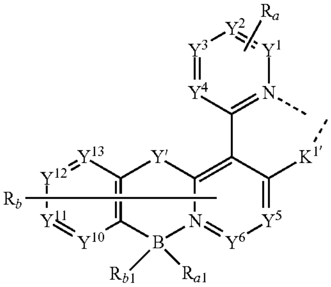
, and
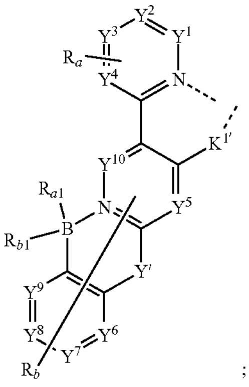
;
wherein $L_B$ and $L_C$ are independently selected from the group consisting of
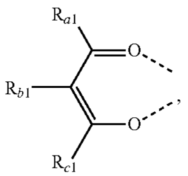
and the structures of LIGAND LIST; wherein:
T is selected from the group consisting of B, Al, Ga, and In;

$K^{1'}$ is a direct bond or is selected from the group consisting of $NR_e$, $PR_e$, O, S, and Se;

each $Y^1$ to $Y^{13}$ are independently selected from the group consisting of carbon and nitrogen;

Y' is selected from the group consisting of $BR_e$, $NR_e$, $PR_e$, O, S, Se, C═O, S═O, $SO_2$, $CR_eR_f$, $SiR_eR_f$, and $GeR_eR_f$;

$R_e$ and $R_f$ can be fused or joined to form a ring;

each $R_a$, $R_b$, $R_c$, and $R_d$ can independently represent from mono to the maximum possible number of substitutions, or no substitution;

each $R_{a1}$, $R_{b1}$, $R_{c1}$, $R_{d1}$, $R_a$, $R_b$, $R_c$, $R_d$, $R_e$, and $R_f$ is independently a hydrogen or a substituent selected from the group consisting of the General Substituents as defined herein; and wherein any two of $R_{a1}$, $R_{b1}$, $R_{c1}$, $R_{d1}$, $R_{a1}$, $R_{b1}$, $R_{c1}$, and $R_{d1}$ can be fused or joined to form a ring or form a multidentate ligand.

In some embodiments, the metal in formula $M(L_A)_x(L_B)_y(L_C)_z$ is selected from the group consisting of Cu, Ag, or Au.

In some embodiments of the OLED, the sensitizer compound has a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$;

wherein $L_A$, $L_B$, and $L_C$ are different from each other in the Ir compounds;

wherein $L_A$ and $L_B$ can be the same or different in the Pt compounds; and wherein $L_A$ and $L_B$ can be connected to form a tetradentate ligand in the Pt compounds.

In some embodiments of the OLED, the sensitizer compound is selected from the group consisting of the compounds in the following SENSITIZER LIST:

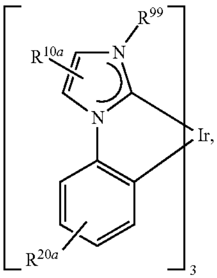
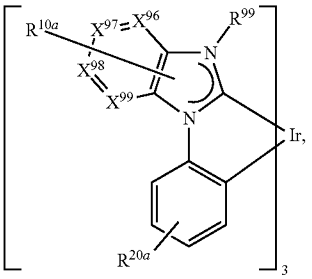
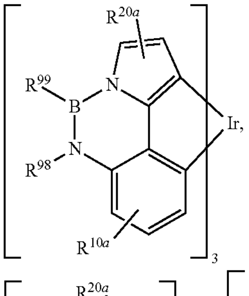
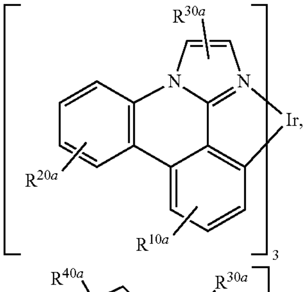
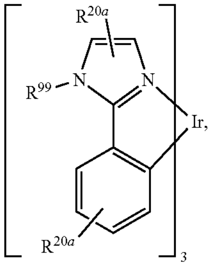
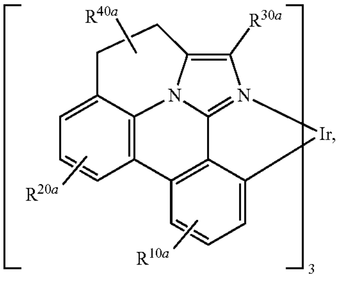

-continued

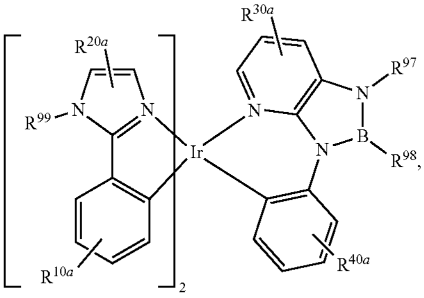
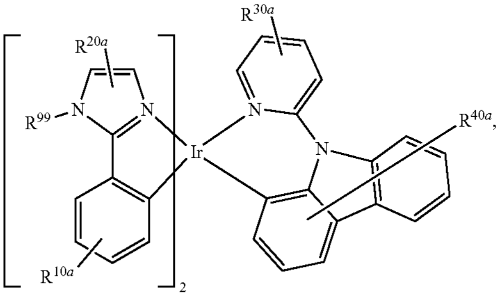
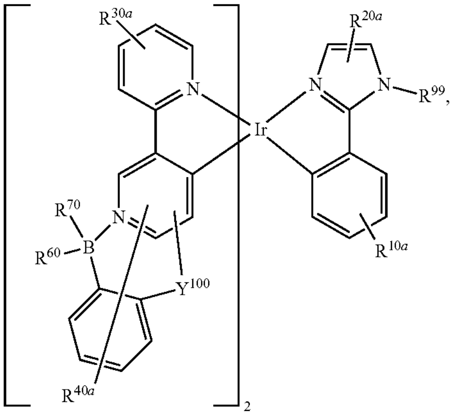
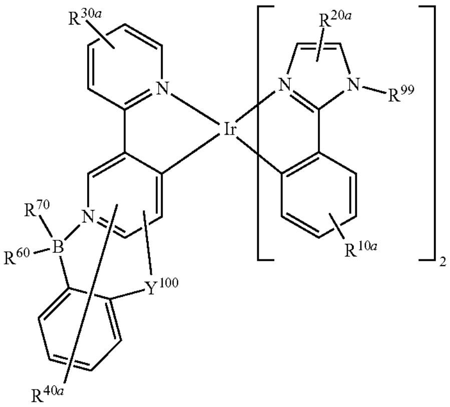
,
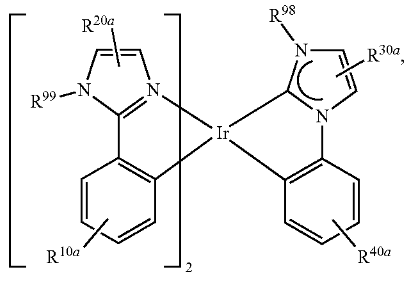

-continued
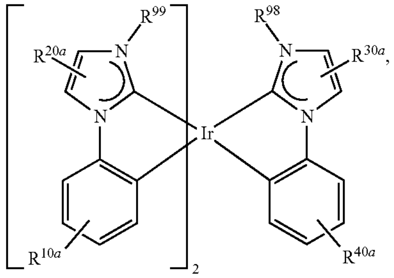
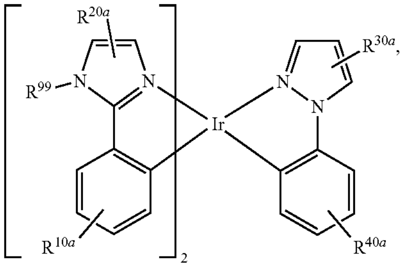
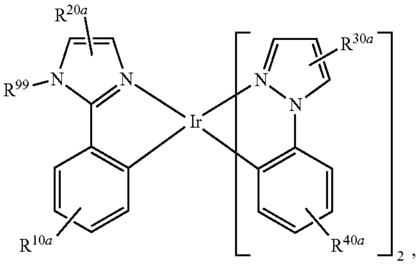
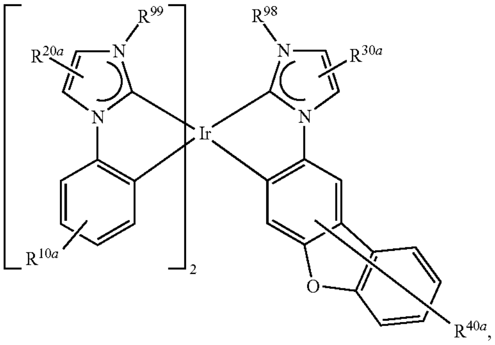
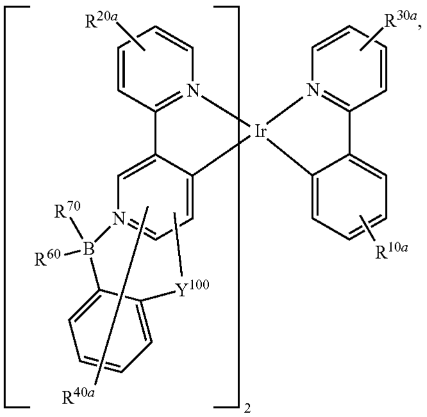
-continued
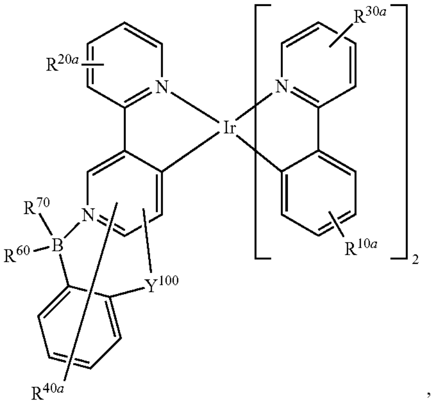
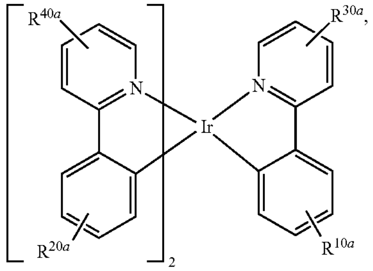
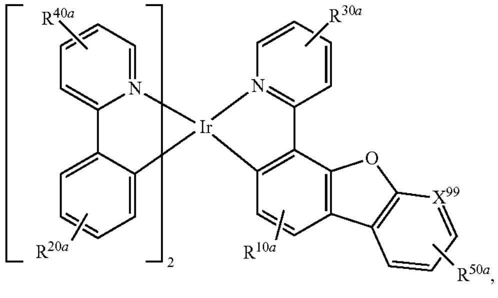
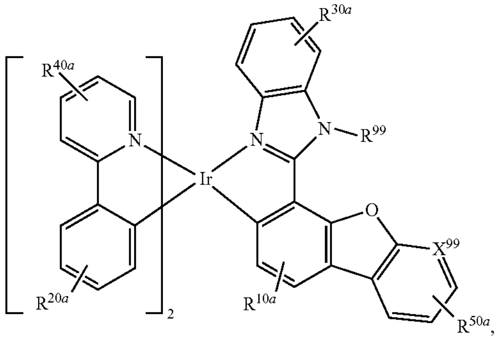
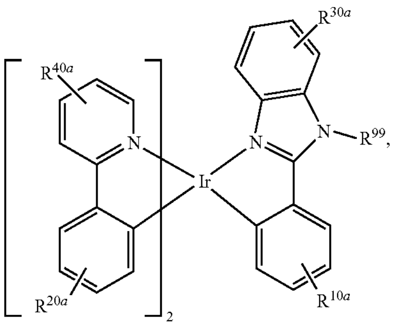

-continued
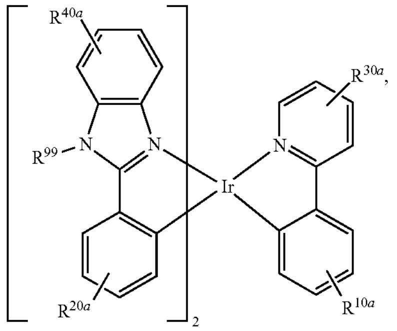
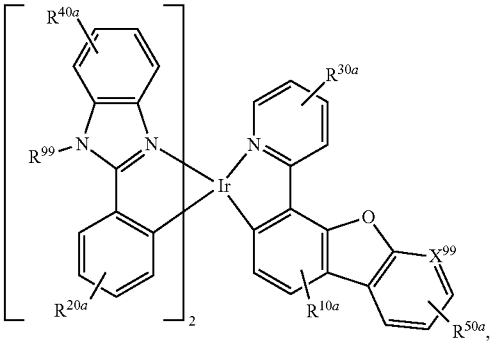
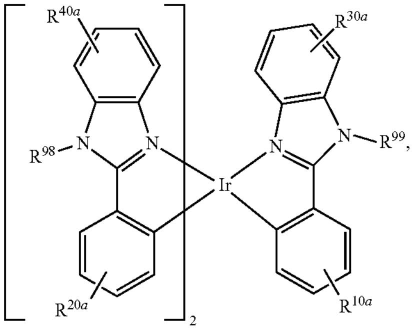
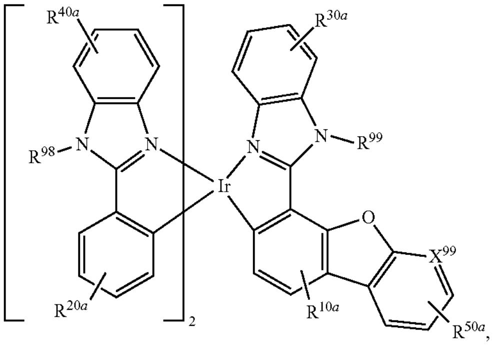
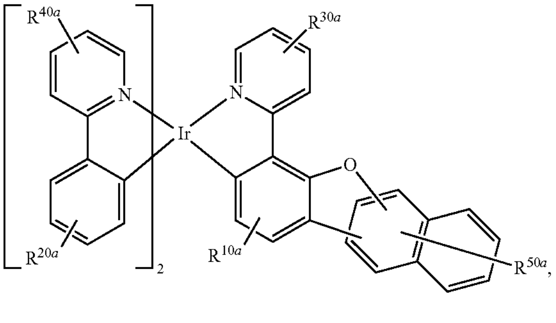
-continued
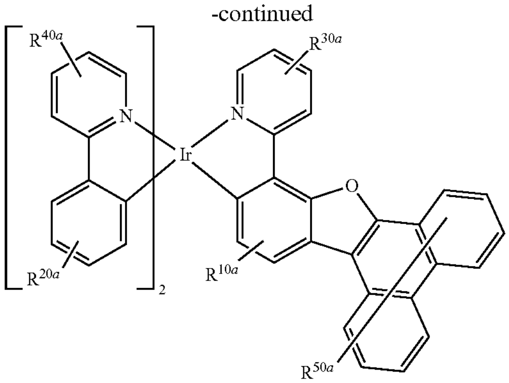
,
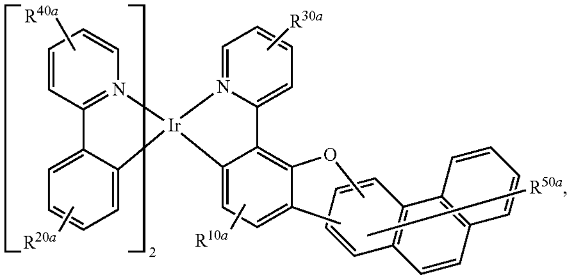
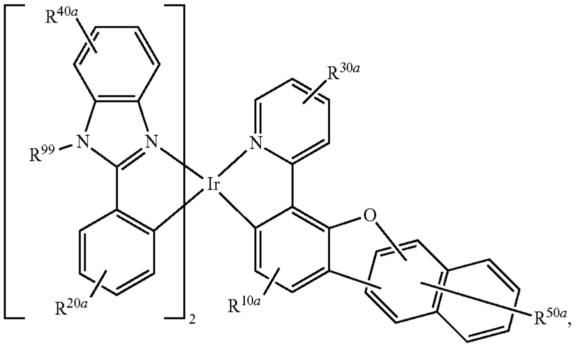
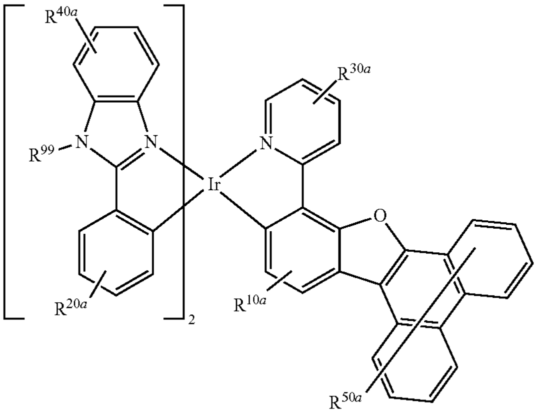
,
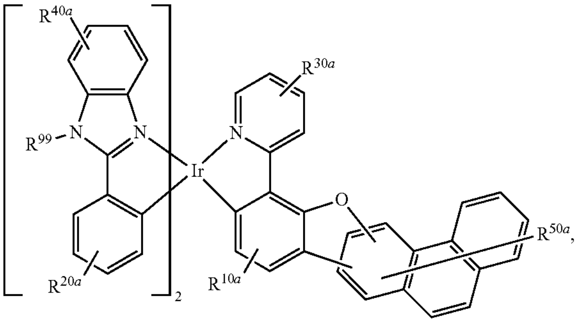

-continued
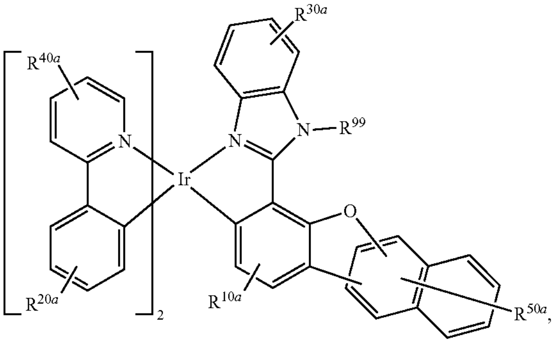
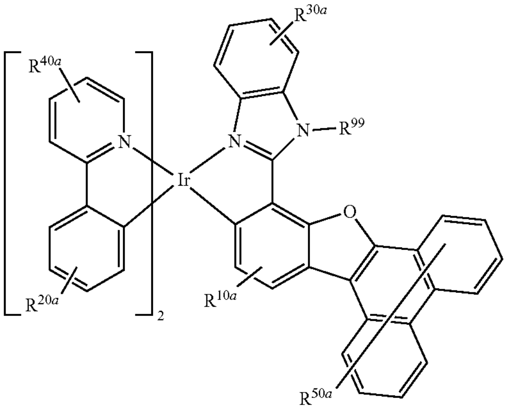
,
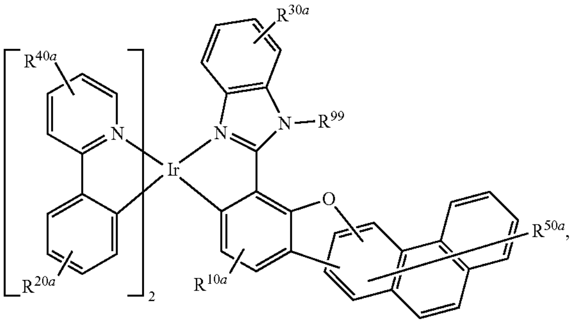
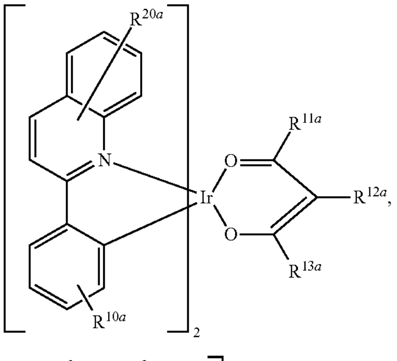
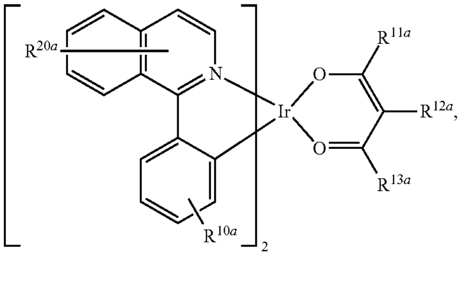
-continued
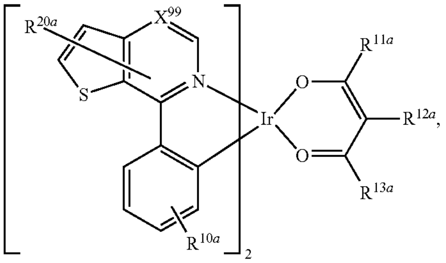
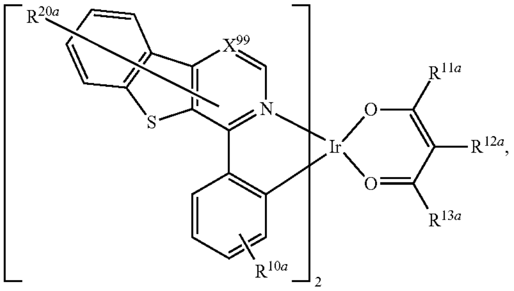
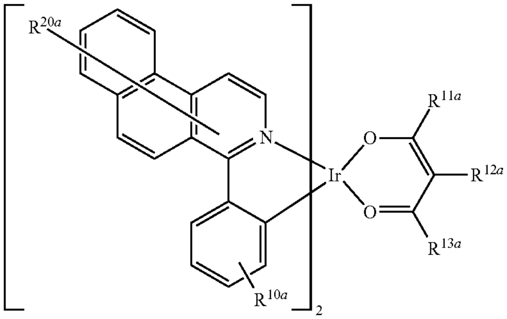
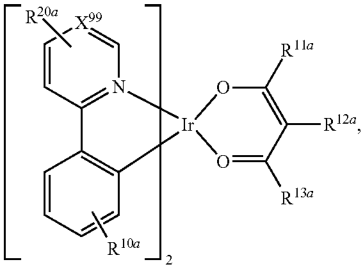
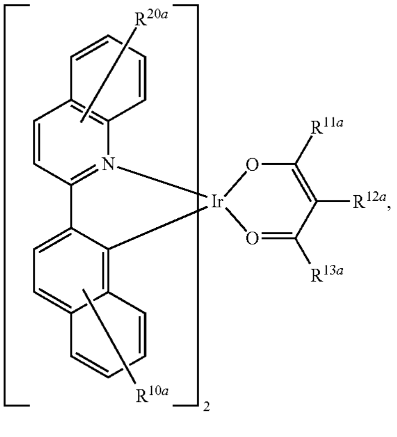

-continued
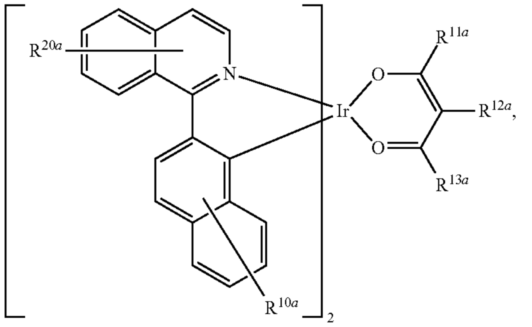
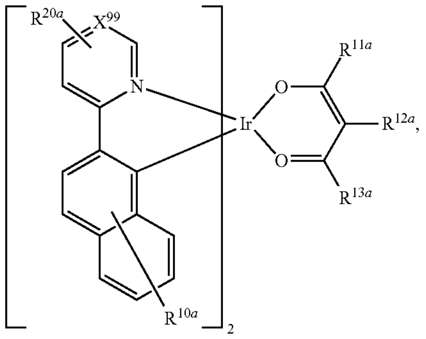
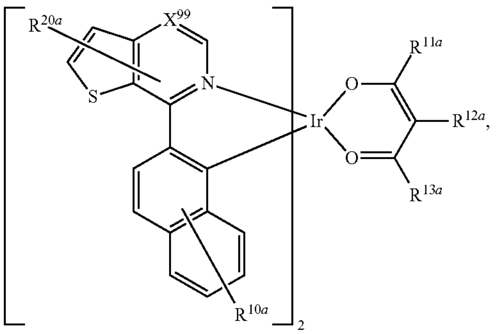
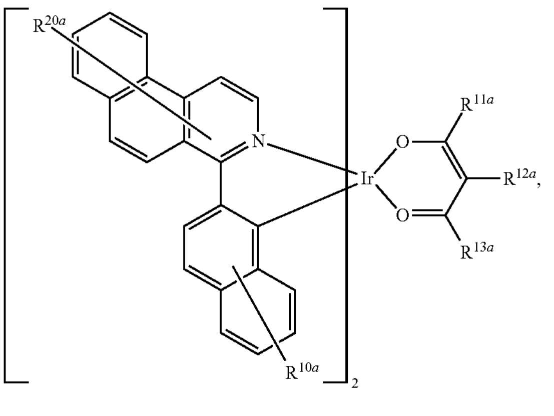
-continued
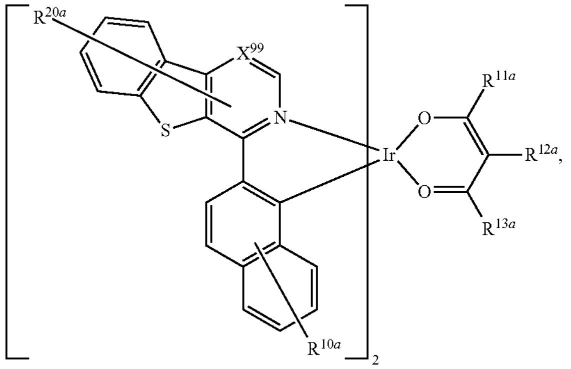
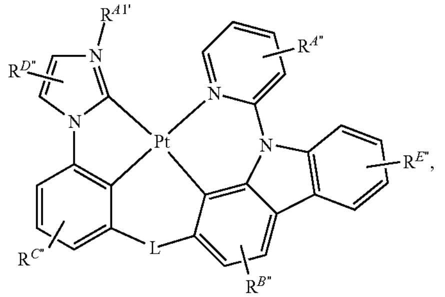
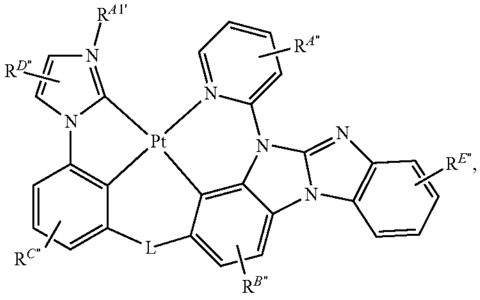
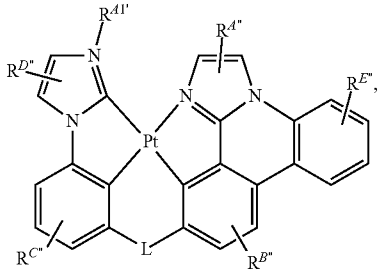
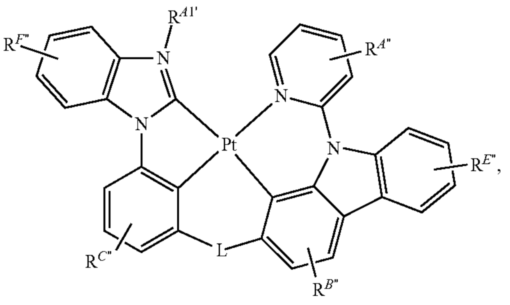

-continued
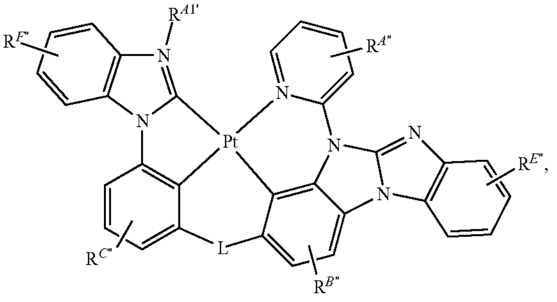
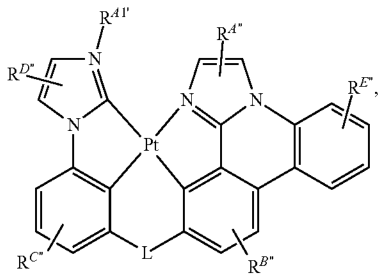
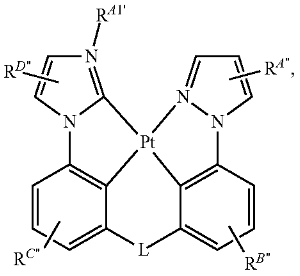
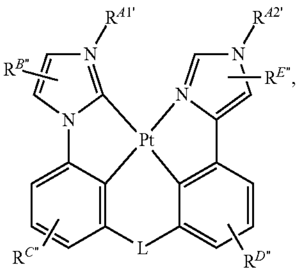
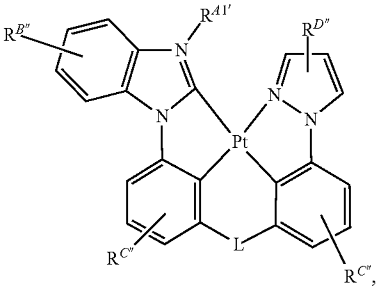
-continued
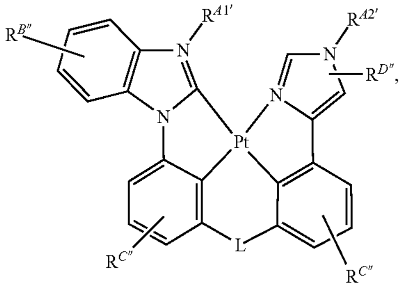
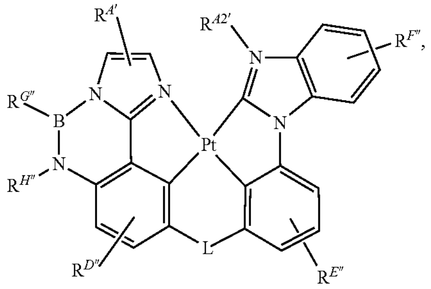
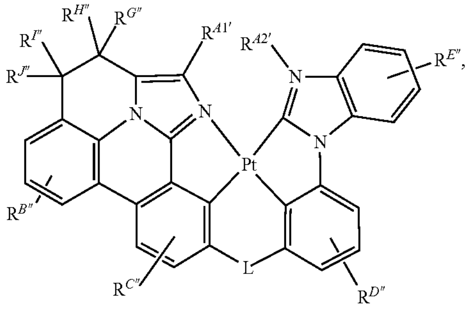
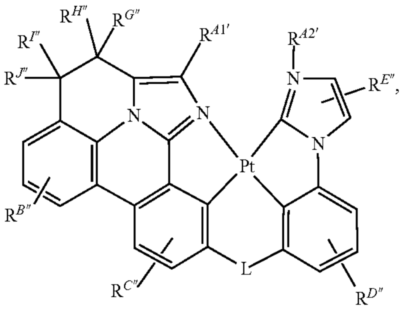
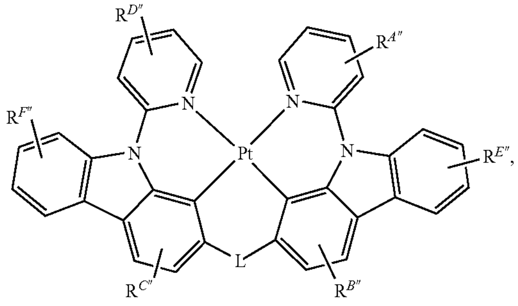

-continued
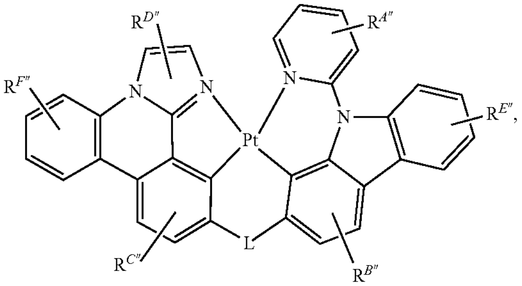
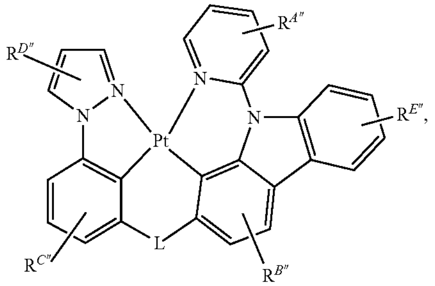
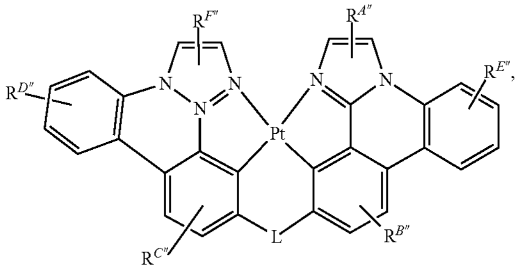
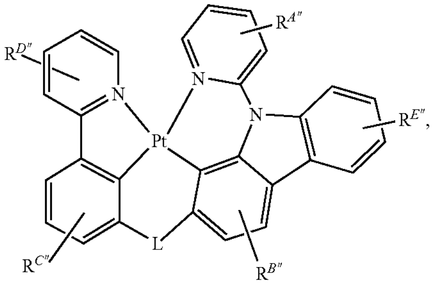
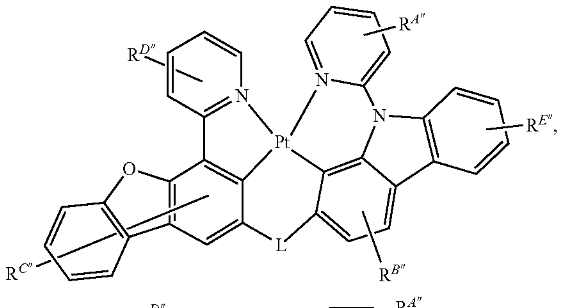
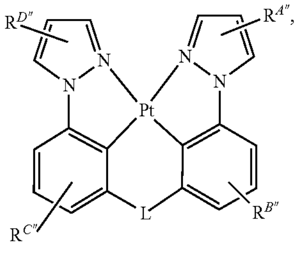
-continued
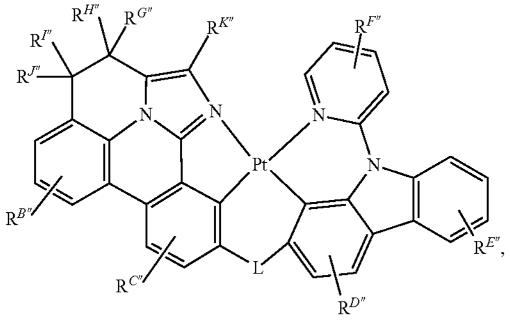
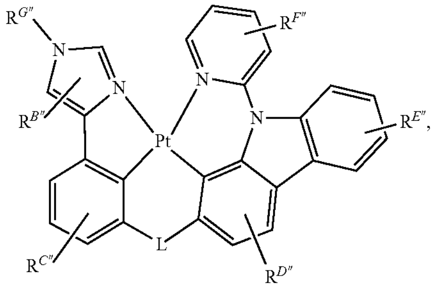
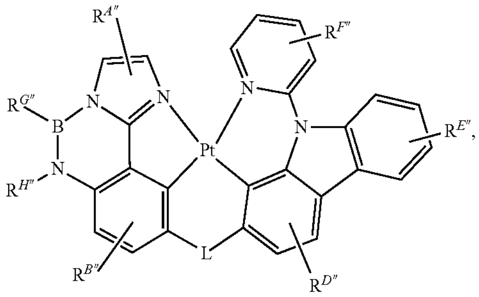
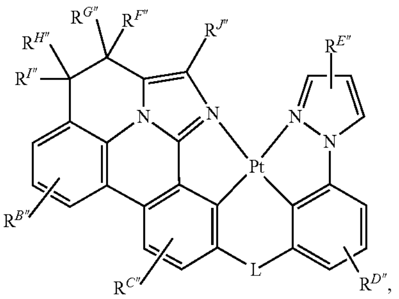
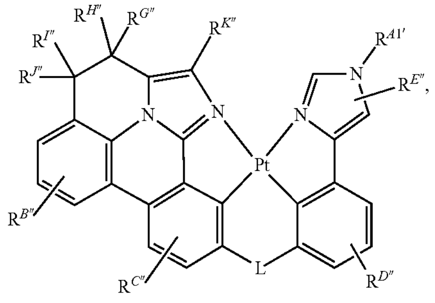

-continued
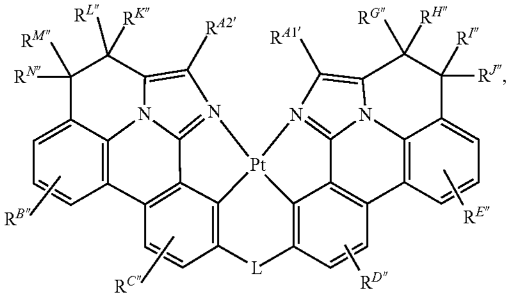
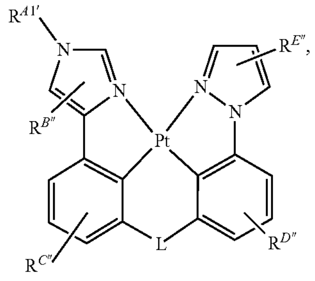
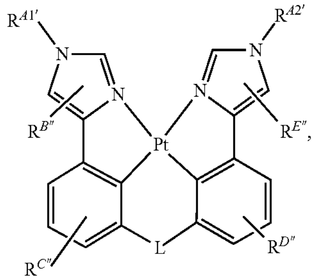
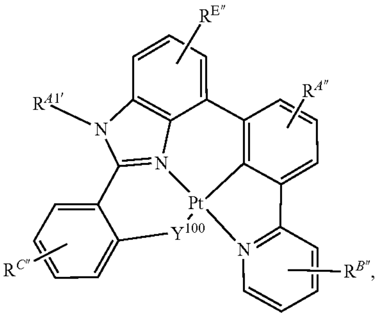
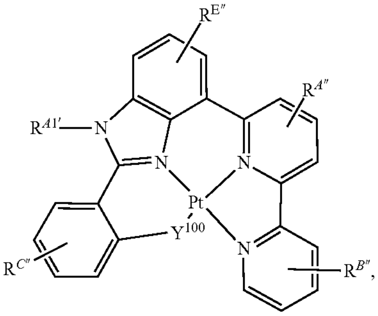
-continued
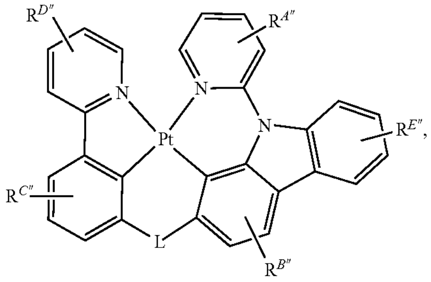
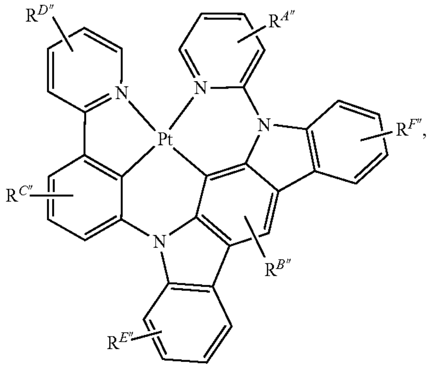
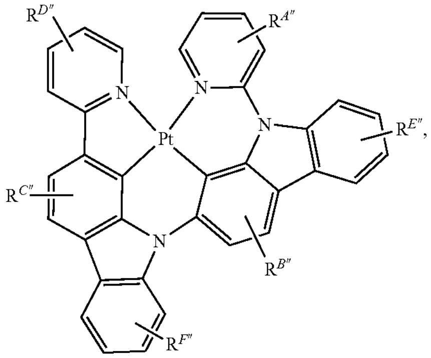
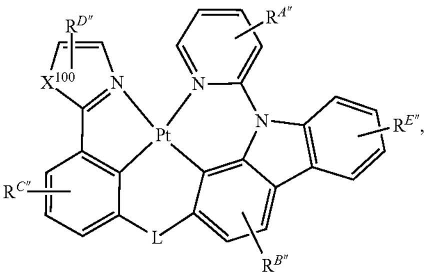
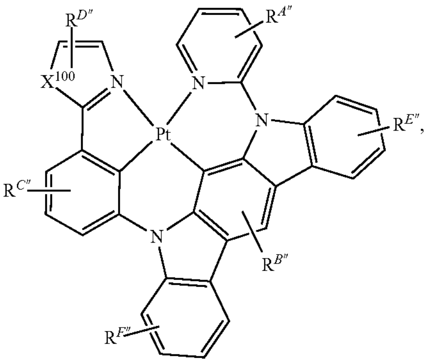

-continued
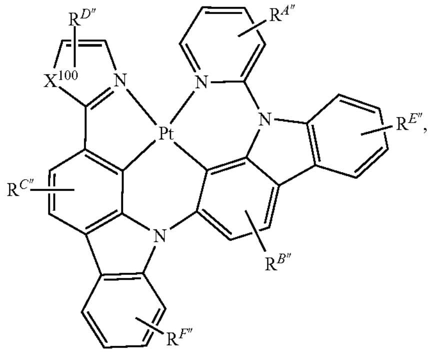
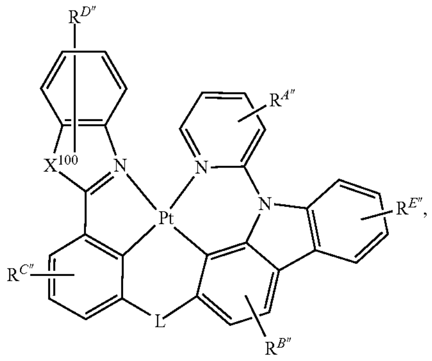
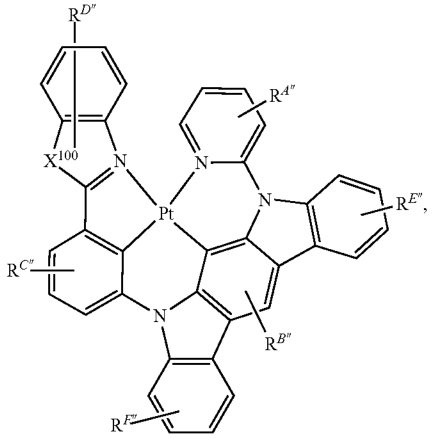
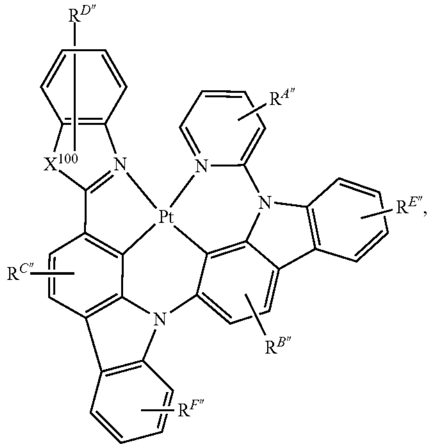
-continued
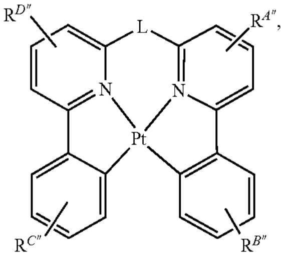
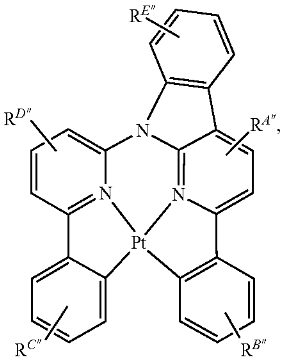
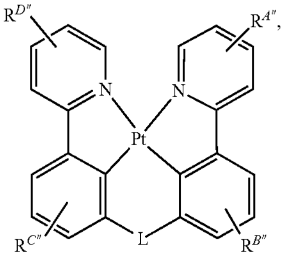
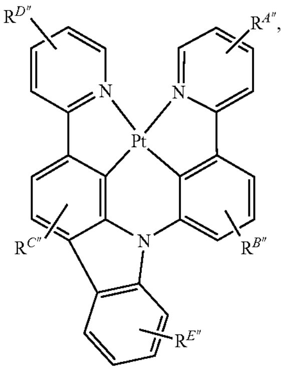
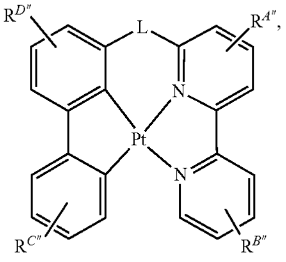

-continued
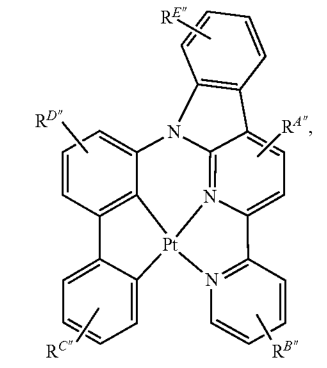
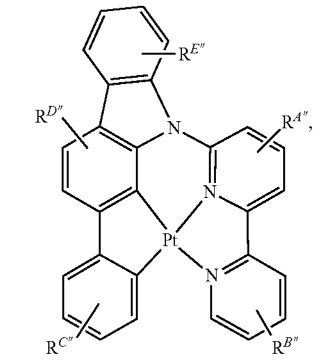
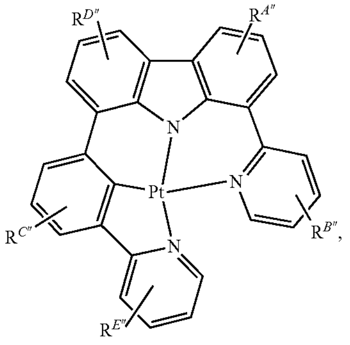
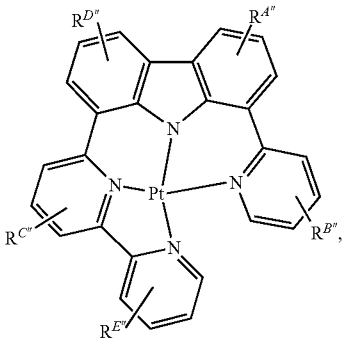
-continued
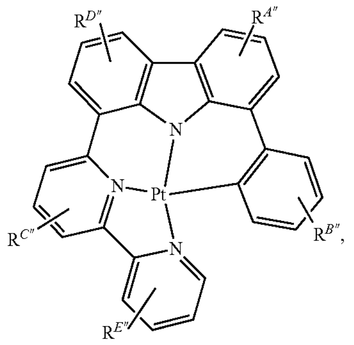
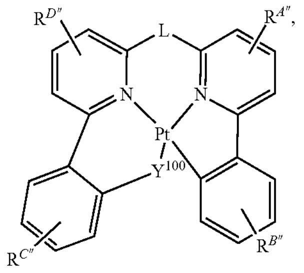
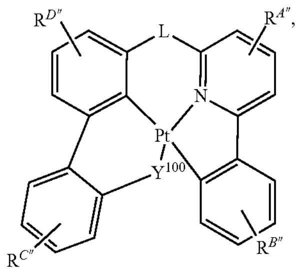
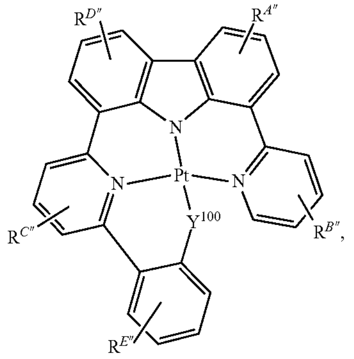
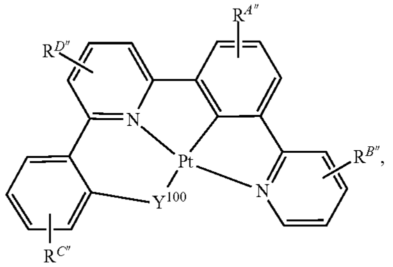

-continued
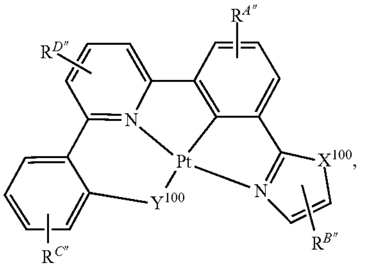
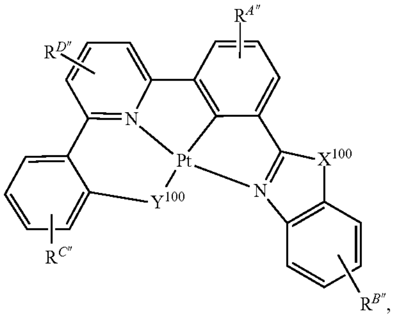
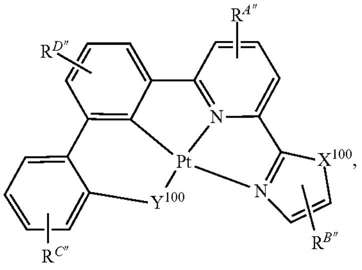
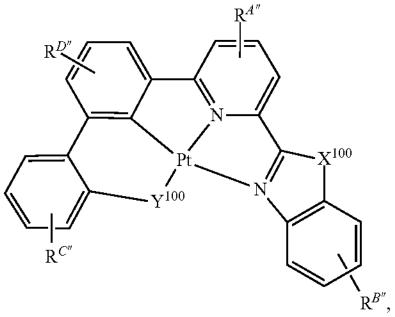
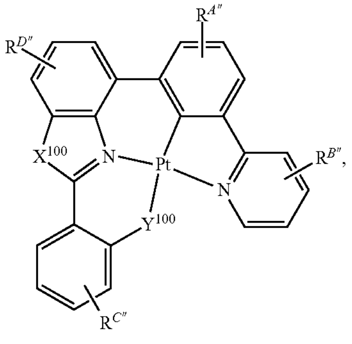
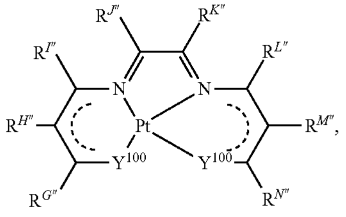
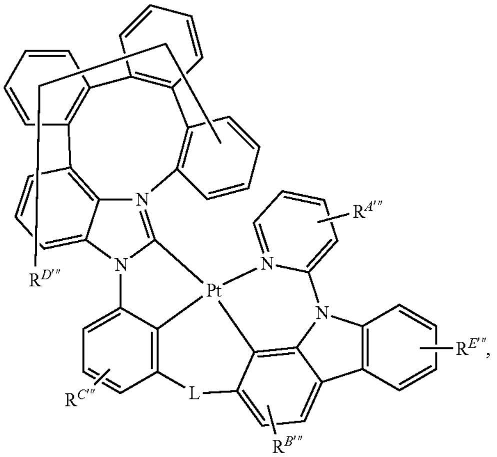
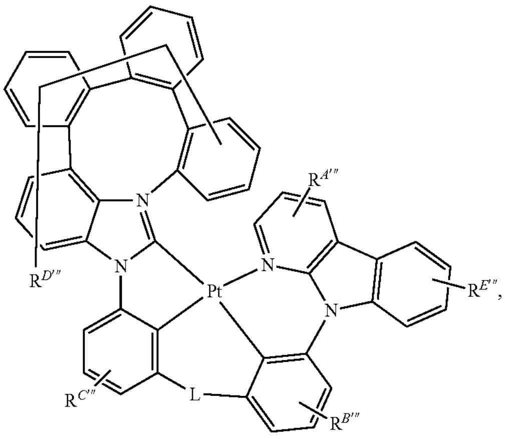
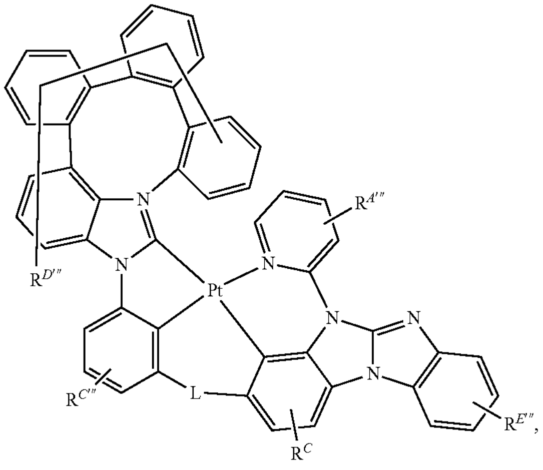

-continued

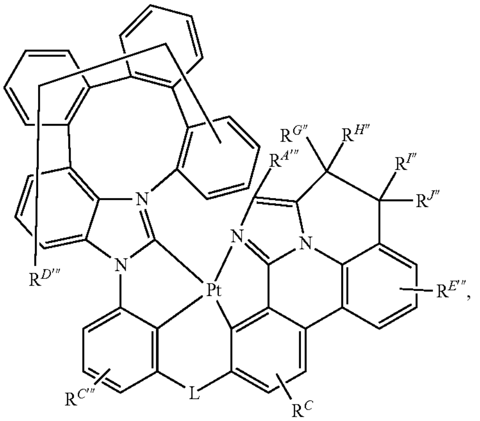

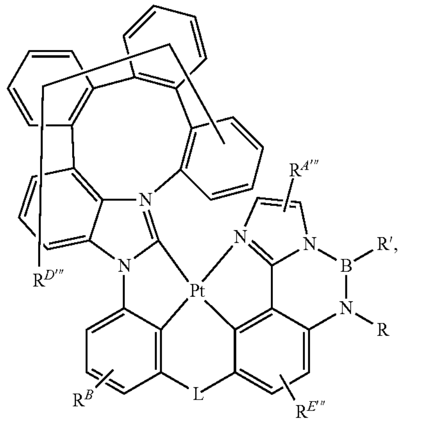

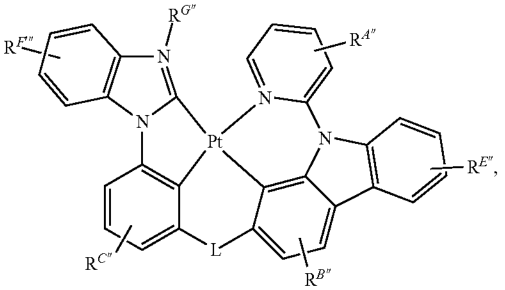

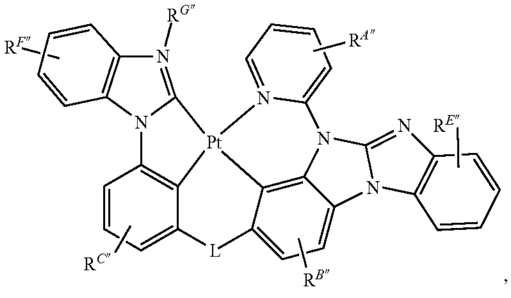

,

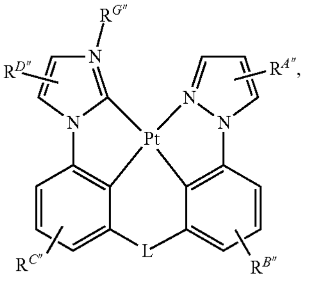

-continued

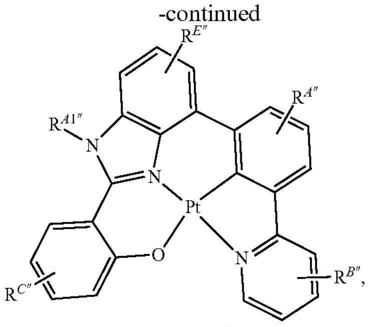

and

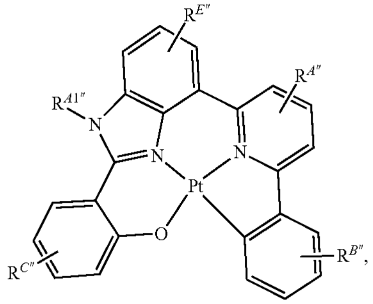

wherein:

each of $X^{96}$ to $X^{99}$ is independently C or N;

each $Y^{100}$ is independently selected from the group consisting of a NR", O, S, and Se;

L is independently selected from the group consisting of a direct bond, BR", BR"R"', NR", PR", O, S, Se, C=O, C=S, C=Se, C=NR", C=CR"R"', S=O, $SO_2$, CR", CR"R"', SiR"R"', GeR"R"', alkyl, cycloalkyl, aryl, heteroaryl, and combinations thereof;

$X^{100}$ for each occurrence is selected from the group consisting of O, S, Se, NR", and CR"R"';

each $R^{10a}$, $R^{20a}$, $R^{30a}$, $R^{40a}$, and $R^{50a}$, $R^{A''}$, $R^{B''}$, $R^{C''}$, $R^{D''}$, $R^{E''}$, and $R^{F''}$ independently represents mono-, up to the maximum substitutions, or no substitutions;

each of R, R', R", R"', $R^{10a}$, $R^{11a}$, $R^{12a}$, $R^{13a}$, $R^{20a}$, $R^{30a}$, $R^{40a}$, $R^{50a}$, $R^{60}$, $R^{70}$, $R^{97}$, $R^{98}$, $R^{99}$, $R^{A1'}$, $R^{A2'}$, $R^{A''}$, $R^{B''}$, $R^{C''}$, $R^{D''}$, $R^{E''}$, $R^{F''}$, $R^{G''}$, $R^{H''}$, $R^{I''}$, $R^{J''}$, $R^{K''}$, $R^{L''}$, $R^{M''}$, and $R^{N''}$ is independently a hydrogen or a substituent selected from the group consisting of deuterium, halide, alkyl, cycloalkyl, heteroalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, combinations thereof.

In some embodiments of the OLED where the sensitizer is selected from the group consisting of the structures in the SENSITIZER LIST, one or more of R, R', R", R"', $R^{10a}$, $R^{11a}$, $R^{12a}$, $R^{13a}$, $R^{20a}$, $R^{30a}$, $R^{40a}$, $R^{50a}$, $R^{60}$, $R^{70}$, $R^{97}$, $R^{98}$, $R^{99}$, $R^{A1'}$, $R^{A2'}$, $R^{A''}$, $R^{B''}$, $R^{C''}$, $R^{D''}$, $R^{E''}$, $R^{F''}$, $R^{G''}$, $R^{H''}$, $R^{I''}$, $R^{J''}$, $R^{K''}$, $R^{L''}$, $R^{M''}$, and $R^{N''}$ comprises a moiety selected from the group consisting of fully or partially deuterated aryl, fully or partially deuterated alkyl, boryl, silyl, germyl, 2,6-terphenyl, 2-biphenyl, 2-(tert-butyl)phenyl, tetraphenylene, tetrahydronaphthalene, and combinations thereof.

In some embodiments, the sensitizer and/or the acceptor can be a phosphorescent or fluorescent emitter. Phosphorescence generally refers to emission of a photon with a change in electron spin, i.e., the initial and final states of the emission have different multiplicity, such as from $T_1$ to So state. Ir and Pt complexes currently widely used in OLEDs belong to a family of phosphorescent emitters. In some embodiments, if an exciplex formation involves a triplet emitter, such exciplex can also emit phosphorescent light. On the other hand, fluorescent emitters generally refer to emission of a photon without a change in electron spin, such as from $S_1$ to $S_0$ state. Fluorescent emitters can be delayed fluorescent or non-delayed fluorescent emitters. Depending on the spin state, fluorescent emitter can be a singlet emitter or a doublet emitter, or other multiplet emitter. It is believed that the internal quantum efficiency (IQE) of fluorescent OLEDs can exceed the 25% spin statistics limit through delayed fluorescence. There are two types of delayed fluorescence, i.e. P-type and E-type delayed fluorescence. P-type delayed fluorescence is generated from triplet-triplet annihilation (TTA). On the other hand, E-type delayed fluorescence does not rely on the collision of two triplets, but rather on the thermal population between the triplet states and the singlet excited states. Thermal energy can activate the transition from the triplet state back to the singlet state. This type of delayed fluorescence is also known as thermally activated delayed fluorescence (TADF). E-type delayed fluorescence characteristics can be found in an exciplex system or in a single compound. Without being bound by a theory, it is believed that TADF requires a compound or an exciplex having a small singlet-triplet energy gap ($\Delta E_{S-T}$) of less than or equal to 300 meV, and in some preferred embodiments, less than or equal to 250, 200, 150, 100, or 50 meV. There are two major types of TADF emitters, one is called donor-acceptor type TADF, the other one is called multiple resonance (MR) type TADF. Often, donor-acceptor single compounds are constructed by connecting an electron donor moiety such as amino- or carbazole-derivatives and an electron acceptor moiety such as N-containing six-membered aromatic ring. Donor-acceptor exciplex can be formed between a hole transporting compound and an electron transporting compound. The examples for MR-TADF include a highly conjugated boron-containing compounds. In some embodiments, the reverse intersystem crossing time duration from $T_1$ to $S_1$ of the delayed fluorescent emission at 293K is less than or equal to 10 microseconds. In some embodiments, such time duration can be greater than 10 microseconds and less than 100 microseconds.

In some embodiments of the OLED, at least one of the following conditions is true: (1) the sensitizer compound is capable of functioning as a TADF emitter in an OLED at room temperature; (2) the acceptor compound is a delayed-fluorescent compound functioning as a TADF emitter in the OLED at room temperature.

In some embodiments of the OLED, the TADF emitter comprises at least one donor group and at least one acceptor group. In some embodiments, the TADF emitter is a metal complex. In some embodiments, the TADF emitter is a non-metal complex. In some embodiments, the TADF emitter is a Cu, Ag, or Au complex.

In some embodiments of the OLED, the TADF emitter has the formula of $M(L^5)(L^6)$, wherein M is Cu, Ag, or Au, $L^5$ and $L^6$ are different, and $L^5$ and $L^6$ are independently selected from the group consisting of:

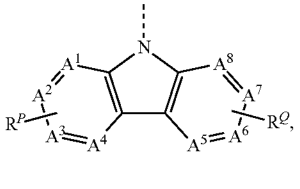

-continued

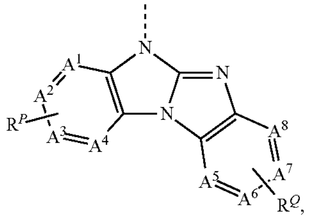

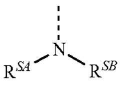

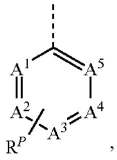

,

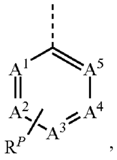

,

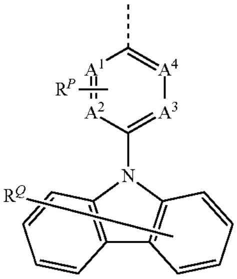

,

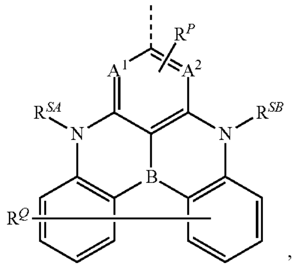

,

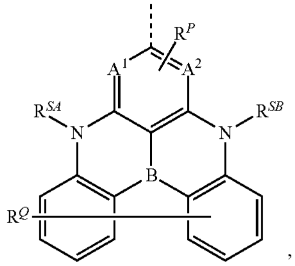

,

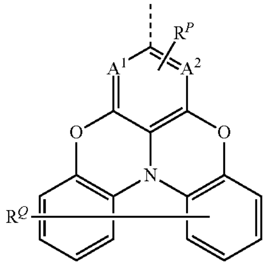

,

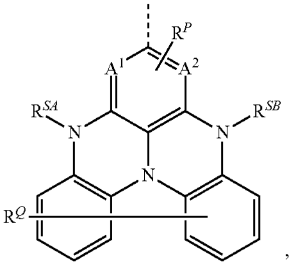

,

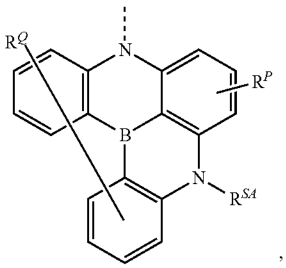

,

-continued

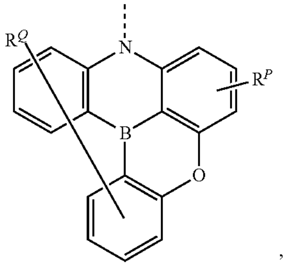

, 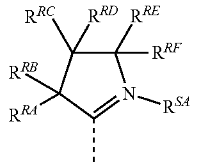

, 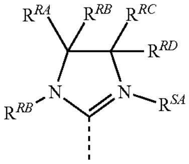

, 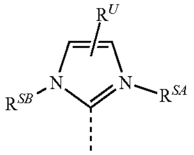

, 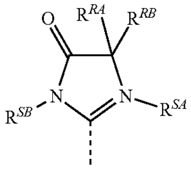

, 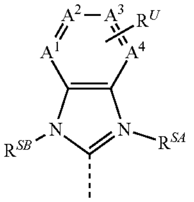

, 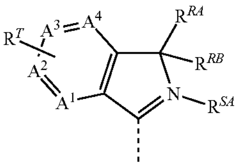

, 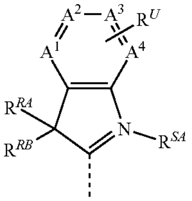

, 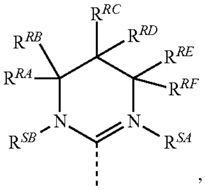

, 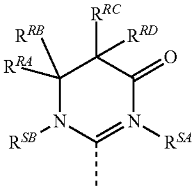

, 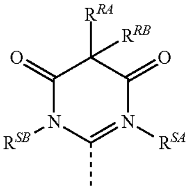

, 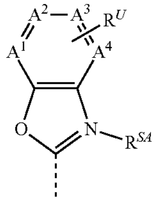

, 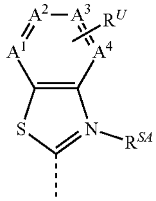

, 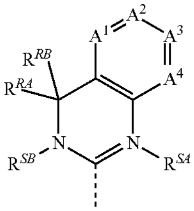

, 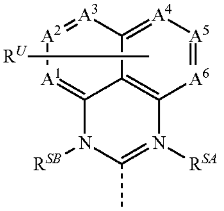

, and

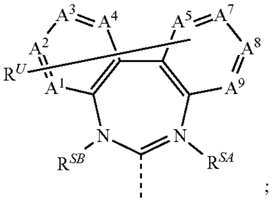

;

wherein $A^1$-$A^9$ are each independently selected from C or N;

wherein each $R^P$, $R^P$, $R^U$, $R^{SA}$, $R^{SB}$, $R^{RA}$, $R^{RB}$, $R^{RC}$, $R^{RD}$, $R^{RE}$, and $R^{RF}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some embodiments of the OLED, the TADF emitter is selected from the group consisting of the structures in the following TADF LIST:

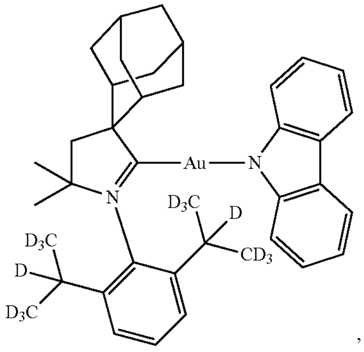

,

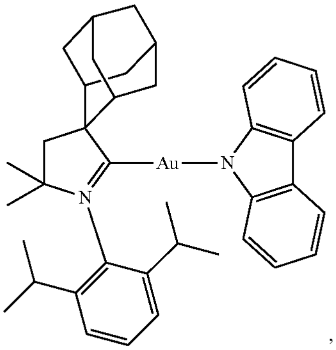

,

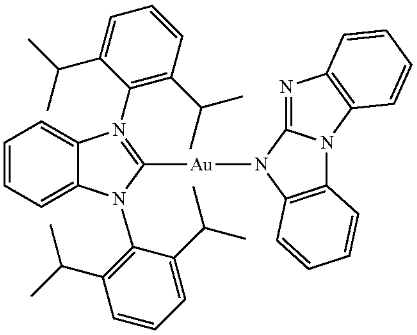

,

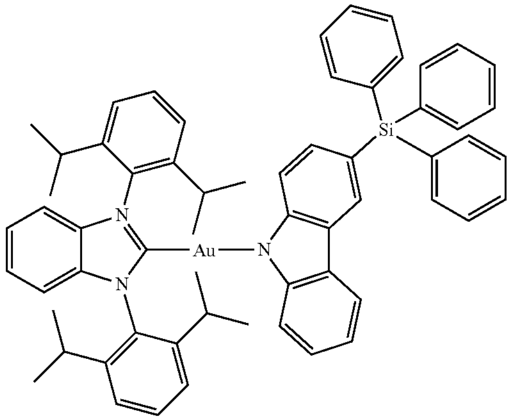
,
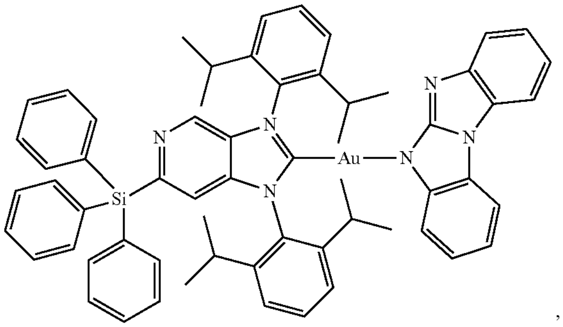
,
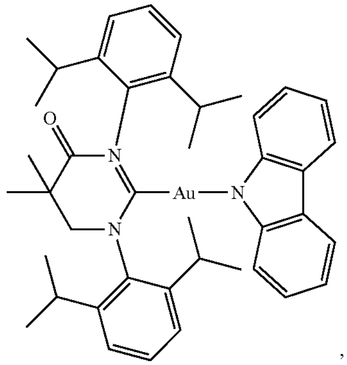
,
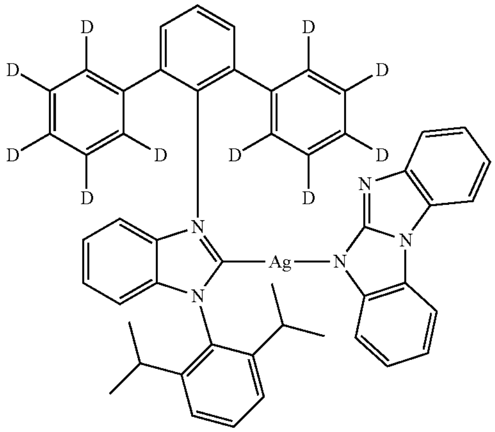
,
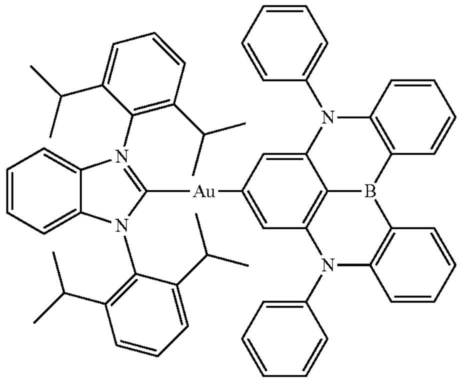
,
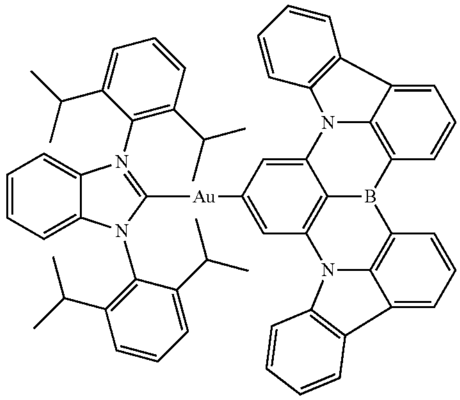
,
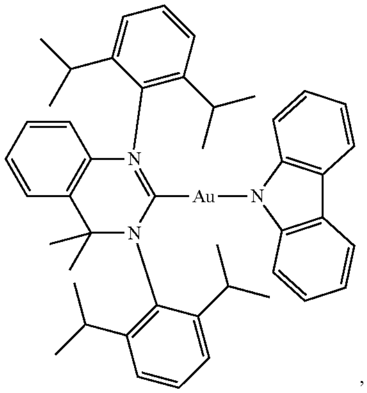
,
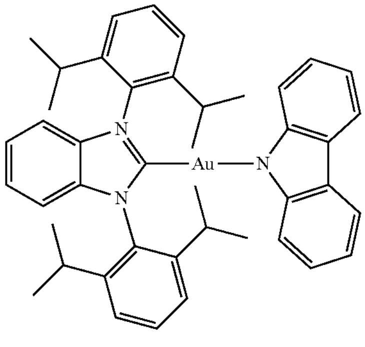
, -continued
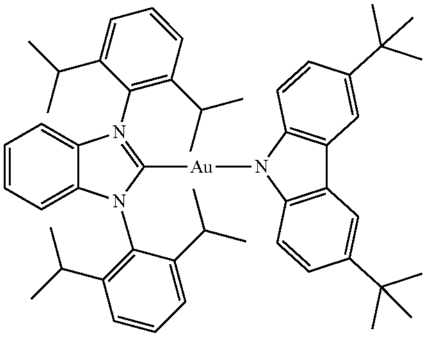
,
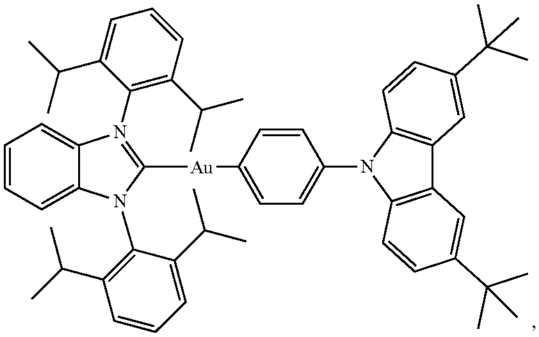
,
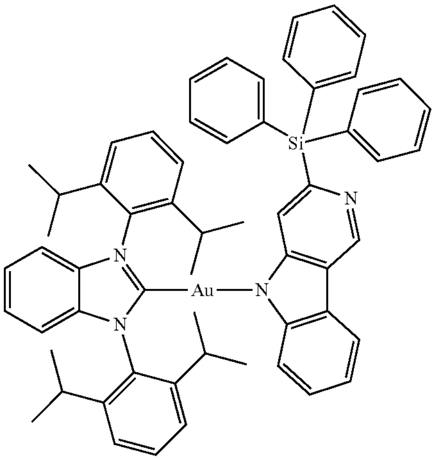
,
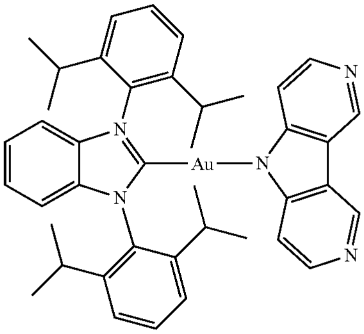
, and
-continued
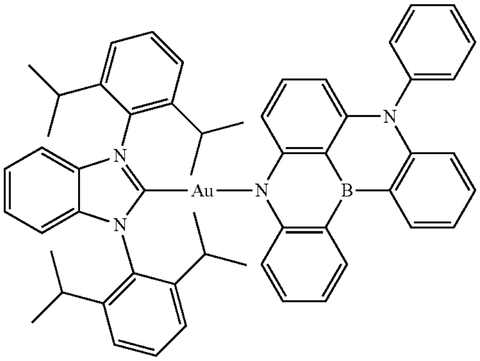
.
In some embodiments of the OLED, the TADF emitter comprises at least one of the chemical moieties selected from the group consisting of:
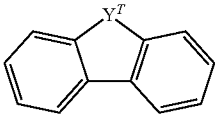
,
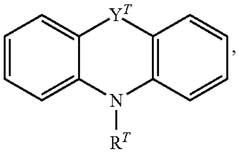
,
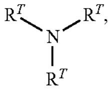
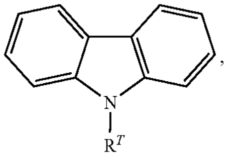
,
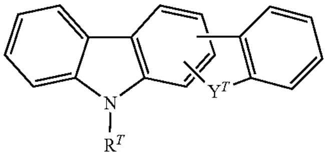
,
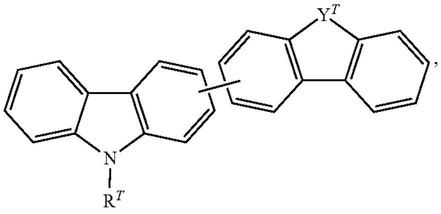
,
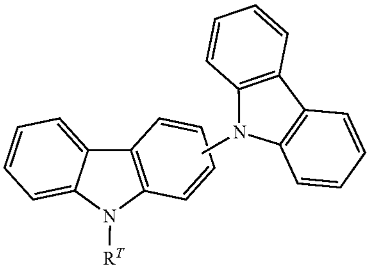
, -continued

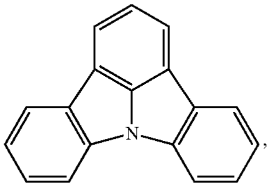,
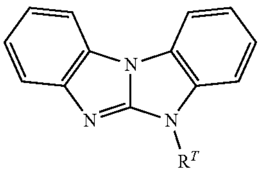,
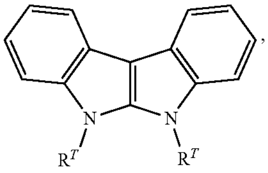,
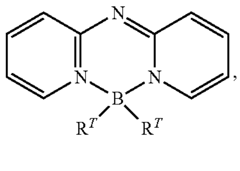,
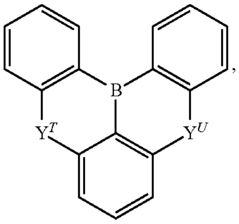,
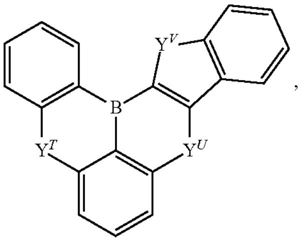,
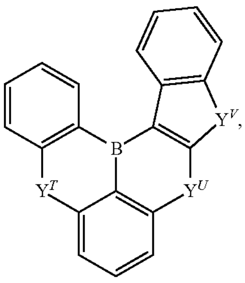,
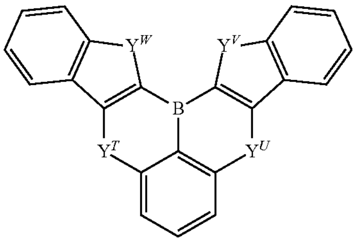,
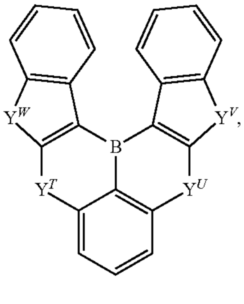, -continued

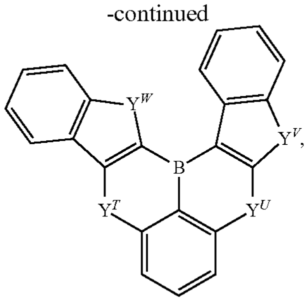,
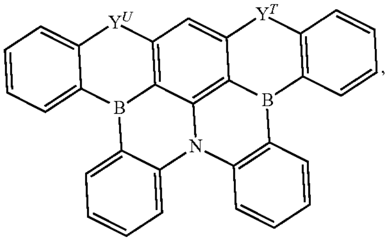,
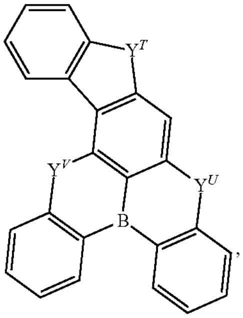,
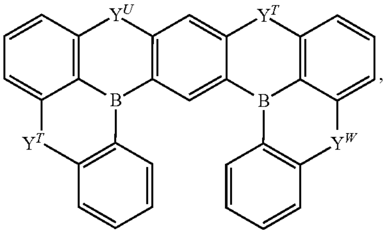, and
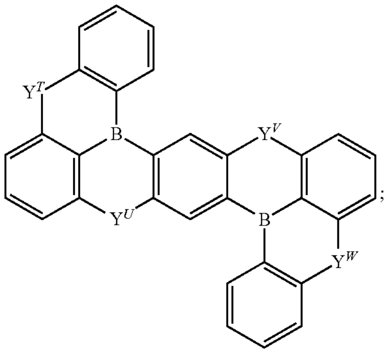;

wherein $Y^T$, $Y^U$, $Y^V$, and $Y^W$ are each independently selected from the group consisting of BR, NR, PR, O, S, Se, C═O, S═O, $SO_2$, BRR', CRR', SiRR', and GeRR';

wherein each $R^T$ can be the same or different and each $R^T$ is independently a donor, an acceptor group, an organic linker bonded to a donor, an organic linker bonded to an acceptor group, or a terminal group selected from the group consisting of alkyl, cycloalkyl, heteroalkyl, heterocycloalkyl, arylalkyl, aryl, heteroaryl, and combinations thereof; and R, and R' are each independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some of the above embodiments, any carbon ring atoms up to maximum of a total number of three, together with their substituents, in each phenyl ring of any of above structures can be replaced with N.

In some embodiments, the TADF emitter comprises at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

In some embodiments, the acceptor is a fluorescent compound functioning as an emitter in the OLED at room temperature. In some embodiments, the fluorescent compound comprises at least one of the chemical moieties selected from the group consisting of:

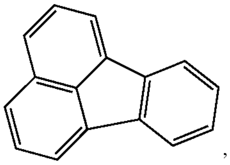
,
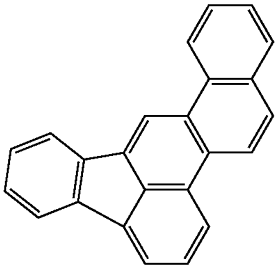
,
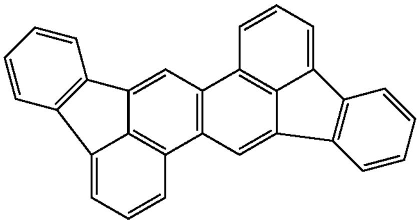
,
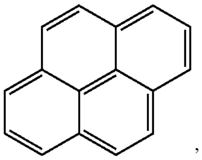
,
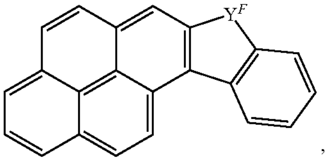
,
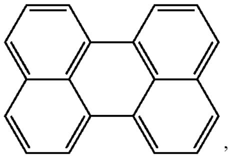
,
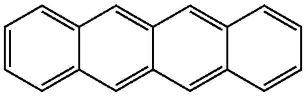
,
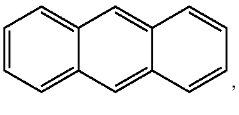
,
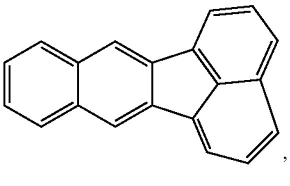
, -continued

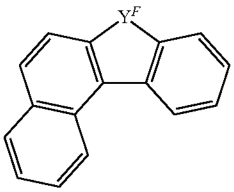
,
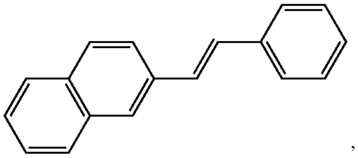
,
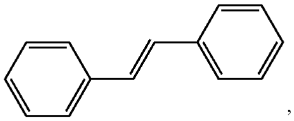
,
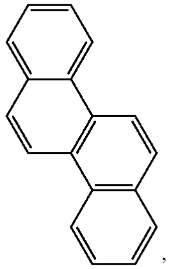
,
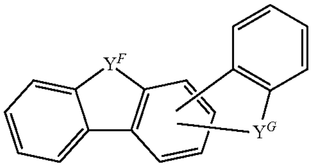
,
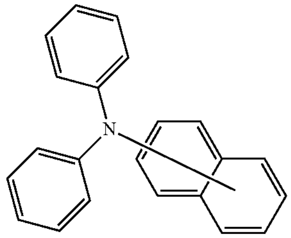
,
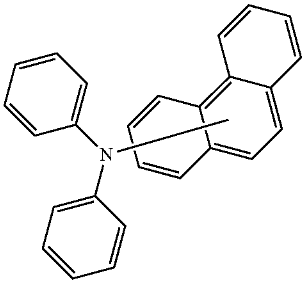
,
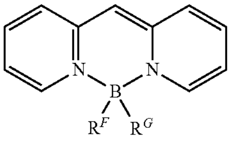
,
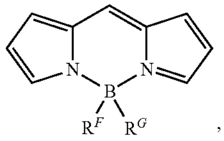
,
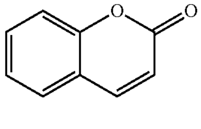
,
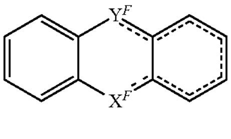
, -continued
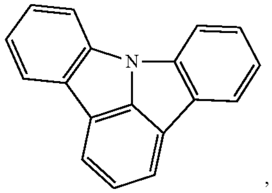
,
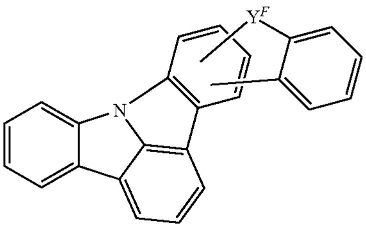
,
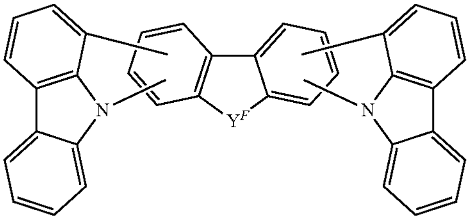
,
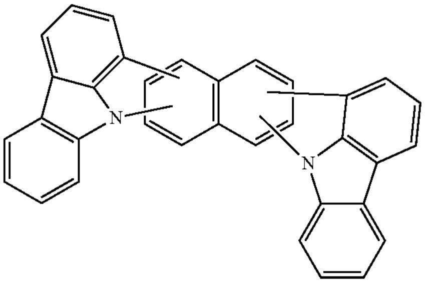
,
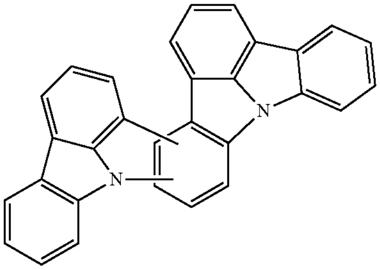
,
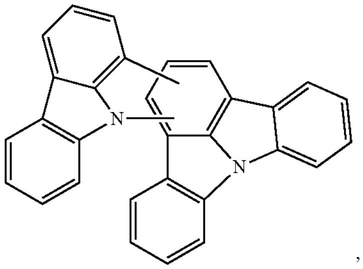
,
-continued
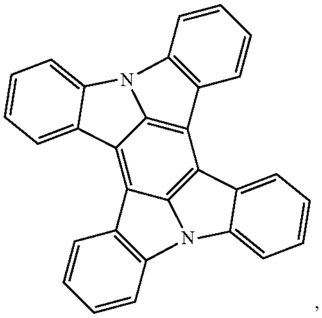
,
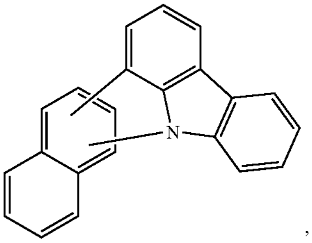
,
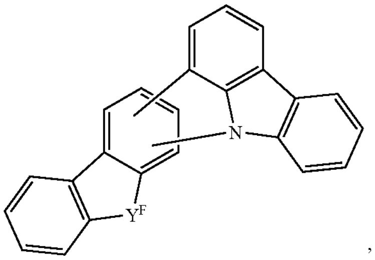
,
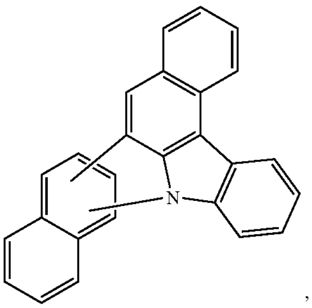
,
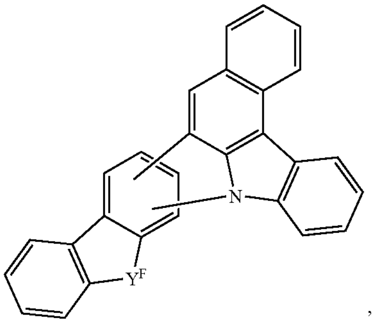
, -continued
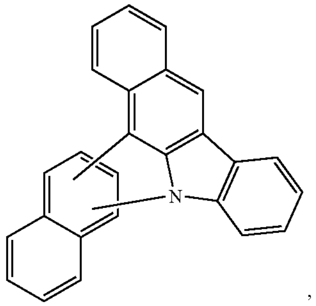
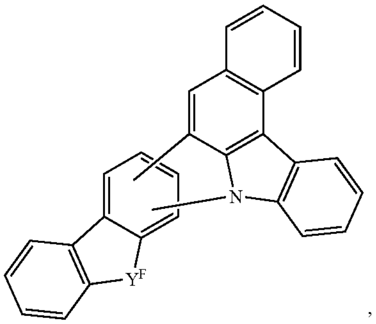
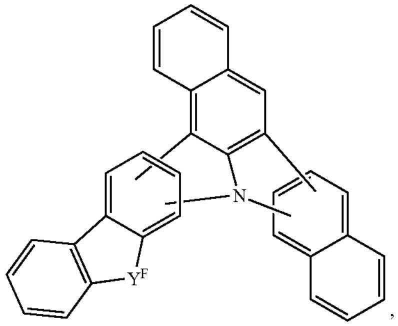
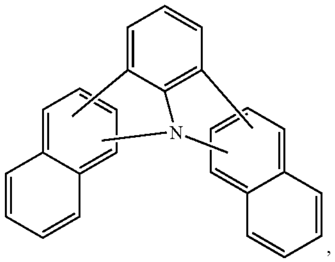
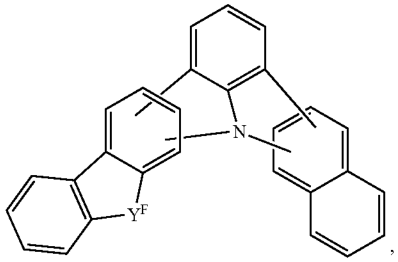
-continued
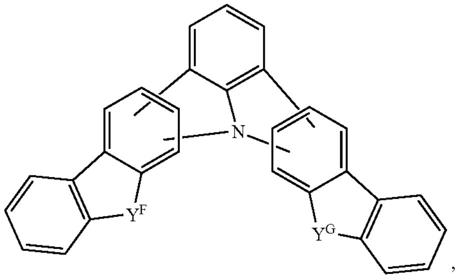
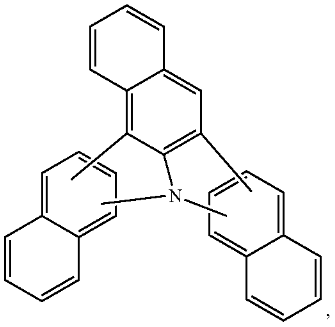
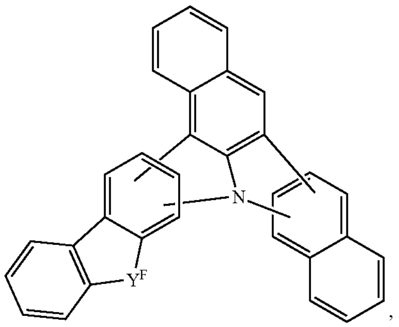
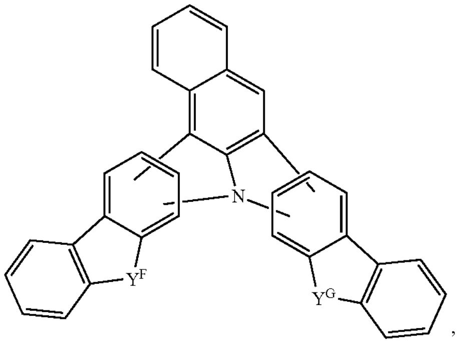
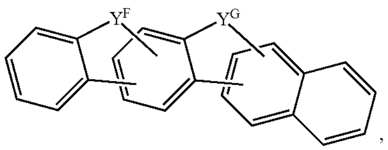
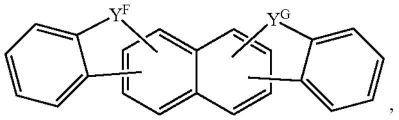
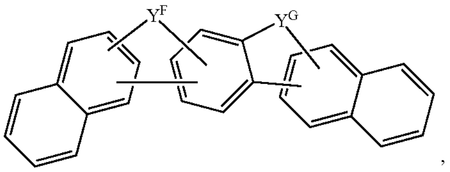

-continued

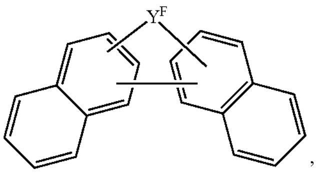

,

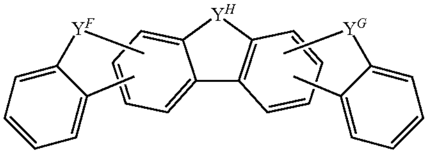

,

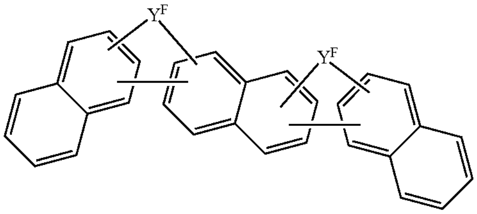

,

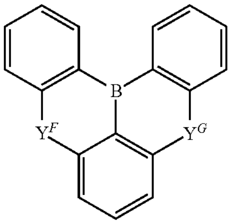

,

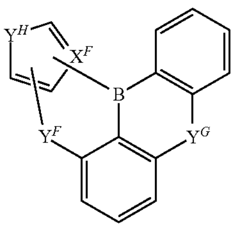

and

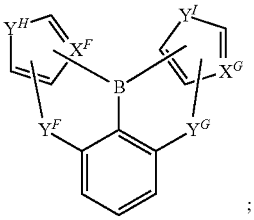

;

wherein $Y^F$ $Y^G$ $Y^H$, and $Y^I$ are each independently selected from the group consisting of BR, NR, PR, O, S, Se, C═O, S═O, $SO_2$, BRR', CRR', SiRR', and GeRR';

wherein $X^F$ and $Y^G$ are each independently selected from the group consisting of C and N; and wherein $R^F$, $R^G$, R, and R' are each independently a hydrogen or a substituent selected from the group consisting of the General Substituents as defined herein.

In some of the above embodiments, any carbon ring atoms up to maximum of a total number of three, together with their substituents, in each phenyl ring of any of above structures can be replaced with N.

In some embodiments of the OLED, the fluorescent compound is selected from the group consisting of:

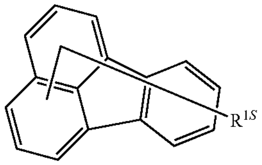

,

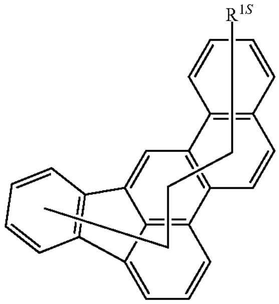

,

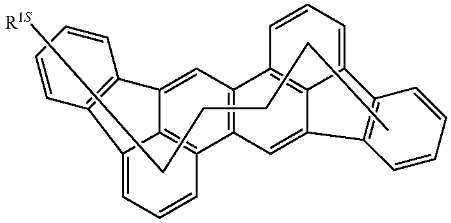

,

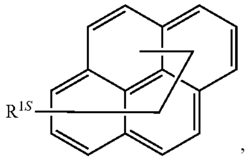

,

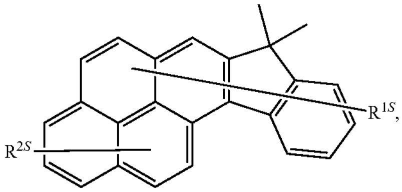

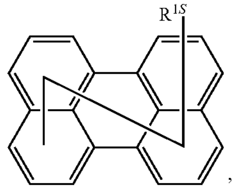

,

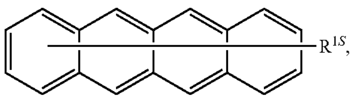

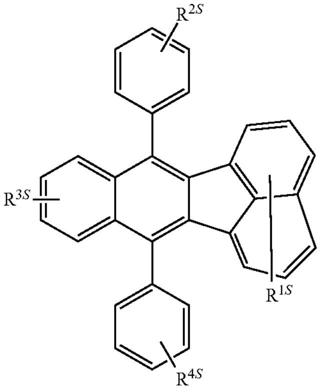

,

-continued
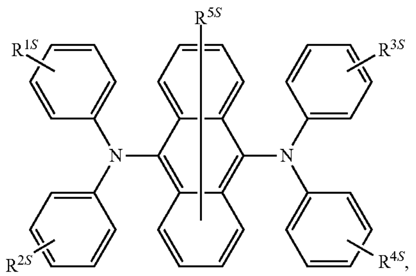
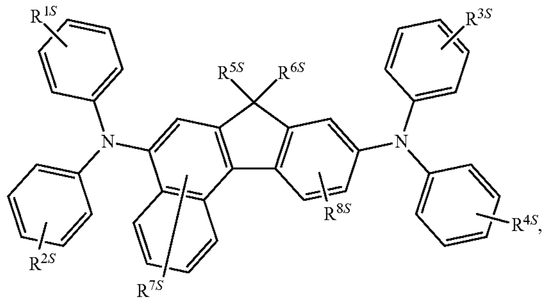
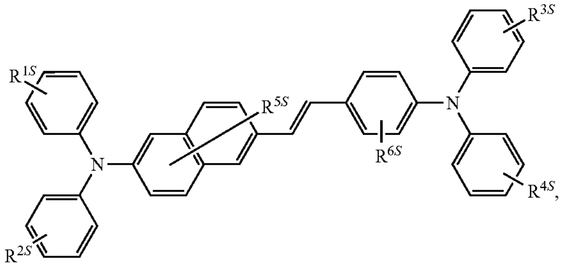
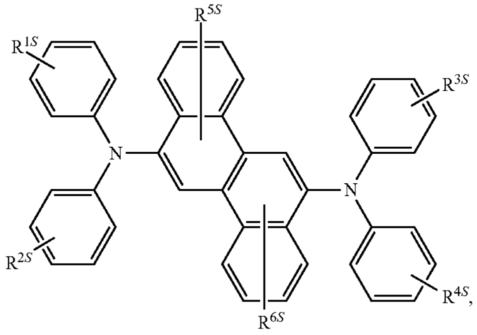
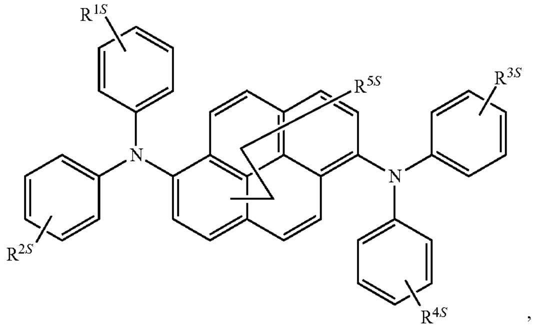
-continued
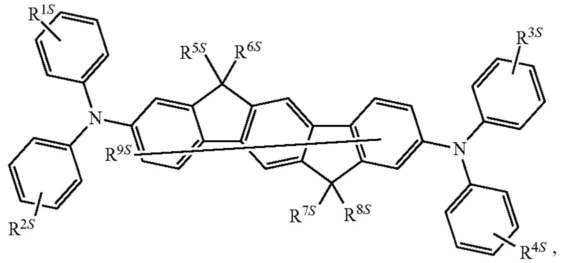
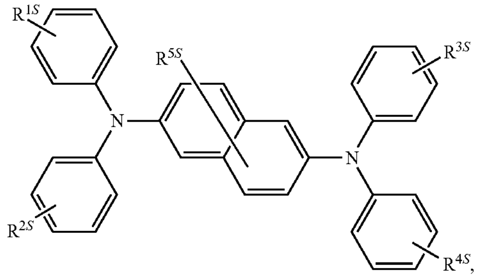
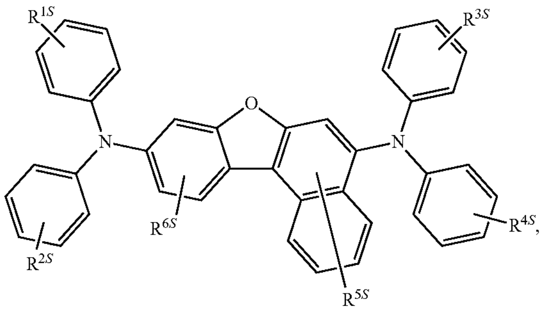
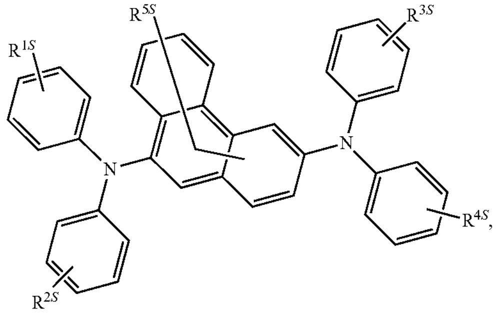
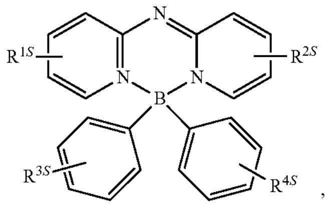
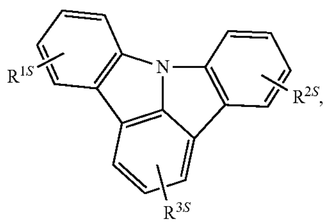

-continued
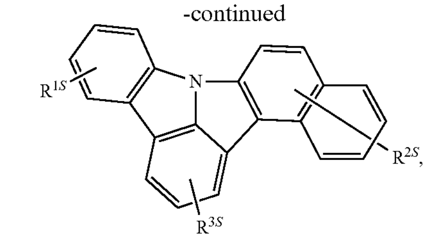
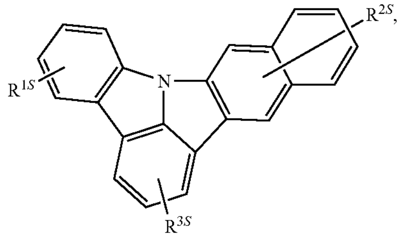
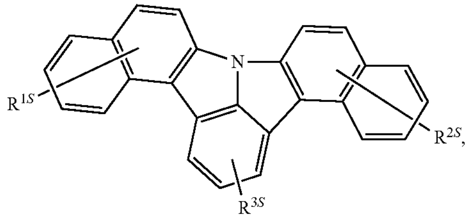
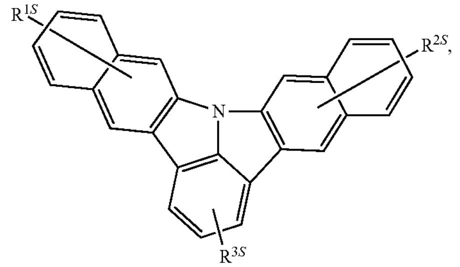
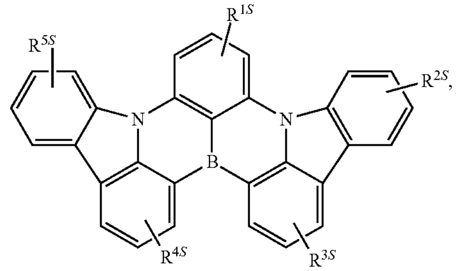
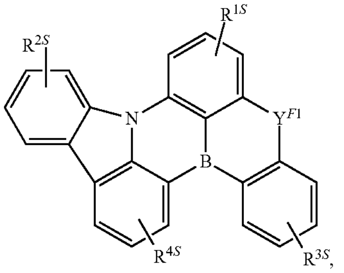
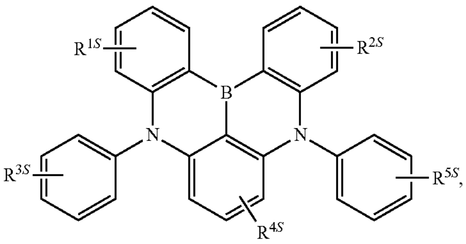
-continued
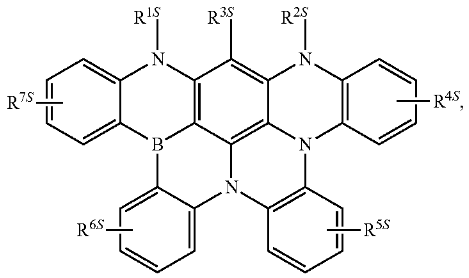
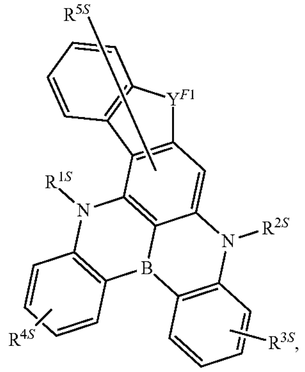
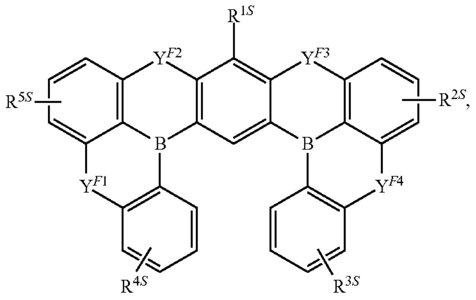
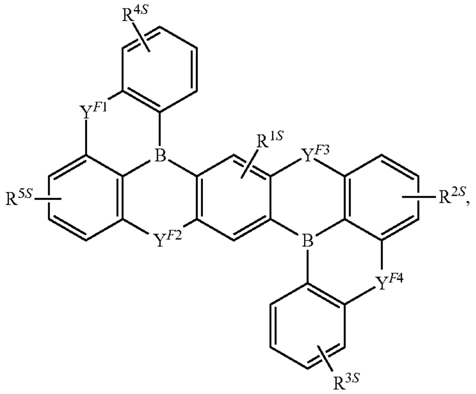
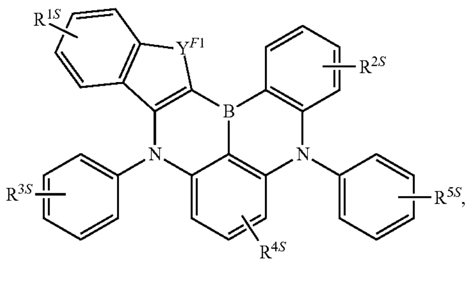

-continued

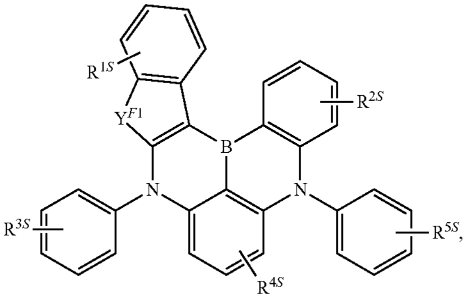

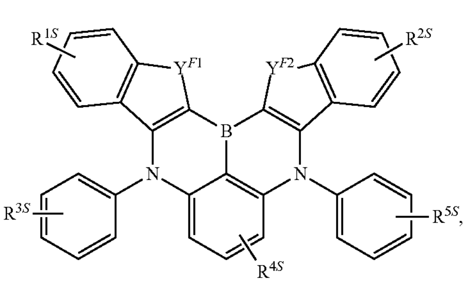

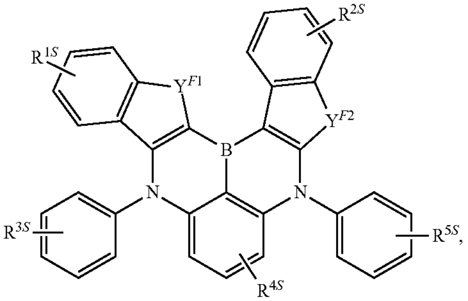

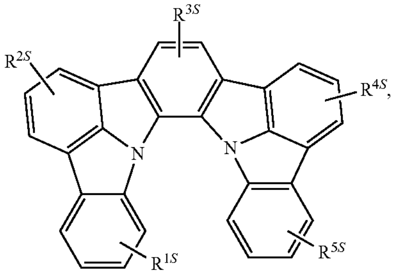

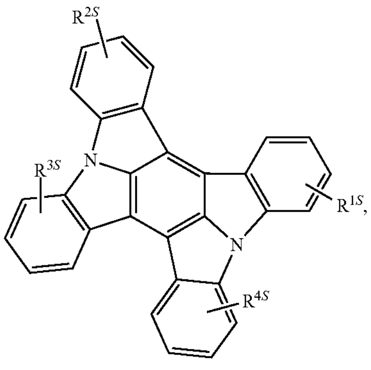

-continued

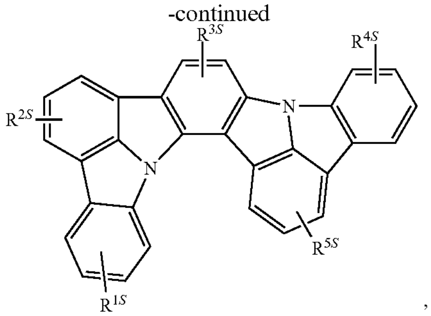

,

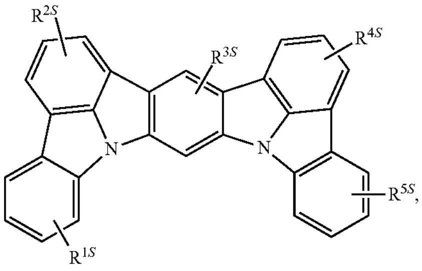

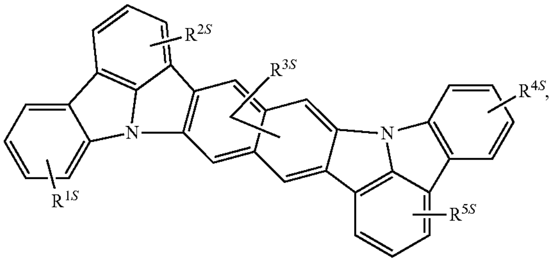

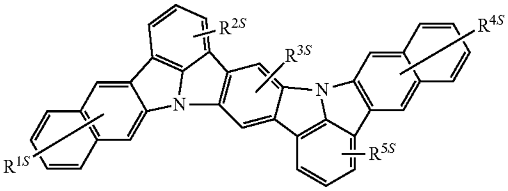

, and

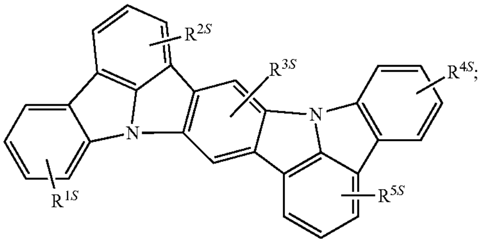

wherein $Y^{F1}$ to $Y^{F4}$ are each independently selected from O, S, and $NR^{F1}$;

wherein $R^{F1}$ and $R^{1S}$ to $R^{9S}$ each independently represents from mono to maximum possible number of substitutions, or no substitution; and wherein $R^{F1}$ and $R^{1S}$ to $R^{9S}$ are each independently a hydrogen or a substituent selected from the group consisting of the general substituents as defined herein.

In some embodiments, the acceptor compound is selected from the group consisting of the structures of the following ACCEPTOR LIST:

-continued
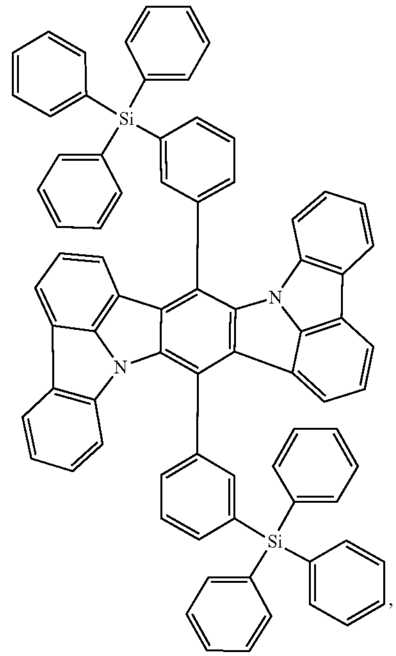
,
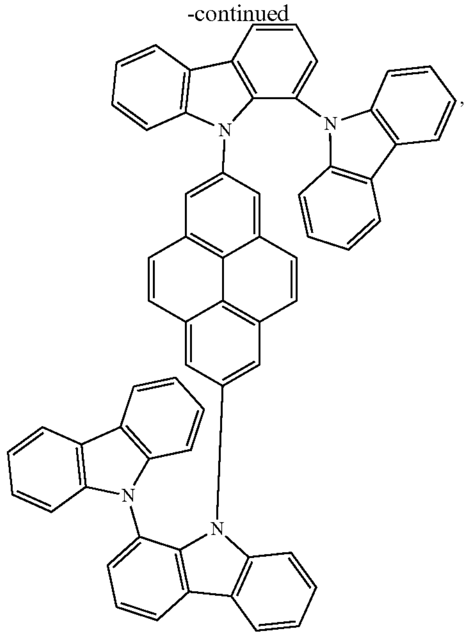
,
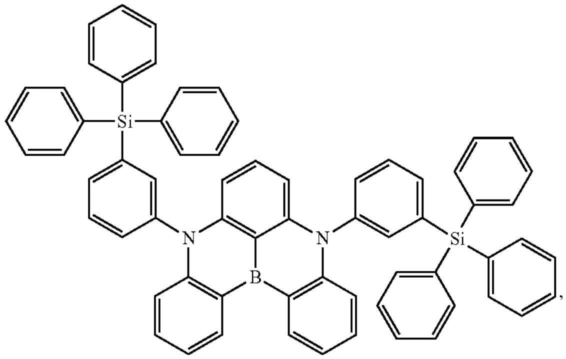
,
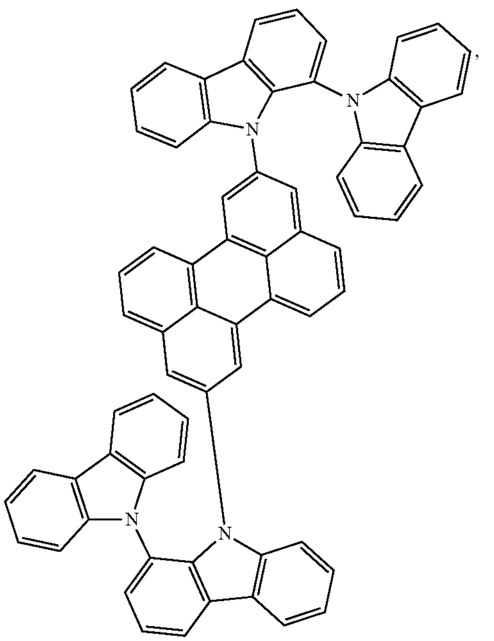
,
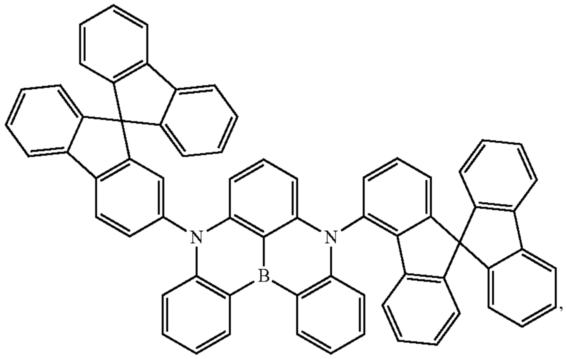
, -continued
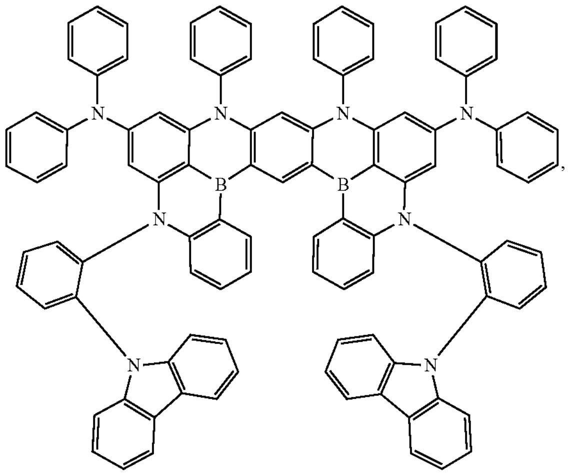
,
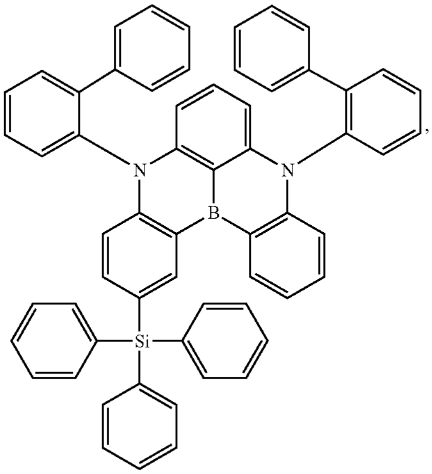
,
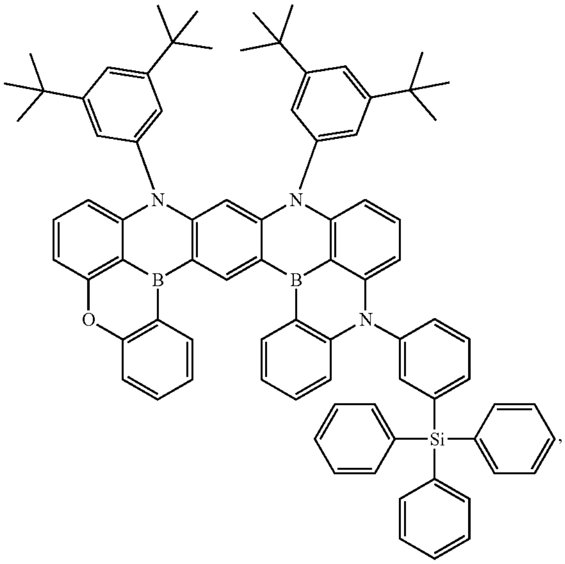
,
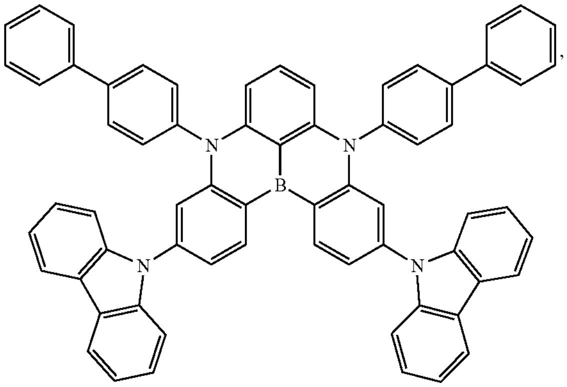
,
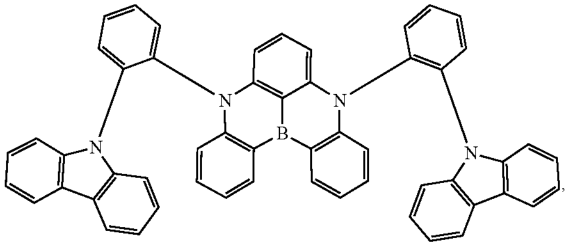
,
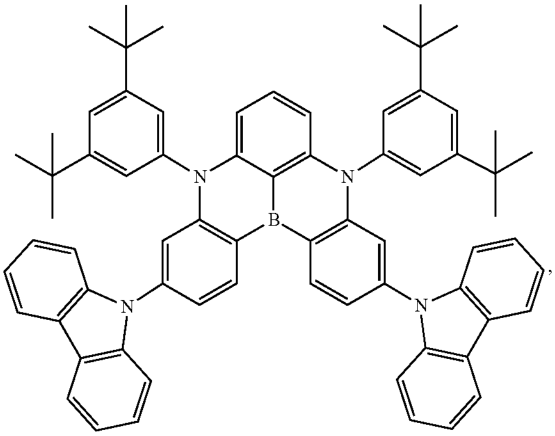
, -continued
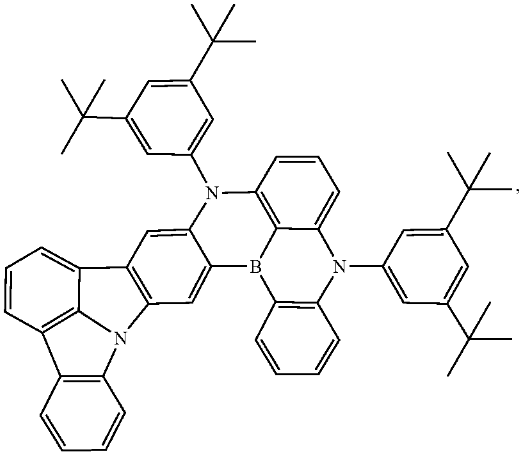
,
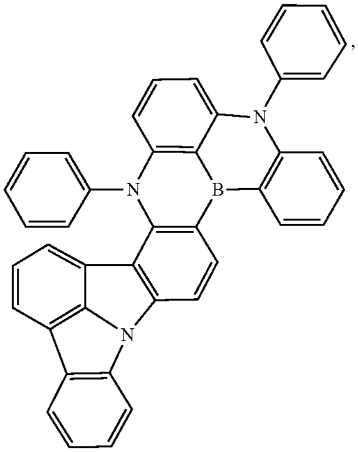
,
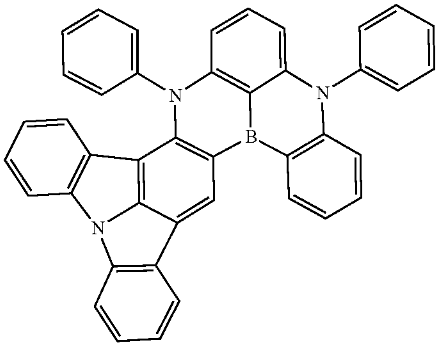
,
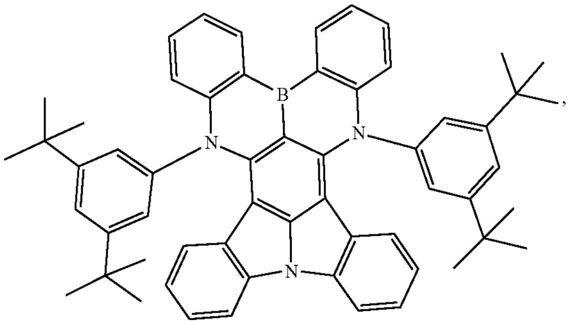
,
-continued
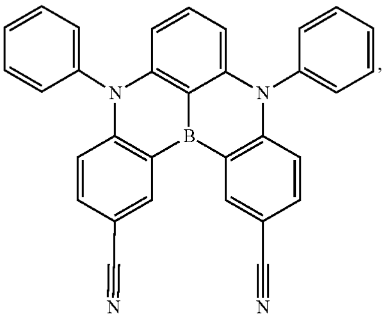
,
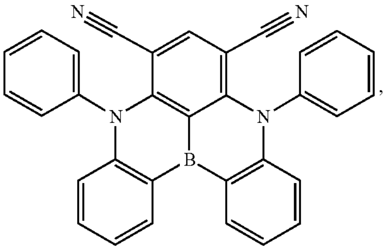
,
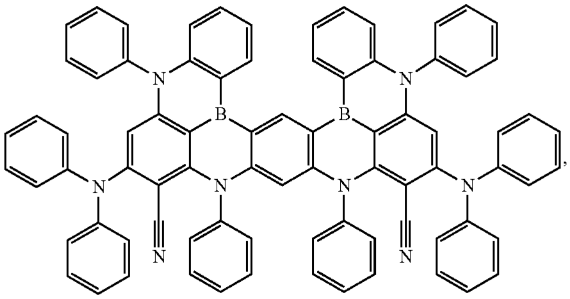
,
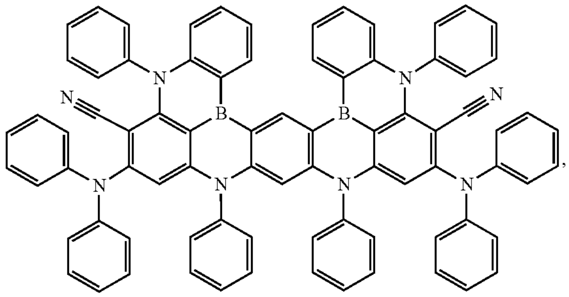
,
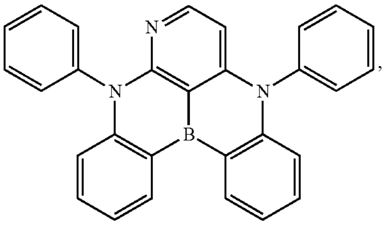
,
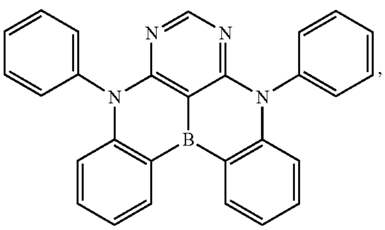
, -continued
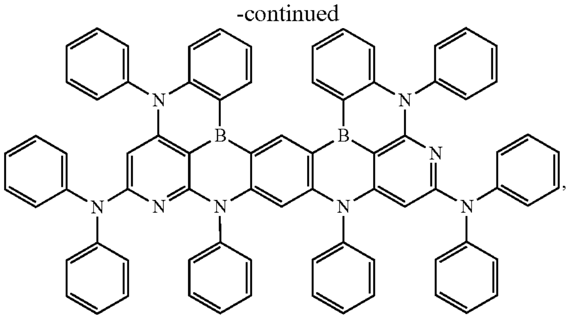
,
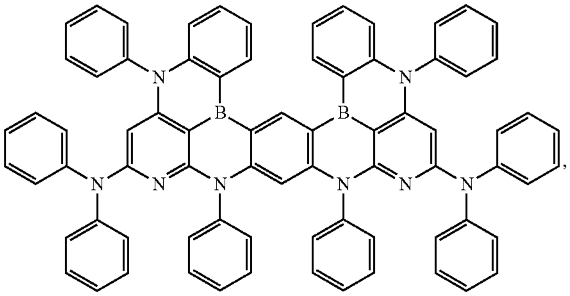
,
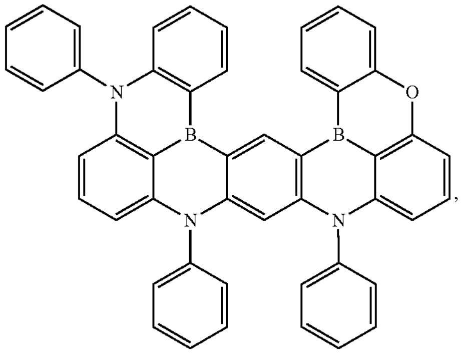
,
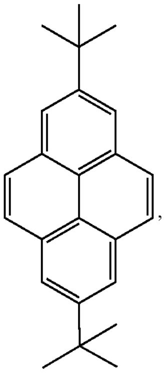
,
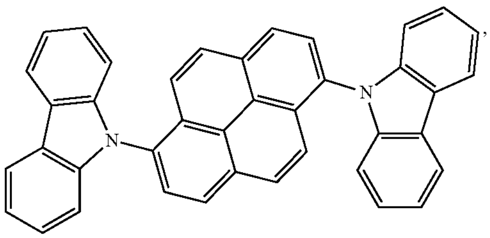
,
-continued
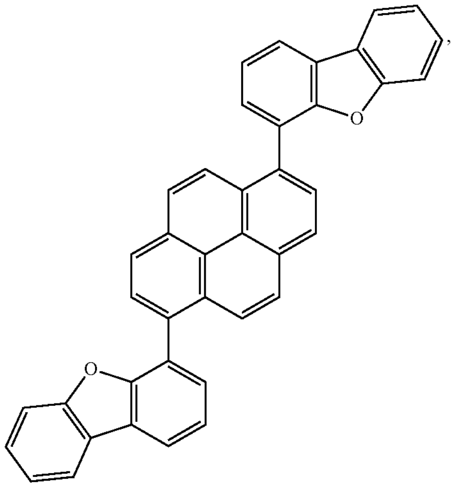
,
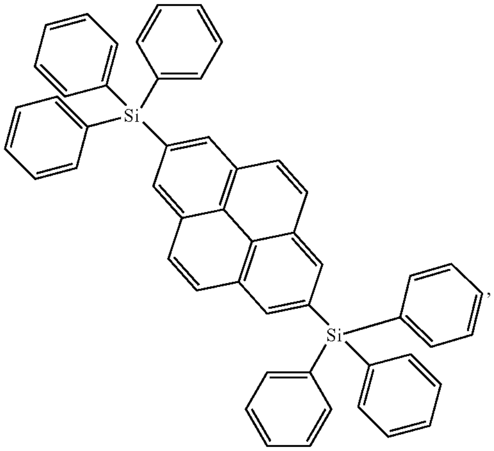
,
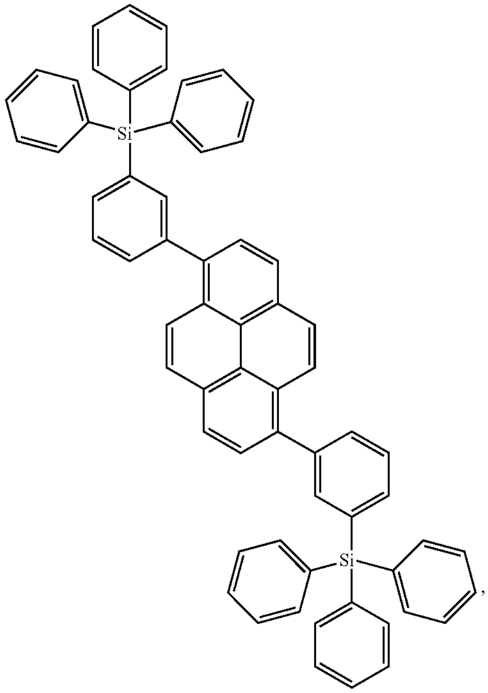
, -continued
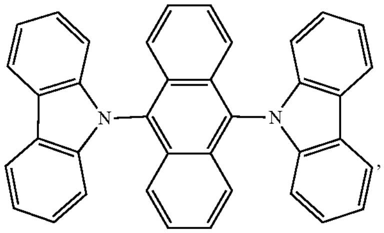
,
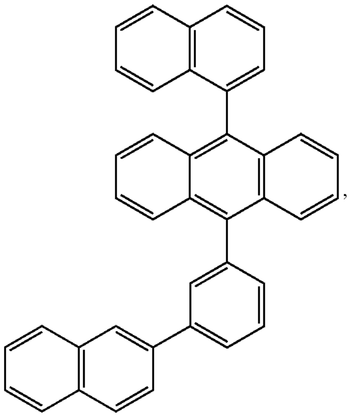
,
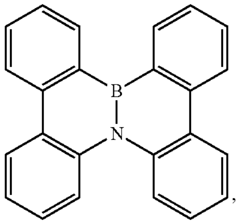
,
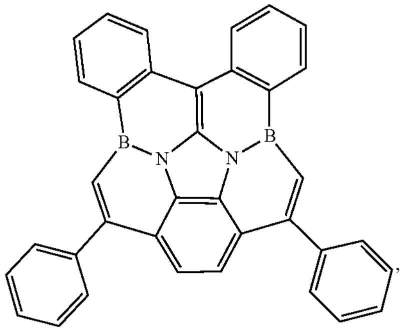
,
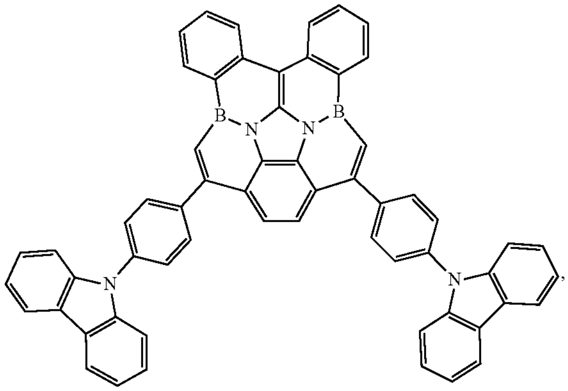
,
-continued
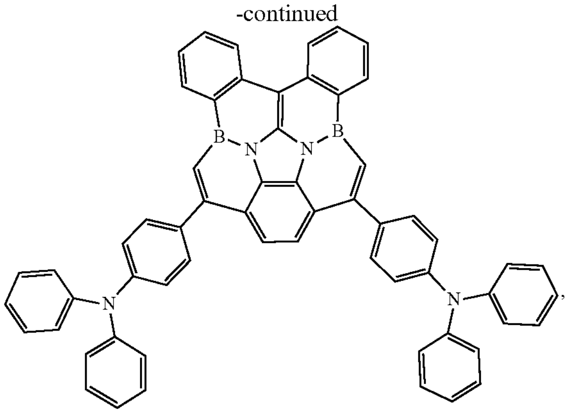
,
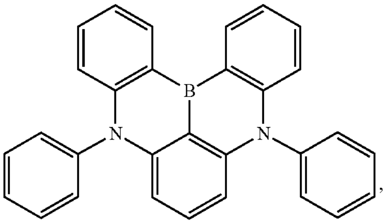
,
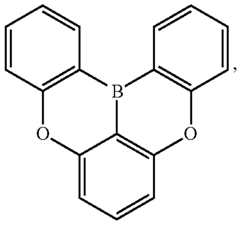
,
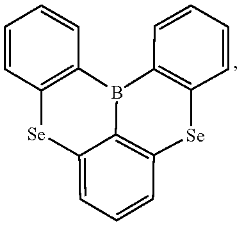
,
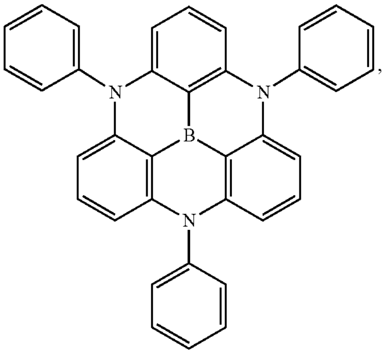
,
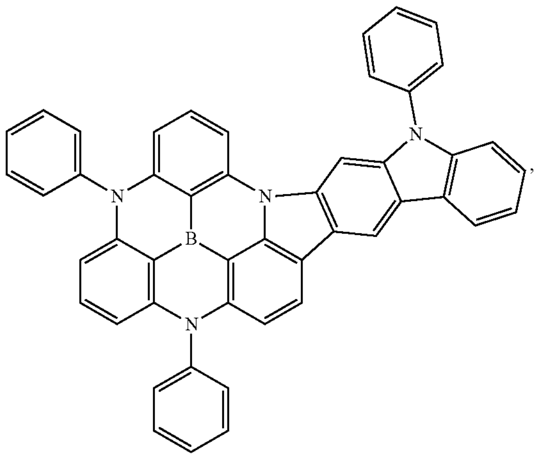
, -continued
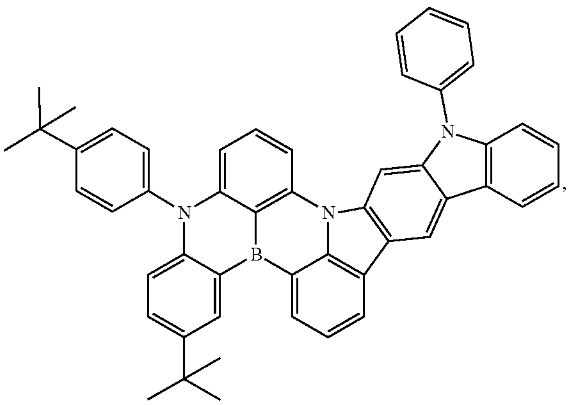
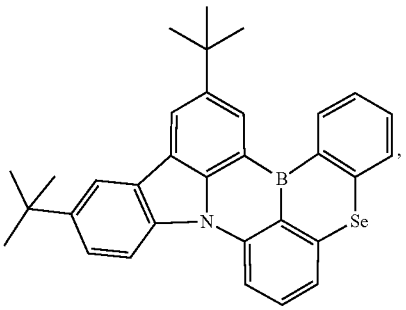
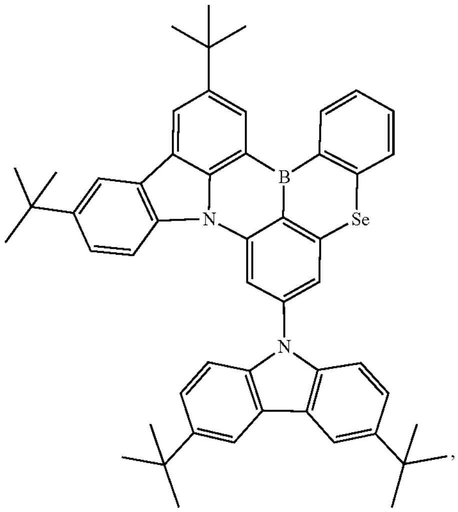
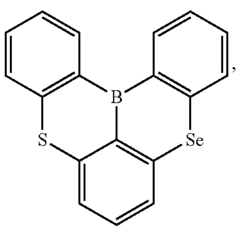
-continued
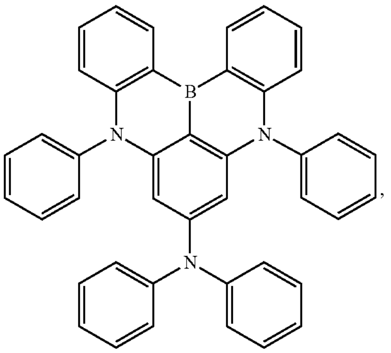
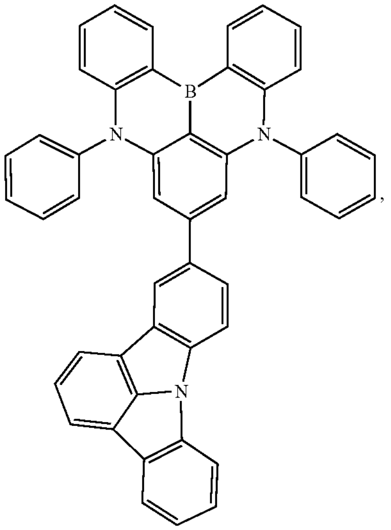
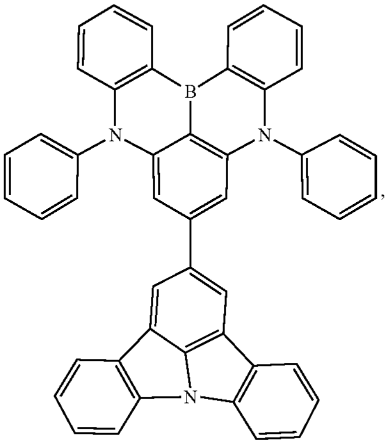

-continued
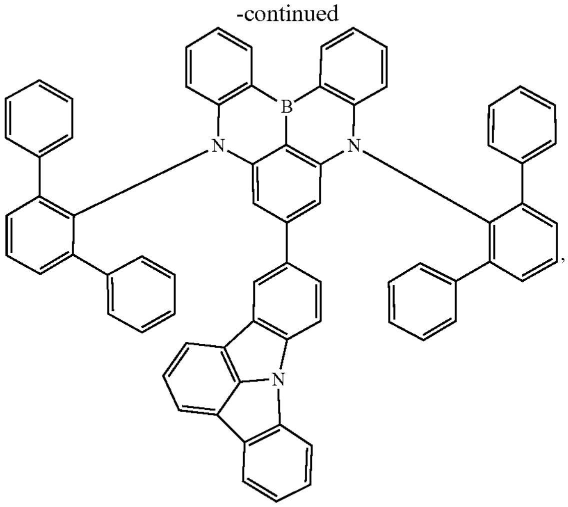
,
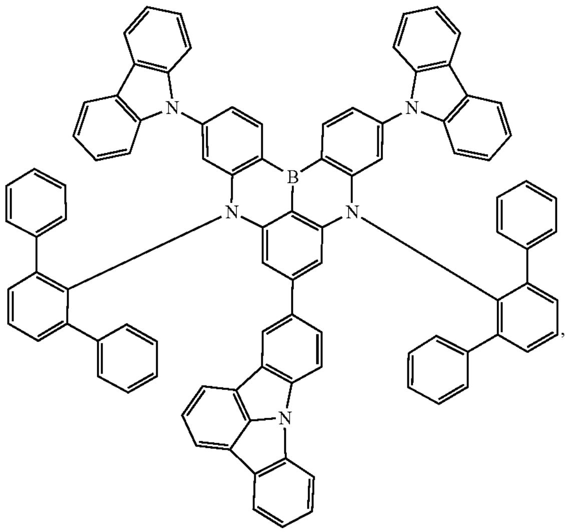
,
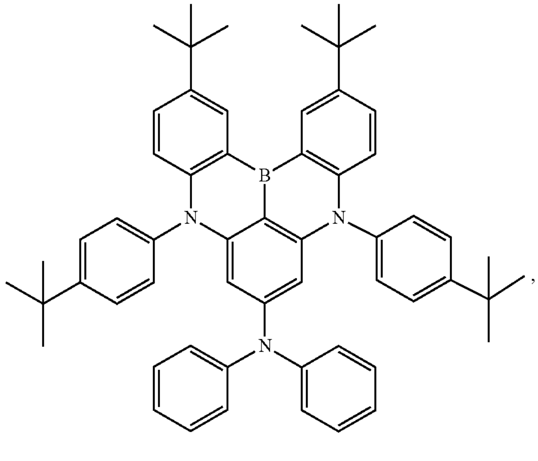
,
-continued
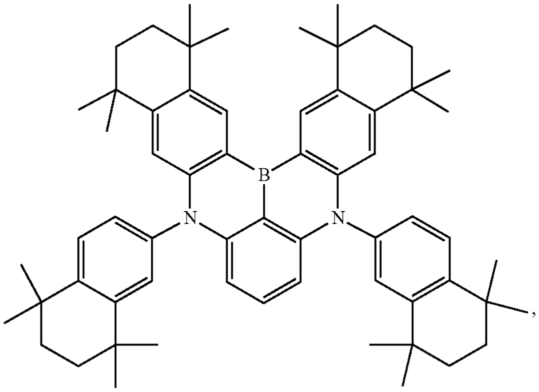
,
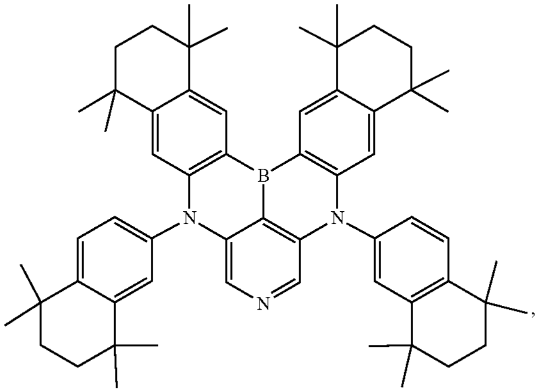
,
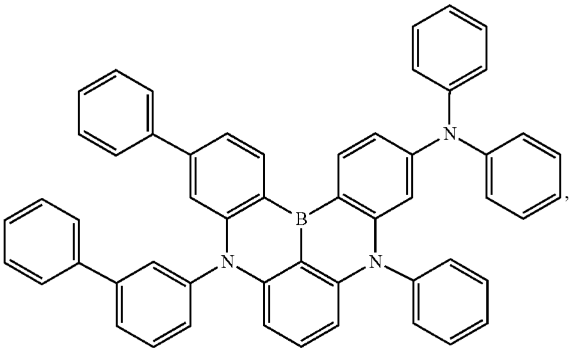
,
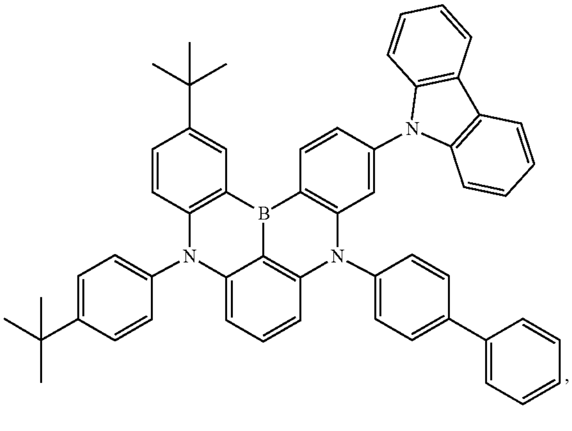
, -continued
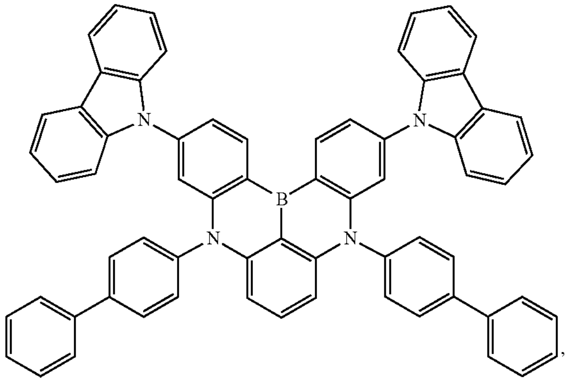
,
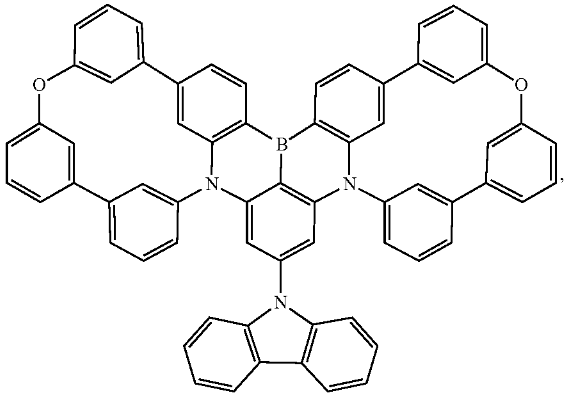
,
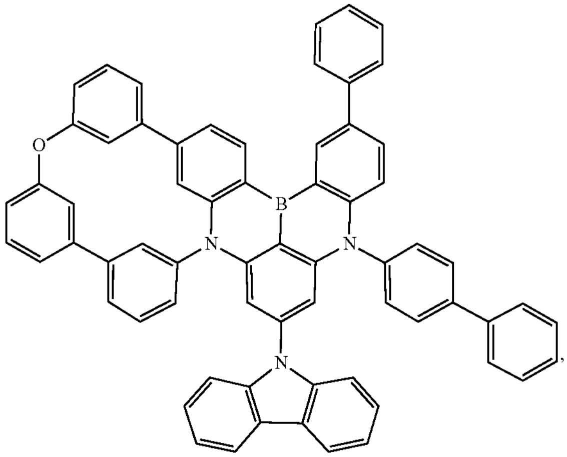
,
-continued
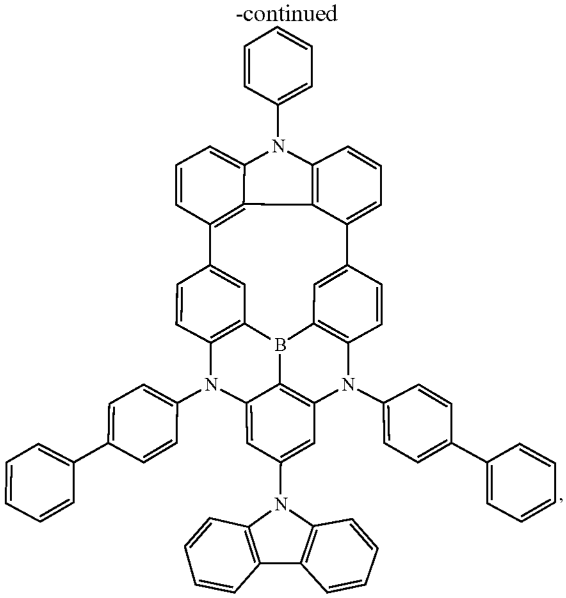
,
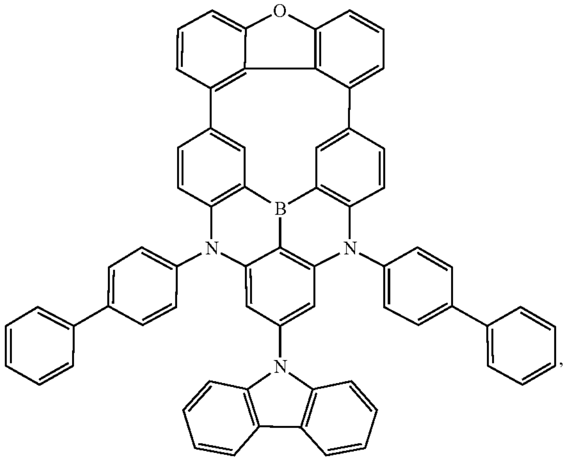
,
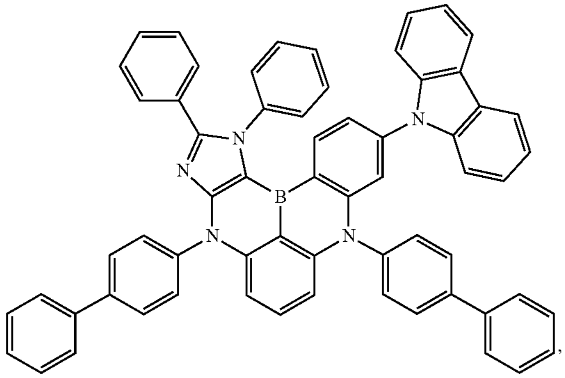
, -continued
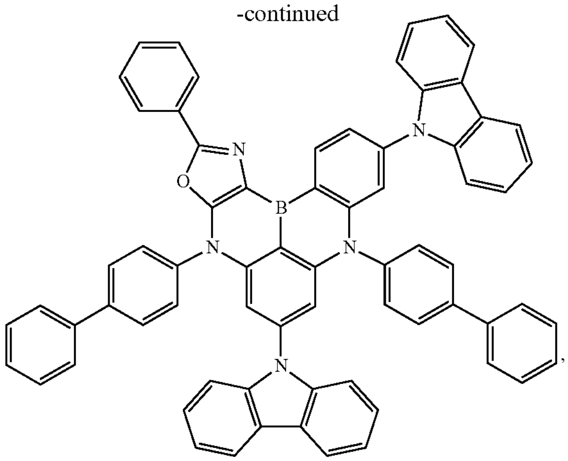
,
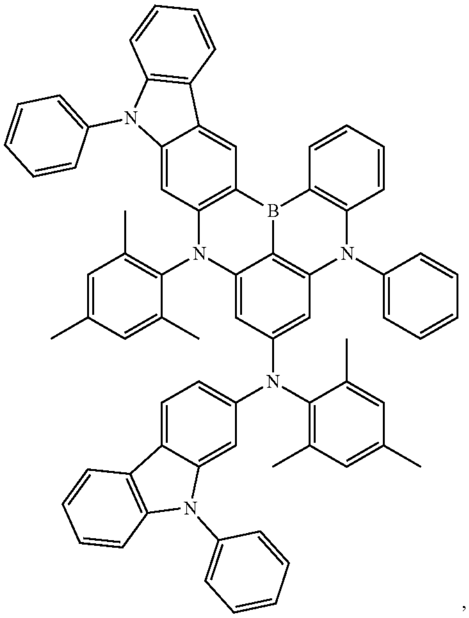
,
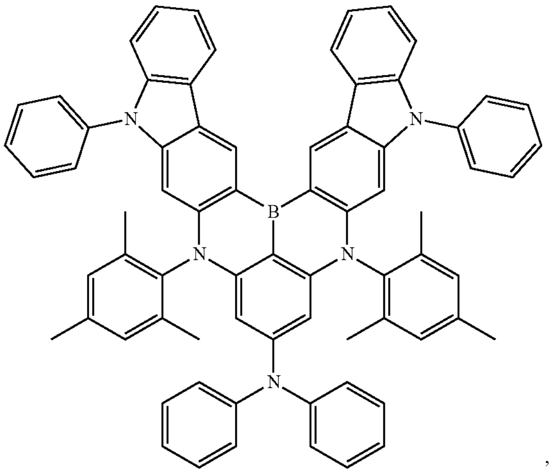
,
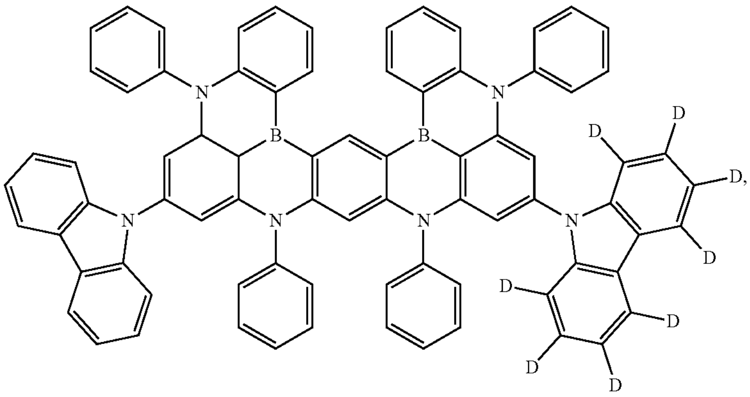
, -continued
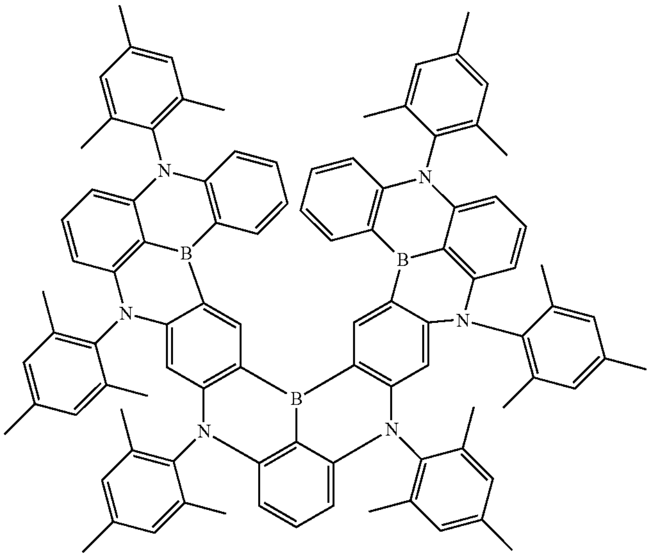
,
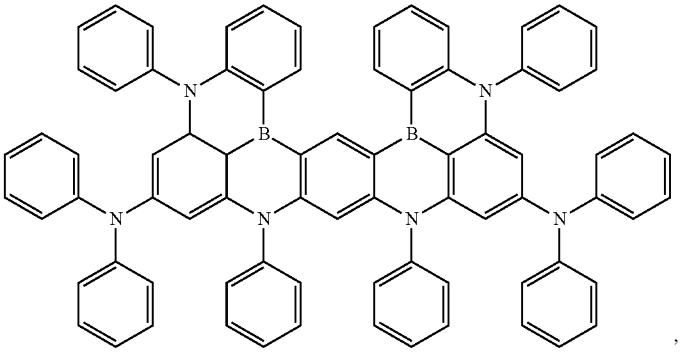
,
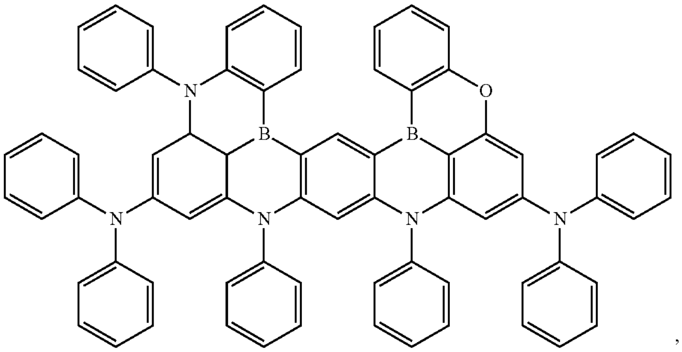
,
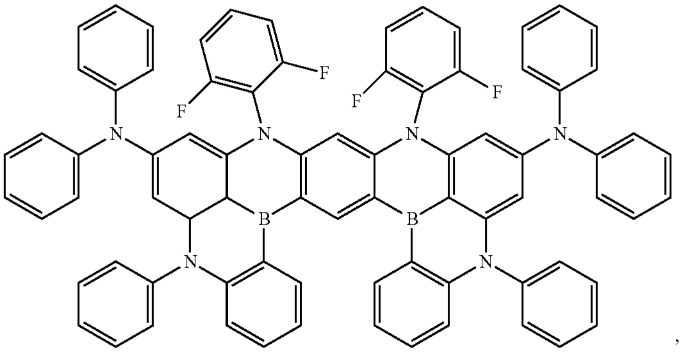
, -continued
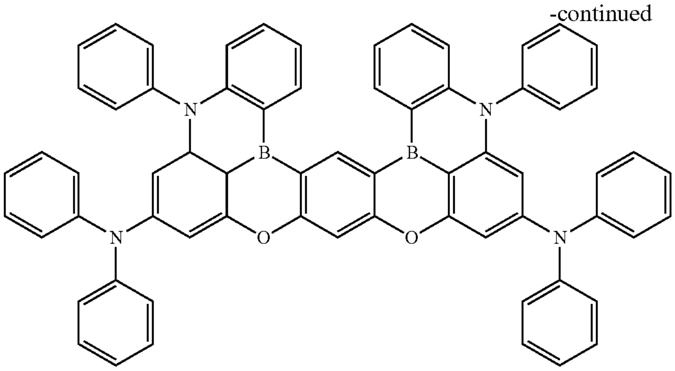
,
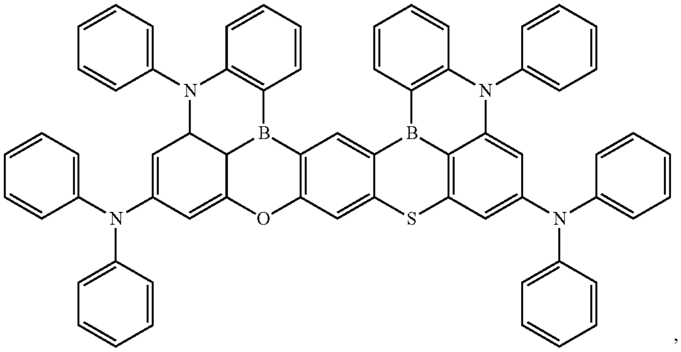
,
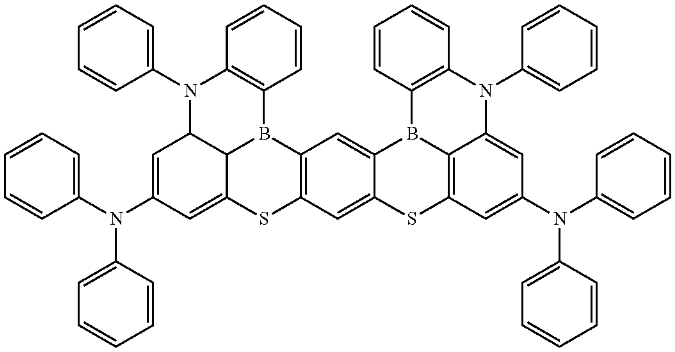
,
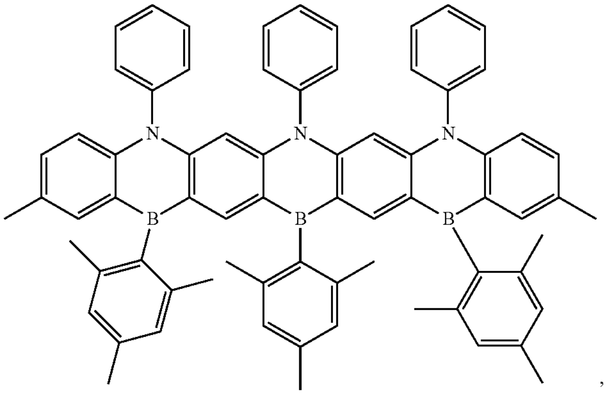
, -continued
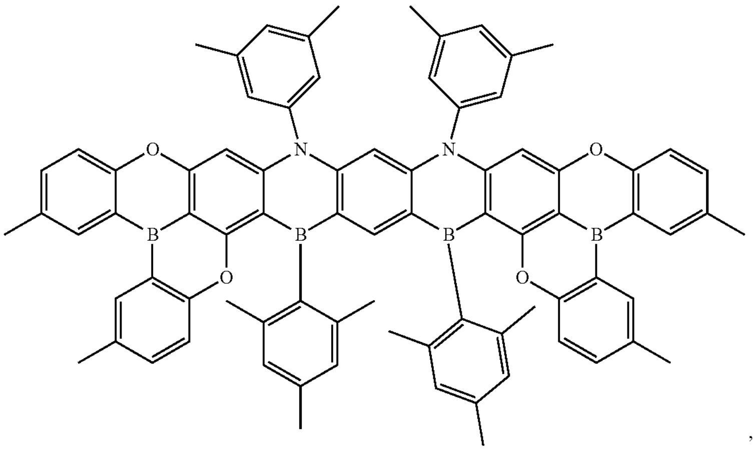
,
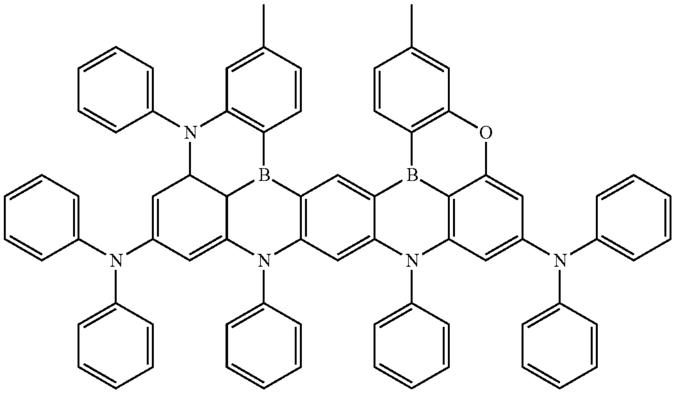
,
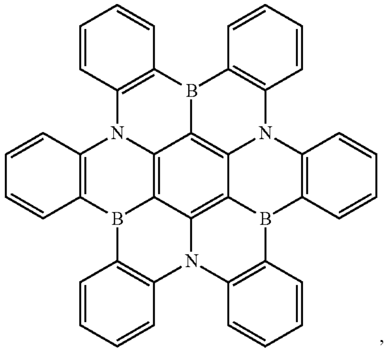
,
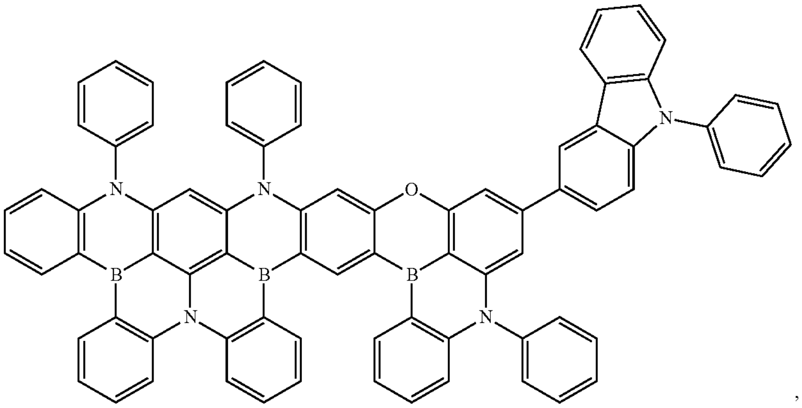
,
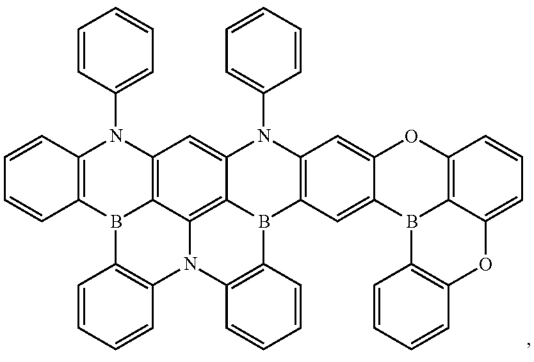
,
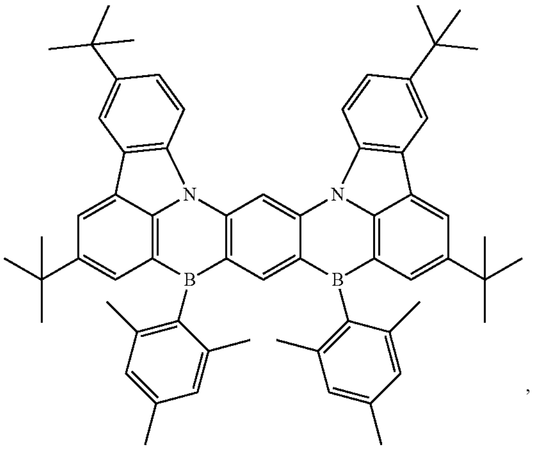
, -continued
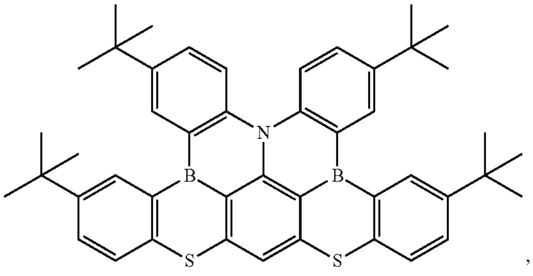
,
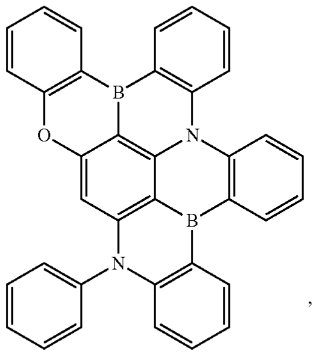
,
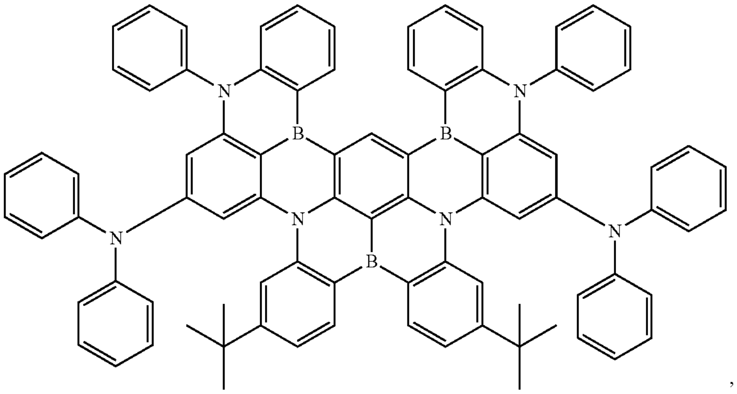
,
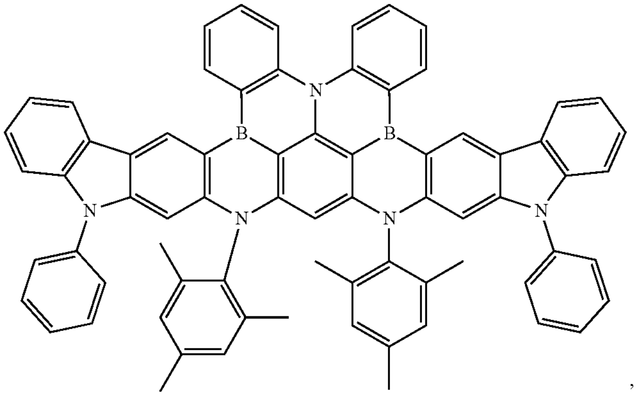
,
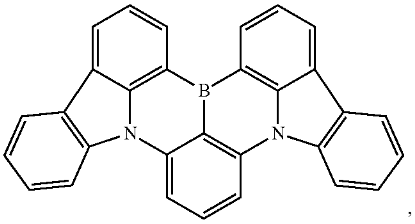
,
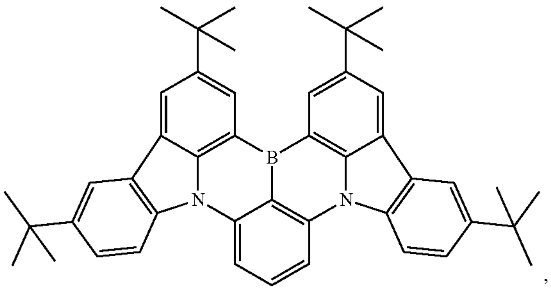
,
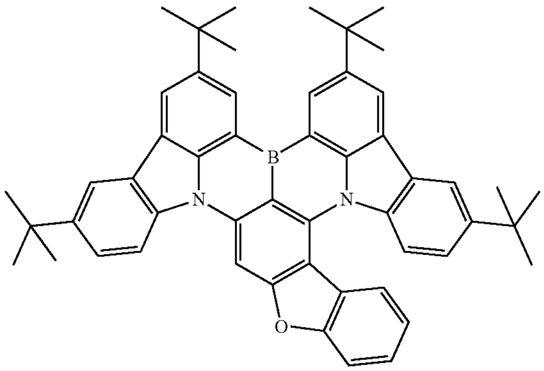
, -continued
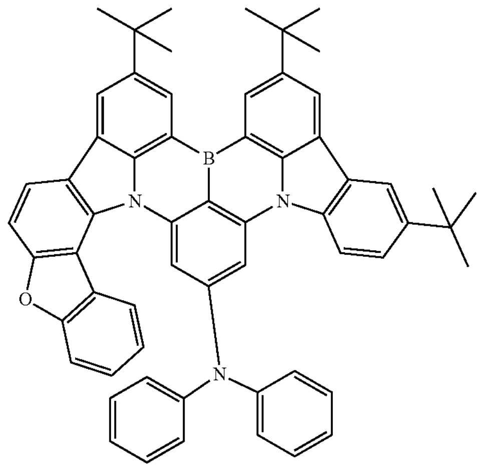
,
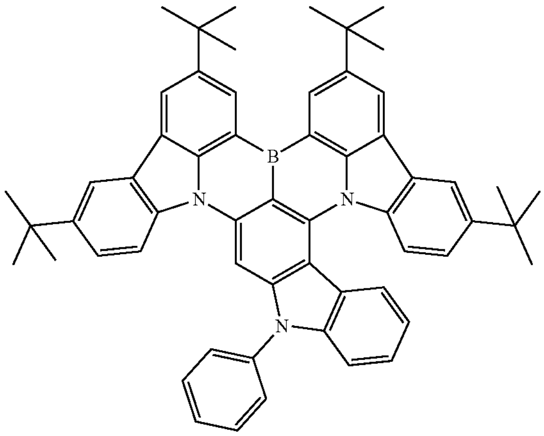
,
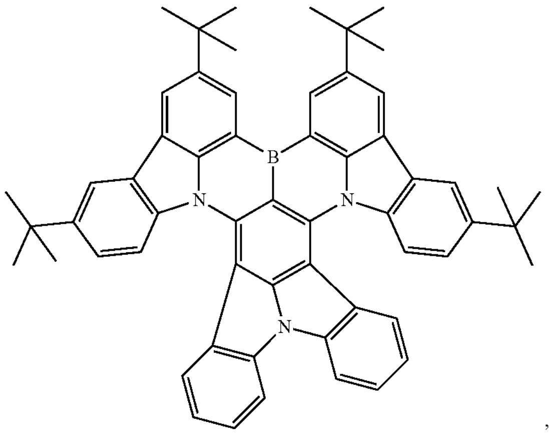
,
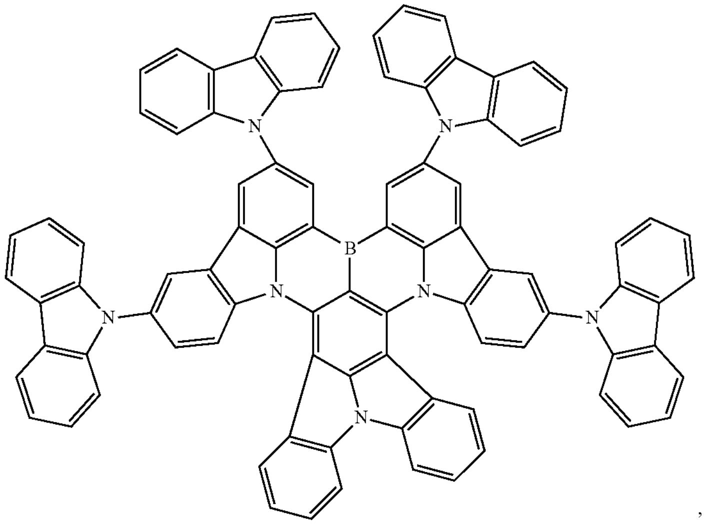
, -continued
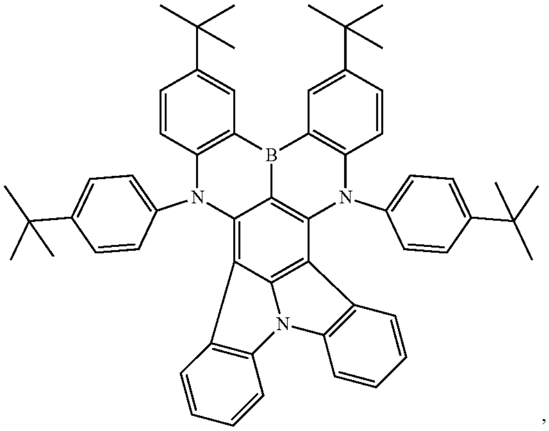
,
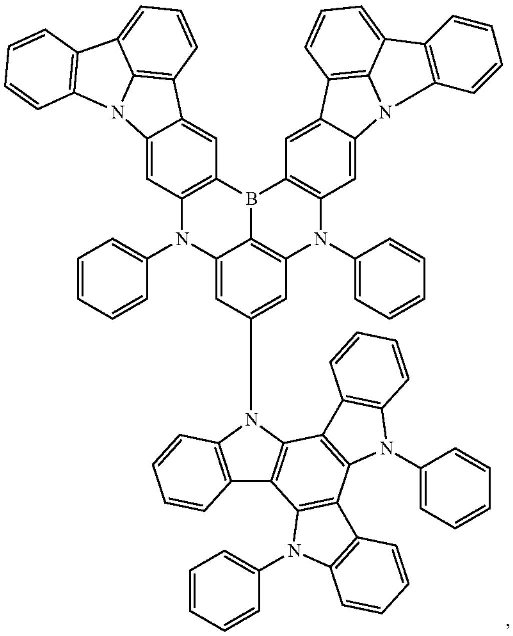
,
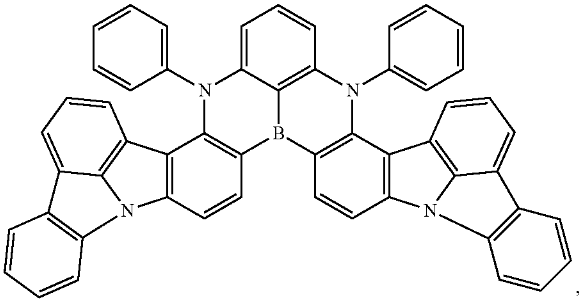
,
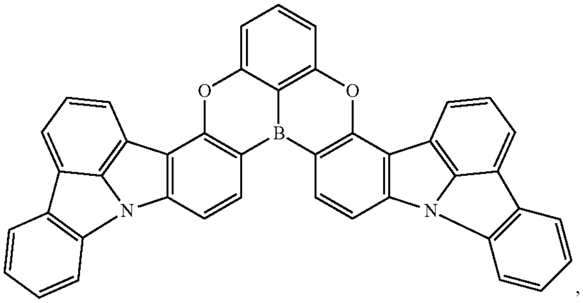
,
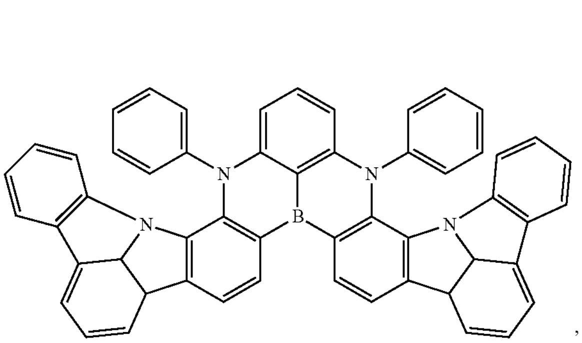
,
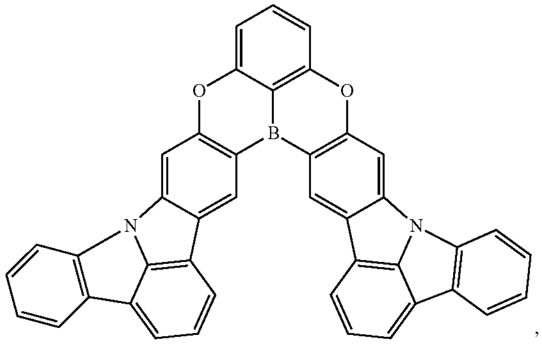
, -continued
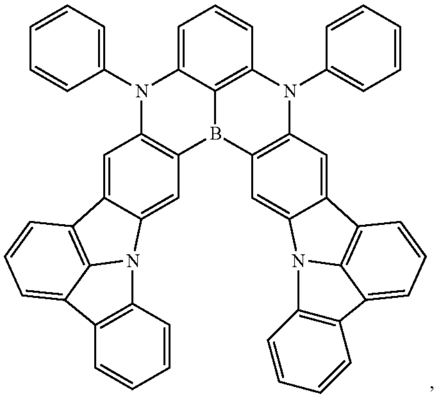
,
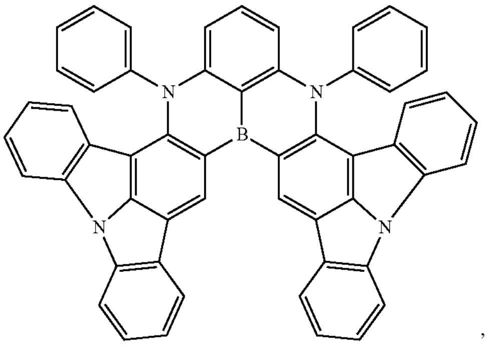
,
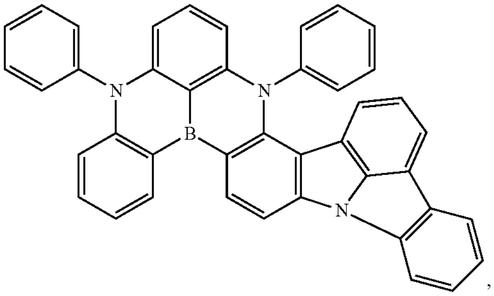
,
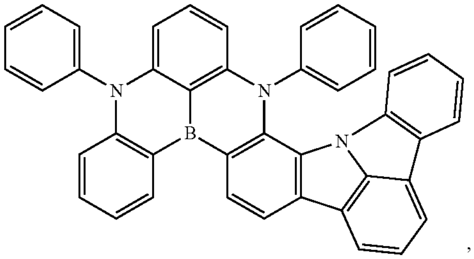
,
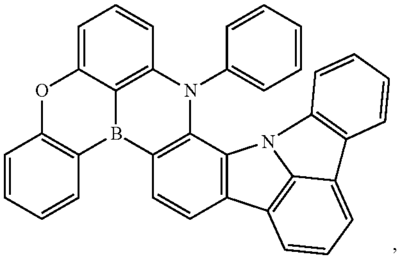
,
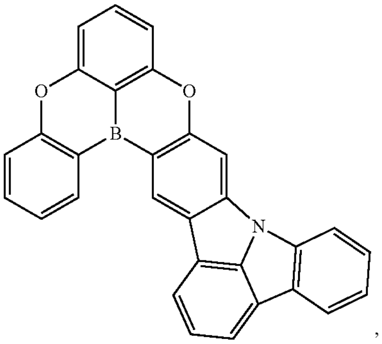
,
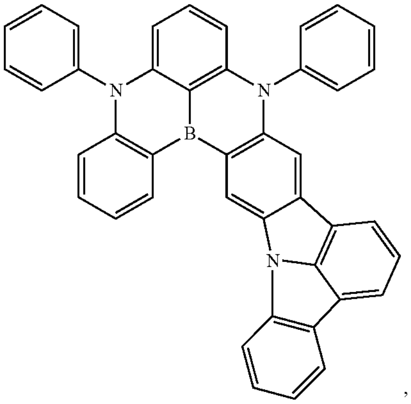
,
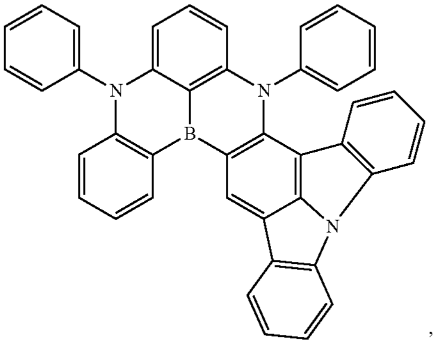
, -continued
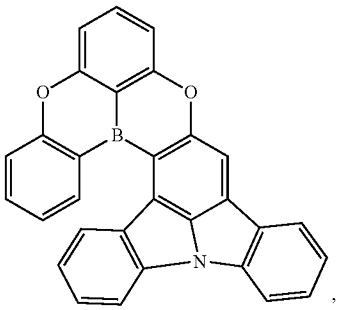
,
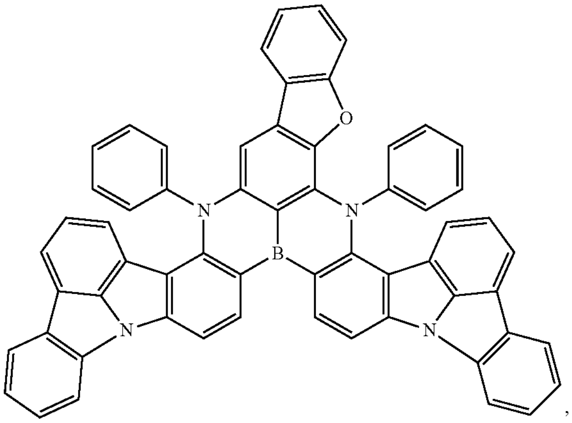
,
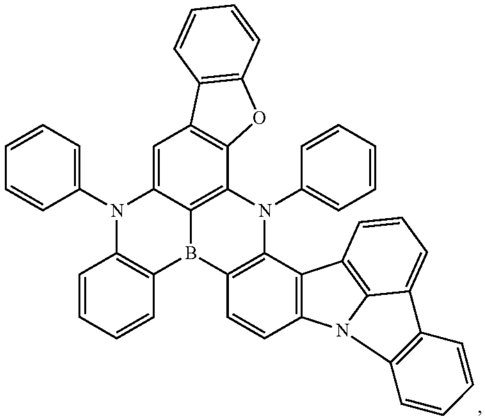
,
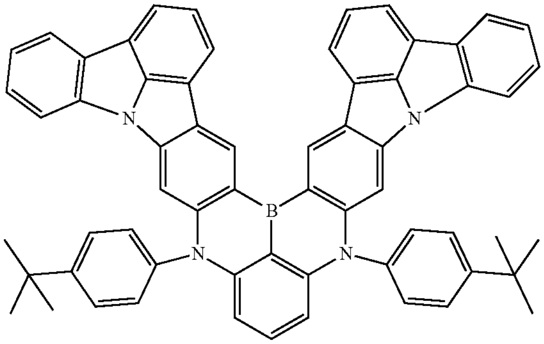
,
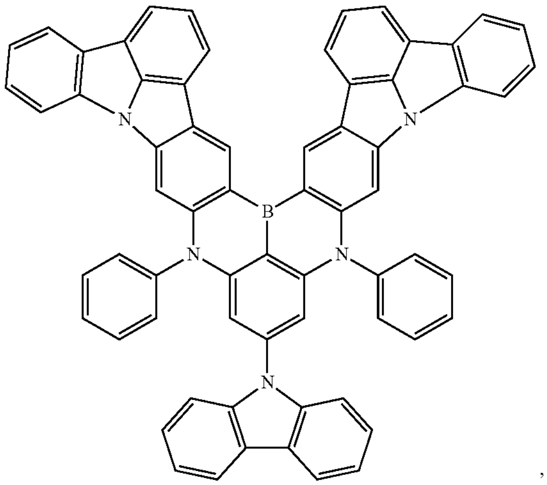
,
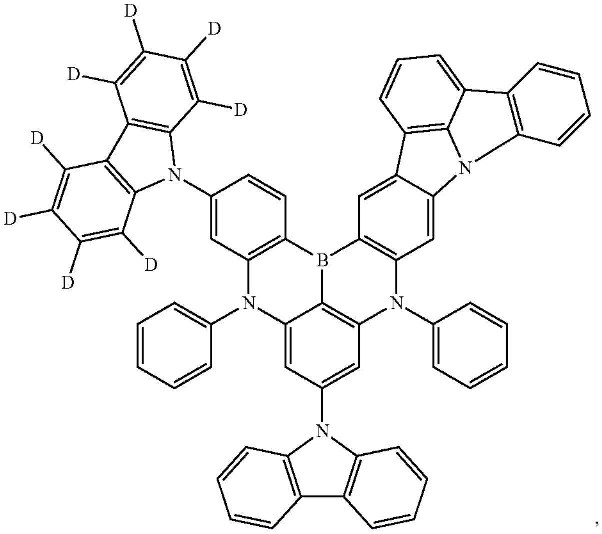
, -continued
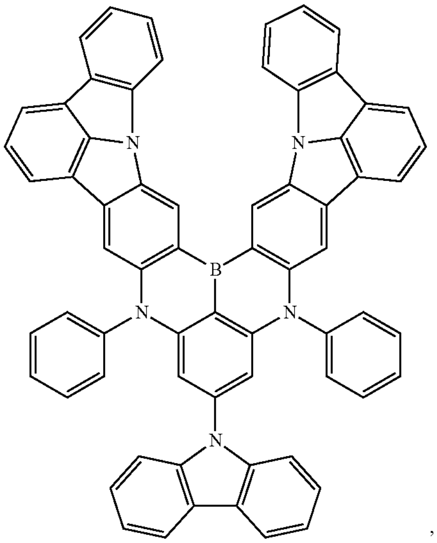
,
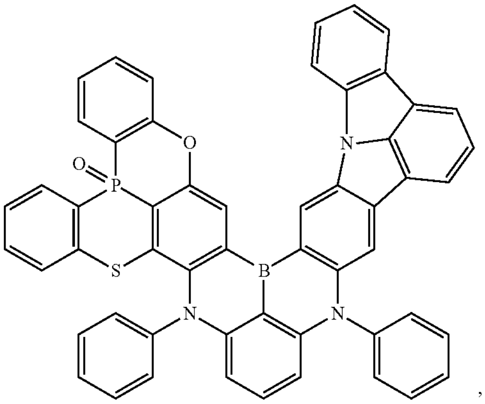
,
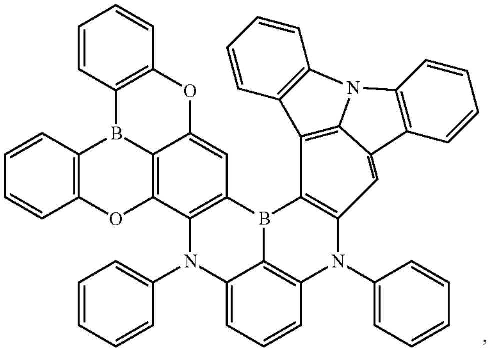
,
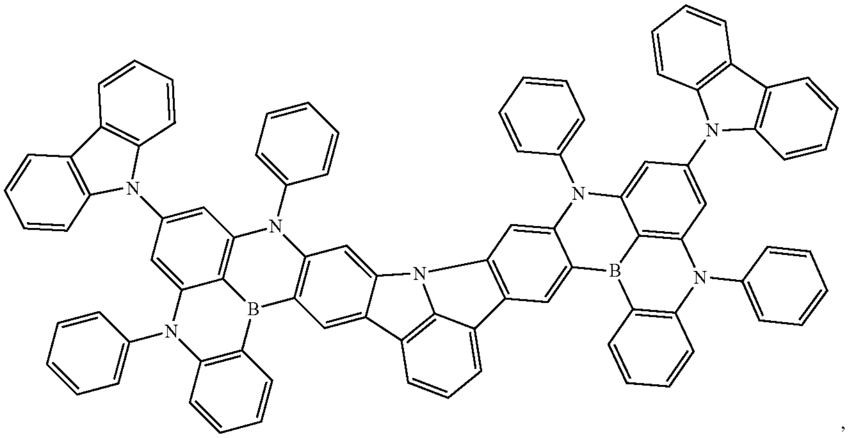
,
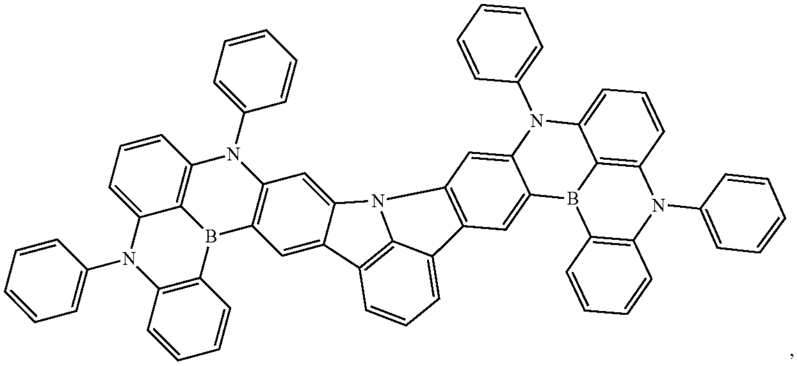
, -continued
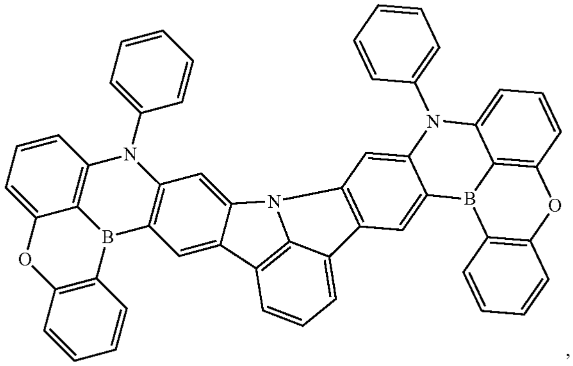
,
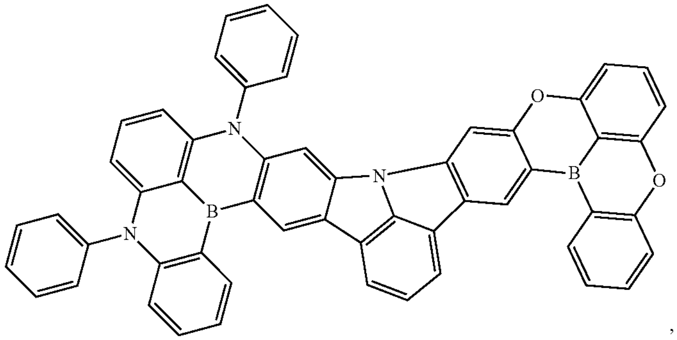
,
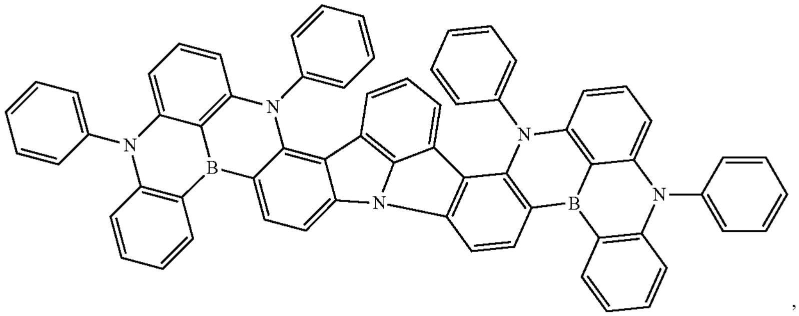
,
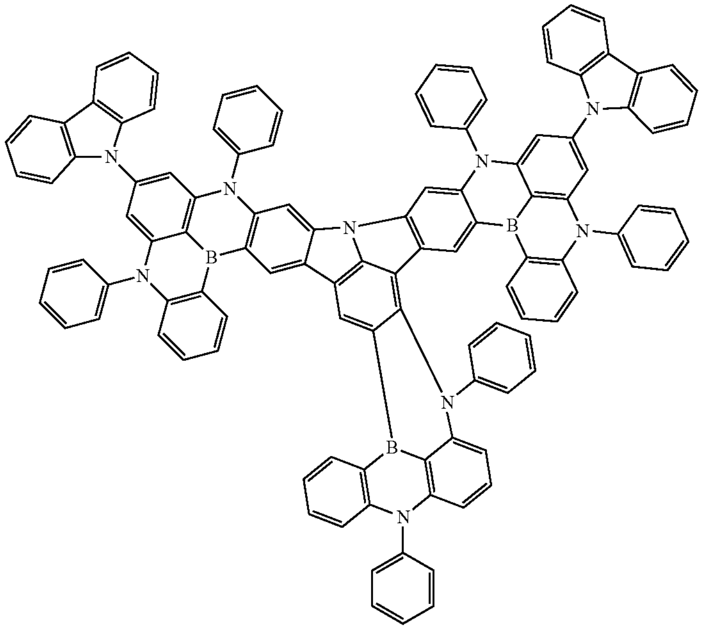
, -continued
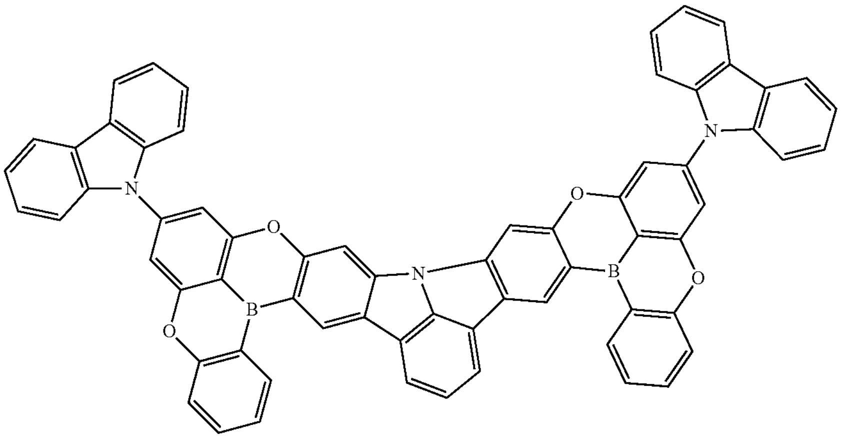
,
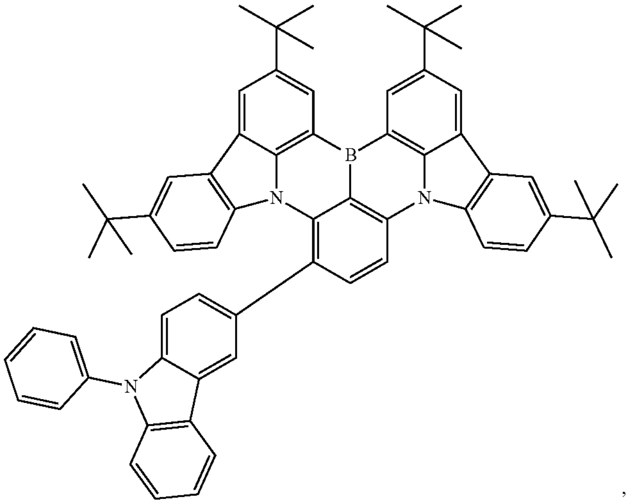
,
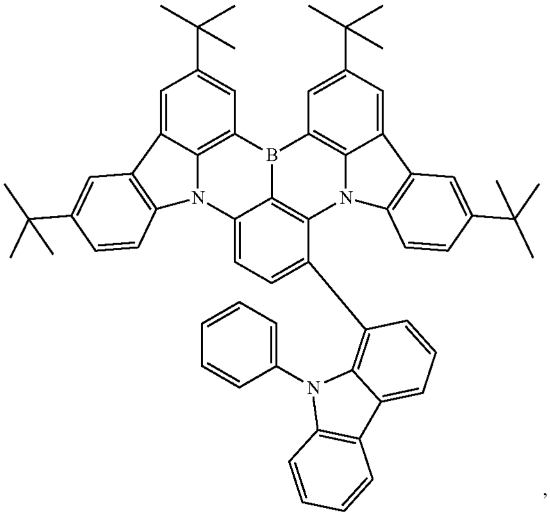
,
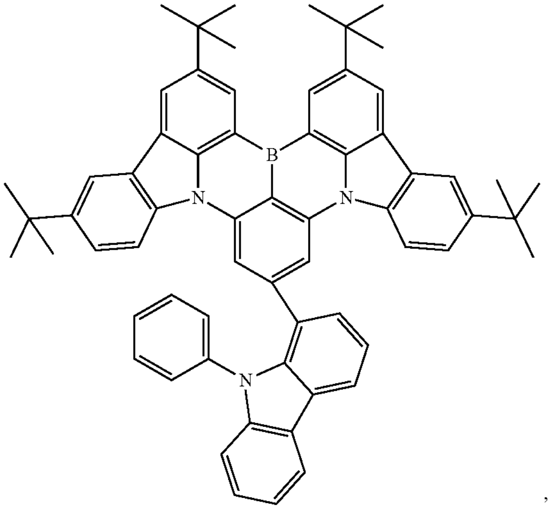
,
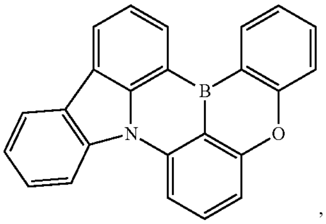
, -continued
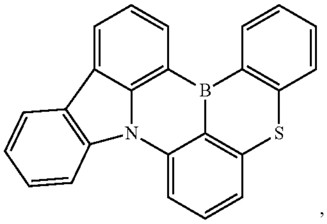
,
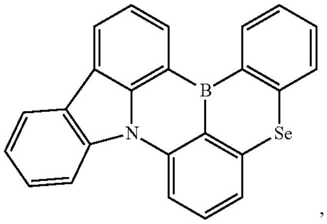
,
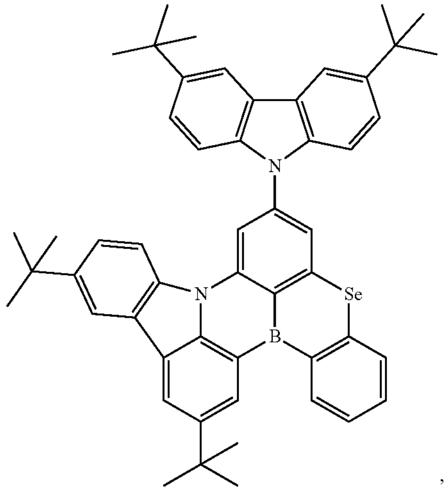
,
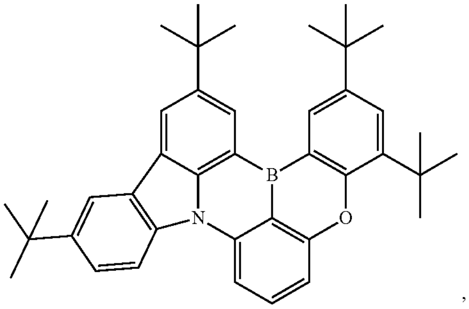
,
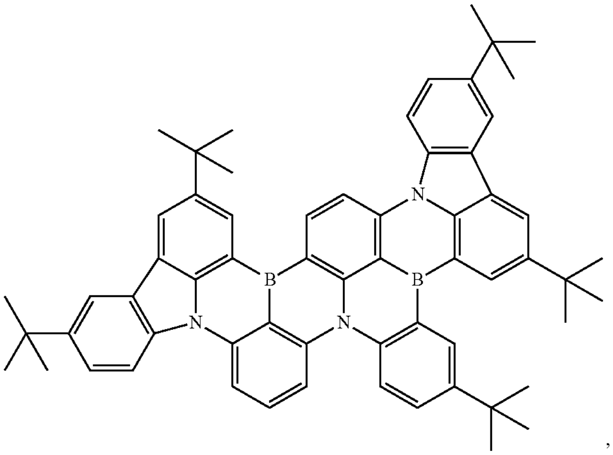
,
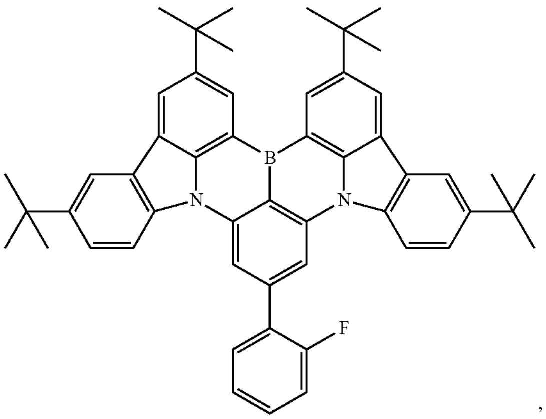
, -continued
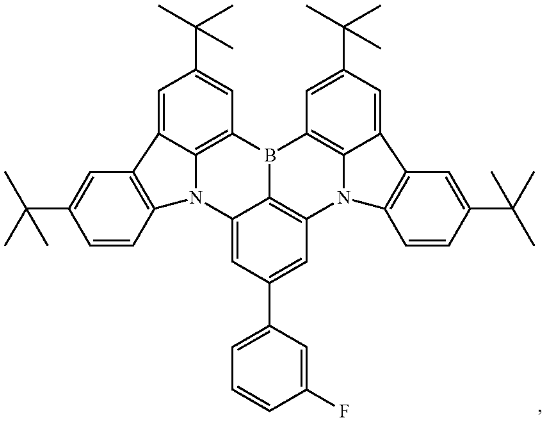
,
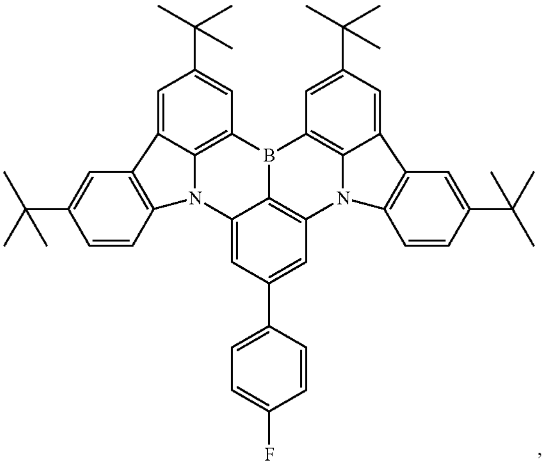
,
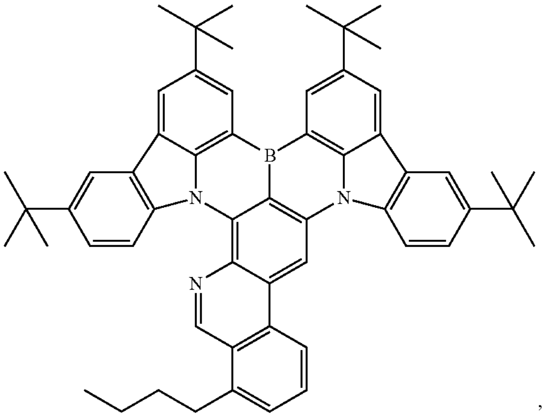
,
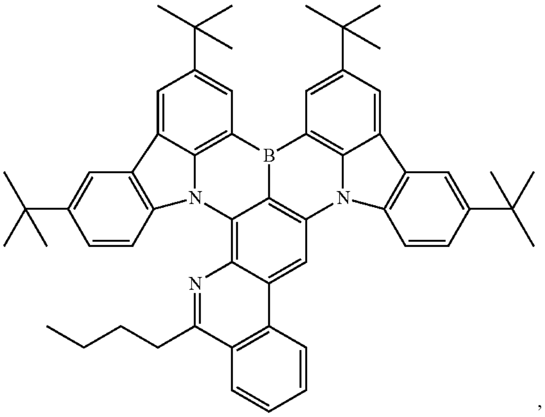
,
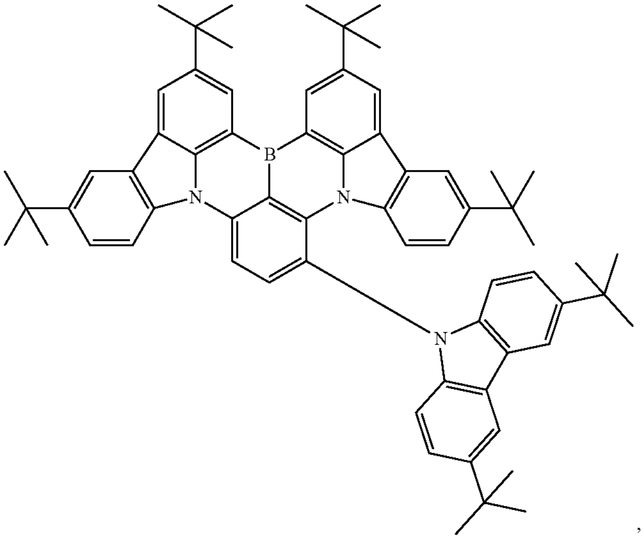
, -continued
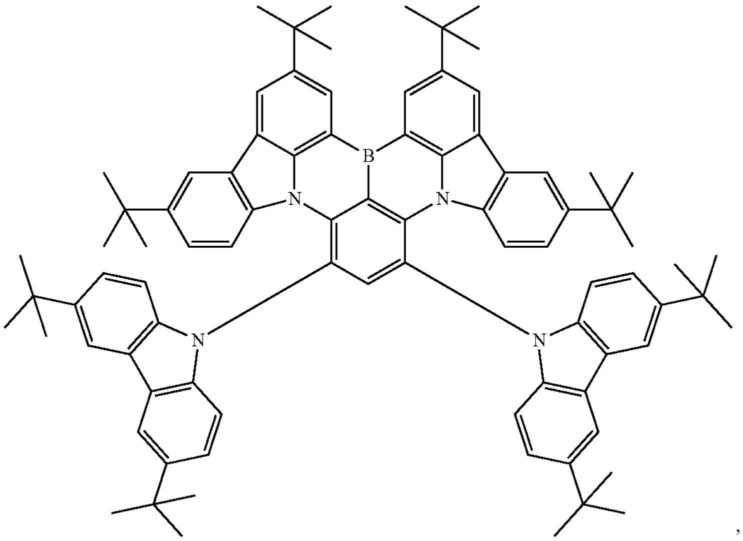
,
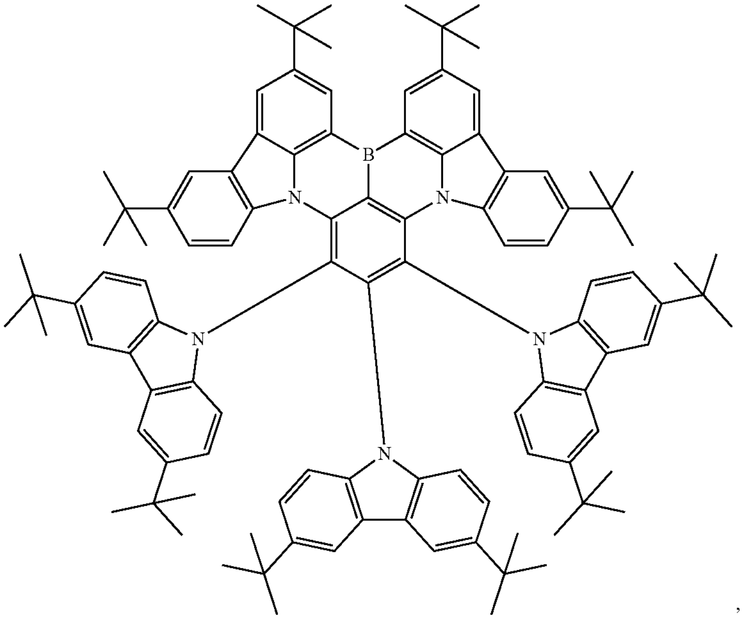
,
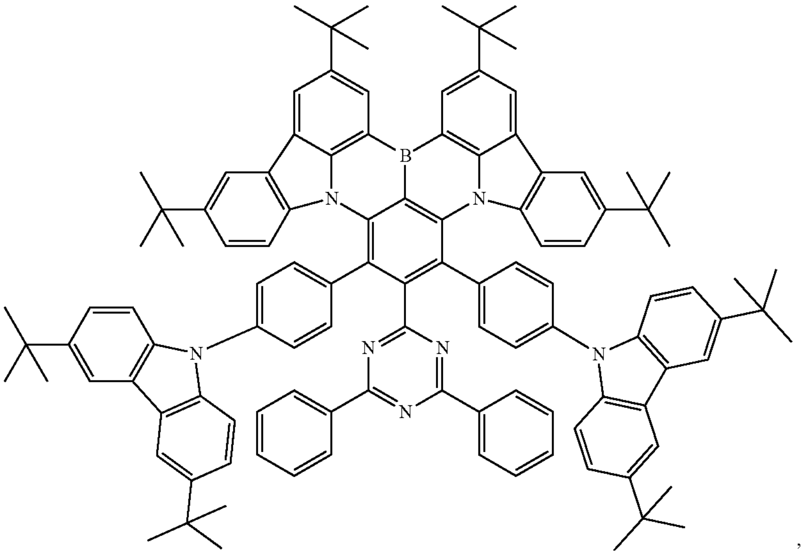
, -continued
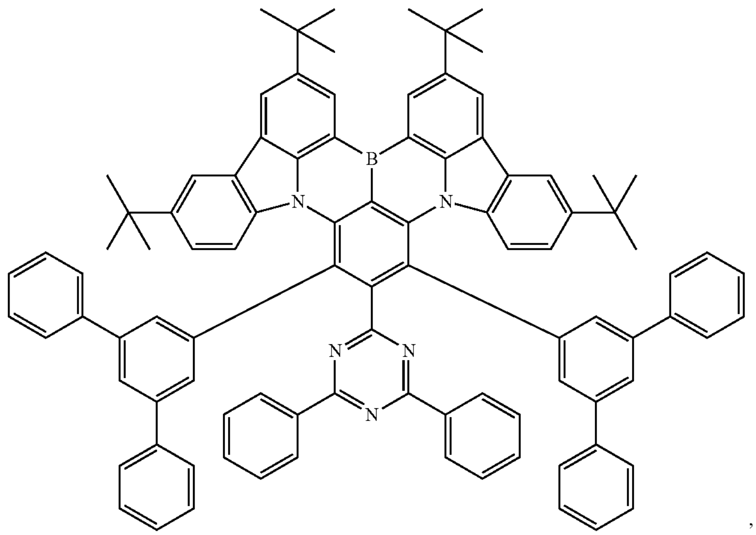
,
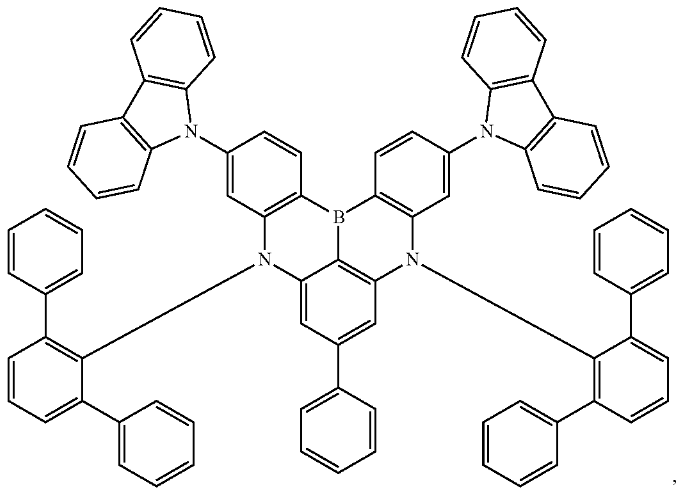
,
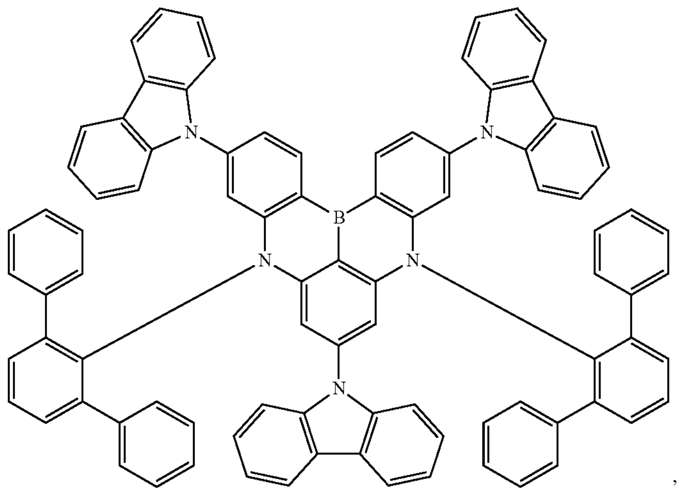
, -continued
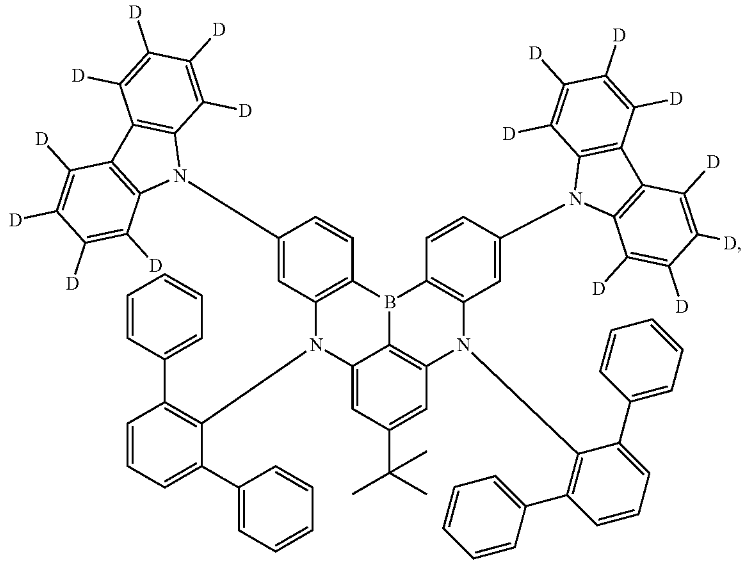
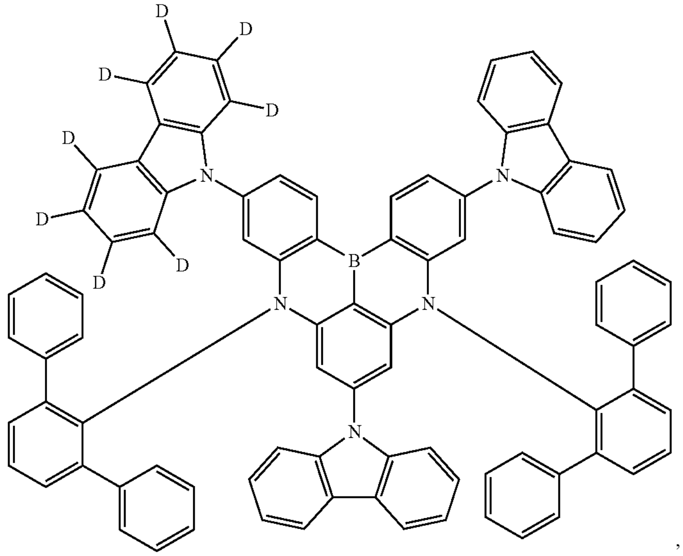
,
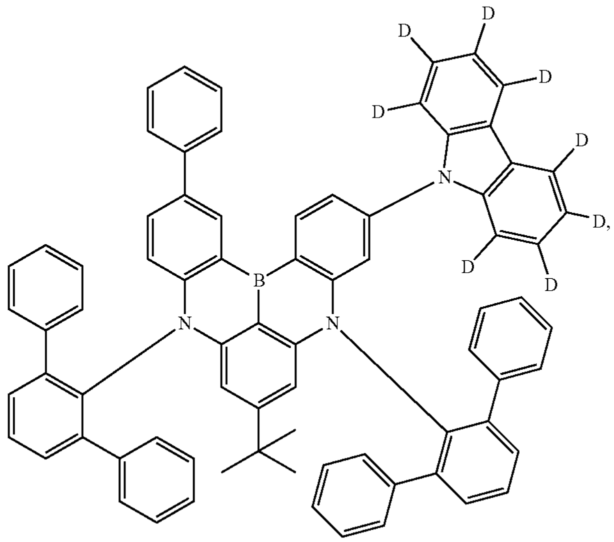

-continued
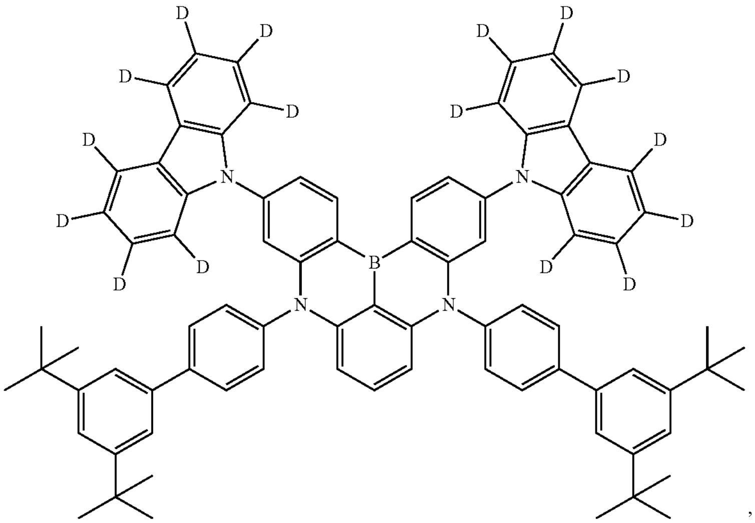
,
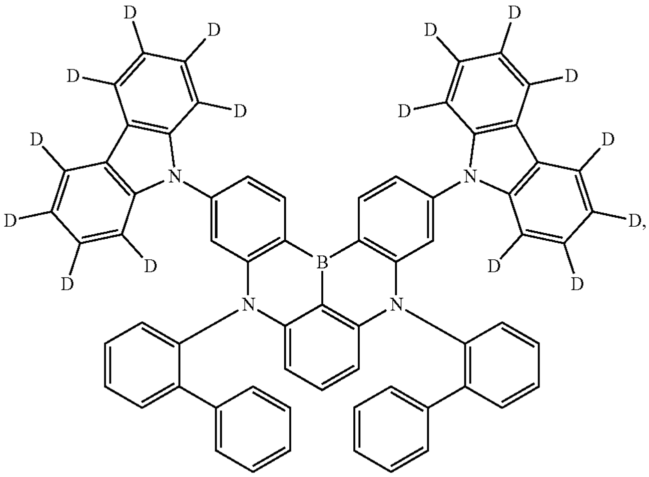
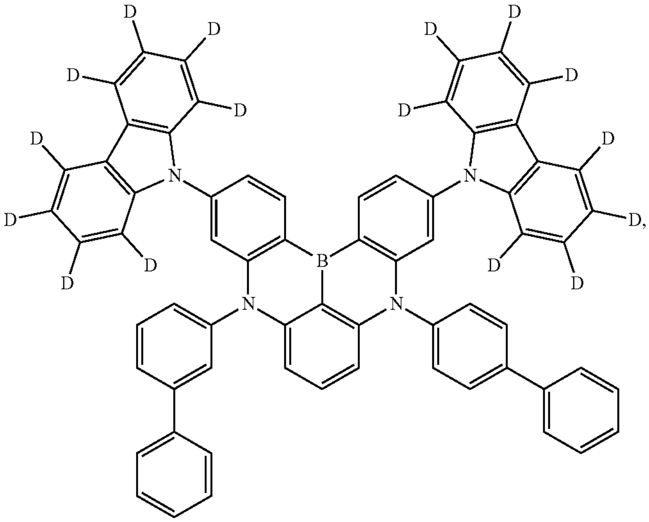

-continued
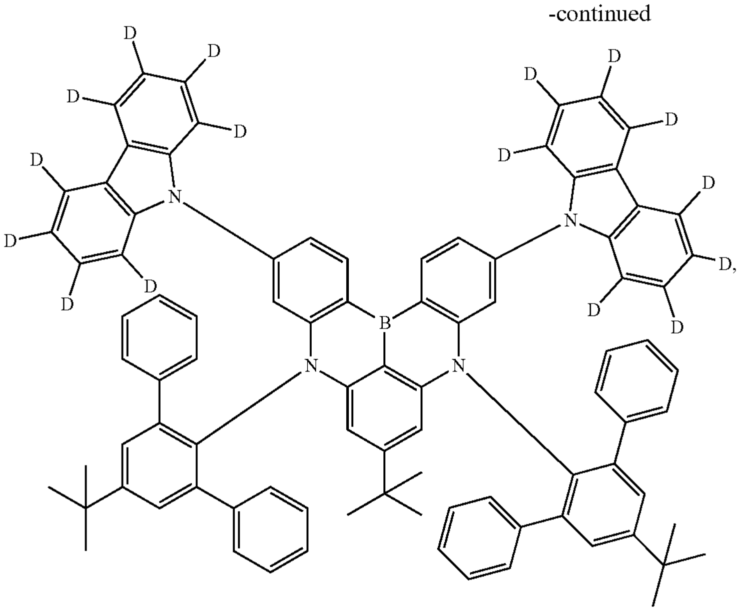
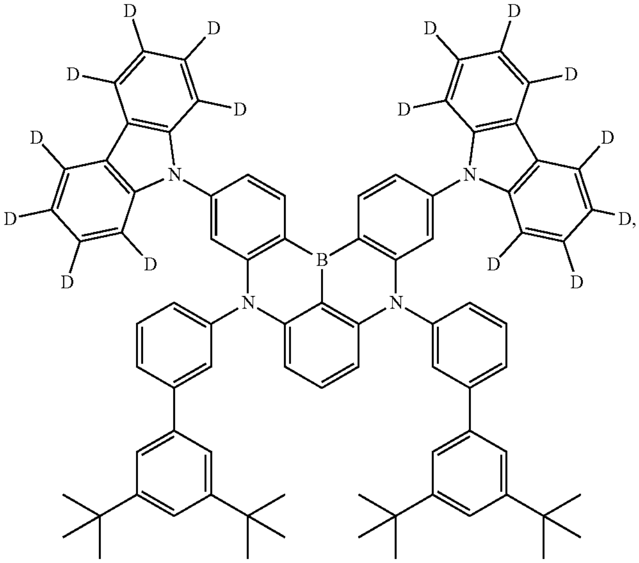
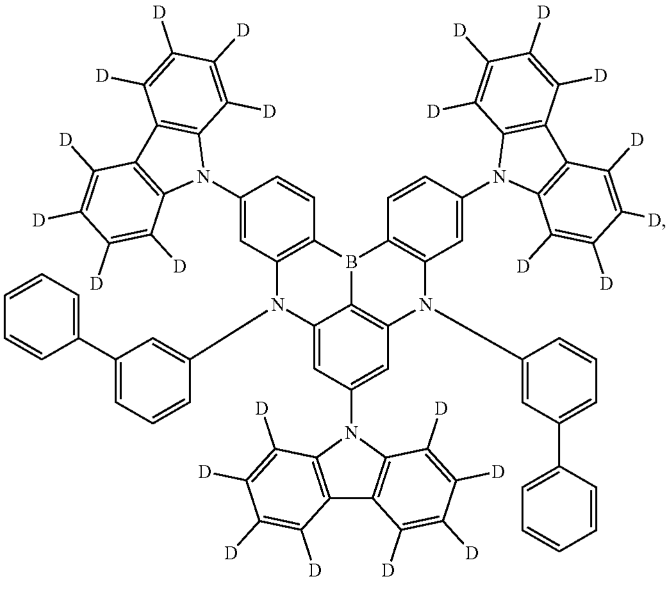

-continued
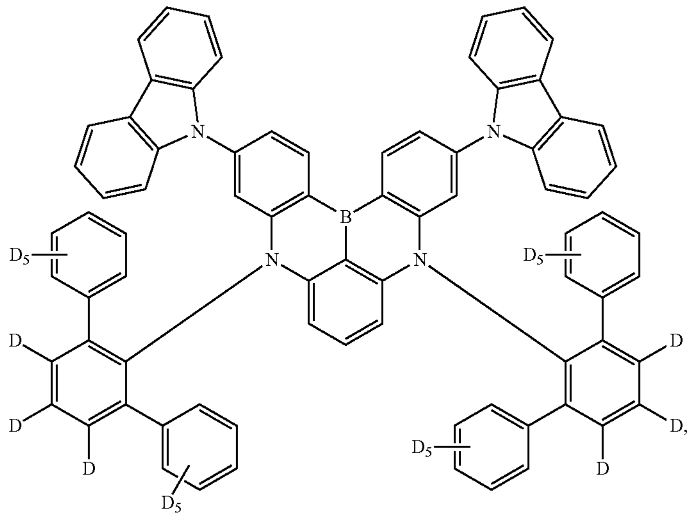
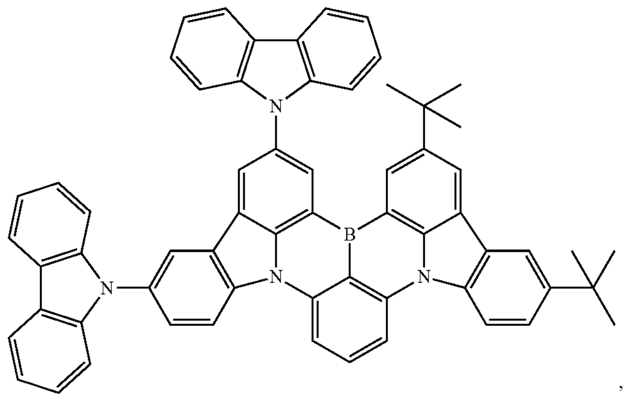
,
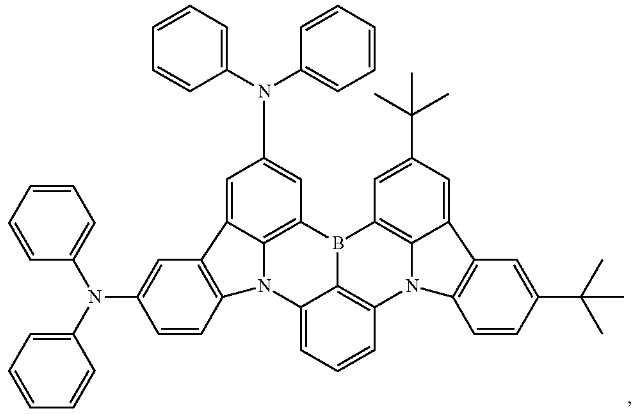
,

-continued
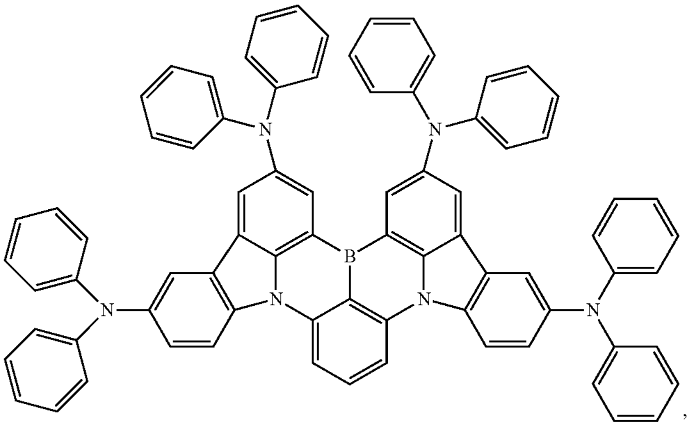,
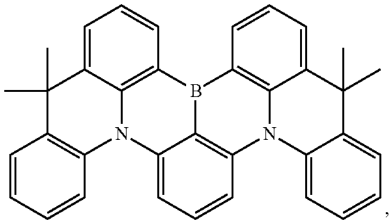,
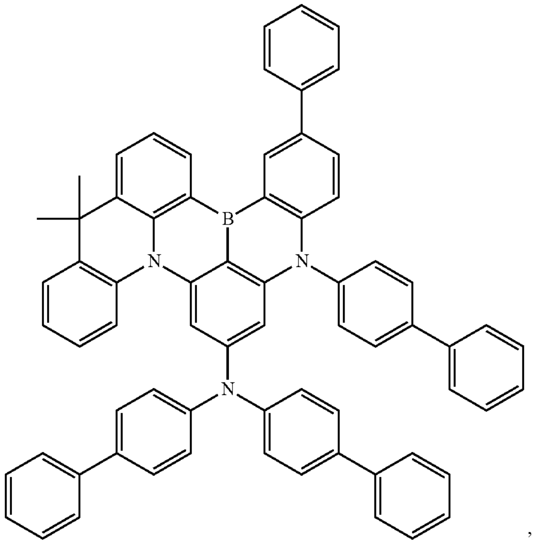,
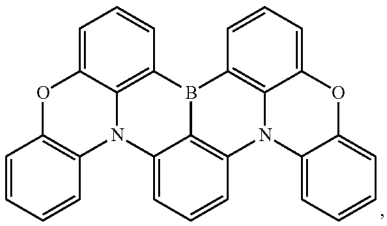,
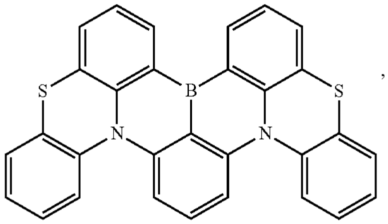,
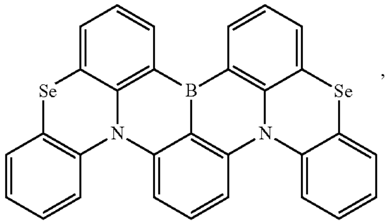,
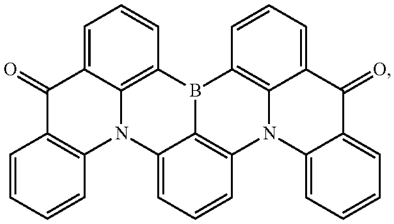,
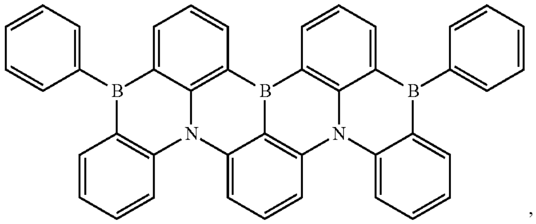,
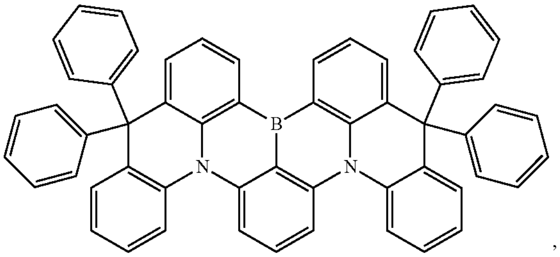, -continued
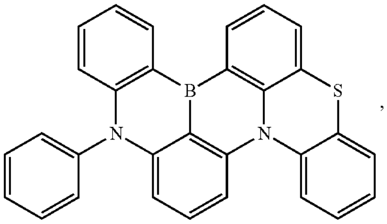
,
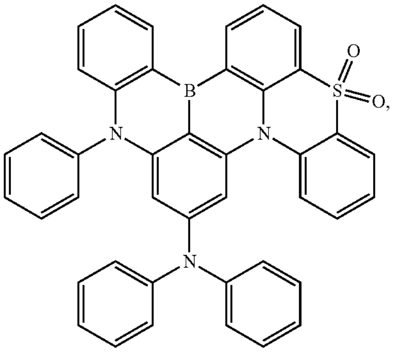
,
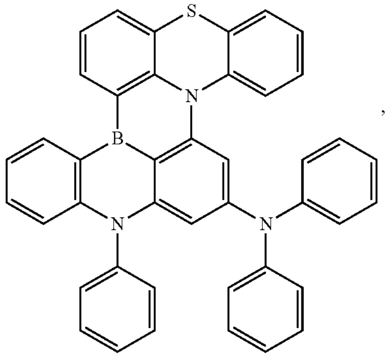
,
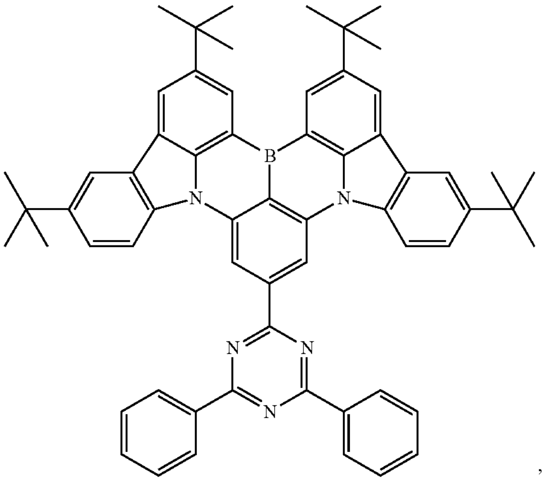
,
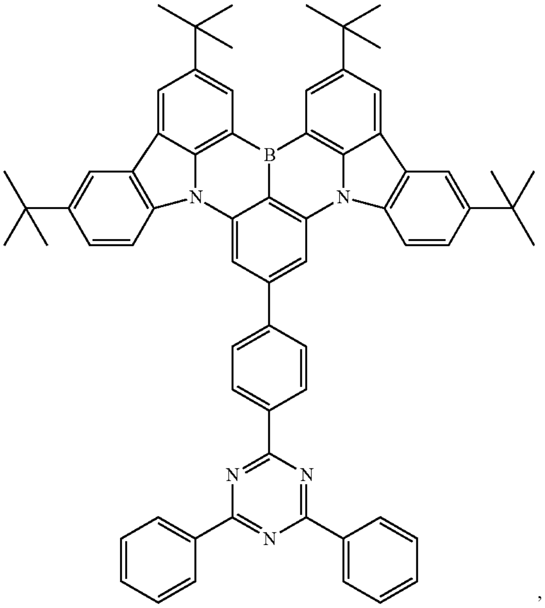
,
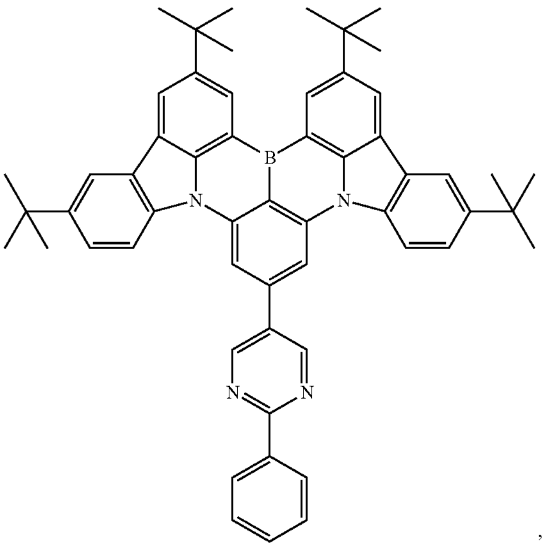
,
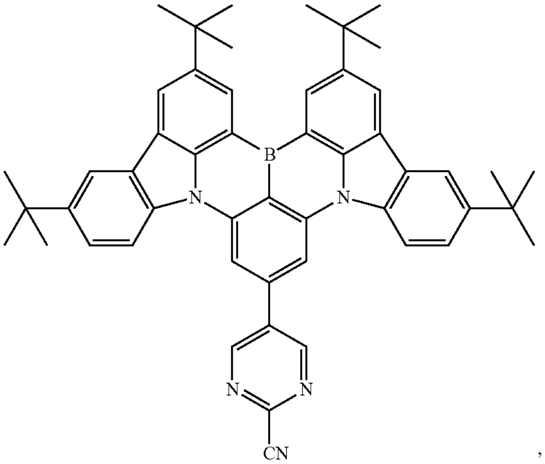
, -continued
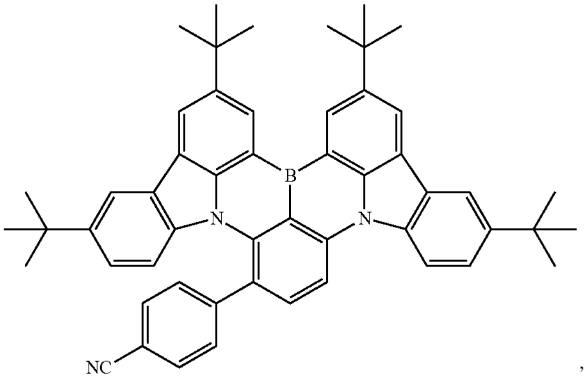
,
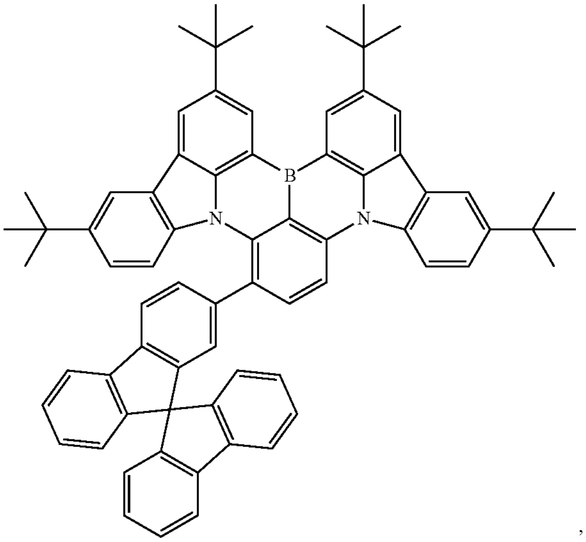
,
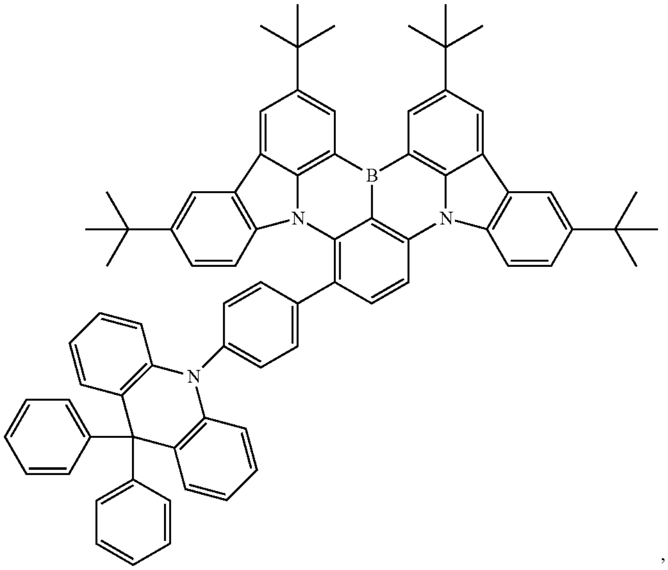
,
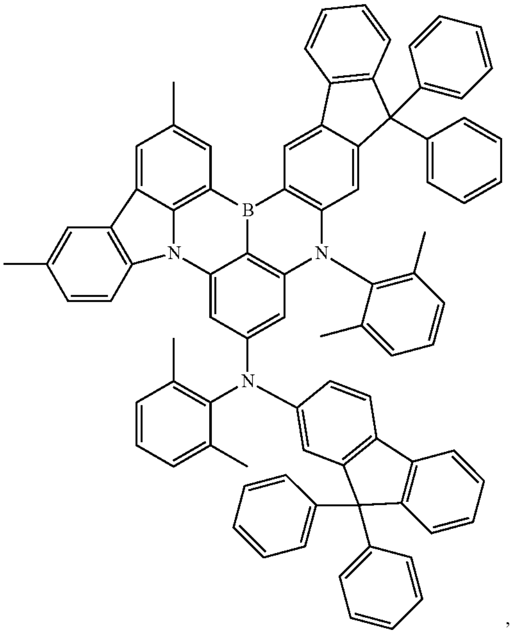
,
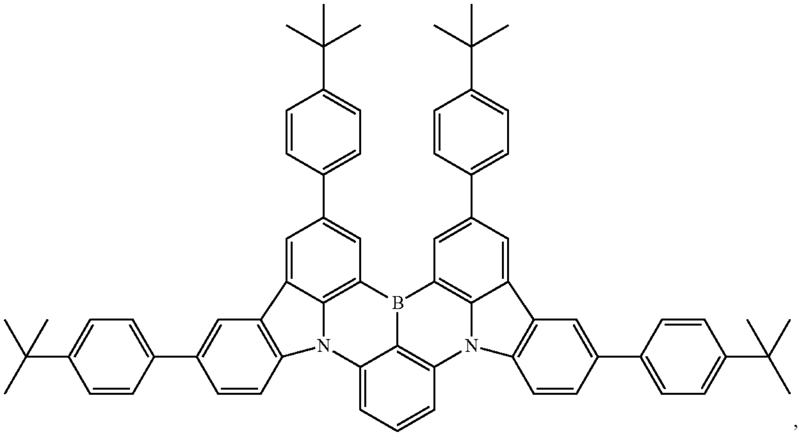
, -continued
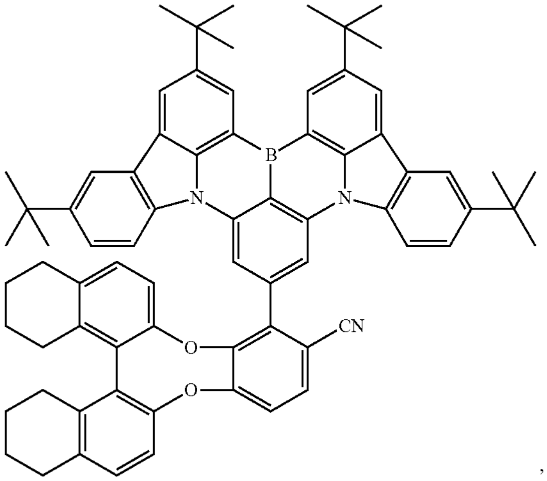
,
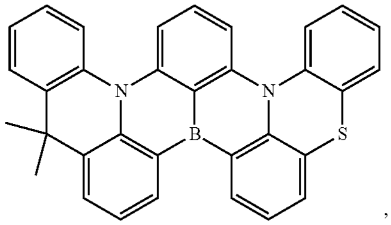
,
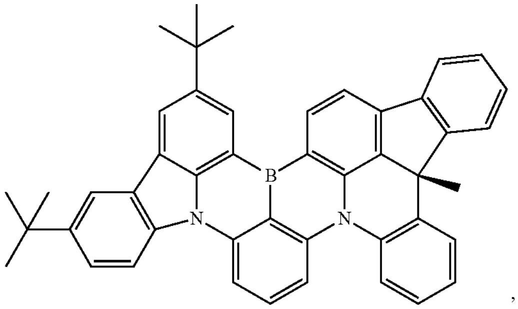
,
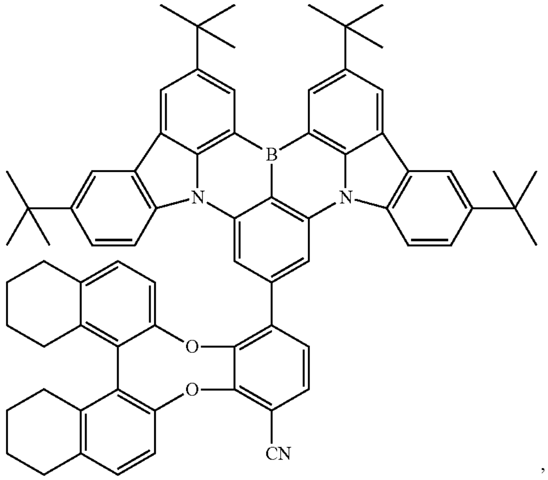
,
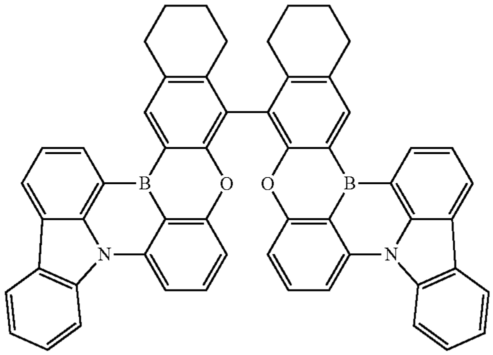
,
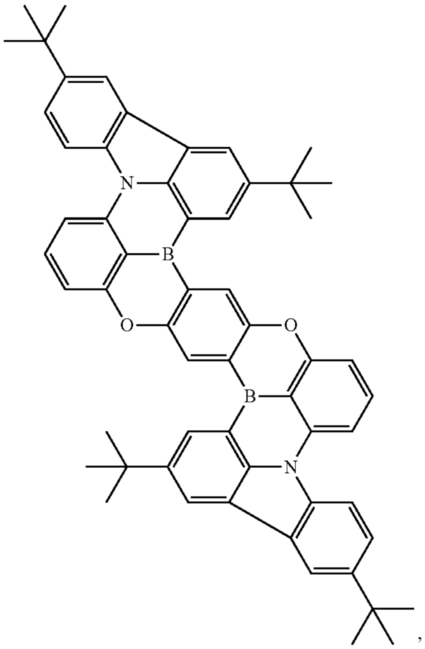
,

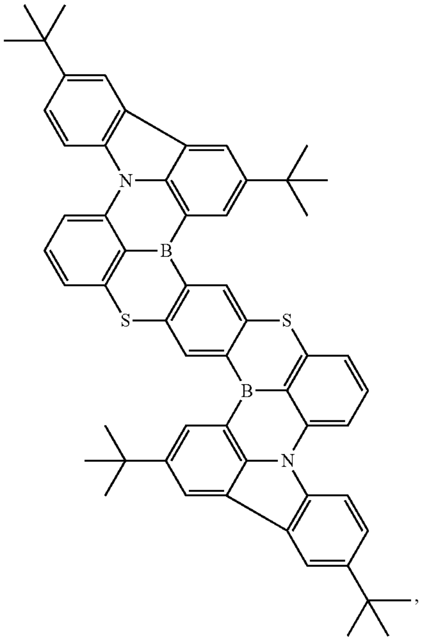
,
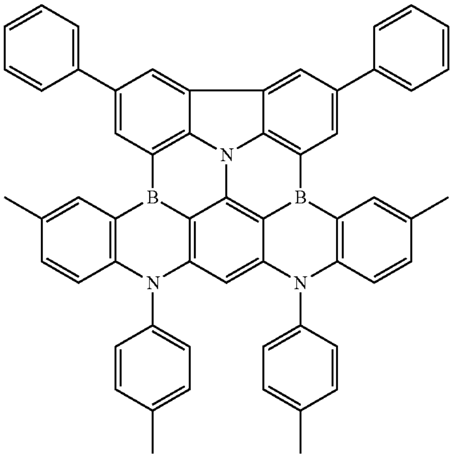
,
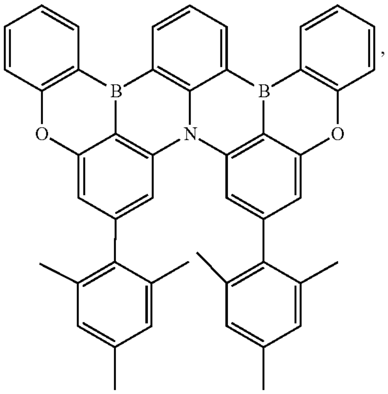
,
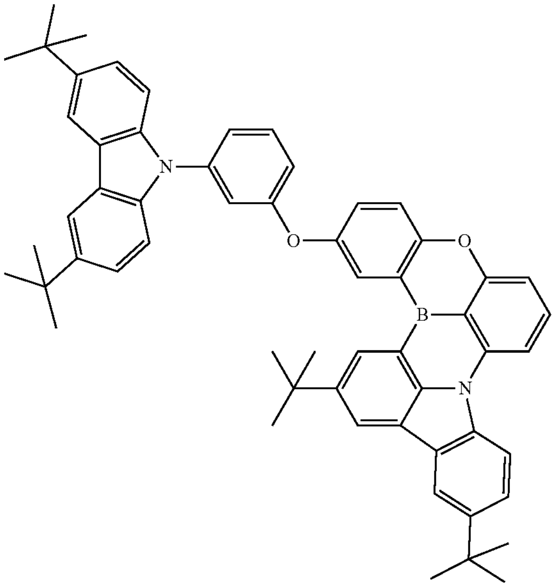
,

-continued
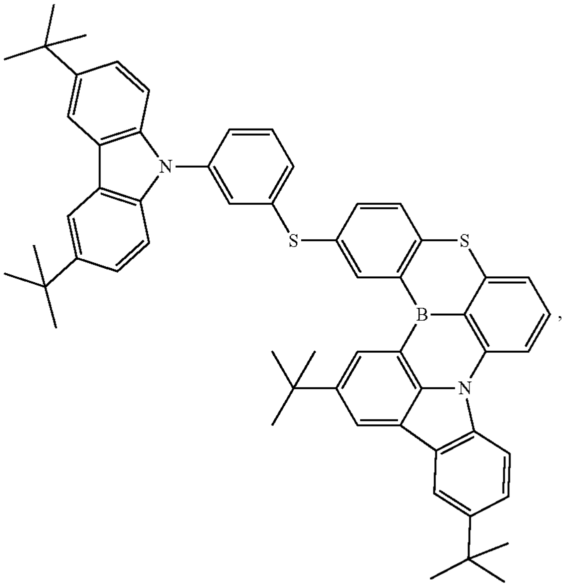
,
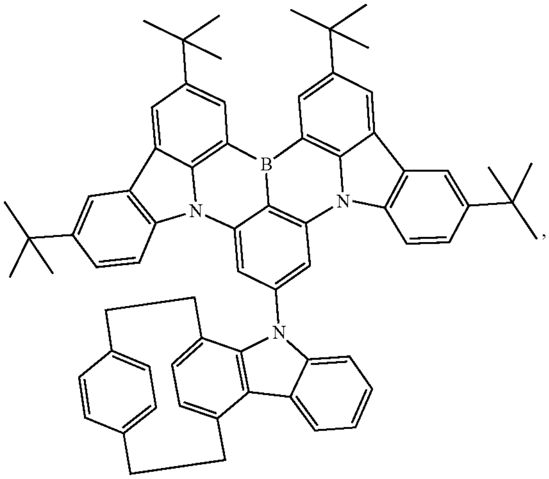
,
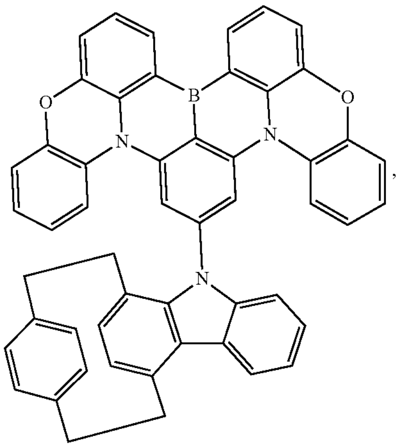
,
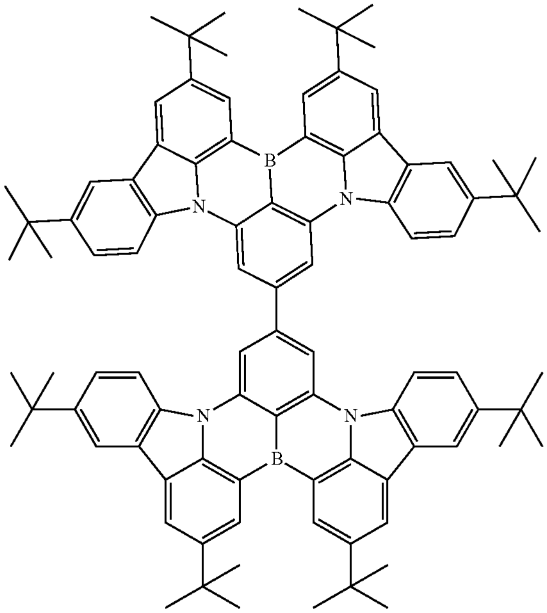
,

-continued
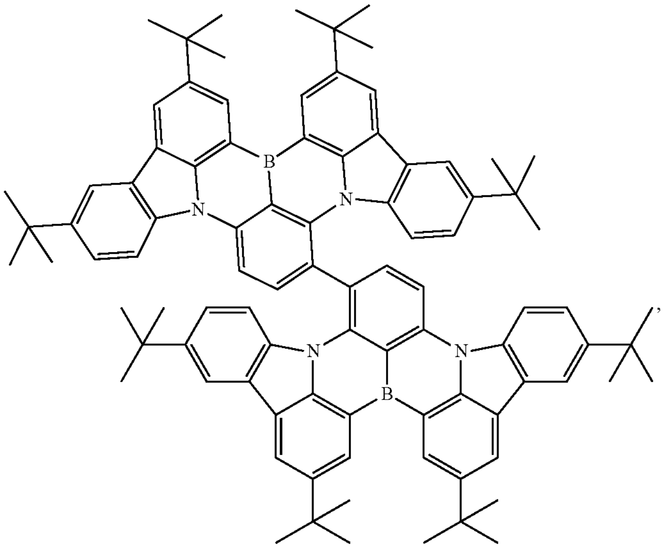
,
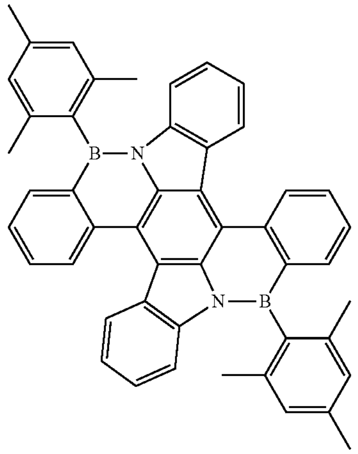
,
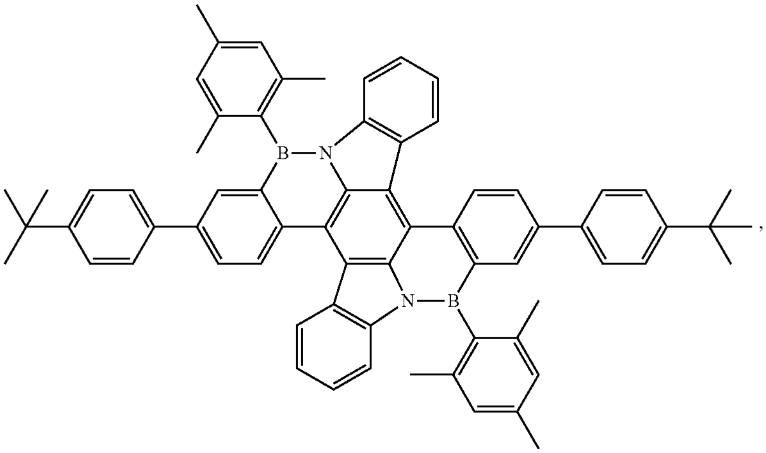
,
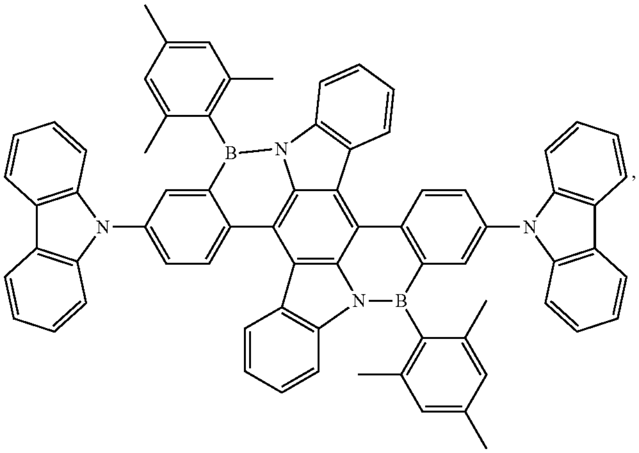
,
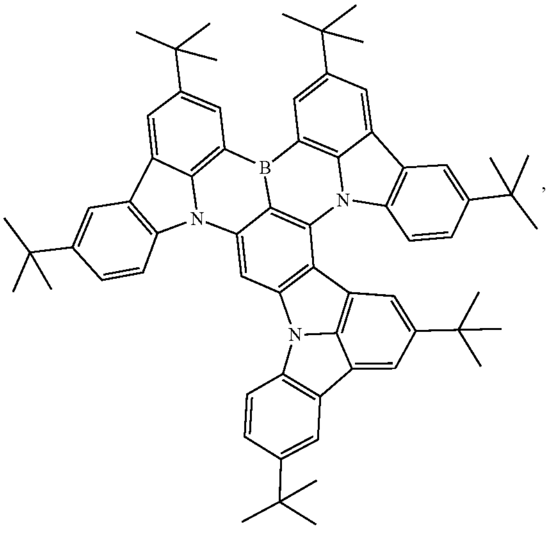
, -continued
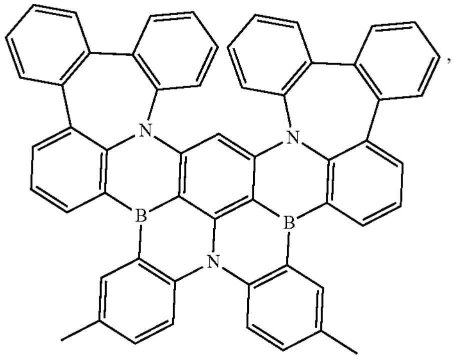
,
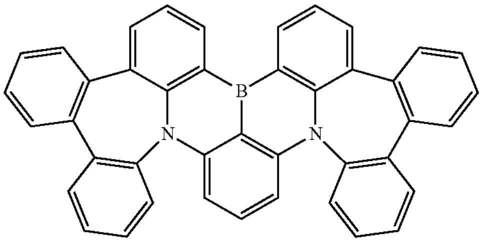
,
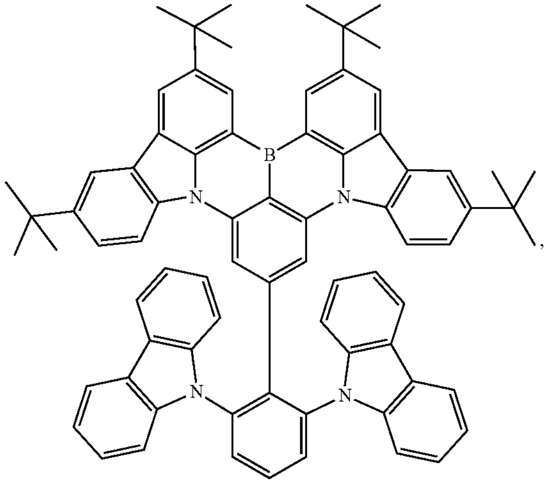
,
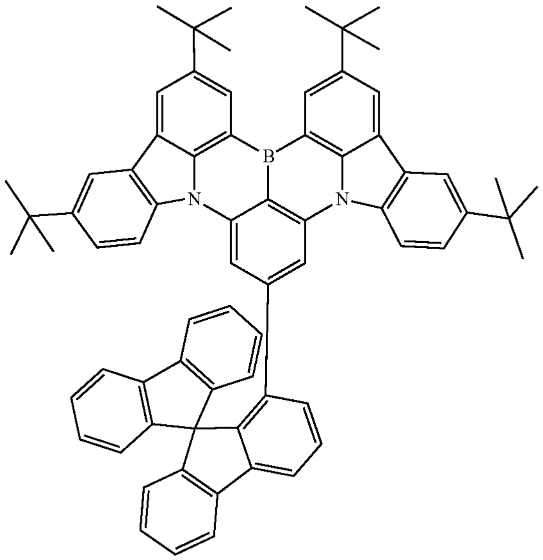
,
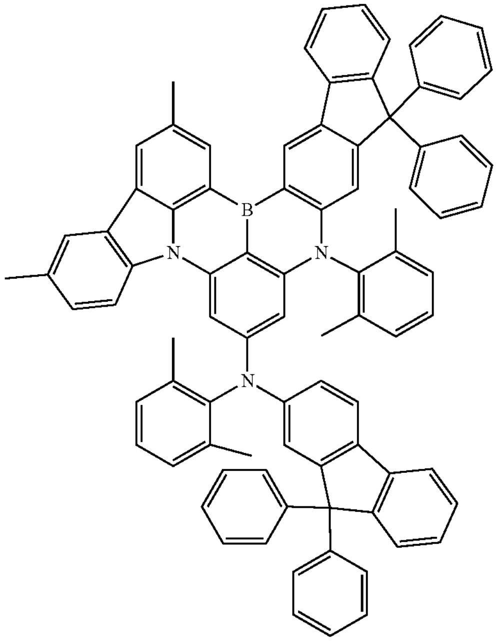
,
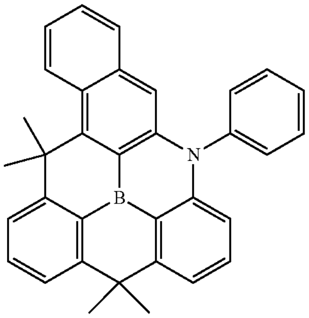
, -continued
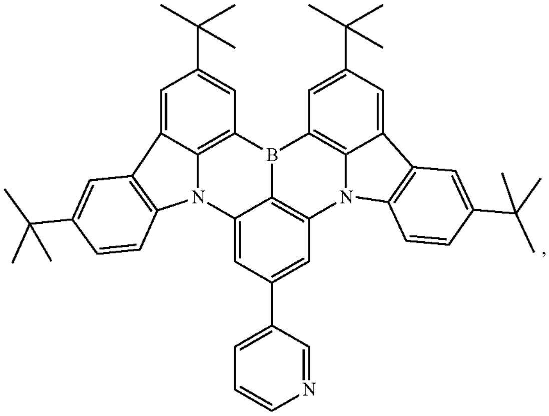
,
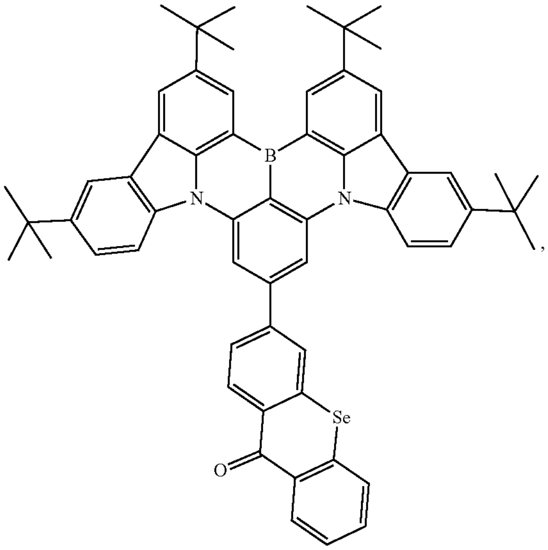
,
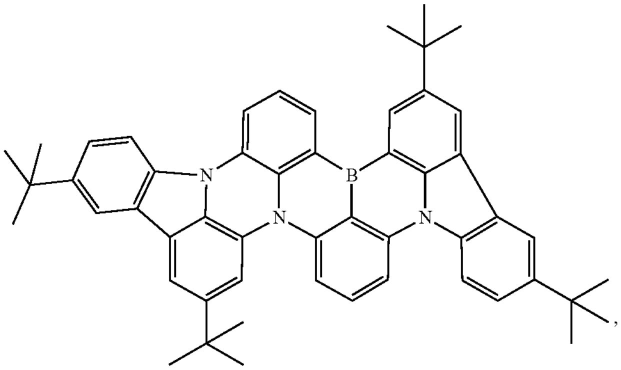
,
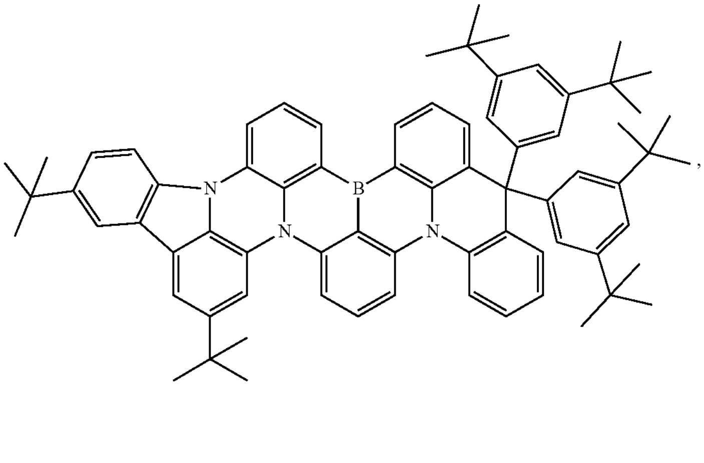
, -continued
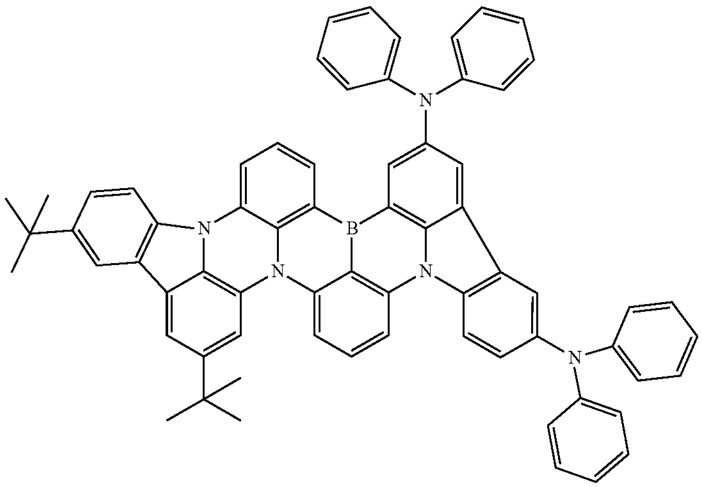,
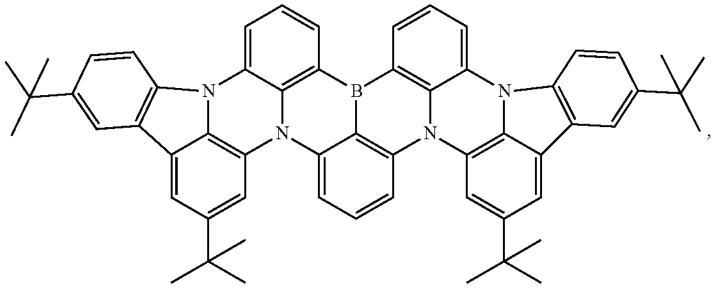,
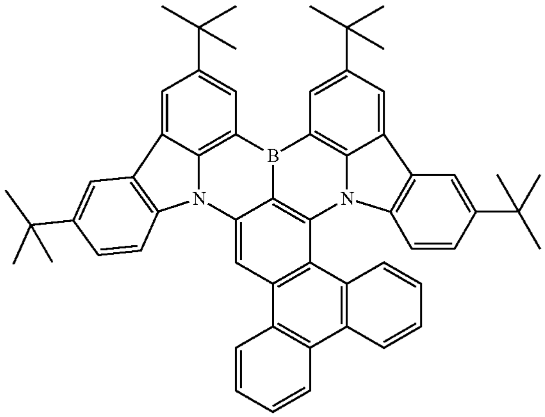, 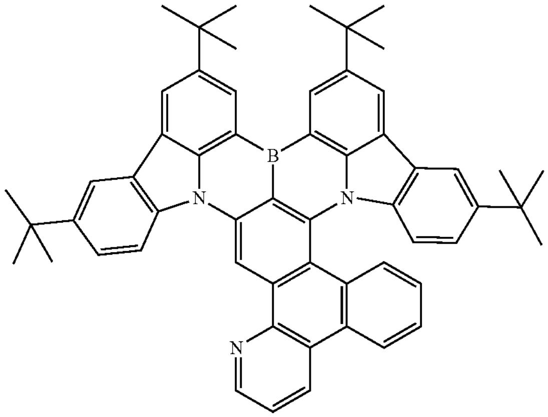,
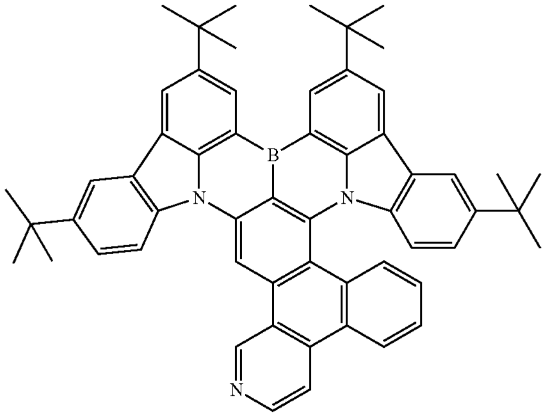, 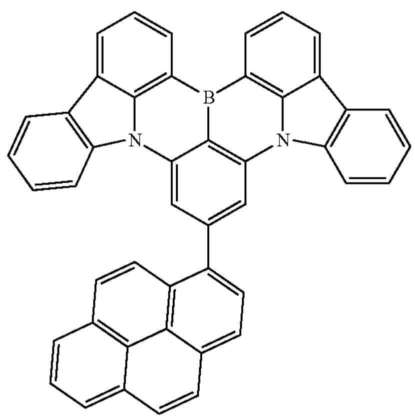, -continued
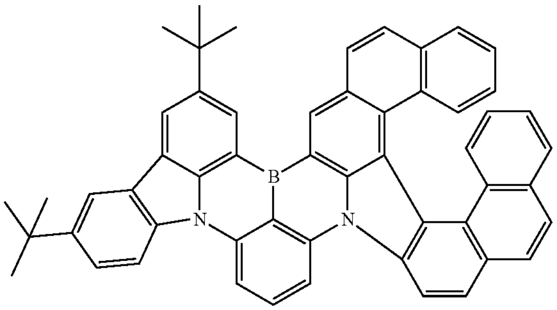
,
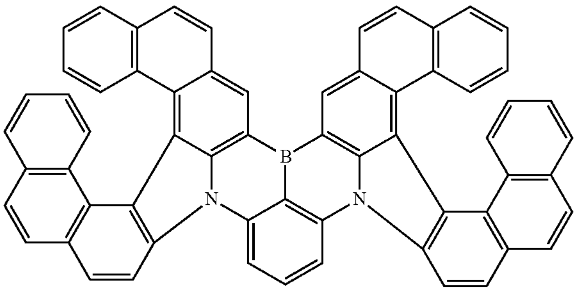
,
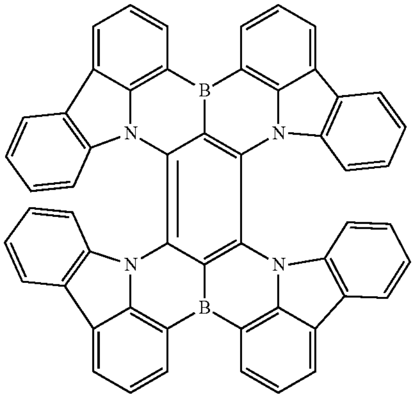
,
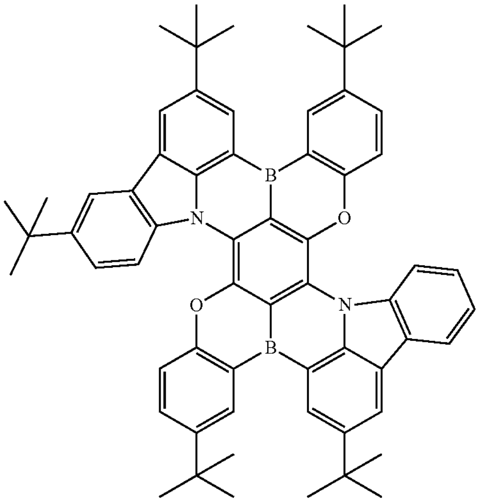
,
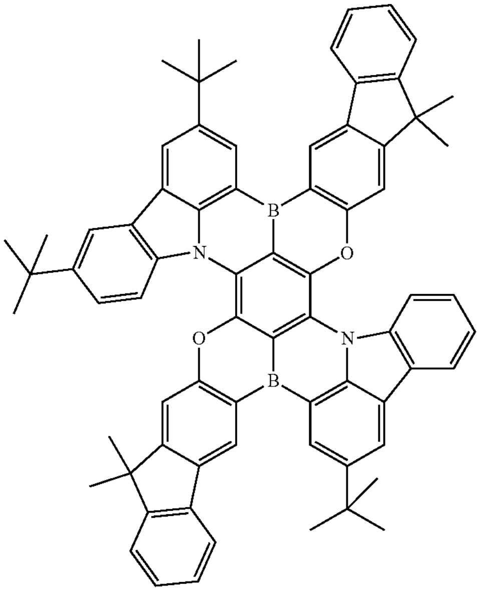
,
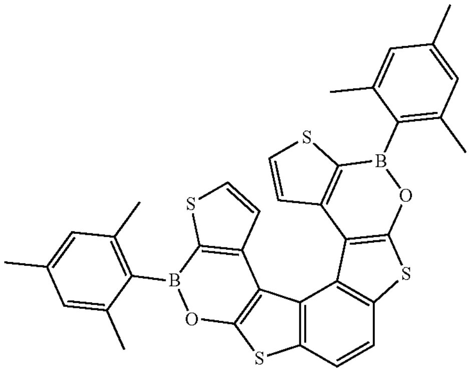
, -continued
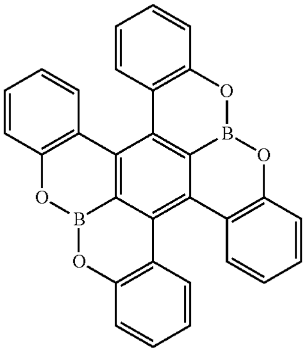
,
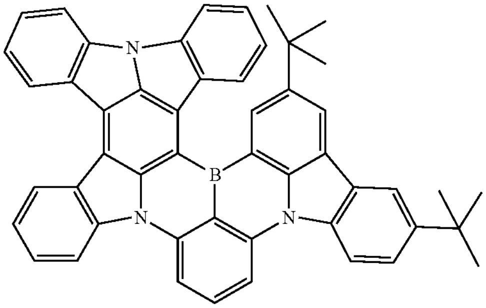
,
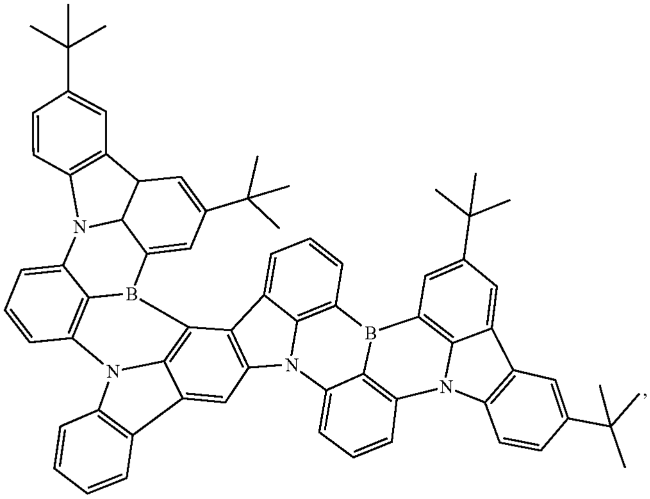
,
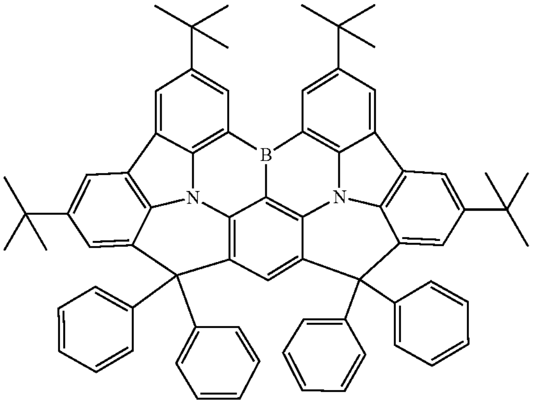
,
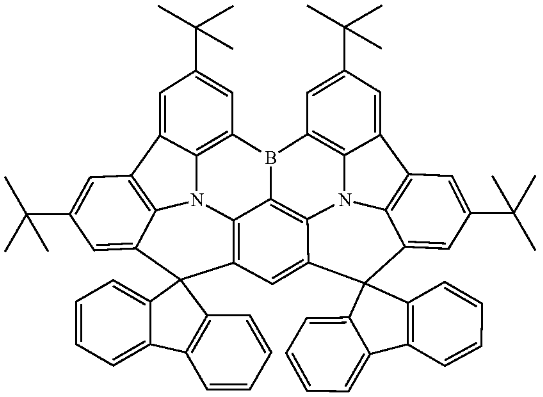
,
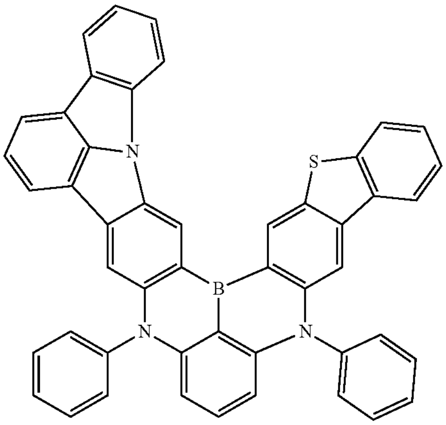
,
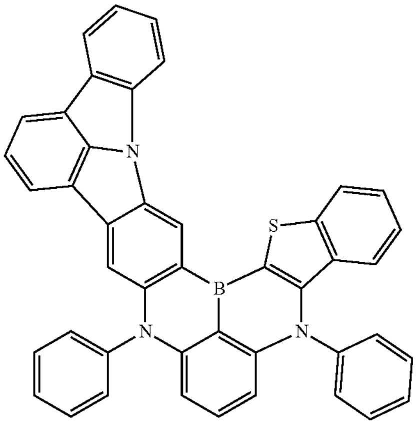
,
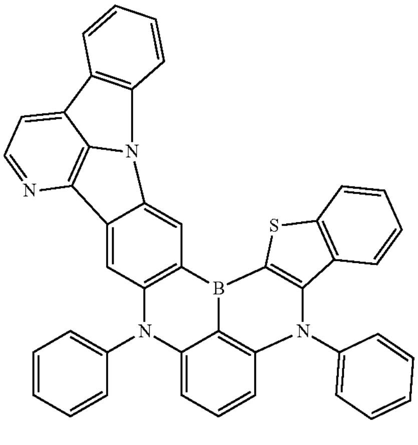
, -continued
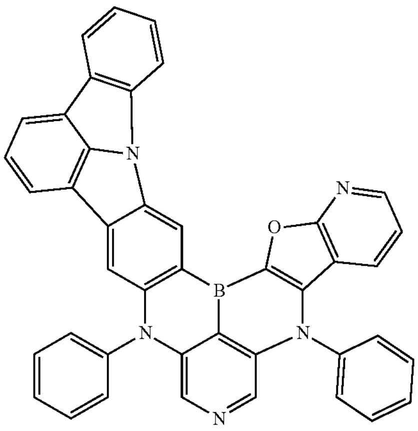,
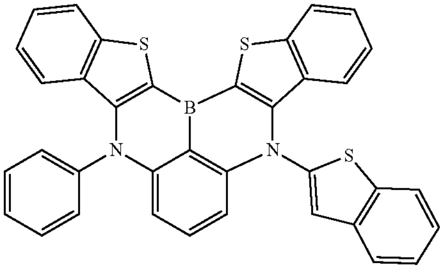,
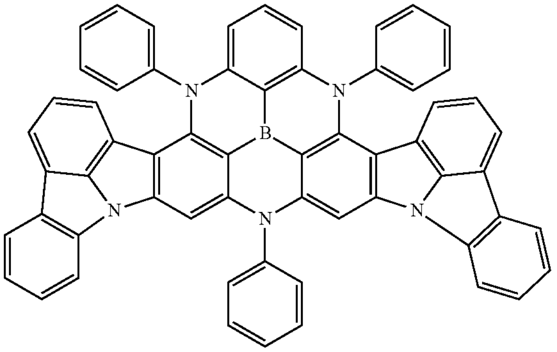,
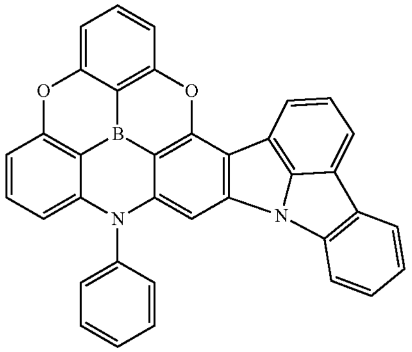,
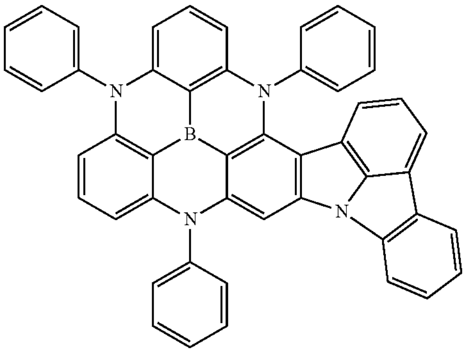,
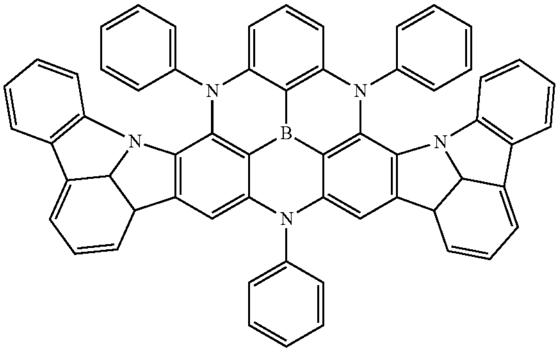,
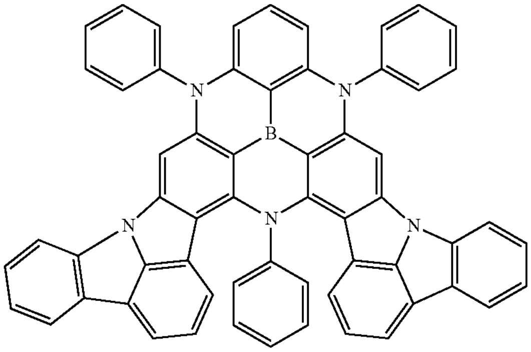,
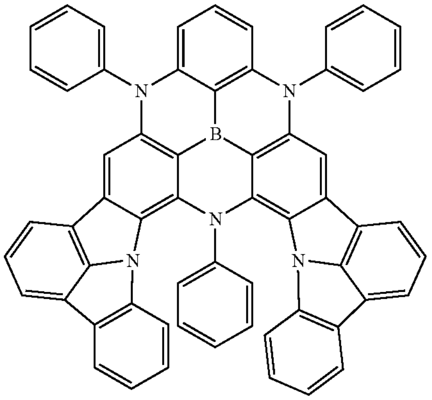, -continued
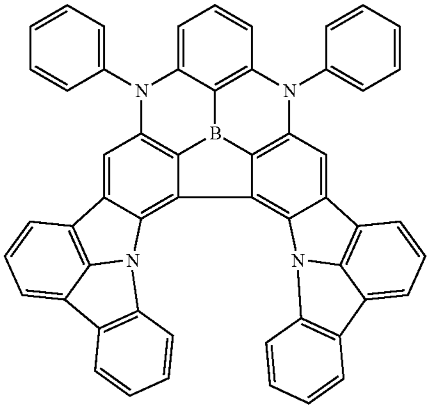
,
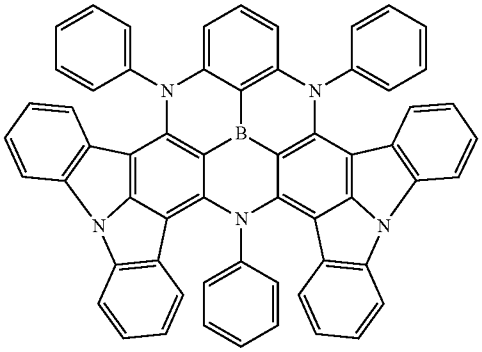
,
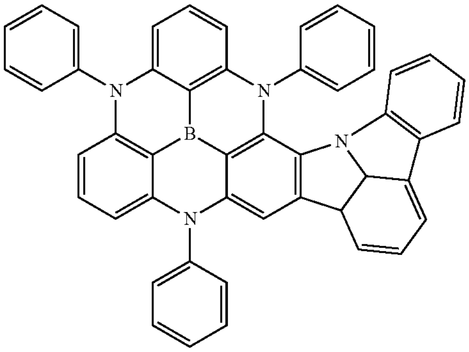
,
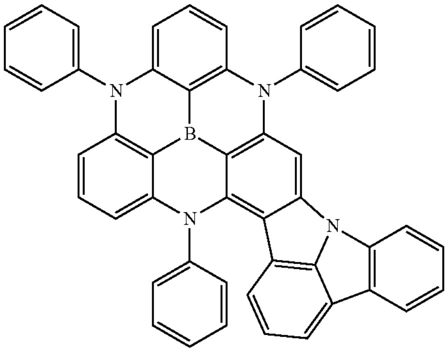
,
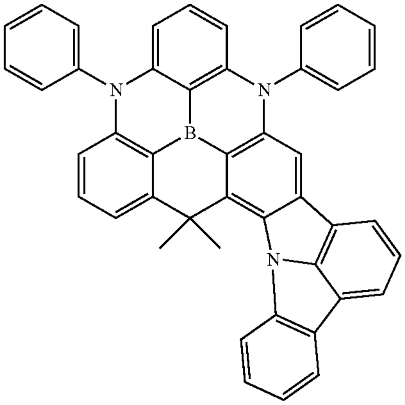
,
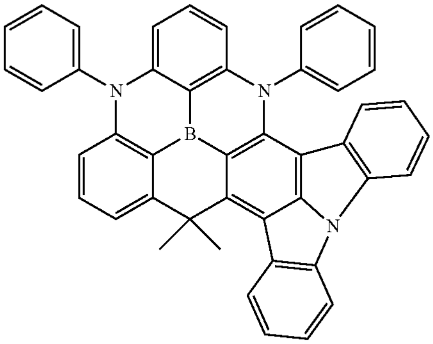
,
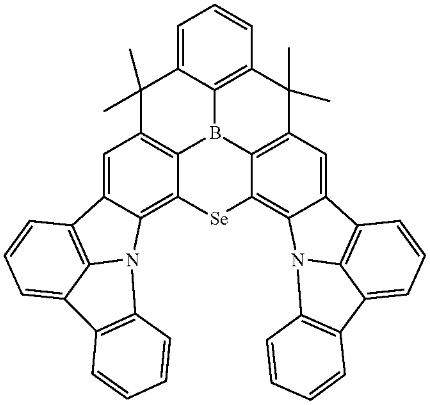
,
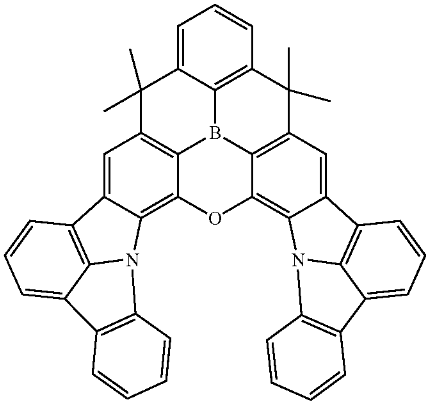
, -continued
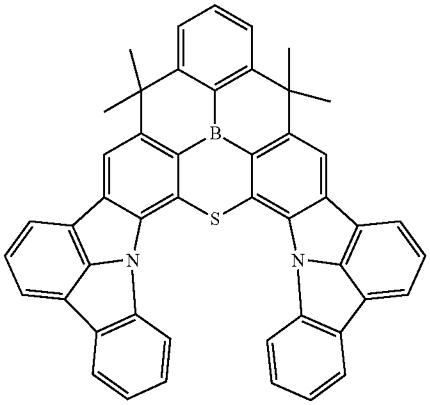
,
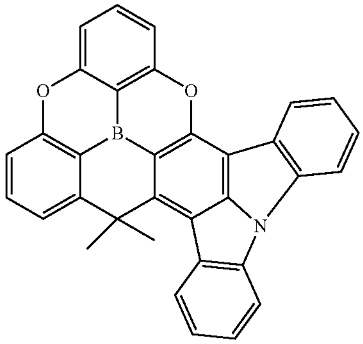
,
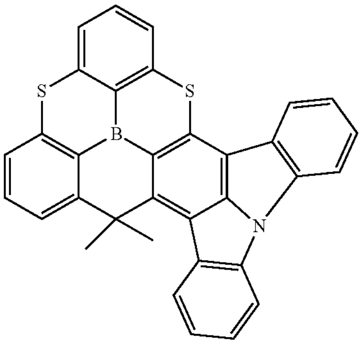
,
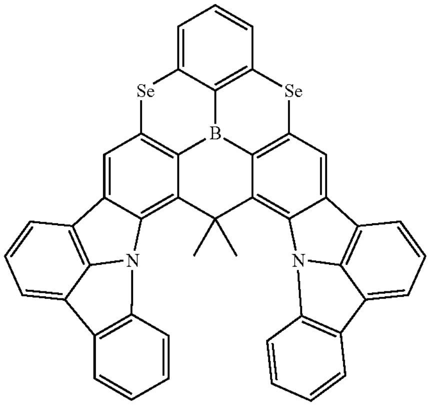
,
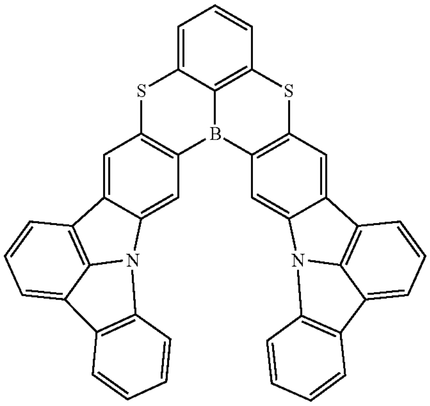
,
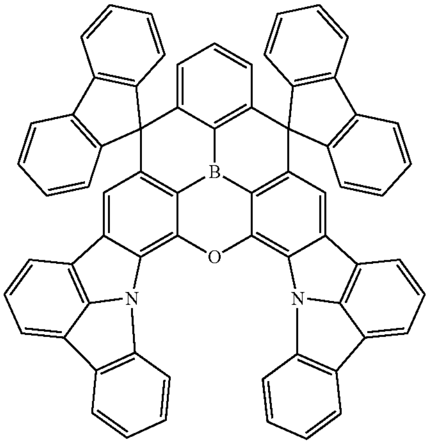
,
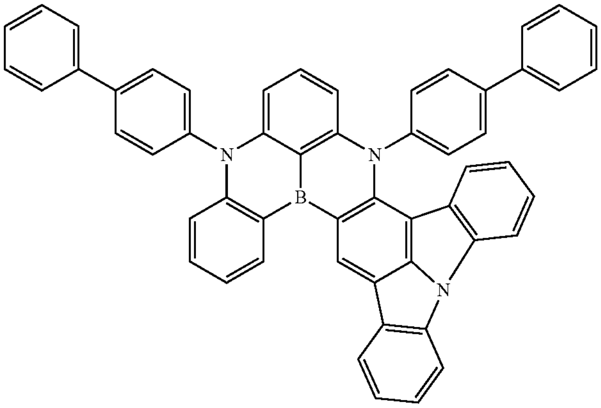
, -continued
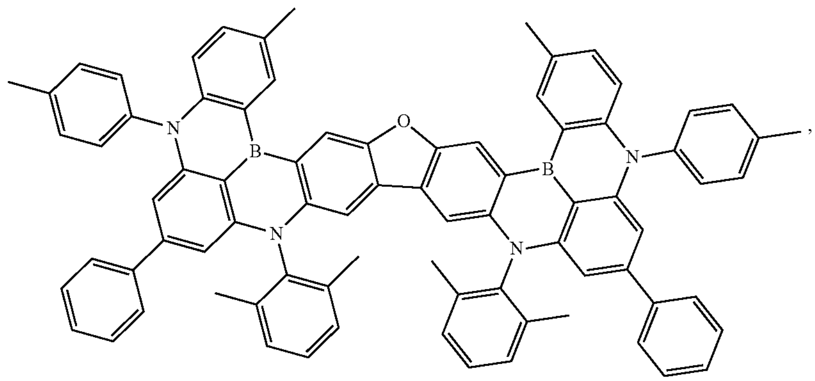
,
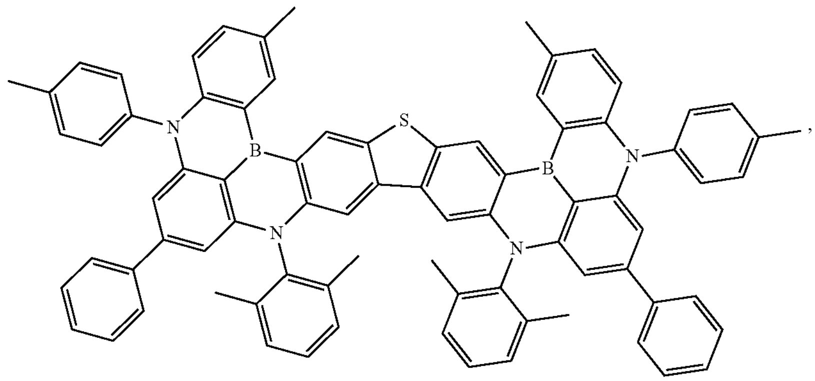
,
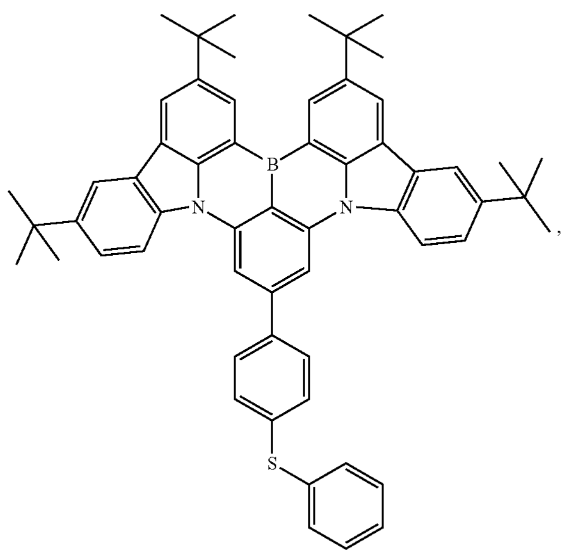
,

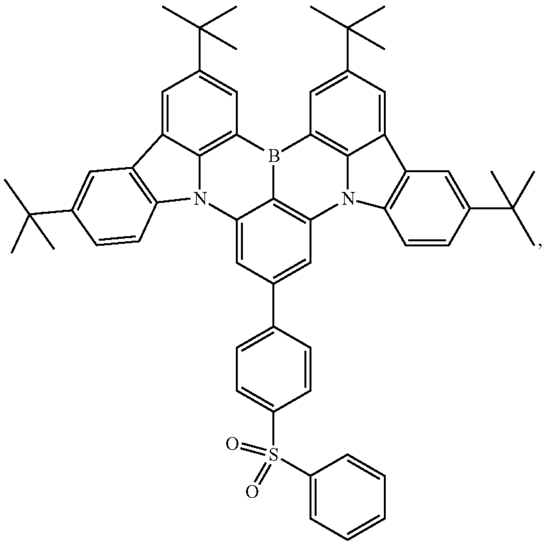
,
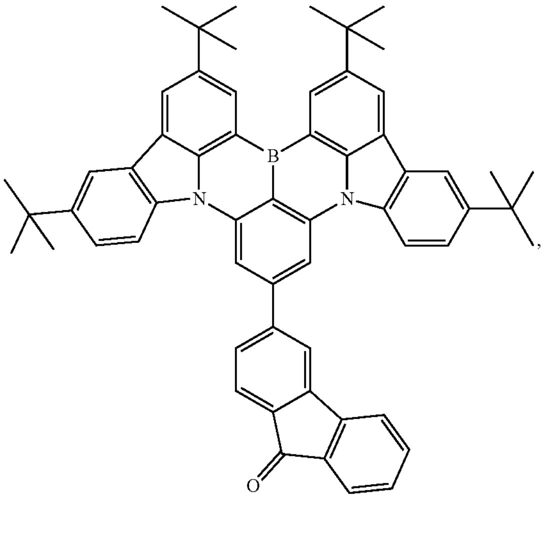
,
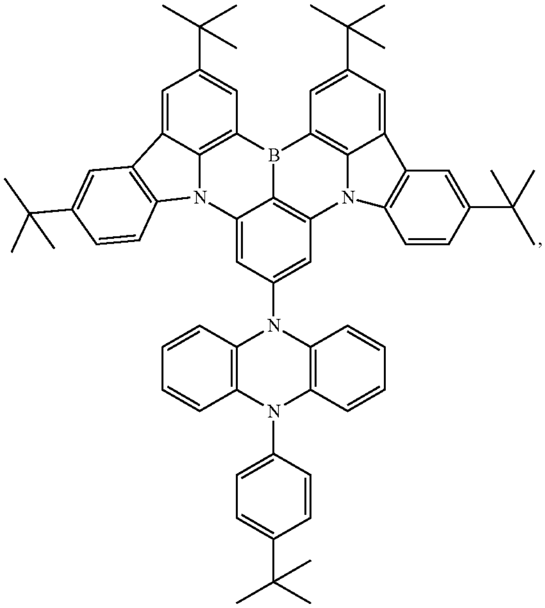
,
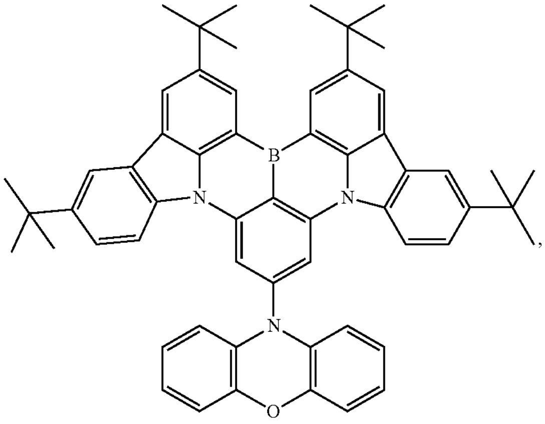
,
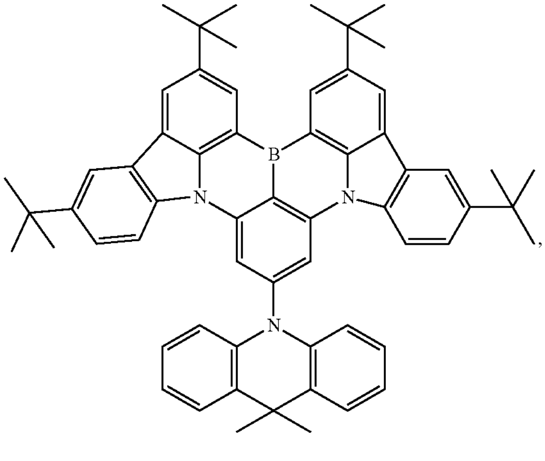
,
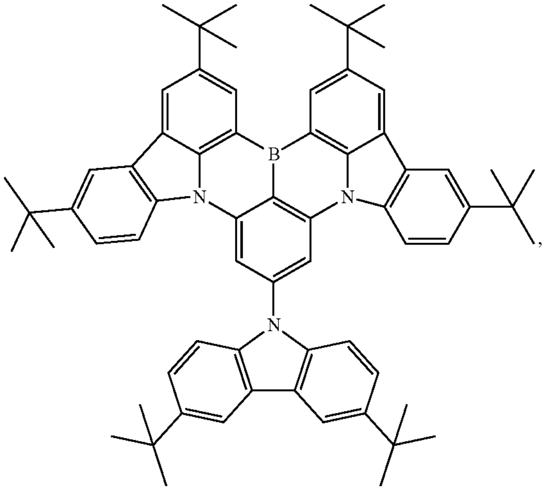
, -continued
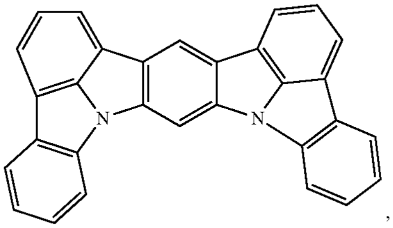
,
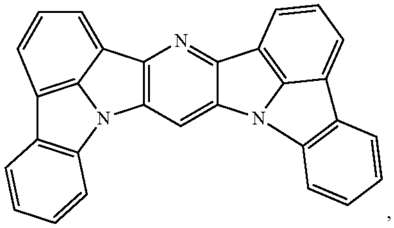
,
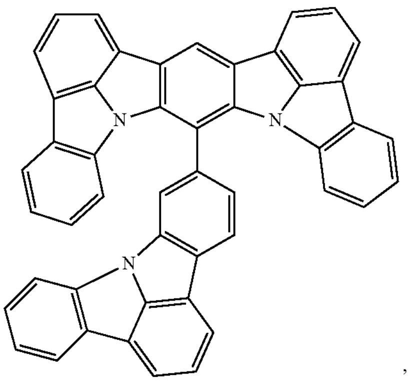
,
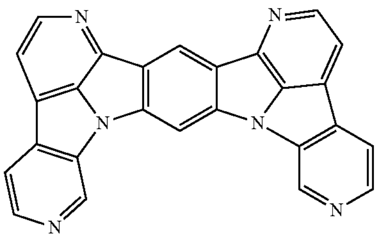
,
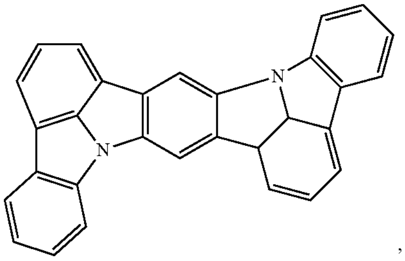
,
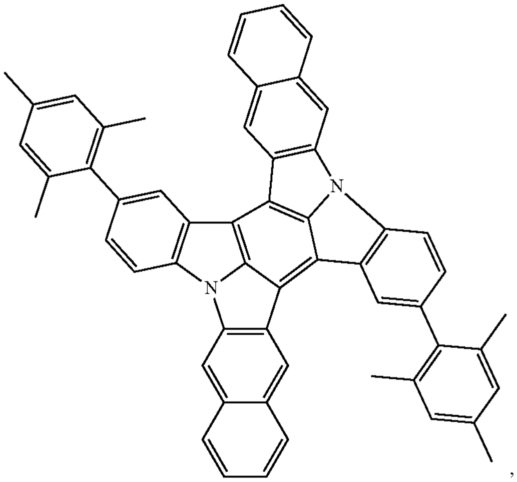
,
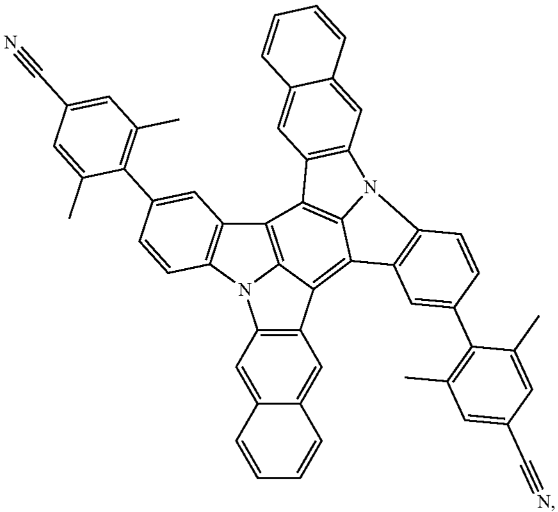
,
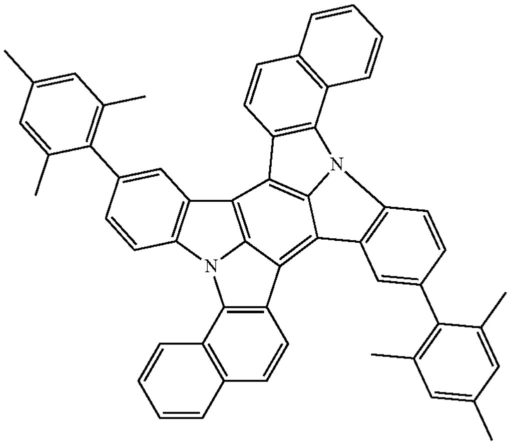
, -continued
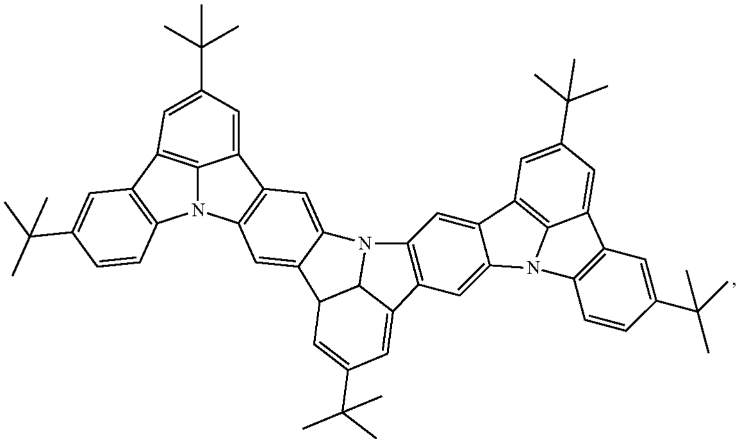
,
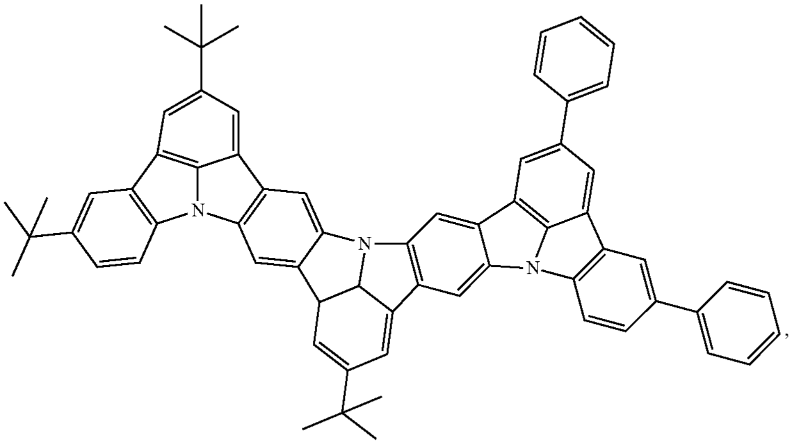
,
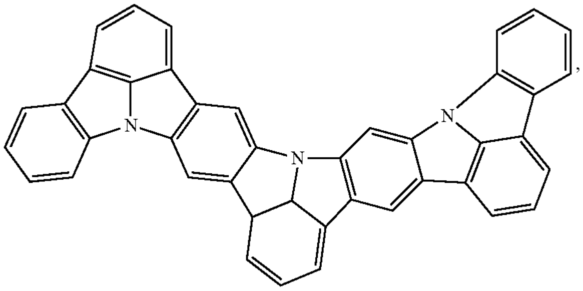
,
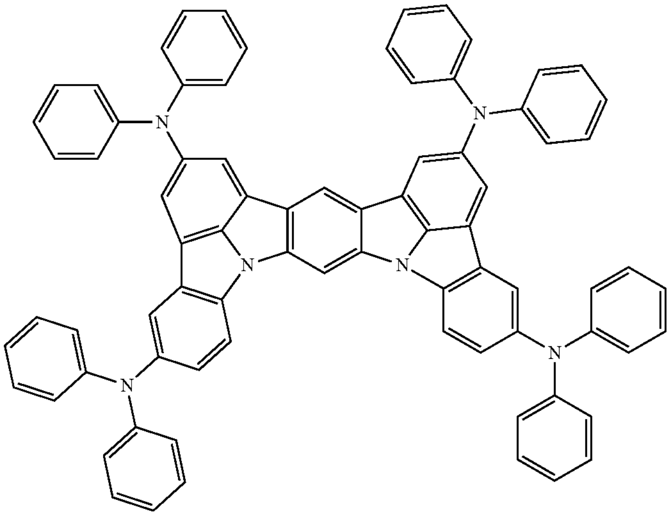
,
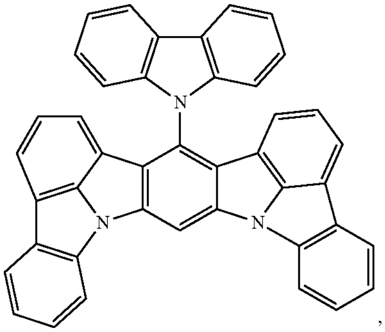
, -continued
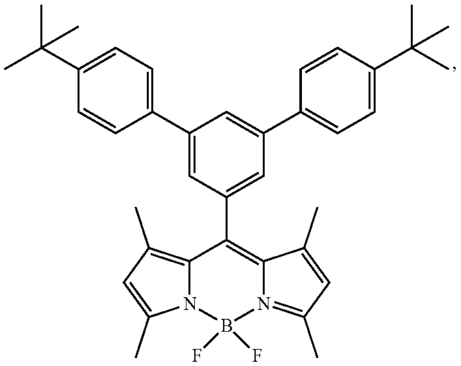
,
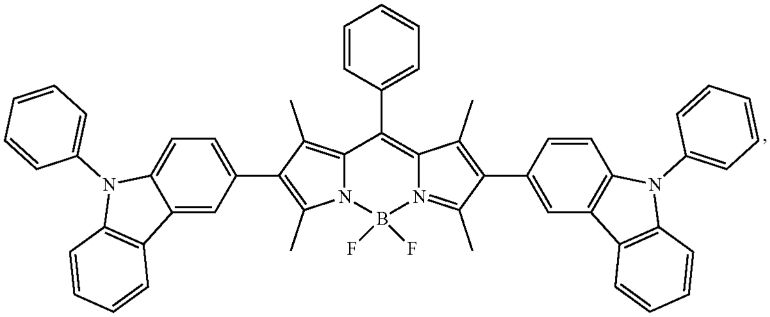
,
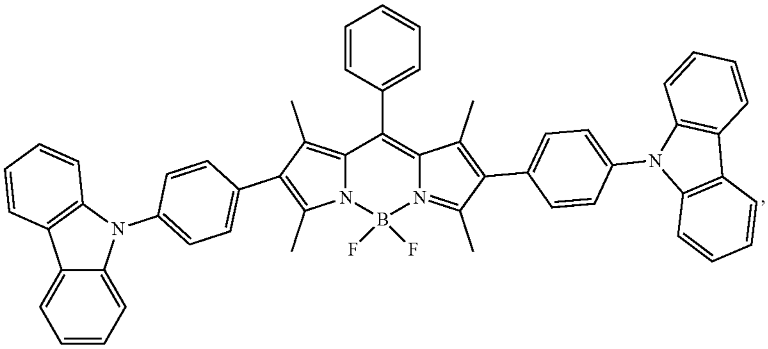
,
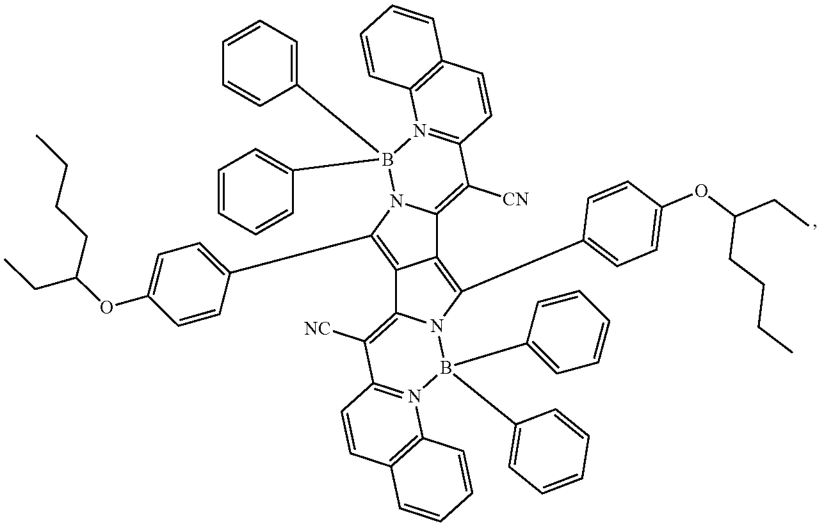
, -continued
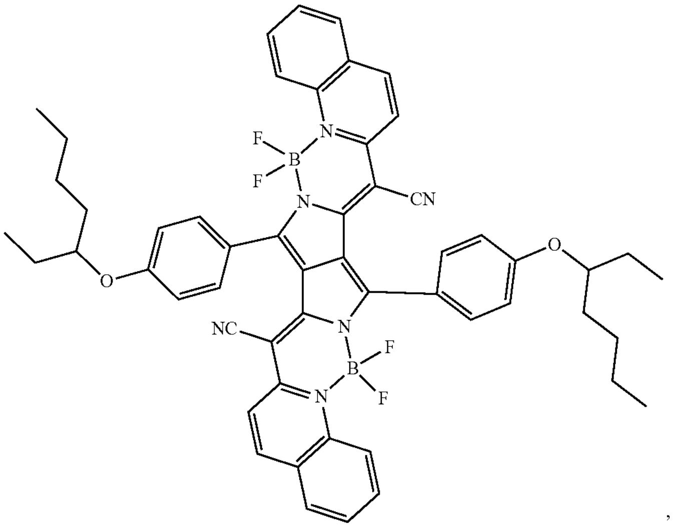
,
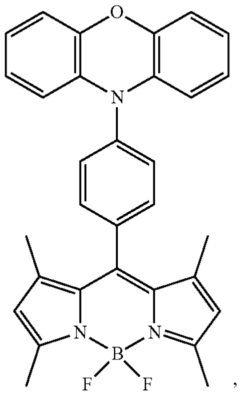
,
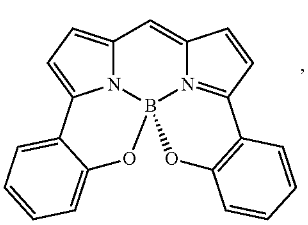
,
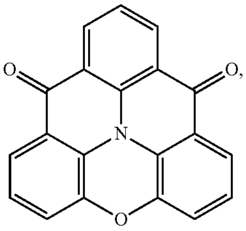
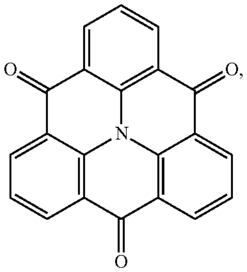
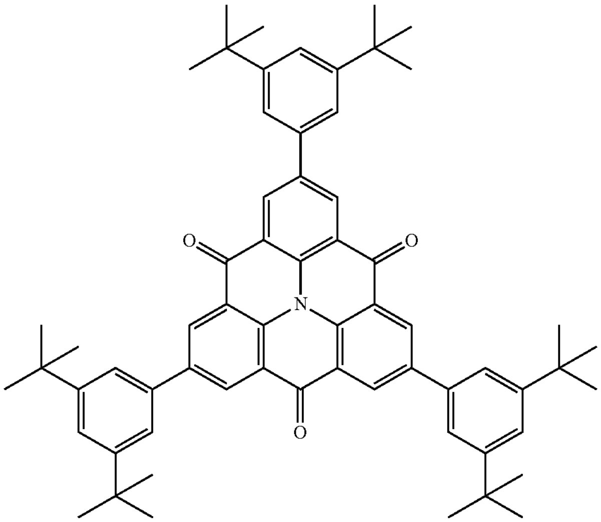
,
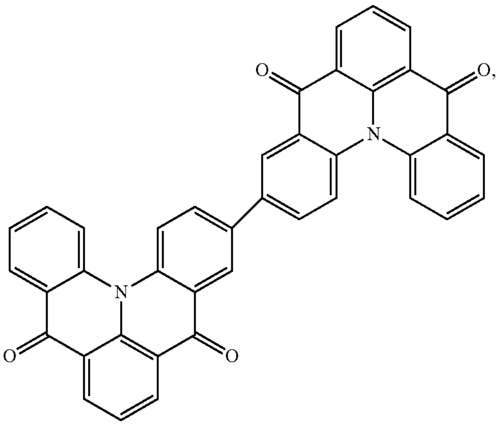
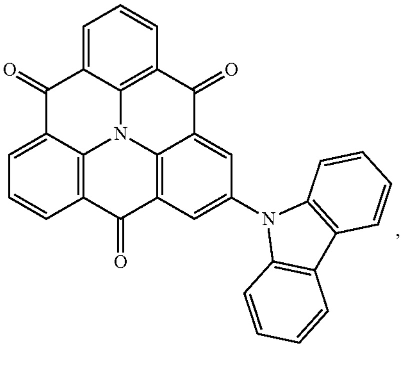
,
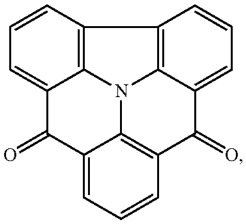
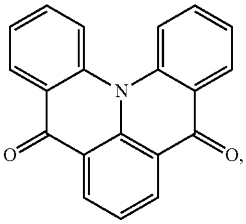
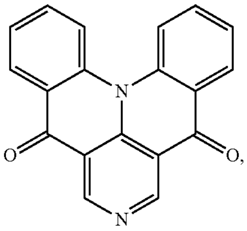

-continued
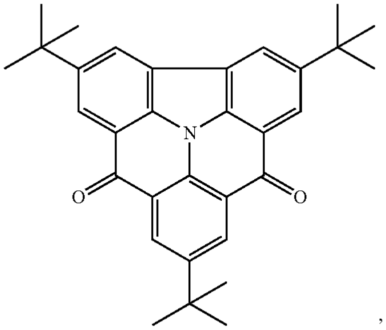
,
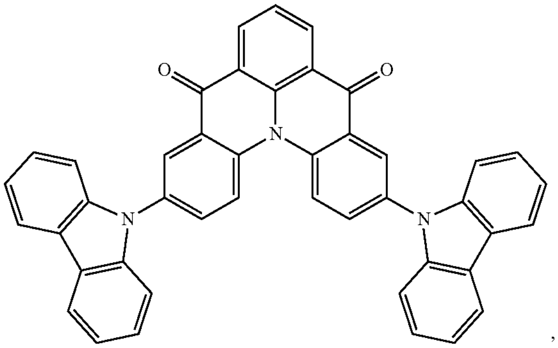
,
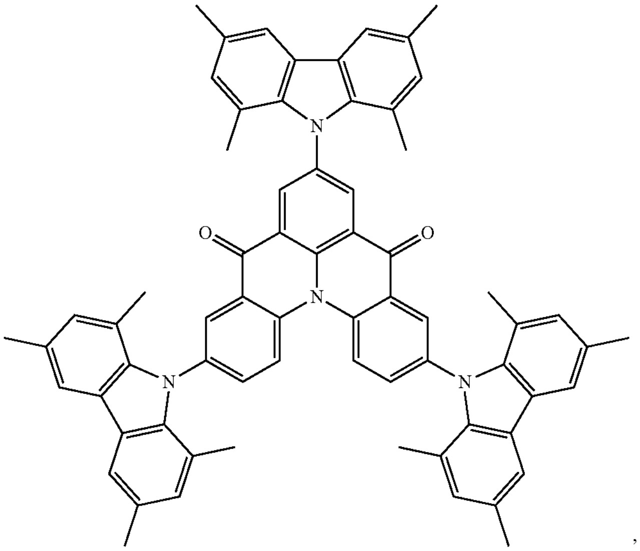
,
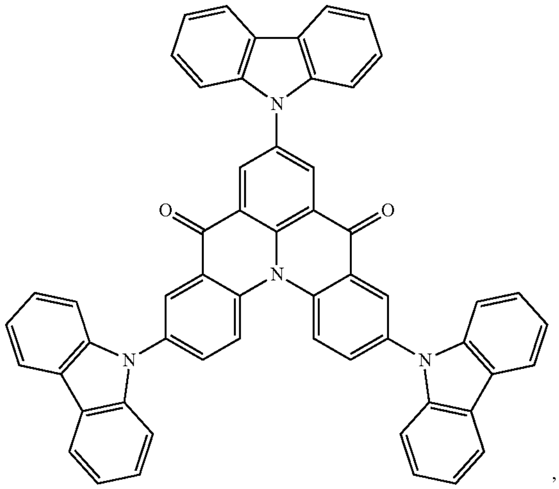
,
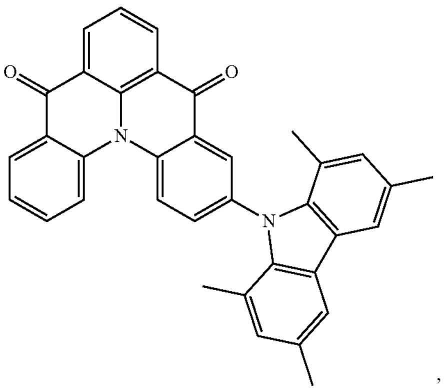
,
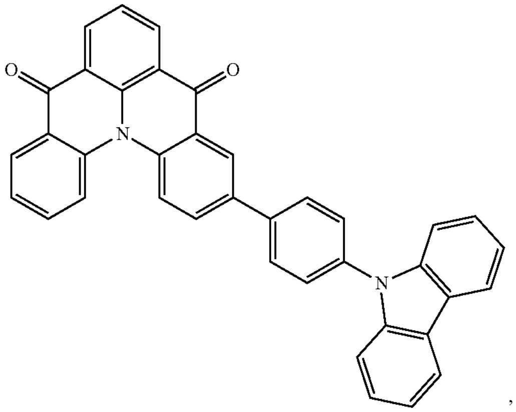
, -continued
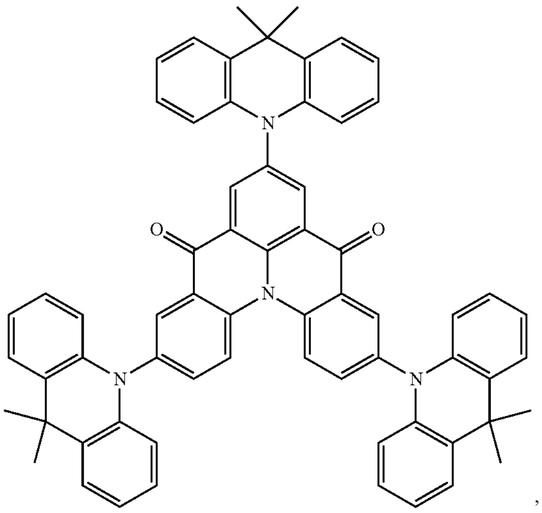
,
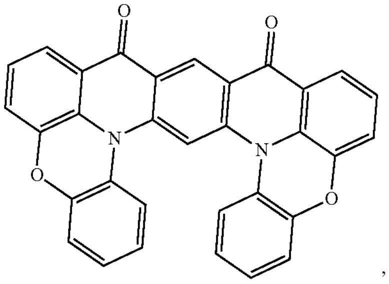
,
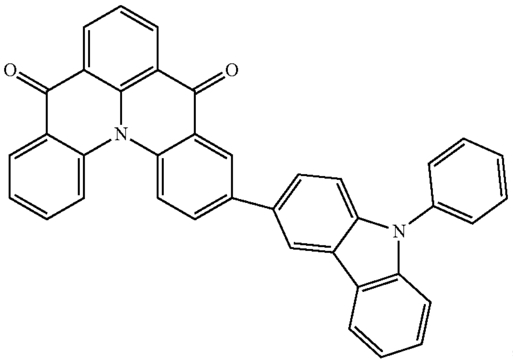
,
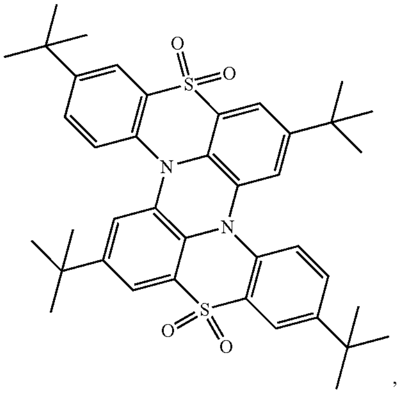
,
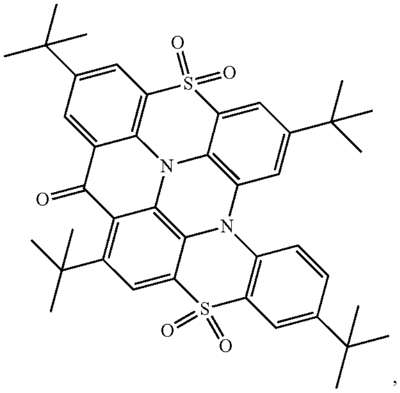
,
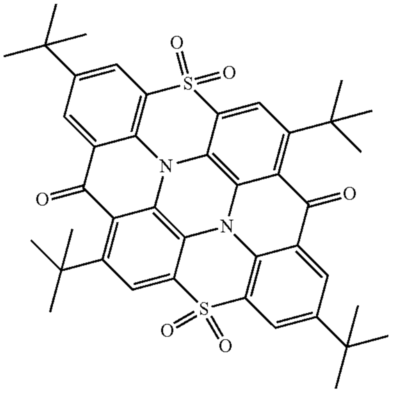
,
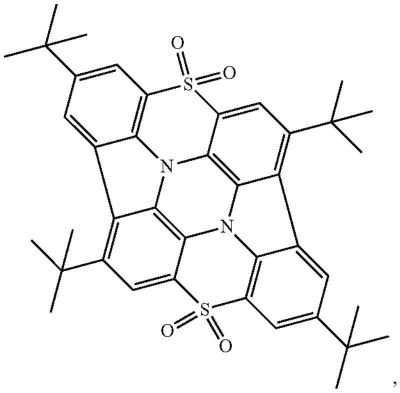
,
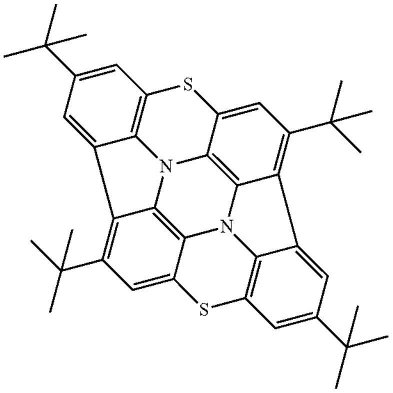
, -continued
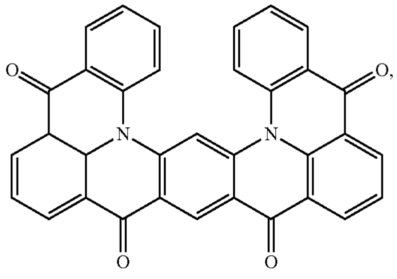,
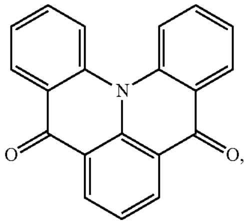,
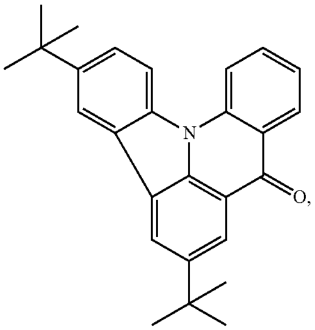,
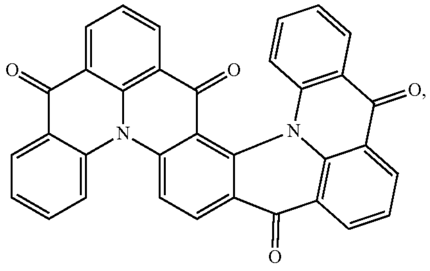,
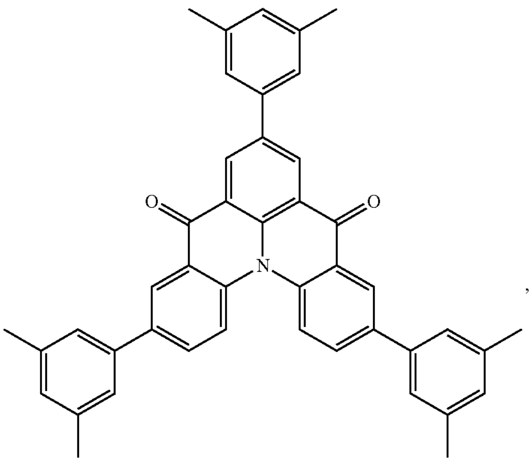,
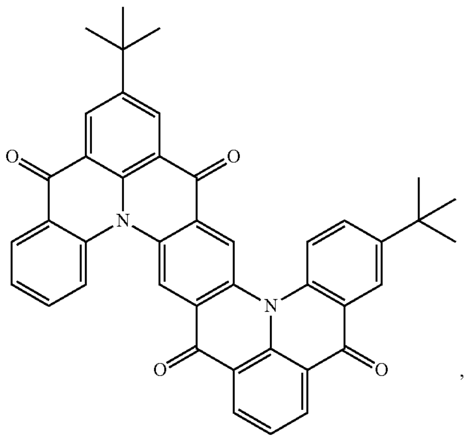,
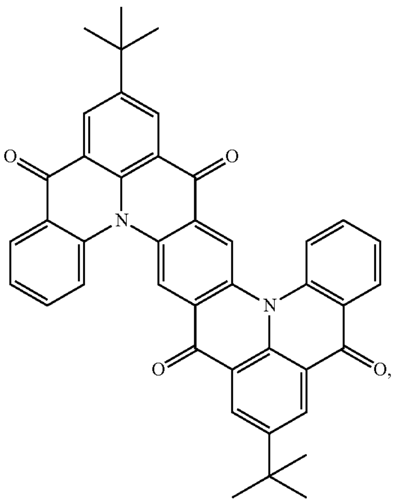, -continued
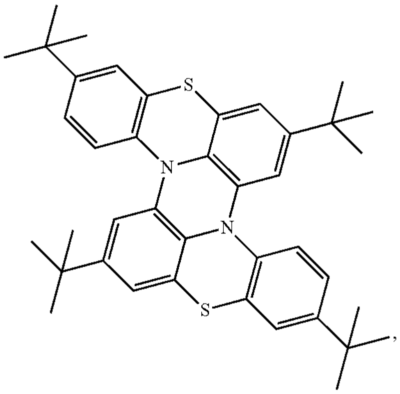,
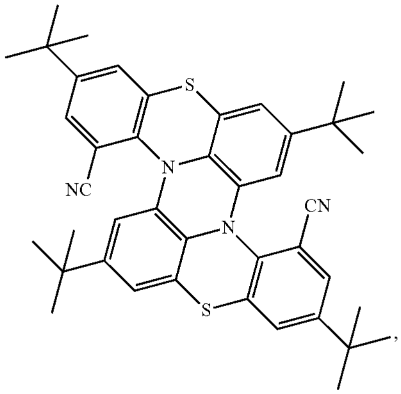,
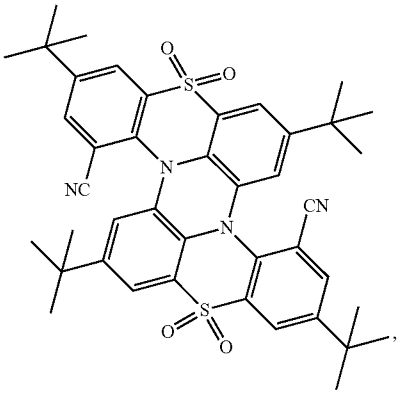,
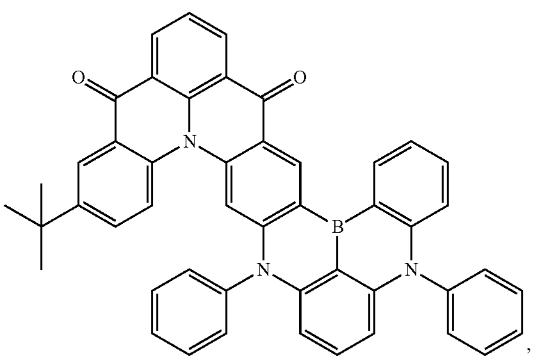,
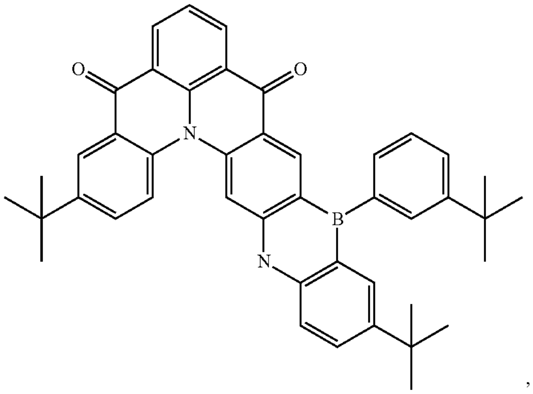,
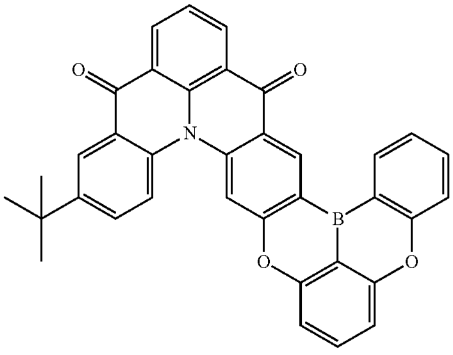,
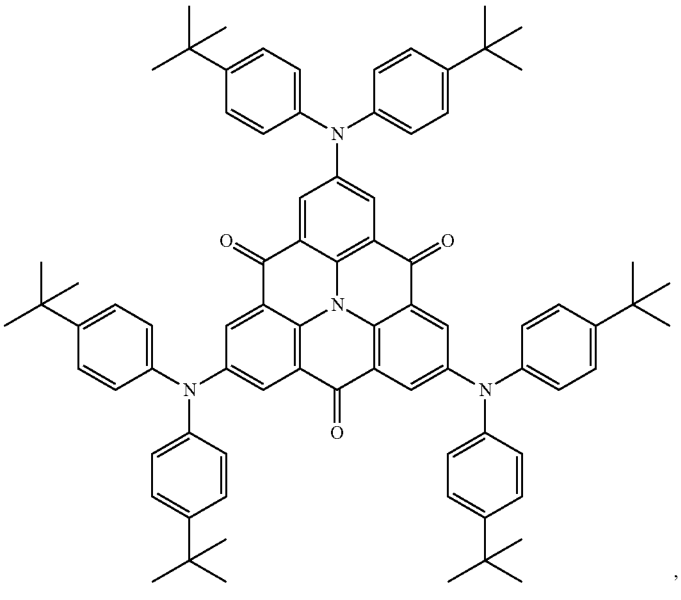, -continued
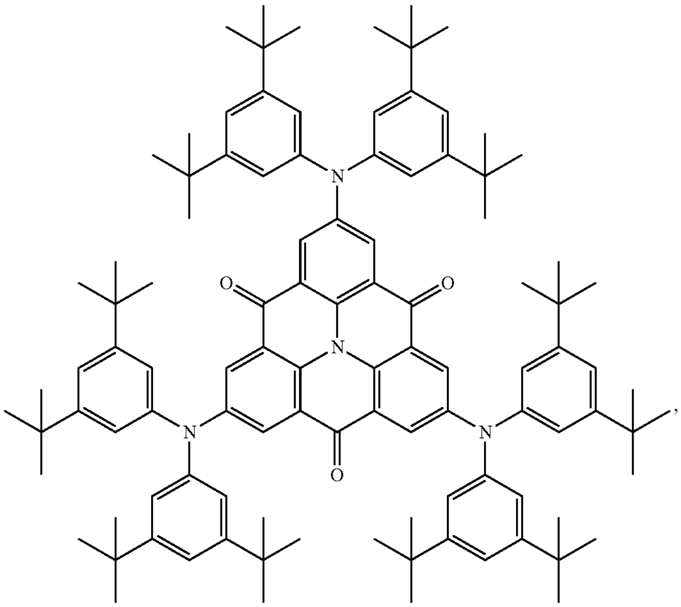
,
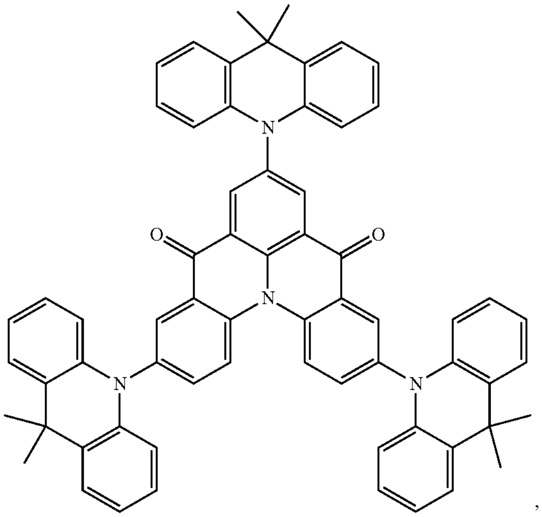
,
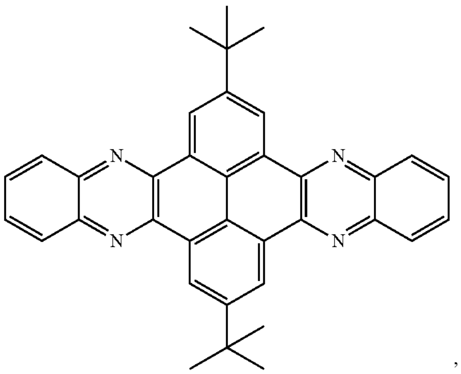
,
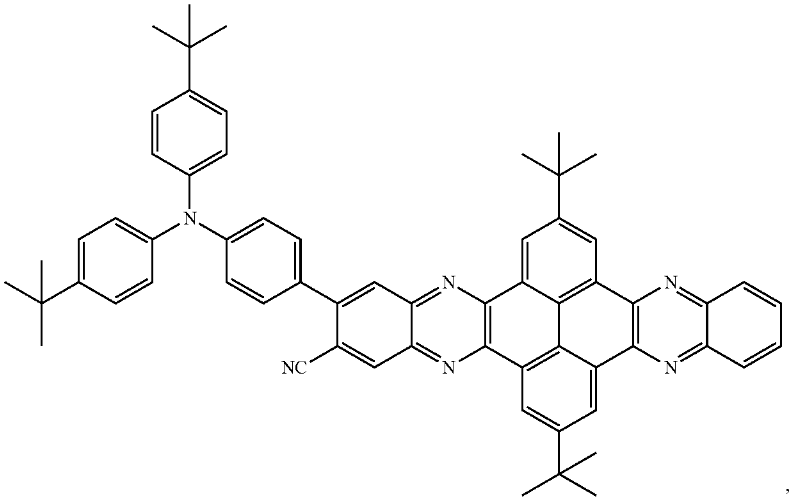
, and -continued

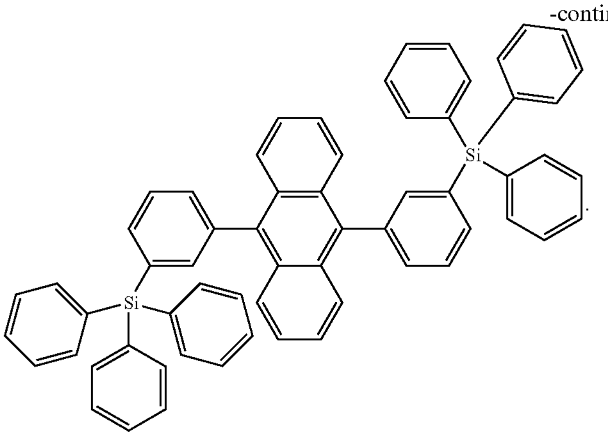

In some of the above embodiments, any carbon ring atoms up to maximum of a total number of three, together with their substituents, in each phenyl ring of any of above structures can be replaced with N.

In some embodiments, the acceptor compound comprises a fused ring system having at least five to fifteen 5-membered and/or 6-membered aromatic rings. In some embodiments, the acceptor compound has a first group and a second group with the first group not overlapping with the second group; wherein at least 80% of the singlet excited state population of the lowest singlet excitation state are localized in the first group; and wherein at least 80%, 85%, 90%, or 95% of the triplet excited state population of the lowest triplet excitation state are localized in the second group.

In some embodiments, the emissive region further comprises a first host. In some embodiments, the sensitizer compound forms an exciplex with the first host in the OLED at room temperature. In some embodiments, the first host has a LUMO energy that is lower than the LUMO energies of the sensitizer compound and the acceptor compound in the emissive region. In some embodiments, the first host has a HOMO energy that is lower than the HOMO energies of the sensitizer compound and the acceptor compound in the emissive region. In some embodiments, the first host has a HOMO energy that is higher than the HOMO energies of the sensitizer compound and the acceptor compound in the emissive region. In some embodiments, the first host has a HOMO energy that is higher than the HOMO energy of at least one of the sensitizer compound and the acceptor compound in the emissive region.

In some embodiments, the emissive region further comprises a second host. In some embodiments, the first host forms an exciplex with the second host in the OLED at room temperature. In some embodiments, the concentrations of the first and second hosts in the layer or layers containing the first and second host are greater than the concentrations of the sensitizer compound and the acceptor compound in the layer or layers containing the sensitizer compound and the acceptor compound. In some embodiments, the concentrations of the first and second hosts in the layer or layers containing the first and second host are greater than the concentrations of the acceptor compound in the layer or layers containing the sensitizer compound and the acceptor compound.

In some embodiments, the Si energy of the first host is greater than that of the acceptor compound. In some embodiments, $T_1$ energy of the first host is greater than that of the sensitizer compound. In some embodiments, the sensitizer compound has a HOMO energy that is greater than that of the acceptor compound. In some embodiments, the second host has a HOMO level that is shallower than that of the acceptor compound. In some embodiments, the HOMO level of the acceptor compound is deeper than at least one selected from the sensitizer compound and the first host.

In some embodiments, the first host and/or the second host comprises at least one chemical group selected from the group consisting of triphenylene, carbazole, indolocarbazole, dibenzothiophene, dibenzofuran, dibenzoselenophene, 5$\lambda^2$-benzo[d]benzo[4,5]imidazo[3,2-a]imidazole, 5,9-dioxa-13b-boranaphtho[3,2,1-de]anthracene, triazine, boryl, silyl, aza-triphenylene, aza-carbazole, aza-indolocarbazole, aza-dibenzothiophene, aza-dibenzofuran, aza-dibenzoselenophene, aza-5$\lambda^2$-benzo[d]benzo[4,5]imidazo[3,2-a]imidazole, and aza-(5,9-dioxa-13b-boranaphtho[3,2,1-de]anthracene).

In some embodiments, each of the first host and/or the second host is independently selected from the group consisting of:

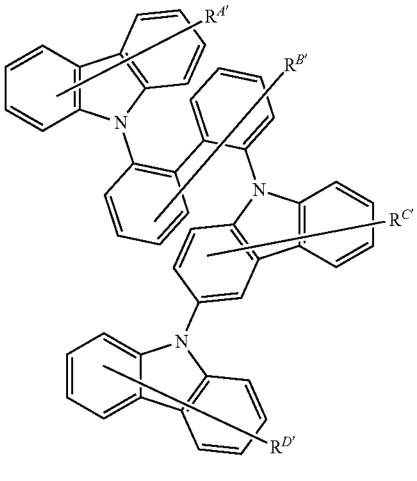

,

-continued
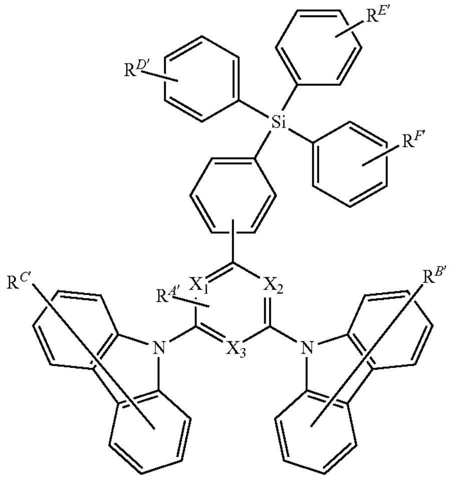
,
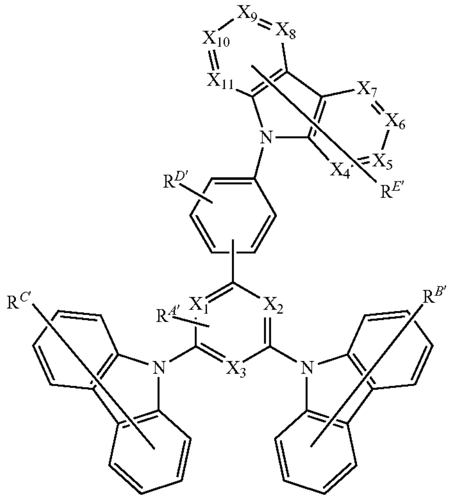
,
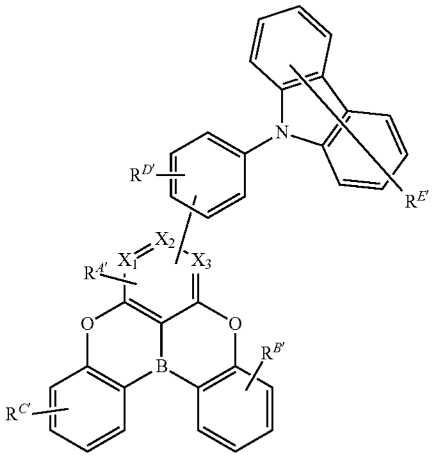
,
-continued
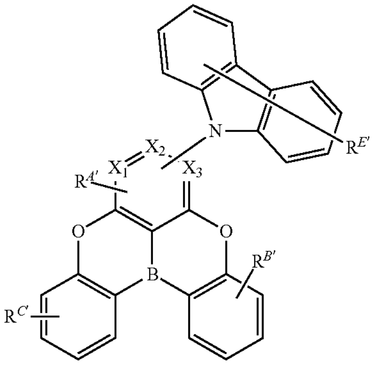
,
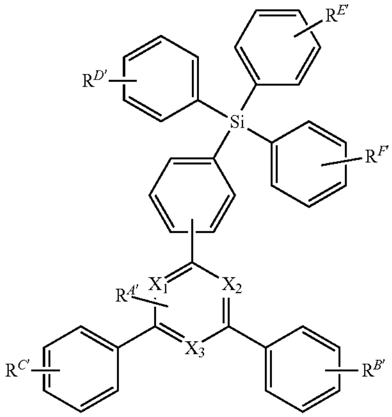
,
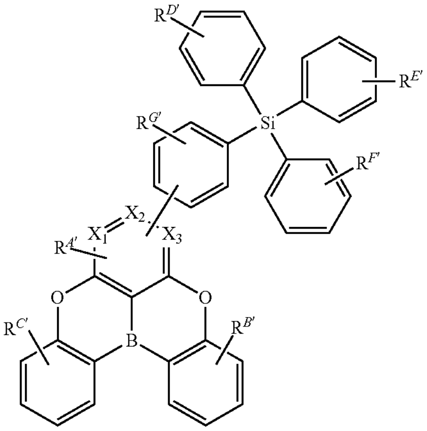
,
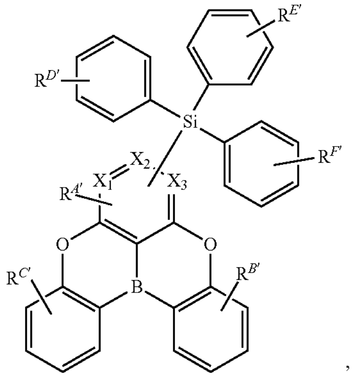
, -continued
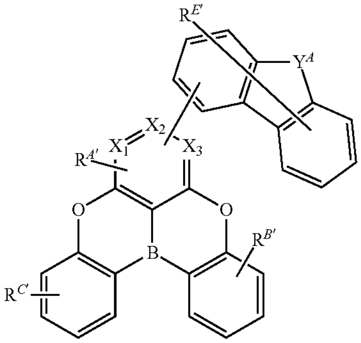
,
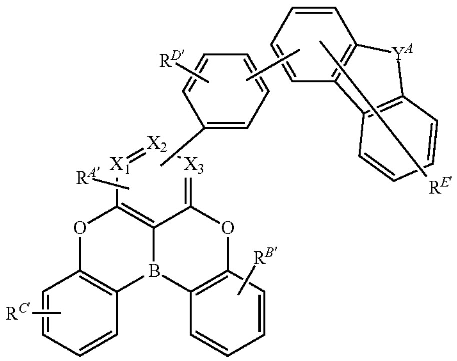
,
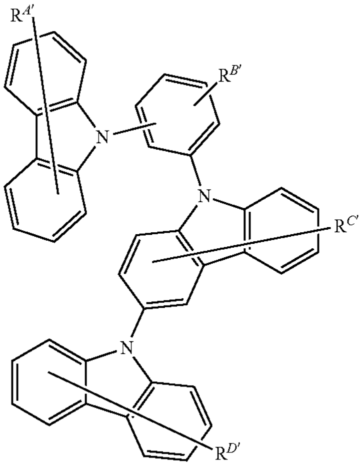
,
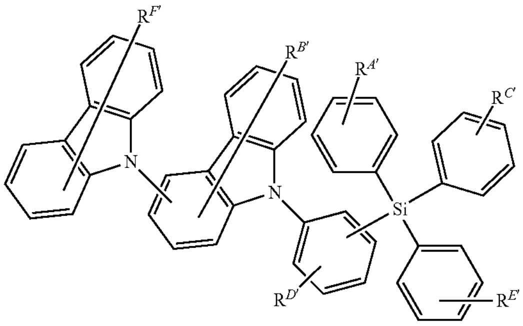
,
-continued
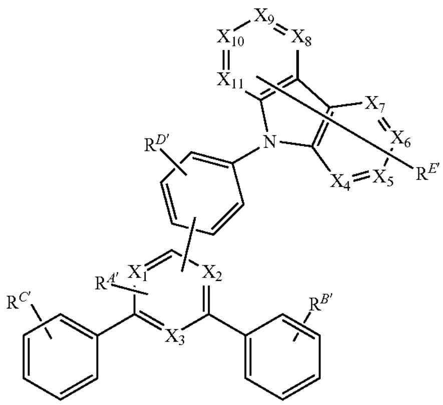
,
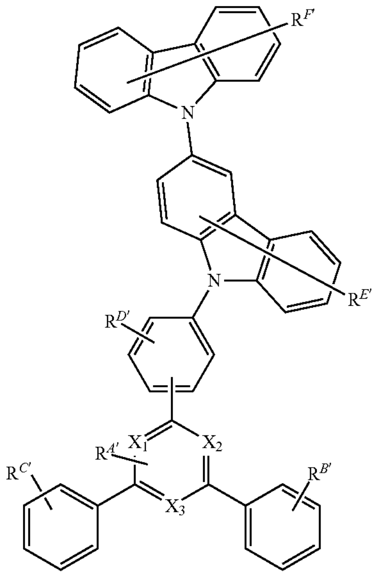
,
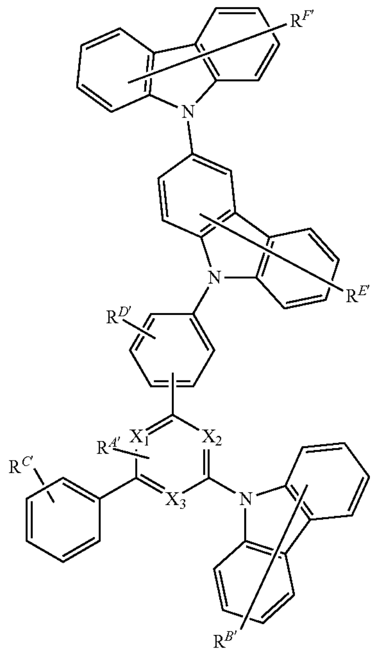
, -continued
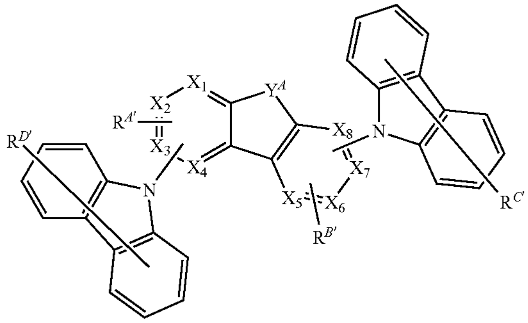
,
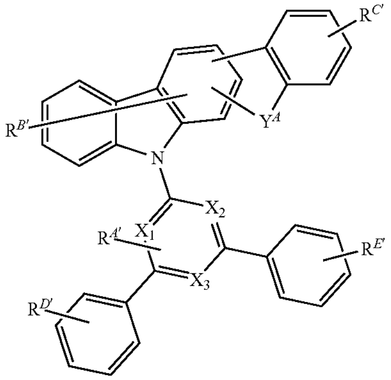
,
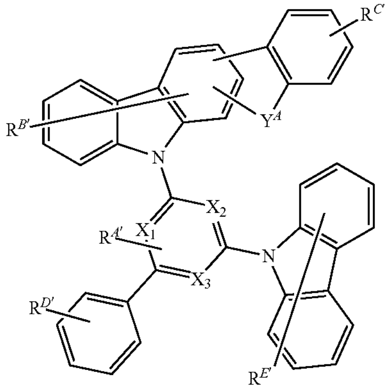
,
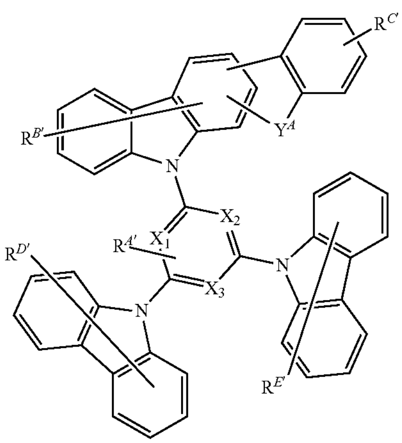
,
-continued
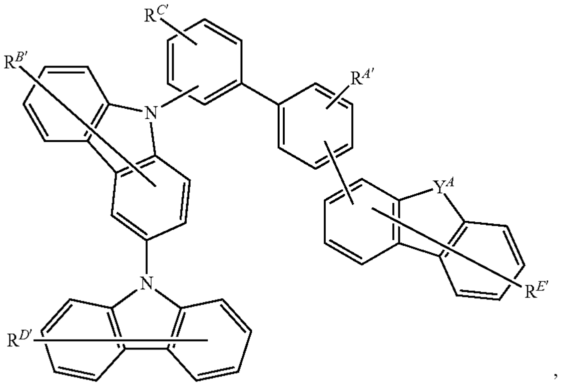
,
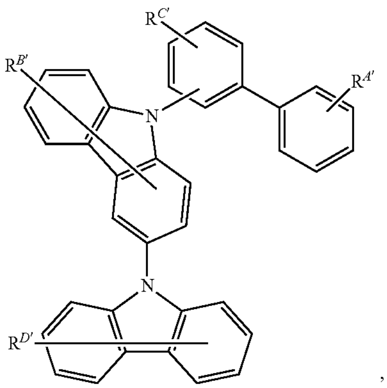
,
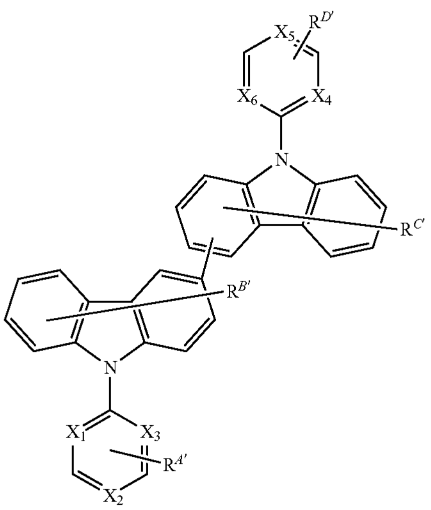
, -continued
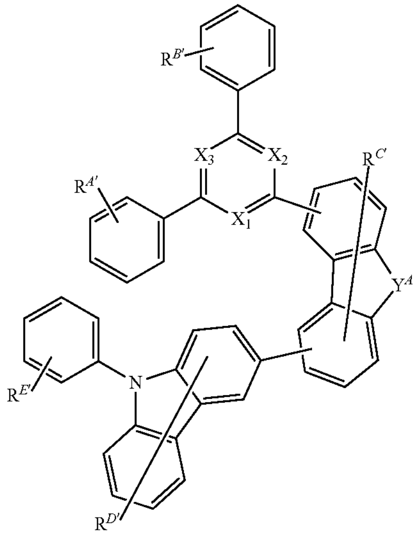
,
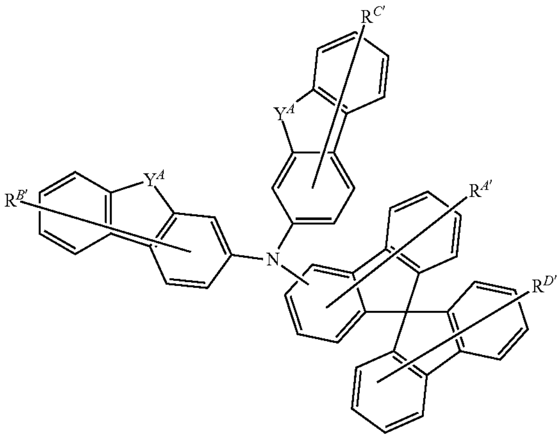
,
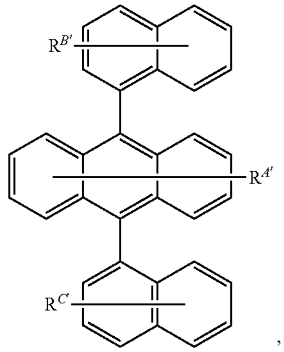
,
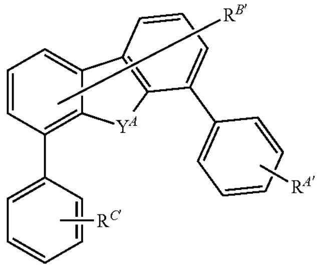
,
-continued
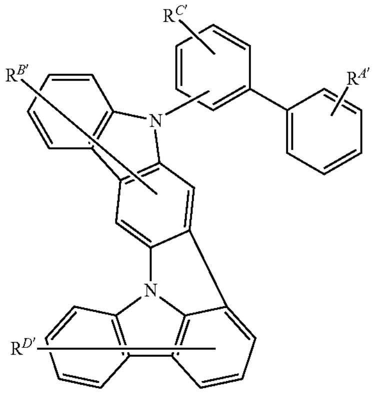
,
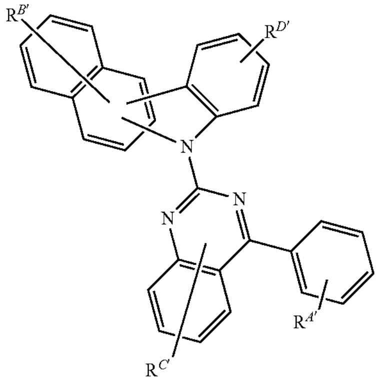
,
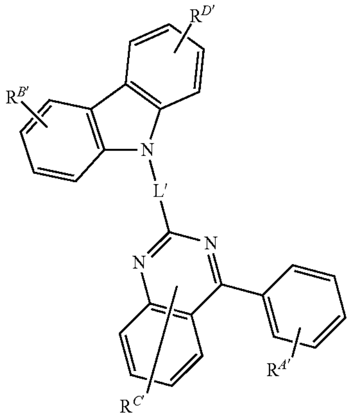
,
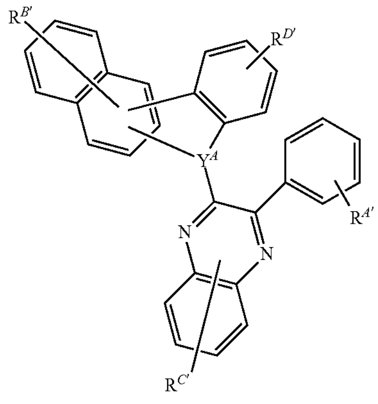
, -continued
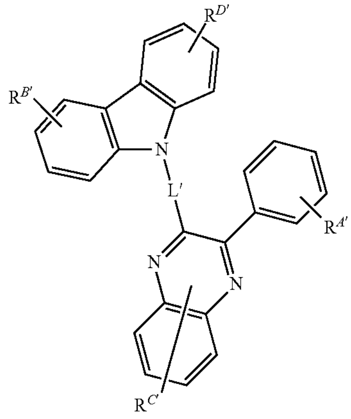
,
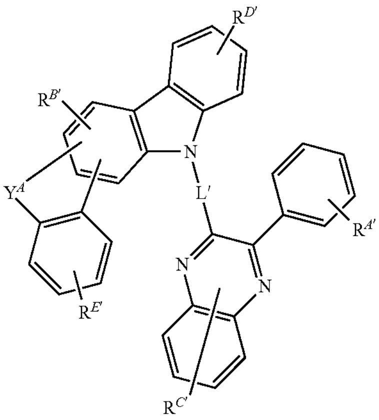
,
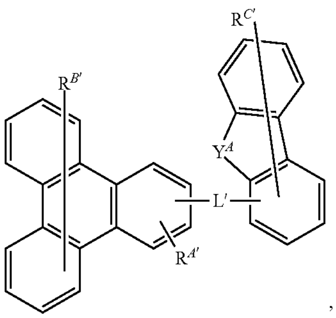
,
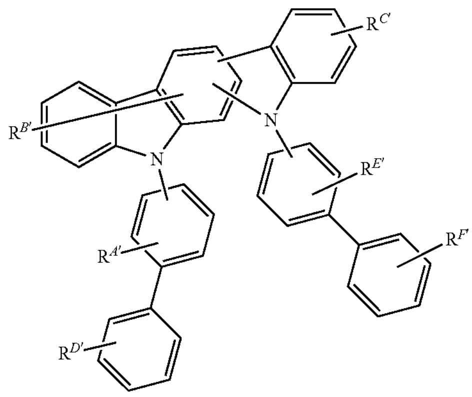
,
-continued
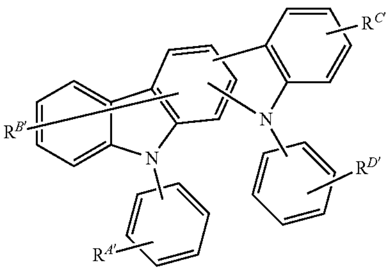
,
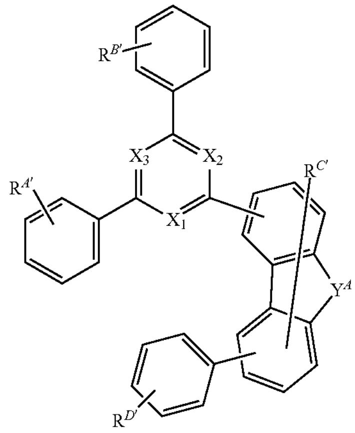
,
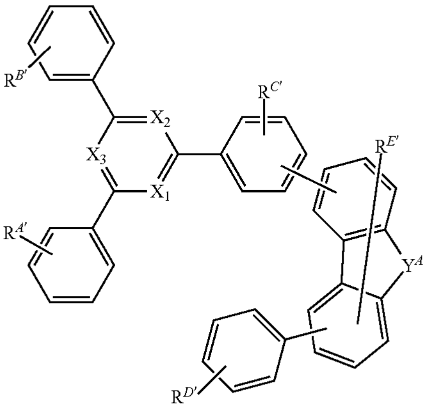
,
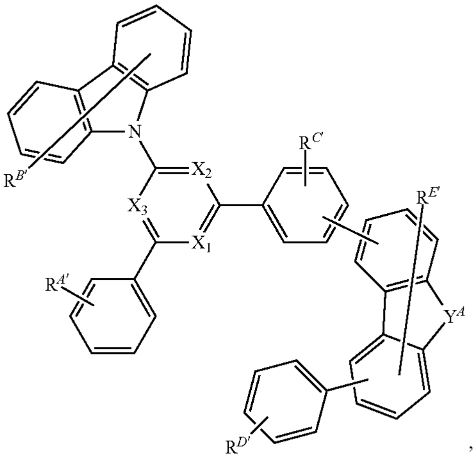
, -continued
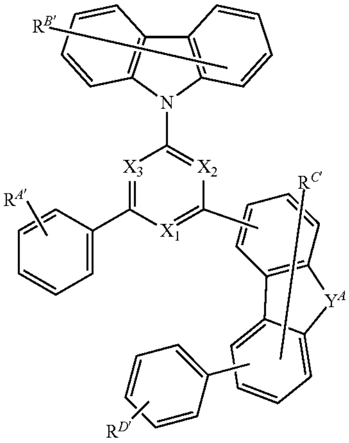
,
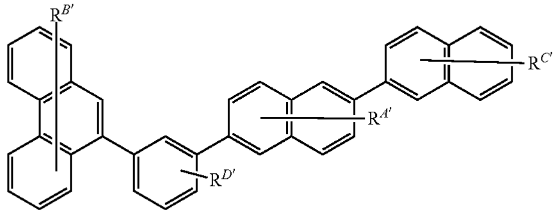
,
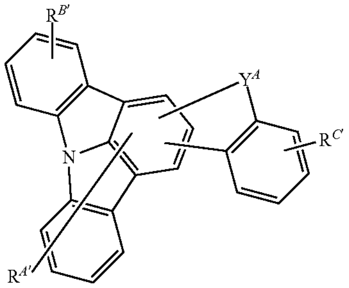
,
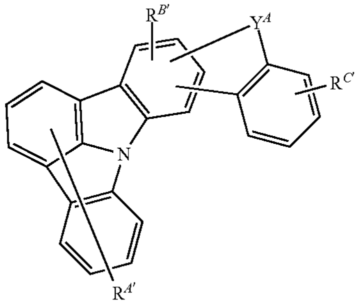
,
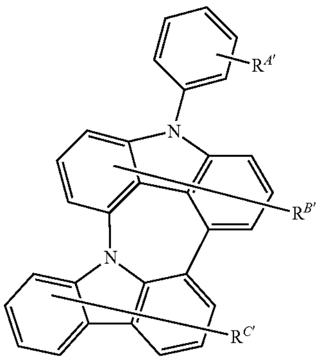
,
-continued
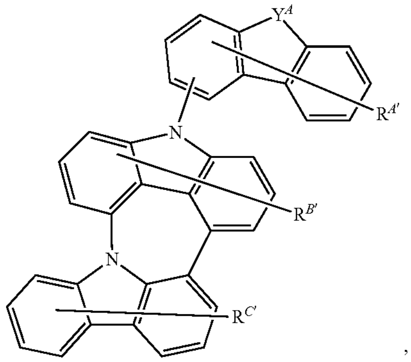
,
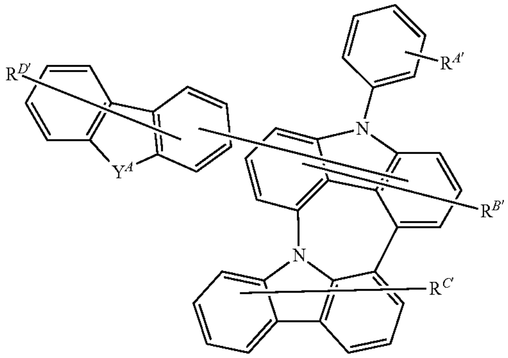
,
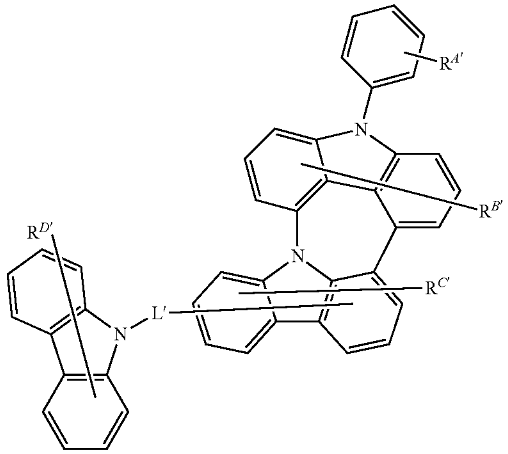
,
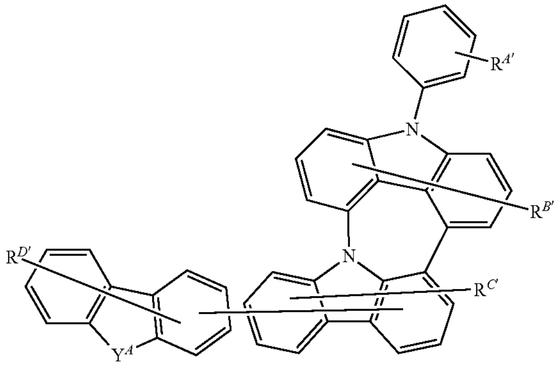
, -continued
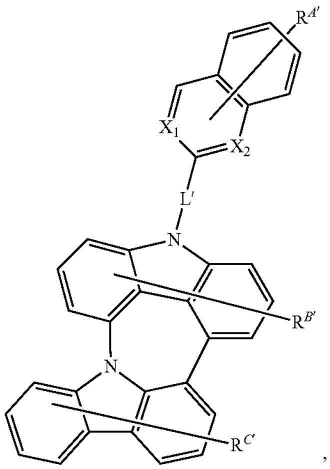
,
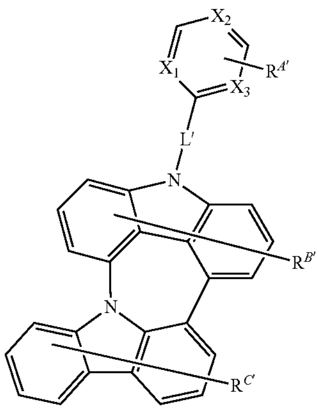
,
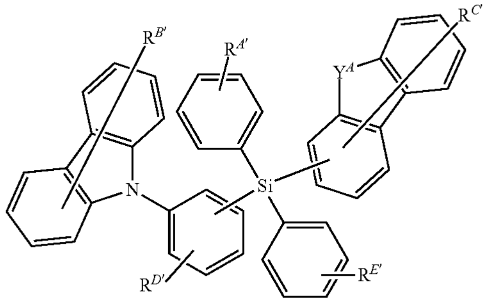
,
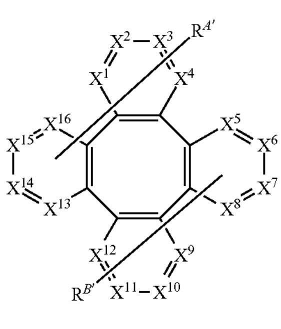
,
-continued
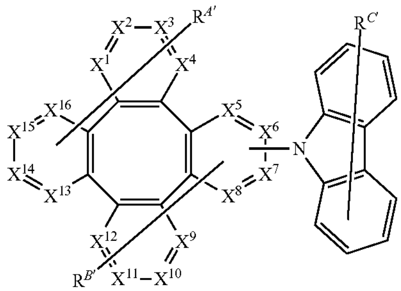
,
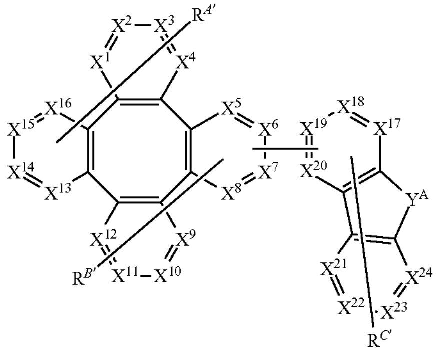
,
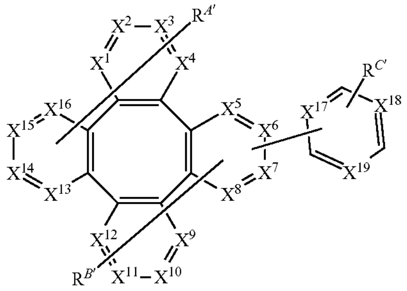
,
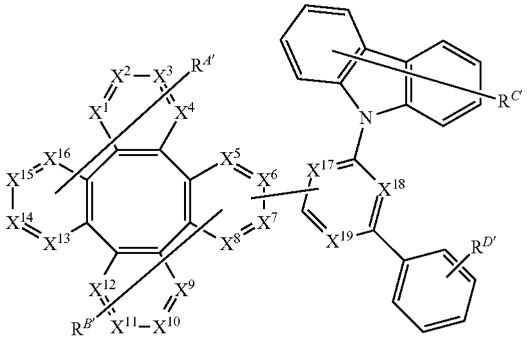
,
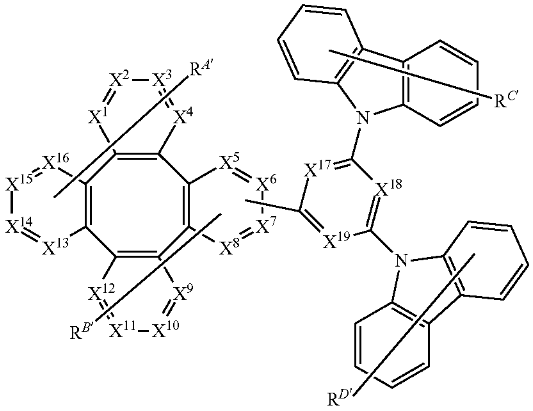
, -continued
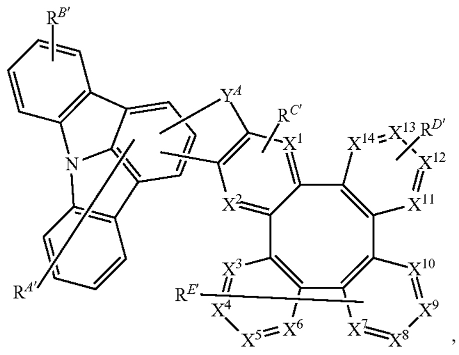
,
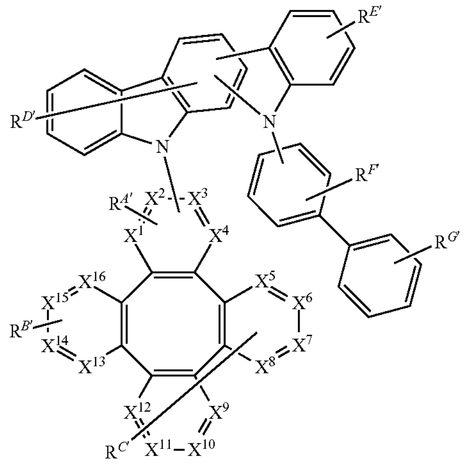
,
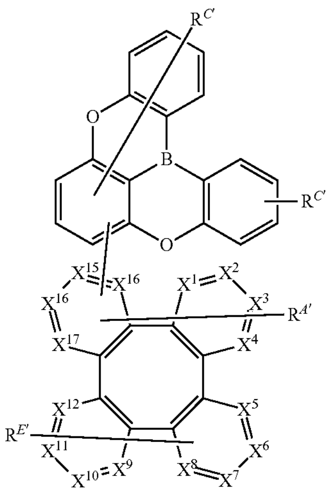
,
-continued
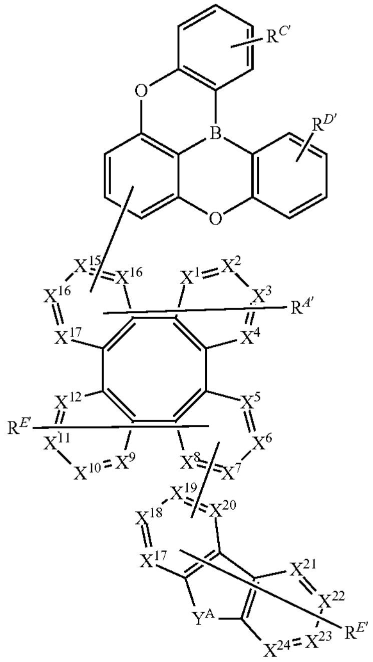
,
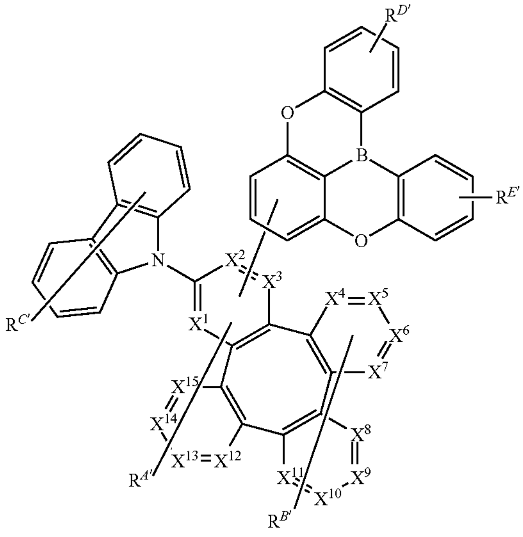
,
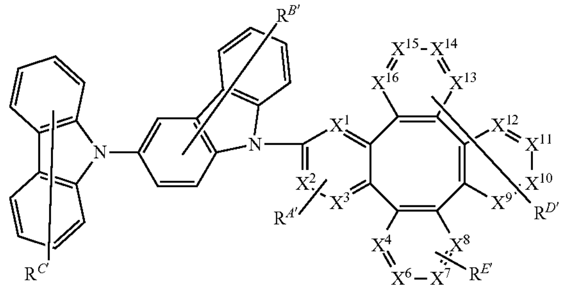
, -continued

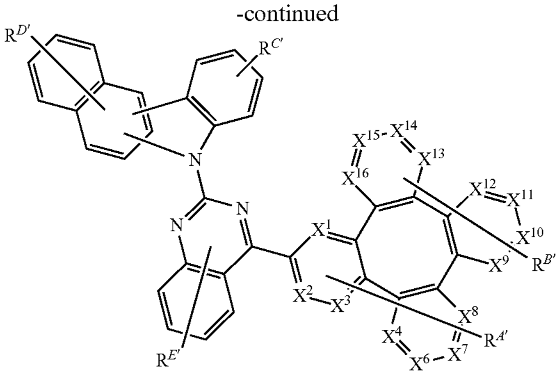

,

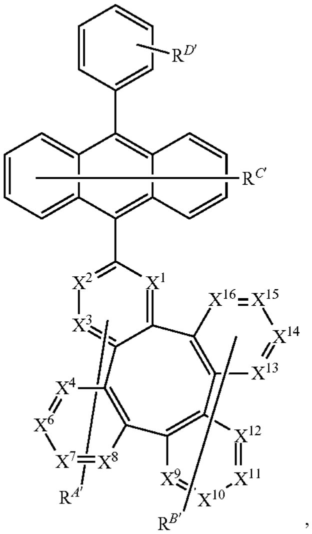

, and

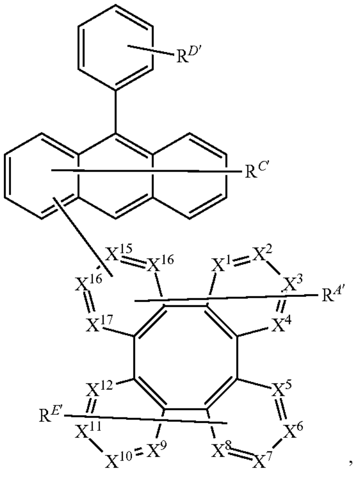

, wherein:

each of $X^1$ to $X^{24}$ is independently C or N;

L' is a direct bond or an organic linker;

each $Y^A$ is independently selected from the group consisting of absent a bond, O, S, Se, CRR', SiRR', GeRR', NR, BR, BRR';

each of $R^{A'}$, $R^{B'}$, $R^{C'}$, $R^{D'}$, $R^{E'}$, $R^{F'}$, and $R^{G'}$ independently represents mono, up to the maximum substitutions, or no substitutions;

each of R, R', $R^{A'}$, $R^{B'}$, $R^{C'}$, $R^{D'}$, $R^{E'}$, $R^{F'}$, and $R^{G'}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; two adjacent of$^{RA'}$, $R^{B'}$, $R^{C'}$, $R^{D'}$, $R^{E'}$, $R^{F'}$, and $R^{G'}$ are optionally joined or fused to form a ring.

In yet another aspect, the OLED of the present disclosure may also comprise an emissive region containing a formulation of the compounds as disclosed in the present disclosure. In some embodiments, the emissive region consists of one or more organic layers, wherein at least one of the one or more organic layers has a minimum thickness selected from the group consisting of 350, 400, 450, 500, 550, 600, 650 and 700 Å. In some embodiments, the at least one of the one or more organic layers are formed from an Emissive System that has a figure of merit (FOM) value equal to or larger than the number selected from the group consisting of 2.50, 2.55, 2.60, 2.65, 2.70, 2.75, 2.80, 2.85, 2.90, 2.95, 3.00, 5.00, 10.0, 15.0, and 20.0. The definition of FOM is available in U.S. patent Application Publication No. 2023/0292605, and its entire contents are incorporated herein by reference. In some embodiments, the at least one of the one or more organic layers comprises a compound or a formulation of the compound as disclosed in Sections A and D of the present disclosure.

In some embodiments, the OLED or the emissive region comprising an inventive composition disclosed herein can be incorporated into a full-color pixel arrangement of a device. The full-color pixel arrangement of such device comprises at least one pixel, wherein the at least one pixel comprises a first subpixel and a second subpixel. The first subpixel includes a first OLED comprising a first emissive region. The second subpixel includes a second OLED comprising a second emissive region. In some embodiments, the first and/or second OLED, the first and/or second emissive region can be the same or different and each can independently have the various device characteristics and the various embodiments of the inventive compounds included therein, and various combinations and subcombinations of the various device characteristics and the various embodiments of the inventive compounds included therein, as disclosed herein.

In some embodiments, the first emissive region is configured to emit a light having a peak wavelength $\lambda_{max1}$; the second emissive region is configured to emit a light having a peak wavelength $\lambda_{max2}$. In some embodiments, the difference between the peak wavelengths $\lambda_{max1}$ and $\lambda_{max2}$ is at least 4 nm but within the same color. For example, a light blue and a deep blue light as described above. In some embodiments, a first emissive region is configured to emit a light having a peak wavelength $\lambda_{max1}$ in one region of the visible spectrum of 400-500 nm, 500-600 nm, 600-700 nm; and a second emissive region is configured to emit light having a peak wavelength $\lambda_{max2}$ in one of the remaining regions of the visible spectrum of 400-500 nm, 500-600 nm, 600-700 nm. In some embodiments, the first emissive region comprises a first number of emissive layers that are deposited one over the other if more than one; and the second emissive region comprises a second number of emissive layers that is deposited one over the other if more than one; and the first number is different from the second number. In some embodiments, both the first emissive region and the second emissive region comprise a phosphorescent material, which may be the same or different. In some embodiments, the first emissive region comprises a phosphorescent material, while the second emissive region comprises a fluorescent material. In some embodiments, both the first emissive region and the second emissive region comprise a fluorescent material, which may be the same or different.

In some embodiments, the at least one pixel of the OLED or emissive regions includes a total of N subpixels; wherein the N subpixels comprises the first subpixel and the second subpixel; wherein each of the N subpixels comprises an emissive region; wherein the total number of the emissive regions within the at least one pixel is equal to or less than N−1. In some embodiments, the second emissive region is exactly the same as the first emissive region; and each subpixel of the at least one pixel comprises the same one emissive region as the first emissive region. In some embodiments, the full-color pixel arrangements can have a plurality of pixels comprising a first pixel region and a second pixel region; wherein at least one display characteristic in the first pixel region is different from the corresponding display characteristic of the second pixel region, and wherein the at least one display characteristic is selected from the group consisting of resolution, cavity mode, color, outcoupling, and color filter.

In some embodiments, the OLED is a stacked OLED comprising one or more charge generation layers (CGLs). In some embodiments, the OLED comprises a first electrode, a first emissive region disposed over the first electrode, a first CGL disposed over the first emissive region, a second emissive region disposed over the first CGL, and a second electrode disposed over the second emissive region. In some embodiments, the first and/or the second emissive regions can have the various device characteristics as described above for the pixelated device. In some embodiments, the stacked OLED is configured to emit white color. In some embodiments, one or more of the emissive regions in a pixelated or in a stacked OLED comprises a sensitizer and an acceptor with the various sensitizing device characteristics and the various embodiments of the inventive compounds disclosed herein. For example, the first emissive region is comprised in a sensitizing device, while the second emissive region is not comprised in a sensitizing device; in some instances, both the first and the second emissive regions are comprised in sensitizing devices.

In some embodiments, the OLED can emit light having at least 1%, 5%, 10, 30%, 50%, 70%, 80%, 90%, 95%, 99%, or 100% from the plasmonic mode. In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. In some embodiments, the enhancement layer is provided no more than a threshold distance away from the organic emissive layer, wherein the emitter material has a total non-radiative decay rate constant and a total radiative decay rate constant due to the presence of the enhancement layer. A threshold distance is where the total non-radiative decay rate constant is equal to the total radiative decay rate constant. Another threshold distance is the distance at which the total radiative decay rate constant divided by the sum of the total non-radiative decay rate constant and total radiative decay rate constant is equal to the photoluminescent yield of the emissive material without the enhancement layer present.

To reduce the amount of Dexter energy transfer between the sensitizer compound and the acceptor compound, it would be preferable to have a large distance between the center of mass of the sensitizer compound and the center of mass of the closest neighboring acceptor compound in the emissive region. Therefore, in some embodiments, the distance between the center of mass of the acceptor compound and the center of mass of the sensitizer compound is at least 2, 1.5, 1.0, or 0.75 nm.

Preferred acceptor/sensitizer VDR combination (A): In some embodiments, it is preferable for the VDR of the acceptor to be less than 0.33 in order to reduce the coupling of the transition dipole moment of the emitting acceptor to the plasmon modes, compared to an isotropic emitter, in order to achieve a higher outcoupling efficiency. In some cases, when the VDR of the acceptor is less than 0.33, it would be preferable for the VDR of the sensitizer to be less than 0.33 in order to improve the coupling of the transition dipole moments of the sensitizer and acceptor to optimize the Forster energy transfer rate. Accordingly, in some embodiments of the inventive OLED, the acceptor compound in the inventive OLED exhibits a VDR value equal to or less than 0.33, 0.30, 0.25, 0.2, 0.15, 0.10, 0.08, or 0.05 when the VDR is measured with an emissive thin film test sample that has the acceptor compound as the only emitter; and the sensitizer compound in the inventive OLED exhibits a VDR value equal to or less than 0.33, 0.30, 0.25, 0.2, 0.15, 0.10, 0.08, or 0.05 when the VDR is measured with an emissive thin film test sample that has the sensitizer compound as the only emitter.

Preferred acceptor/sensitizer VDR combination (B): In some embodiments, it is preferable for the VDR of the acceptor to be less than 0.33 in order to reduce the coupling of the transition dipole moment of the emitting acceptor to the plasmon modes compared to an isotropic emitter in order to achieve a higher outcoupling efficiency. In some cases, when the VDR of the acceptor is less than 0.33, it would be preferable to minimize the intermolecular interactions between the sensitizer and acceptor to decrease the degree of Dexter quenching. By changing the molecular geometry of the sensitizer to reduce the intermolecular interactions, it may be preferable to have a sensitizer with a VDR greater than 0.33. Accordingly, in some embodiments of the inventive OLED, the acceptor compound in the inventive OLED exhibits a VDR value equal to or less than 0.33, 0.30, 0.25, 0.2, 0.15, 0.10, 0.08, or 0.05 when the VDR is measured with an emissive thin film test sample that has the acceptor compound as the only emitter; and the sensitizer compound in the inventive OLED exhibits a VDR value larger than 0.33, 0.4, 0.5, 0.6, or 0.7 when the VDR is measured with an emissive thin film test sample that has the sensitizer compound as the only emitter.

Preferred acceptor/sensitizer VDR combination (C): In some embodiments, it is preferable for the VDR of the acceptor to be greater than 0.33 in order to increase the coupling of the transition dipole moment of the acceptor to the plasmon modes compared to an isotropic emitter in order to decrease the transient lifetime of the excited states in the emissive layer. In some cases, the increased coupling to the plasmon modes can be paired with an enhancement layer in a plasmonic OLED device to improve efficiency and extend operational lifetime. In some cases, when the VDR of the acceptor is greater than 0.33, it would be preferable to minimize the intermolecular interactions between the sensitizer and acceptor to decrease the degree of Dexter quenching. By changing the molecular geometry of the sensitizer to reduce the intermolecular interactions, it may be preferable to have a sensitizer with a VDR less than 0.33. Accordingly, in some embodiments of the inventive OLED, the acceptor compound in the inventive OLED exhibits a VDR value larger than 0.33, 0.4, 0.5, 0.6, or 0.7 when the VDR is measured with an emissive thin film test sample that has the acceptor compound as the only emitter; and the sensitizer compound in the inventive OLED exhibits a VDR value equal to or less than 0.33, 0.30, 0.25, 0.2, 0.15, 0.10, 0.08, or 0.05 when the VDR is measured with an emissive thin film test sample that has the sensitizer compound as the only emitter.

Preferred acceptor/sensitizer VDR combination (D): In some embodiments, it is preferable for the VDR of the acceptor to be greater than 0.33 in order to increase the coupling of the transition dipole moment of the acceptor to the plasmon modes compared to an isotropic emitter in order to decrease the transient lifetime of the excited states in the emissive layer. In some cases, the increased coupling to the plasmon modes can be paired with an enhancement layer in a plasmonic OLED device to improve efficiency and extend operational lifetime. In some cases, when the VDR of the acceptor is greater than 0.33, it would be preferable for the VDR of the sensitizer to be greater than 0.33 in order to improve the coupling of the transition dipole moments of the sensitizer and acceptor to optimize the Forster energy transfer rate. Accordingly, in some embodiments of the inventive OLED, the acceptor compound in the inventive OLED exhibits a VDR value larger than 0.33, 0.4, 0.5, 0.6, or 0.7 when the VDR is measured with an emissive thin film test sample that has the acceptor compound as the only emitter; and the sensitizer compound in the inventive OLED exhibits a VDR value larger than 0.33, 0.4, 0.5, 0.6, or 0.7 when the VDR is measured with an emissive thin film test sample that has the sensitizer compound as the only emitter.

Figure 3:
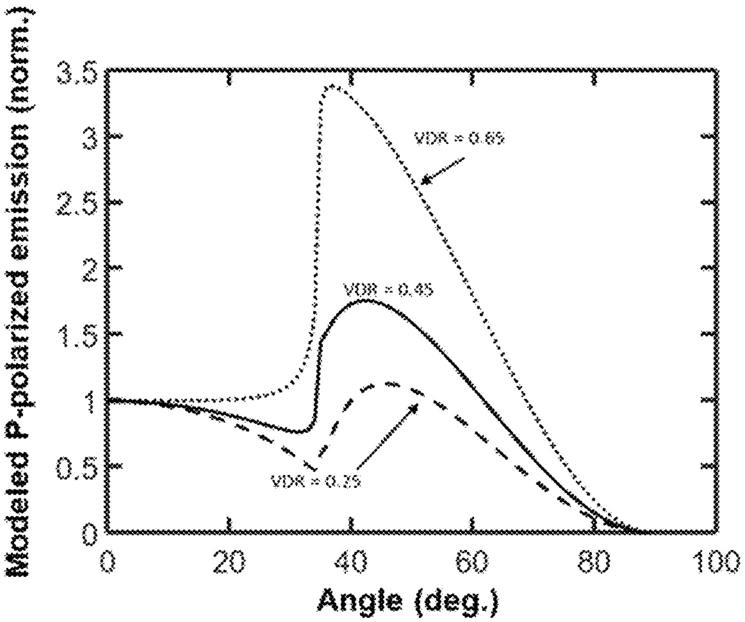
FIG. 3 shows a graph of modeled P-polarized photoluminescence as a function of angle for emitters with different vertical dipole ratio (VDR) values.

VDR is the ensemble average fraction of vertically oriented molecular dipoles of the light-emitting compound in a thin film sample of an emissive layer, where the orientation “vertical” is relative to the plane of the surface of the substrate (i.e., normal to the surface of the substrate plane) on which the thin film sample is formed. A similar concept is horizontal dipole ratio (HDR) which is the ensemble average fraction of horizontally oriented molecular dipoles of the light-emitting compound in a thin film sample of an emissive layer, where the orientation “horizontal” is relative to the plane of the surface of the substrate (i.e. parallel to the surface of the substrate plane) on which the thin film sample is formed. By definition, VDR+HDR=1. VDR can be measured by angle dependent, polarization dependent, photoluminescence measurements. By comparing the measured emission pattern of a photo-excited thin film test sample, as a function of polarization, to the computationally modeled pattern, one can determine VDR of the thin film test sample emission layer. For example, a modelled data of p-polarized emission is shown in FIG. 3. The modelled p-polarized angle photoluminescence (PL) is plotted for emitters with different VDRs. A peak in the modelled PL is observed in the p-polarized PL around the angle of 45 degrees with the peak PL being greater when the VDR of the emitter is higher.

To measure VDR values of the thin film test samples, a thin film test sample can be formed with the acceptor compound or the sensitizer compound (depending on whether the VDR of the acceptor compound or the sensitizer compound is being measured) as the only emitter in the thin film and a Reference Host Compound A as the host. Preferably, the Reference Host Compound A is

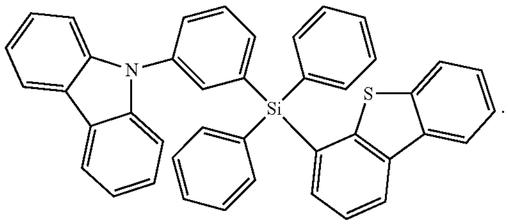 [SMILES: c1ccc([Si](c2ccccc2)(c2cccc(-n3c4ccccc4c4ccccc43)c2)c2cccc3c2sc2ccccc23)cc1]

The thin film test sample is formed by thermally evaporating the emitter compound and the host compound on a substrate. For example, the emitter compound and the host compound can be co-evaporated. In some embodiments, the doping level of the emitter compounds in the host can be from 0.1 wt. % to 50 wt. %. In some embodiments, the doping level of the emitter compounds in the host can be from 3 wt. % to 20 wt. % for blue emitters. In some embodiments, the doping level of the emitter compounds in the host can be from 1 wt. % to 15 wt. % for red and green emitters. The thickness of the thermally evaporated thin film test sample can have a thickness of from 50 to 1000 Å.

In some embodiments, the OLED of the present disclosure can comprise a sensitizer, an acceptor, and one or more hosts in the emissive region, and the preferred acceptor/sensitizer VDR combinations (A)-(D) mentioned above are still applicable. In these embodiments, the VDR values for the acceptor compound can be measured with a thin film test sample formed of the one or more hosts and the acceptor, where the acceptor is the only emitter in the thin film test sample. Similarly, the VDR values for the sensitizer compound can be measured with a thin film test sample formed of the one or more hosts and the sensitizer, where the sensitizer is the only emitter in the thin film test sample.

In the example used to generate FIG. 3, a 30 nm thick film of material with a refractive index of 1.75 and the emission is monitored in a semi-infinite medium with a refractive index of 1.75. Each curve is normalized to a photoluminescence intensity of 1 at an angle of zero degrees, which is perpendicular to the surface of the film. As the VDR of the emitter is varied, the peak around 45 degrees increases greatly. When using a software to fit the VDR of experimental data, the modeled VDR would be varied until the difference between the modeled data and the experimental data is minimized.

Because the VDR represents the average dipole orientation of the light-emitting compound in the thin film sample, even if there are additional emission capable compounds in the emissive layer, if they are not contributing to the light emission, the VDR measurement does not reflect their VDR. Further, by inclusion of a host material that interacts with the light-emitting compound, the VDR of the light-emitting compound can be modified. Thus, a light-emitting compound in a thin film sample with host material A will exhibit one measured VDR value and that same light-emitting compound in a thin film sample with host material B will exhibit a different measured VDR value. Further, in some embodiments, exciplex or excimers are desirable which form emissive states between two neighboring molecules. These emissive states may have a VDR that is different than that if only one of the components of the exciplex or excimer were emitting or present in the sample.

In some embodiments, the OLED is a plasmonic OLED. In some embodiments, the OLED is a wave-guided OLED.

In some embodiments, the emissive region can further include a second host. In some embodiments, the second host comprises a moiety selected from the group consisting of bicarbazole, indolocarbazole, triazine, pyrimidine, pyridine, and boryl. In some embodiments, the second host has a HOMO level that is shallower than that of the acceptor compound.

In some embodiments, the OLED emits a white light at room temperature when a voltage is applied across the device.

In some embodiments, the OLED emits a luminescent radiation at room temperature when a voltage is applied across the device; wherein the luminescent first radiation component contributed from the acceptor compound with an emission $\lambda_{max1}$ being independently selected from the group consisting of larger than 340 nm to equal or less than 500 nm, larger than 500 nm to equal or less than 600 nm, and larger than 600 nm to equal or less than 900 nm. In some embodiments, the first radiation component has FWHM of 50, 40, 35, 30, 25, 20, 15, 10, or 5 nm or less. In some embodiments, the first radiation component has a 10% onset of the emission peak that is less than 465, 460, 455, or 450 nm.

In some embodiments, the sensitizer compound is partially or fully deuterated. In some embodiments, the acceptor compound is partially or fully deuterated. In some embodiments, the first host is partially or fully deuterated. In some embodiments, the second host is partially or fully deuterated.

In some embodiments, one of the first and second hosts is a hole transporting host, the other one of the first and second host is an electron transporting host. In some embodiments, the first host is a hole transporting host; and wherein the first host comprises at least one chemical group selected from the group consisting of amino, carbazole, indolocarbazole, dibenzothiophene, dibenzofuran, dibenzoselenophene, and 5$\lambda'^2$-benzo[d]benzo[4,5]imidazo[3,2-a]imidazole. In some embodiments, the first host is an electron transporting host; and wherein the first host comprises at least one chemical group selected from the group consisting of pyridine, pyrimidine, pyrazine, pyridazine, triazine, imidazole, aza-triphenylene, aza-carbazole, aza-dibenzothiophene, aza-dibenzofuran, aza-dibenzoselenophene, 5,9-dioxa-13b-boranaphtho[3,2,1-de]anthracene, boryl, aza-5$\lambda^2$-benzo[d]benzo[4,5]imidazo[3,2-a]imidazole, and aza-(5,9-dioxa-13b-boranaphtho[3,2,1-de]anthracene).

In some embodiments, the OLED further comprises a color conversion layer or a color filter.

In some embodiments, a formulation can comprise at least two different compounds of the following compounds: a sensitizer compound, an acceptor compound and a host.

In some embodiments, a chemical structure selected from the group consisting of a monomer, a polymer, a macromolecule, and a supramolecule, wherein the chemical structure comprises at least two of the following components: a sensitizer compound, an acceptor compound and a host.

In some embodiments, a premixed co-evaporation source is disclosed that is a mixture that at least comprises a first compound and a second compound; wherein the co-evaporation source is a co-evaporation source for vacuum deposition process or OVJP process; wherein the first compound and the second compound are differently selected from the group 1 consisting of: a sensitizer compound, an acceptor compound, a first host compound; and a second host compound; wherein the first compound has an evaporation temperature T1 of 150 to 350° C.; wherein the second compound has an evaporation temperature T2 of 150 to 350° C.; wherein absolute value of T1-T2 is less than 20° C.; wherein the first compound has a concentration C1 in said mixture and a concentration C2 in a test film formed by evaporating the mixture in a vacuum deposition tool at a constant pressure between $1\times10^{-6}$ Torr to 1×10−9 Torr, at a 2 Å/sec deposition rate on a surface positioned at a predefined distance away from the mixture being evaporated; and wherein the absolute value of (C1−C2)/C1 is less than 5%. In some embodiments, the mixture further comprises a third compound; wherein the third compound is different from the first and the second compound, and is selected from the same group 1; wherein the third compound has an evaporation temperature T3 of 150 to 350° C., and wherein absolute value of T1-T3 is less than 20° C.

In some embodiments, the first compound has evaporation temperature T1 of 200 to 350° C. and the second compound has evaporation temperature T2 of 200 to 350° C. In some embodiments, the absolute value of $(C_1-C_2)/C_1$ is less than 3%. In some embodiments, the first compound has a vapor pressure of $P_1$ at T1 at 1 atm, and the second compound has a vapor pressure of $P_2$ at T2 at 1 atm; and wherein the ratio of $P_1/P_2$ is within the range of 0.90:1 to 1.10:1. In some embodiments, the first compound has a first mass loss rate and the second compound has a second mass loss rate, wherein the ratio between the first mass loss rate and the second mass loss rate is within the range of 0.90:1 to 1.10:1, 0.95:1 to 1.05:1, or 0.97:1 to 1.03:1. In some embodiments, the first compound and the second compound each has a purity in excess of 99% as determined by high pressure liquid chromatography. In some embodiments, the composition is in liquid form at a temperature less than the lesser of T1 and T2.

In some embodiments, a method for fabricating an organic light emitting device can comprises: providing a substrate having a first electrode disposed thereon; depositing a first organic layer over the first electrode by evaporating a pre-mixed co-evaporation source that is a mixture of a first compound and a second compound described above in a high vacuum deposition tool with a chamber base pressure between $1\times10^{-6}$ Torr to 1×10−9 Torr; and depositing a second electrode over the first organic layer.

It should be understood that embodiments of all the compounds and devices described herein may be interchangeable if those embodiments are also applicable under different aspects of the entire disclosure.

In some embodiments, each of the first compound, the second compound, the sensitizer compound, the acceptor compound, the host compound, described herein can be at least 10% deuterated, at least 20% deuterated, at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of possible hydrogen atoms (e.g., positions that are hydrogen or deuterium) that are replaced by deuterium atoms.

C. Other Aspects of the OLEDs of the Present Disclosure

In some embodiments, the OLED may further comprise an additional host, wherein the additional host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}{-}Ar_1$, or no substitution, wherein n is an integer from 1 to 10;

and wherein $Ar_1$ and $Ar_2$ are independently selected from the group consisting of benzene, biphenyl, naphthalene, triphenylene, carbazole, and heteroaromatic analogs thereof.

In some embodiments, the additional host comprises at least one chemical group selected from the group consisting of triphenylene, carbazole, indolocarbazole, dibenzothiophene, dibenzofuran, dibenzoselenophene, 522-benzo[d]benzo[4,5]imidazo[3,2-a]imidazole, 5,9-dioxa-13b-boranaphtho[3,2,1-de]anthracene, triazine, boryl, silyl, aza-triphenylene, aza-carbazole, aza-indolocarbazole, aza-dibenzothiophene, aza-dibenzofuran, aza-dibenzoselenophene, aza-5,2-benzo[d]benzo[4,5]imidazo[3,2-a]imidazole, and aza-(5,9-dioxa-13b-boranaphtho[3,2,1-de]anthracene).

In some embodiments, the additional host may be selected from the group consisting of:

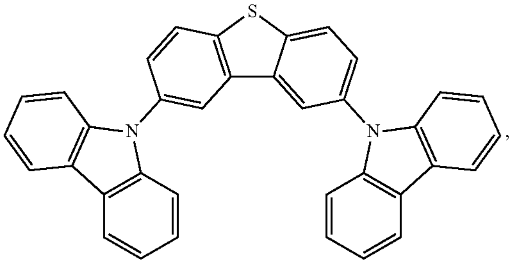

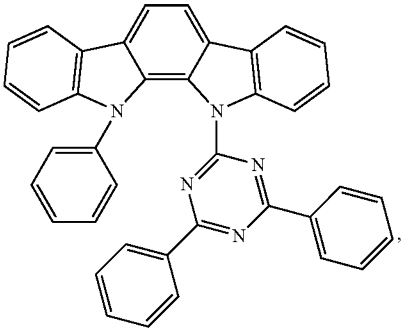

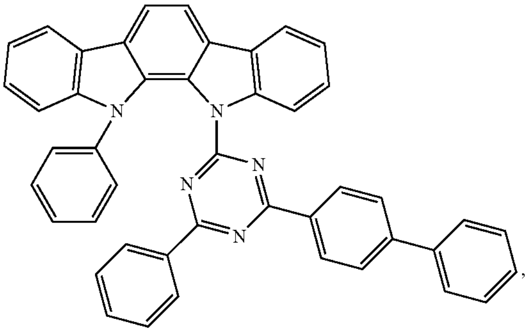

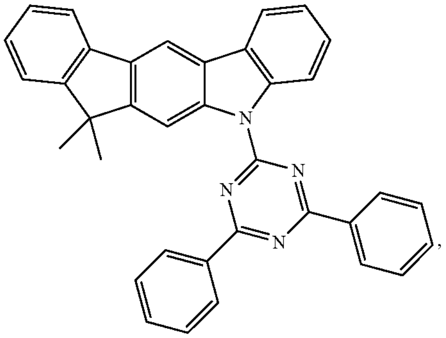

-continued

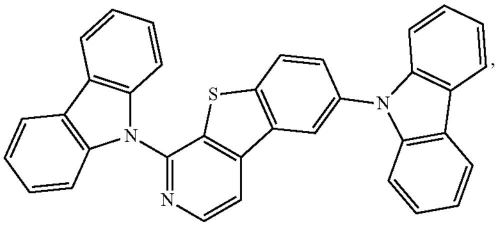

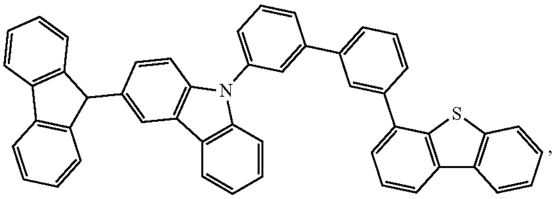

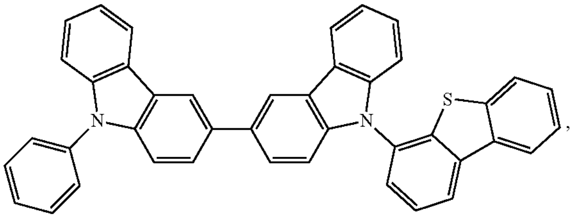

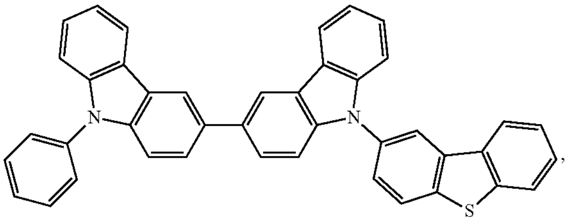

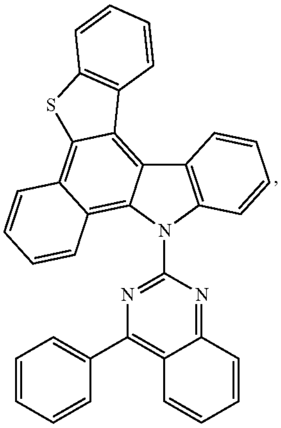

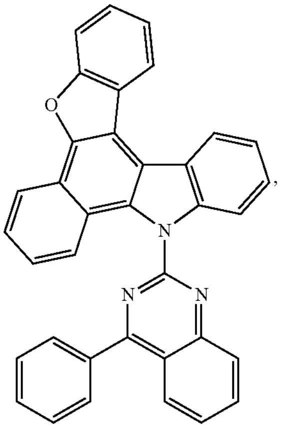

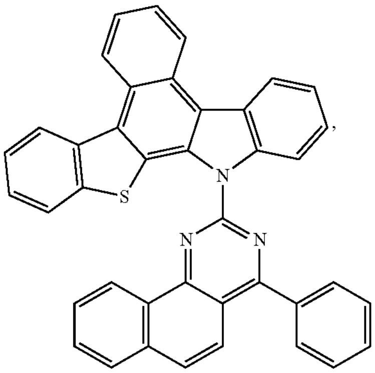

-continued
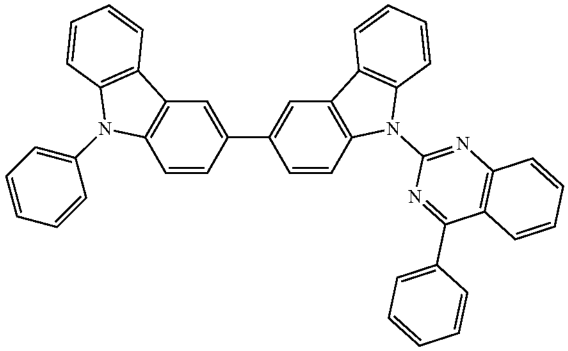
,
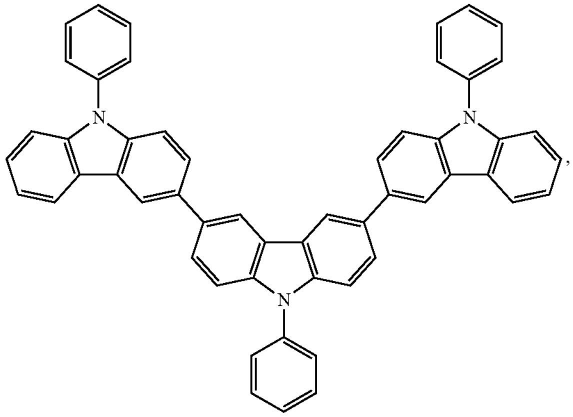
,
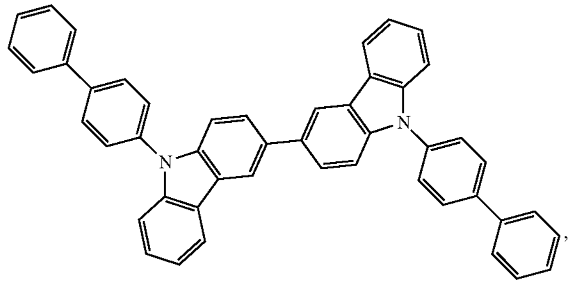
,
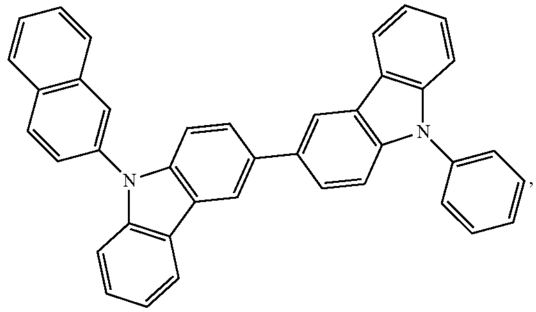
,
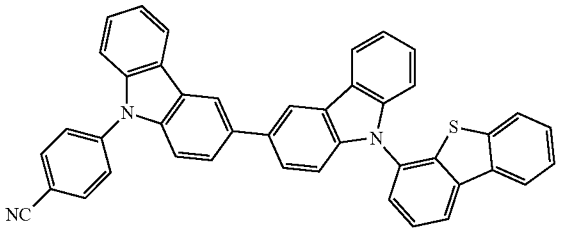
,
-continued
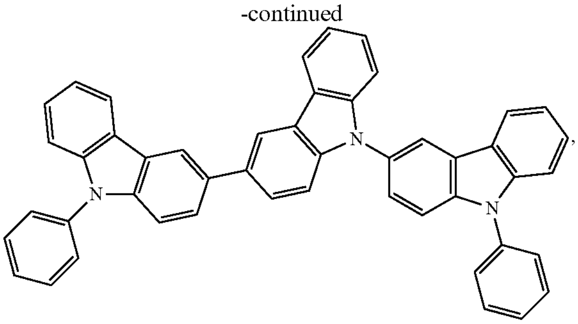
,
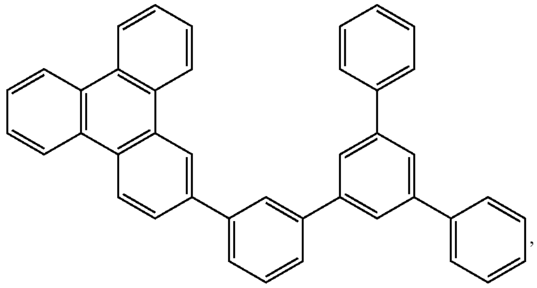
,
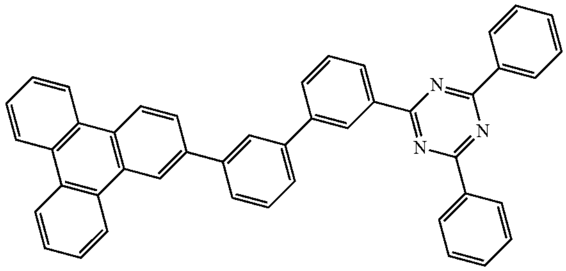
,
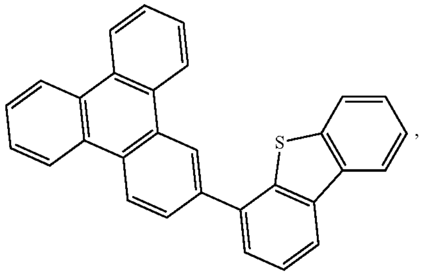
,
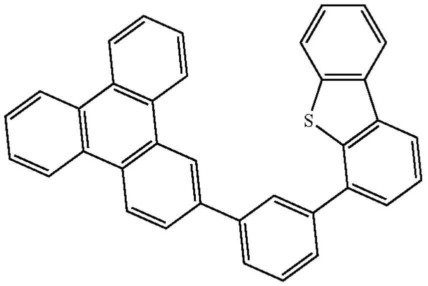
,
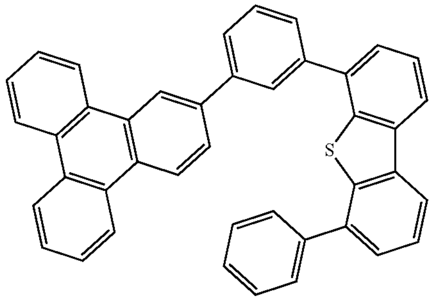
, -continued
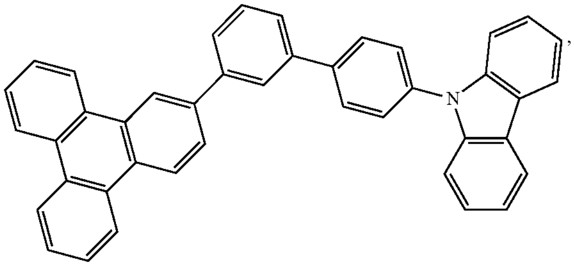
,
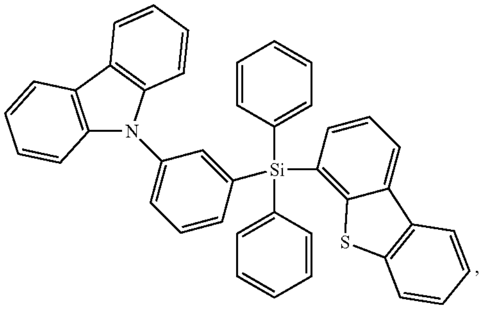
,
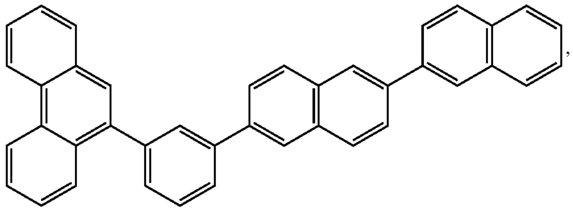
,
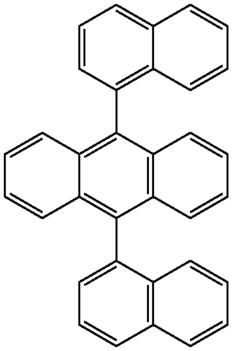
,
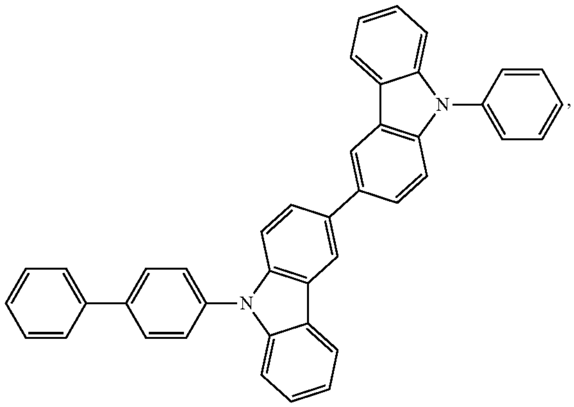
,
-continued
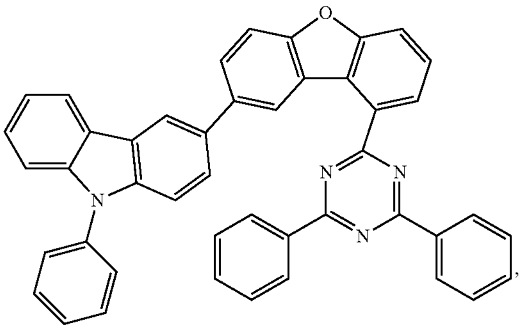
,
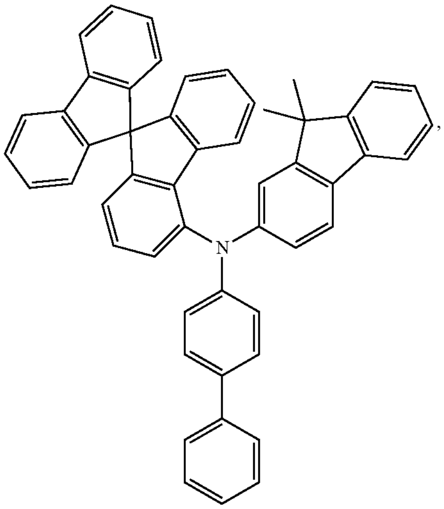
,
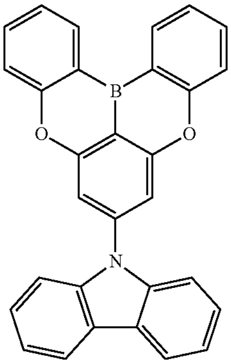
,
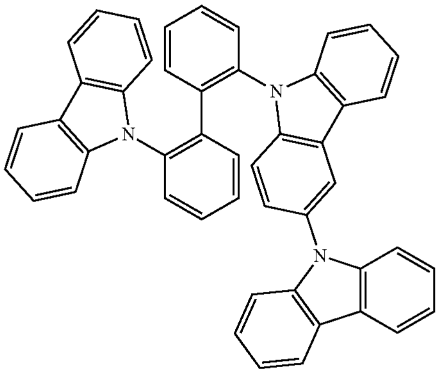
, -continued

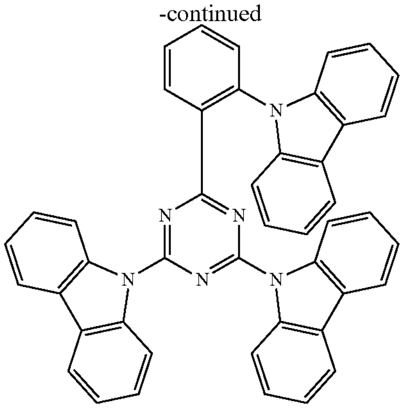

,

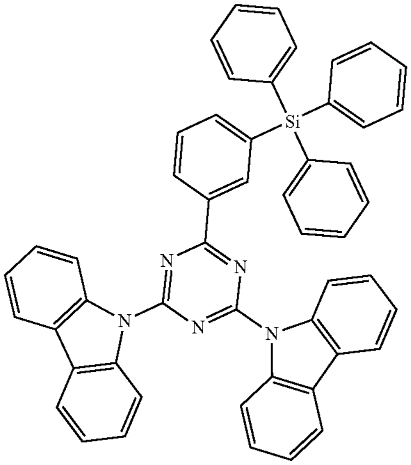

, and combinations thereof.

In some embodiments, the additional host comprises a metal complex.

In yet another aspect, the OLED of the present disclosure may also comprise an emissive region containing a formulation as disclosed in the above compounds section of the present disclosure.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an OLED of the present disclosure.

In some embodiments, the consumer product comprises an OLED having an anode; a cathode; and an organic layer disposed between the anode and the cathode, wherein the organic layer may comprise a formulation as described herein.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree c. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the first compound can be an emissive dopant. In some embodiments, the first compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the first compound can be homoleptic (each ligand is the same). In some embodiments, the first compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the first compound can be used as a phosphorescent sensitizer in an OLED where one or multiple layers in the OLED contains an acceptor in the form of one or more fluorescent and/or delayed fluorescence emitters. In some embodiments, the first compound can be used as one component of an exciplex to be used as a sensitizer. As a phosphorescent sensitizer, the first compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising two or more of the compounds such as sensitizer, the host, the second host, the acceptor, etc. described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

F. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer. In some embodiments, conductivity dopants comprises at least one chemical moiety selected from the group consisting of cyano, fluorinated aryl or heteroaryl, fluorinated alkyl or cycloalkyl, alkylene, heteroaryl, amide, benzodithiophene, and highly conjugated heteroaryl groups extended by non-ring double bonds.

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

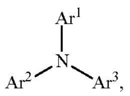, 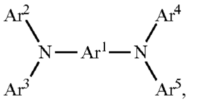, 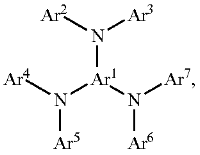,

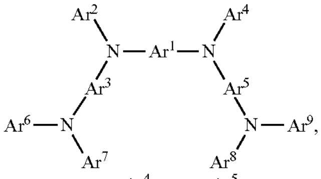, and

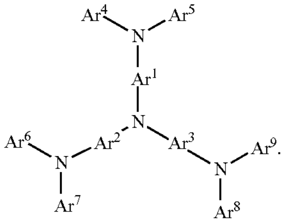.

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each of $Ar^1$ to $Ar^9$ may be unsubstituted or may be substituted by a general substituent as described above, any two substituents can be joined or fused into a ring.

In some embodiments, each $Ar^1$ to $Ar^9$ independently comprises a moiety selected from the group consisting of:

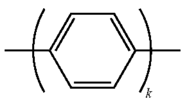, 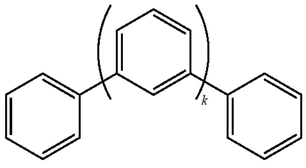,

-continued

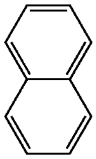, 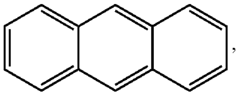,

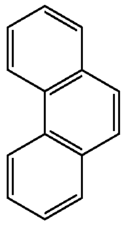, 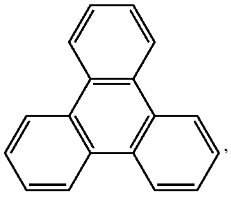, and

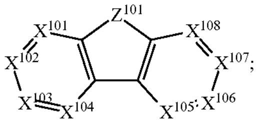;

wherein k is an integer from 1 to 20; $X^{101}$ to $X^{108}$ is C or N; $Z^{101}$ is C, N, O, or S.

Examples of metal complexes used in HIL or HTL include, but are not limited to the following general formula:

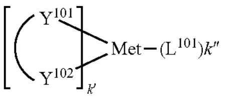

wherein Met is a metal, which can have an atomic weight greater than 40; $(Y^{101}\text{-}Y^{102})$ is a bidentate ligand, the coordinating atoms of $Y^{101}$ and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, $(Y^{101}\text{-}Y^{102})$ is a 2-phenylpyridine or 2-phenylimidazole derivative. In some embodiments, $(Y^{101}\text{-}Y^{102})$ is a carbene ligand. In some embodiments, Met is selected from Ir, Pt, Pd, Os, Cu, and Zn. In some embodiments, the metal complex has a smallest oxidation potential in solution vs. $Fc^+/Fc$ couple less than about 0.6 V.

In some embodiments, the HIL/HTL material is selected from the group consisting of phthalocyanine and porphryin compounds, starburst triarylamines, $CF_x$ fluorohydrocarbon polymer, conducting polymers (e.g., PEDOT:PSS, polyaniline, polypthiophene), phosphonic acid and sliane SAMs, triarylamine or polythiophene polymers with conductivity dopants, Organic compounds with conductive inorganic compounds (such as molybdenum and tungsten oxides), n-type semiconducting organic complexes, metal organometallic complexes, cross-linkable compounds, polythiophene based polymers and copolymers, triarylamines, triaylamine with spirofluorene core, arylamine carbazole compounds, triarylamine with (di)benzothiophene/(di)benzofuran, indolocarbazoles, isoindole compounds, and metal carbene complexes.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than one or more emitters closest to the EBL interface. In some embodiments, the compound used in EBL contains at least one carbazole group and/or at least one arylamine group. In some embodiments the HOMO level of the compound used in the EBL is shallower than the HOMO level of one or more of the hosts in the EML. In some embodiments, the compound used in EBL contains the same molecule or the same functional groups used as one of the hosts described herein.

d) Additional Hosts:

The light emitting layer of the organic EL device of the present disclosure preferably contains at least a light emitting material as the dopant, and a host material. Examples of the host material are not particularly limited, and any metal complexes or organic compounds may be used as long as the host won't fully quench the emission of the dopant. In some embodiments, the emissive layer can comprise two hosts, a first host and a second host. In some embodiments, the first host is a hole transporting host, and the second host is an electron transporting host. In some embodiments, the first host is a hole transporting host, and the second host is a bipolar host. In some embodiments, the first host is an electron transporting host, and the second host is a bipolar host. In some embodiments, the first host and the second host can form an exciplex. In some embodiments, the emissive layer can comprise a third host. In some embodiments, the third host is selected from the group consisting of an insulating host (wide band gap host), a hole transporting host, and an electron transporting host. In some embodiments, the third host forms an exciplex with one of the first host and the second host, or with both the first host and the second host. In some embodiments, the emissive layer can comprise a fourth host. In some embodiments, the fourth host is selected from the group consisting of an insulating host (wide band gap host), a hole transporting host, and an electron transporting host. In some embodiments, the fourth host forms an exciplex with one of the first host, the second host, and the third host, with two of the first host, the second host, and the third host, or with each of the first host, the second host, and the third host. In some embodiments, the electron transporting host has a LUMO less than −2.4 eV, less than −2.5 eV, less than −2.6 eV, or less than −2.7 eV. In some embodiments, the hole transporting host has a HOMO higher than −5.6 eV, higher than −5.5 eV, higher than −5.4 eV, or higher than −5.35 eV. The HOMO and LUMO values can be determined using solution electrochemistry. Solution cyclic voltammetry and differential pulsed voltammetry can be performed using a CH Instruments model 6201B potentiostat using anhydrous dimethylformamide (DMF) solvent and tetrabutylammonium hexafluorophosphate as the supporting electrolyte. Glassy carbon, platinum wire, and silver wire were used as the working, counter and reference electrodes, respectively. Electrochemical potentials can be referenced to an internal ferrocene-ferroconium redox couple (Fc/Fc+) by measuring the peak potential differences from differential pulsed voltammetry. The corresponding highest occupied molecular orbital (HOMO) and lowest unoccupied molecular orbital (LUMO) energies can be determined by referencing the cationic and anionic redox potentials to ferrocene (4.8 eV vs. vacuum) according to literature ((a) Fink, R.; Heischkel, Y.; Thelakkat, M.; Schmidt, H.-W. *Chem. Mater.* 1998, 10, 3620-3625. (b) Pommerehne, J.; Vestweber, H.; Guss, W.; Mahrt, R. F.; Bassler, H.; Porsch, M.; Daub, *J. Adv. Mater.* 1995, 7, 551).

In some embodiments, the inventive compounds described herein can be used as a one of the hosts as described above, and the compounds described below can be used as one or more other hosts as described above.

Examples of metal complexes used as one or more other hosts are preferred to have the following general formula:

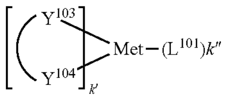

wherein Met is a metal; ($Y^{103}$-$Y^{104}$) is a bidentate ligand, the coordinating atoms of $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, the metal complexes are:

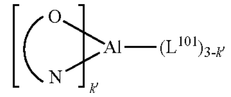
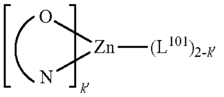

wherein (O—N) is a bidentate ligand, having metal coordinated to atoms O and N.

In some embodiments, Met is selected from Ir and Pt. In a further embodiments, ($Y^{103}$-$Y^{104}$) is a carbene ligand.

In some embodiments, the one or more other hosts contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, aza-dibenzothiophene, aza-dibenzofuran, aza-dibenzoselenophene, aza-carbazole, aza-indolocarbazole, aza-triphenylene, aza-tetraphenylene, 5,2-benzo[d]benzo[4,5]imidazo[3,2-a]imidazole, 5,9-dioxa-13b-boranaphtho[3,2,1-de]anthracene; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by the general substituents as described herein or may be further fused.

In some embodiments, the one or more other hosts comprises at least one of the moieties selected from the group consisting of:

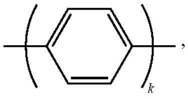,
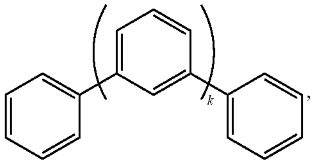,
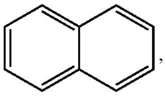,
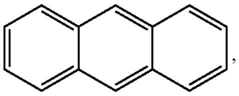,
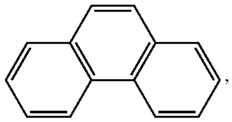,
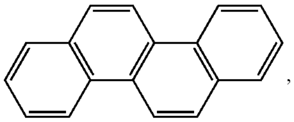,
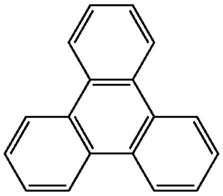,
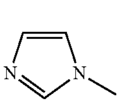,
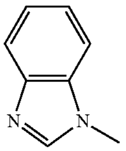,
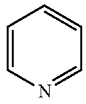,
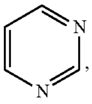,
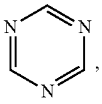,
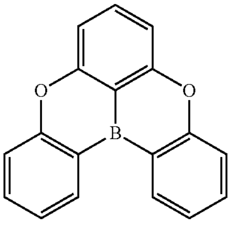,
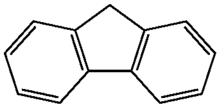,
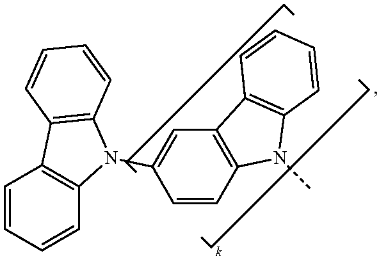,
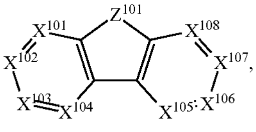,
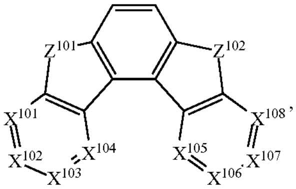,
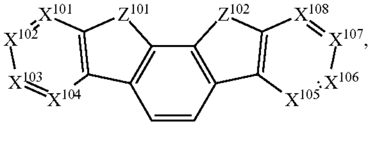

-continued

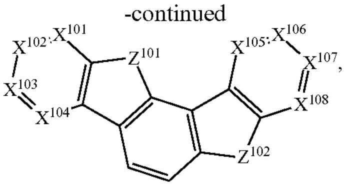,
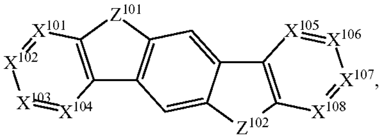, and
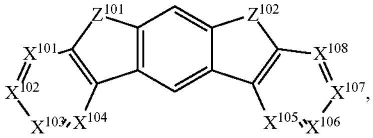, wherein k is an integer from 0 to 20 or 1 to 20. $X^{101}$ to $X^{108}$ are independently selected from C or N. $Z^{101}$ and $Z^{102}$ are independently selected from C, N, O, or S.

In some embodiments, the one or more other hosts is selected from the group consisting of arylcarbazoles, metal 8-hydroxyquinolates, (e.g., alq3, balq), metal phenoxybenzothiazole compounds, conjugated oligomers and polymers (e.g., polyfluorene), aromatic fused rings, zinc complexes, chrysene based compounds, aryltriphenylene compounds, poly-fused heteroaryl compounds, donor acceptor type molecules, dibenzofuran/dibenzothiophene compounds, polymers (e.g., pvk), spirofluorene compounds, spirofluorene-carbazole compounds, indolocabazoles, 5-member ring electron deficient heterocycles (e.g., triazole, oxadiazole), tetraphenylene complexes, metal phenoxypyridine compounds, metal coordination complexes (e.g., Zn, Al with N^N ligands), dibenzothiophene/dibenzofuran-carbazole compounds, silicon/germanium aryl compounds, aryl benzoyl esters, carbazole linked by non-conjugated groups, aza-carbazole/dibenzofuran/dibenzothiophene compounds, and high triplet metal organometallic complexes (e.g., metal-carbene complexes).

In some embodiments, the one or more other hosts comprises at least one chemical group selected from the group consisting of triphenylene, carbazole, indolocarbazole, dibenzothiophene, dibenzofuran, dibenzoselenophene, $5\lambda^2$-benzo[d]benzo[4,5]imidazo[3,2-a]imidazole, 5,9-dioxa-13b-boranaphtho[3,2,1-de]anthracene, azaborinine, oxaborinine, dihydroacridine, xanthene, dihydrobenzoazasiline, dibenzooxasiline, phenoxazine, phenoxathiine, phenothiazine, dihydrophenazine, fluorene, naphthalene, anthracene, phenanthrene, phenanthroline, benzoquinoline, quinoline, isoquinoline, quinazoline, pyrimidine, pyrazine, pyridine, triazine, boryl, silyl, aza-triphenylene, aza-carbazole, aza-indolocarbazole, aza-dibenzothiophene, aza-dibenzofuran, aza-dibenzoselenophene, aza-$5\lambda^2$-benzo[d]benzo[4,5]imidazo[3,2-a]imidazole, and aza-(5,9-dioxa-13b-boranaphtho[3,2,1-de]anthracene).

In some embodiments, the one or more other hosts can be selected from the group consisting of the structures of the following HOST Group 1:

-continued
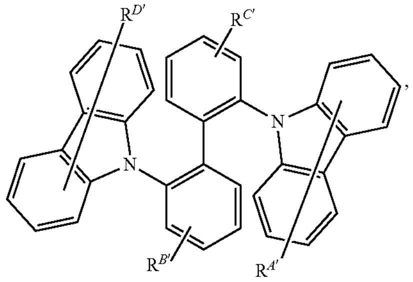
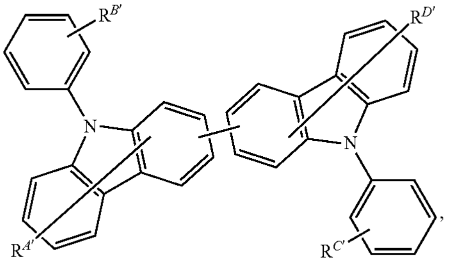
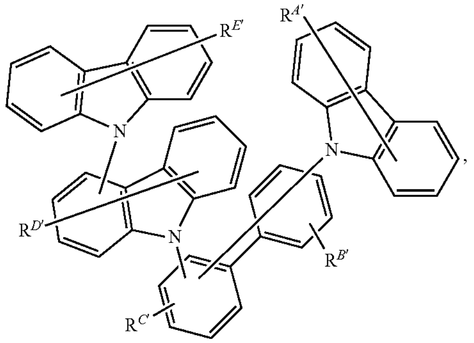
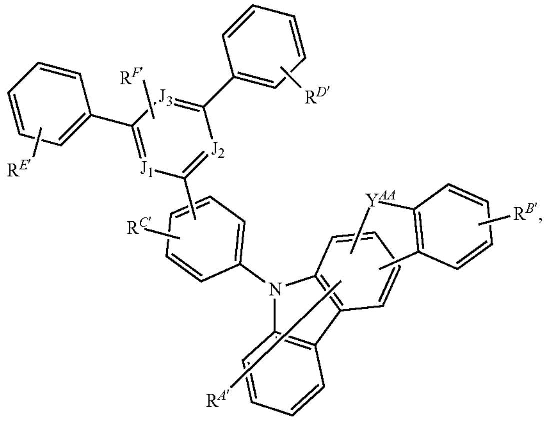
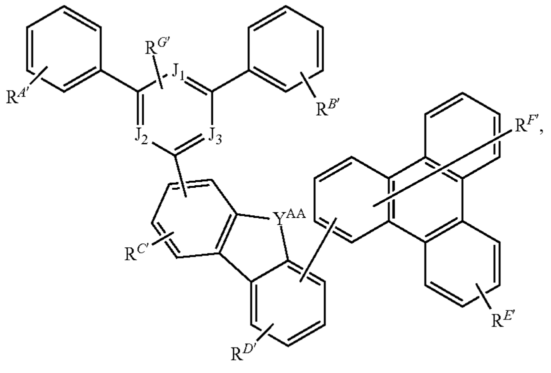
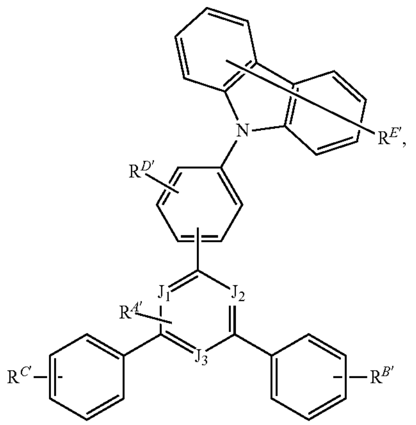
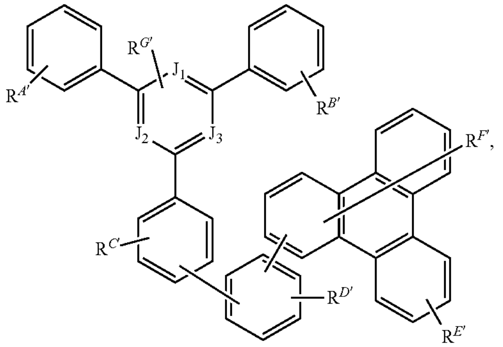
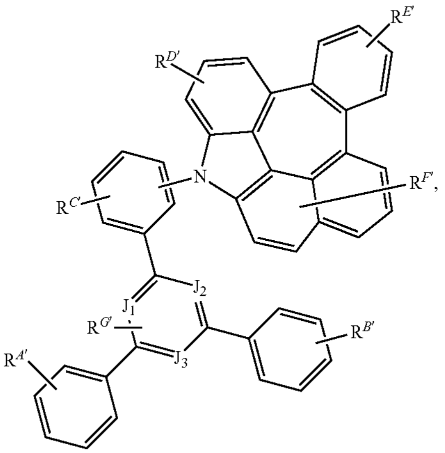
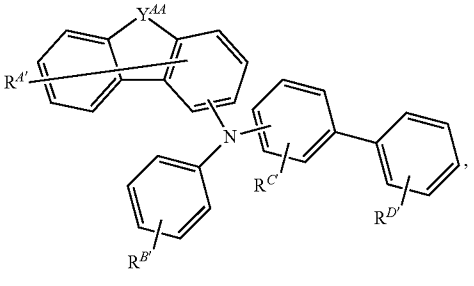

-continued
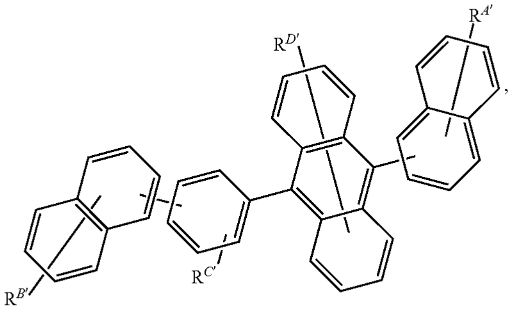
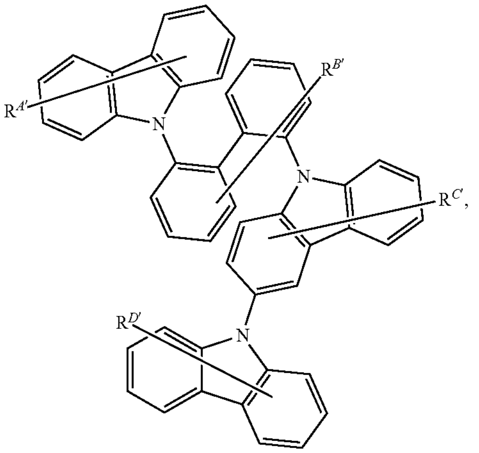
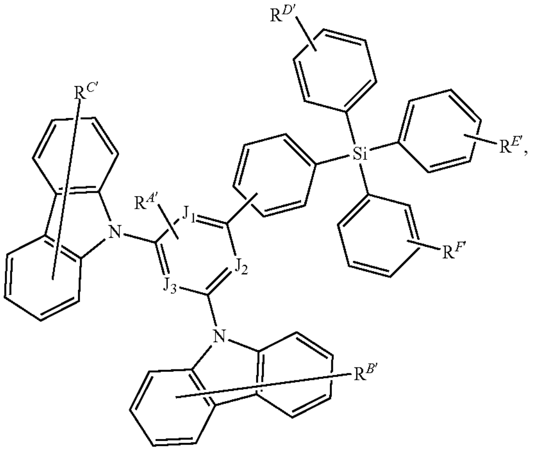
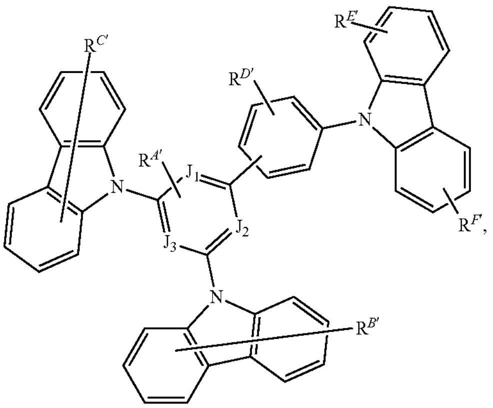
-continued
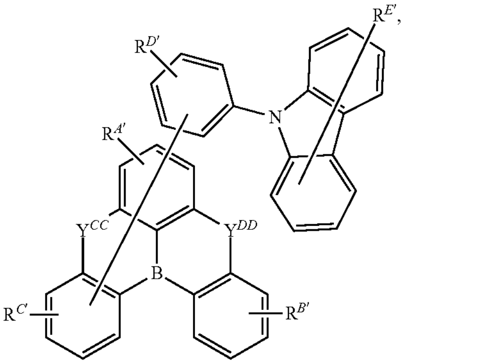
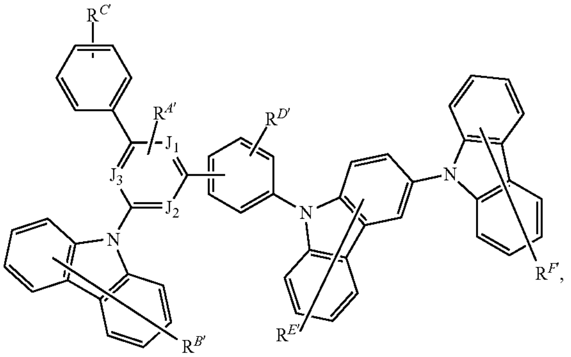
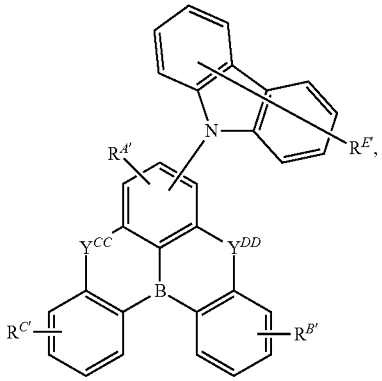
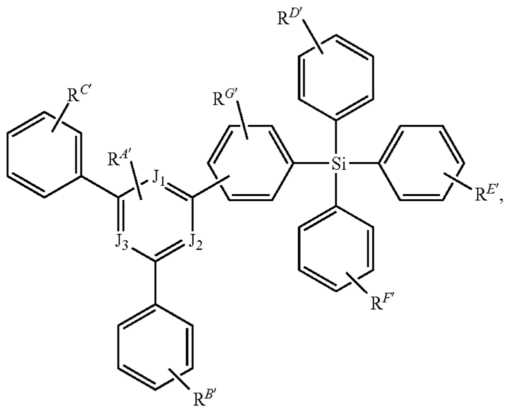

-continued
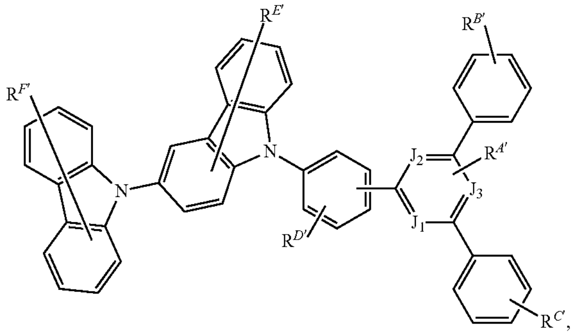
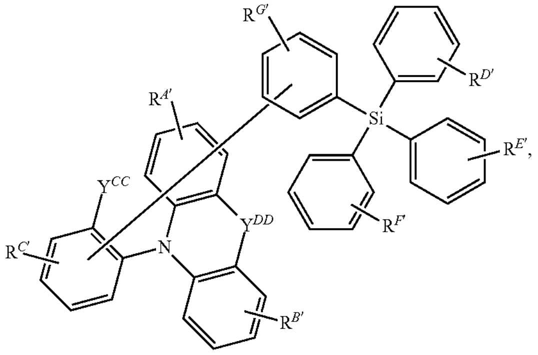
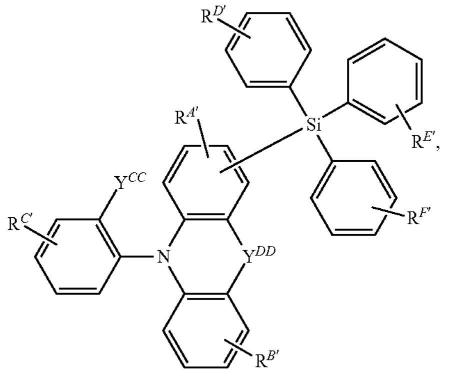
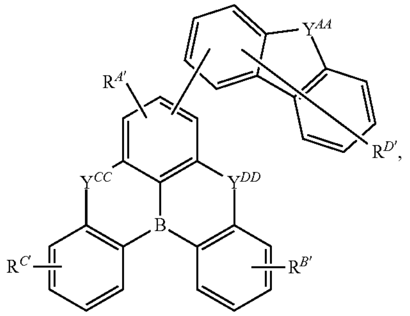
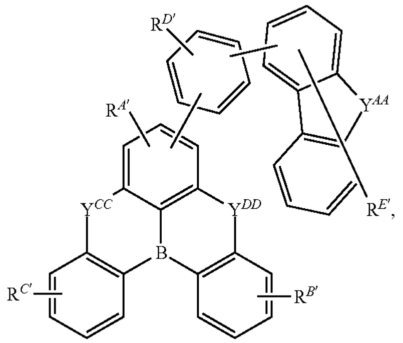
-continued
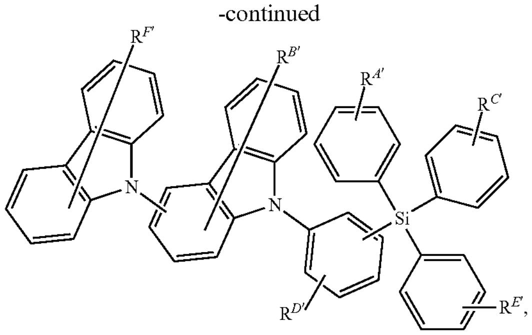
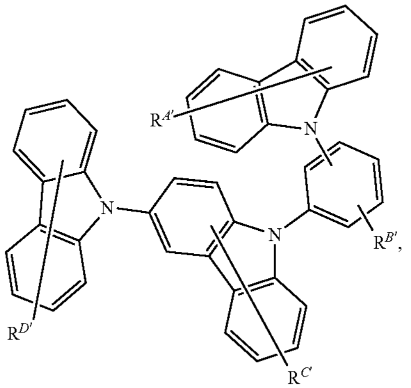
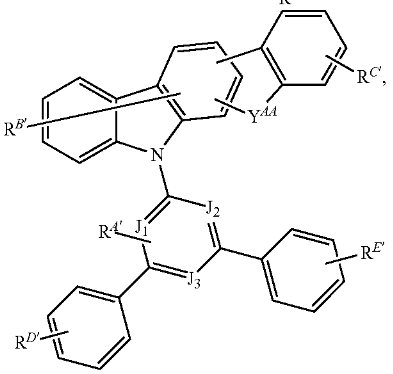
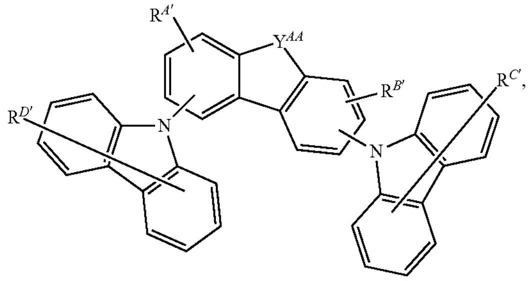
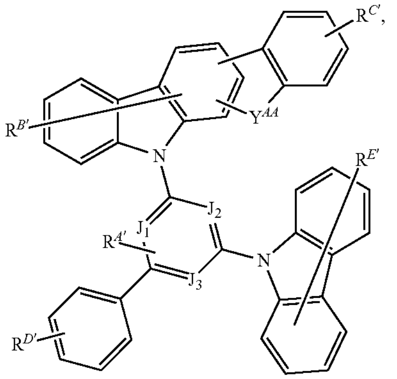

-continued
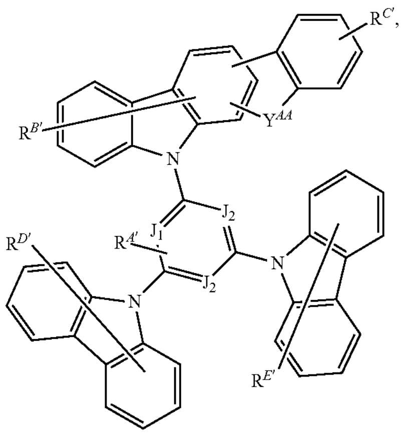
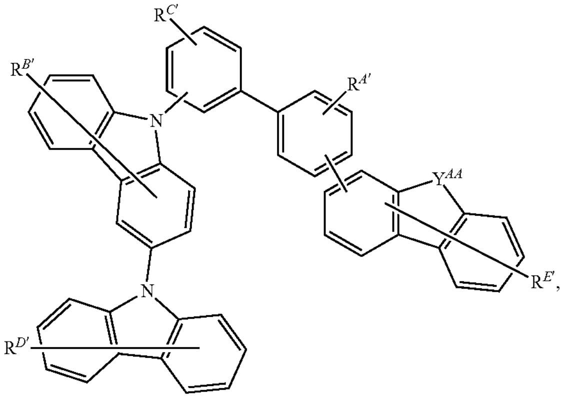
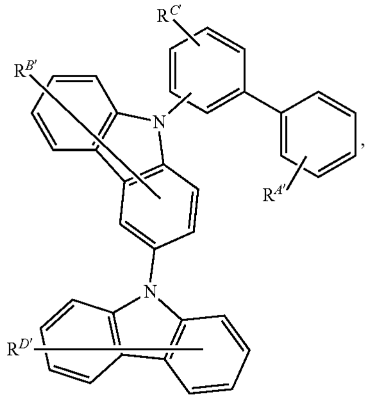
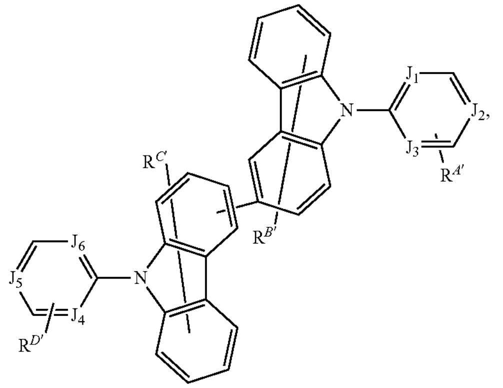
-continued
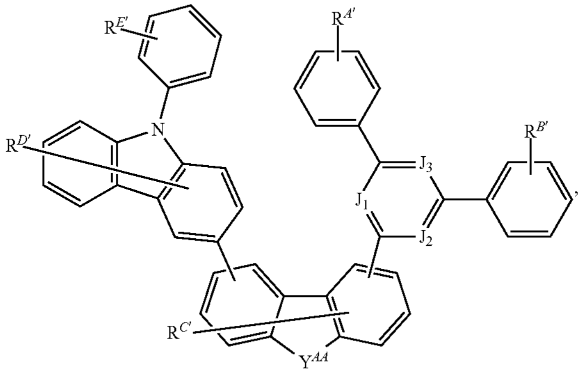
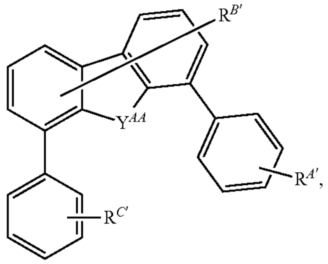
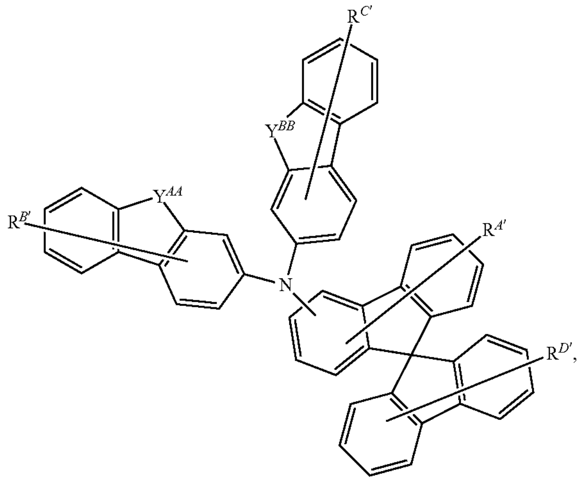
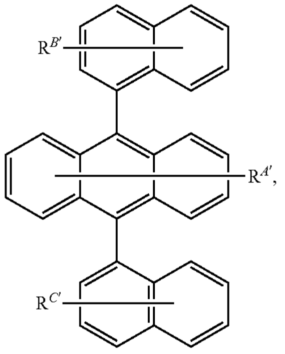
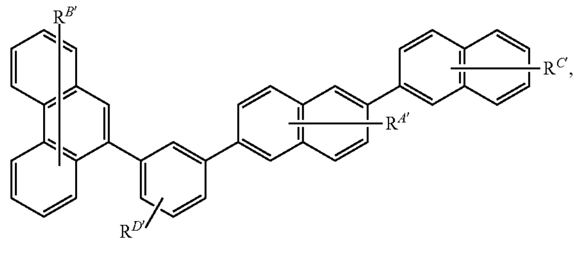

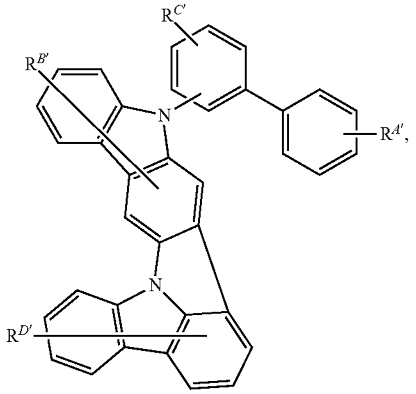
,
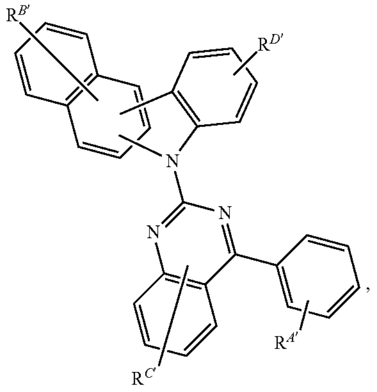
,
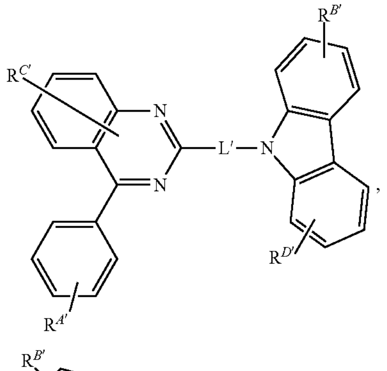
,
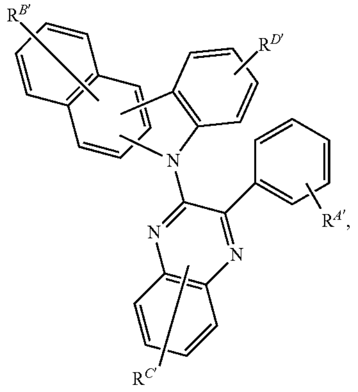
,
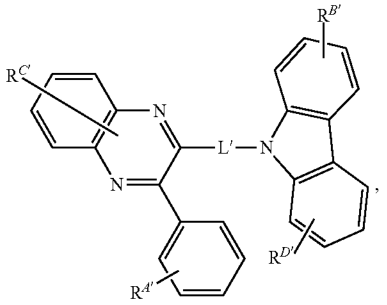
,
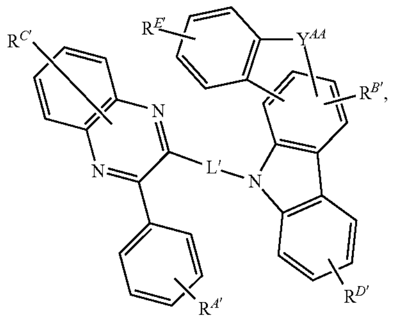
,
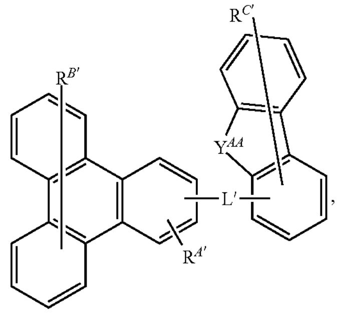
,
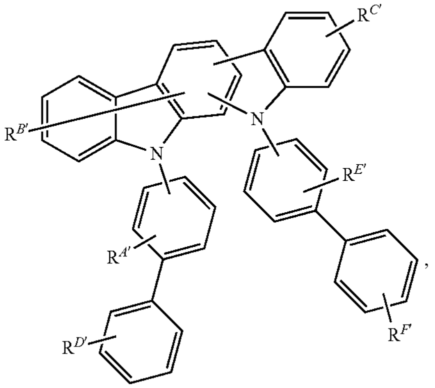
,
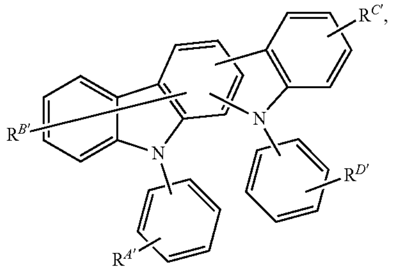
, -continued
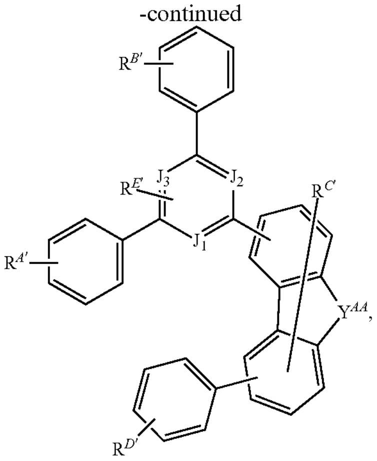
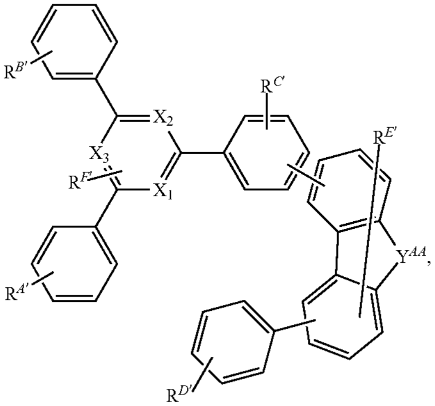
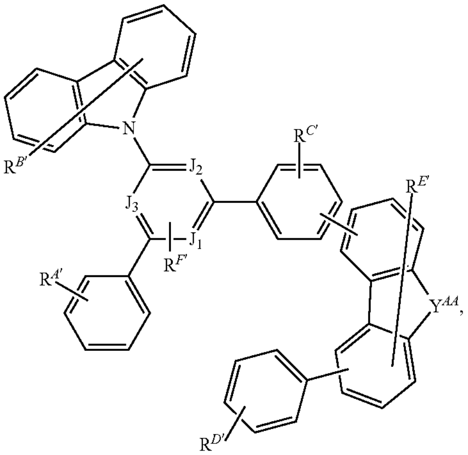
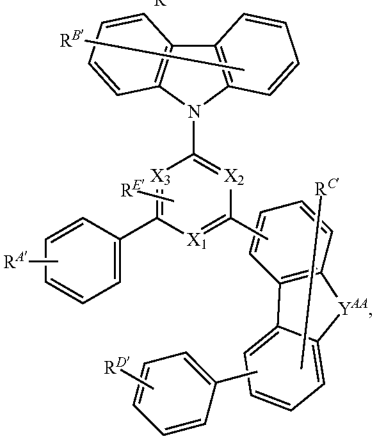
-continued
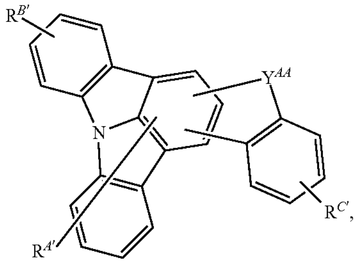
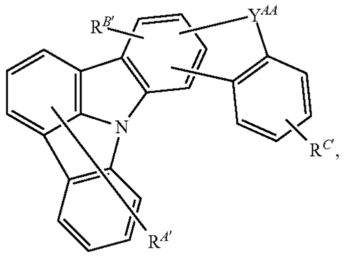
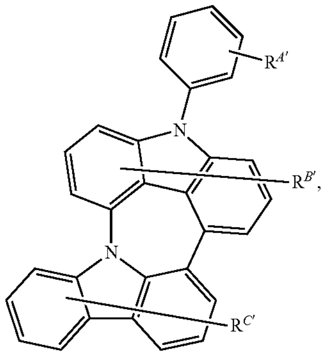
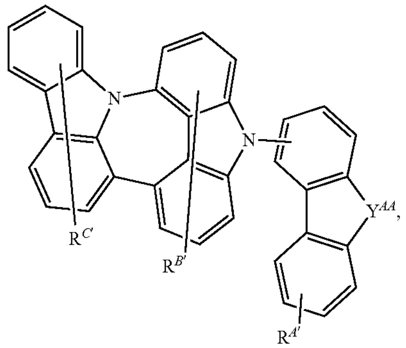
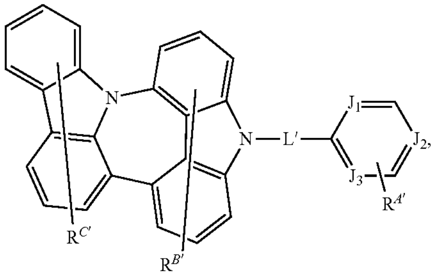

-continued
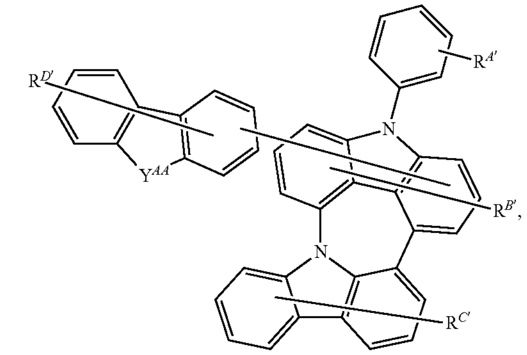
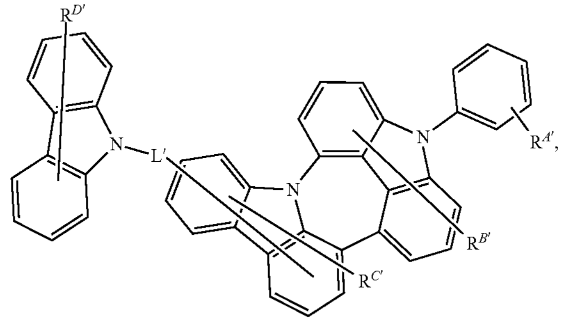
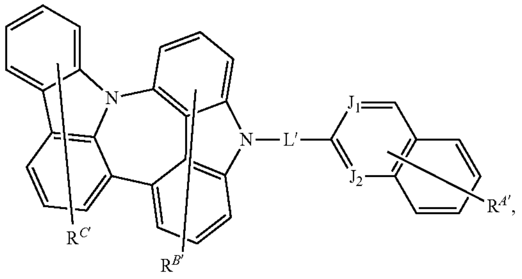
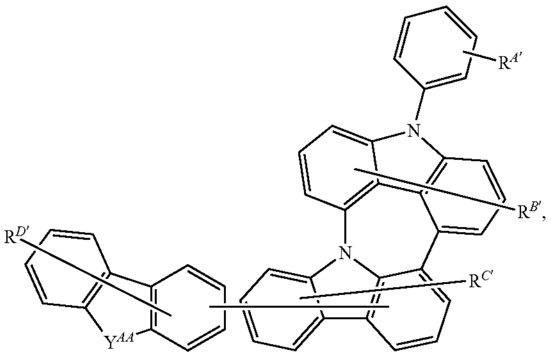
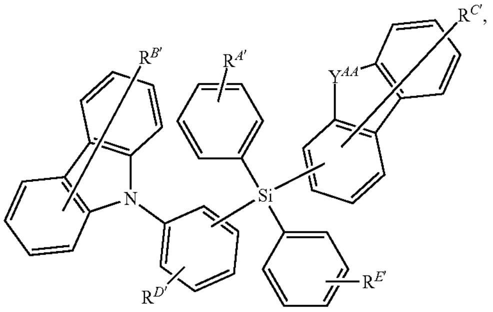
-continued
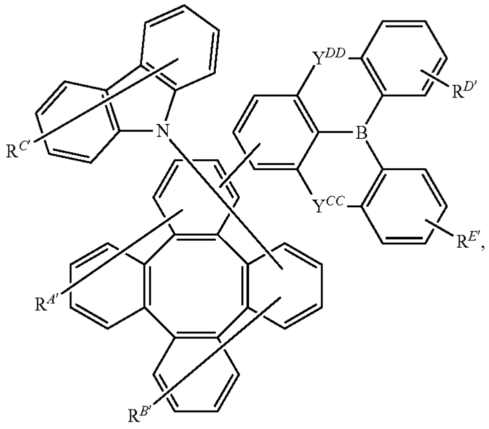
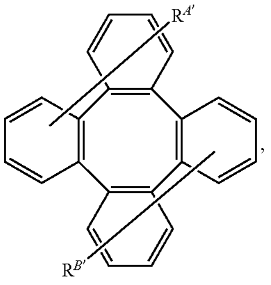
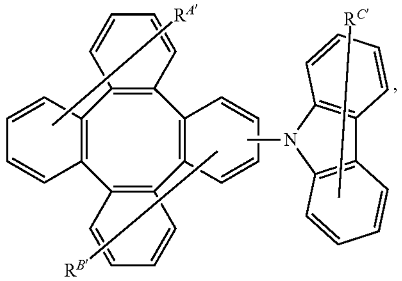
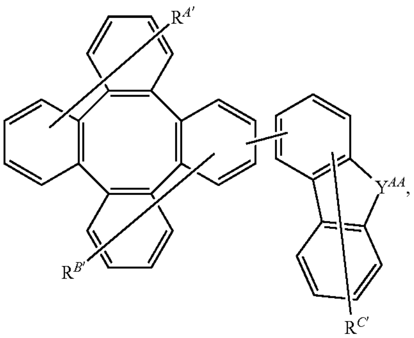
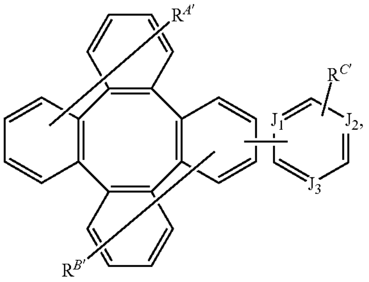

-continued

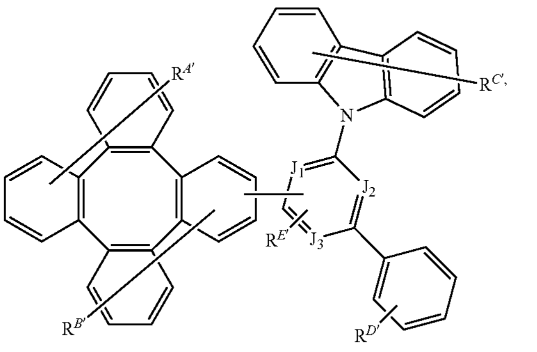

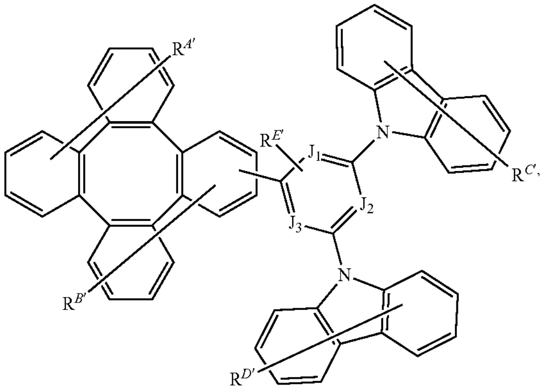

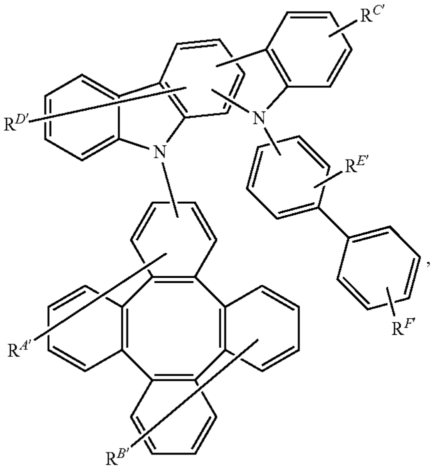

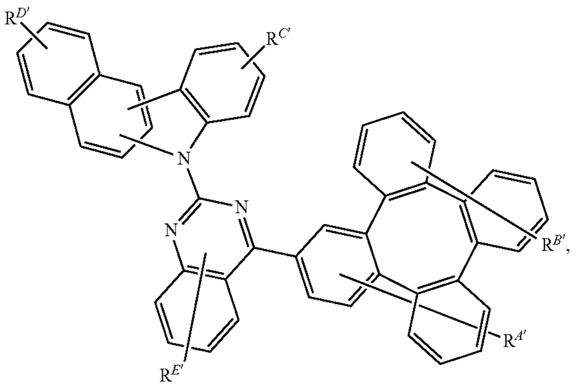

-continued

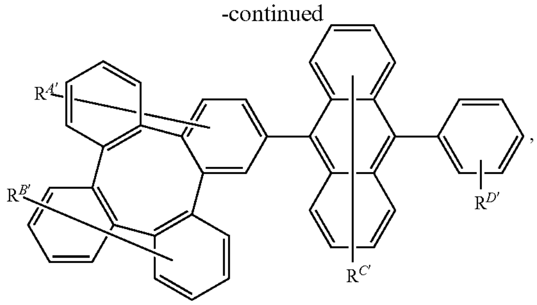

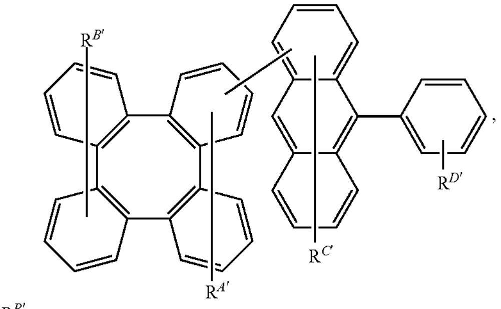

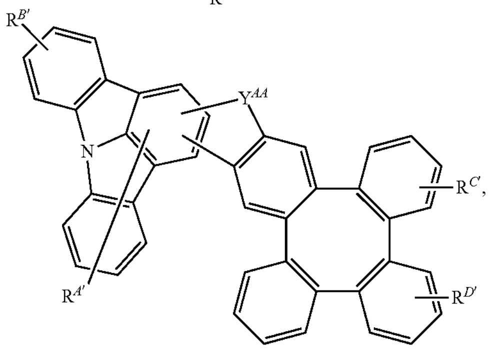

and

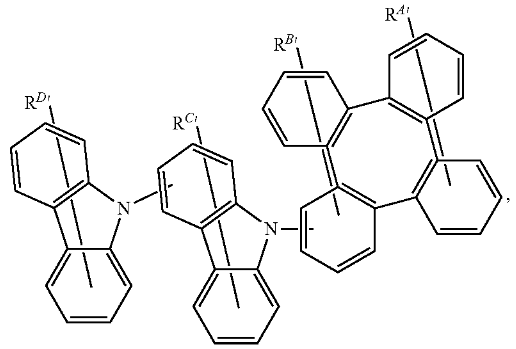

wherein:

each of $J_1$ to $J_6$ is independently C or N;

L' is a direct bond or an organic linker;

each $Y^{AA}$, $Y^{BB}$, $Y^{CC}$, and $Y^{DD}$ is independently selected from the group consisting of absent a bond, direct bond, O, S, Se, CRR', SiRR', GeRR', NR, BR, BRR';

each of $R^{A'}$, $R^{B'}$, $R^{C'}$, $R^{D'}$, $R^{E'}$, $R^{F'}$, and $R^{G'}$ independently represents mono, up to the maximum substitutions, or no substitutions;

each R, R', $R^{A'}$, $R^{B'}$, $R^{C'}$, $R^{D'}$, $R^{E'}$, $R^{F'}$, and $R^{G'}$ is independently a hydrogen or a substituent selected from the group consisting of the general substituents as defined herein; any two substituents can be joined or fused to form a ring;

and where possible, each unsubstituted aromatic carbon atom is optionally replaced with N to form an aza-substituted ring.

In some embodiments at least one of $J_1$ to $J_3$ are N, in some embodiments at least two of $J_1$ to $J_3$ are N, in some embodiments, all three of $J_1$ to $J_3$ are N. In some embodiments, each $Y^{CC}$ and $Y^{DD}$ are preferably O, S, and SiRR', more preferably O, or S. In some embodiments, at least one unsubstituted aromatic carbon atom is replaced with N to form an aza-ring.

In some embodiments, the host is selected from the group consisting of EG1-MG1-EG1 to EG53-MG27-EG53 with a formula of EGa-MGb-EGc, or EG1-EG1 to EG53-EG53 with a formula of EGa-EGc when MGb is absent, wherein a is an integer from 1 to 53, b is an integer from 1 to 27, c is an integer from 1 to 53. The structure of EG1 to EG53 is shown below:

EG1

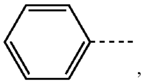
,

EG2

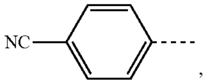
,

EG3

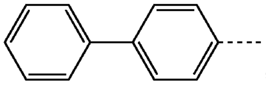
,

EG4

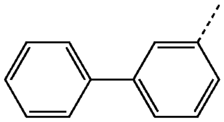
,

EG5

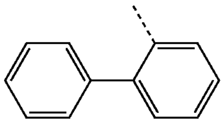
,

EG6

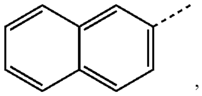
,

EG7

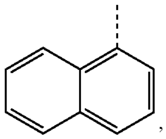
,

EG8

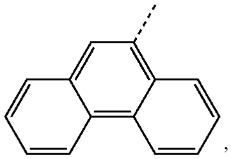
,

EG9

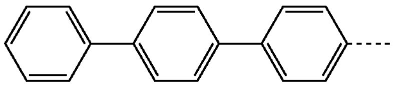
,

EG10

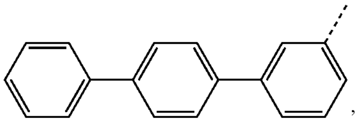
,

-continued

EG11

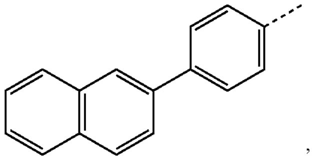
,

EG12

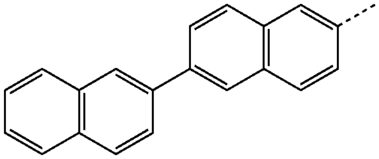
,

EG13

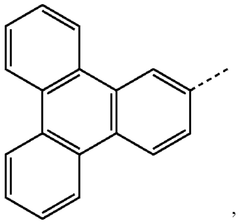
,

EG14

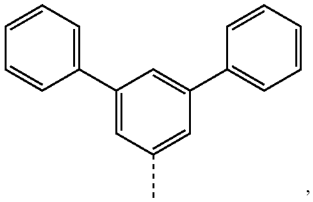
,

EG15

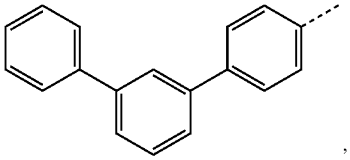
,

EG16

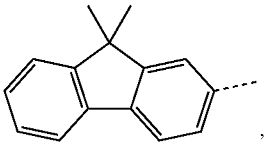
,

EG17

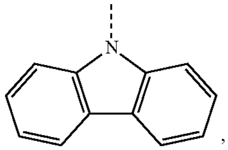
,

EG18

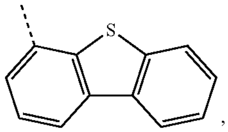
,

EG19

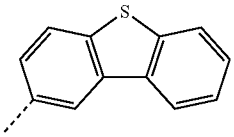
,

-continued
EG20
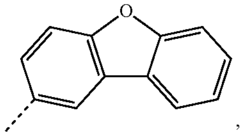
,
EG21
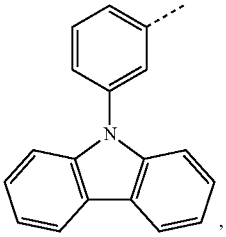
,
EG22
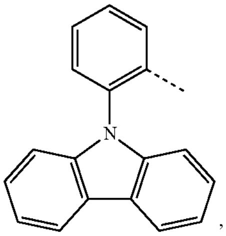
,
EG23
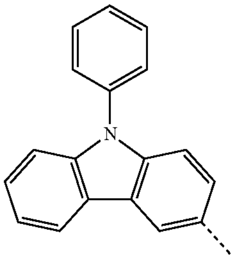
,
EG24
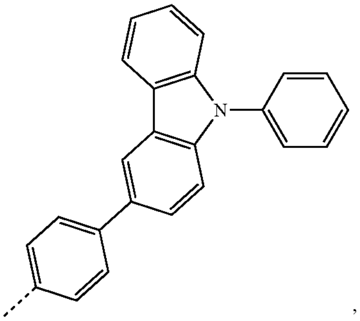
,
EG25
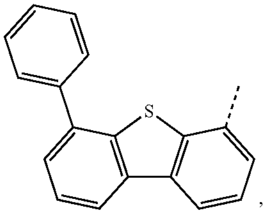
,
-continued
EG26
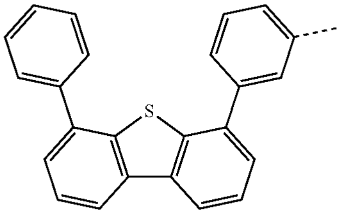
,
EG27
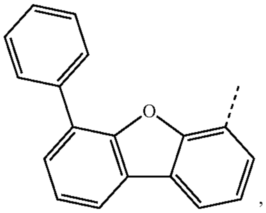
,
EG28
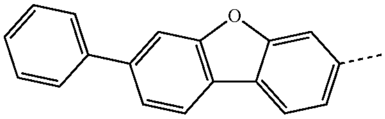
,
EG29
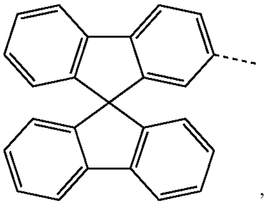
,
EG30
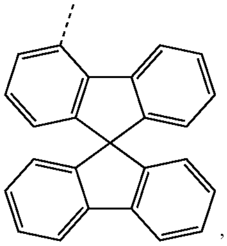
,
EG31
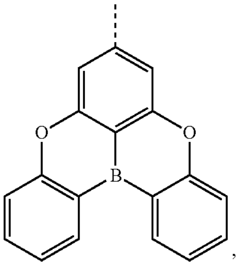
,
EG32
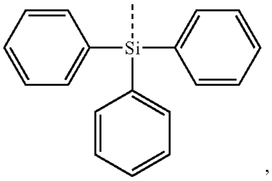
, -continued
EG33
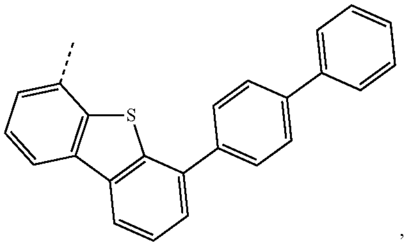
,
EG34
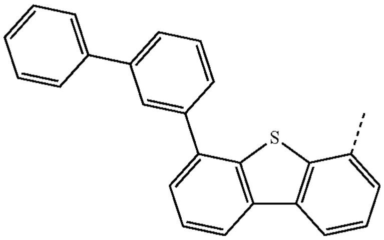
,
EG35
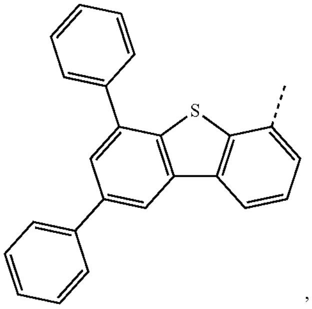
,
EG36
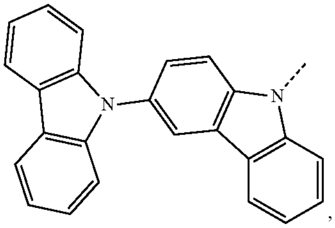
,
EG37
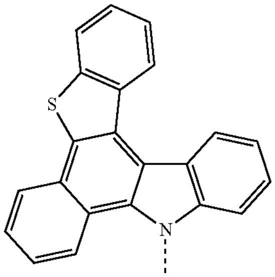
,
EG38
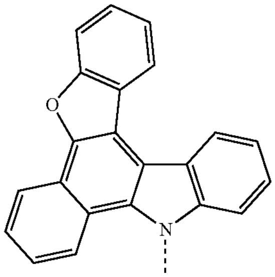
,
-continued
EG39
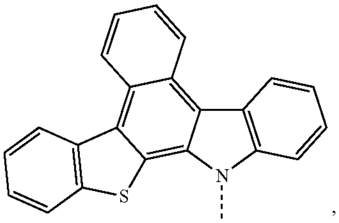
,
EG40
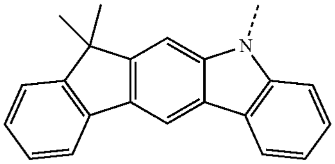
,
EG41
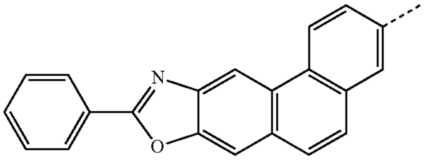
,
EG42
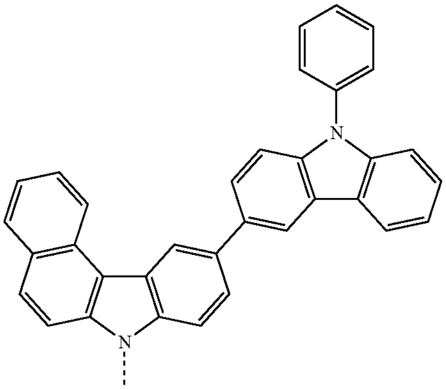
,
EG43
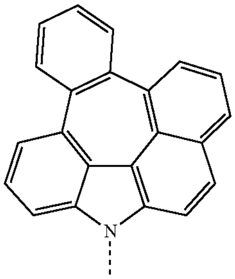
,
EG44
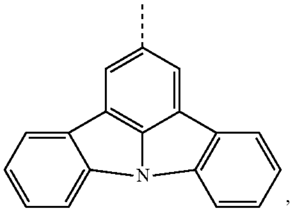
, -continued
EG45
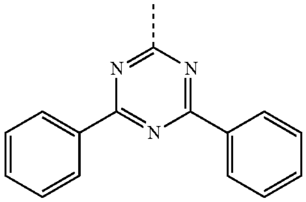
,
EG46
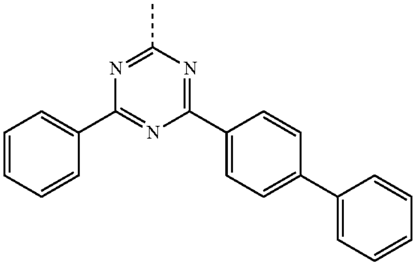
,
EG47
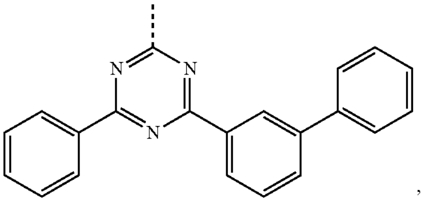
,
EG48
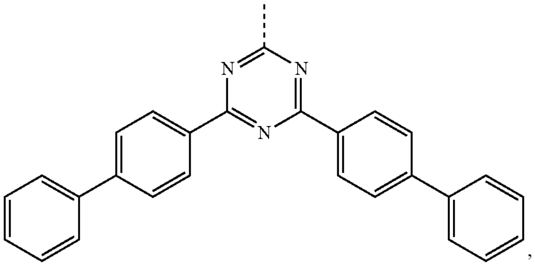
,
EG49
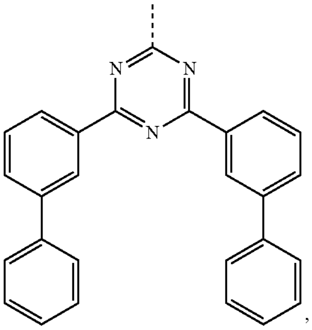
,
EG50
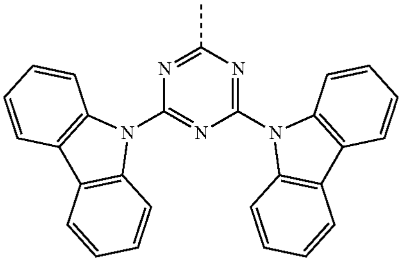
,
-continued
EG51
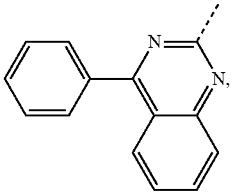
EG52
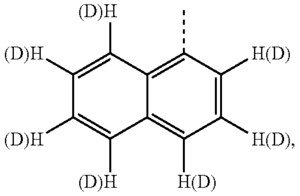
EG53
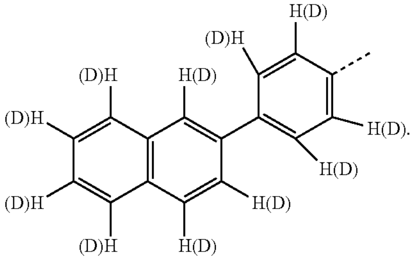
The structure of MG1 to MG27 is shown below:
MG1
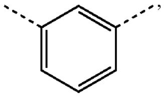
MG2
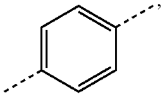
MG3
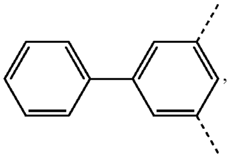
MG4
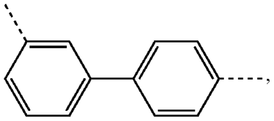
MG5
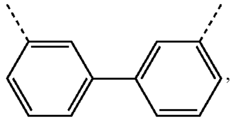
MG6
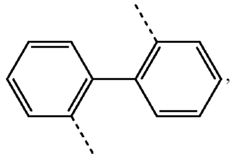

-continued
MG7
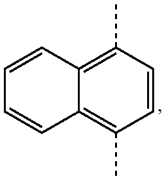
MG8
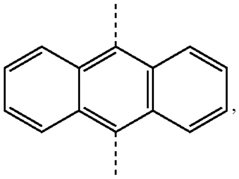
MG9
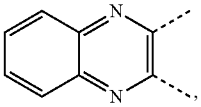
MG10
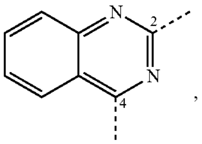
MG11
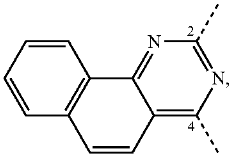
MG12
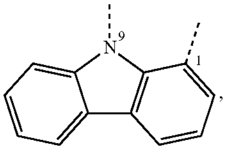
MG13
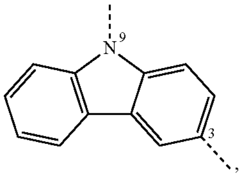
MG14
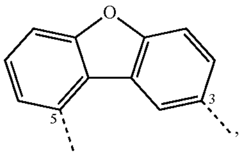
MG15
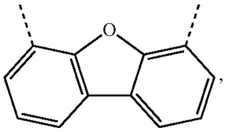
MG16
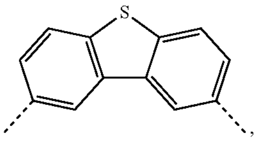
-continued
MG17
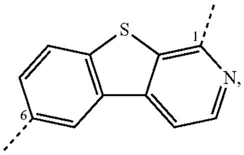
MG18
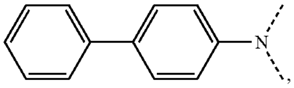
MG19
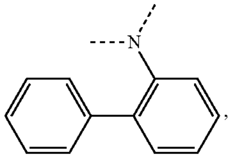
MG20
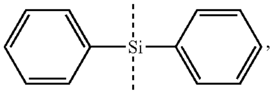
MG21
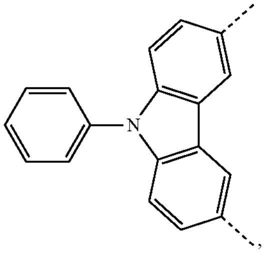
MG22
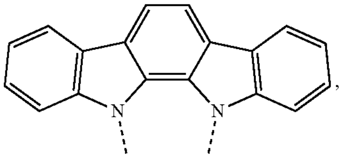
MG23
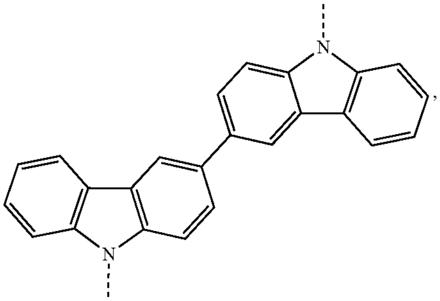
MG24
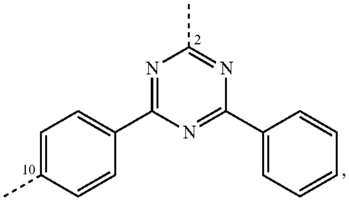

-continued

MG25

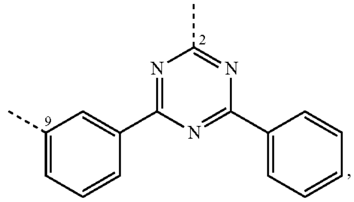
,

MG26

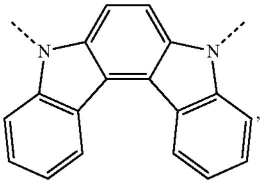
,

MG27

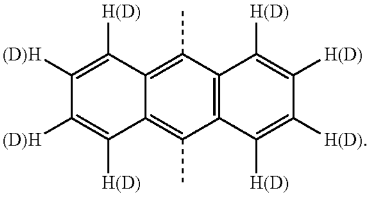
.

In the MGb structures shown above, the two bonding positions in the asymmetric structures MG10, MG11, MG12, MG13, MG14, MG17, MG24, and MG25 are labeled with numbers for identification purposes.

In some embodiments, the host can be any of the aza-substituted variants thereof, fully or partially deuterated variants thereof, and combinations thereof. In some embodiments, the host has formula EGa-MGb-Egc and is selected from the group consisting of h1 to h112 defined in the following HOST Group 2 list, where each of MGb, EGa, and EGc are defined as follows:

| h | MGb | EGa | EGc |
|---|---|---|---|
| h1 | MG1 | EG3 | EG36 |
| h2 | MG1 | EG8 | EG12 |
| h3 | MG1 | EG13 | EG14 |
| h4 | MG1 | EG13 | EG18 |
| h5 | MG1 | EG13 | EG25 |
| h6 | MG1 | EG13 | EG36 |
| h7 | MG1 | EG22 | EG36 |
| h8 | MG1 | EG25 | EG46 |
| h9 | MG1 | EG27 | EG46 |
| h10 | MG1 | EG27 | EG48 |
| h11 | MG1 | EG32 | EG50 |
| h12 | MG1 | EG35 | EG46 |
| h13 | MG1 | EG36 | EG45 |
| h14 | MG1 | EG36 | EG49 |
| h15 | MG1 | EG40 | EG45 |
| h16 | MG2 | EG3 | EG36 |
| h17 | MG2 | EG25 | EG31 |
| h18 | MG2 | EG31 | EG33 |
| h19 | MG2 | EG36 | EG45 |
| h20 | MG2 | EG36 | EG46 |
| h21 | MG3 | EG4 | EG36 |
| h22 | MG3 | EG34 | EG45 |
| h23 | MG4 | EG13 | EG17 |
| h24 | MG5 | EG13 | EG45 |
| h25 | MG5 | EG17 | EG36 |
| h26 | MG5 | EG18 | EG36 |
| h27 | MG6 | EG17 | EG17 |
| h28 | MG7 | EG43 | EG45 |
| h29 | MG8 | EG1 | EG28 |
| h30 | MG8 | EG6 | EG7 |

-continued

| h | MGb | EGa | EGc |
|---|---|---|---|
| h31 | MG8 | EG7 | EG7 |
| h32 | MG8 | EG7 | EG11 |
| h33 | MG9 | EG1 | EG43 |
| h34 | MG10 | 4-EG1 | 2-EG37 |
| h35 | MG10 | 4-EG1 | 2-EG38 |
| h36 | MG10 | EG1 | EG42 |
| h37 | MG11 | 4-EG1 | 2-EG39 |
| h38 | MG12 | 1-EG17 | 9-EG31 |
| h39 | MG13 | 3-EG17 | 9-EG4 |
| h40 | MG13 | 3-EG17 | 9-EG13 |
| h41 | MG13 | 3-EG17 | 9-EG31 |
| h42 | MG13 | 3-EG17 | 9-EG45 |
| h43 | MG13 | 3-EG17 | 9-EG46 |
| h44 | MG13 | 3-EG17 | 9-EG48 |
| h45 | MG13 | 3-EG17 | 9-EG49 |
| h46 | MG13 | 3-EG32 | 9-EG31 |
| h47 | MG13 | 3-EG44 | 9-EG3 |
| h48 | MG14 | 3-EG13 | 5-EG45 |
| h49 | MG14 | 3-EG23 | 5-EG45 |
| h50 | MG15 | EG3 | EG48 |
| h51 | MG15 | EG17 | EG31 |
| h52 | MG15 | EG31 | EG36 |
| h53 | MG16 | EG17 | EG17 |
| h54 | MG17 | EG17 | EG17 |
| h55 | MG18 | EG16 | EG24 |
| h56 | MG18 | EG16 | EG30 |
| h57 | MG18 | EG20 | EG41 |
| h58 | MG19 | EG16 | EG29 |
| h59 | MG20 | EG1 | EG31 |
| h60 | MG20 | EG17 | EG18 |
| h61 | MG21 | EG23 | EG23 |
| h62 | MG22 | EG1 | EG45 |
| h63 | MG22 | EG1 | EG46 |
| h64 | MG22 | EG3 | EG46 |
| h65 | MG22 | EG4 | EG46 |
| h66 | MG22 | EG4 | EG47 |
| h67 | MG22 | EG9 | EG45 |
| h68 | MG23 | EG1 | EG3 |
| h69 | MG23 | EG1 | EG6 |
| h70 | MG23 | EG1 | EG14 |
| h71 | MG23 | EG1 | EG18 |
| h72 | MG23 | EG1 | EG19 |
| h73 | MG23 | EG1 | EG23 |
| h74 | MG23 | EG1 | EG51 |
| h75 | MG23 | EG2 | EG18 |
| h76 | MG23 | EG3 | EG3 |
| h77 | MG23 | EG3 | EG4 |
| h78 | MG23 | EG3 | EG5 |
| h79 | MG23 | EG4 | EG4 |
| h80 | MG23 | EG4 | EG5 |
| h81 | MG24 | 2-EG1 | 10-EG33 |
| h82 | MG24 | 2-EG4 | 10-EG36 |
| h83 | MG24 | 2-EG21 | 10-EG36 |
| h84 | MG24 | 2-EG23 | 10-EG36 |
| h85 | MG25 | 2-EG1 | 9-EG33 |
| h86 | MG25 | 2-EG3 | 9-EG36 |
| h87 | MG25 | 2-EG4 | 9-EG36 |
| h88 | MG25 | 2-EG17 | 9-EG27 |
| h89 | MG25 | 2-EG17 | 9-EG36 |
| h90 | MG25 | 2-EG21 | 9-EG36 |
| h91 | MG25 | 2-EG23 | 9-EG27 |
| h92 | MG25 | 2-EG23 | 9-EG36 |
| h93 | MG26 | EG1 | EG9 |
| h94 | MG26 | EG1 | EG10 |
| h95 | MG26 | EG1 | EG21 |
| h96 | MG26 | EG1 | EG23 |
| h97 | MG26 | EG1 | EG26 |
| h98 | MG26 | EG3 | EG3 |
| h99 | MG26 | EG3 | EG9 |
| h100 | MG26 | EG3 | EG23 |
| h101 | MG26 | EG3 | EG26 |
| h102 | MG26 | EG4 | EG10 |
| h103 | MG26 | EG5 | EG10 |
| h104 | MG26 | EG6 | EG10 |
| h105 | MG26 | EG10 | EG10 |
| h106 | MG26 | EG10 | EG14 |
| h107 | MG26 | EG10 | EG15 |

-continued

| h | MGb | EGa | EGc |
|---|---|---|---|
| h108 | MG27 | EG52 | EG53 |
| h109 | — | EG13 | EG18 |
| h110 | — | EG17 | EG31 |
| h111 | — | EG17 | EG50 |
| h112 | — | EG40 | EG45 |

In the table above, the EGa and EGc structures that are bonded to one of the asymmetric structures MG10, MG11, MG12, MG13, MG14, MG17, MG24, and MG25, are noted with a numeric prefix identifying their bonding position in the MGb structure.

e) Emitter Materials in EML:

One or more emitter materials may be used in conjunction with the compound or device of the present disclosure. The emitter material can be emissive or non-emissive in the current device as described herein. Examples of the emitter materials are not particularly limited, and any compounds may be used as long as the compounds are capable of producing emissions in a regular OLED device. Examples of suitable emitter materials include, but are not limited to, compounds which are capable of producing emissions via phosphorescence, non-delayed fluorescence, delayed fluorescence, especially the thermally activated delayed fluorescence, i.e., TADF (also referred to as E-type delayed fluorescence), triplet-triplet annihilation, or combinations of these processes.

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further away from the vacuum level) and/or higher triplet energy than one or more of the emitters closest to the HBL interface.

In some embodiments, compound used in HBL contains the same molecule or the same functional groups used as host described above.

In some embodiments, compound used in HBL comprises at least one of the following moieties selected from the group consisting of:

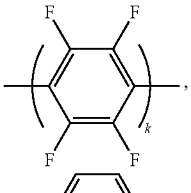,
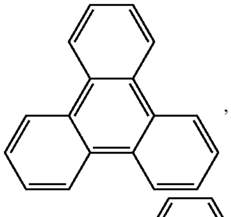,
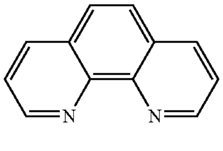,
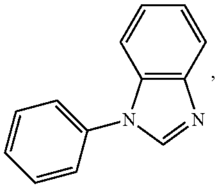,
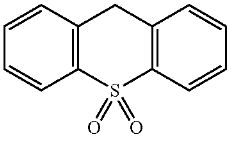, and
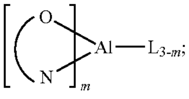;

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL comprises at least one of the following moieties in the molecule:

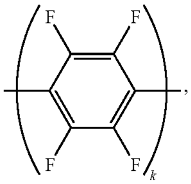,
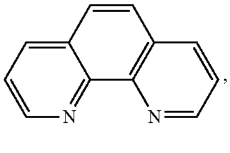,
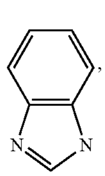,
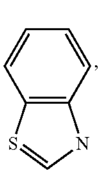,
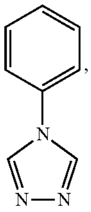,
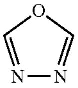,
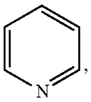,
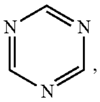,
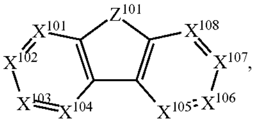,
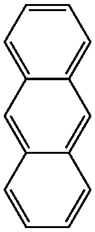.

and fullerenes; wherein k is an integer from 1 to 20, $X^{101}$ to $X^{108}$ is selected from C or N; $Z^{101}$ is selected from the group consisting of C, N, O, and S.

In some embodiments, the metal complexes used in ETL contains, but not limit to the following general formula:

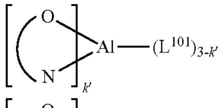
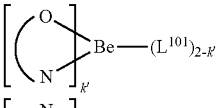
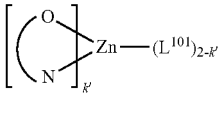
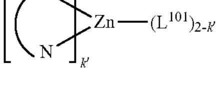

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In some embodiments, the ETL material is selected from the group consisting of anthracene-benzoimidazole compounds, aza triphenylene derivatives, anthracene-benzothiazole compounds, metal 8-hydroxyquinolates, metal hydroxybenoquinolates, bathocuprine compounds, 5-member ring electron deficient heterocycles (e.g., triazole, oxadiazole, imidazole, benzoimidazole), silole compounds, arylborane compounds, fluorinated aromatic compounds, fullerene (e.g., C60), triazine complexes, and Zn (N^N) complexes.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any of the compounds disclosed herein, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. As used herein, percent deuteration has its ordinary meaning and includes the percent of all possible hydrogen and deuterium atoms that are replaced by deuterium atoms. In some embodiments, the deuterium atoms are attached to an aromatic ring. In some embodiments, the deuterium atoms are attached to a saturated carbon atom, such as an alkyl or cycloalkyl carbon atom. In some other embodiments, the deuterium atoms are attached to a heteroatom, such as Si, or Ge atom.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

It should also be understood that embodiments of all the compounds and devices described herein may be interchangeable if those embodiments are also applicable under different aspects of the entire disclosure.

E. Experimental Section

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The devices in Tables 1 were fabricated in high vacuum (<$10^{-7}$ Torr) by thermal evaporation. The anode electrode was 750 Å of indium tin oxide (ITO). The device example had organic layers consisting of, sequentially, from the ITO surface, 100 Å of Compound 1 (HIL), 250 Å of Compound 2 (HTL), 50 Å of HH1 (EBL), 300 Å of HH1 doped with a percentage of EH1 or EH2 and a percentage BD1 or BD2 (EML), 50 Å of EH1 or EH2 (BL), 300 Å of Compound 3 doped with 35% of Compound 4 (ETL), 10 Å of Compound 3 (EIL) followed by 1,000 Å of A1 (Cathode). All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

HH1

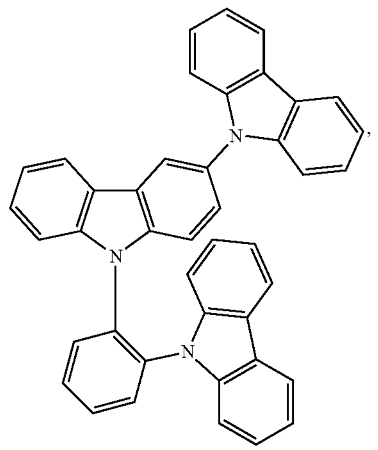

,

EH1

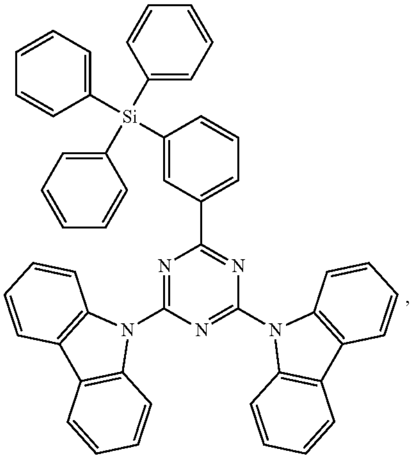

,

EH2

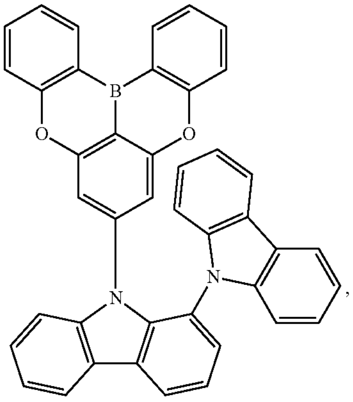

,

-continued

BD1

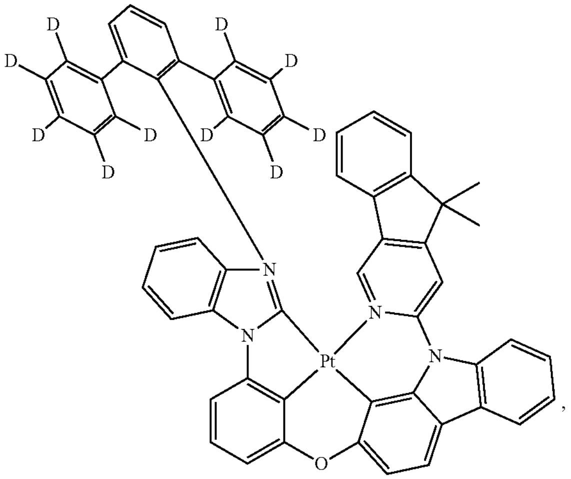

BD2

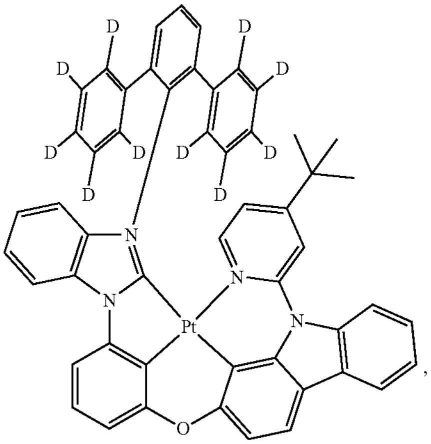

Compound 1

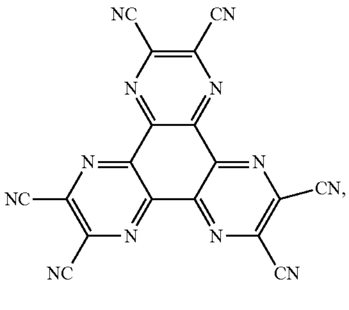

-continued

Compound 2

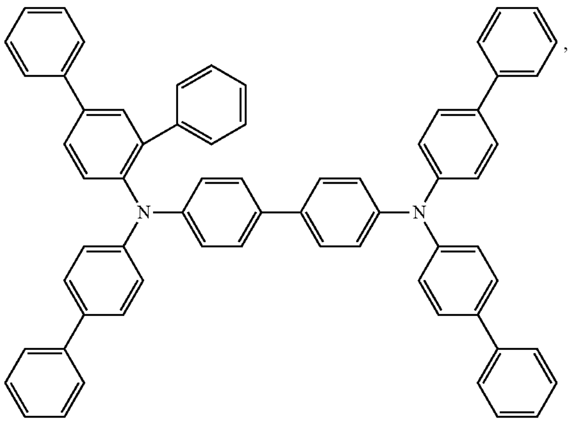

Compound 3

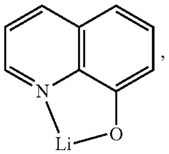

Compound 4

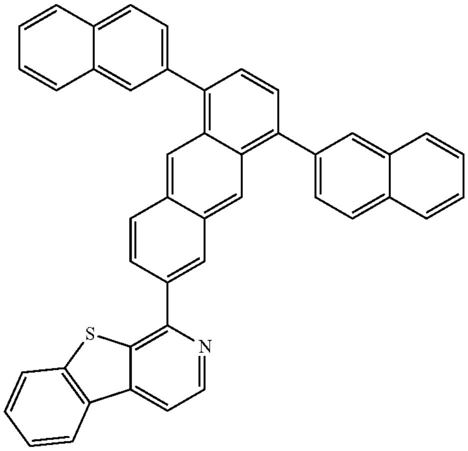

TABLE 1

Properties of Inventive and Comparative devices. The device lifetimes are determined at aging conditions of 20 mA/cm$^2$, and are normalized to comparative device 1 in HS1 and to comparative device 3 in HS2.

| Host System | Device | EML Dopant [12%] | EML Hosts [HH:EH] | 1931 CIE x | 1931 CIE y | $\lambda_{max}$ [nm] | $LT_{95}$ [norm] |
|---|---|---|---|---|---|---|---|
| HS1 | Inventive device | BD1 | HH1:EH2 [1:0.3] | 0.131 | 0.145 | 462 | 1.1 |
| | Comparative device 1 | BD2 | HH1:EH2 [1:0.3] | 0.131 | 0.142 | 461 | 1.0 |
| HS2 | Comparative device 2 | BD1 | HH1:EH1 [1:0.8] | 0.136 | 0.156 | 463 | 1.0 |
| | Comparative device 3 | BD2 | HH1:EH1 [1:0.8] | 0.134 | 0.168 | 462 | 1.0 |

As shown in Table 1, OLED devices comprising HS1 show longer lifetime with BD1 compared to BD2. BD1 has more bulk around the pyridine compared to BD2 which supports the claim that adding a bulky group around a reactive site on the emitter can increase the lifetime of devices utilizing OBO as an EHost. Furthermore, OLED devices comprising HS2 do not show longer lifetime with BD1 compared to BD2 which supports the hypothesis that the effects the bulky groups are having on lifetime are specific to the OBO containing EHost EH2. These improvements were beyond any value that could be attributed to experimental error and the observed improvements were significant.

What is claimed is:

1. An organic light emitting device (OLED) comprising:
an anode;
a cathode; and
an emissive layer, disposed between the anode and cathode;
wherein the emissive layer comprises a first compound and a second compound;
wherein the first compound has a structure of Formula I:

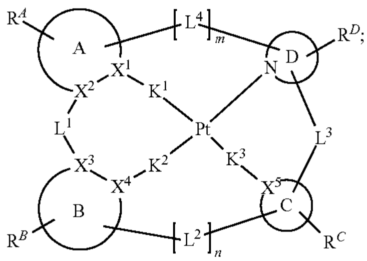

wherein:
each of moiety A, moiety B, moiety C, and moiety D is independently a monocyclic ring or a polycyclic fused ring system, where the monocyclic ring or each ring of the polycyclic fused ring system is independently a 5-membered or 6-membered carbocyclic or heterocyclic ring;
each of $X^1$ to $X^5$ is independently C or N;
each of $K^1$, $K^2$, and $K^3$ is independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;
m and n are each independently 0 or 1:
m+n=1 or 2;

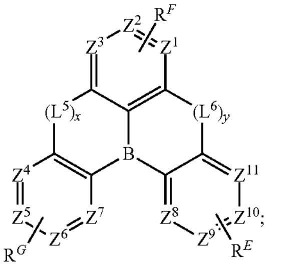

wherein the second compound has Formula II,
wherein:
each of $Z^1$ to $Z^{11}$ is independently C or N;
x and y are each independently 0 or 1;
wherein the LUMO energy of the second compound is less than or equal to −2.33 eV;
wherein:
each of $L^1$, $L^2$, $L^3$, $L^4$, $L^5$, and $L^6$ is independently selected from the group consisting of a direct bond, or a linker selected from the group consisting of BR, BRR', NR, PR, P(O)R, O, S, Se, C═O, C═S, C═Se, C═NR', C═CR"R'", S═O, $SO_2$, CR, CRR', SiRR', GeRR', alkyl, cycloalkyl, aryl, heteroaryl, and combinations thereof;
each of $R^A$, $R^B$, $R^C$, $R^D$, $R^E$, $R^F$, and $R^G$ independently represents mono to the maximum allowable substitution, or no substitution;
each $R^\alpha$, $R^\beta$, R, R', R", R'", $R^A$, $R^B$, $R^C$, $R^D$, $R^E$, $R^F$, and $R^G$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and
any two substituents may be joined or fused to form a ring; with at least one of the following conditions being true:
(1) wherein at least one $R^D$ substituent is not hydrogen;
(2) wherein one of moiety A, B, C, or D of Formula I comprises a pyridine moiety coordinated to Pt, and the pyridine moiety having a center of gravity C1; wherein the closest calculated intermolecular distance at 0K between C1 and the boron atom of Formula II is greater than or equal to 3.57 Å;
(3) wherein at least one of $R^E$, $R^G$, or $R^F$ of Formula II has a spherocity greater than or equal to 0.04, and the LUMO energy of Formula II is less than or equal to −2.33 eV; and
(4) when moiety A is benzimidazole, each of moiety B and moiety C is phenyl, moiety D is pyridine, and $X^1$ is N, at least one of the following two conditions is true:
(a) a combined molecular weight of all of the at least one $R^D$ substituents that are not hydrogen is ≥57 g/mol; or
(b) two $R^D$ substituents are joined together to form a ring.

2. The OLED of claim 1, wherein each $R^\alpha$, $R^\beta$, R, R', R", R'", $R^A$, $R^B$, $R^C$, $R^D$, $R^E$, $R^F$, and $R^G$ is independently a hydrogen or a substituent selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

3. The OLED of claim 1, wherein each of moiety A, moiety B, moiety C, and moiety D is independently selected from the group consisting of benzene, pyridine, pyrimidine, pyridazine, pyrazine, triazine, imidazole, imidazole derived carbene, pyrazole, pyrrole, oxazole, furan, thiophene, thiazole, triazole, naphthalene, quinoline, isoquinoline, quinazoline, benzofuran, aza-benzofuran, benzoxazole, aza-benzoxazole, benzothiophene, aza-benzothiophene, benzothiazole, aza-benzothiazole, benzoselenophene, aza-benzoselenophene, indene, aza-indene, indole, aza-indole, benzimidazole, aza-benzimidazole, benzimidazole derived carbene, aza-benzimidazole derived carbene, carbazole, aza-carbazole, dibenzofuran, aza-dibenzofuran, dibenzothiophene, aza-dibenzothiophene, quinoxaline, phthalazine, phenanthrene, aza-phenanathrene, anthracene, aza-antracene, phenanthridine, fluorene, and aza-fluorene.

4. The OLED of claim 1, wherein the ring comprising $X^1$ and $X^2$ is an N-heterocyclic carbene ligand.

5. The OLED of claim 1, wherein $L^1$ is a direct bond; and/or wherein n is 1; and/or wherein $L^2$ is selected from the group consisting of O, S, NR, CRR', SiRR', and Se; and/or wherein $L^3$ is a direct bond, BR, NR, or PR; and/or wherein m is 0; and/or wherein $L^4$ is selected from the group consisting of O, S, NR, CRR', SiRR', and Se; and/or wherein each of $K^1$, $K^2$, and $K^3$ is a direct bond or one of $K^1$, $K^2$, or $K^3$ is O or S.

6. The OLED of claim 1, wherein the molecular weight of each of the at least one $R^D$ substituents that are not hydrogen is ≥57 g/mol, or wherein the at least one $R^D$ is a bulky group.

7. The OLED of claim 1, wherein the at least one $R^D$ has a structure selected from the group consisting of:

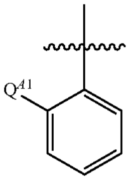,
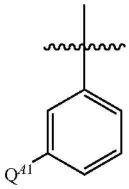,
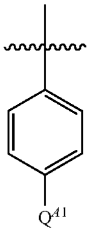,
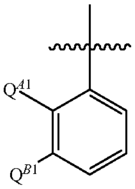,
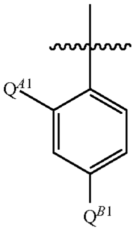,
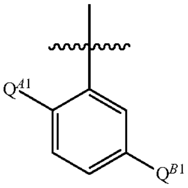,
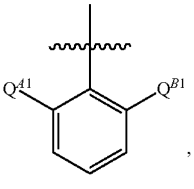,
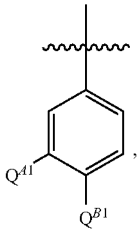,
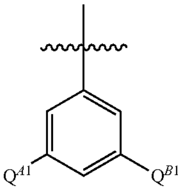,
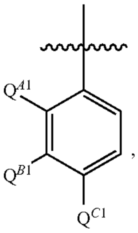,
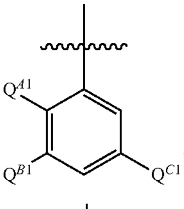,
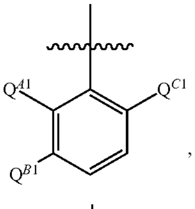,
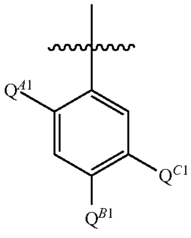,
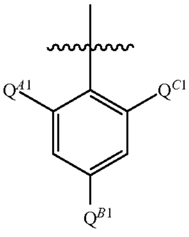, -continued

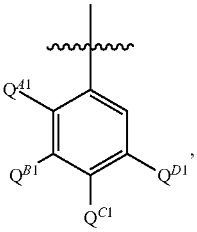,
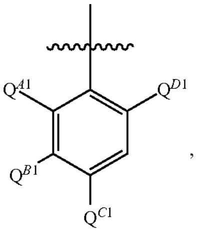,
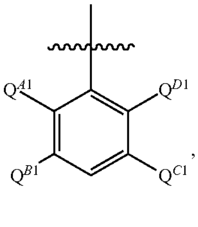,
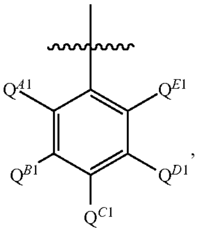,
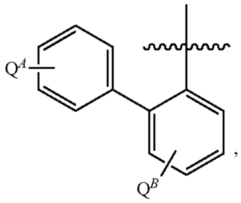,
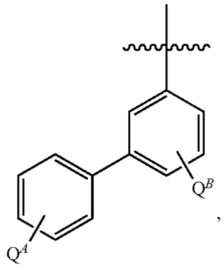,
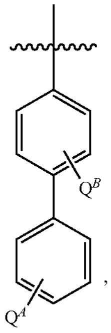,
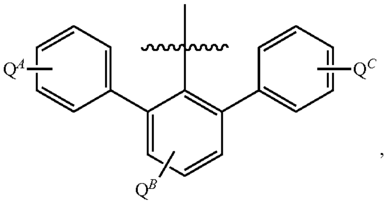,
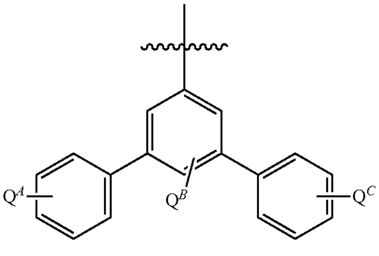,
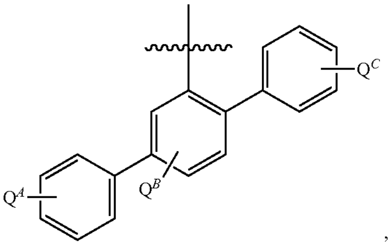, -continued
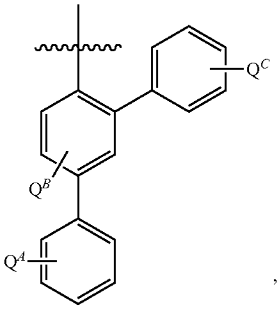
,
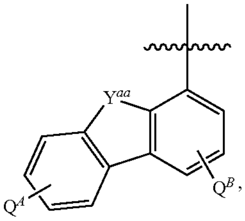
,
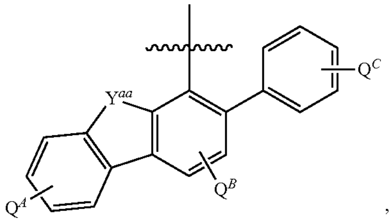
,
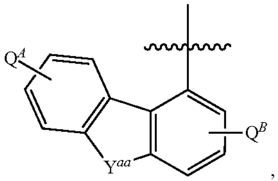
,
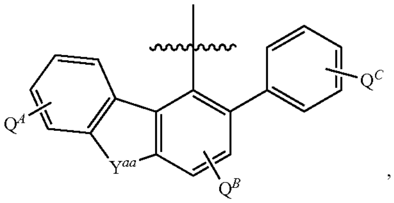
,
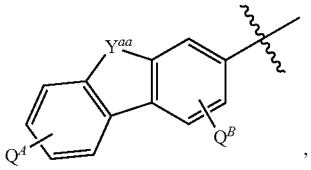
,
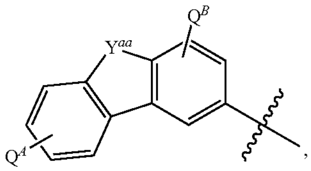
,
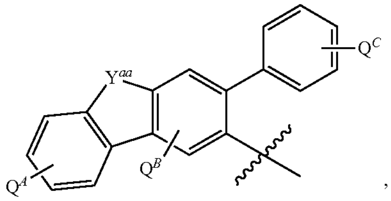
,
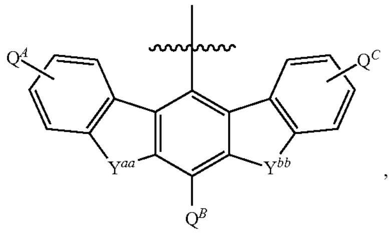
,
-continued
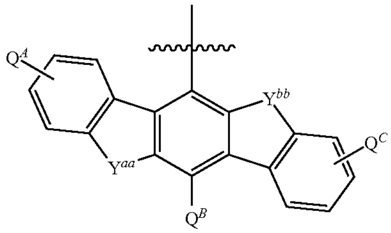
,
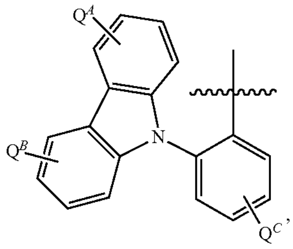
,
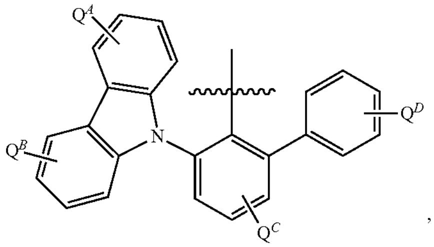
,
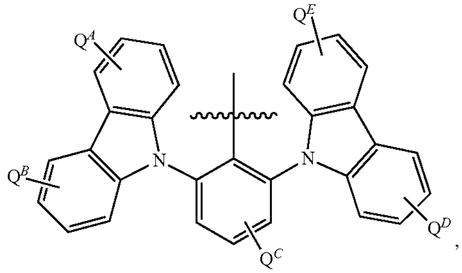
,
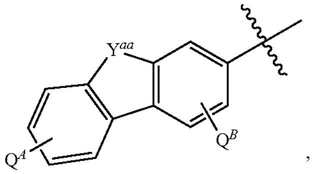
,
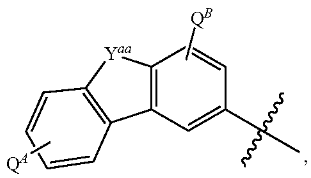
,
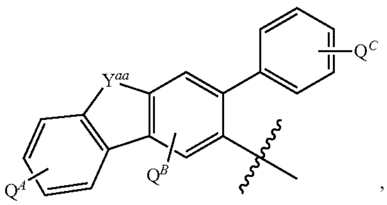
, -continued

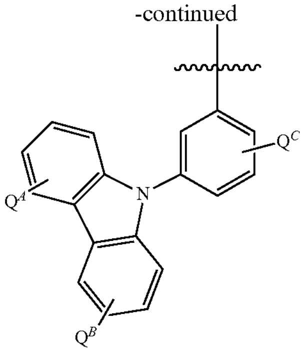

, and

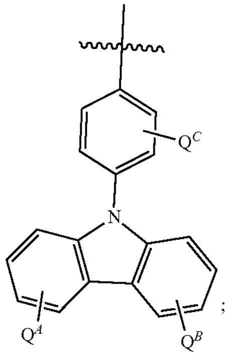

;

wherein:

each $Y^{aa}$ and $Y^{bb}$ is independently selected from the group consisting of a direct bond, BR, BRR', NR, PR, O, S, Se, C=O, C=S, C=Se, C=NR, C=CRR', S=O, $SO_2$, CR, CRR', SiRR', GeRR', alkyl, cycloalkyl, aryl, heteroaryl, and combinations thereof;

each of $Q^A$, $Q^B$, $Q^C$, $Q^D$, and $Q^E$ independently represents mono to the maximum allowable substitution, or no substitution;

each R, R', $Q^A$, $Q^B$, $Q^C$, $Q^D$, $Q^E$, $Q^{A1}$, $Q^{B1}$, $Q^{C1}$, $Q^{D1}$ and $Q^{E1}$ is independently a hydrogen or a substituent selected from the group consisting of alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

8. The OLED of claim 1, wherein the first compound has a structure selected from the group consisting of:

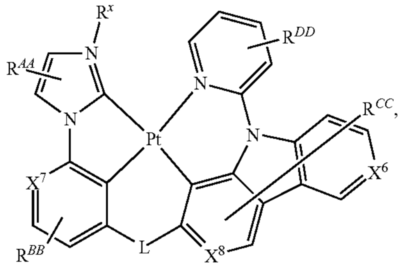

-continued

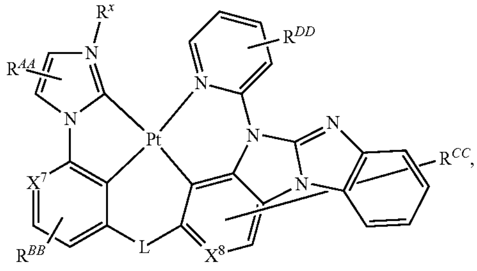

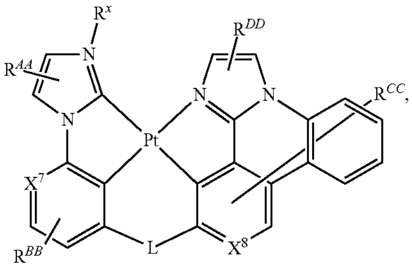

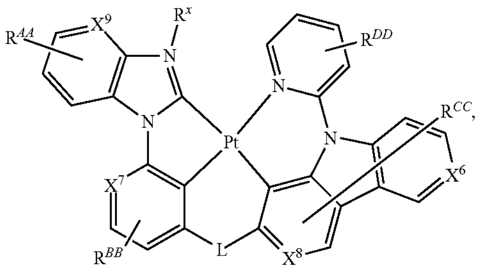

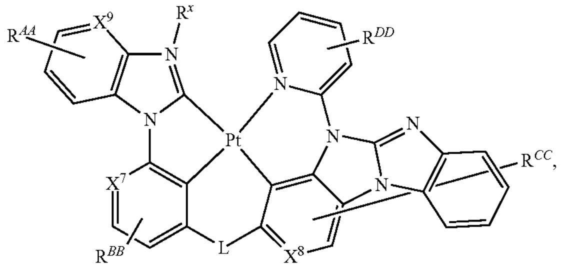

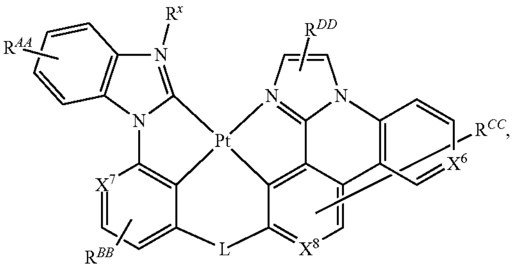

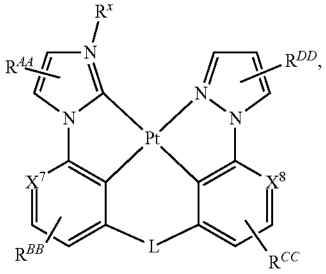

-continued
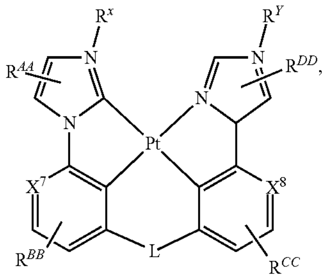
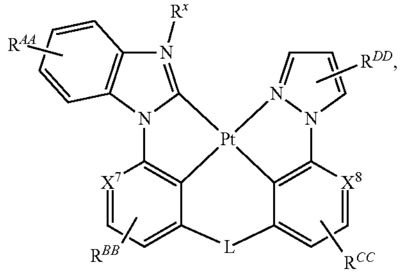
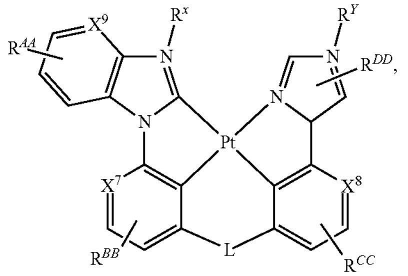
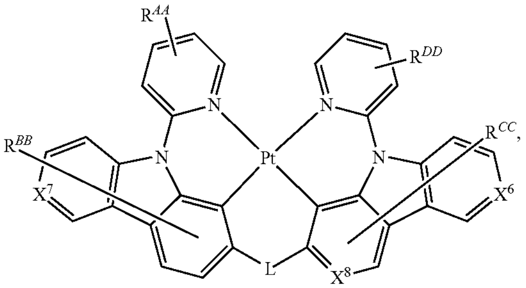
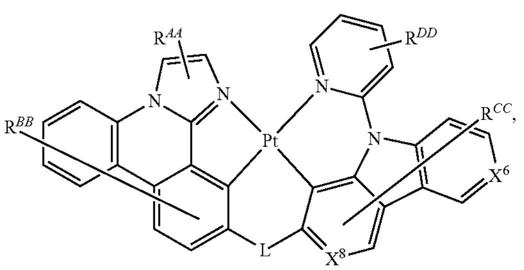
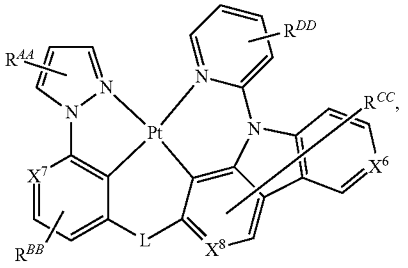
-continued
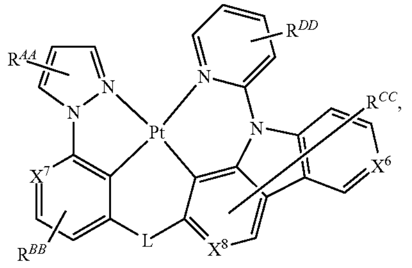
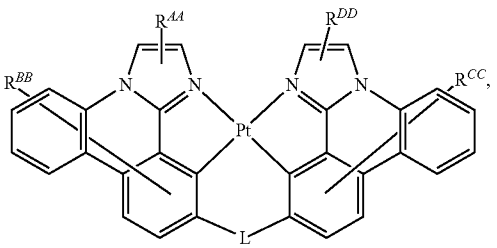
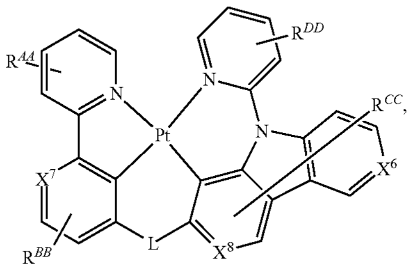
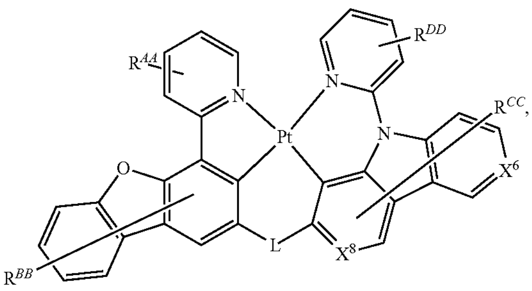
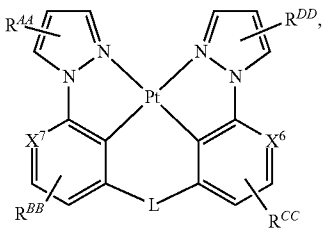
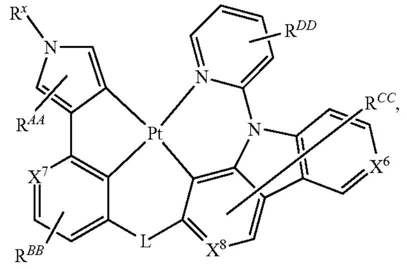

-continued
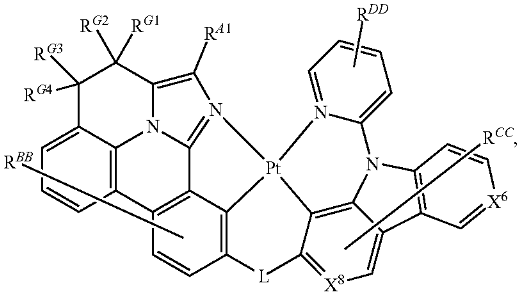
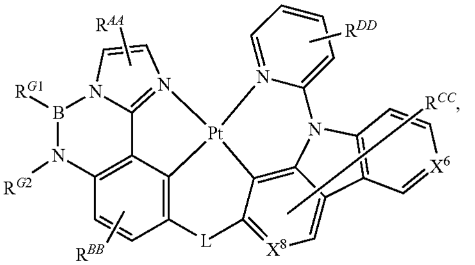
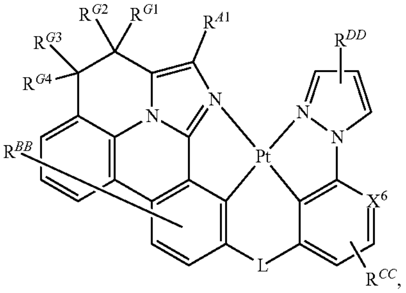
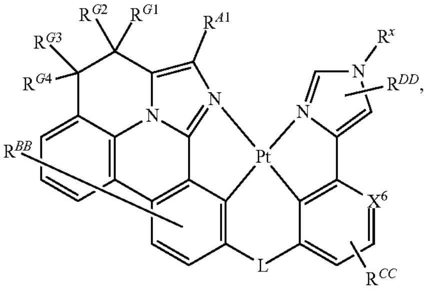
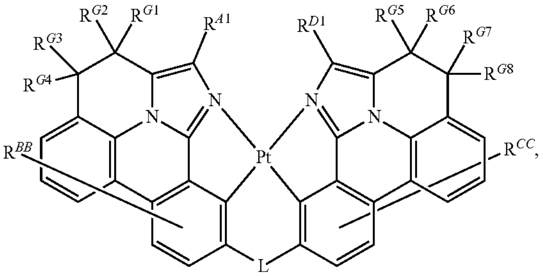
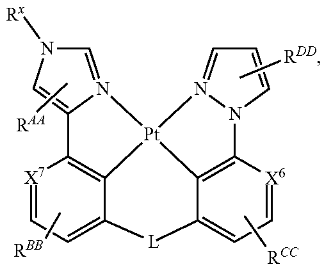
-continued
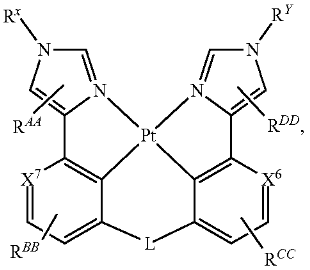
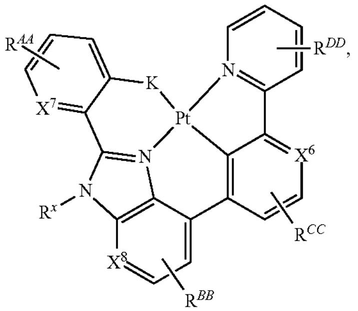
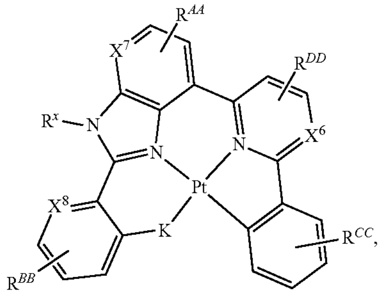
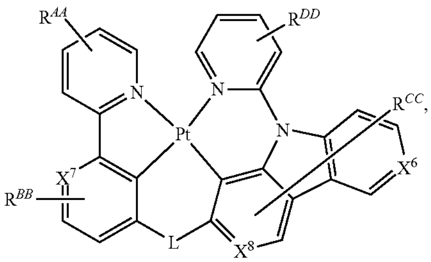
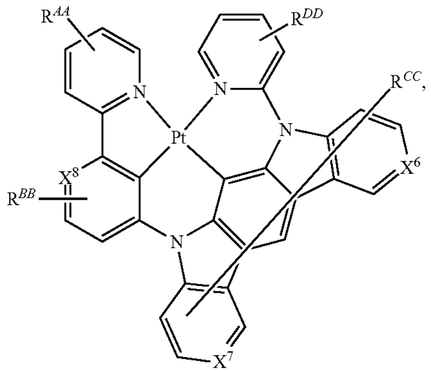

-continued
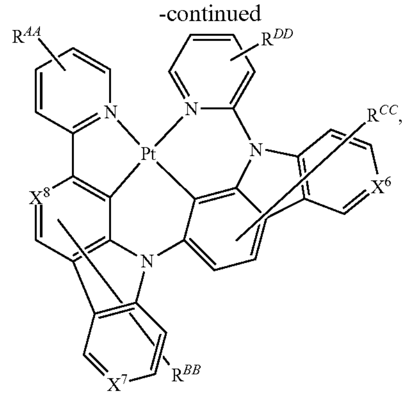
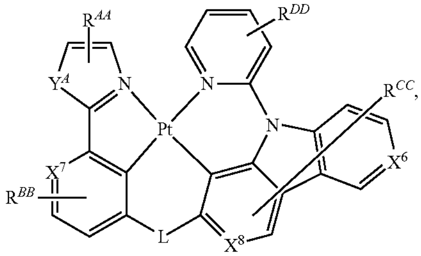
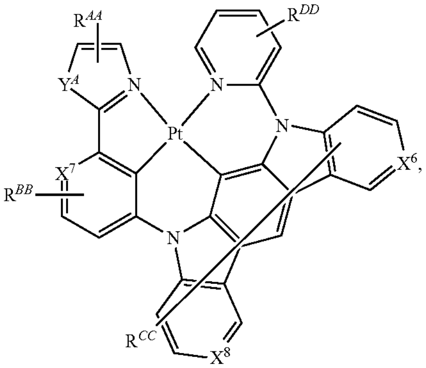
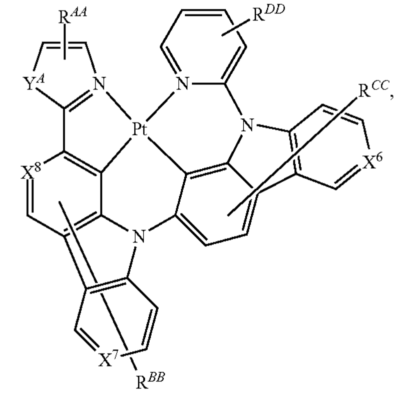
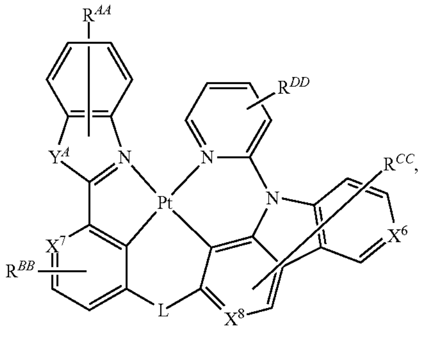
-continued
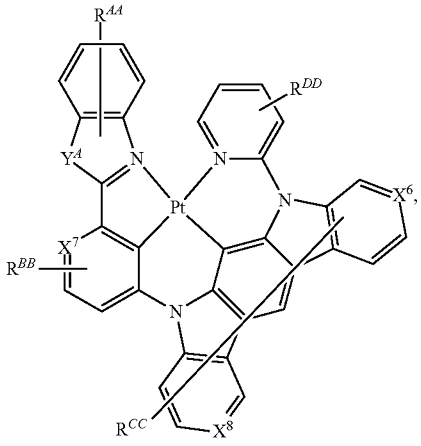
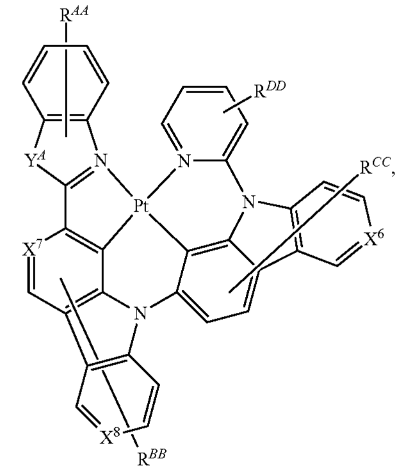
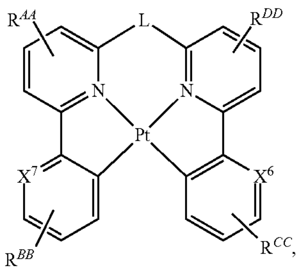
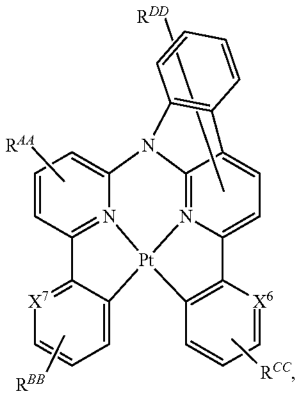

-continued
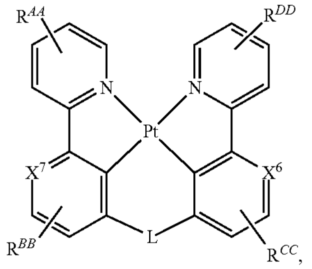
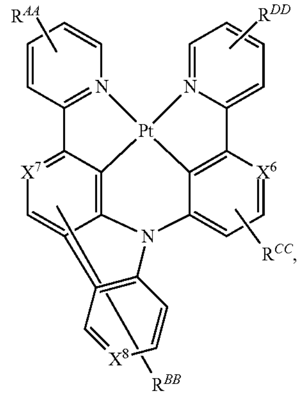
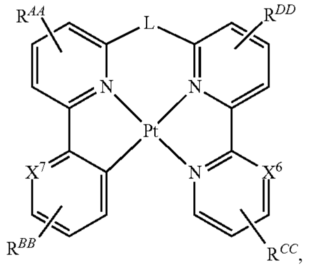
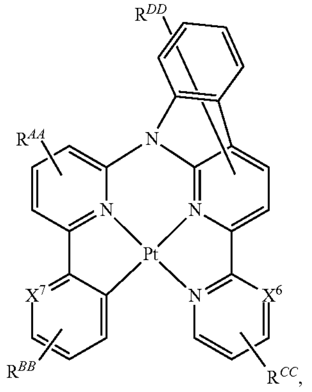
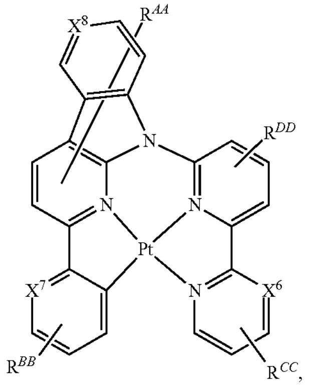
-continued
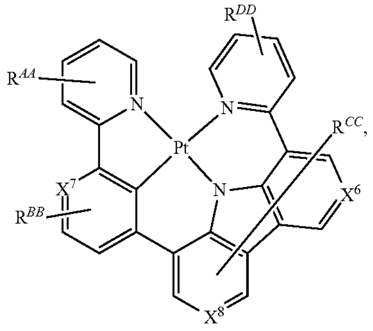
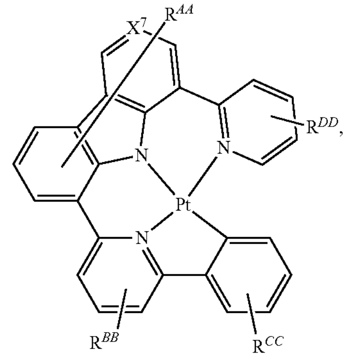
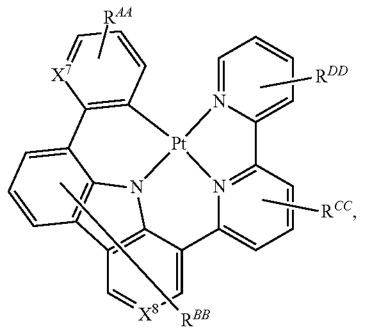
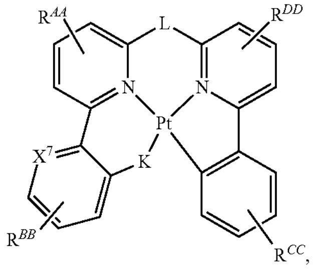
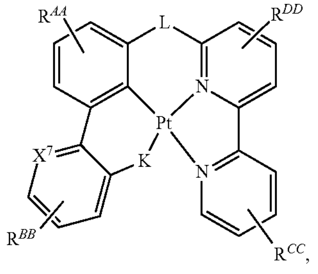

-continued
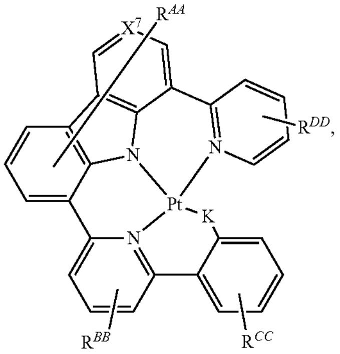
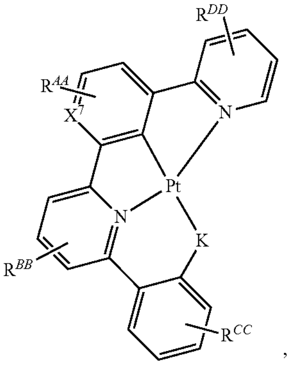
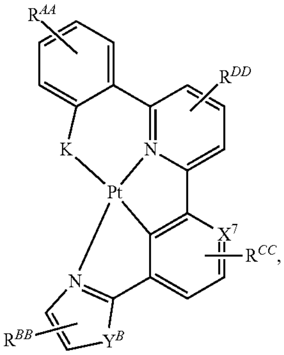
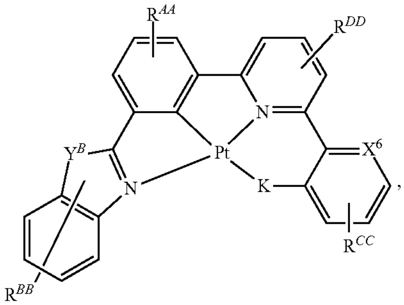
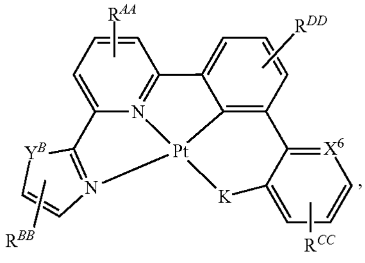
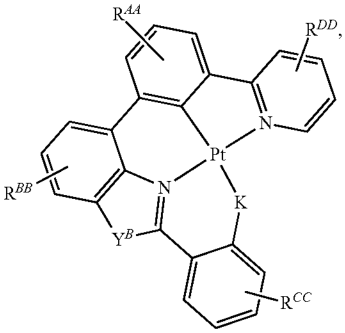
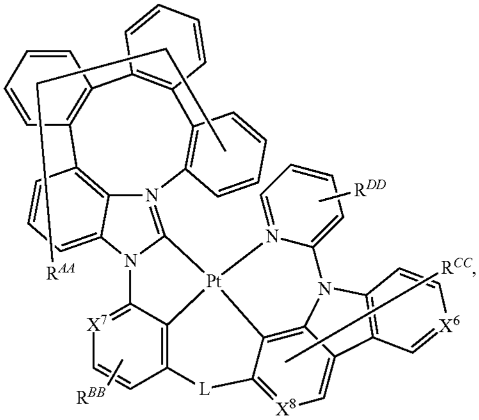
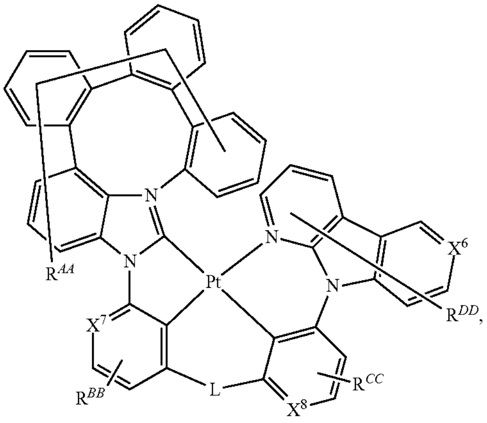
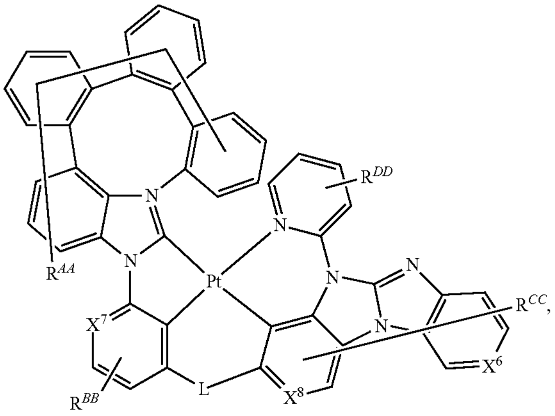

-continued
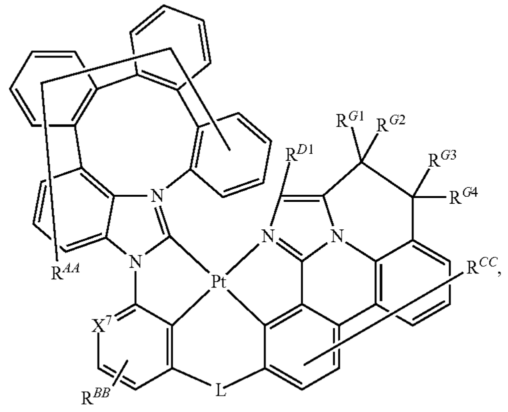
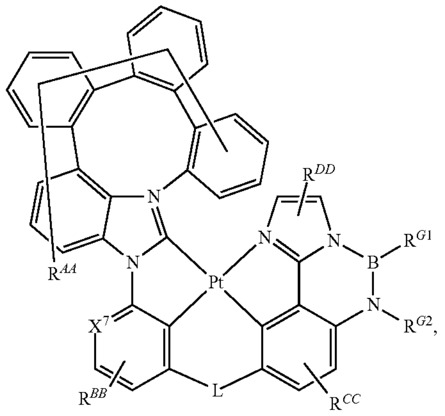
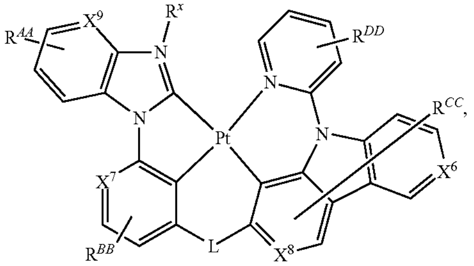
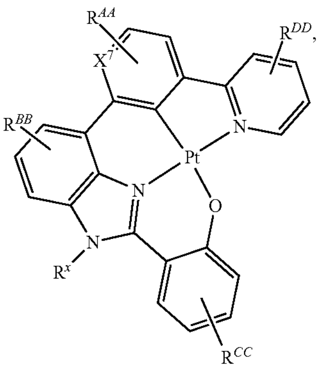
and
-continued
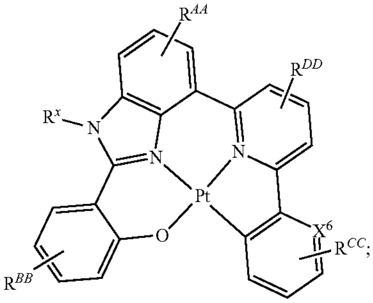
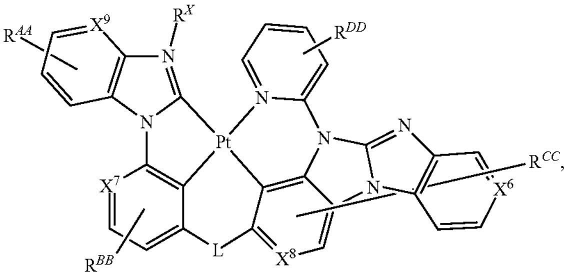
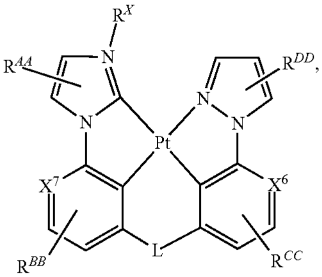
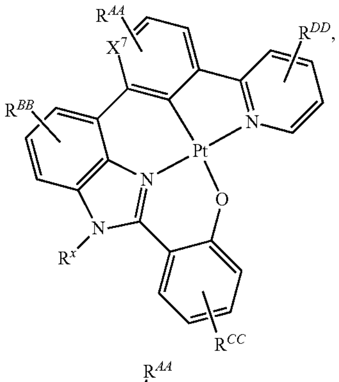
and
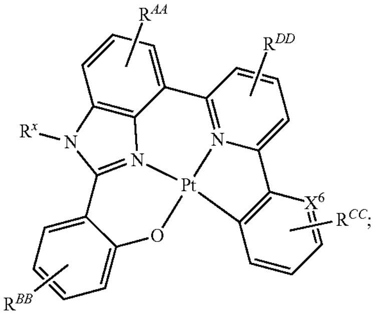

wherein:

each of $X^6$ to $X^9$ is independently C or N;

K is selected from the group consisting of a direct bond, O, S, N($R^{\alpha}$), P($R^{\alpha}$), B($R^{\alpha}$), C($R^{\alpha}$)($R^{B}$), and Si($R^{\alpha}$)($R^{B}$);

L is selected from the group consisting of a direct bond, or a linker selected from the group consisting of BR, BRR', NR, PR, P(O)R, O, S, Se, C═O, C═S, C═Se, C═NR', C═CR"R'", S═O, $SO_2$, CR, CRR', SiRR', GeRR', alkyl, cycloalkyl, aryl, heteroaryl, and combinations thereof;

each of $Y^A$ and $Y^B$ is independently selected from the group consisting of BR, BRR', NR, PR, P(O)R, O, S, Se, C═O, C═S, C═Se, C═NR', C═CR"R'", S═O, $SO_2$, CR, CRR', SiRR', GERR';

each of $R^{AA}$, $R^{BB}$, $R^{CC}$, and $R^{DD}$ independently represents mono to the maximum allowable substitution, or no substitution;

each R, R', R", R", $R^{\alpha}$, $R^{B}$, $R^{X}$, $R^{Y}$, $R^{A1}$, $R^{D1}$, $R^{G1}$, $R^{G2}$, $R^{G3}$, $R^{G4}$, $R^{G5}$, $R^{G6}$, $R^{G7}$, $R^{G8}$, $R^{AA}$, $R^{BB}$, $R^{CC}$, and $R^{DD}$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

9. The OLED of claim 1, wherein the first compound has a structure selected from the group consisting of:

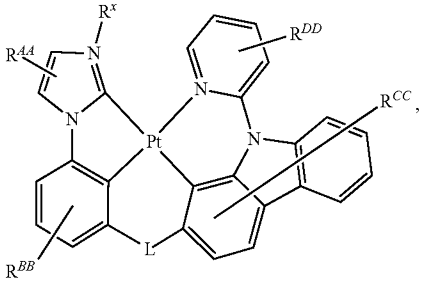

,

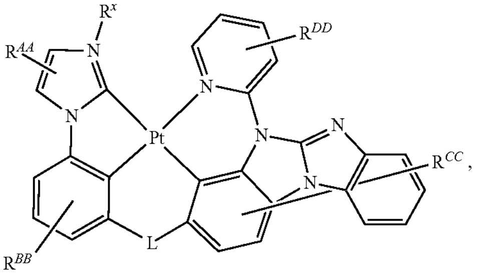

,

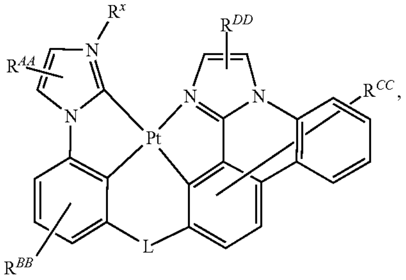

,

-continued

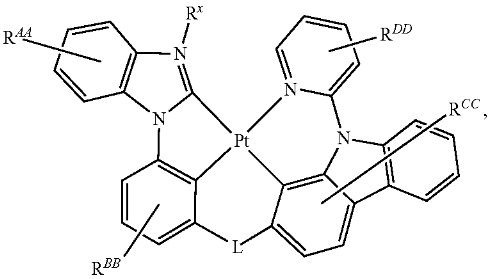

,

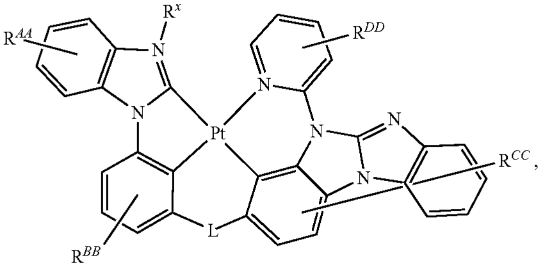

,

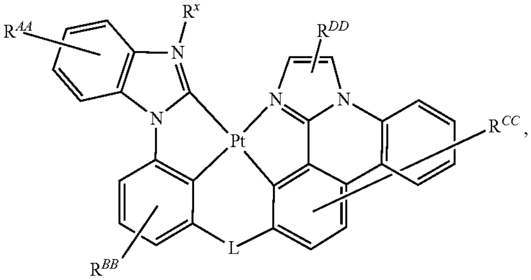

,

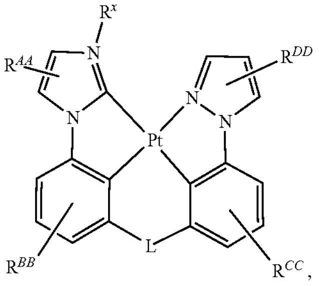

,

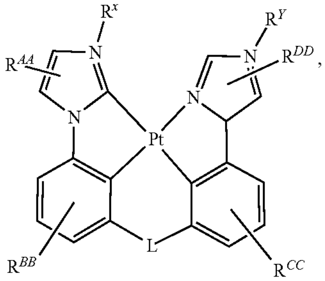

,

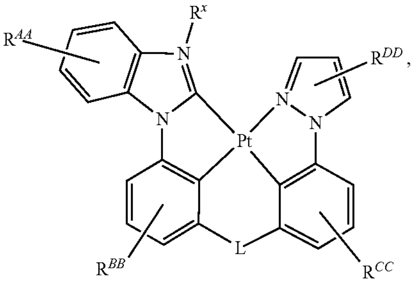

-continued
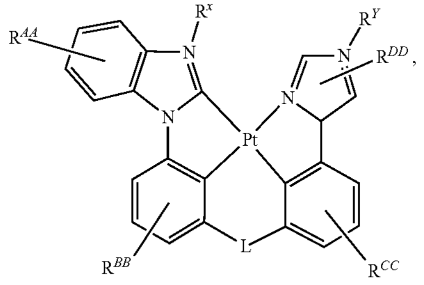
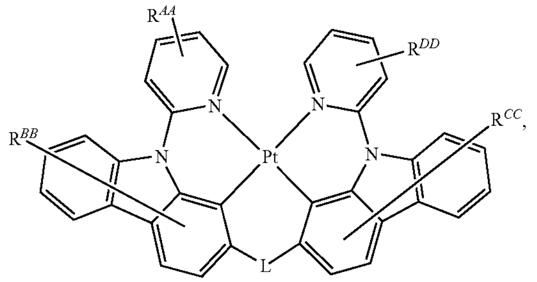
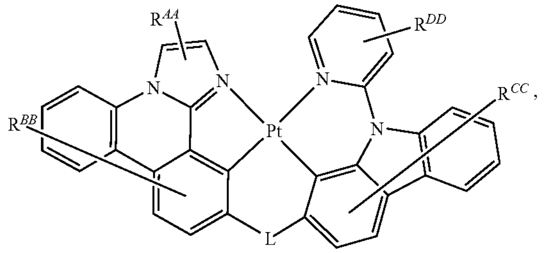
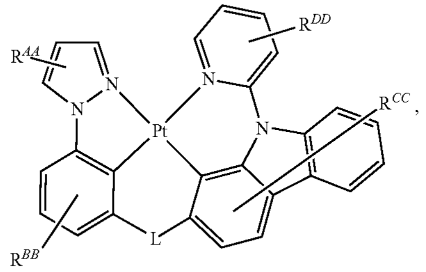
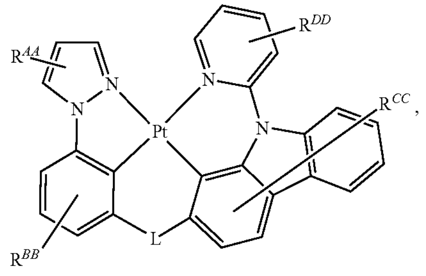
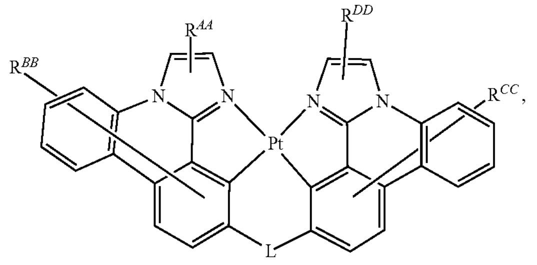
-continued
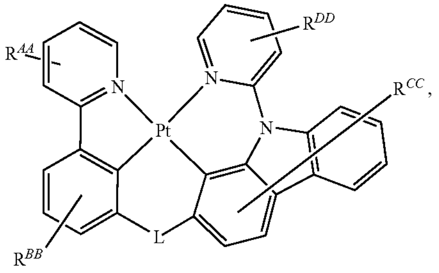
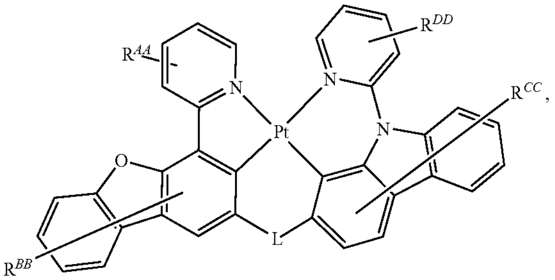
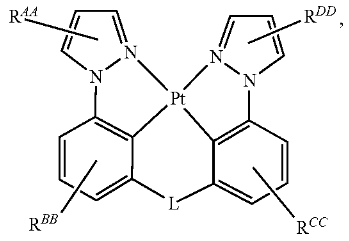
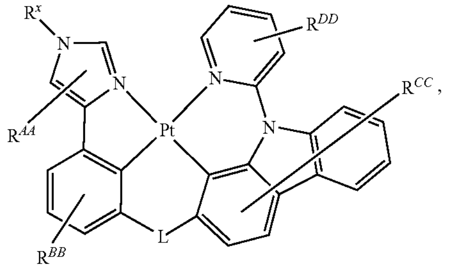
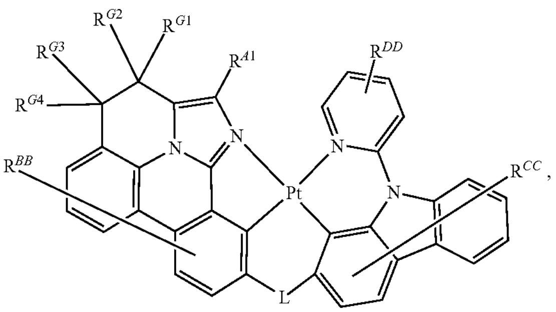
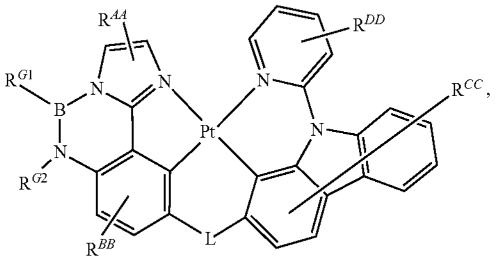

-continued
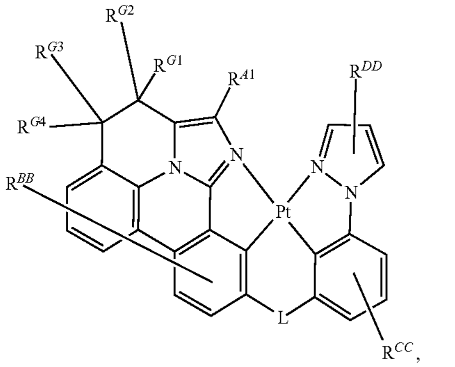
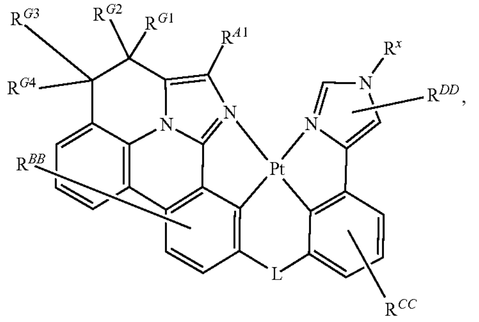
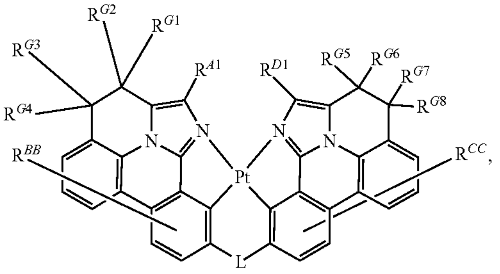
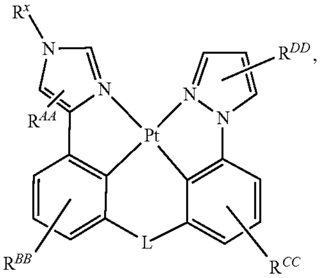
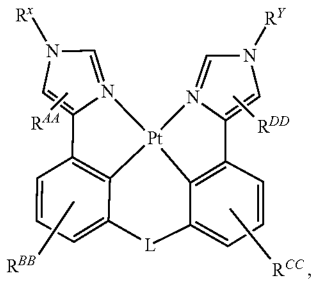
-continued
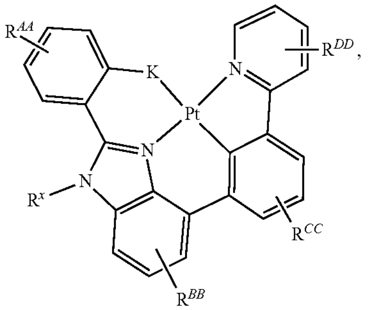
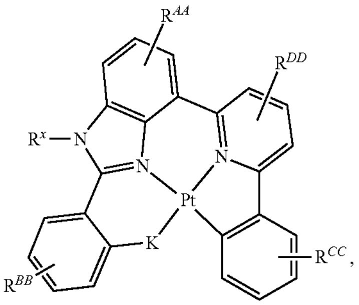
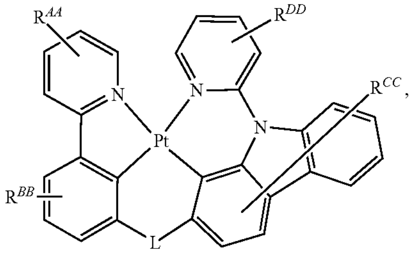
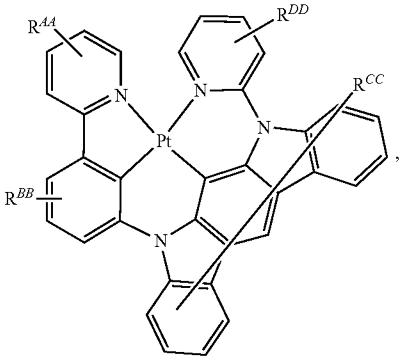
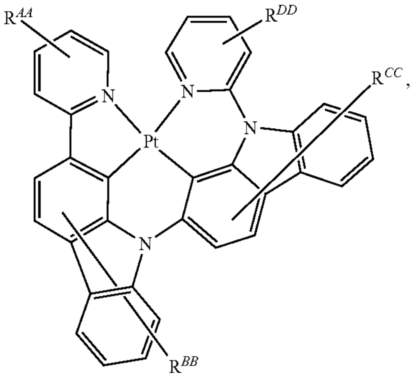

-continued
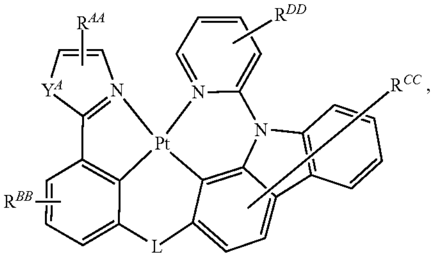
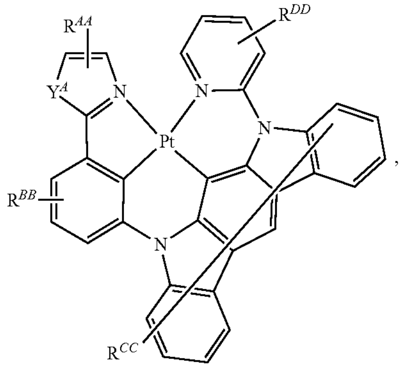
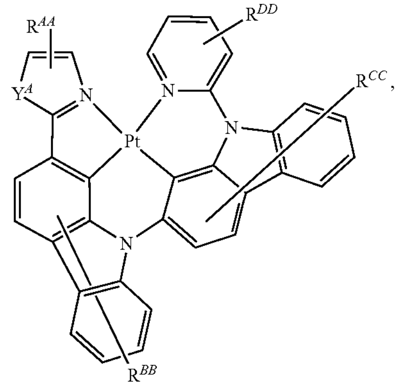
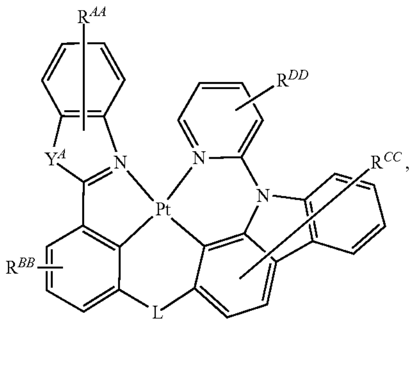
-continued
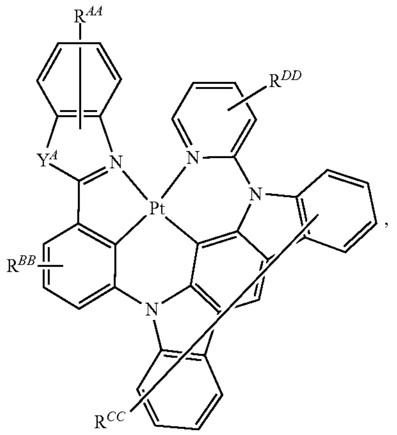
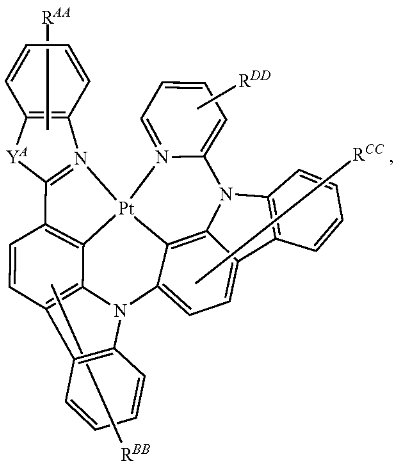
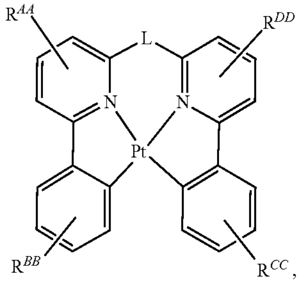
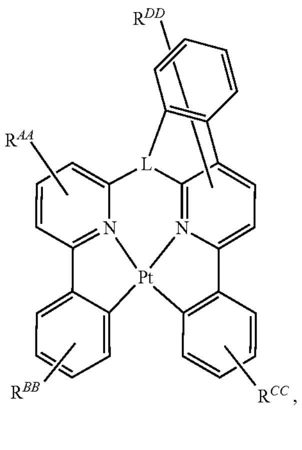

-continued
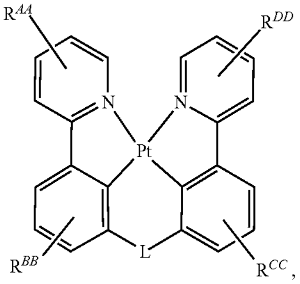
,
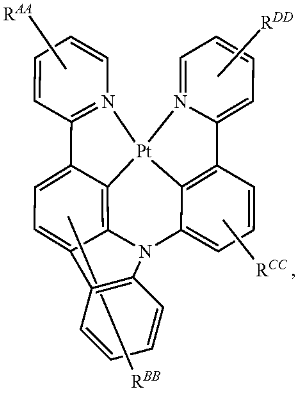
,
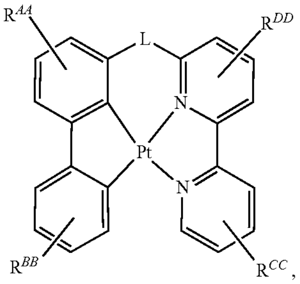
,
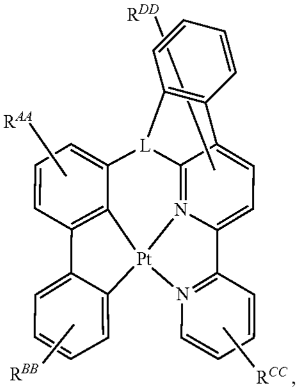
,
-continued
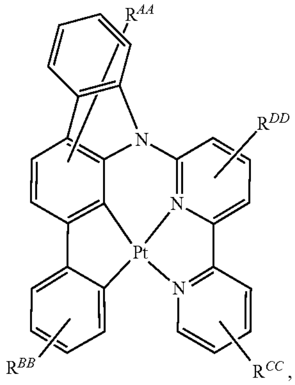
,
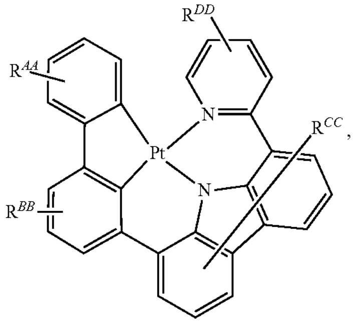
,
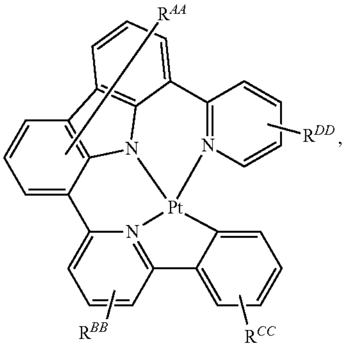
,
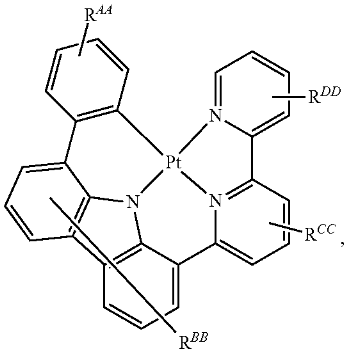
,
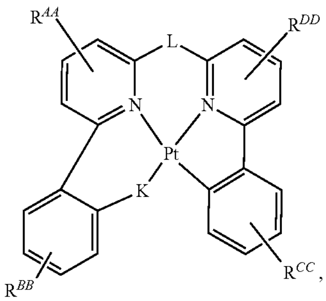
, -continued
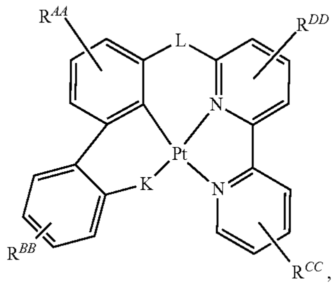
,
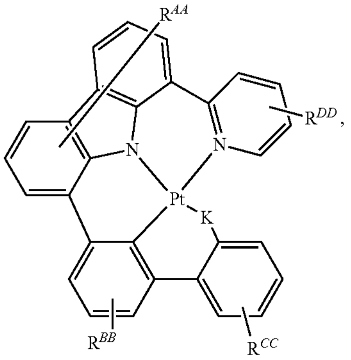
,
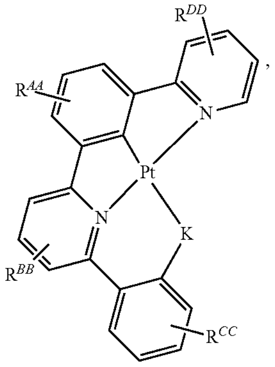
,
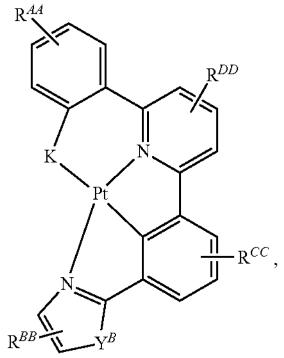
,
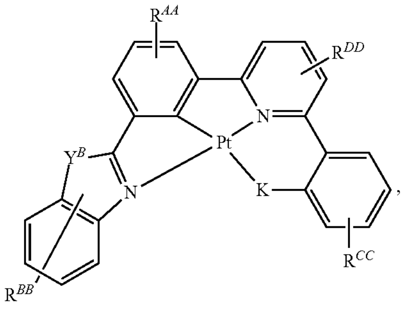
,
-continued
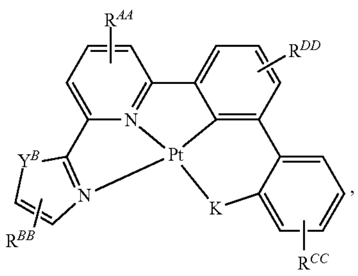
,
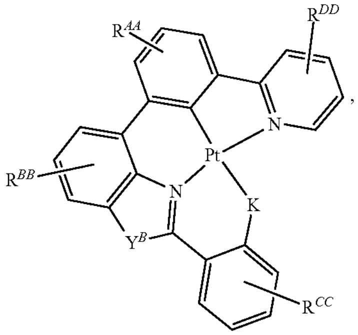
,
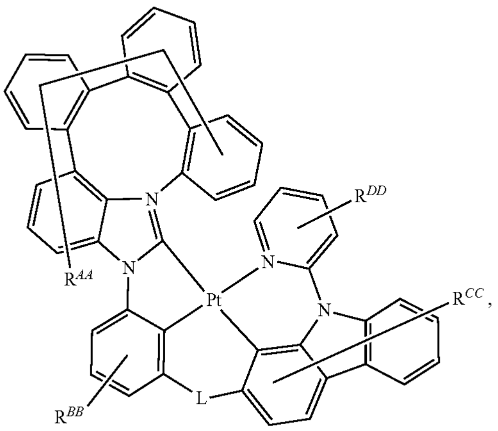
,
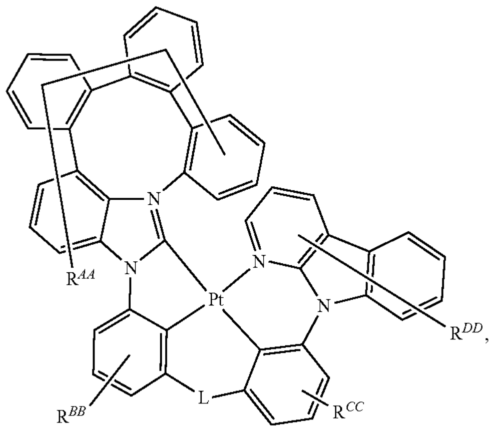
, -continued

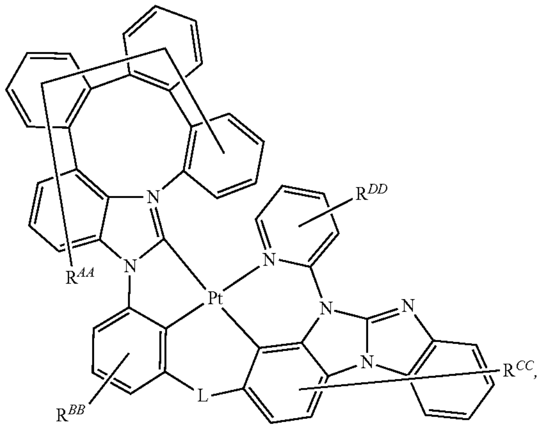

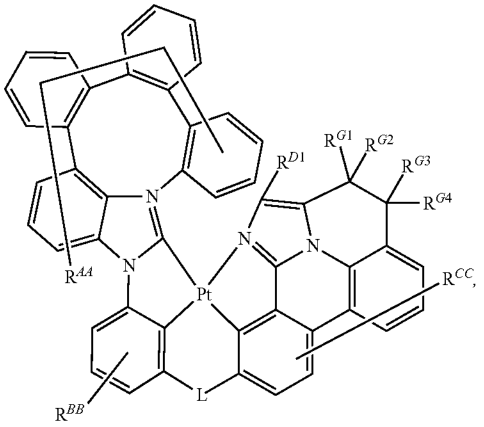

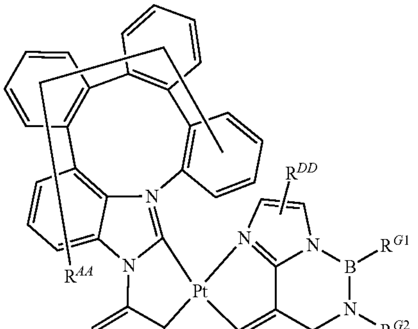

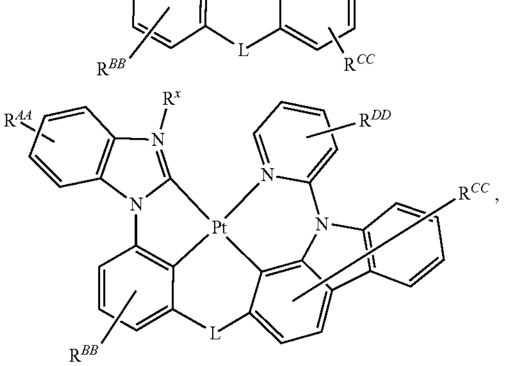

-continued

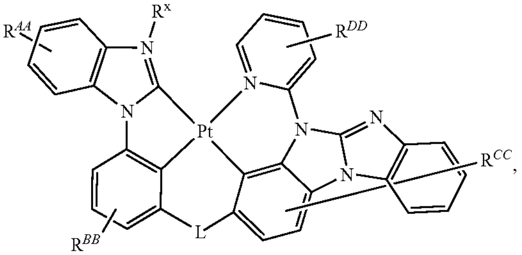

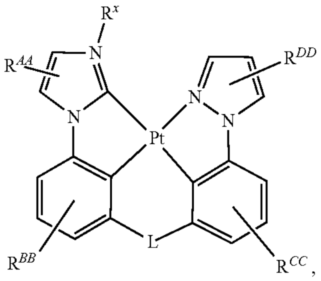

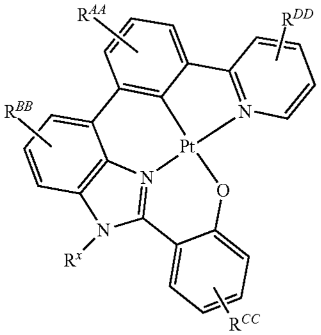

, and

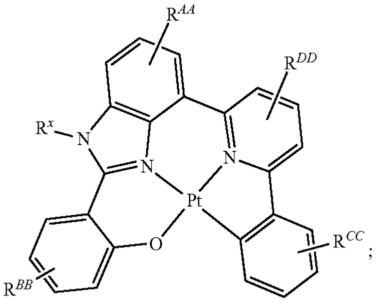

wherein:

K is selected from the group consisting of a direct bond, O, S, N($R^{\alpha}$), P($R^{\alpha}$), B($R^{\alpha}$), C($R^{\alpha}$)($R^{\beta}$), and Si($R^{\alpha}$)($R^{\beta}$);

L is selected from the group consisting of a direct bond, or a linker selected from the group consisting of BR, BRR', NR, PR, P(O)R, O, S, Se, C═O, C═S, C═Se, C═NR', C═CR"R"', S═O, $SO_2$, CR, CRR', SiRR', GeRR', alkyl, cycloalkyl, aryl, heteroaryl, and combinations thereof each of $Y^A$ and $Y^B$ is independently selected from the group consisting of BR, BRR', NR, PR, P(O)R, O, S, Se, C═O, C═S, C═Se, C═NR', C═CR"R"', S═O, $SO_2$, CR, CRR', SiRR', GeRR';

each of $R^{AA}$, $R^{BB}$, $R^{CC}$, and $R^{DD}$ independently represents mono to the maximum allowable substitution, or no substitution;

each R, R', R'', R''', $R^{\alpha}$, $R^{\beta}$, $R^{X}$, $R^{Y}$, $R^{A1}$, $R^{D1}$, $R^{G1}$, $R^{G2}$, $R^{G3}$, $R^{G4}$, $R^{G5}$, $R^{G6}$, $R^{G7}$, $R^{G8}$, $R^{AA}$, $R^{BB}$, $R^{CC}$, and $R^{DD}$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

10. The OLED of claim 1, wherein the first compound has a structure selected from the group consisting of:

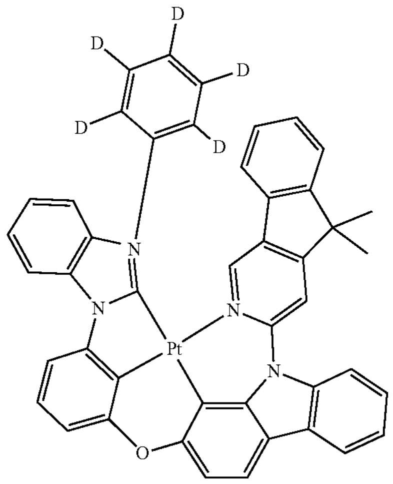
,
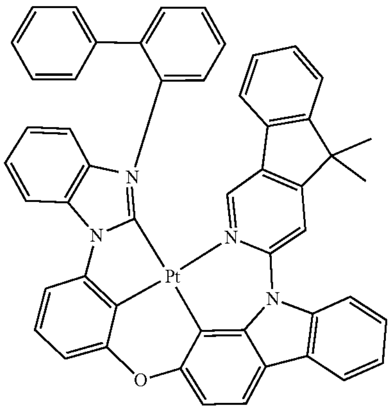
,
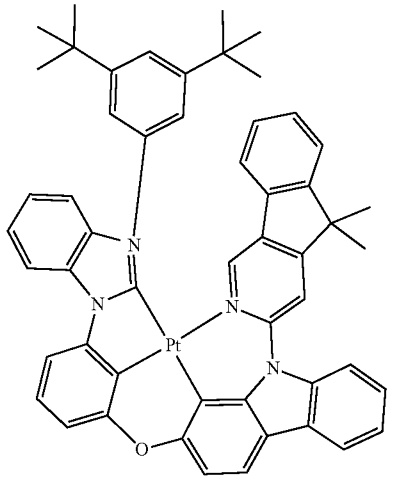
,
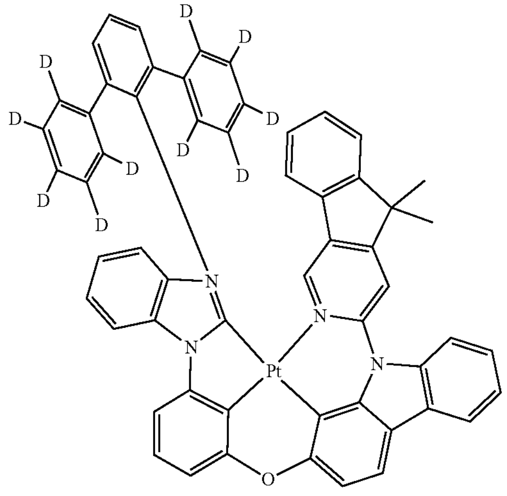
,
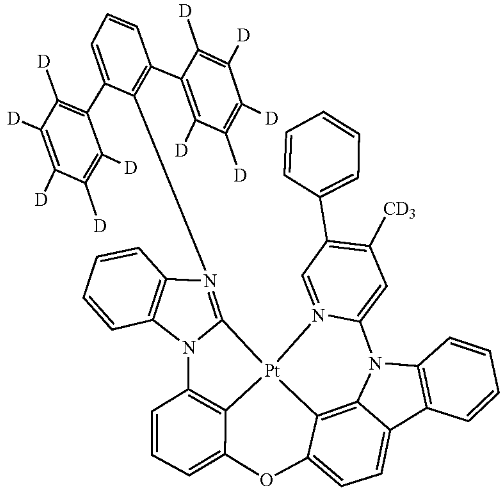
,
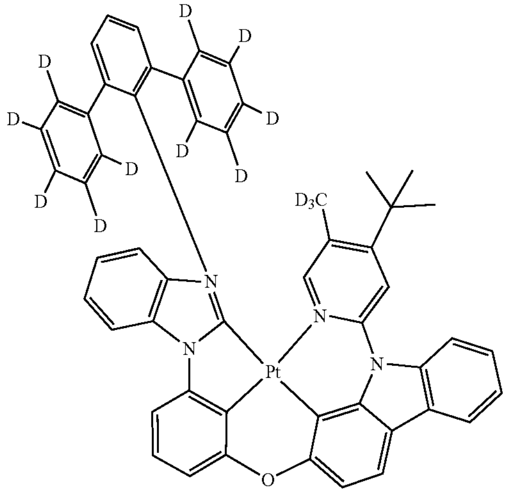
, -continued
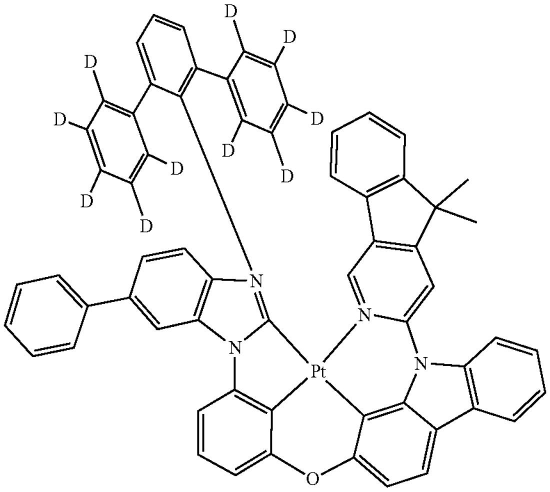
,
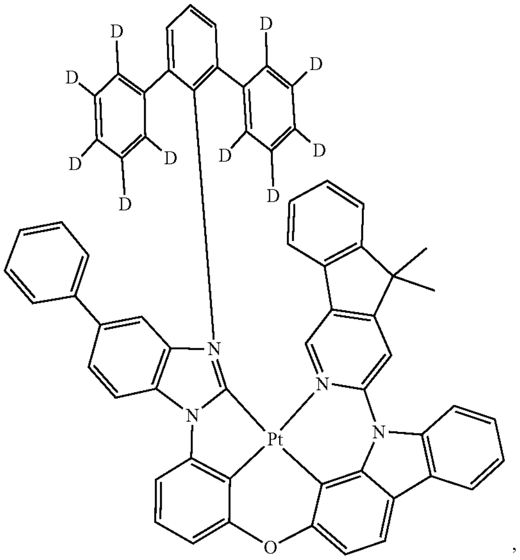
,
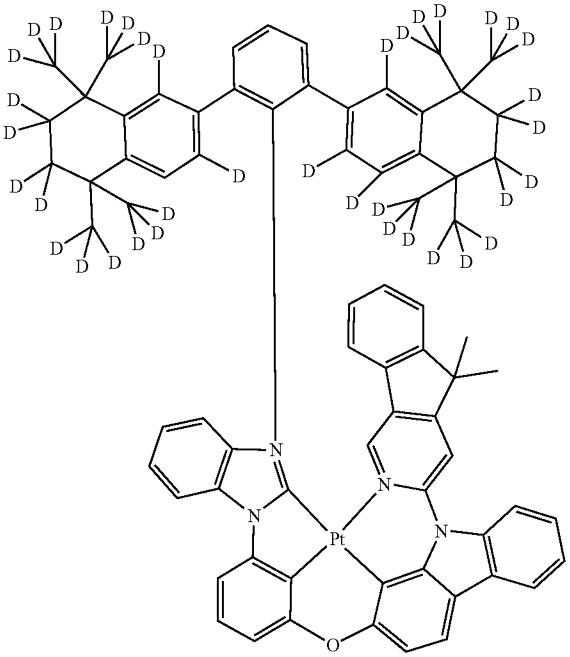
,
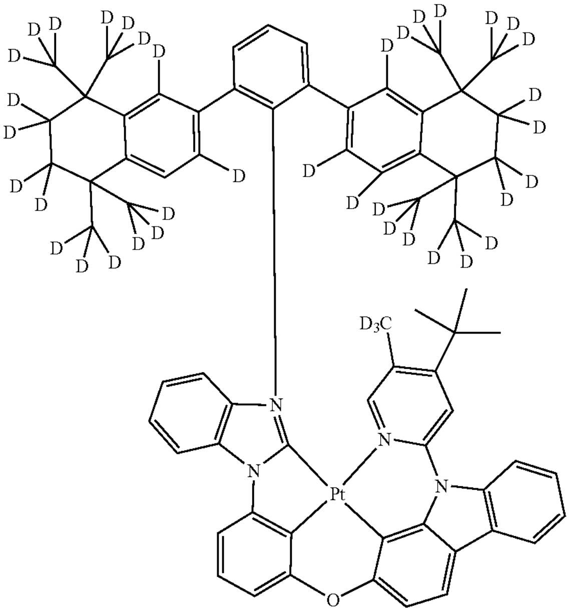
, -continued
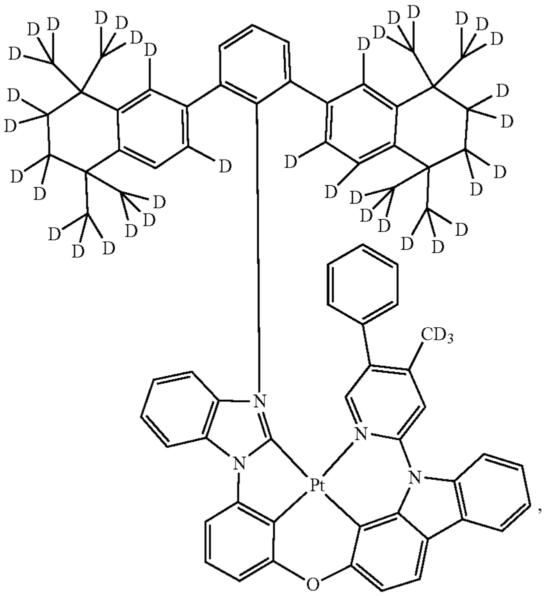
,
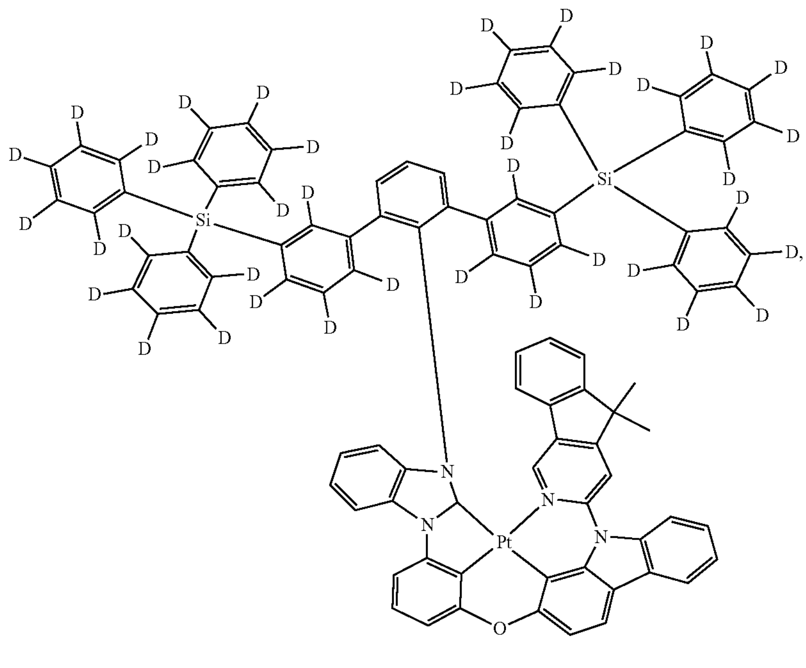
, -continued
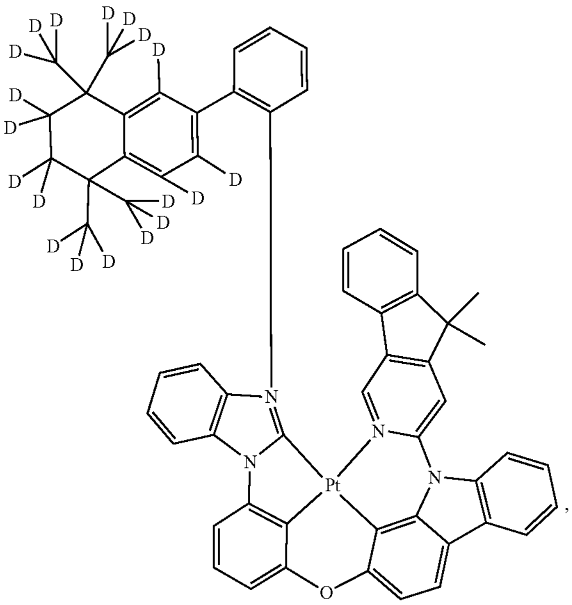
,
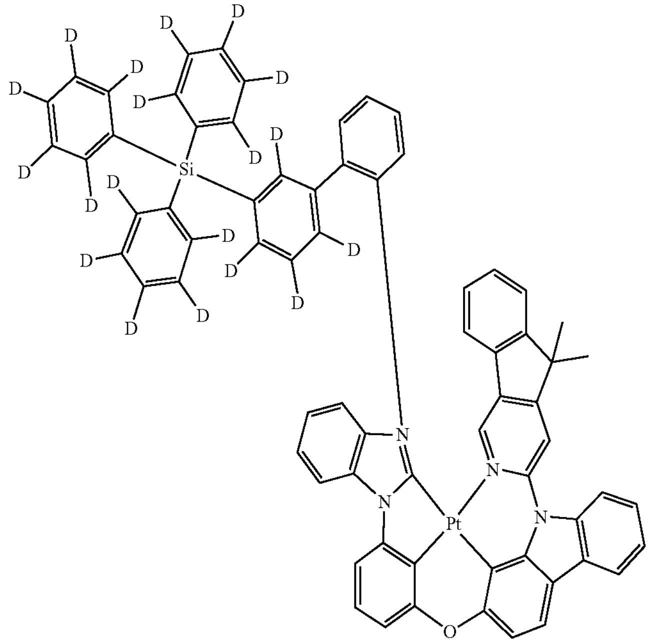
,
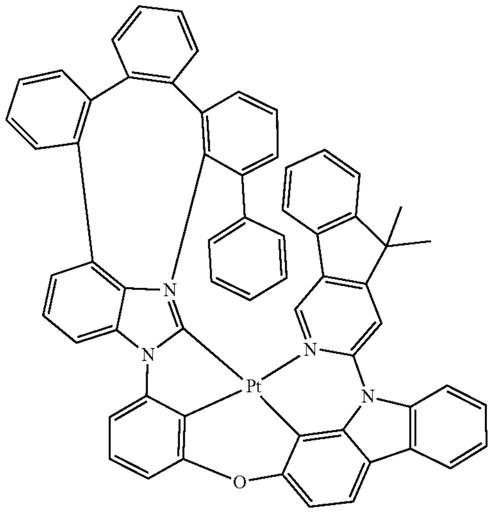
, -continued
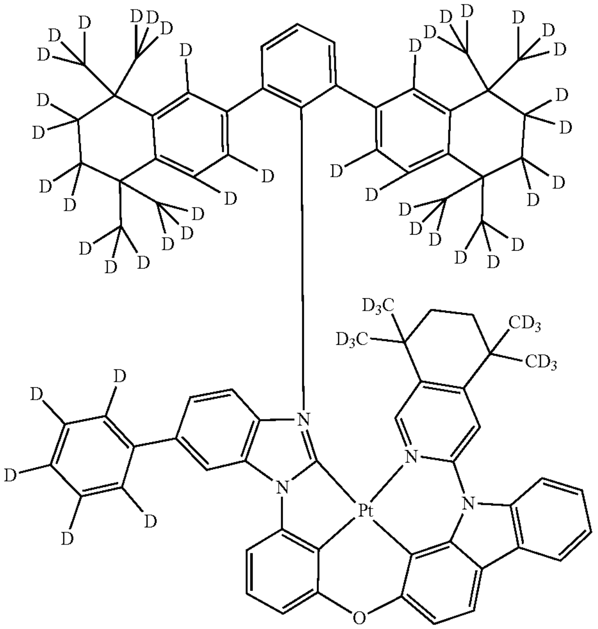
,
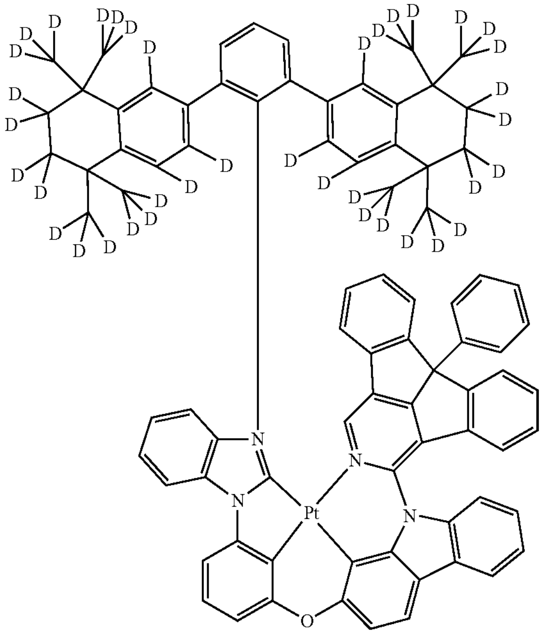
,
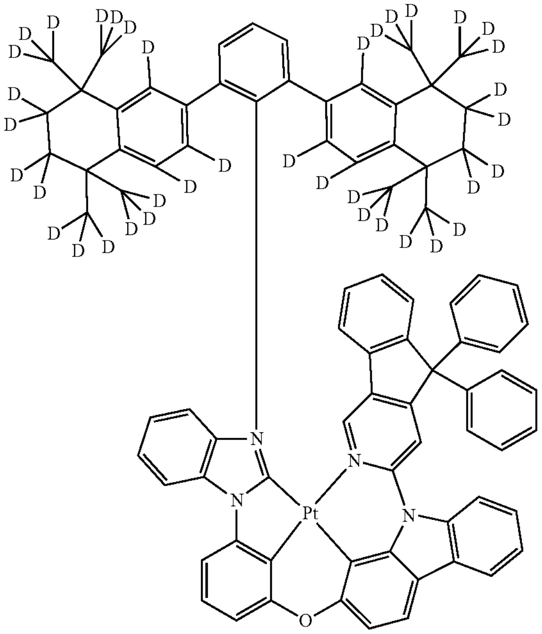
,
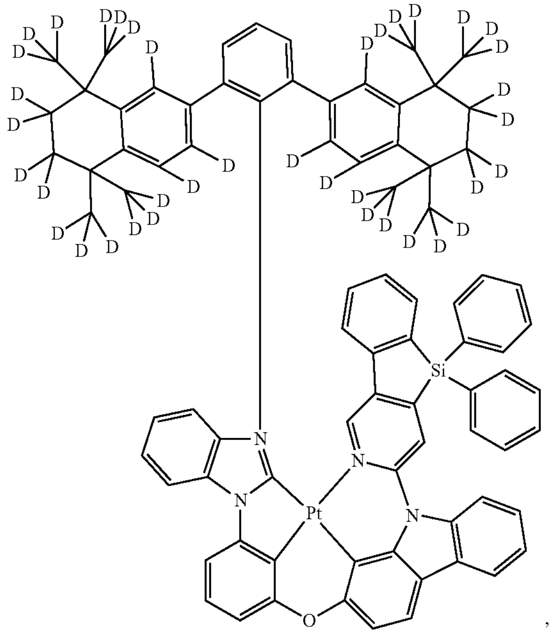
,
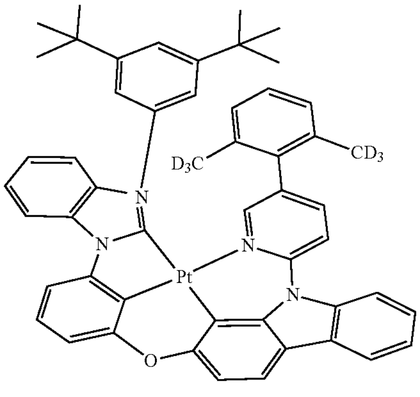
,
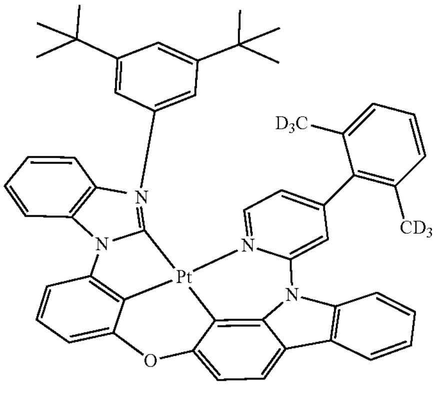
, -continued
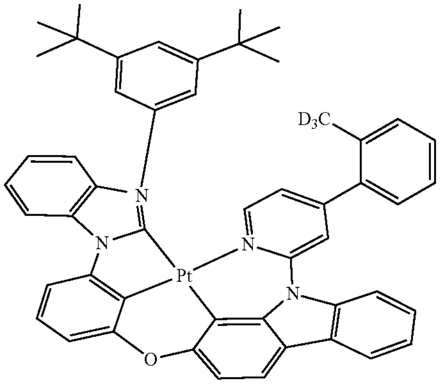
,
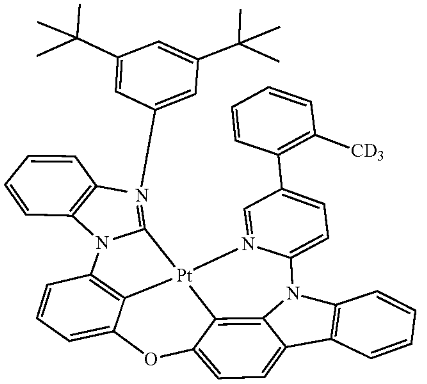
,
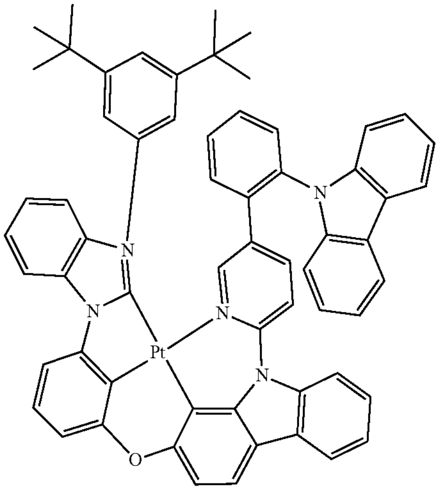
,
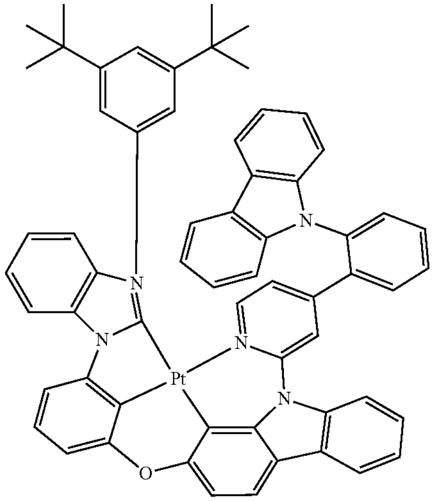
,
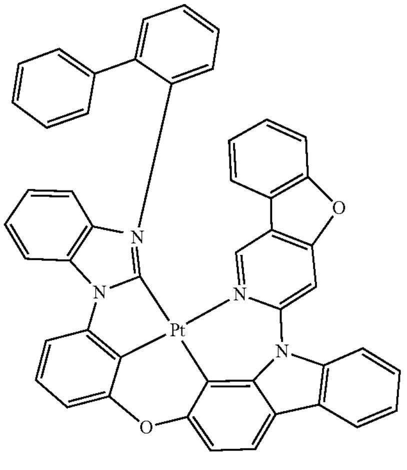
,
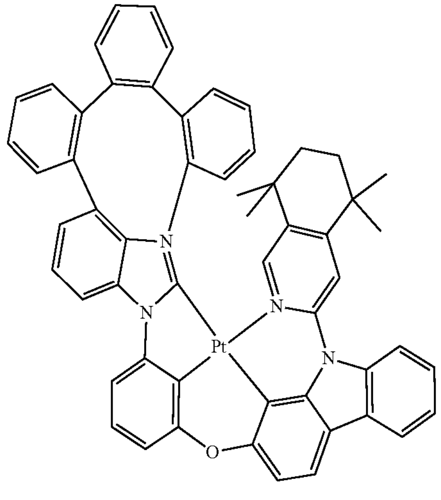
, -continued
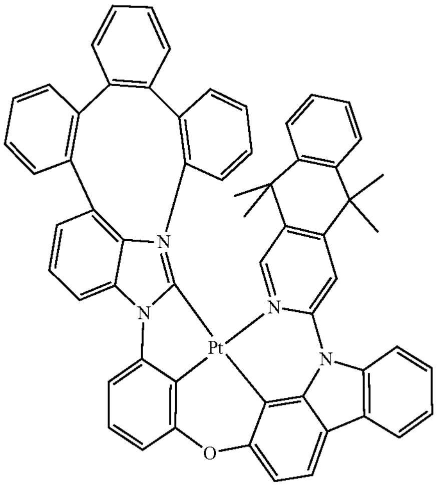
,
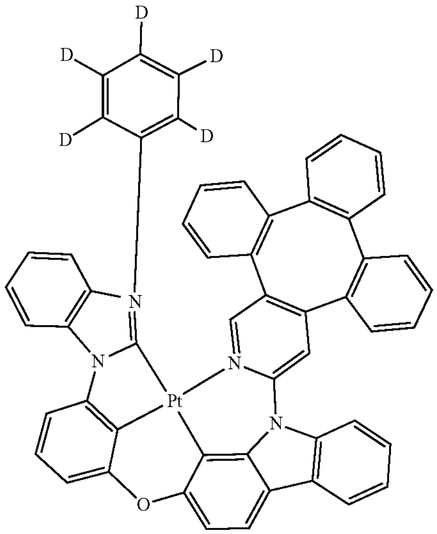
,
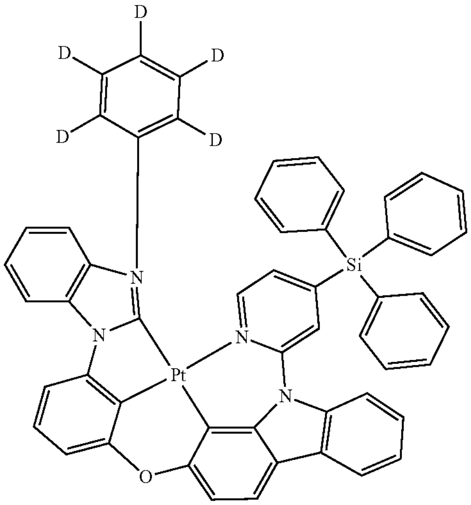
,
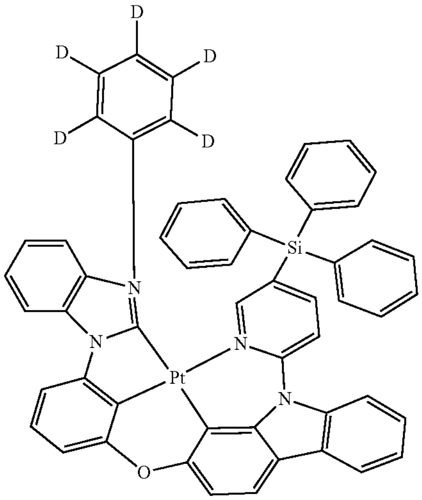
,
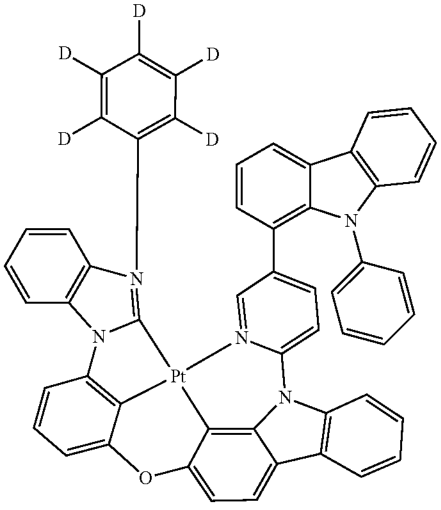
,
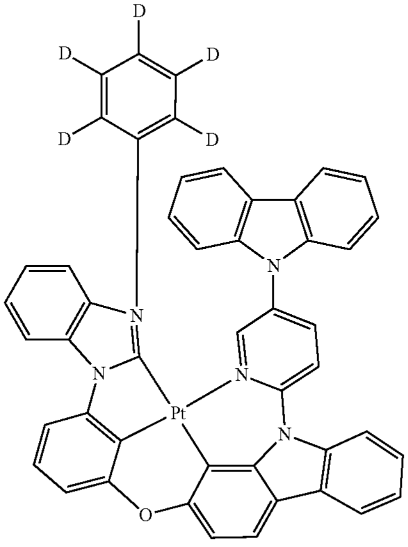
, -continued
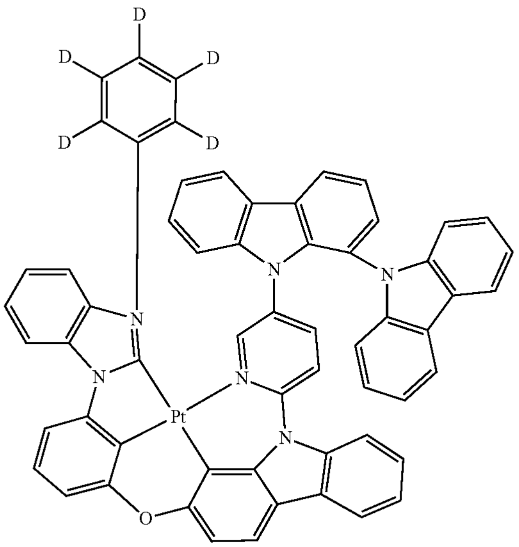
,
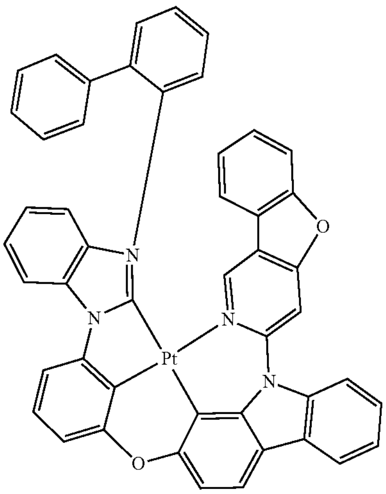
,
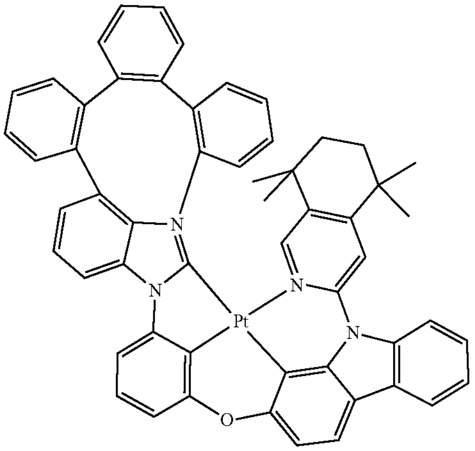
,
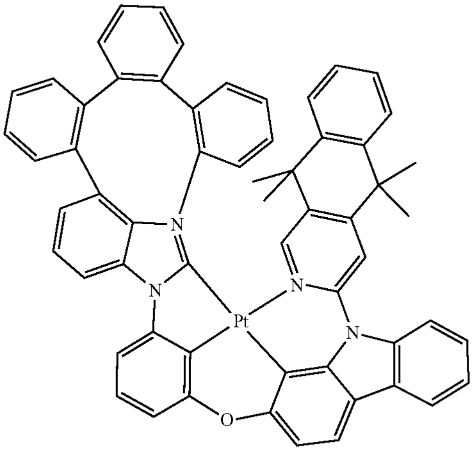
,
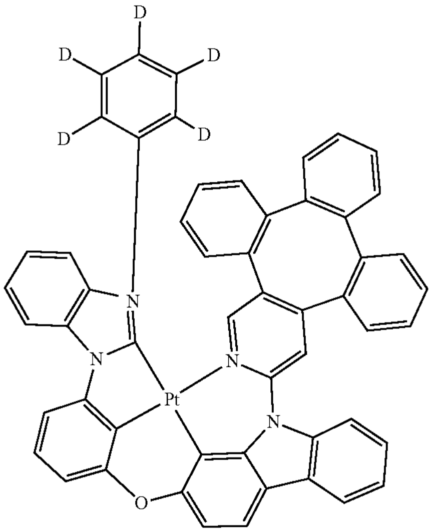
,
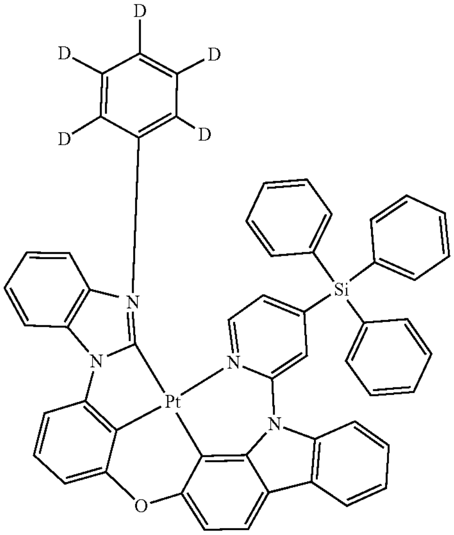
, -continued

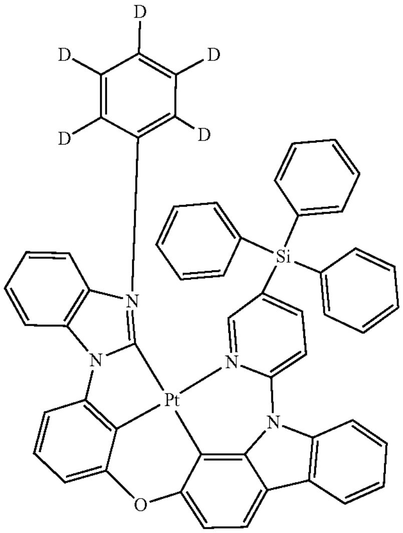

,

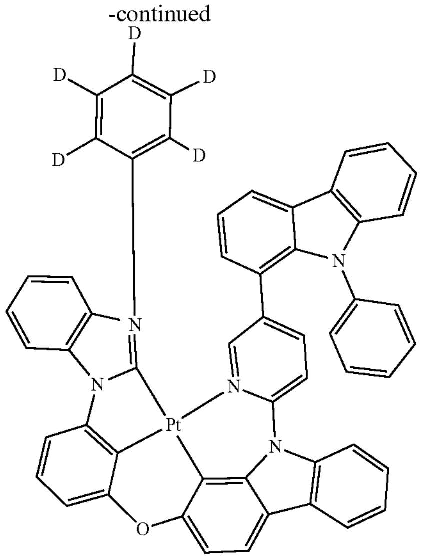

,

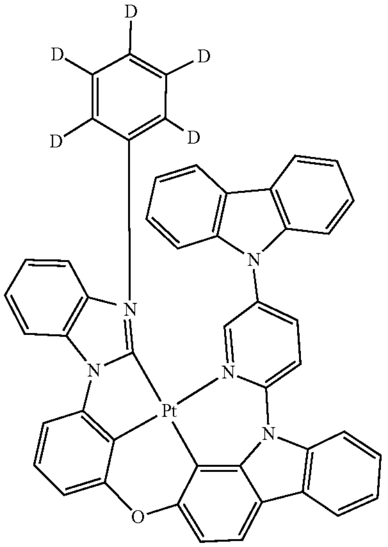

, and

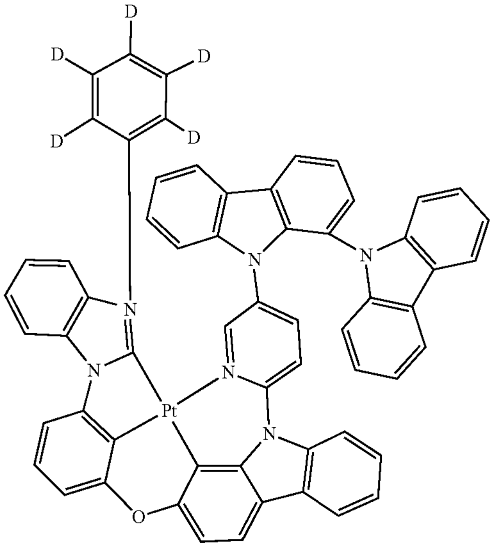

.

11. The OLED of claim 1, wherein the second compound is a host; and/or wherein the second compound is an E-host.

12. The OLED of claim 1, wherein each of $Z^1$ to $Z^{11}$ is C; and/or wherein $L^5$ is selected from the group consisting of O, S, and Se; and/or wherein $L^6$ is selected from the group consisting of O, S, and Se; and/or wherein x+y=2; and/or wherein at least one $R^E$, $R^F$, or $R^G$ comprises a moiety selected from the group consisting of aryl, heteroaryl, silyl, amino, combinations thereof, and partially and fully deuterated variants thereof; and/or wherein at least one of $R^E$, $R^G$, or $R^F$ of Formula II has a spherocity greater than or equal to 0.04.

13. The OLED of claim 1, wherein the second compound is selected from the group consisting of:

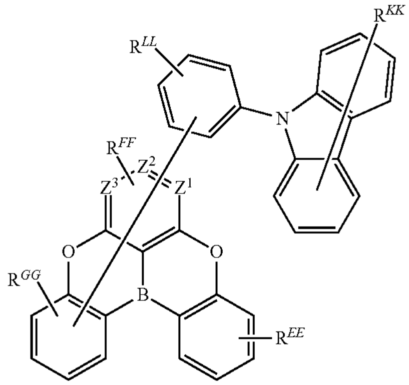

,

-continued

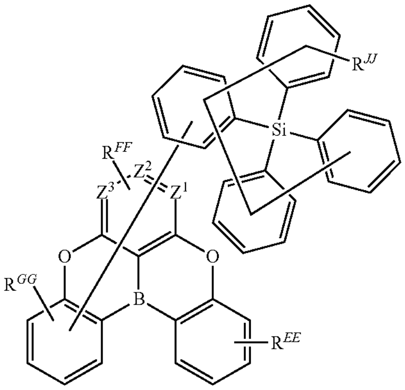

,

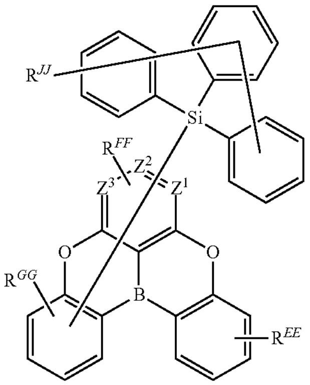

,

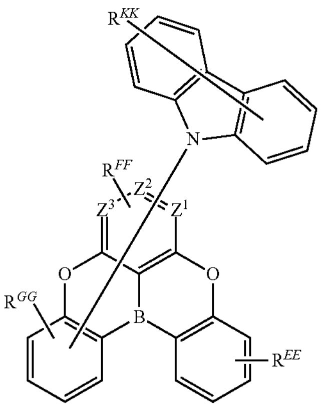

,

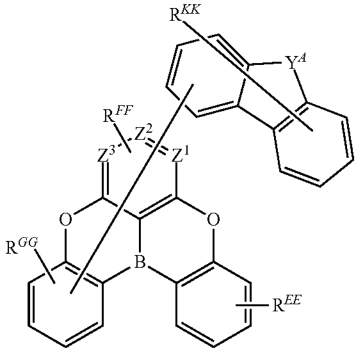

,

-continued

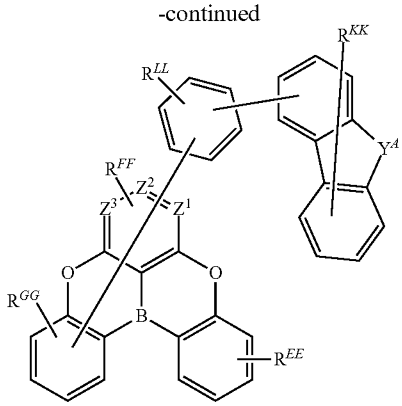

,

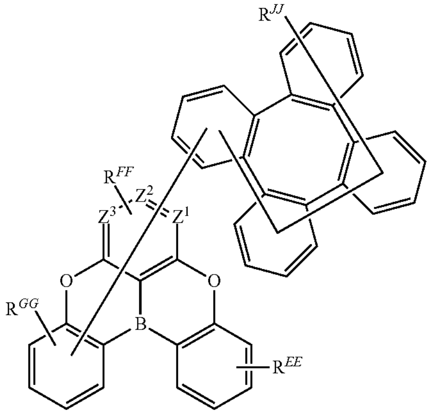

,

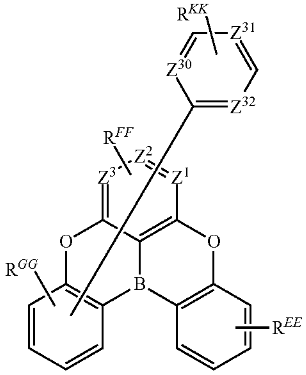

, and

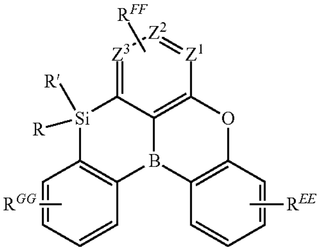

;

wherein:

each of $Z^{30}$, $Z^{31}$, and $Z^{32}$ is independently C or N;

each $Y^A$ is independently selected from the group consisting of BR, BRR', NR, PR, P(O)R, O, S, Se, C═O, C═S, C═Se, C═NR', C═CRR, S═O, $SO_2$, CRR', SiRR', and GeRR';

each of $R^{EE}$, $R^{FF}$, $R^{GG}$, $R^{JJ}$, $R^{KK}$, and $R^{LL}$ independently represents mono, up to the maximum substitutions, or no substitutions;

each of R, R', $R^{EE}$, $R^{FF}$, $R^{GG}$, $R^{JJ}$, $R^{KK}$, and $R^{LL}$ is independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, germyl, selenyl, and combinations thereof; and any two adjacent substituents can be joined or fused to form a ring.

14. The OLED of claim 1, wherein the second compound is selected from the group consisting of:

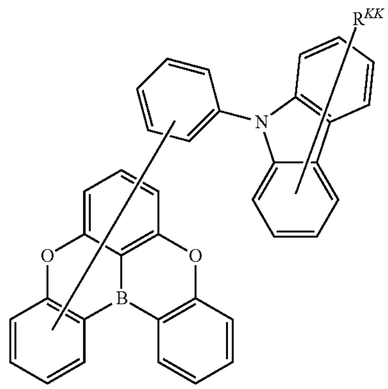

;

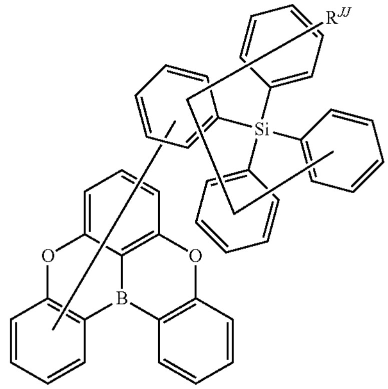

;

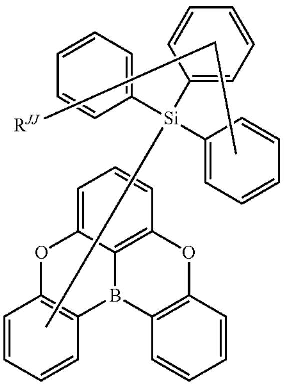

;

-continued

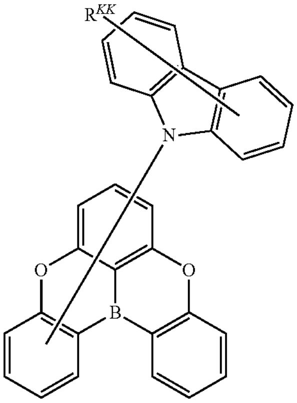

;

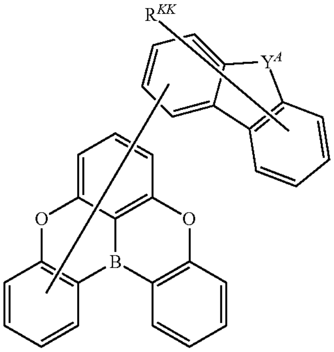

;

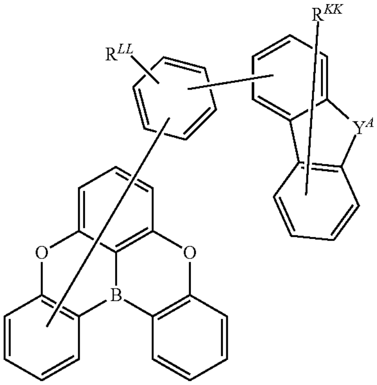

;

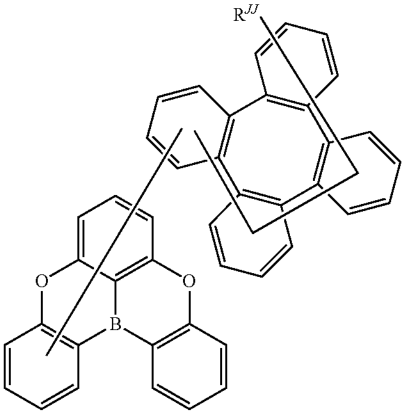

;

-continued

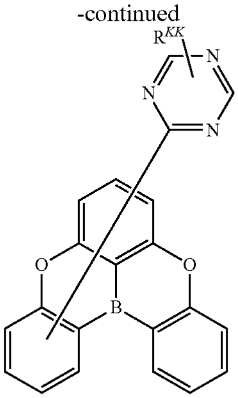

;

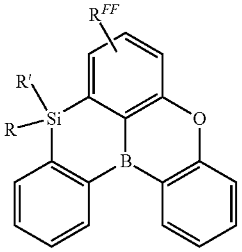

;

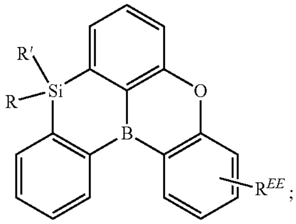

;

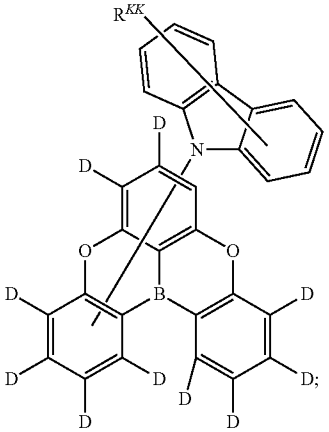

;

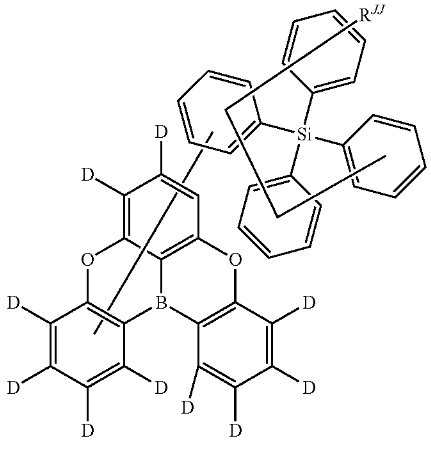

;

-continued

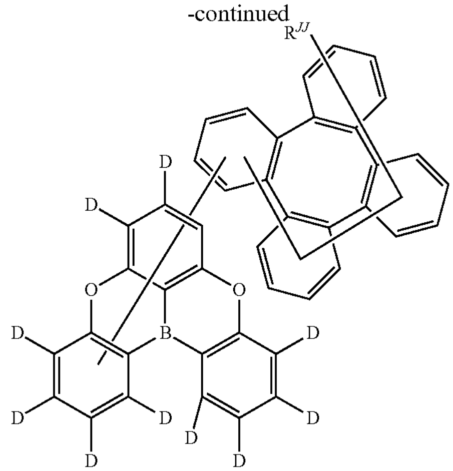

;

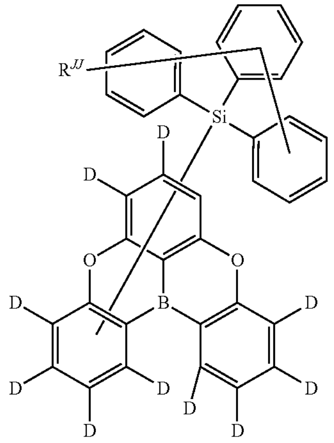

; and

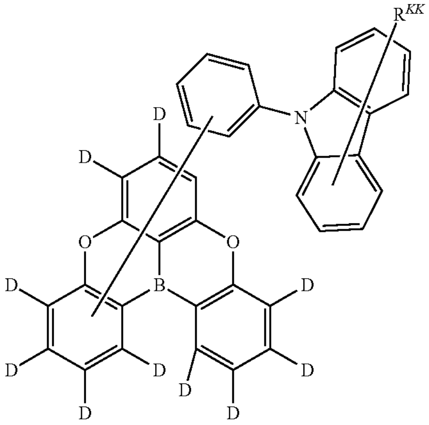

;

wherein:

each $Y^A$ is independently selected from the group consisting of BR, BRR', NR, PR, P(O)R, O, S, Se, C═O, C═S, C═Se, C═NR', C═CRR, S═O, $SO_2$, CRR', SiRR', and GeRR';

each of $R^{EE}$, $R^{FF}$, $R^{JJ}$, $R^{KK}$, and $R^{LL}$ independently represents mono, up to the maximum substitutions, or no substitutions;

each of R, R', $R^{EE}$, $R^{FF}$, $R^{JJ}$, $R^{KK}$, and $R^{LL}$ is independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, germyl, selenyl, and combinations thereof; and
any two adjacent substituents can be joined or fused to form a ring.
15. The OLED of claim 1, wherein the second compound is selected from the group consisting of:
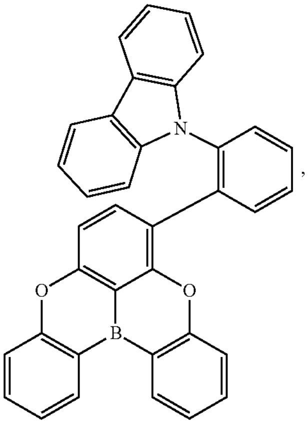
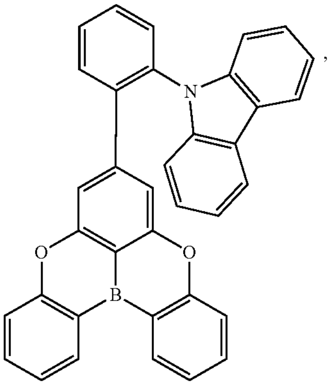
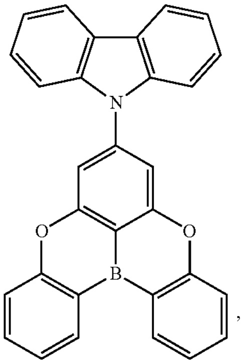
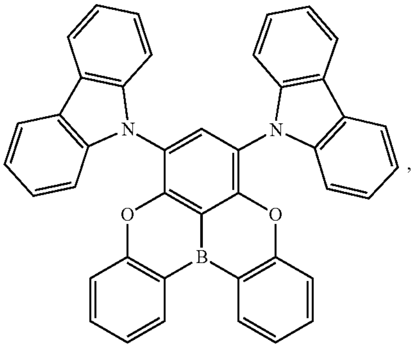
-continued
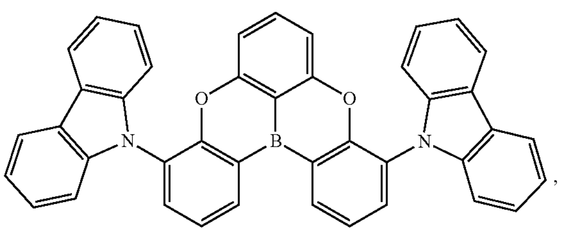
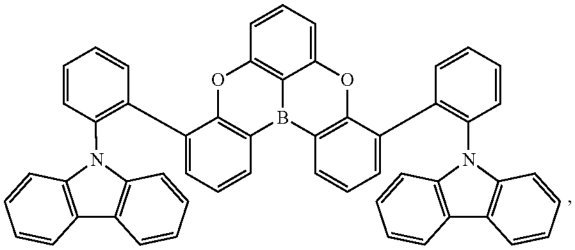
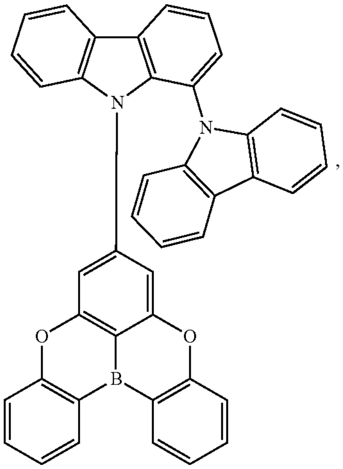
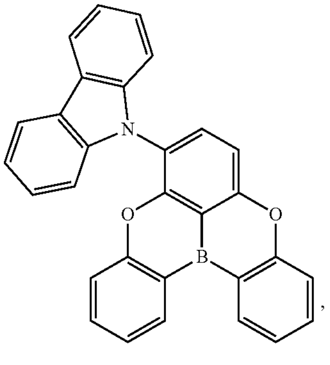

-continued
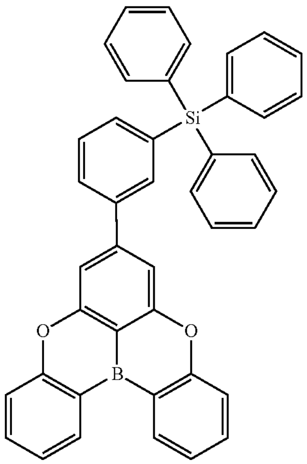
,
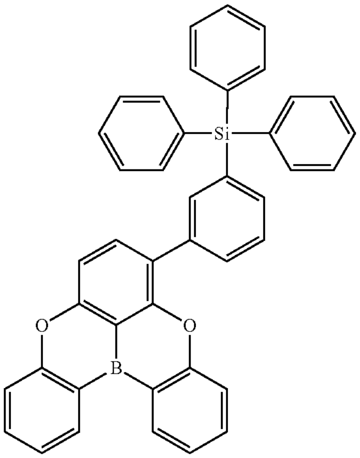
,
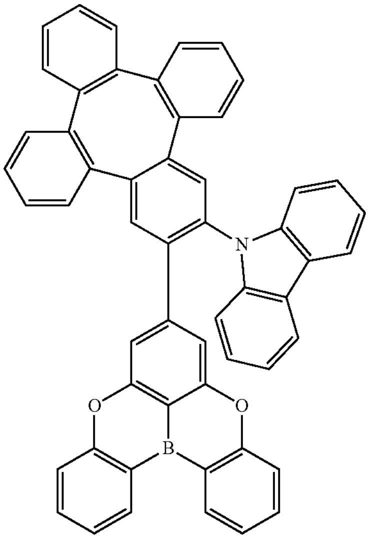
,
-continued
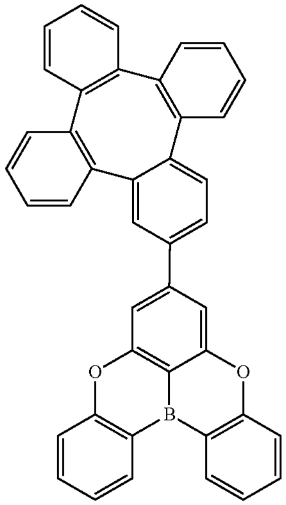
,
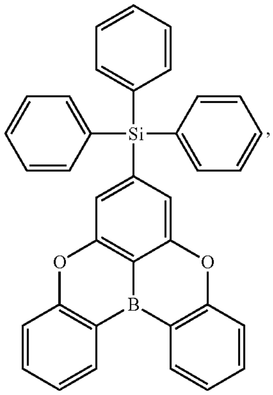
,
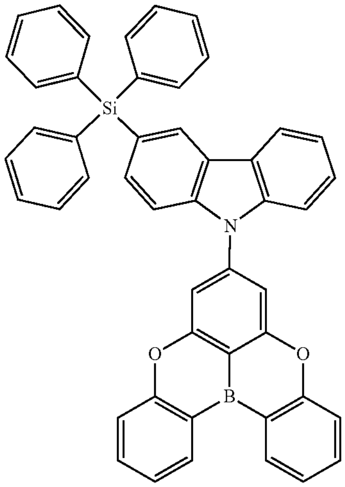
, -continued
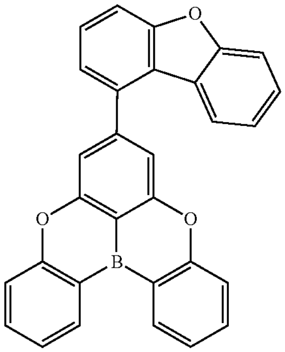
,
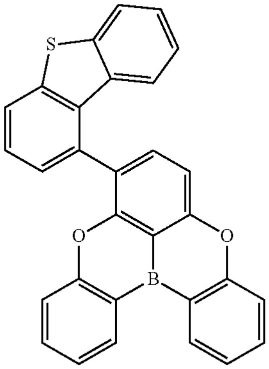
,
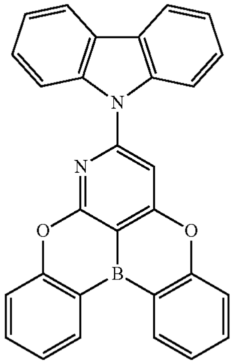
,
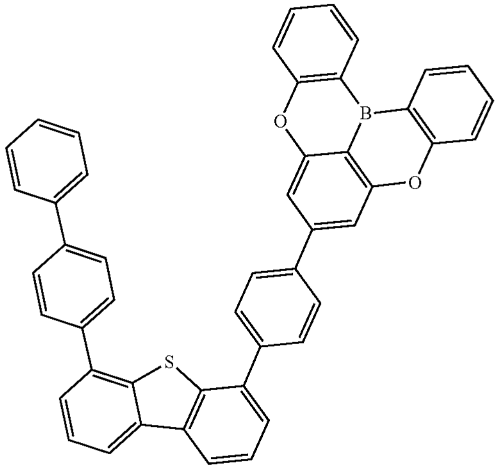
,
-continued
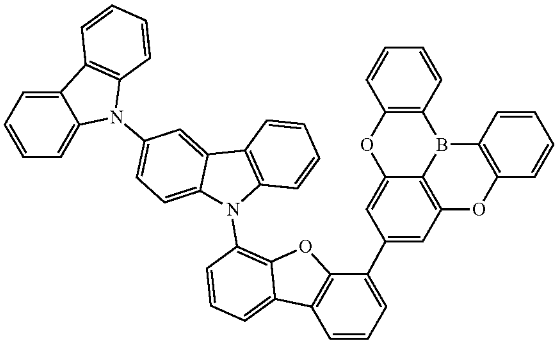
,
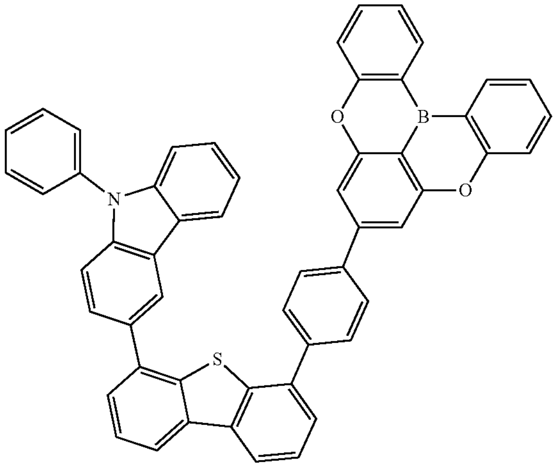
,
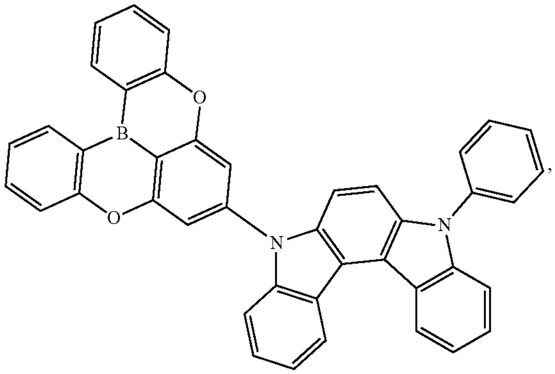
,
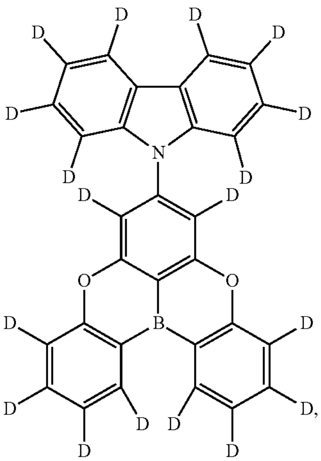
, -continued
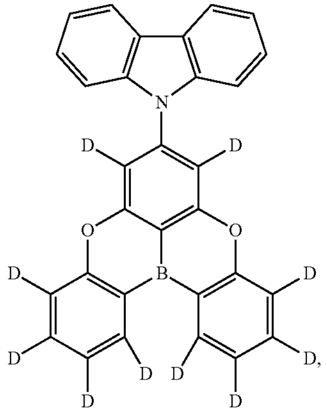
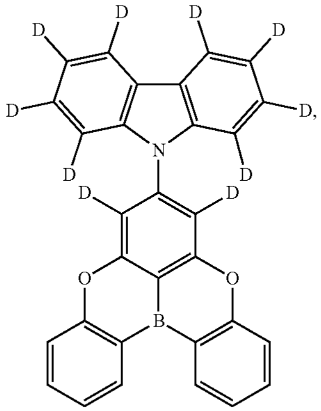
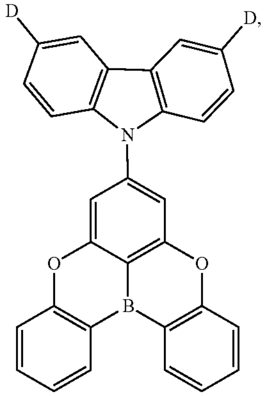
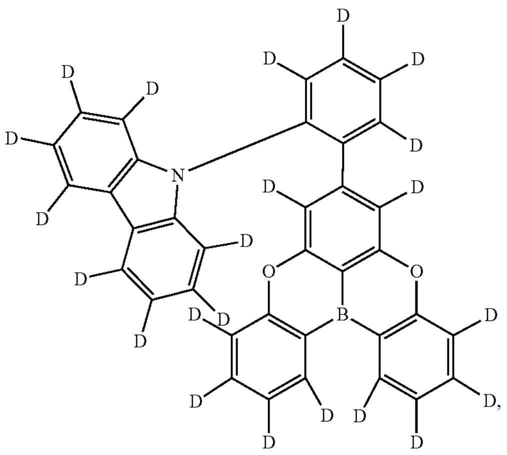
-continued
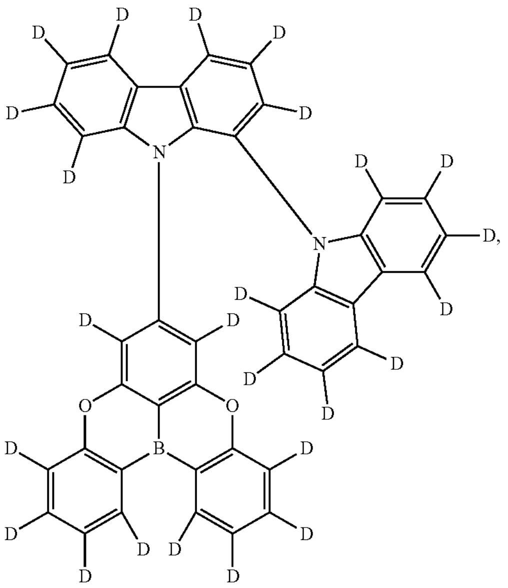
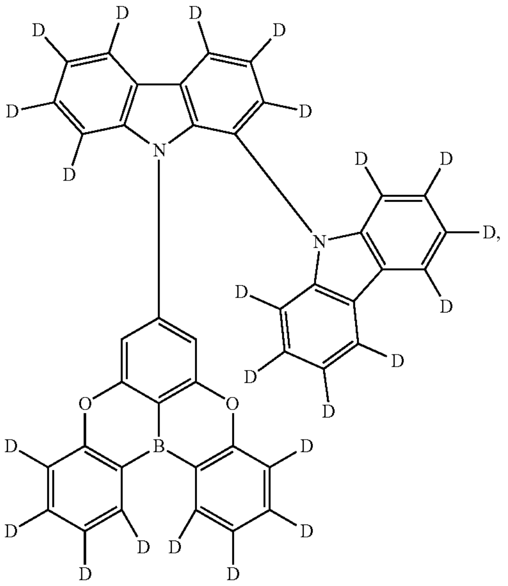
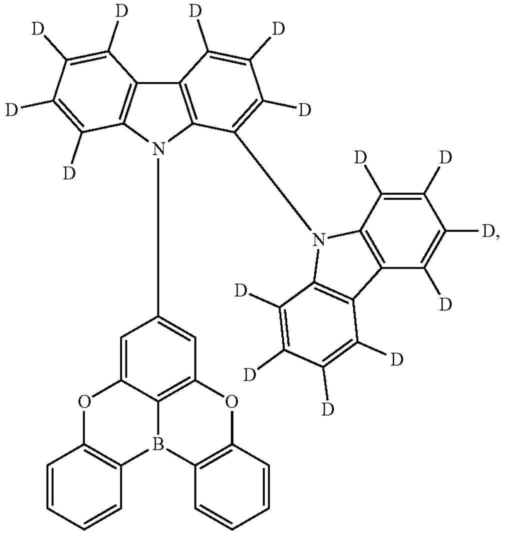

-continued
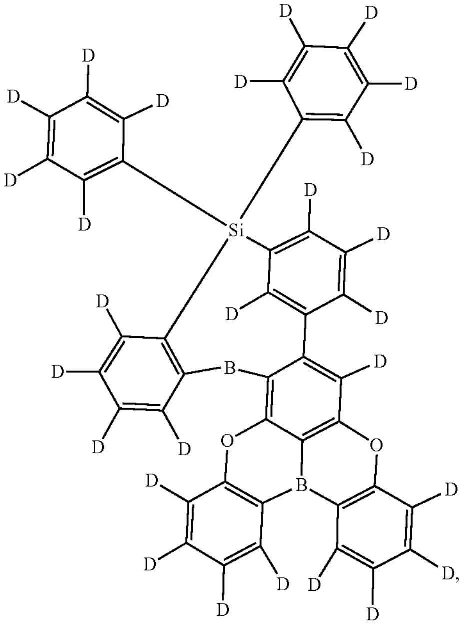
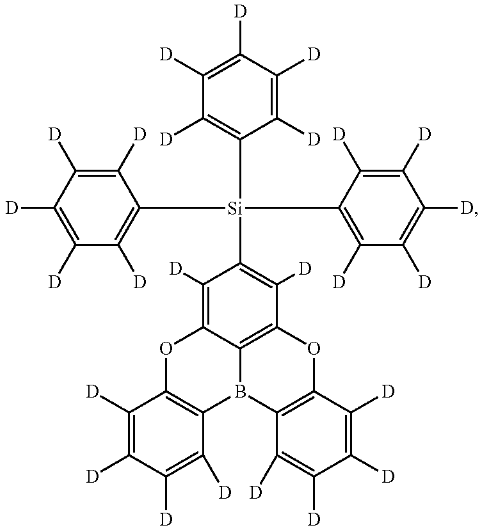
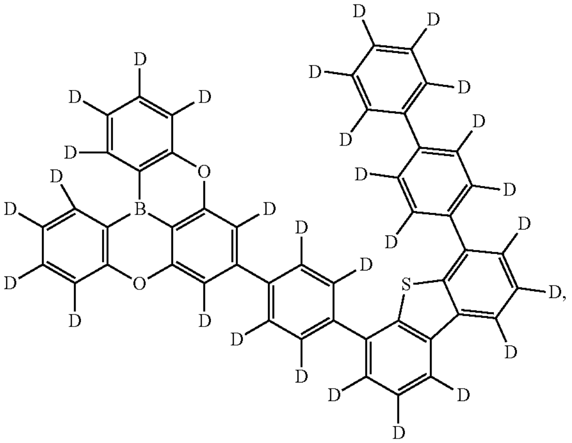
-continued
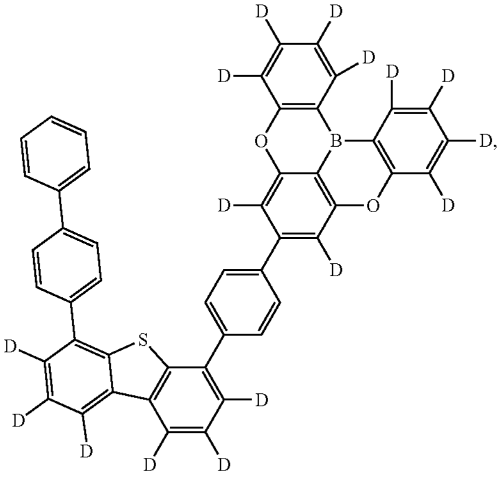
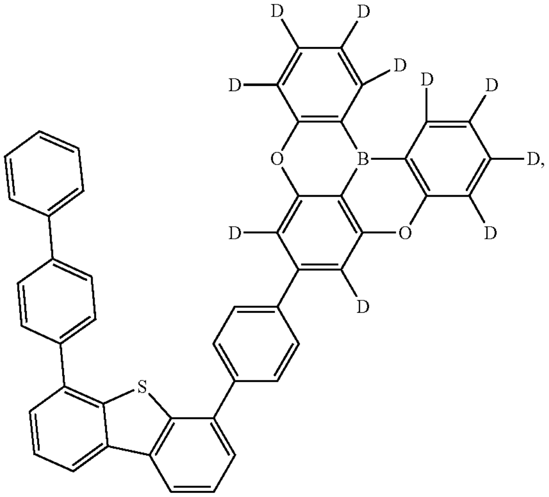
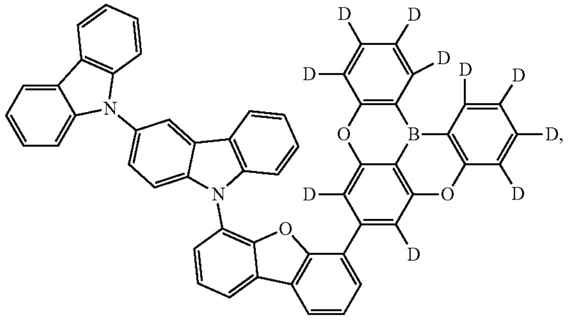
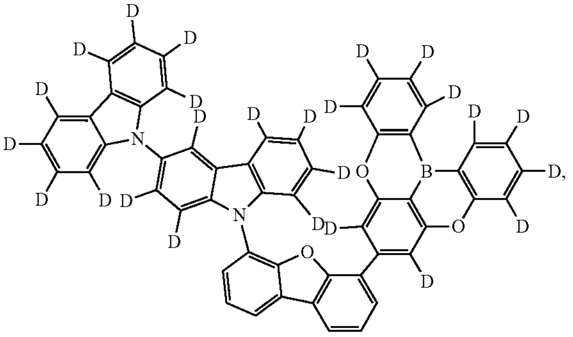

-continued
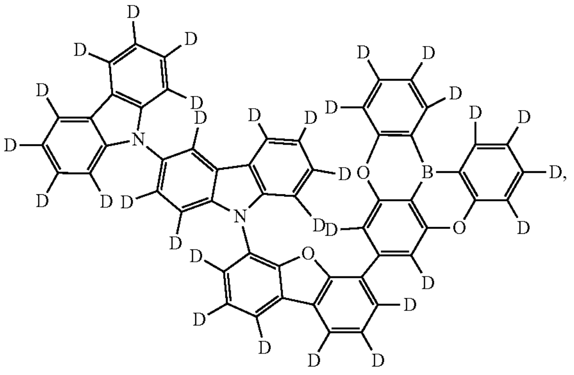
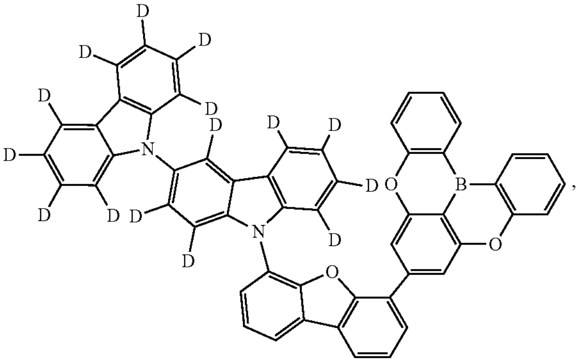
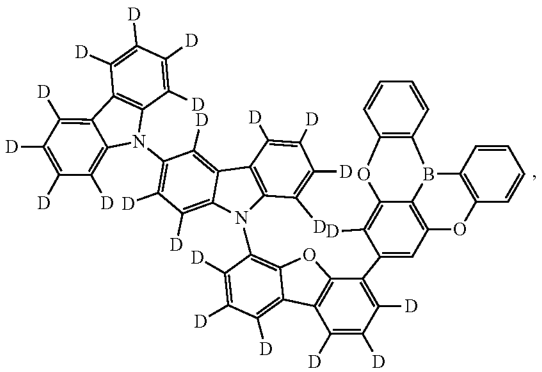
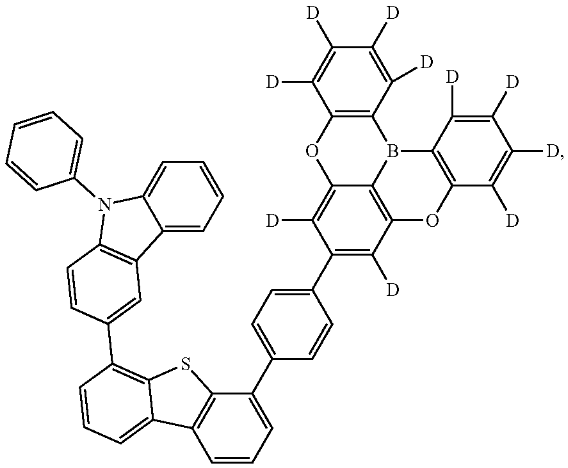
-continued
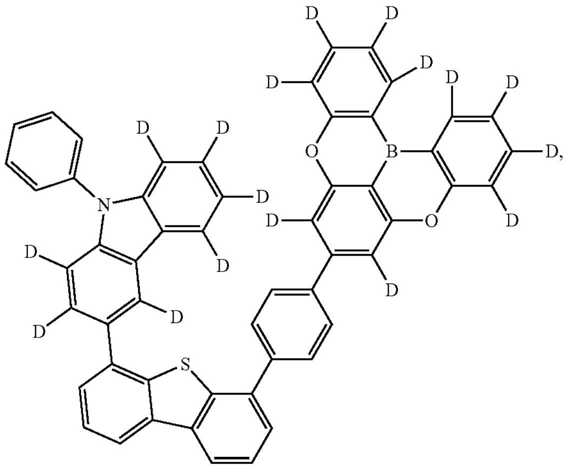
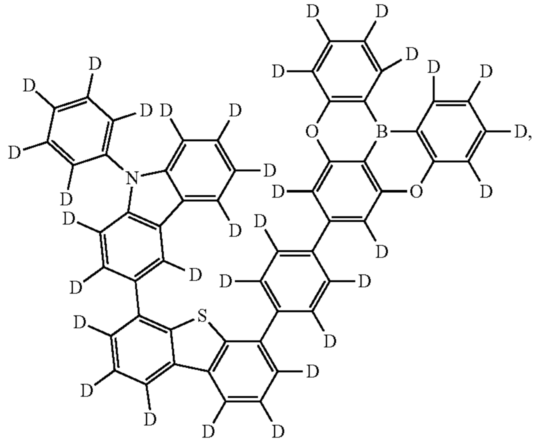
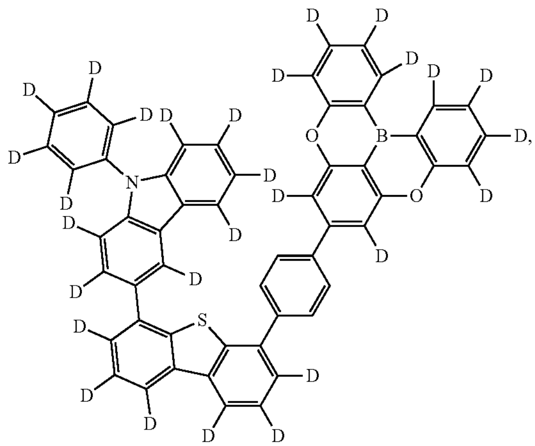

-continued

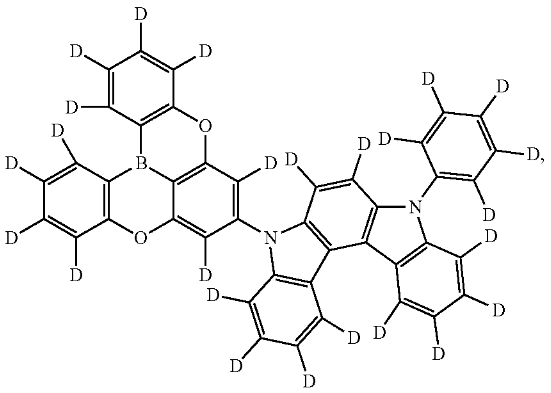

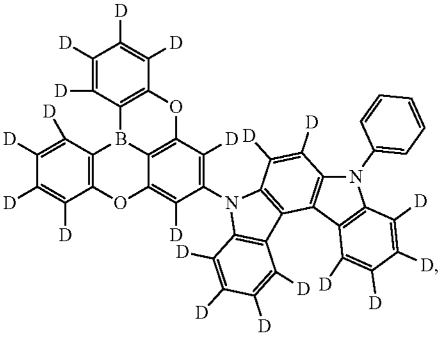

and

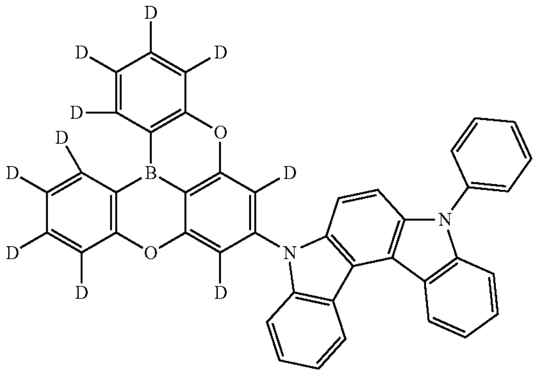

.

16. The OLED of claim 1, wherein one of moiety A, B, C, or D of Formula I comprises a pyridine moiety coordinated to Pt, and the pyridine moiety having a center of gravity C1; wherein the closest calculated intermolecular distance at 0K between C1 and the boron atom of Formula II is greater than or equal to 3.57 Å.

17. The OLED of claim 1, at least one of $R^E$, $R^F$ or $R^G$ is selected from the following structures:

Formula IIA

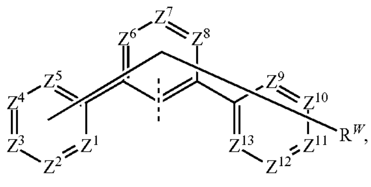

-continued

Formula IIB

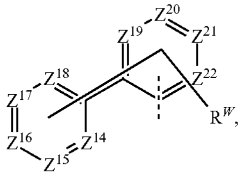

Formula IIC

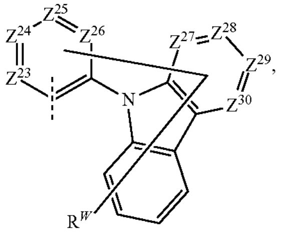

Formula IID

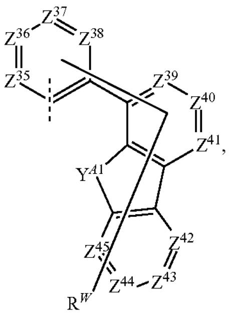

Formula IIE

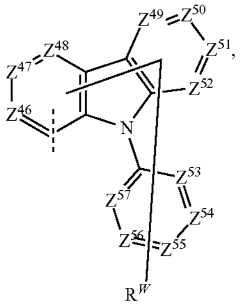

Formula IIH

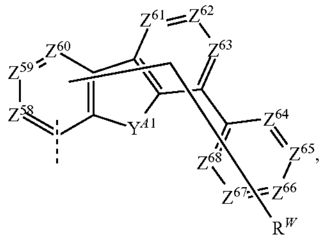

Formula IIF

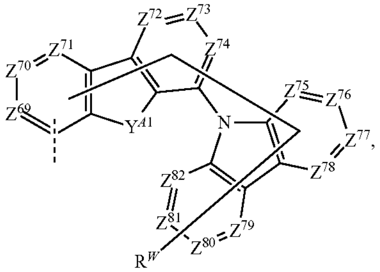

-continued

Formula IIG

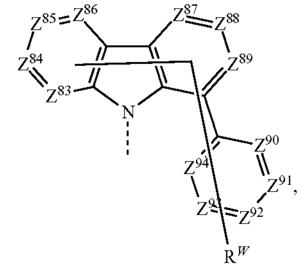

Formula IIJ

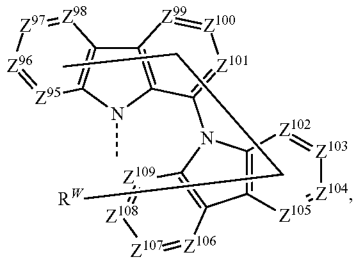

Formula IIK

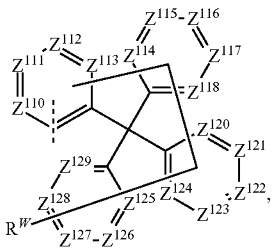

Formula IIO

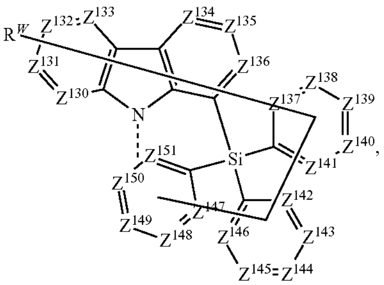

Formula IIL

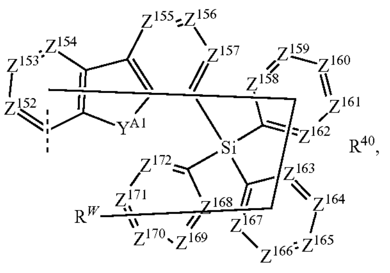

-continued

Formula IIM

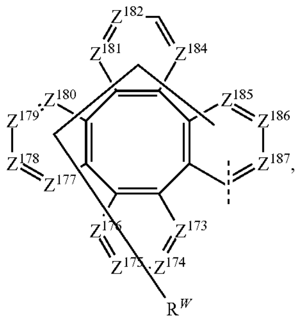

and

Formula IIN

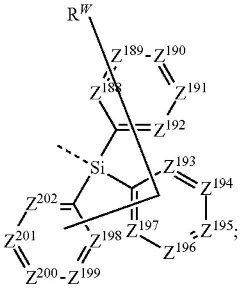

wherein $Z^1$ to $Z^{202}$ are each independently C or N;

wherein each $Y^{A1}$ is selected from the group consisting of BR, BRR', NR, PR, O, S, Se, C=O, C=S, C=Se, C=NR, C=CRR', S=O, $SO_2$, CR, CRR', SiRR', and GeRR';

wherein each $R^W$ independently represents mono to the maximum allowable substitution, or no substitution;

each R, R', and $R^W$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two $R^W$ can be joined or fused to form a ring.

18. The OLED of claim 1, wherein the emissive layer includes a third compound; and/or wherein the third compound is an emitter.

19. The OLED of claim 18, wherein the first compound is a sensitizer and the third compound is an acceptor.

20. A consumer product comprising an OLED according to claim 1.

* * * * *